US012660502B2

(12) United States Patent
Jun et al.

(10) Patent No.: US 12,660,502 B2
(45) Date of Patent: Jun. 16, 2026

(54) PLURALITY OF HOST MATERIALS, ORGANIC ELECTROLUMINESCENT COMPOUND, AND ORGANIC ELECTROLUMINESCENT DEVICE COMPRISING THE SAME

(71) Applicant: ROHM AND HAAS ELECTRONIC MATERIALS KOREA LTD., Chungcheongnam-do (KR)

(72) Inventors: Ji-Song Jun, Gyeonggi-do (KR); Hong-Se Oh, Gyeonggi-do (KR); Dong-Hyung Lee, Gyeonggi-do (KR); Sang-Hee Cho, Gyeonggi-do (KR); Du-Yong Park, Gyeonggi-do (KR); Hyun-Woo Kang, Gyeonggi-do (KR); Jin-Man Kim, Gyeonggi-do (KR)

(73) Assignee: DuPont Specialty Materials Korea Ltd. (KR)

( * ) Notice: Subject to any disclaimer, the term of this patent is extended or adjusted under 35 U.S.C. 154(b) by 375 days.

(21) Appl. No.: 18/463,978

(22) Filed: Sep. 8, 2023

(65) Prior Publication Data

US 2024/0138260 A1 Apr. 25, 2024

(30) Foreign Application Priority Data

Sep. 19, 2022 (KR) ........................ 10-2022-0117738
Jun. 26, 2023 (KR) ........................ 10-2023-0081810

(51) Int. Cl.

| | |
|---|---|
| ***H01L 21/78*** | (2006.01) |
| ***C09K 11/02*** | (2006.01) |
| ***C09K 11/06*** | (2006.01) |
| ***H10K 85/40*** | (2023.01) |
| ***H10K 85/60*** | (2023.01) |

(52) U.S. Cl.

CPC .......... *H10K 85/6574* (2023.02); *C09K 11/02* (2013.01); *C09K 11/06* (2013.01); *H10K 85/40* (2023.02); *H10K 85/615* (2023.02); *H10K 85/622* (2023.02); *H10K 85/633* (2023.02); *H10K 85/654* (2023.02); *H10K 85/6572* (2023.02); *H10K 85/6576* (2023.02); *C07B 2200/05* (2013.01); *C09K 2211/1022* (2013.01)

(58) Field of Classification Search

CPC .. H10K 85/6574; H10K 85/40; H10K 85/615; H10K 85/622; H10K 85/633; H10K 85/654; H10K 85/6572; H10K 85/6576; H10K 85/342; H10K 85/657; C09K 11/02; C09K 11/06; C09K 2211/1022; C07B 2200/05

USPC ............................................................ 257/40

See application file for complete search history.

(56) References Cited

U.S. PATENT DOCUMENTS

| | | | | |
|---|---|---|---|---|
| 7,935,434 | B2 * | 5/2011 | Tanaka | C09K 11/06 546/49 |
| 8,426,035 | B2 * | 4/2013 | Kwong | H10K 85/654 428/917 |
| 8,580,980 | B2 * | 11/2013 | Osaka | C07D 333/76 549/429 |
| 8,710,493 | B2 * | 4/2014 | Nishimura | C07D 235/18 257/E51.026 |
| 9,455,411 | B2 * | 9/2016 | Kwong | H10K 85/657 |
| 9,871,204 | B2 * | 1/2018 | Fuchiwaki | H10K 85/6576 |
| 9,929,355 | B2 * | 3/2018 | Takada | H10K 85/6576 |
| 9,997,715 | B2 * | 6/2018 | Fuchiwaki | C09K 11/06 |
| 11,121,329 | B2 * | 9/2021 | Uno | C09K 11/06 |
| 11,793,068 | B2 * | 10/2023 | Uno | H10K 85/6576 428/690 |
| 12,268,092 | B2 * | 4/2025 | Hanaki | C07D 493/04 |
| 2010/0072887 | A1 | 3/2010 | Kwong et al. | |

FOREIGN PATENT DOCUMENTS

| | | | |
|---|---|---|---|
| CN | 111333611 | A | 6/2020 |
| KR | 20210128363 | A | 10/2021 |

* cited by examiner

*Primary Examiner* — Vu A Vu
(74) *Attorney, Agent, or Firm* — G. Creston Campbell

(57) ABSTRACT

The present disclosure relates to a plurality of host materials, an organic electroluminescent compound, and an organic electroluminescent device comprising the same. By comprising a specific combination of host compounds and/or an organic electroluminescent compound according to the present disclosure as an organic electroluminescent material, an organic electroluminescent device having low driving voltage and/or high luminous efficiency and/or long lifespan characteristics can be provided.

10 Claims, No Drawings

PLURALITY OF HOST MATERIALS, ORGANIC ELECTROLUMINESCENT COMPOUND, AND ORGANIC ELECTROLUMINESCENT DEVICE COMPRISING THE SAME

TECHNICAL FIELD

The present disclosure relates to a plurality of host materials, an organic electroluminescent compound, and an organic electroluminescent device comprising the same.

BACKGROUND ART

Since Tang et al., of Eastman Kodak first developed a TPD/$Alq_3$ double-layer low-molecular green organic electroluminescent device (OLED) consisting of a light emitting layer and a charge transport layer in 1987, research on organic electroluminescent devices has been made rapidly and has now reached commercialization. Currently, organic electroluminescent devices mainly use phosphorescent materials with excellent luminous efficiency in implementing panels. OLEDs having high luminous efficiency and/or long lifespan are required for long-term use and the high resolution of displays.

Various materials or concepts have been proposed for the organic layer of the organic electroluminescent device in order to improve luminous efficiency, driving voltage and/or lifespan, but they are not satisfactory for practical use. Accordingly, it is continuously required to develop an organic electroluminescent device having more improved performance, for example, improved driving voltage, luminous efficiency, power efficiency, and/or lifespan characteristics compared to previously disclosed organic electroluminescent devices.

KR 2016-0078526 A discloses an organic light emitting device including an organic selenium compound as a host material; CN 111333611 A discloses the examples of a device including a dibenzoselenophene compound substituted with an amino group as a material for an electron blocking layer; KR 2021-0128363 A discloses naphtho[1,2-b][1]benzoselenole substituted with an amino group as a compound for the capping layer. However, the prior art documents do not specifically disclose an organic electroluminescent device including a plurality of host materials of a specific combination of the present disclosure, including a naphthobenzoselenol compound, as a light emitting layer material. There is still a demand for the development of organic electroluminescent materials to improve the performance of OLEDs.

DISCLOSURE OF THE INVENTION

Technical Problem

The object of the present disclosure is firstly, to provide a plurality of host materials which is able to produce an organic electroluminescent device having high luminous efficiency and/or long lifespan characteristics, and secondly, to provide an organic electroluminescent compound with a new structure suitable for use as an organic electroluminescent material. In addition, another object of the present disclosure is to provide an organic electroluminescent device having a low driving voltage and/or high luminous efficiency and/or long lifespan characteristics by comprising a plurality of host materials having a specific combination of compounds according to the present disclosure and/or an electroluminescent compound.

Solution to Problems

As a result of intensive studies to solve the technical problem above, the present inventors have found that the aforementioned objective can be achieved by a plurality of host materials comprising at least one first host material represented by the following Formula 1 and at least one second host material represented by the following Formula 2, so that the present invention was completed.

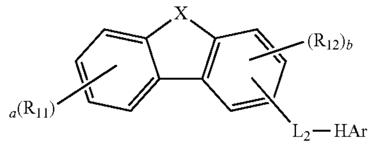
(1)

in Formula 1,

X represents O, S, Se, $CR_{13}R_{14}$, or $NR_{15}$;

$R_{11}$ and $R_{12}$ each independently represent hydrogen, deuterium, a substituted or unsubstituted (C6-C30)aryl, a substituted or unsubstituted (3- to 30-membered)heteroaryl, or $-SiR_{16}R_{17}R_{18}$;

$R_{13}$ to $R_{18}$ each independently represent hydrogen, deuterium, a substituted or unsubstituted (C1-C30)alkyl, a substituted or unsubstituted (C6-C30)aryl, or a substituted or unsubstituted (3- to 30-membered)heteroaryl;

$L_2$ represents a single bond, a substituted or unsubstituted (C6-C30)arylene, or a substituted or unsubstituted (3- to 30-membered)heteroarylene;

HAr represents a substituted or unsubstituted (3- to 30-membered)heteroaryl containing at least one nitrogen atom(s);

a represents an integer of 1 to 4, and b represents an integer of 1 to 3;

when a and b are 2 or more, each of $R_{11}$ and each of $R_{12}$ may be the same or different;

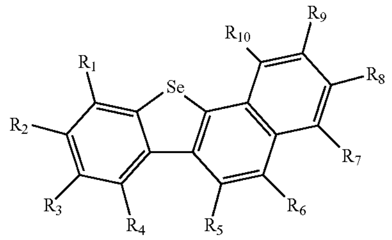
(2)

in Formula 2, $R_1$ to $R_{10}$ each independently represent hydrogen, deuterium, a substituted or unsubstituted (C1-C30)alkyl, a substituted or unsubstituted (C6-C30)aryl, or the following Formula a; provided that at least one of $R_1$ to $R_{10}$ is the following Formula a;

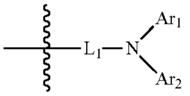
(a)

in Formula a, $L_1$ represents a single bond, a substituted or unsubstituted (C6-C30)arylene, or a substituted or unsubstituted (3- to 30-membered)heteroarylene;

$Ar_1$ and $Ar_2$ each independently represent a substituted or unsubstituted (C1-C30)alkyl, a substituted or unsubstituted (C6-C30)aryl, a substituted or unsubstituted (3- to 30-membered)heteroaryl, or $-L_3-NAr_3Ar_4$;

$L_3$ represents a substituted or unsubstituted (C6-C30) arylene or a substituted or unsubstituted (3- to 30-membered)heteroarylene; and $Ar_3$ and $Ar_4$ each independently represent a substituted or unsubstituted (C6-C30)aryl or a substituted or unsubstituted (3- to 30-membered)heteroaryl.

Advantageous Effects of Invention

By using a plurality of host materials and/or an organic electroluminescent compound according to the present disclosure, an organic electroluminescent device having low driving voltage and/or high luminous efficiency and/or long lifespan characteristics can be provided.

EMBODIMENTS OF THE INVENTION

Hereinafter, the present disclosure will be described in detail. However, the following description is intended to explain the invention, and is not meant in any way to restrict the scope of the invention.

The present disclosure relates to a plurality of host materials comprising a first host material including at least one compound(s) represented by Formula 1 and a second host material including at least one compound(s) represented by Formula 2, and an organic electroluminescent device comprising the host materials.

The present disclosure relates to an organic electroluminescent compound represented by Formula 3, and an organic electroluminescent material including the same, and an organic electroluminescent device.

The term "organic electroluminescent compound" in the present disclosure means a compound that may be used in an organic electroluminescent device, and may be comprised in any material layer constituting an organic electroluminescent device, as necessary.

Herein, the term "organic electroluminescent material" means a material that may be used in an organic electroluminescent device, and may comprise at least one compound. The organic electroluminescent material may be comprised in any layer constituting an organic electroluminescent device, as necessary. For example, the organic electroluminescent material may be a hole injection material, a hole transport material, a hole auxiliary material, a light-emitting auxiliary material, an electron blocking material, a light-emitting material (containing host and dopant materials), an electron buffer material, a hole blocking material, an electron transport material, or an electron injection material, etc.

The term "a plurality of organic electroluminescent materials" in the present disclosure means an organic electroluminescent material comprising a combination of at least two compounds, which may be comprised in any layer constituting an organic electroluminescent device. It may mean both a material before being comprised in an organic electroluminescent device (for example, before vapor deposition) and a material after being comprised in an organic electroluminescent device (for example, after vapor deposition). For example, a plurality of organic electroluminescent materials may be a combination of at least two compounds, which may be comprised in at least one layer of a hole injection layer, a hole transport layer, a hole auxiliary layer, a light-emitting auxiliary layer, an electron blocking layer, a light-emitting layer, an electron buffer layer, a hole blocking layer, an electron transport layer, and an electron injection layer. Such at least two compounds may be comprised in the same layer or in different layers, and may be mixture-evaporated or co-evaporated, or may be individually evaporated.

Herein, the term "a plurality of host materials" means an organic electroluminescent material comprising a combination of at least two host materials. It may mean both a material before being comprised in an organic electroluminescent device (e.g., before vapor deposition) and a material after being comprised in an organic electroluminescent device (e.g., after vapor deposition). A plurality of host materials of the present disclosure may be comprised in any light-emitting layer constituting an organic electroluminescent device. The at least two compounds comprised in a plurality of host materials may be comprised together in one light-emitting layer, or may each be comprised in separate light-emitting layers. When at least two compounds are comprised in one light-emitting layer, the at least two compounds may be mixture-evaporated to form a layer or may be individually and simultaneously co-evaporated to form a layer.

Herein, "(C1-C30)alkyl" is meant to be a linear or branched alkyl having 1 to 30 carbon atoms constituting the chain, in which the number of carbon atoms is preferably 1 to 20, and more preferably 1 to 10. The above alkyl may include methyl, ethyl, n-propyl, isopropyl, n-butyl, isobutyl, tert-butyl, sec-butyl, etc. Herein, the term "(C3-C30)cycloalkyl" is meant to be a mono- or polycyclic hydrocarbon having 3 to 30 ring backbone carbon atoms, in which the number of carbon atoms is preferably 3 to 20, and more preferably 3 to 7. The above cycloalkyl may include cyclopropyl, cyclobutyl, cyclopentyl, cyclohexyl, cyclopentylmethyl, cyclohexylmethyl, etc. Herein, "(3- to 7-membered) heterocycloalkyl" is meant to be a cycloalkyl having 3 to 7 ring backbone atoms and including at least one heteroatoms selected from the group consisting of B, N, O, S, Si, and P, preferably the group consisting of O, S, and N, in which the number of the ring backbone carbon atoms is preferably 5 to 7, for example, tetrahydrofuran, pyrrolidine, thiolane, tetrahydropyran, etc. Herein, "(C6-C30)aryl(ene)" is a monocyclic or fused ring radical derived from an aromatic hydrocarbon having 6 to 30 ring backbone carbon atoms, in which the number of the ring backbone carbon atoms is preferably 6 to 20, more preferably 6 to 15, may be partially saturated, and may include a spiro structure. Examples of the aryl specifically may be phenyl, biphenyl, terphenyl, quaterphenyl, naphthyl, binaphthyl, phenylnaphthyl, naphthylphenyl, fluorenyl, phenylfluorenyl, dimethylfluorenyl, diphenylfluorenyl, benzofluorenyl, diphenylbenzofluorenyl, dibenzofluorenyl, phenanthrenyl, benzophenanthrenyl, phenylphenanthrenyl, anthracenyl, benzanthracenyl, indenyl, triphenylenyl, pyrenyl, tetracenyl, perylenyl, chrysenyl, benzochrysenyl, naphthacenyl, fluoranthenyl, benzofluoranthenyl, tolyl, xylyl, mesityl, cumenyl, spiro[fluoren-fluoren]yl, spiro[fluoren-benzofluoren]yl, azulenyl, tetramethyldihydrophenanthrenyl, etc. More specifically, the aryl may be o-tolyl, m-tolyl, p-tolyl, 2,3-xylyl, 3,4-xylyl, 2,5-xylyl, mesityl, o-cumenyl, m-cumenyl, p-cumenyl, p-t-butylphenyl, p-(2-phenylpropyl)phenyl, 4'-methylbiphenyl, 4"-t-butyl-p-terphenyl-4-yl, o-biphenyl, m-biphenyl, p-biphenyl, o-terphenyl, m-terphenyl-4-yl, m-terphenyl-3-yl, m-terphenyl-2-yl, p-terphenyl-4-yl, p-terphenyl-3-yl, p-terphenyl-2- yl, m-quaterphenyl, 1-naphthyl, 2-naphthyl, 1-fluorenyl, 2-fluorenyl, 3-fluorenyl, 4-fluorenyl, 9-fluorenyl, 9,9-dimethyl-1-fluorenyl, 9,9-dimethyl-2-fluorenyl, 9,9-dimethyl-3-fluorenyl, 9,9-dimethyl-4-fluorenyl, 9,9-diphenyl-1-fluorenyl, 9,9-diphenyl-2-fluorenyl, 9,9-diphenyl-3-fluorenyl, 9,9-diphenyl-4-fluorenyl, 1-anthryl, 2-anthryl, 9-anthryl, 1-phenanthryl, 2-phenanthryl, 3-phenanthryl, 4-phenanthryl, 9-phenanthryl, 1-chrysenyl, 2-chrysenyl, 3-chrysenyl, 4-chrysenyl, 5-chrysenyl, 6-chrysenyl, benzo[c]phenanthryl, benzo[g]chrysenyl, 1-triphenylenyl, 2-triphenylenyl, 3-triphenylenyl, 4-triphenylenyl, 3-fluoranthenyl, 4-fluoranthenyl, 8-fluoranthenyl, 9-fluoranthenyl, benzofluoranthenyl, 11,11-dimethyl-1-benzo[a]fluorenyl, 11,11-dimethyl-2-benzo[a]fluorenyl, 11,11-dimethyl-3-benzo[a]fluorenyl, 11,11-dimethyl-4-benzo[a]fluorenyl, 11,11-dimethyl-5-benzo[a]fluorenyl, 11,11-dimethyl-6-benzo[a]fluorenyl, 11,11-dimethyl-7-benzo[a]fluorenyl, 11,11-dimethyl-8-benzo[a]fluorenyl, 11,11-dimethyl-9-benzo[a]fluorenyl, 11,11-dimethyl-10-benzo[a]fluorenyl, 11,11-dimethyl-1-benzo[b]fluorenyl, 11,11-dimethyl-2-benzo[b]fluorenyl, 11,11-dimethyl-3-benzo[b]fluorenyl, 11,11-dimethyl-4-benzo[b]fluorenyl, 11,11-dimethyl-5-benzo[b]fluorenyl, 11,11-dimethyl-6-benzo[b]fluorenyl, 11,11-dimethyl-7-benzo[b]fluorenyl, 11,11-dimethyl-8-benzo[b]fluorenyl, 11,11-dimethyl-9-benzo[b]fluorenyl, 11,11-dimethyl-10-benzo[b]fluorenyl, 11,11-dimethyl-1-benzo[c]fluorenyl, 11,11-dimethyl-2-benzo[c]fluorenyl, 11,11-dimethyl-3-benzo[c]fluorenyl, 11,11-dimethyl-4-benzo[c]fluorenyl, 11,11-dimethyl-5-benzo[c]fluorenyl, 11,11-dimethyl-6-benzo[c]fluorenyl, 11,11-dimethyl-7-benzo[c]fluorenyl, 11,11-dimethyl-8-benzo[c]fluorenyl, 11,11-dimethyl-9-benzo[c]fluorenyl, 11,11-dimethyl-10-benzo[c]fluorenyl, 11,11-diphenyl-1-benzo[a]fluorenyl, 11,11-diphenyl-2-benzo[a]fluorenyl, 11,11-diphenyl-3-benzo[a]fluorenyl, 11,11-diphenyl-4-benzo[a]fluorenyl, 11,11-diphenyl-5-benzo[a]fluorenyl, 11,11-diphenyl-6-benzo[a]fluorenyl, 11,11-diphenyl-7-benzo[a]fluorenyl, 11,11-diphenyl-8-benzo[a]fluorenyl, 11,11-diphenyl-9-benzo[a]fluorenyl, 11,11-diphenyl-10-benzo[a]fluorenyl, 11,11-diphenyl-1-benzo[b]fluorenyl, 11,11-diphenyl-2-benzo[b]fluorenyl, 11,11-diphenyl-3-benzo[b]fluorenyl, 11,11-diphenyl-4-benzo[b]fluorenyl, 11,11-diphenyl-5-benzo[b]fluorenyl, 11,11-diphenyl-6-benzo[b]fluorenyl, 11,11-diphenyl-7-benzo[b]fluorenyl, 11,11-diphenyl-8-benzo[b]fluorenyl, 11,11-diphenyl-9-benzo[b]fluorenyl, 11,11-diphenyl-10-benzo[b]fluorenyl, 11,11-diphenyl-1-benzo[c]fluorenyl, 11,11-diphenyl-2-benzo[c]fluorenyl, 11,11-diphenyl-3-benzo[c]fluorenyl, 11,11-diphenyl-4-benzo[c]fluorenyl, 11,11-diphenyl-5-benzo[c]fluorenyl, 11,11-diphenyl-6-benzo[c]fluorenyl, 11,11-diphenyl-7-benzo[c]fluorenyl, 11,11-diphenyl-8-benzo[c]fluorenyl, 11,11-diphenyl-9-benzo[c]fluorenyl, 11,11-diphenyl-10-benzo[c]fluorenyl, 9,9,10,10-tetramethyl-9,10-dihydro-1-phenanthrenyl, 9,9,10,10-tetramethyl-9,10-dihydro-2-phenanthrenyl, 9,9,10,10-tetramethyl-9,10-dihydro-3-phenanthrenyl, 9,9,10,10-tetramethyl-9,10-dihydro-4-phenanthrenyl, etc. Herein, "(3- to 30-membered)heteroaryl(ene)" is an aryl having 3 to 30 ring backbone atoms and including at least one, preferably 1 to 4 heteroatoms selected from the group consisting of B, N, O, S, Si, P, Se, and Ge, in which the number of the ring backbone carbon atoms is preferably 3 to 30, and more preferably 5 to 20. The above heteroaryl(ene) may be a monocyclic ring, or a fused ring condensed with at least one benzene ring; and may be partially saturated. Also, the above heteroaryl or heteroarylene herein may be one formed by linking at least one heteroaryl or aryl group to a heteroaryl group via a single bond(s), and may comprise a spiro structure. Examples of the heteroaryl specifically may be a monocyclic ring-type heteroaryl including furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl, etc., and a fused ring-type heteroaryl including benzofuranyl, benzothiophenyl, isobenzofuranyl, dibenzofuranyl, dibenzothiophenyl, dibenzoselenophenyl, benzofuroquinolinyl, benzofuroquinazolinyl, benzofuronaphthiridinyl, benzofuropyrimidinyl, naphthofuropyrimidinyl, benzothienoquinolinyl, benzothienoquinazolinyl, benzothienonaphthiridinyl, benzothienopyrimidinyl, naphthothienopyrimidinyl, pyrimidoindolyl, benzopyrimidoindolyl, benzofuropyrazinyl, naphthofuropyrazinyl, benzothienopyrazinyl, naphthothienopyrazinyl, pyrazinoindolyl, benzopyrazinoindolyl, benzoimidazolyl, benzothiazolyl, benzoisothiazolyl, benzoisoxazolyl, benzoxazolyl, imidazopyridinyl, isoindolyl, indolyl, benzoindolyl, indazolyl, benzothiadiazolyl, quinolyl, isoquinolyl, cinnolinyl, quinazolinyl, quinoxalinyl, carbazolyl, azacarbazolyl, benzocarbazolyl, dibenzocarbazolyl, phenoxazinyl, phenanthridinyl, benzodioxolyl, indolizidinyl, acridinyl, silafluorenyl, germafluorenyl, benzotriazolyl, phenazinyl, imidazopyridinyl, chromenoquinazolinyl, thiochromenoquinazolinyl, dimethylbenzopyrimidinyl, indolocarbazolyl, indenocarbazolyl, etc. More specifically, the heteroaryl may be 1-pyrrolyl, 2-pyrrolyl, 3-pyrrolyl, 2-pyridinyl, 3-pyridinyl, 4-pyridinyl, 2-pyrimidinyl, 4-pyrimidinyl, 5-pyrimidinyl, 6-pyrimidinyl, 1,2,3-triazin-4-yl, 1,2,4-triazin-3-yl, 1,3,5-triazin-2-yl, 1-imidazolyl, 2-imidazolyl, 1-pyrazolyl, 1-indolizidinyl, 2-indolizidinyl, 3-indolizidinyl, 5-indolizidinyl, 6-indolizidinyl, 7-indolizidinyl, 8-indolizidinyl, 2-imidazopyridinyl, 3-imidazopyridinyl, 5-imidazopyridinyl, 6-imidazopyridinyl, 7-imidazopyridinyl, 8-imidazopyridinyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, azacarbazol-1-yl, azacarbazol-2-yl, azacarbazol-3-yl, azacarbazol-4-yl, azacarbazol-5-yl, azacarbazol-6-yl, azacarbazol-7-yl, azacarbazol-8-yl, azacarbazol-9-yl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, 9-acridinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrol-1-yl, 2-methylpyrrol-3-yl, 2-methylpyrrol-4-yl, 2-methylpyrrol-5-yl, 3-methylpyrrol-1-yl, 3-methylpyrrol-2-yl, 3-methylpyrrol-4-yl, 3-methylpyrrol-5-yl, 2-t-butylpyrrol-4-yl, 3-(2-phenylpropyl)pyrrol-1-yl, 2-methyl-1-indolyl, 4-methyl-1-indolyl, 2-methyl-3-indolyl, 4-methyl-3-indolyl, 2-t-butyl-1-indolyl, 4-t-butyl-1-indolyl, 2-t-butyl-3-indolyl, 4-t-butyl-3-indolyl, 1-dibenzofuranyl, 2-dibenzofuranyl, 3-dibenzofuranyl, 4-dibenzofuranyl, 1-dibenzothiophenyl, 2-dibenzothiophenyl, 3-dibenzothiophenyl, 4-dibenzothiophenyl, 1-naphtho-[1,2-b]-benzofuranyl, 2-naphtho-[1,2-b]-benzofuranyl, 3-naphtho-[1,2-b]-benzofuranyl, 4-naphtho-[1,2-b]-benzofuranyl, 5-naphtho-[1,2-b]-benzofuranyl, 6-naphtho-[1,2-b]-benzofuranyl, 7-naphtho-[1,2-b]-benzofuranyl, 8-naphtho-[1,2-b]-benzofuranyl, 9-naphtho-[1,2-b]-benzofuranyl, 10-naphtho-[1,2-b]-benzofuranyl, 1-naphtho-[2,3-b]-benzofuranyl, 2-naphtho-[2,3-b]-benzofuranyl, 3-naphtho-[2,3-b]-benzofuranyl, 4-naphtho-[2,3-b]-benzofuranyl, 5-naphtho-[2,3-b]-benzofuranyl, 6-naphtho-[2,3-b]-benzofuranyl, 7-naphtho-[2,3-b]-benzofuranyl, 8-naphtho-[2,3-b]-benzofuranyl, 9-naphtho-[2,3-b]-benzofuranyl, 10-naphtho-[2,3-b]-benzofuranyl, 1-naphtho-[2,1-b]-benzofuranyl, 2-naphtho-[2,1-b]-benzofuranyl, 3-naphtho-[2,1-b]-benzofuranyl, 4-naphtho-[2,1-b]-benzofuranyl, 5-naphtho-[2,1-b]-benzofuranyl, 6-naphtho-[2,1-b]-benzofuranyl, 7-naphtho-[2,1-b]-benzofuranyl, 8-naphtho-[2,1-b]-benzofuranyl, 9-naphtho-[2,1-b]-benzofuranyl, 10-naphtho-[2,1-b]-benzofuranyl, 1-naphtho-[1,2-b]-benzothiophenyl, 2-naphtho-[1,2-b]-benzothiophenyl, 3-naphtho-[1,2-b]-benzothiophenyl, 4-naphtho-[1,2-b]-benzothiophenyl, 5-naphtho-[1,2-b]-benzothiophenyl, 6-naphtho-[1,2-b]-benzothiophenyl, 7-naphtho-[1,2-b]-benzothiophenyl, 8-naphtho-[1,2-b]-benzothiophenyl, 9-naphtho-[1,2-b]-benzothiophenyl, 10-naphtho-[1,2-b]-benzothiophenyl, 1-naphtho-[2,3-b]-benzothiophenyl, 2-naphtho-[2,3-b]-benzothiophenyl, 3-naphtho-[2,3-b]-benzothiophenyl, 4-naphtho-[2,3-b]-benzothiophenyl, 5-naphtho-[2,3-b]-benzothiophenyl, 1-naphtho-[2,1-b]-benzothiophenyl, 2-naphtho-[2,1-b]-benzothiophenyl, 3-naphtho-[2,1-b]-benzothiophenyl, 4-naphtho-[2,1-b]-benzothiophenyl, 5-naphtho-[2,1-b]-benzothiophenyl, 6-naphtho-[2,1-b]-benzothiophenyl, 7-naphtho-[2,1-b]-benzothiophenyl, 8-naphtho-[2,1-b]-benzothiophenyl, 9-naphtho-[2,1-b]-benzothiophenyl, 10-naphtho-[2,1-b]-benzothiophenyl, 2-benzofuro[3,2-d]pyrimidinyl, 6-benzofuro[3,2-d]pyrimidinyl, 7-benzofuro[3,2-d]pyrimidinyl, 8-benzofuro[3,2-d]pyrimidinyl, 9-benzofuro[3,2-d]pyrimidinyl, 2-benzothio[3,2-d]pyrimidinyl, 6-benzothio[3,2-d]pyrimidinyl, 7-benzothio[3,2-d]pyrimidinyl, 8-benzothio[3,2-d]pyrimidinyl, 9-benzothio[3,2-d]pyrimidinyl, 2-benzofuro[3,2-d]pyrazinyl, 6-benzofuro[3,2-d]pyrazinyl, 7-benzofuro[3,2-d]pyrazinyl, 8-benzofuro[3,2-d]pyrazinyl, 9-benzofuro[3,2-d]pyrazinyl, 2-benzothio[3,2-d]pyrazinyl, 6-benzothio[3,2-d]pyrazinyl, 7-benzothio[3,2-d]pyrazinyl, 8-benzothio[3,2-d]pyrazinyl, 9-benzothio[3,2-d]pyrazinyl, 1-silafluorenyl, 2-silafluorenyl, 3-silafluorenyl, 4-silafluorenyl, 1-germafluorenyl, 2-germafluorenyl, 3-germafluorenyl, 4-germafluorenyl, 1-dibenzoselenophenyl, 2-dibenzoselenophenyl, 3-dibenzoselenophenyl, 4-dibenzoselenophenyl, etc. Herein, the term "a fused ring of (C3-C30) aliphatic ring and (C6-C30) aromatic ring" means a ring formed by fusing at least one aliphatic ring having 3 to 30 ring backbone carbon atoms in which the carbon atoms number is preferably 3 to 25, more preferably 3 to 18, and at least one aromatic ring having 6 to 30 ring backbone carbon atoms in which the carbon atoms number is preferably 6 to 25, more preferably 6 to 18. For example, the fused ring may be a fused ring of at least one benzene and at least one cyclohexane, or a fused ring of at least one naphthalene and at least one cyclopentane, etc. Herein, the carbon atoms in the fused ring of (C3-C30) aliphatic ring and (C6-C30) aromatic ring may be replaced with at least one heteroatom selected from B, N, O, S, Si, and P, preferably at least one heteroatom selected from N, O, and S. The term "Halogen" in the present disclosure includes F, Cl, Br, and I.

In addition, "ortho (o)," "meta (m)," and "para (p)" are meant to signify the substitution position of all substituents. Ortho position is a compound with substituents, which are adjacent to each other, e.g., at the 1 and 2 positions on benzene. Meta position is the next substitution position of the immediately adjacent substitution position, e.g., a compound with substituents at the 1 and 3 positions on benzene. Para position is the next substitution position of the meta position, e.g., a compound with substituents at the 1 and 4 positions on benzene.

Herein, the term "a ring formed in linking to an adjacent substituent" means a substituted or unsubstituted (3- to 30-membered) mono- or polycyclic, alicyclic, aromatic ring, or a combination thereof, formed by linking or fusing two or more adjacent substituents, preferably a substituted or unsubstituted (5- to 25-membered) mono- or polycyclic, alicyclic, aromatic ring, or a combination thereof. Further, the formed ring may include at least one heteroatom selected from the group consisting of B, N, O, S, Si, and P, preferably, N, O, and S. According to one embodiment of the present disclosure, the number of atoms in the ring skeleton is 5 to 20; according to another embodiment of the present disclosure, the number of atoms in the ring skeleton is 5 to 15. In one embodiment, the fused ring may be, for example, a substituted or unsubstituted dibenzothiophene ring, a substituted or unsubstituted dibenzofuran ring, a substituted or unsubstituted naphthalene ring, a substituted or unsubstituted phenanthrene ring, a substituted or unsubstituted fluorene ring, a substituted or unsubstituted benzofluorene ring, a substituted or unsubstituted benzothiophene ring, a substituted or unsubstituted benzofuran ring, a substituted or unsubstituted indole ring, a substituted or unsubstituted indene ring, a substituted or unsubstituted benzene ring, or a substituted or unsubstituted carbazole ring, etc.

In addition, "substituted" in the expression "substituted or unsubstituted" means that a hydrogen atom in a certain functional group is replaced with another atom or functional group, i.e., a substituent, and substituted with a group to which two or more substituents are connected among the substituents. For example, "a substituent to which two or more substituents are connected" may be pyridine-triazine. That is, pyridine-triazine may be heteroaryl or may be interpreted as one substituent in which two heteroaryls are connected. Preferably, the substituents of a substituted alkyl, a substituted alkenyl, a substituted aryl(ene) a substituted heteroaryl(ene), a substituted phenyl, a substituted naphthyl (ene), a substituted biphenyl, a substituted terphenyl, a substituted dibenzofuranyl, a substituted dibenzothiophenyl, and a substituted carbazolyl in the formulas of the present disclosure each independently represent at least one selected from the group consisting of deuterium; halogen; cyano; carboxyl; nitro; hydroxy; phosphineoxide; (C1-C30)alkyl; halo(C1-C30)alkyl; (C2-C30)alkenyl; (C2-C30)alkynly; (C1-C30)alkoxy; (C1-C30)alkylthio; (C3-C30)cycloalkyl; (C3-C30)cycloalkenyl; (3- to 7-membered)heterocycloalkyl; (C6-C30)aryloxy; (C6-C30)arylthio; (3- to 30-membered)heteroaryl unsubstituted or substituted with deuterium; (C6-C30)aryl unsubstituted or substituted with deuterium; tri(C1-C30)alkylsilyl; tri(C6-C30)arylsilyl; di(C1-C30)alkyl(C6-C30)arylsilyl; (C1-C30)alkyldi(C6-C30)arylsilyl; amino, mono- or di-(C1-C30)alkylamino; mono- or di-(C2-C30)alkenylamino; mono- or di-(C6-C30) arylamino; mono- or di-(3- to 30-membered)heteroarylamino; (C1-C30)alkyl(C2-C30)alkenylamino; (C1-C30)alkyl(C6-C30)arylamino; (C1-C30)alkyl(3- to 30-membered) heteroarylamino; (C2-C30)alkenyl(C6-C30)arylamino; (C2-C30)alkenyl(3- to 30-membered)heteroarylamino; (C6-C30)aryl(3- to 30-membered)heteroarylamino; (C1-C30) alkylcarbonyl; (C1-C30)alkoxycarbonyl; (C6-C30) arylcarbonyl; (C6-C30)arylphosphine; di(C6-C30) arylboronyl; di(C1-C30)alkylboronyl; (C1-C30)alkyl(C6-C30)arylboronyl; (C6-C30)ar(C1-C30)alkyl; and (C1-C30)

alkyl(C6-C30)aryl. For example, the substituents of above substituented compounds may be deuterium, methyl, phenyl, naphthyl, p-biphenyl, m-biphenyl, o-biphenyl, p-terphenyl, m-terphenyl, triphenylenyl, diphenylfluorenyl, spirobifluorenyl, dibenzofuranyl, dibenzothiophenyl, carbazolyl, and benzocarbazolyl, etc.

Hereinafter, the plurality of host materials according to one embodiment will be described.

A plurality of host materials according to one embodiment is a plurality of host materials comprising at least one first host material and at least one second host material, wherein the first host material is a compound represented by Formula 1, and the second host material is a compound represented by Formula 2. The plurality of host materials may be included in a light-emitting layer of an organic electroluminescent device according to one embodiment.

The first host material as the host materials according to one embodiment is represented by the following Formula 1.

(1)

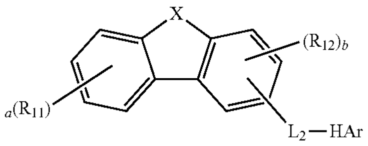

in Formula 1,

X represents O, S, Se, $CR_{13}R_{14}$, or $NR_{15}$;

$R_{11}$ and $R_{12}$ each independently represent hydrogen, deuterium, a substituted or unsubstituted (C6-C30)aryl, a substituted or unsubstituted (3- to 30-membered)heteroaryl, or —$SiR_{16}R_{17}R_{18}$;

$R_{13}$ to $R_{18}$ each independently represent hydrogen, deuterium, a substituted or unsubstituted (C1-C30)alkyl, a substituted or unsubstituted (C6-C30)aryl, or a substituted or unsubstituted (3- to 30-membered)heteroaryl;

$L_2$ represents a single bond, a substituted or unsubstituted (C6-C30)arylene, or a substituted or unsubstituted (3- to 30-membered)heteroarylene;

HAr represents a substituted or unsubstituted (3- to 30-membered)heteroaryl containing at least one nitrogen atom(s);

a represents an integer of 1 to 4, and b represents an integer of 1 to 3;

when a and b are 2 or more, each of $R_{11}$ and each of $R_{12}$ may be the same or different.

In one embodiment, X may be O, S, or Se.

In one embodiment, $R_{11}$ and $R_{12}$ each independently may be hydrogen, deuterium, a substituted or unsubstituted (C6-C30)aryl, or a substituted or unsubstituted (5- to 30-membered)heteroaryl, preferably, hydrogen, deuterium, a substituted or unsubstituted (C6-C25)aryl, or a substituted or unsubstituted (5- to 25-membered)heteroaryl, more preferably, hydrogen, deuterium, a substituted or unsubstituted (C6-C25)aryl, or a substituted or unsubstituted (5- to 18-membered)heteroaryl. For example, $R_{11}$ and $R_{12}$ each independently may be hydrogen, deuterium, a substituted or unsubstituted phenyl, a substituted or unsubstituted biphenyl, a substituted or unsubstituted carbazolyl, a substituted or unsubstituted triphenylenyl, a substituted or unsubstituted fluorenyl, a substituted or unsubstituted spirobifluorenyl, a substituted or unsubstituted dibenzofuranyl, a substituted or unsubstituted dibenzothiophenyl, a substituted or unsubstituted dibenzoselenophenyl, or a substituted or unsubstituted benzothienocarbazolyl. For example, the substituents of the above substituented compounds may be phenyl.

In one embodiment, $L_2$ may be a single bond or a substituted or unsubstituted (C6-C30)arylene, preferably, a single bond or a substituted or unsubstituted (C6-C25) arylene, more preferably, a single bond or a substituted or unsubstituted (C6—C18)arylene. For example, $L_2$ may be a single bond, phenylene unsubstituted or substituted with deuterium, or naphthylene unsubstituted or substituted with deuterium.

In one embodiment, HAr may be a substituted or unsubstituted (5- to 30-membered)heteroaryl containing at least one nitrogen atom(s), preferably, a substituted or unsubstituted (5- to 30-membered)heteroaryl containing at least two nitrogen atoms, more preferably, a substituted or unsubstituted (5- to 30-membered)heteroaryl containing at least three nitrogen atoms. For example, HAr may be a substituted or unsubstituted triazinyl, a substituted or unsubstituted pyridyl, a substituted or unsubstituted pyrimidinyl, a substituted or unsubstituted quinazolinyl, a substituted or unsubstituted benzoquinazolinyl, a substituted or unsubstituted quinoxalinyl, a substituted or unsubstituted benzoquinoxalinyl, a substituted or unsubstituted quinolyl, a substituted or unsubstituted benzoquinolyl, a substituted or unsubstituted isoquinolyl, a substituted or unsubstituted benzoisoquinolyl, a substituted or unsubstituted triazolyl, a substituted or unsubstituted pyrazolyl, a substituted or unsubstituted naphthyridinyl, a substituted or unsubstituted benzothienopyrimidinyl, a substituted or unsubstituted carbazolyl, or a substituted or unsubstituted pyridopyrazinyl. Wherein, the substituents of the above substituented compounds may be (C6-C30)aryl unsubstituted or substituted with at least one of deuterium, tri(C6-C30)arylsilyl, and (3- to 30-membered)heteroaryl, or (3- to 30-membered)heteroaryl unsubstituted or substituted with at least one of deuterium and (C6-C30)aryl. For example, the substituents of the above substituented compounds may be at least one of phenyl unsubstituted or substituted with at least one of deuterium, naphthyl, dibenzofuranyl, carbazolyl, and triphenylsilyl, naphthyl unsubstituted or substituted with phenyl, a substituted or unsubstituted p-biphenyl, a substituted or unsubstituted m-biphenyl, a substituted or unsubstituted o-biphenyl, a substituted or unsubstituted p-terphenyl, a substituted or unsubstituted m-terphenyl, a substituted or unsubstituted triphenylenyl, a substituted or unsubstituted diphenylfluorenyl, a substituted or unsubstituted spirobifluorenyl, dibenzofuranyl unsubstituted or substituted with at least one of deuterium and phenyl, dibenzothiophenyl unsubstituted or substituted with at least one deuterium(s), carbazolyl unsubstituted or substituted with at least of deuterium and phenyl, and a substituted or unsubstituted benzocarbazolyl, preferably, the substituents of the above substituented compounds may be further substituent with at least one deuterium(s).

According to one embodiment, the host material represented by Formula 1 may be represented by the following Formula 1-A.

(1-A)

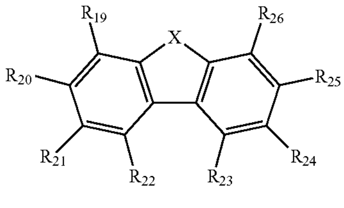

in Formula 1-A,

X represents as defined in Formula 1;

$R_{19}$ to $R_{26}$ each independently represent hydrogen, deuterium, (C6-C18)aryl unsubstituted or substituted with at least one of deuterium, (C1-C6)alkyl, and (C6-C18) aryl, a substituted or unsubstituted (3- to 30-membered) heteroaryl, or the following Formula 1-a; provided that at least one of $R_{19}$ to $R_{26}$ is(are) the following Formula 1-a;

(1-a)

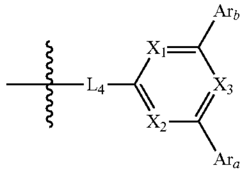

in Formula 1-a, $L_4$ represents a single bond or a substituted or unsubstituted (C6-C30)arylene;

$X_1$ to $X_3$ each independently represent CR or N; provided that at least two of $X_1$ to $X_3$ are N; and $Ar_a$ and $Ar_b$ each independently represent a substituted or unsubstituted (C6-C30)aryl or a substituted or unsubstituted (3- to 30-membered)heteroaryl.

In one embodiment, $L_4$ may be a single bond or a substituted or unsubstituted (C6-C30)arylene, preferably, a single bond or a substituted or unsubstituted (C6-C25) arylene, more preferably, a single bond or a substituted or unsubstituted (C6-C18)arylene. For example, $L_4$ may b a single bond, phenylene unsubstituted or substituted with deuterium, or naphthylene unsubstituted or substituted with deuterium.

In one embodiment, $Ar_a$ and $Ar_b$ each independently may be a substituted or unsubstituted phenyl, a substituted or unsubstituted naphthyl, a substituted or unsubstituted biphenyl, a substituted or unsubstituted terphenyl, a substituted or unsubstituted chrysenyl, a substituted or unsubstituted phenanthrenyl, a substituted or unsubstituted carbazolyl, a substituted or unsubstituted dibenzofuranyl, a substituted or unsubstituted dibenzothiophenyl, or a combination thereof.

According to one embodiment, the host material represented by Formula 1 may be represented by the following Formula 1-1.

(1-1)

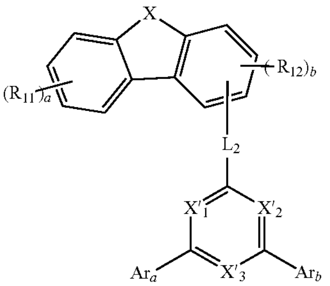

in Formula 1-1,

X, $R_{11}$, $R_{12}$, $L_2$, a, and b are as defined in Formula 1;

$X'_1$ to $X'_3$ each independently represent CR' or N; provided that at least two of $X'_1$ to $X'_3$ are N;

R' represents hydrogen or deuterium; and $Ar_a$ and $Ar_b$ each independently represent a substituted or unsubstituted (C6-C30)aryl or a substituted or unsubstituted (3- to 30-membered)heteroaryl.

In one embodiment, all of $X'_1$ to $X'_3$ may be N.

In one embodiment, $L_2$ may be a single bond or a substituted or unsubstituted (C6-C30)arylene, preferably, a single bond or a substituted or unsubstituted (C6-C25) arylene, more preferably, a single bond or a substituted or unsubstituted (C6-C18)arylene. For example, $L_2$ may be a single bond, phenylene unsubstituted or substituted with deuterium, or naphthylene unsubstituted or substituted with deuterium.

In one embodiment, $Ar_a$ and $Ar_b$ each independently may be a substituted or unsubstituted (C6-C30)aryl or a substituted or unsubstituted (5- to 30-membered)heteroaryl, preferably, a substituted or unsubstituted (C6-C25)aryl or a substituted or unsubstituted (5- to 25-membered)heteroaryl, more preferably, (C6-C25)aryl unsubstituted or substituted with at least one of deuterium, tri(C6-C30)arylsilyl, and (3- to 30-membered)heteroaryl or (5- to 18-membered)heteroaryl unsubstituted or substituted with at least one of deuterium and (C6-C30)aryl. For example, $Ar_a$ and $Ar_b$ each independently may be phenyl unsubstituted or substituted with at least one of deuterium, naphthyl, dibenzofuranyl, carbazolyl, and triphenylsilyl, naphthyl unsubstituted or substituted with phenyl, a substituted or unsubstituted p-biphenyl, a substituted or unsubstituted m-biphenyl, a substituted or unsubstituted o-biphenyl, a substituted or unsubstituted p-terphenyl, a substituted or unsubstituted m-terphenyl, a substituted or unsubstituted triphenylenyl, a substituted or unsubstituted diphenylfluorenyl, a substituted or unsubstituted spirobifluorenyl, dibenzofuranyl unsubstituted or substituted with at least one of deuterium and phenyl, dibenzothiophenyl unsubstituted or substituted with at least one deuterium(s), carbazolyl unsubstituted or substituted with at least one of deuterium and phenyl, or a substituted or unsubstituted benzocarbazolyl, preferably, the substituents of the above substituented compounds may be further substituent with at least one deuterium(s).

According to one embodiment, the compound represented by Formula 1-1 may be represented by any one of the following Formulas 1-1-1 to 1-1-4.

(1-1-1)

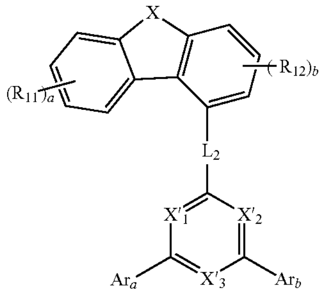

(1-1-2)

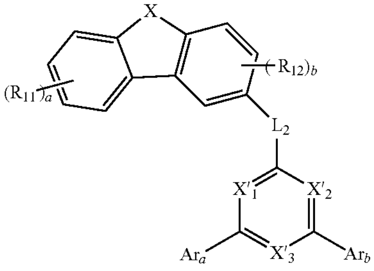

-continued
(1-1-3)
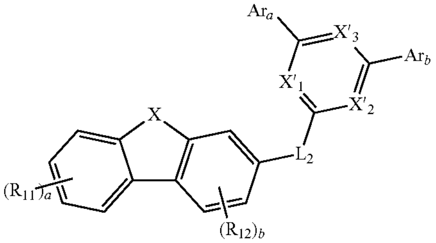
(1-1-4)
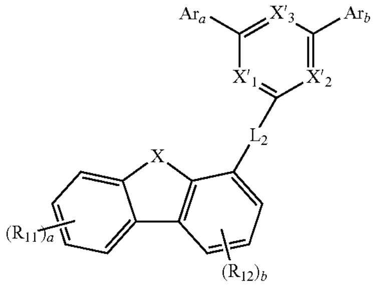
In Formulas 1-1-1 to 1-1-4, X, $X'_1$ to $X'_3$, $R_{11}$, $R_{12}$, $L_2$, $Ar_a$, $Ar_b$, a, and b are as defined in the Formula 1-1.
According to one embodiment, the first host material represented by Formula 1 may be more specifically illustrated by the following compounds, but is not limited thereto.
H1-1
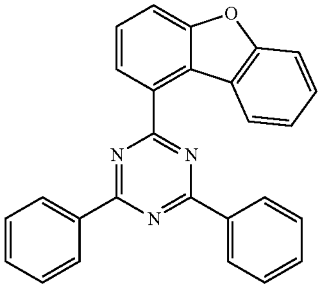
H1-2
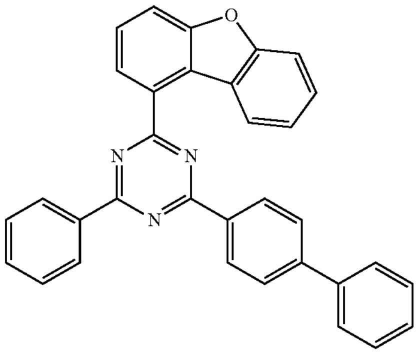
-continued
H1-3
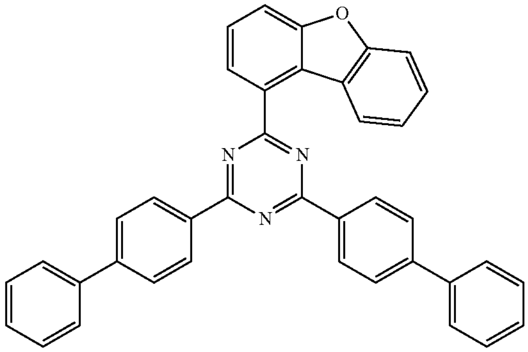
H1-4
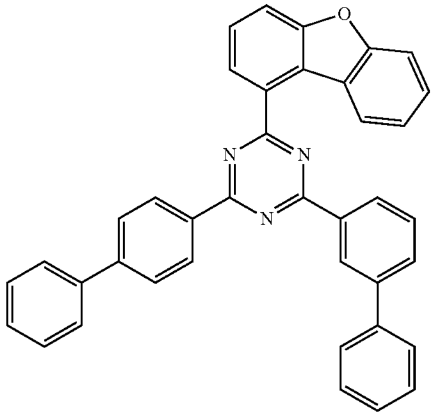
H1-5
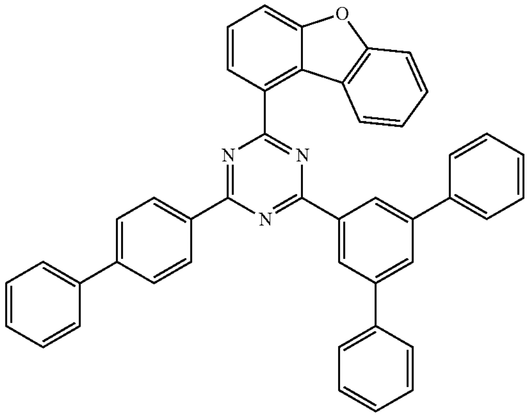

-continued
H1-6
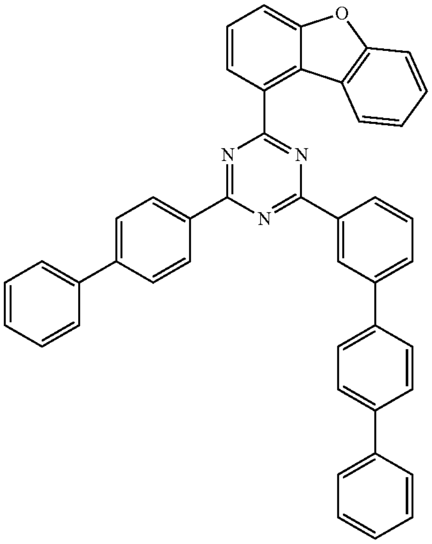
H1-7
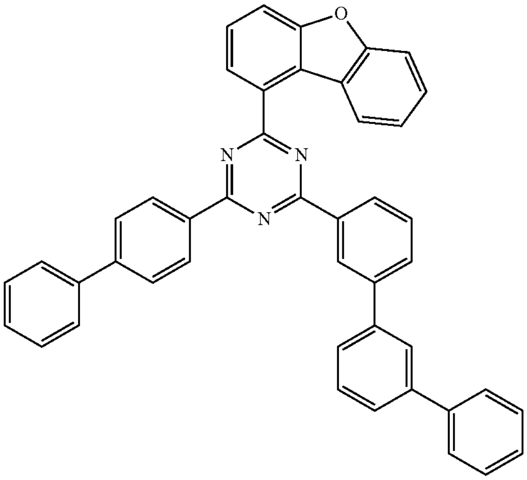
H1-8
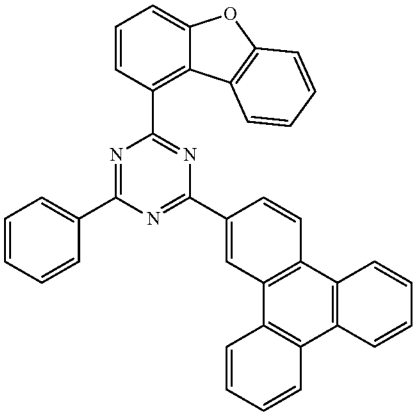
-continued
H1-9
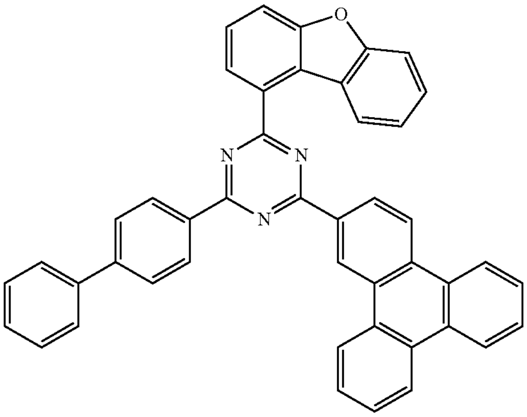
H1-10
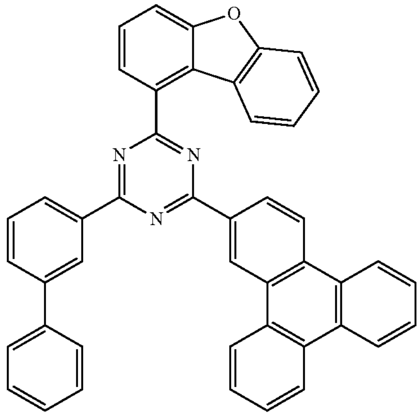
H1-11
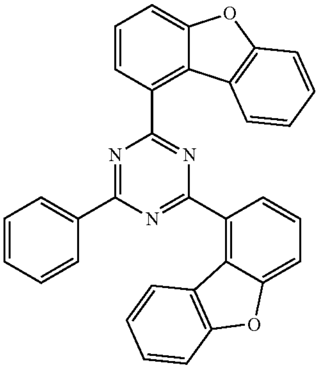
H1-12
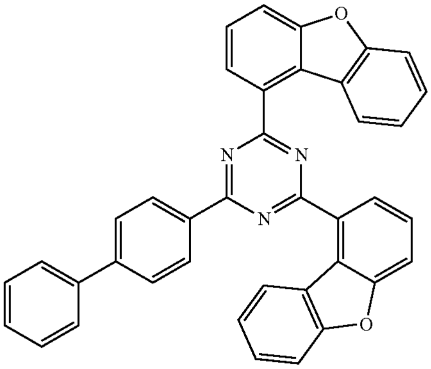

-continued
H1-13
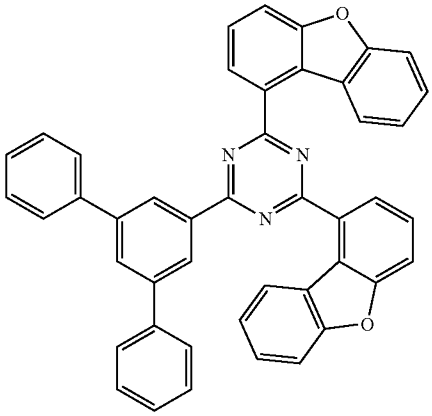
H1-14
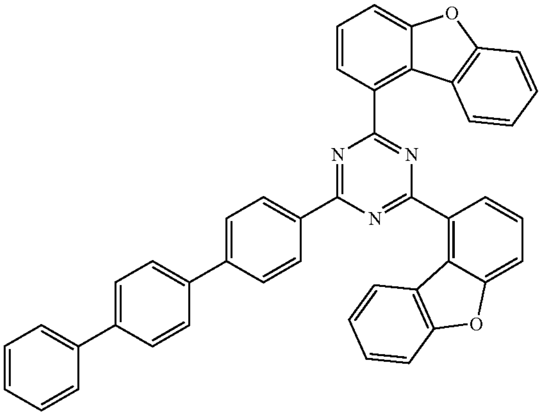
H1-15
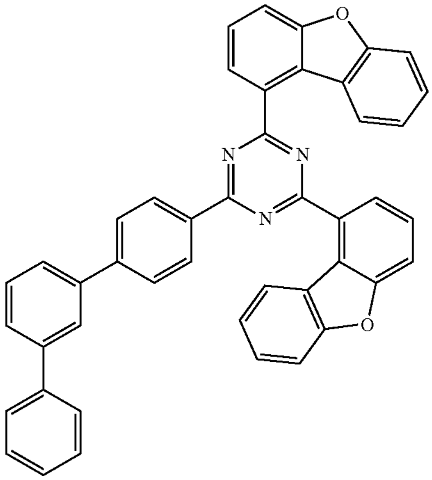
-continued
H1-16
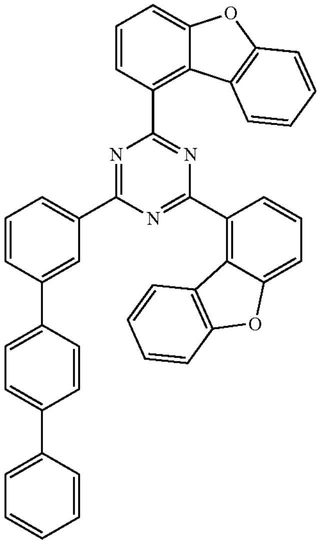
H1-17
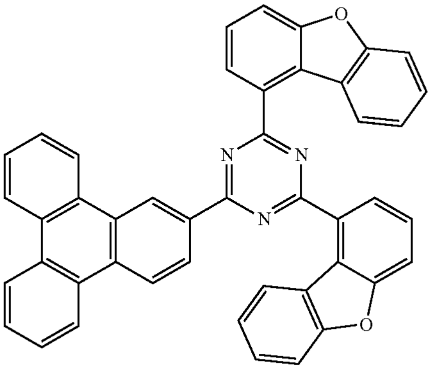
H1-18
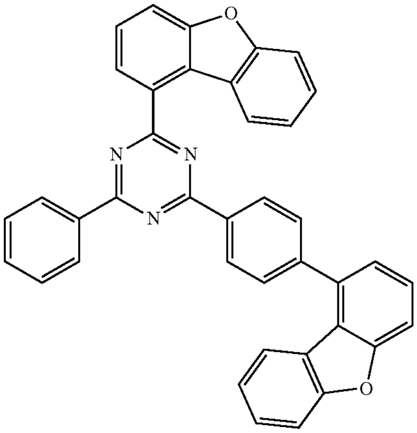

-continued
H1-19
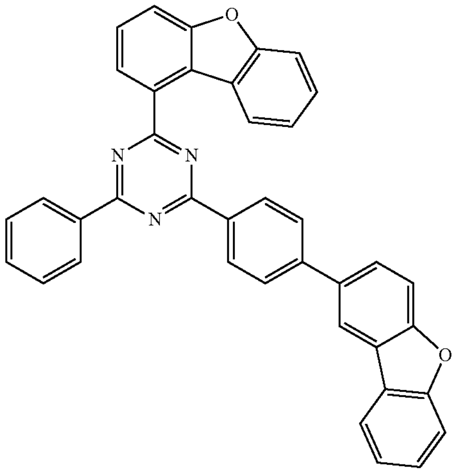
H1-20
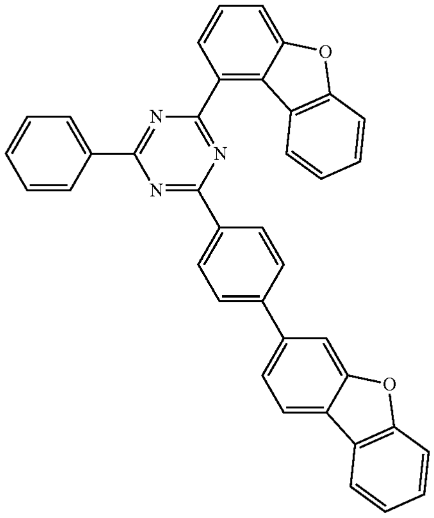
H1-21
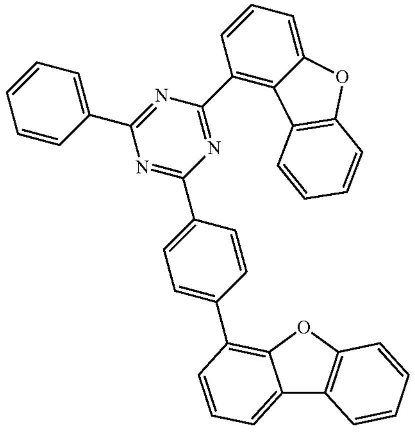
-continued
H1-22
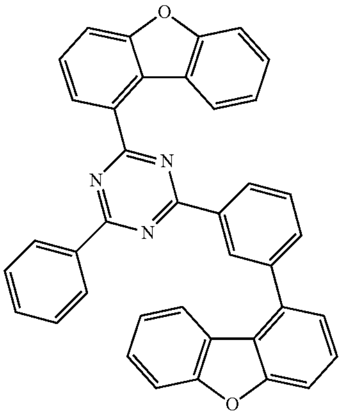
H1-23
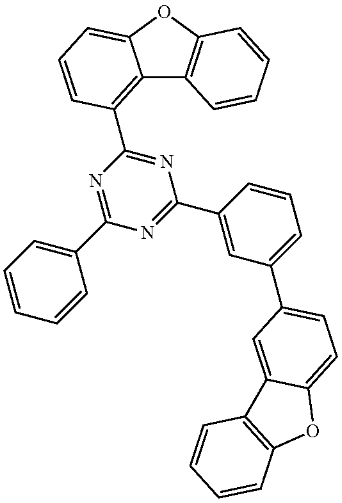
H1-24
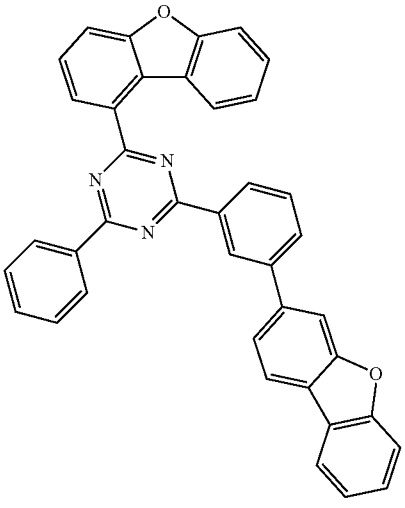

-continued
H1-25
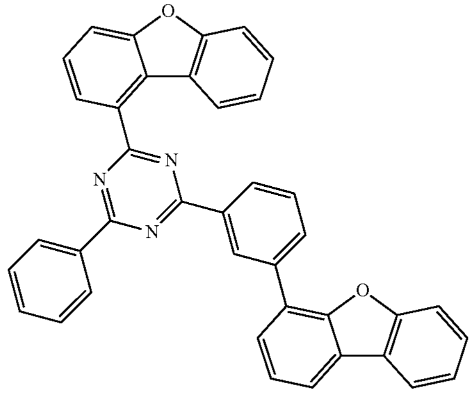
H1-26
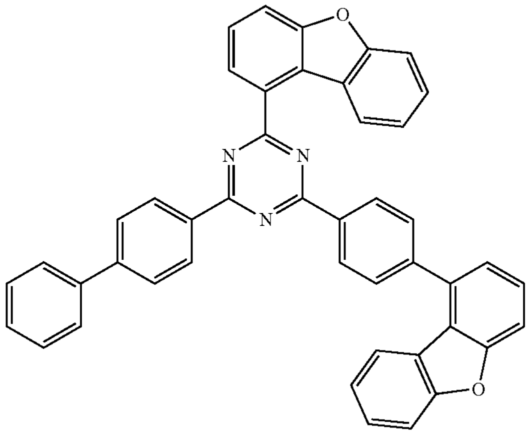
H1-27
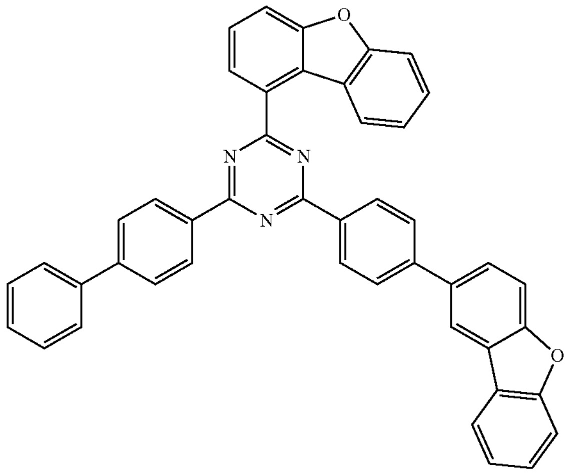
-continued
H1-28
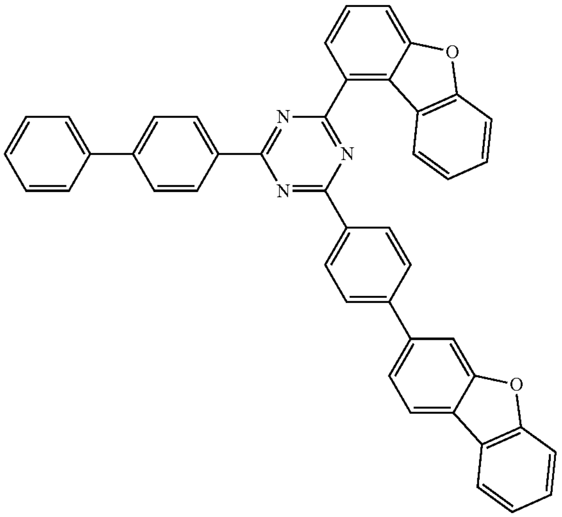
H1-29
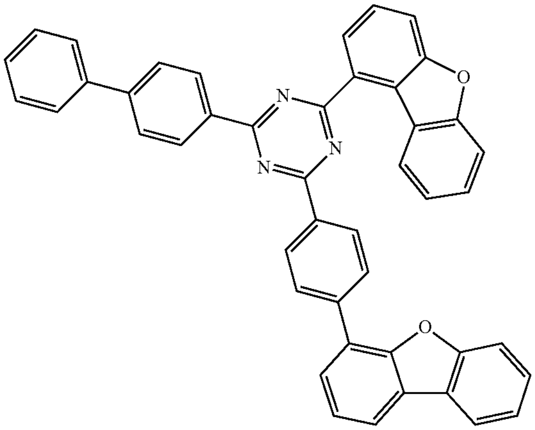
H1-30
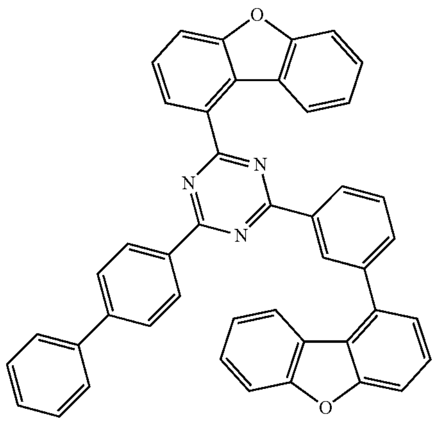

-continued
H1-31
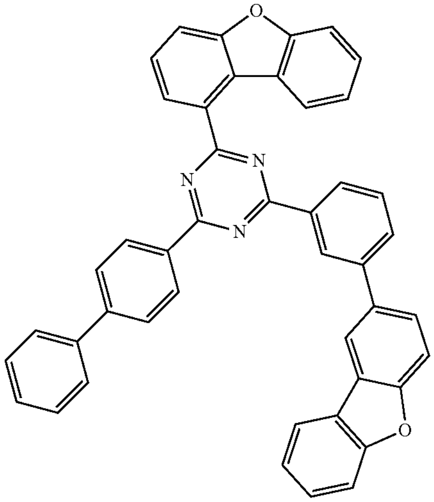
H1-32
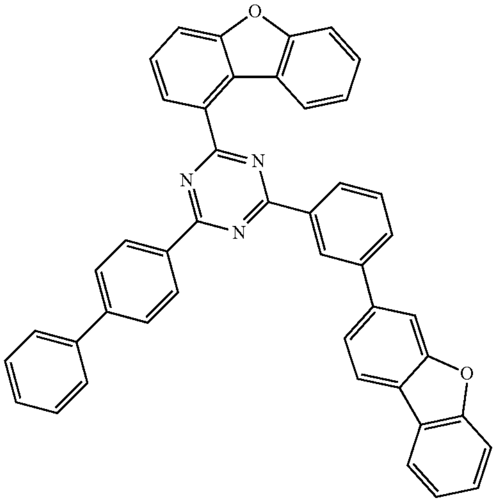
H1-33
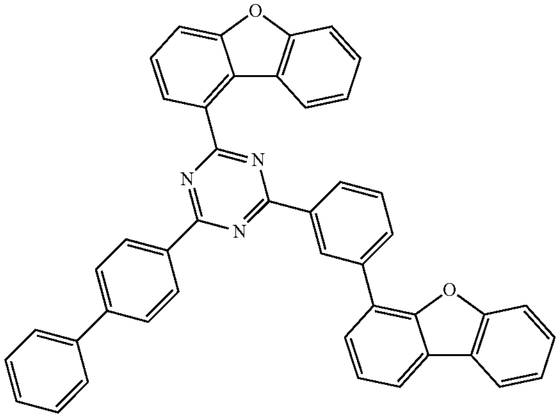
-continued
H1-34
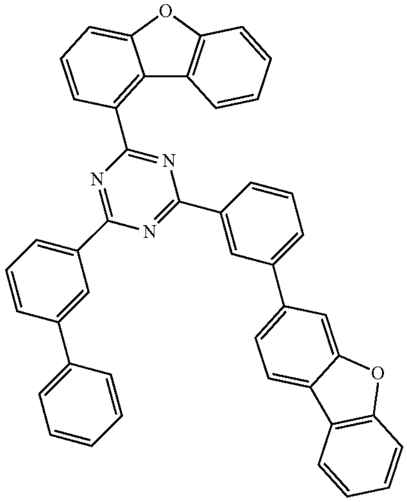
H1-35
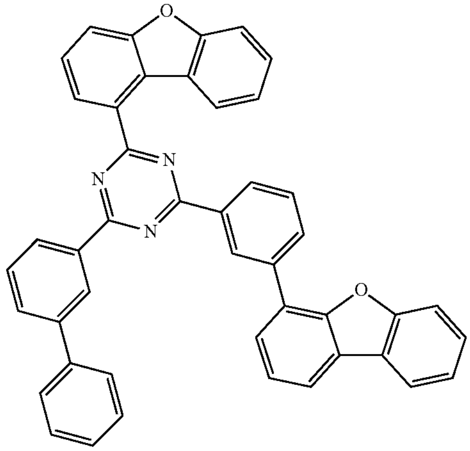
H1-36
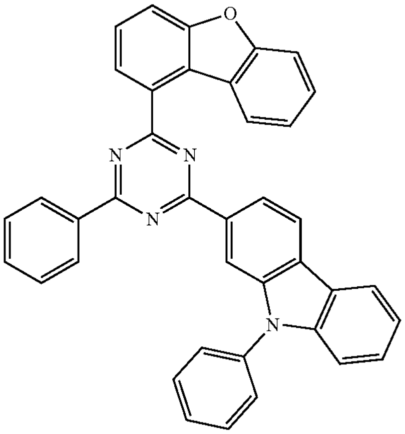

-continued
H1-37
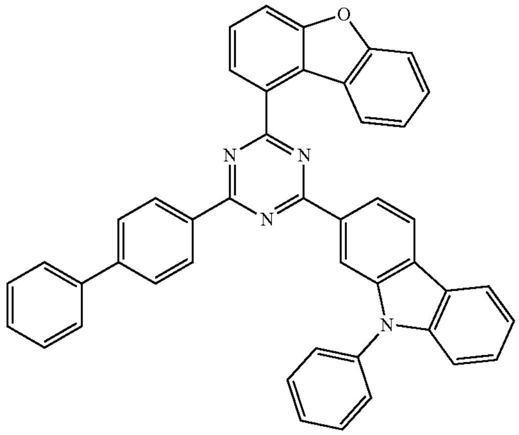
H1-38
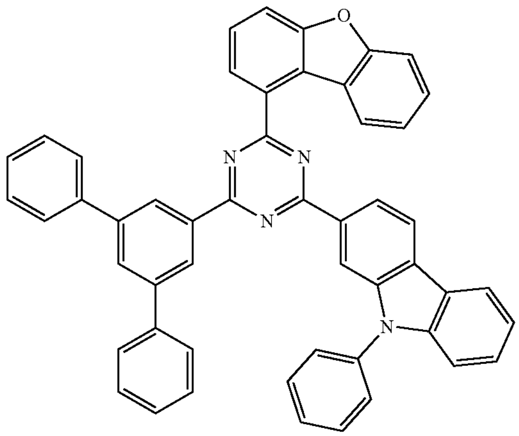
H1-39
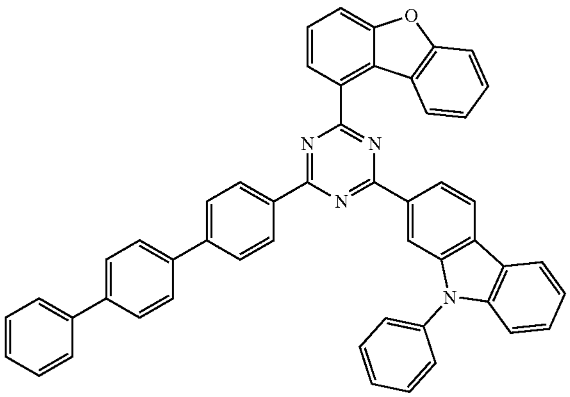
-continued
H1-40
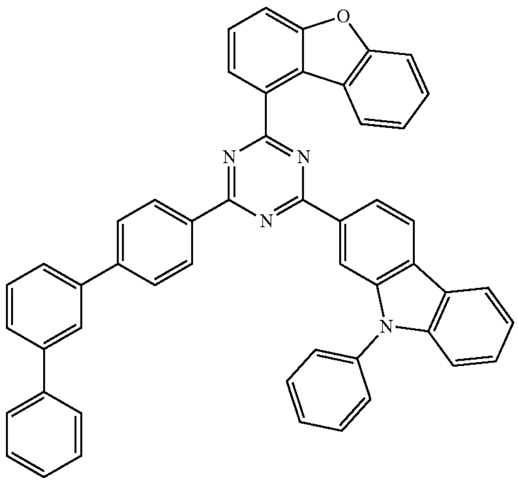
H1-41
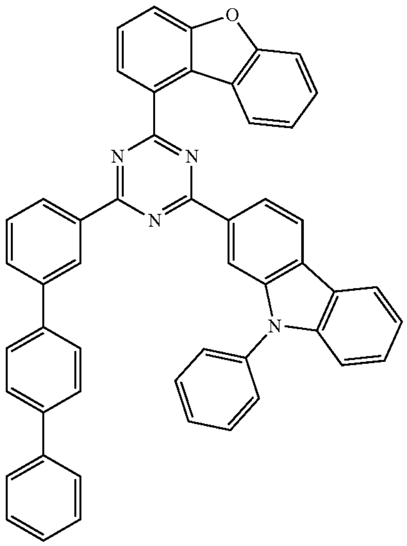
H1-42
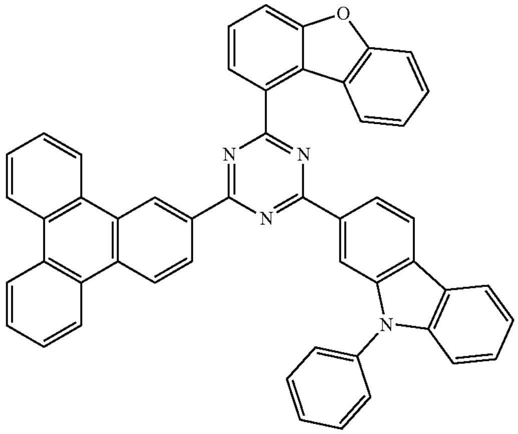

-continued
H1-43
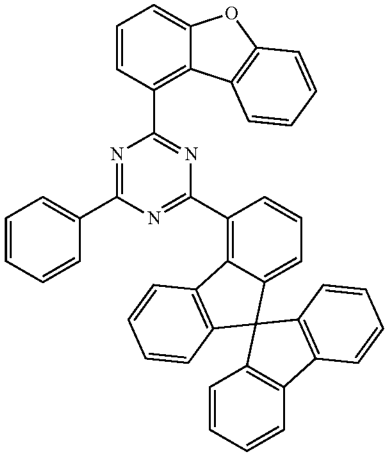
H1-44
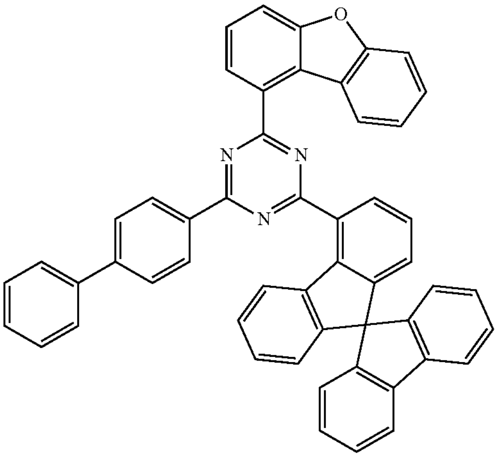
H1-45
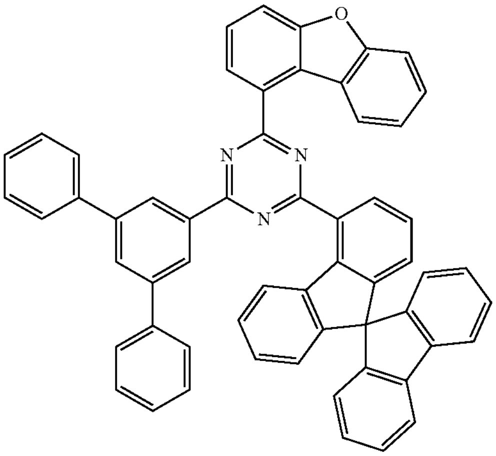
-continued
H1-46
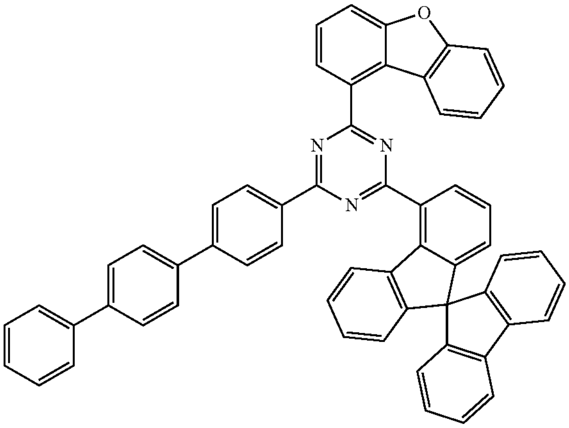
H1-47
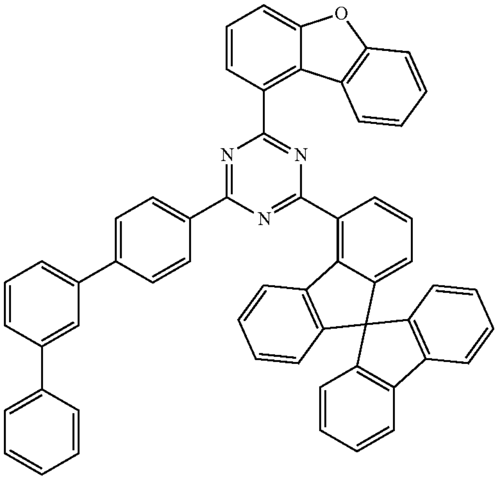
H1-48
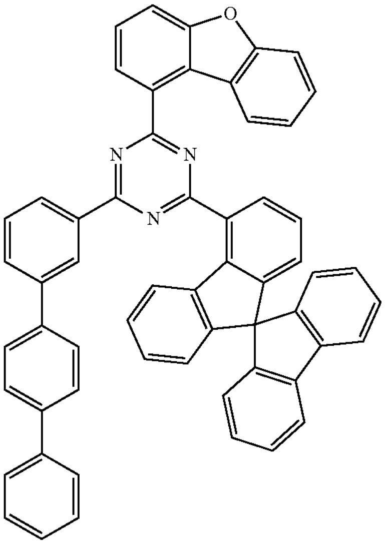

-continued
H1-49
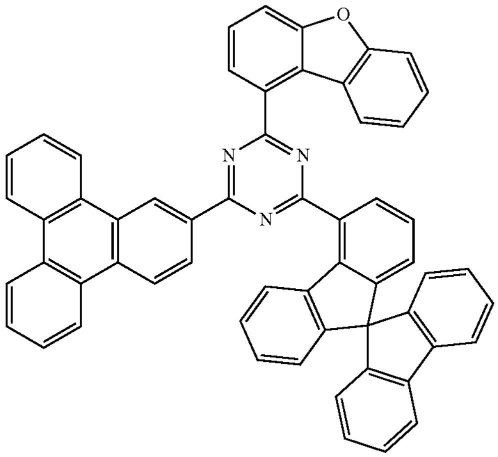
H1-50
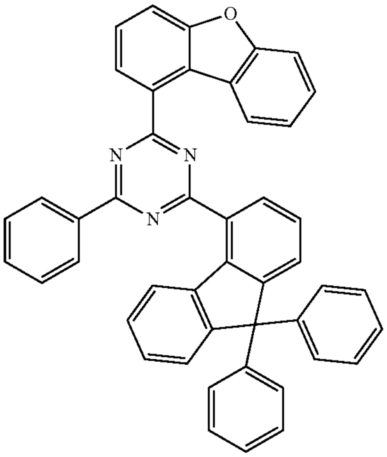
H1-51
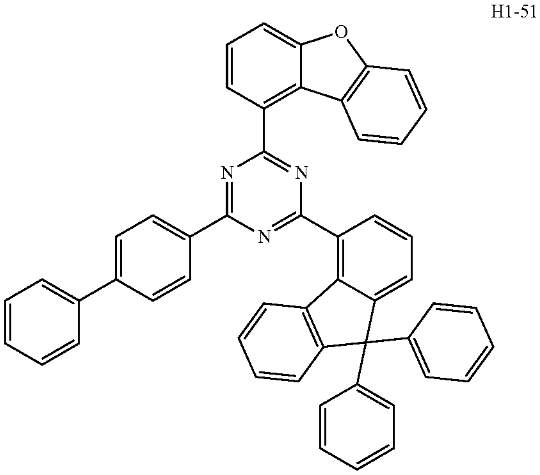
-continued
H1-52
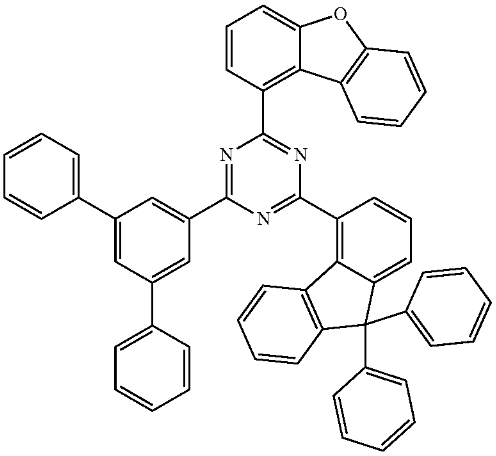
H1-53
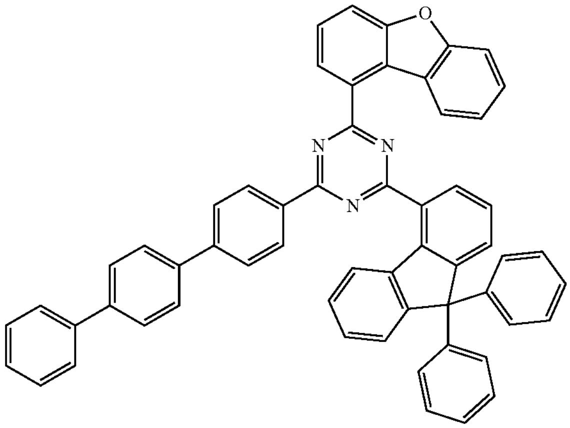
H1-54
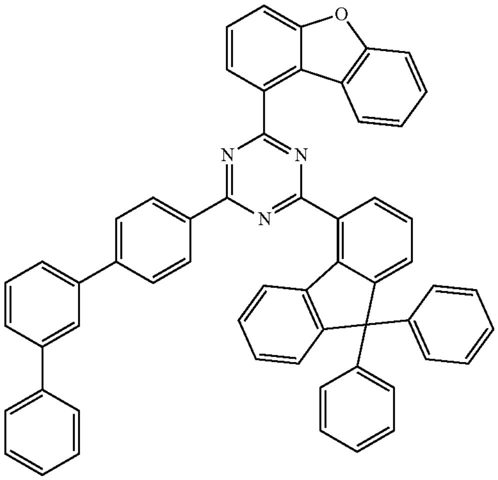

-continued
H1-55
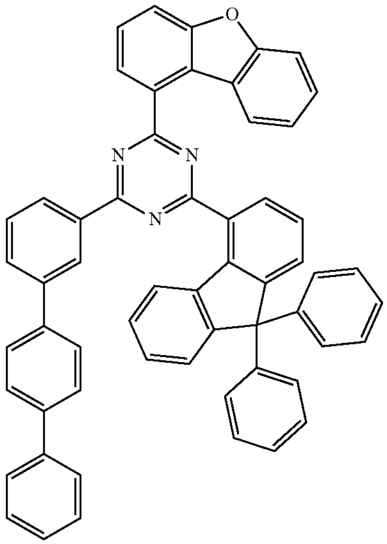
H1-56
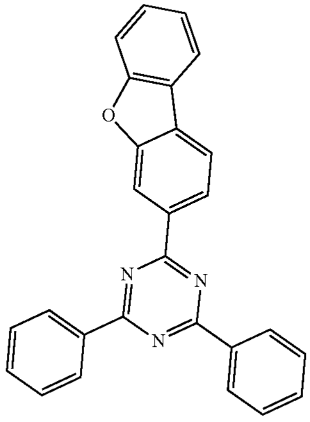
H1-57
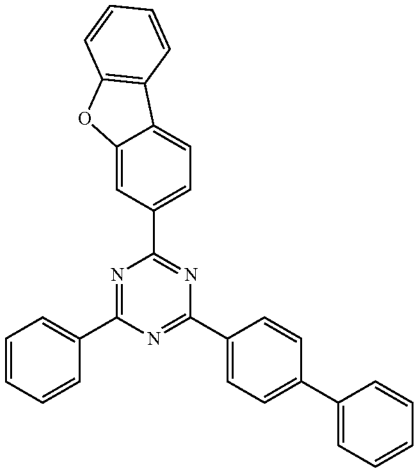
-continued
H1-58
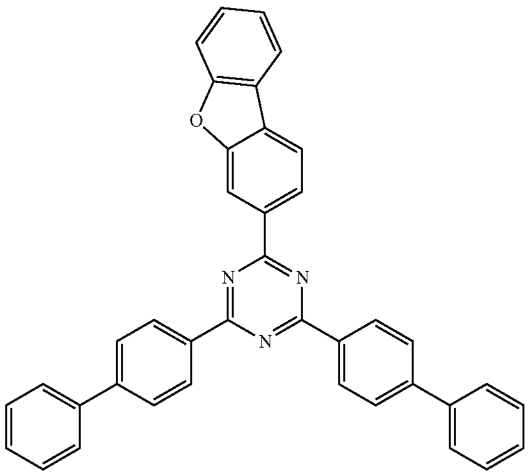
H1-59
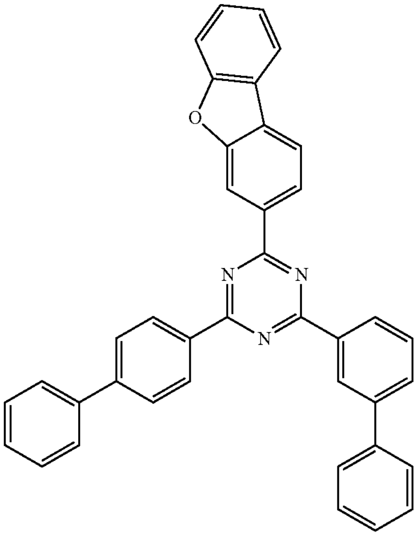
H1-60
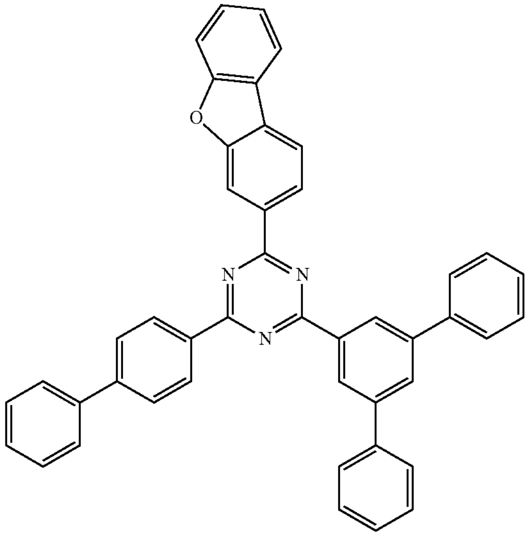

-continued
H1-61
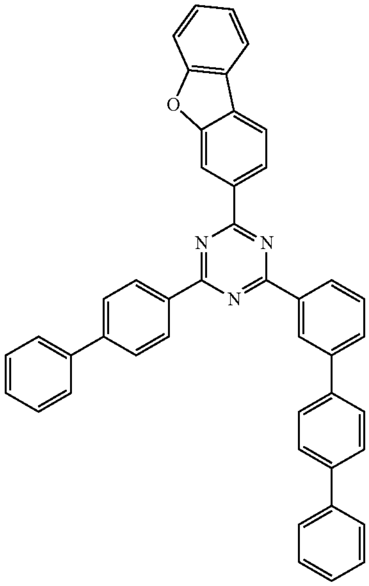
H1-62
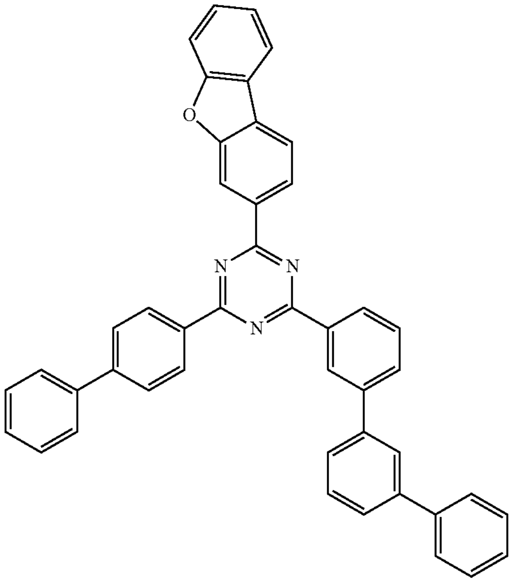
-continued
H1-63
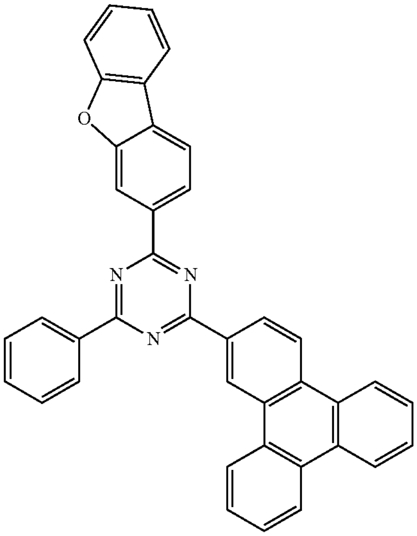
H1-64
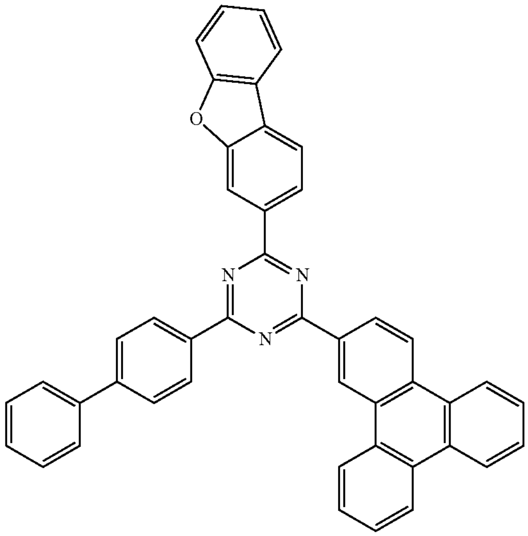
H1-65
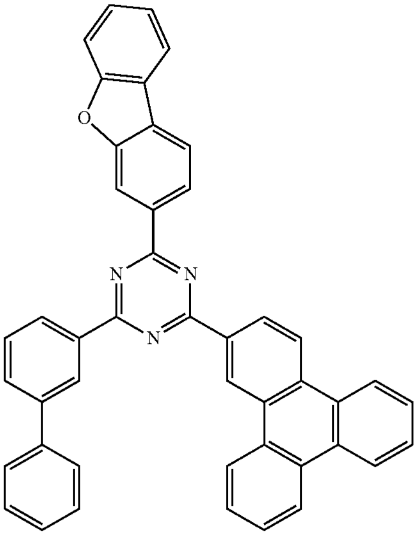

-continued
H1-66
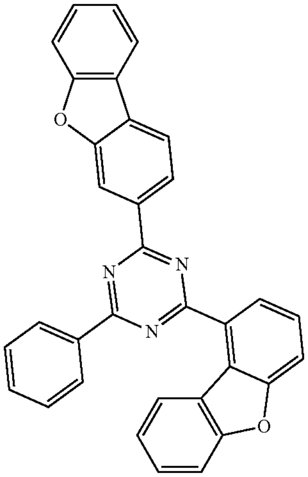
H1-67
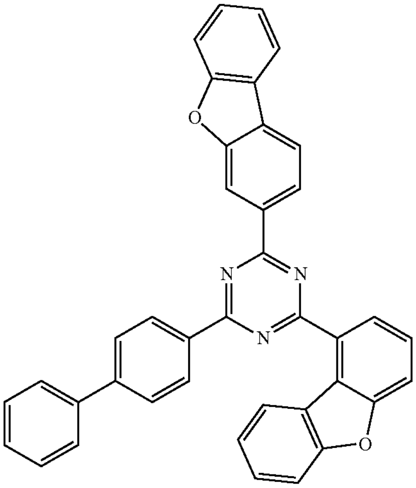
H1-68
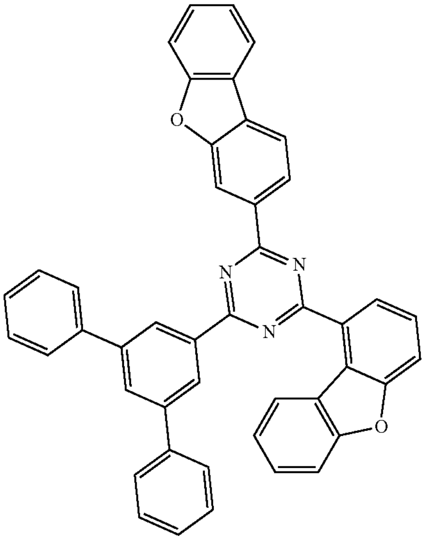
-continued
H1-69
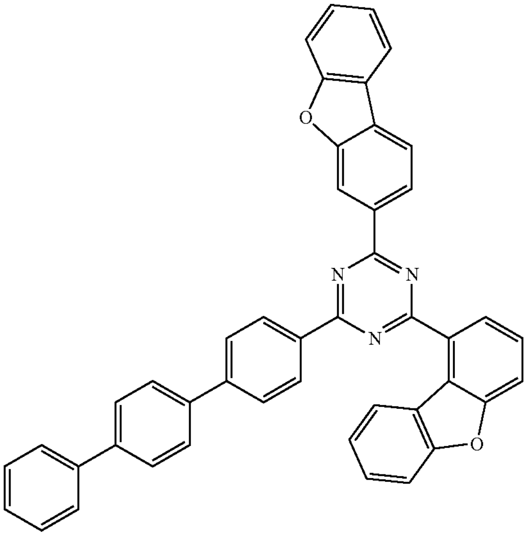
H1-70
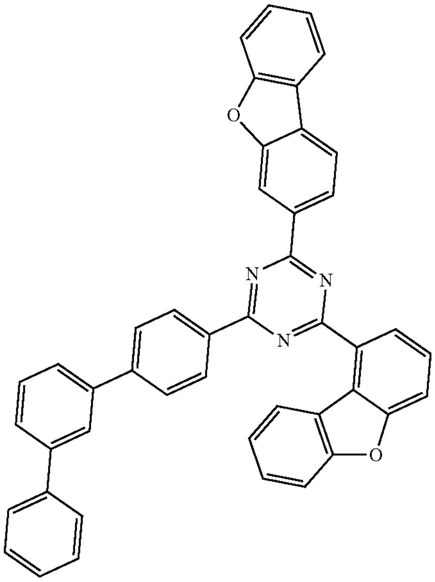

-continued
H1-71
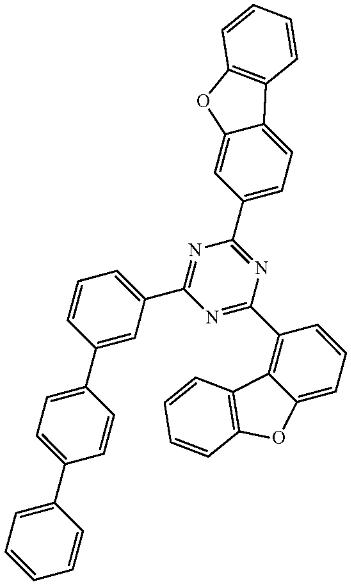
H1-72
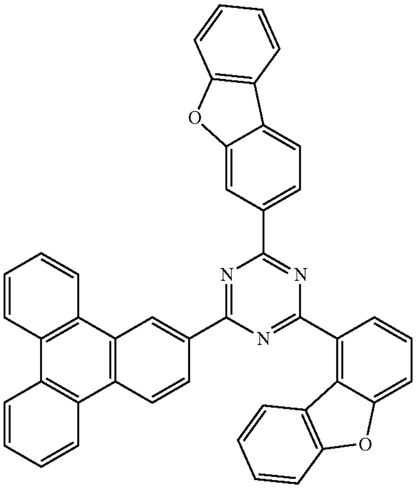
H1-73
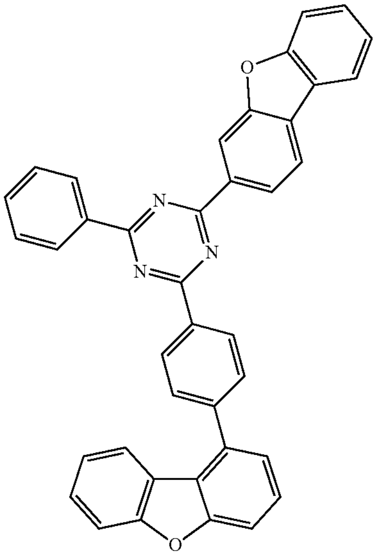
-continued
H1-74
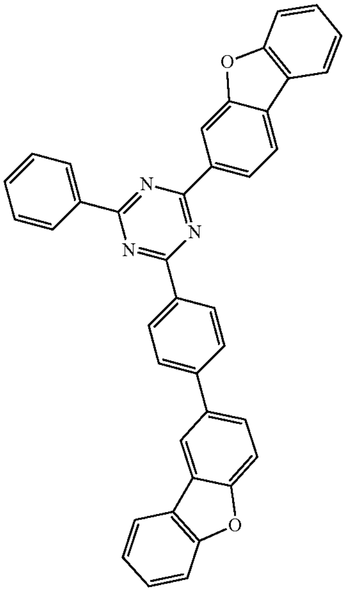
H1-75
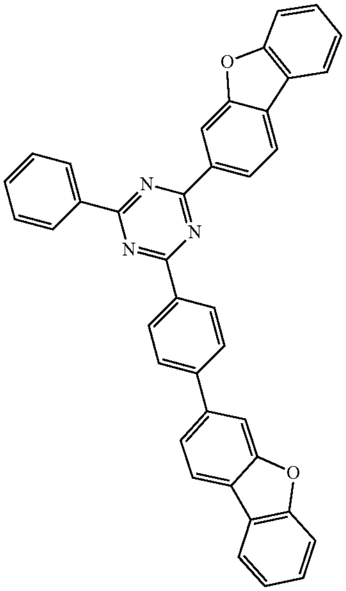
H1-76
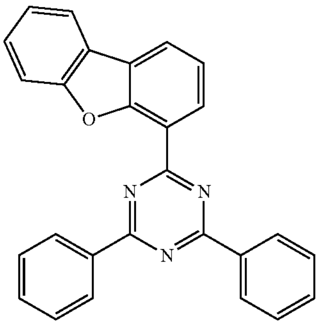

-continued
H1-77
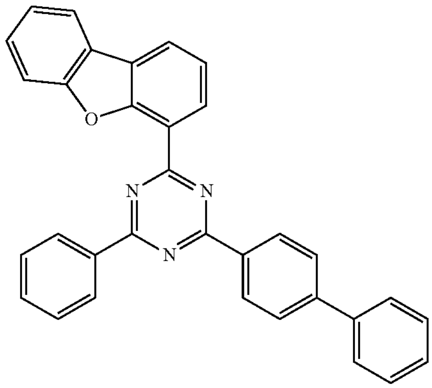
H1-78
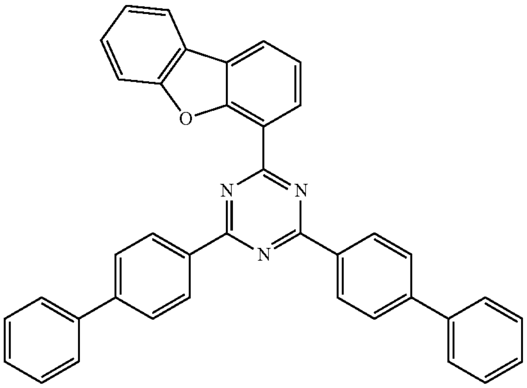
H1-79
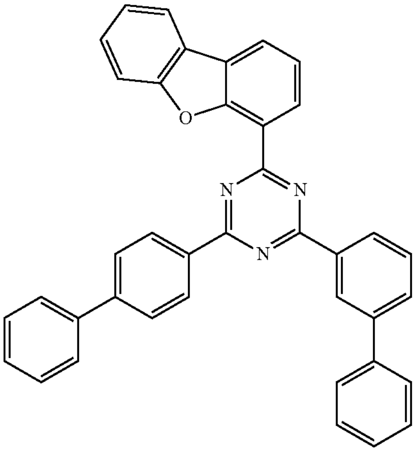
-continued
H1-80
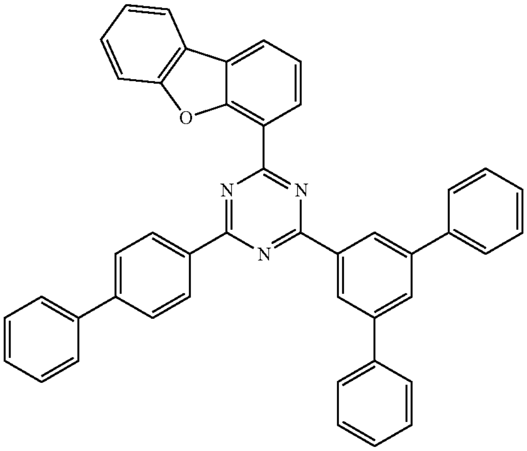
H1-81
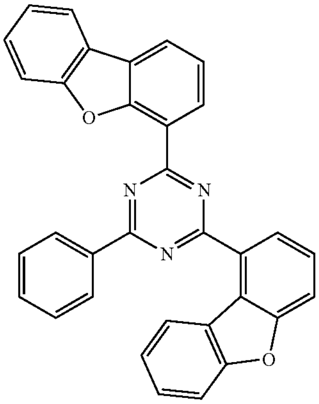
H1-82
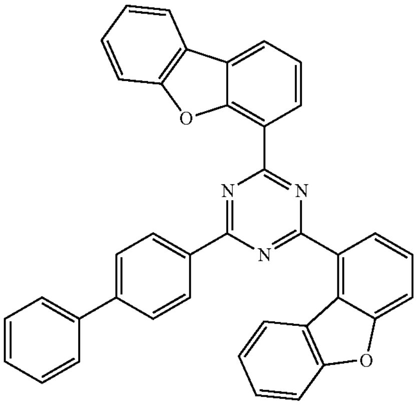

H1-83
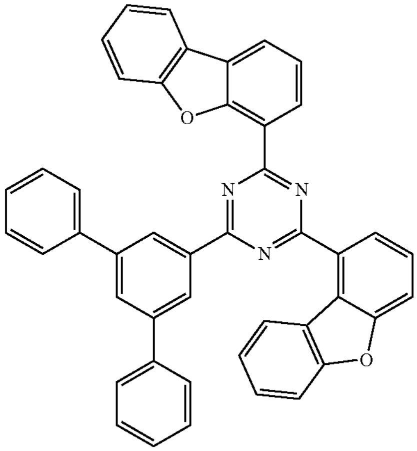
H1-84
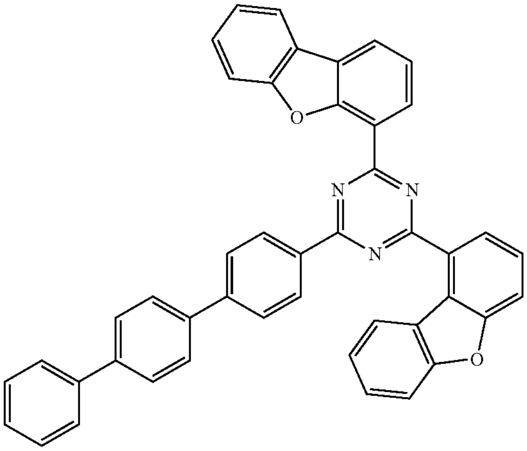
H1-85
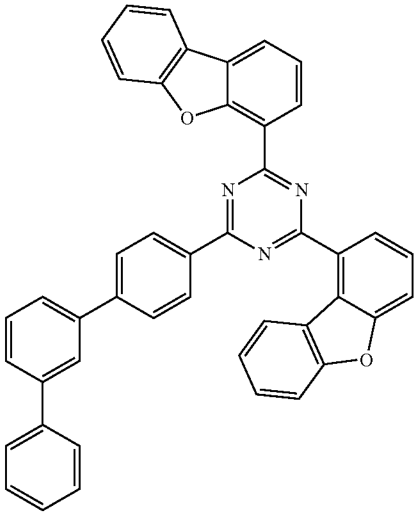
H1-86
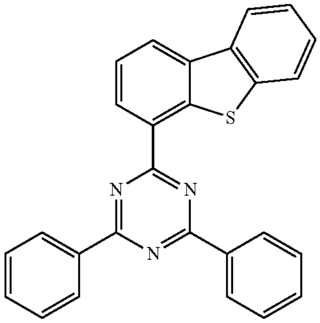
H1-87
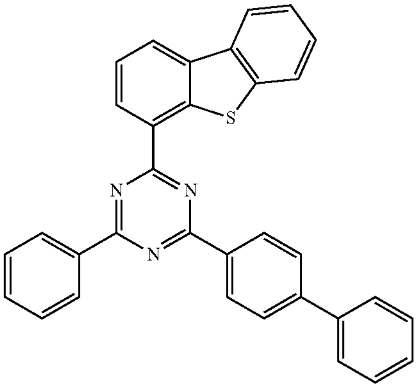
H1-88
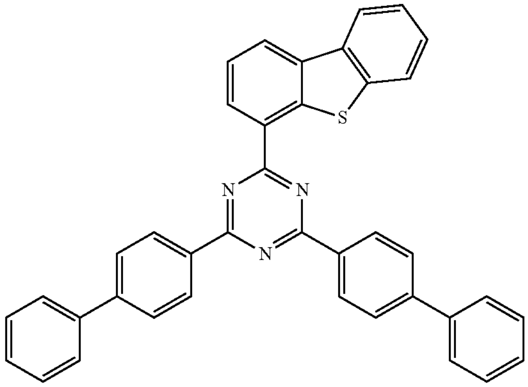
H1-89
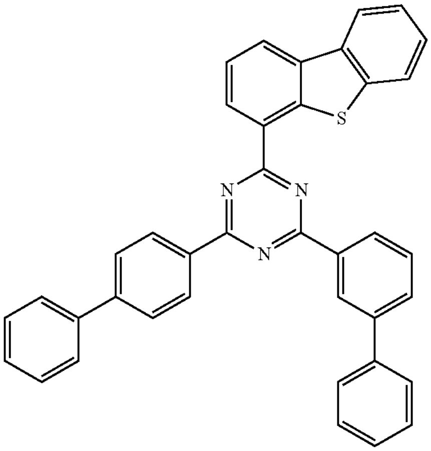

-continued
H1-90
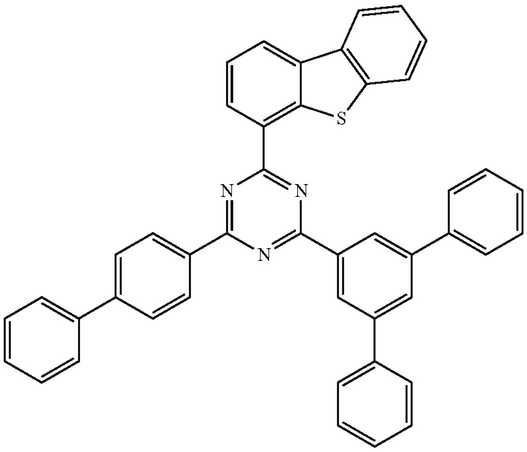
H1-91
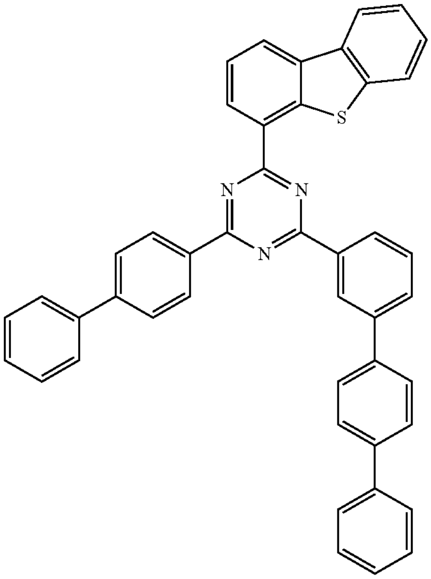
H1-92
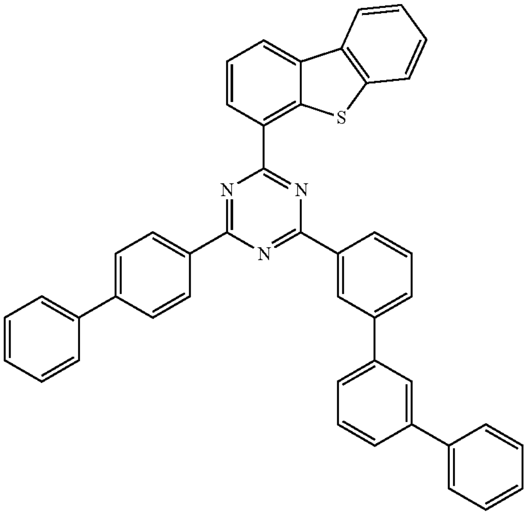
-continued
H1-93
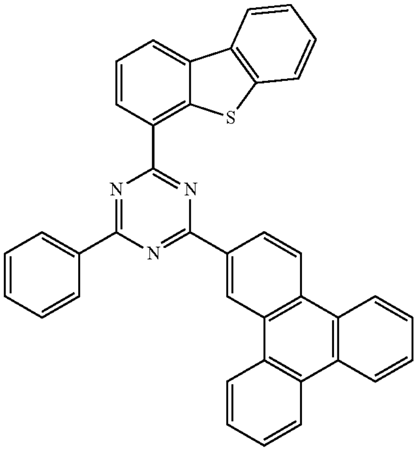
H1-94
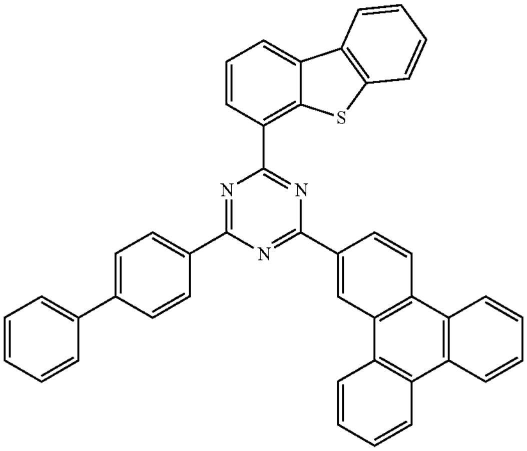
H1-95
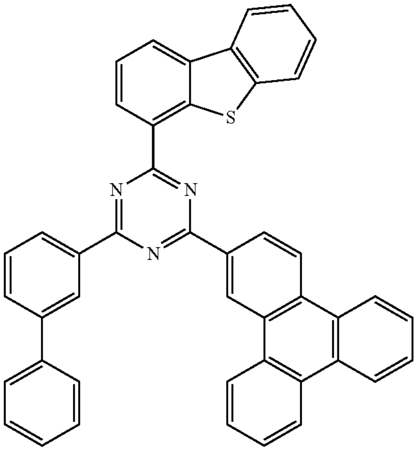

-continued
H1-96
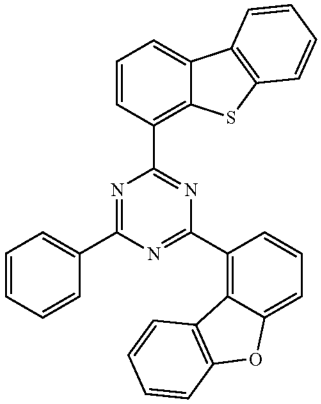
H1-97
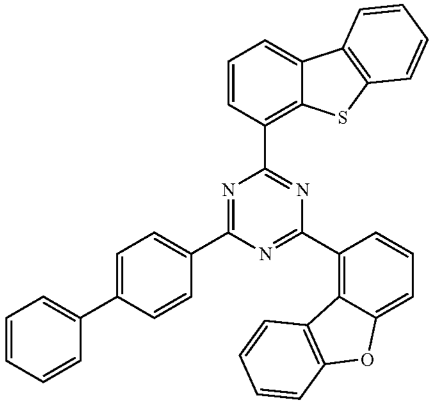
H1-98
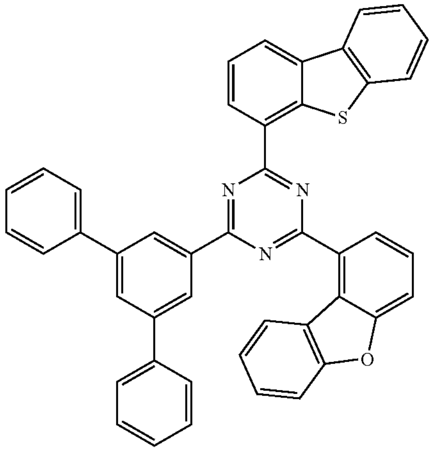
-continued
H1-99
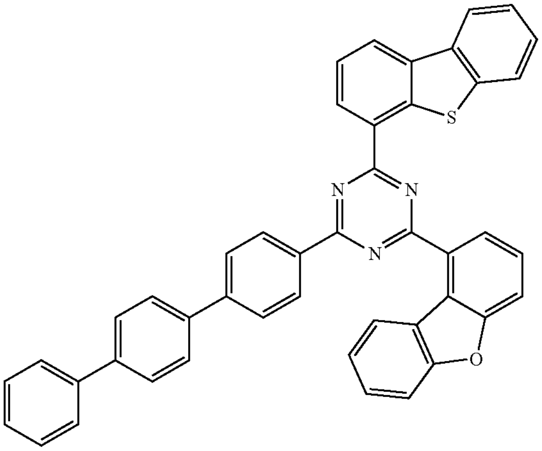
H1-100
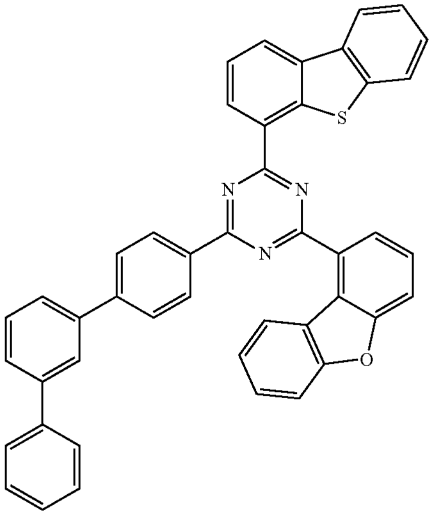
H1-101
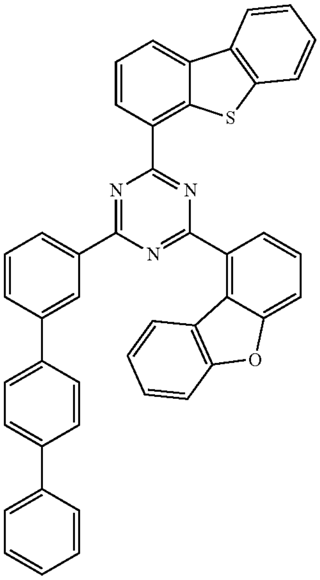

-continued
H1-102
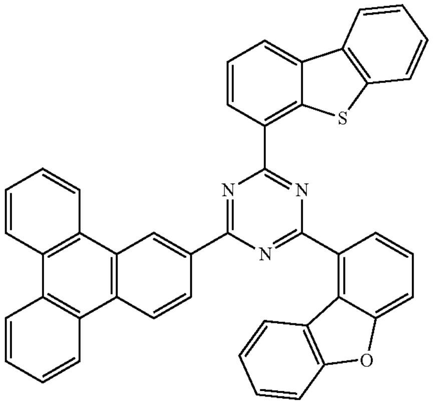
H1-103
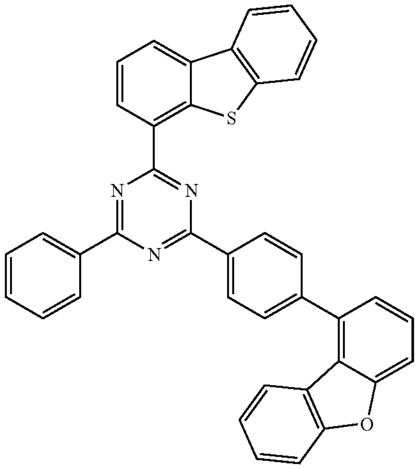
H1-104
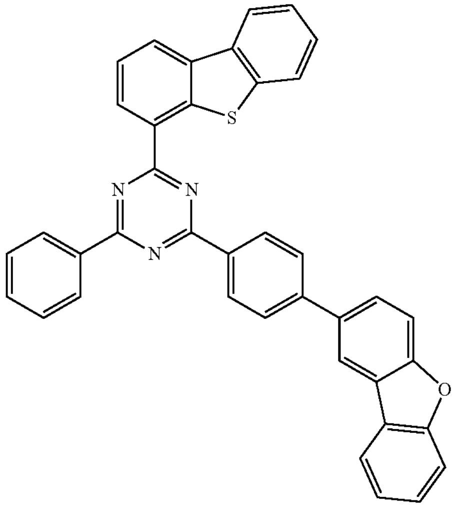
-continued
H1-105
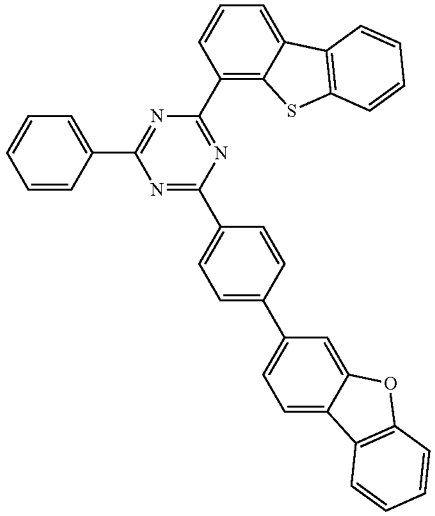
H1-106
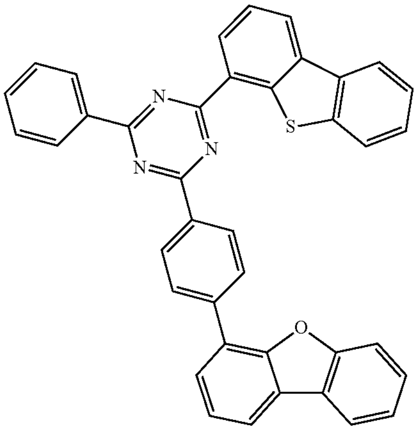
H1-107
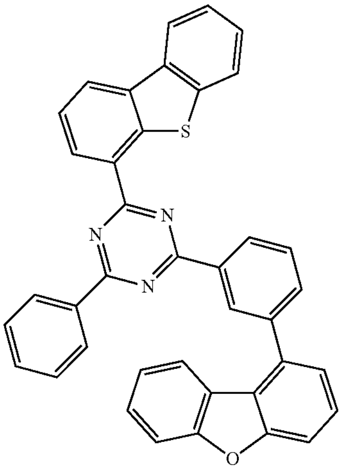

-continued
H1-108
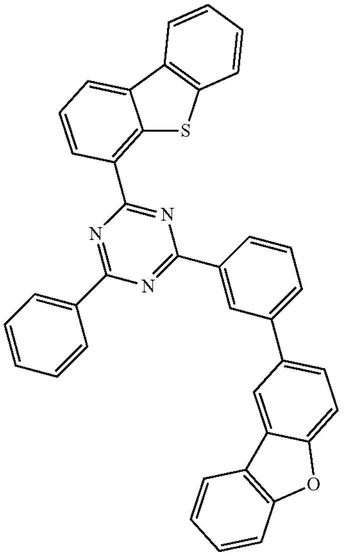
H1-109
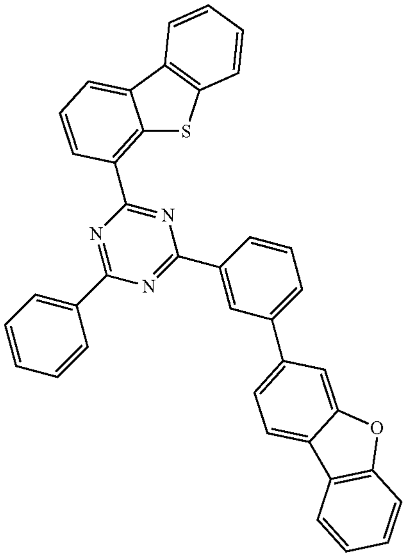
H1-110
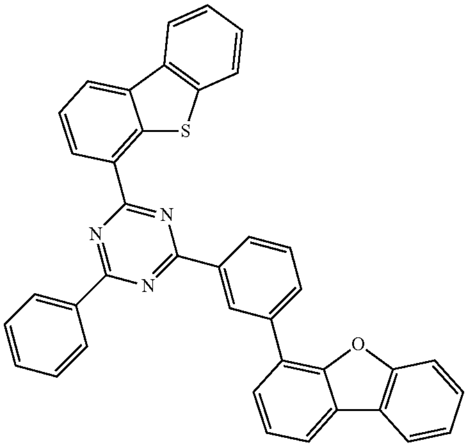
-continued
H1-111
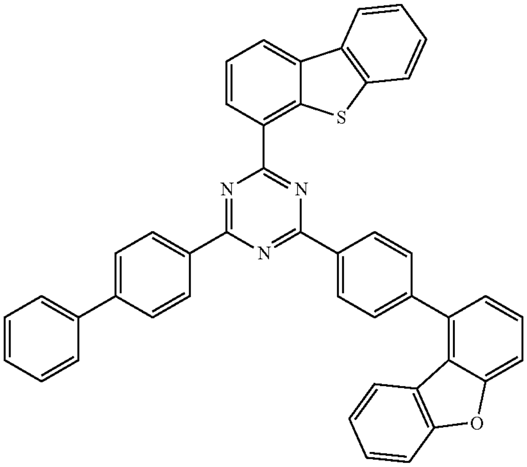
H1-112
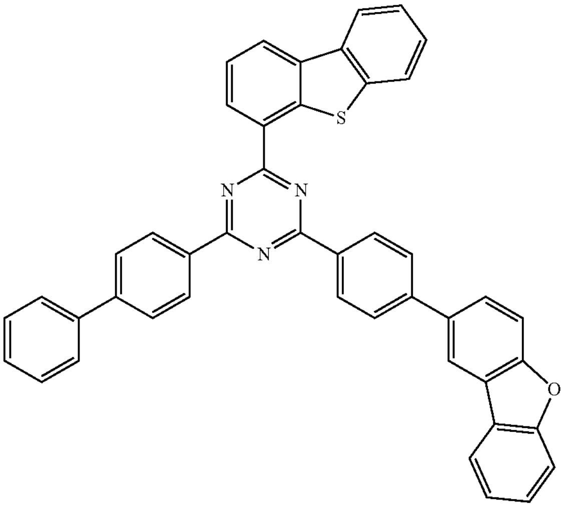
H1-113
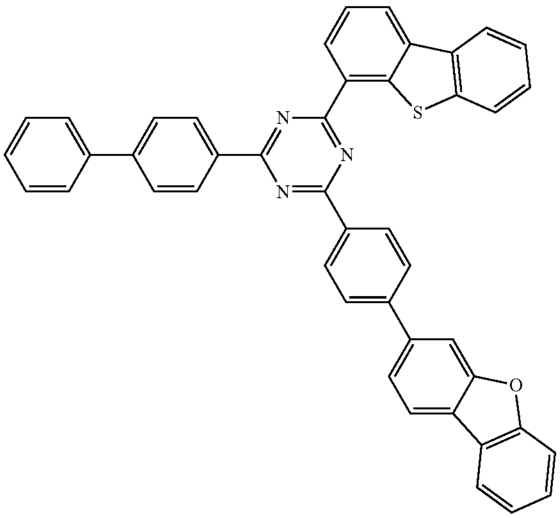

-continued
H1-114
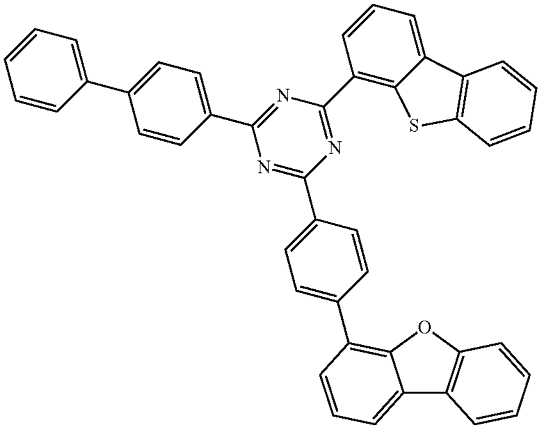
H1-115
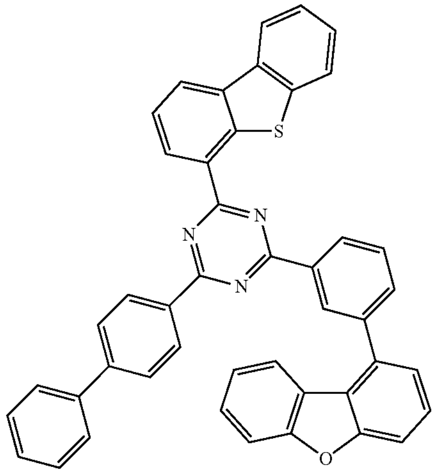
H1-116
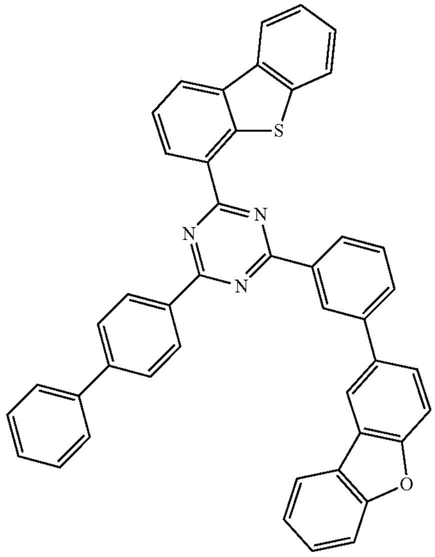
-continued
H1-117
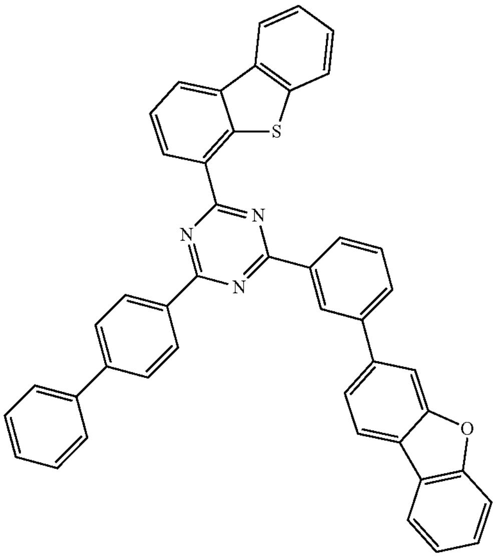
H1-118
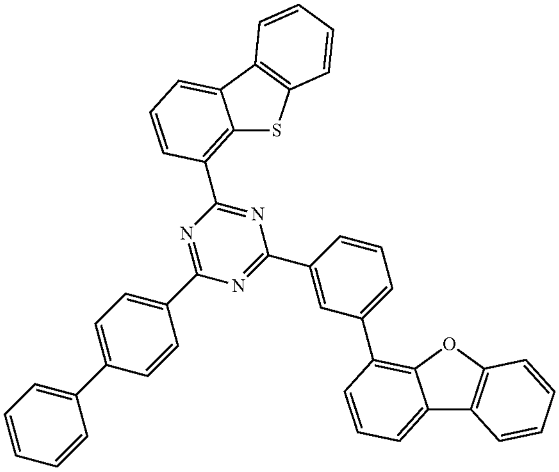
H1-119
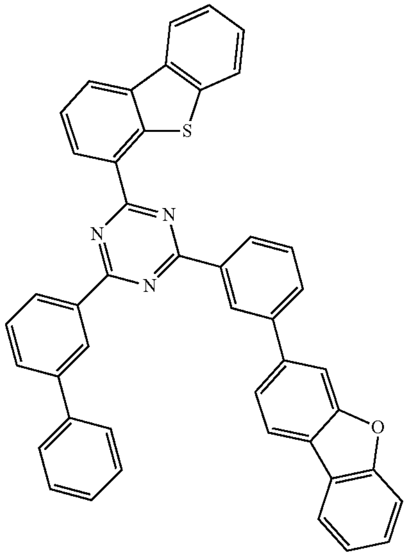

-continued
H1-120
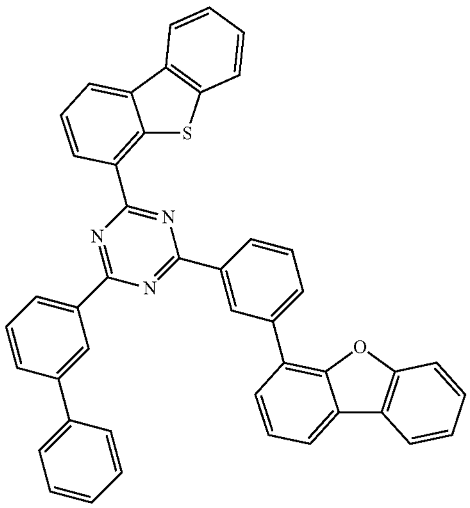
H1-121
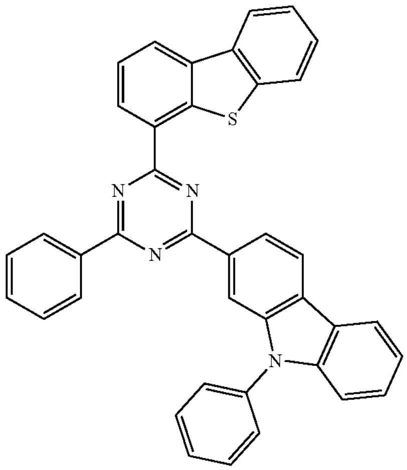
H1-122
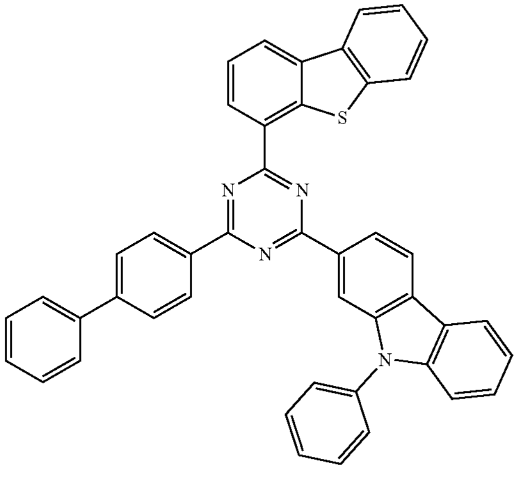
-continued
H1-123
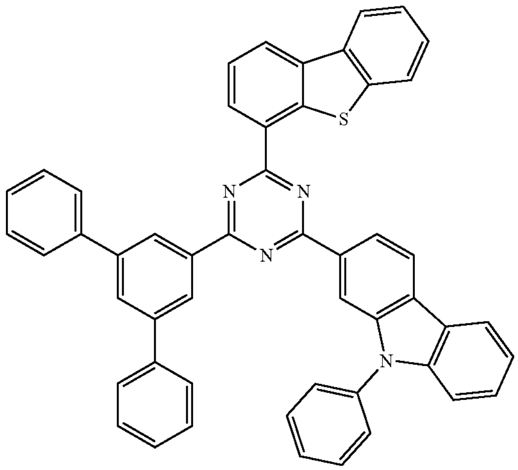
H1-124
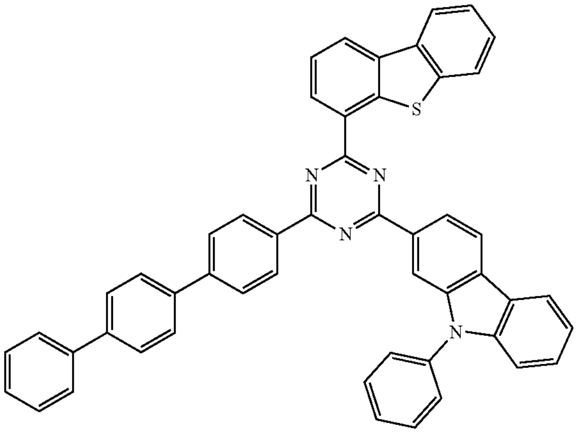
H1-125
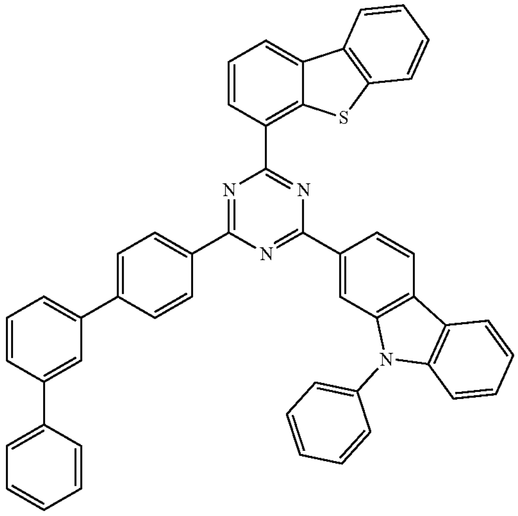

-continued
H1-126
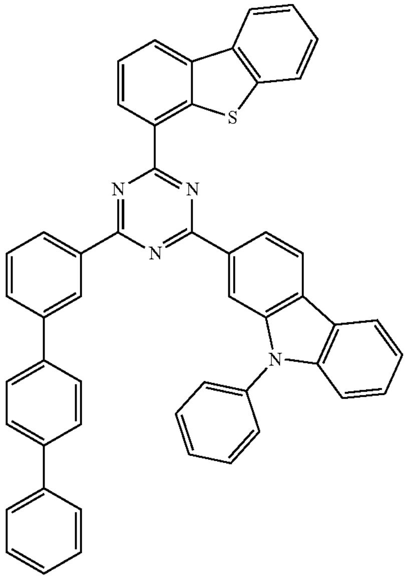
H1-127
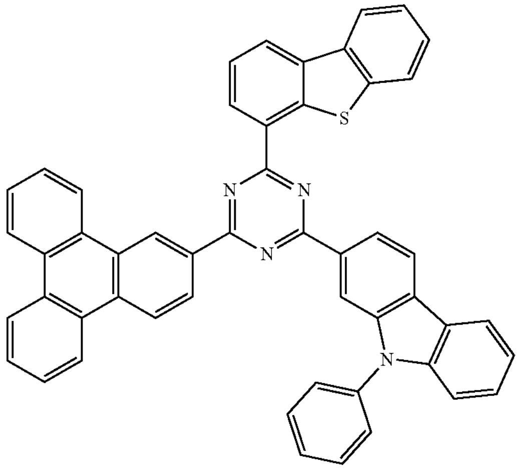
H1-128
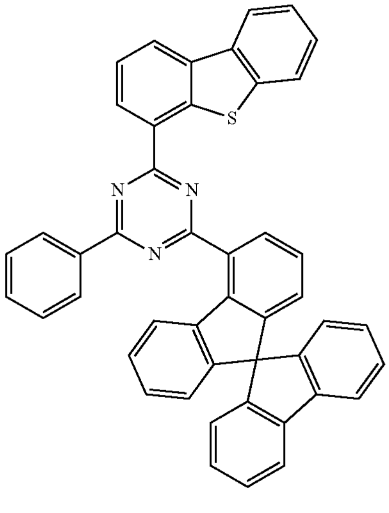
-continued
H1-129
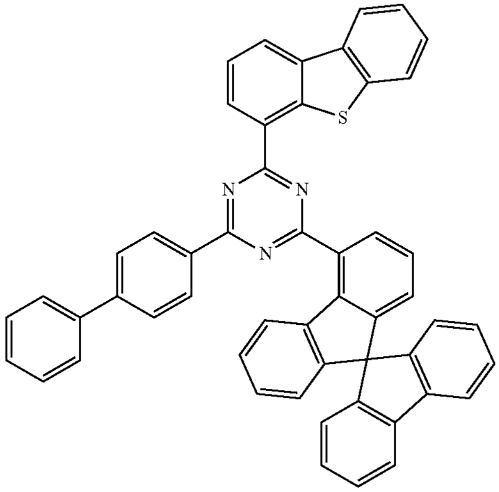
H1-130
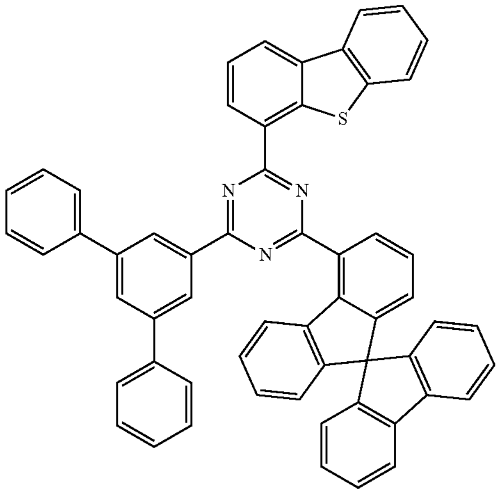
H1-131
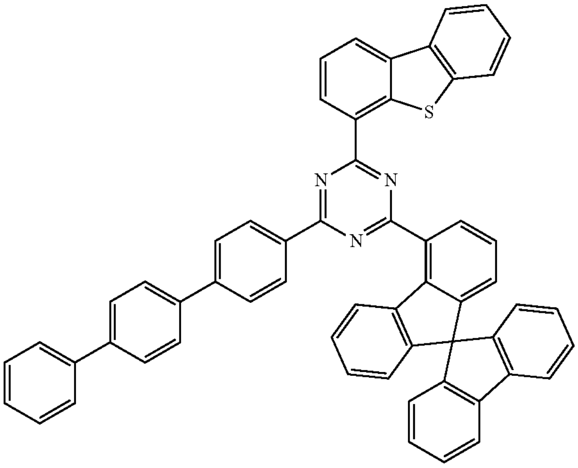

-continued
H1-132
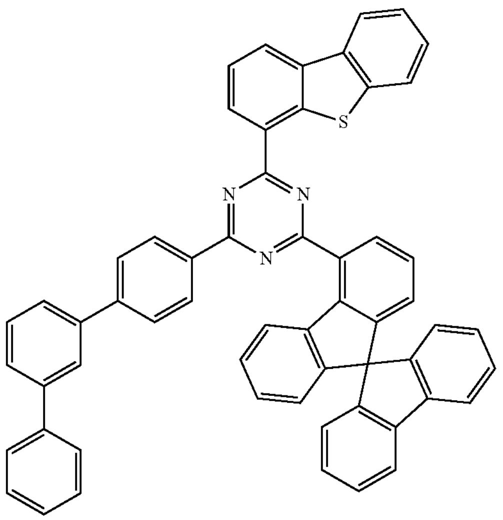
H1-133
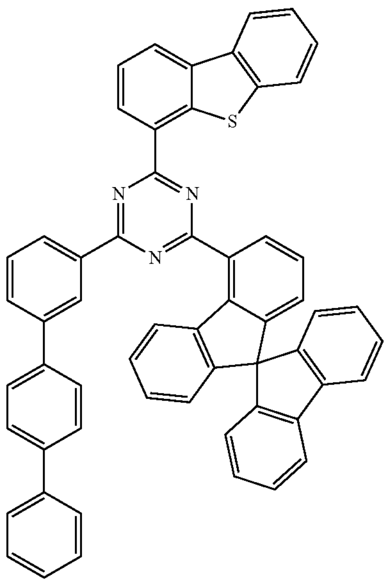
H1-134
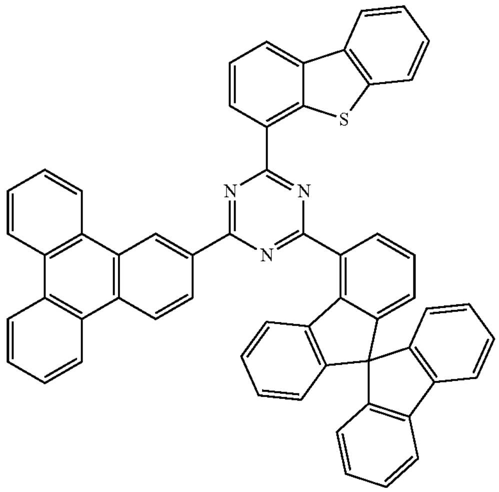
-continued
H1-135
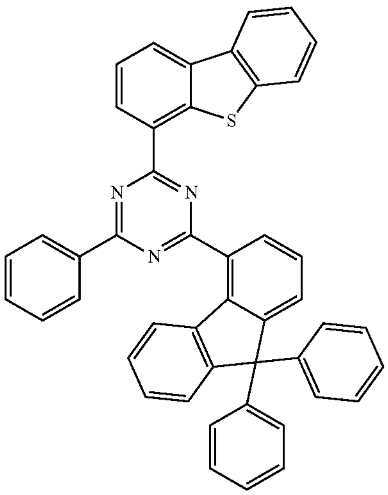
H1-136
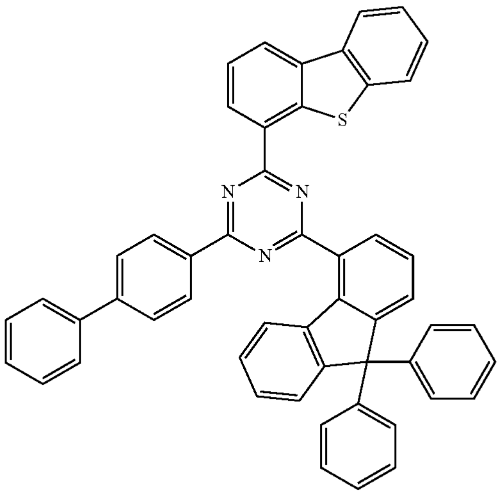
H1-137
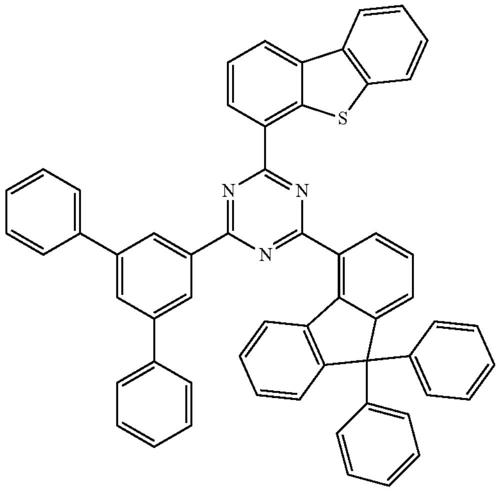

-continued
H1-138
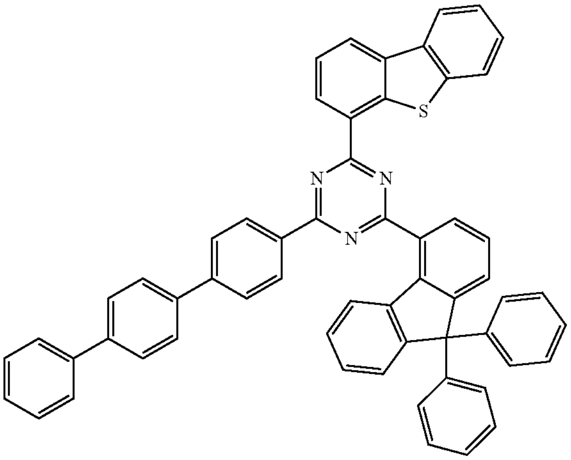
H1-139
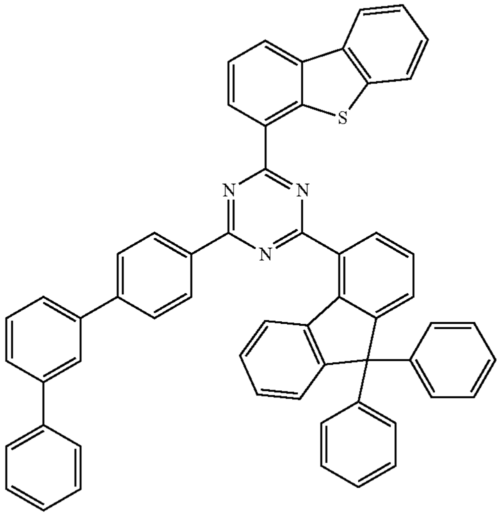
H1-140
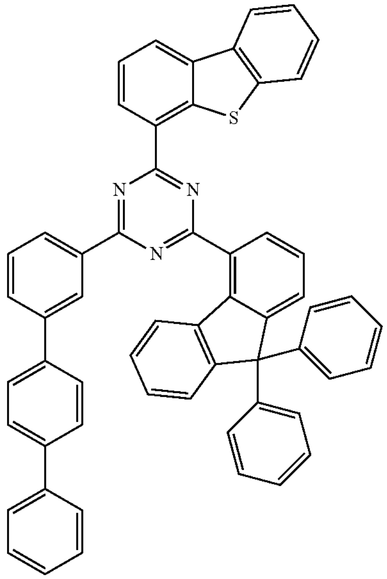
-continued
H1-141
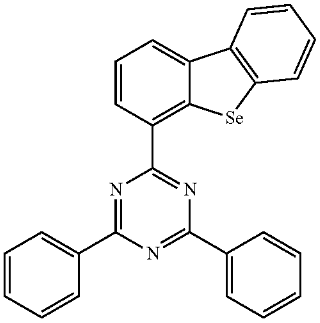
H1-142
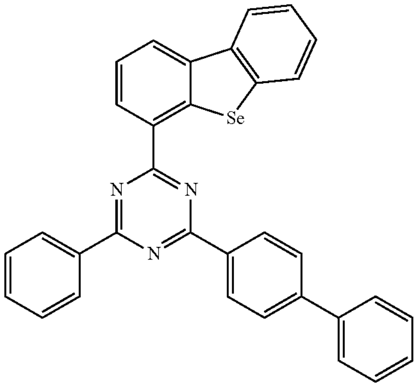
H1-143
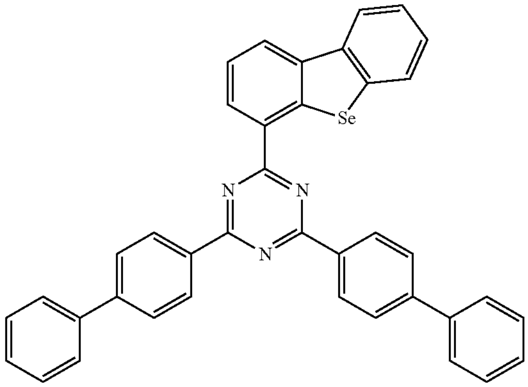
H1-144
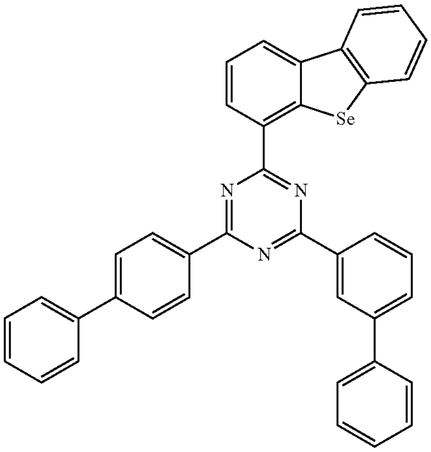

-continued
H1-145
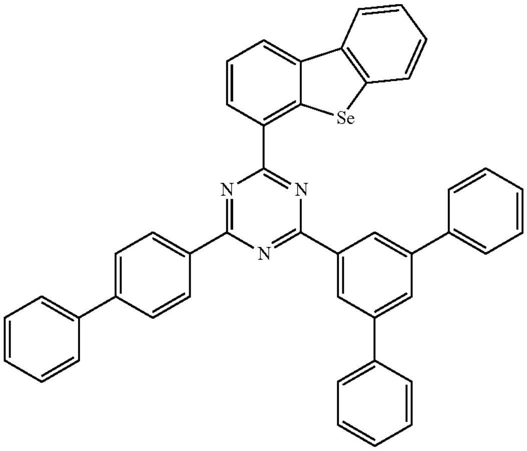
H1-146
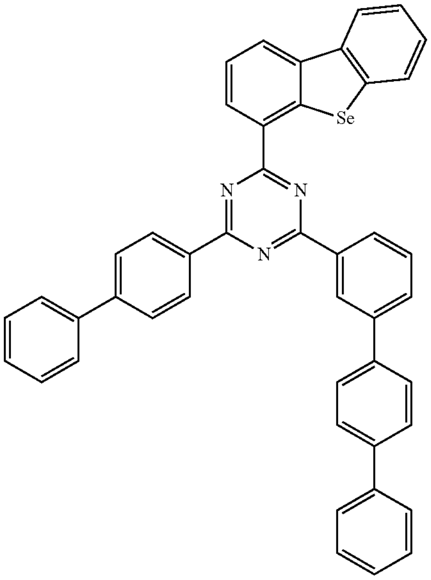
H1-147
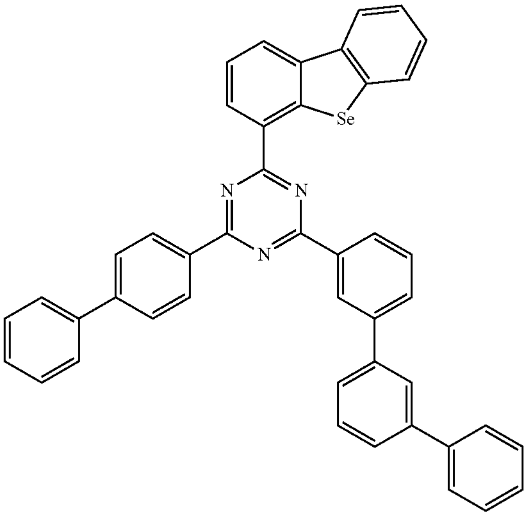
-continued
H1-148
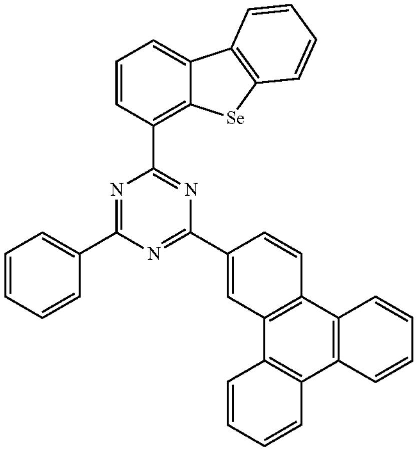
H1-149
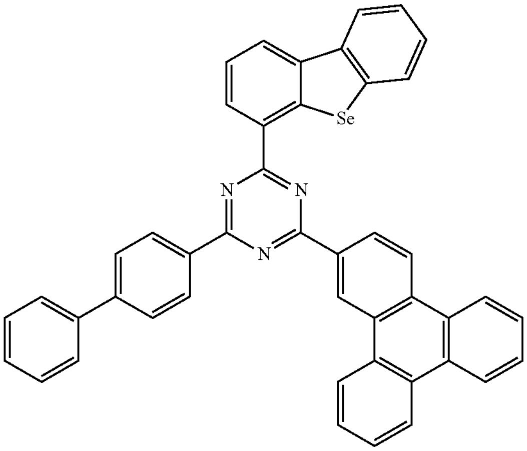
H1-150
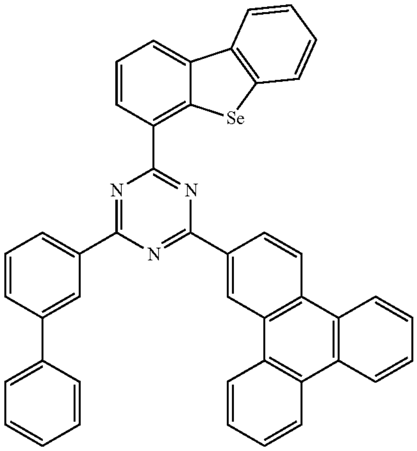

-continued
H1-151
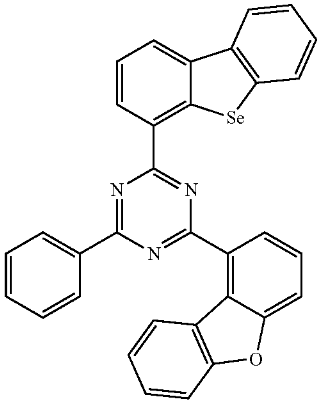
H1-152
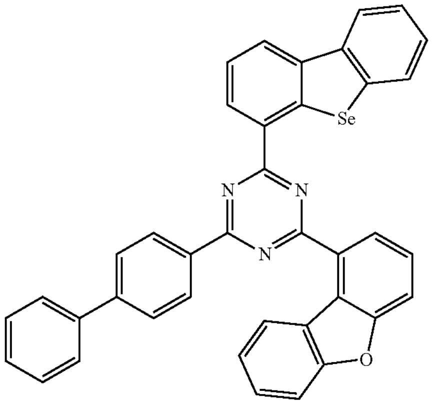
H1-153
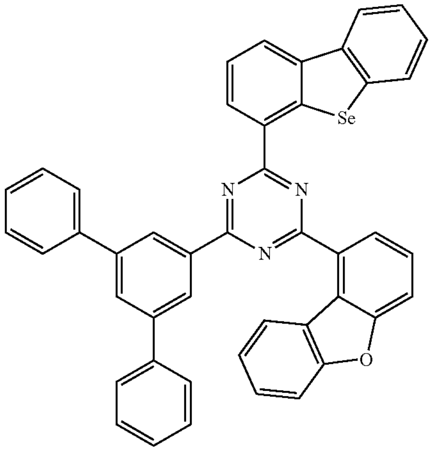
-continued
H1-154
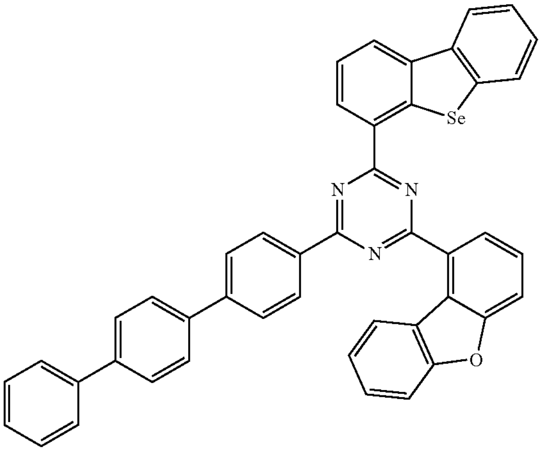
H1-155
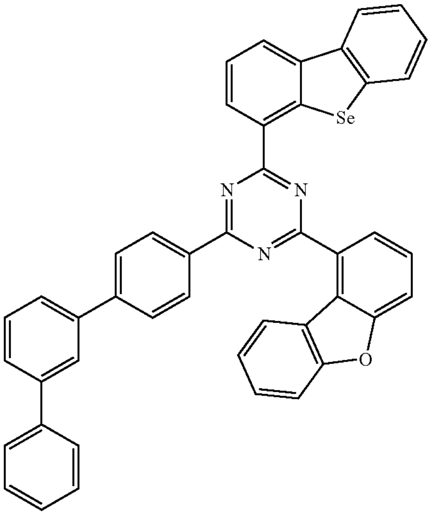
H1-156
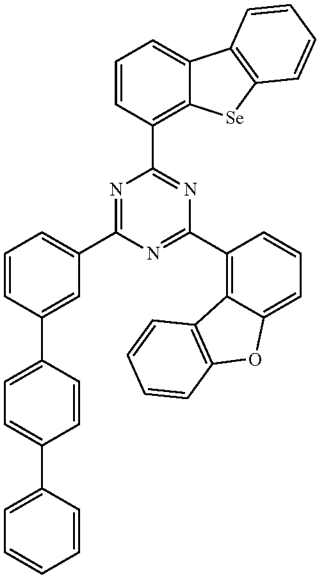

H1-157
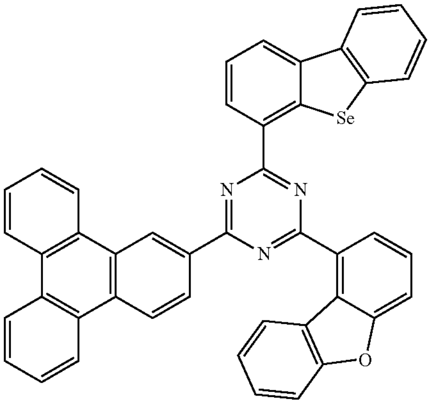
H1-158
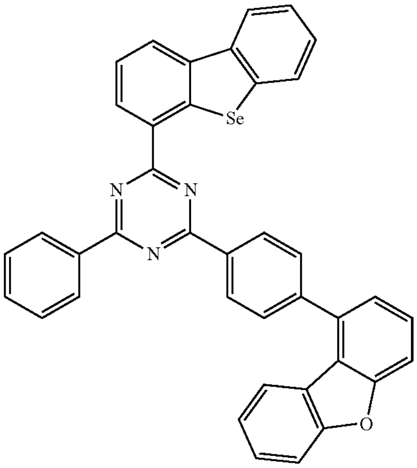
H1-159
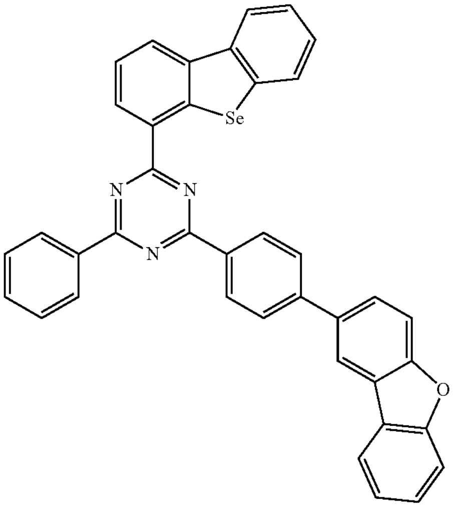
H1-160
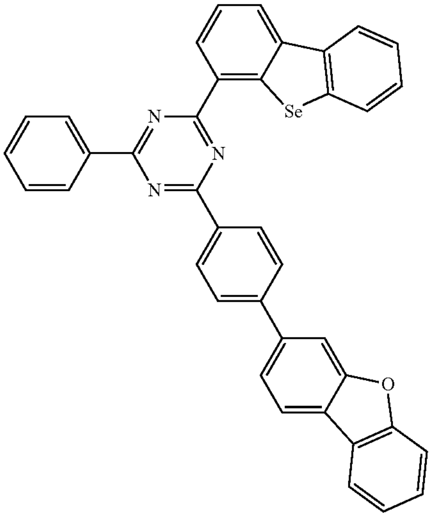
H1-161
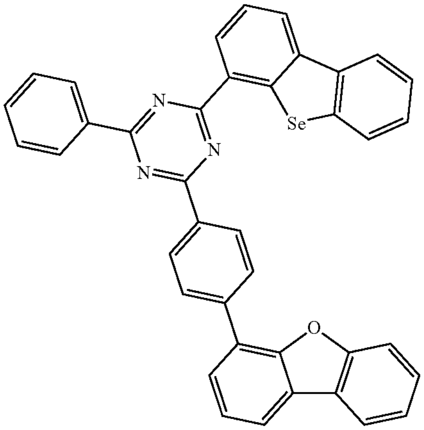
H1-162
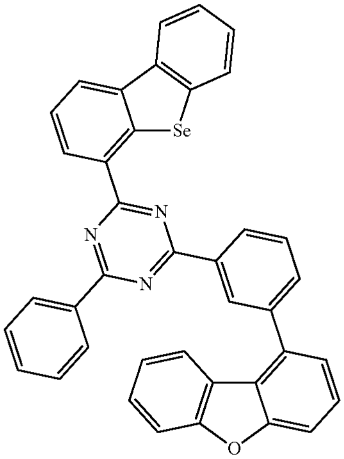

-continued
H1-163
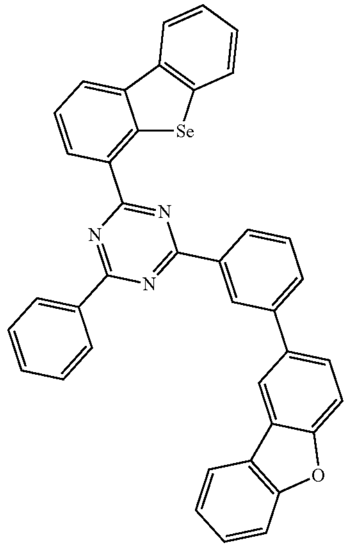
H1-164
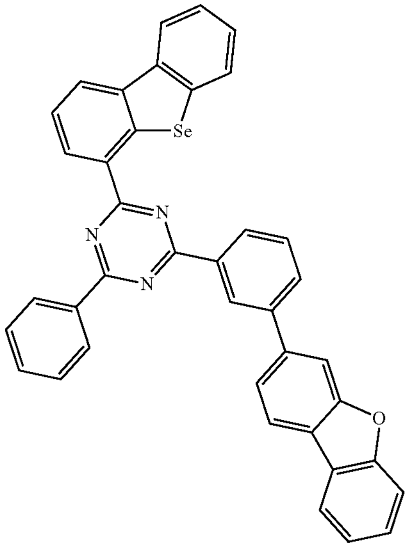
H1-165
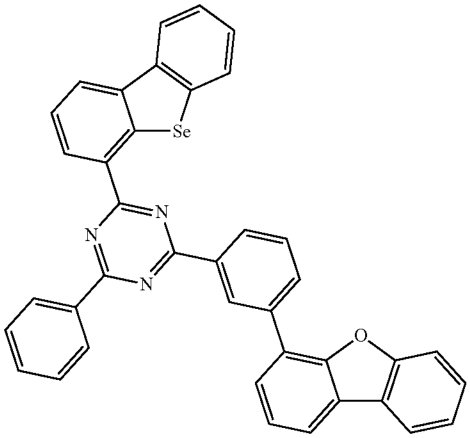
-continued
H1-166
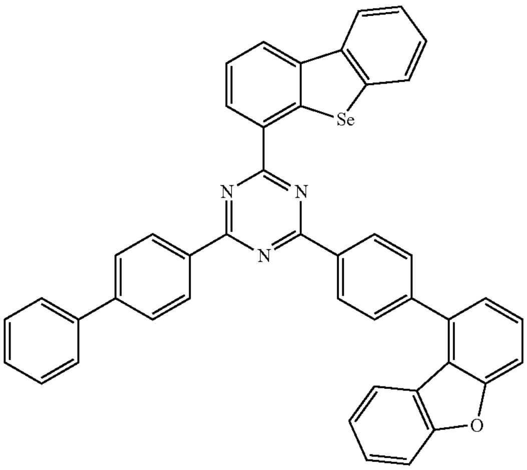
H1-167
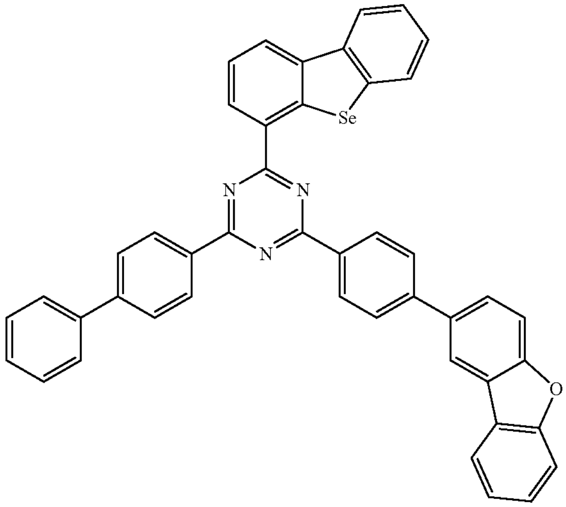
H1-168
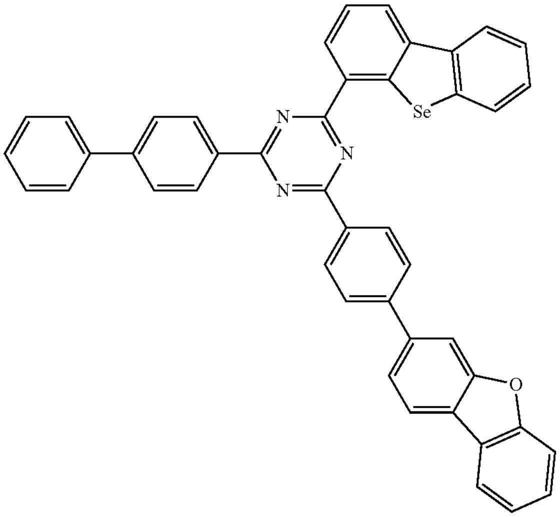

-continued
H1-169
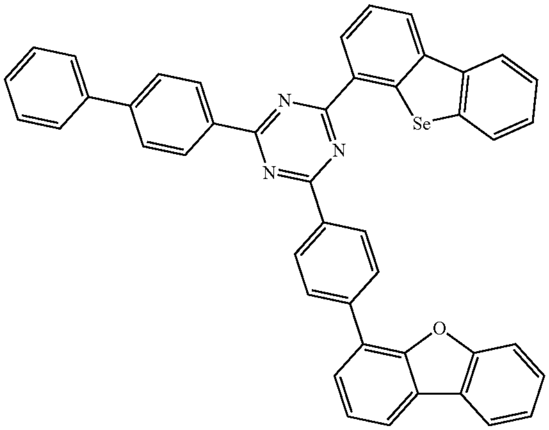
H1-170
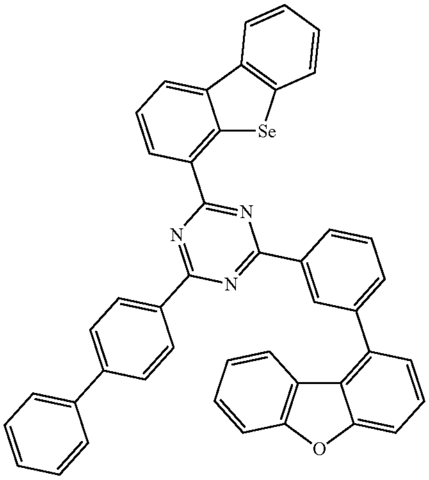
H1-171
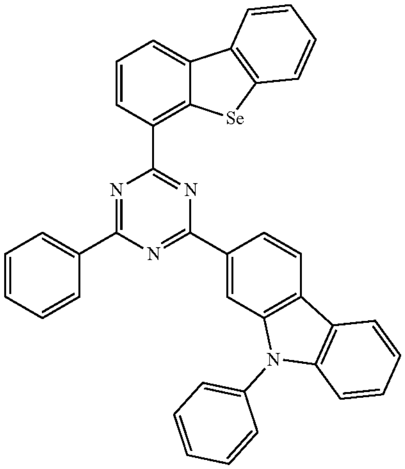
-continued
H1-172
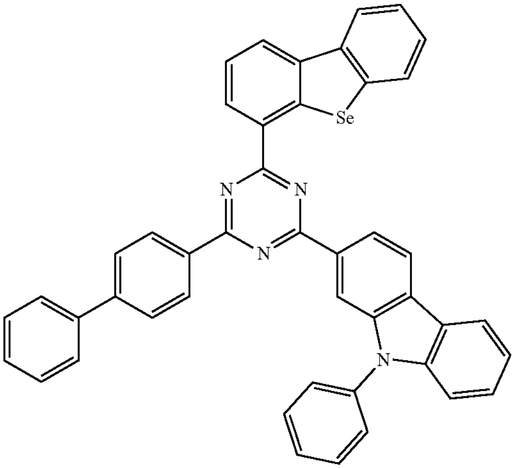
H1-173
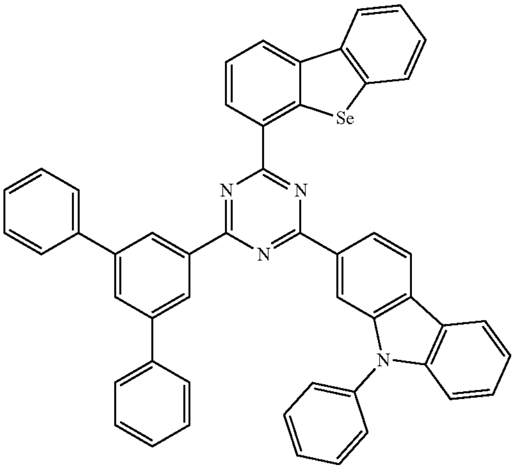
H1-174
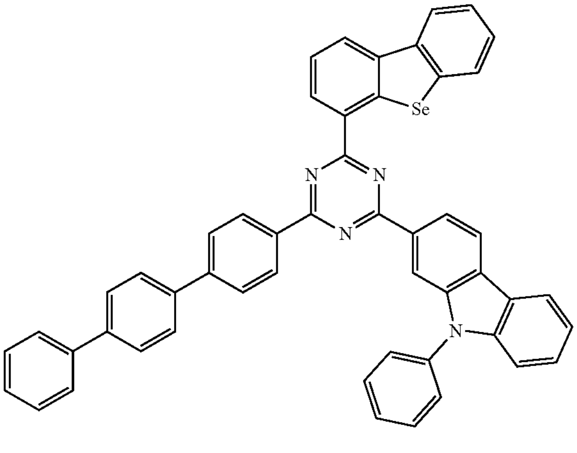

-continued
H1-175
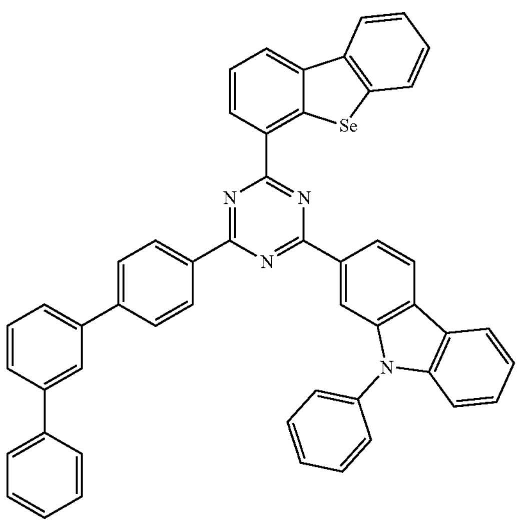
H1-176
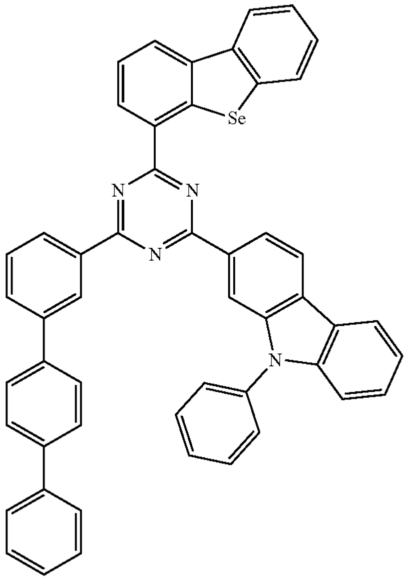
H1-177
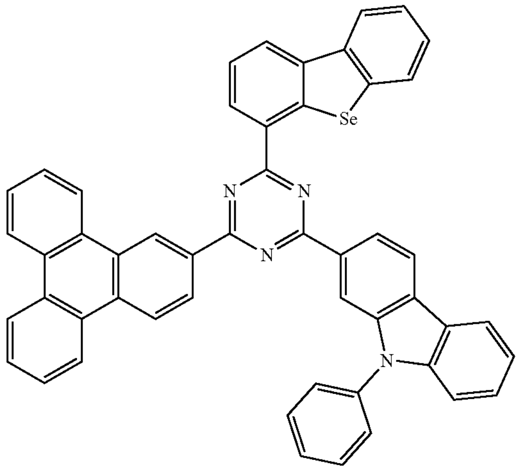
-continued
H1-178
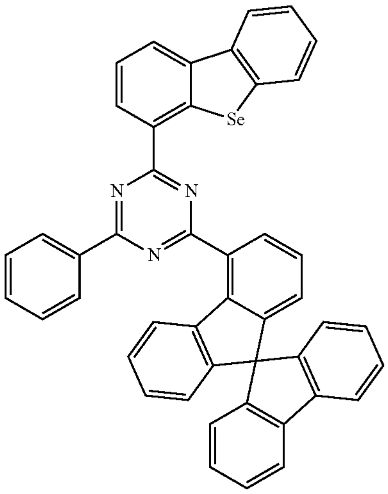
H1-179
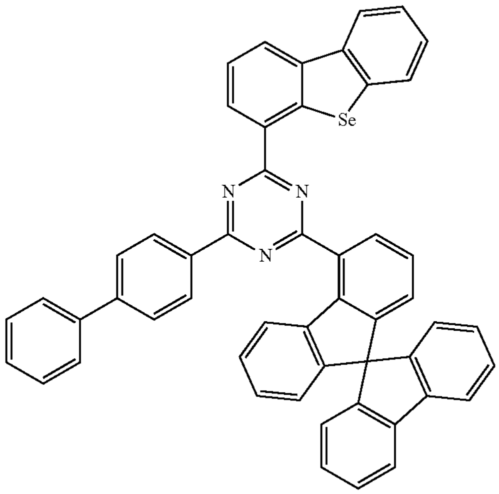
H1-180
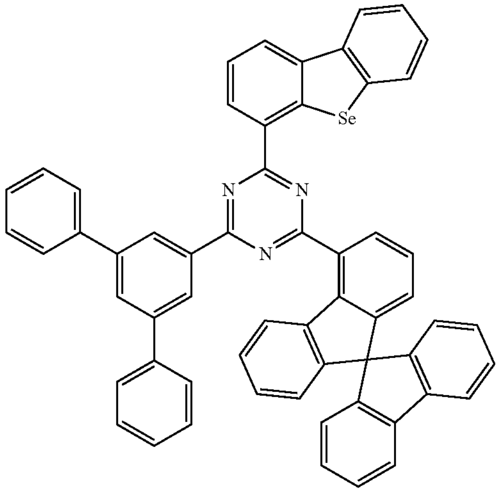

-continued
H1-181
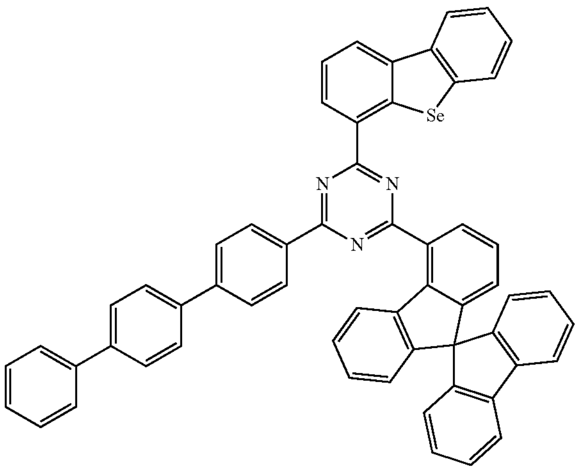
H1-182
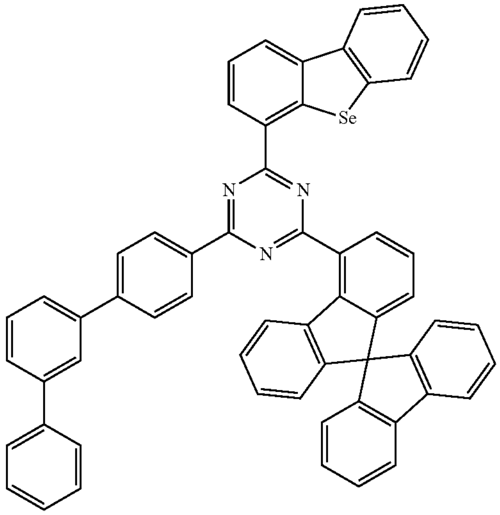
H1-183
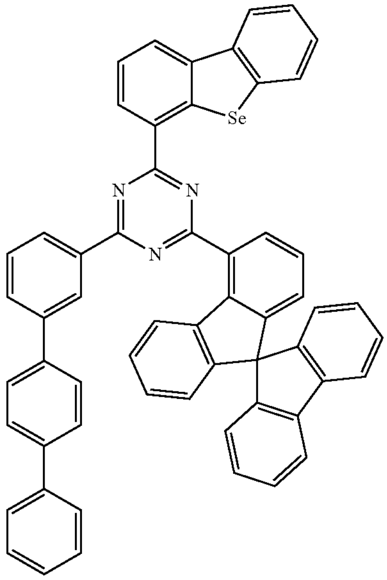
-continued
H1-184
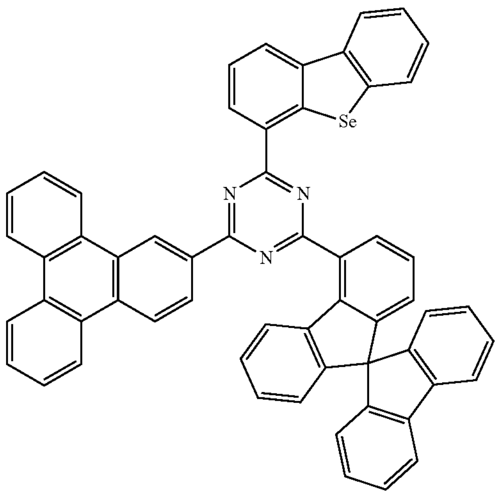
H1-185
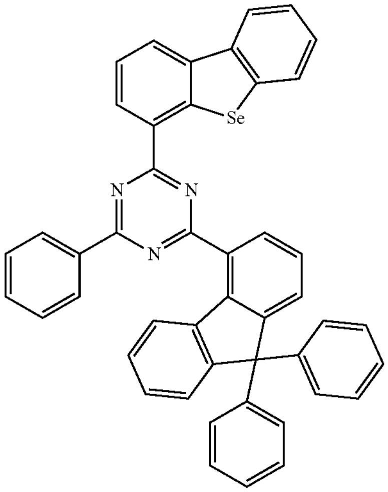
H1-186
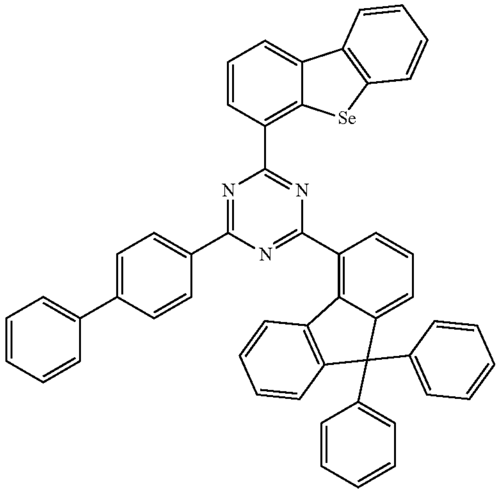

-continued
H1-187
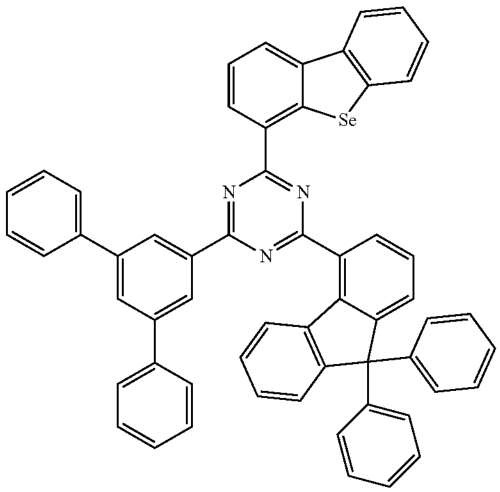
H1-188
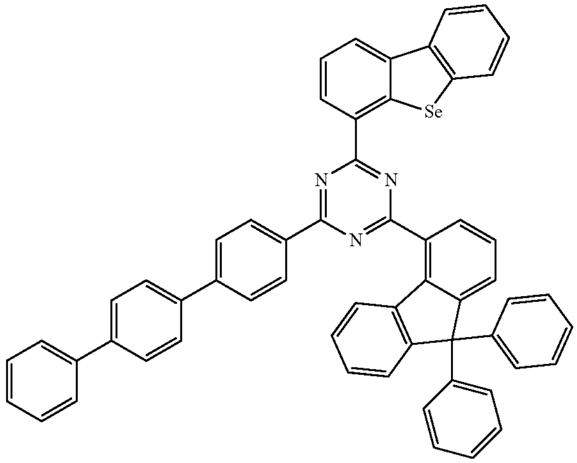
H1-189
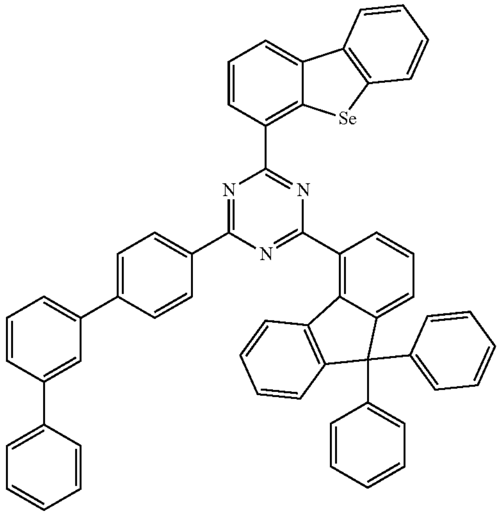
-continued
H1-190
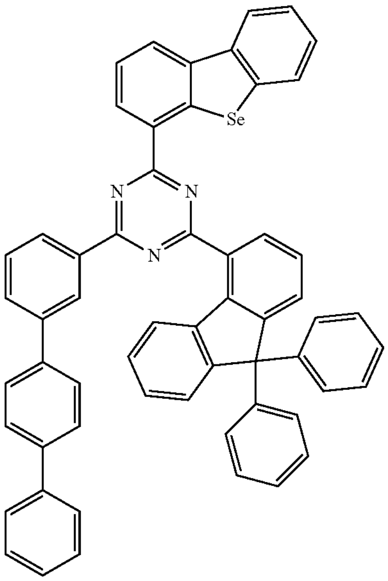
H1-191
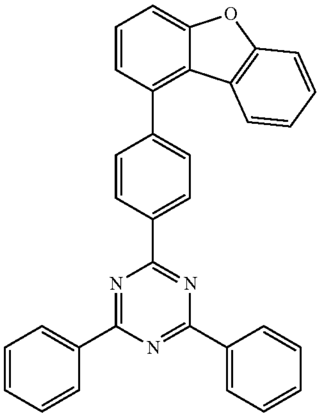
H1-192
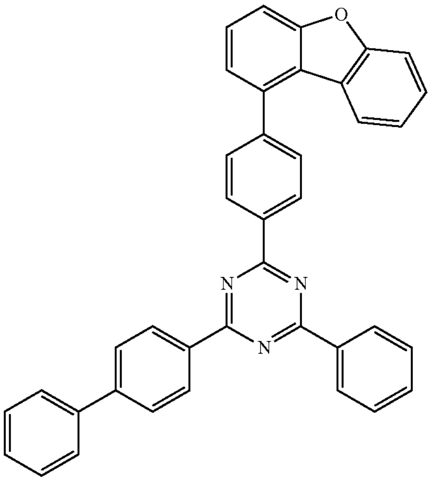

-continued
H1-193
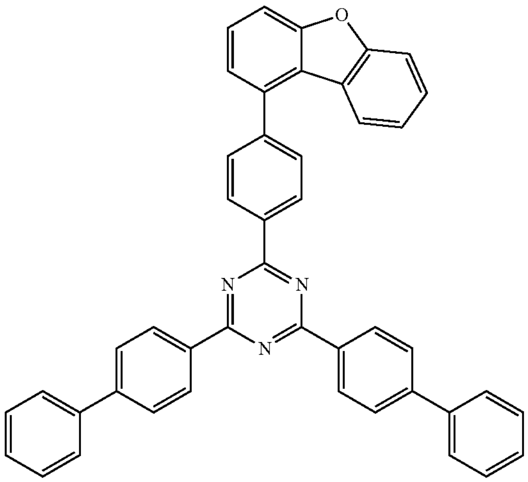
H1-194
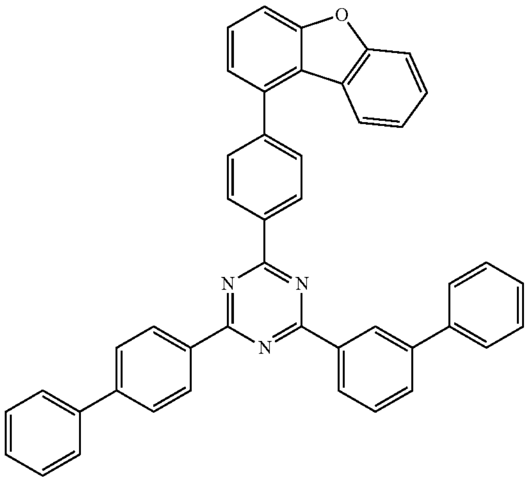
H1-195
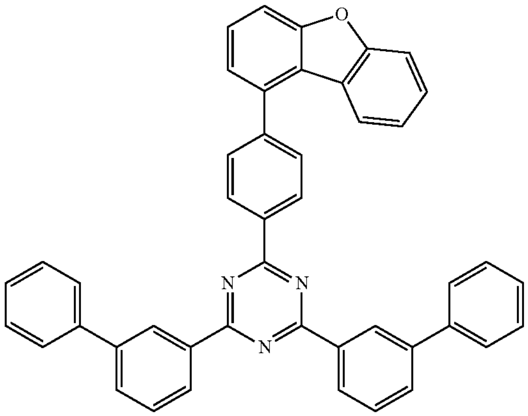
-continued
H1-196
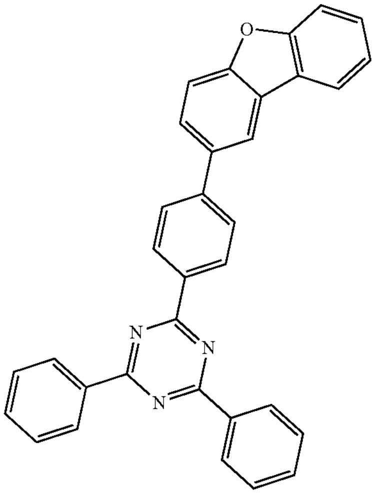
H1-197
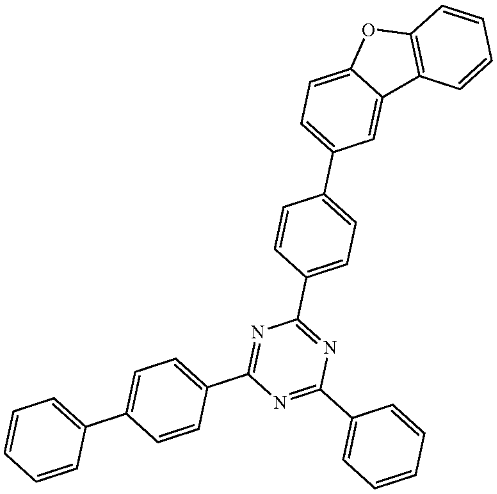
H1-198
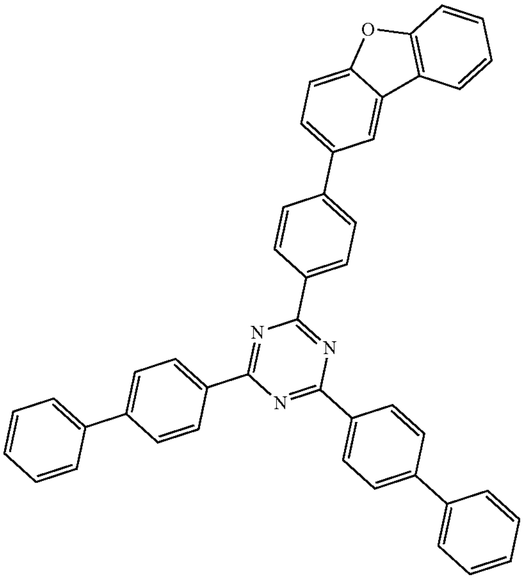

-continued
H1-199
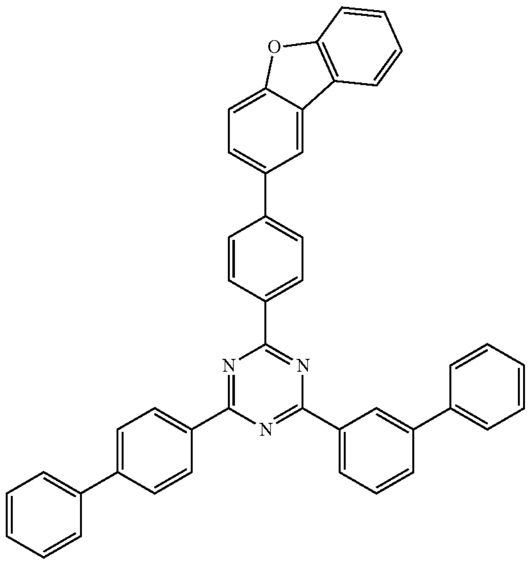
H1-200
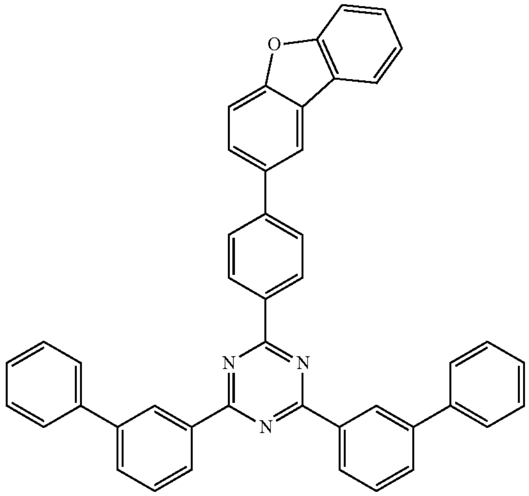
H1-201
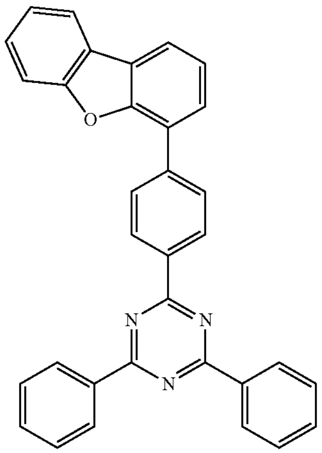
-continued
H1-202
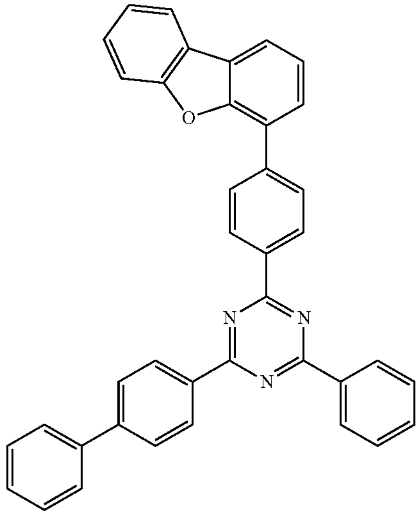
H1-203
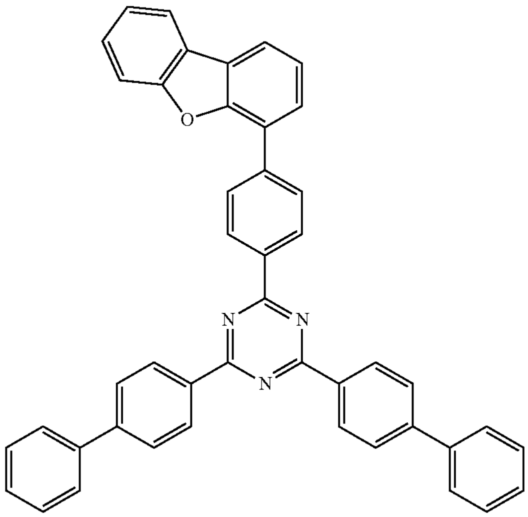
H1-204
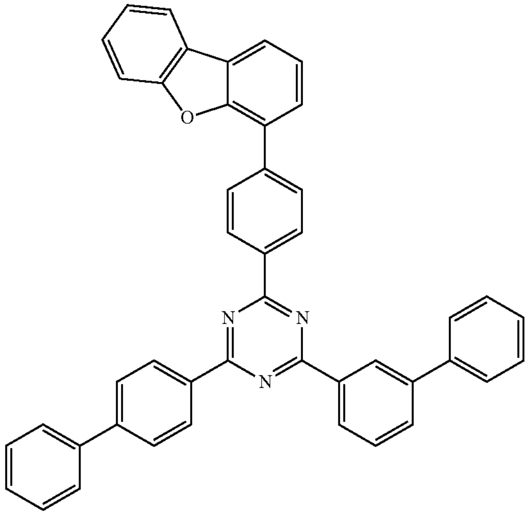

-continued
H1-205
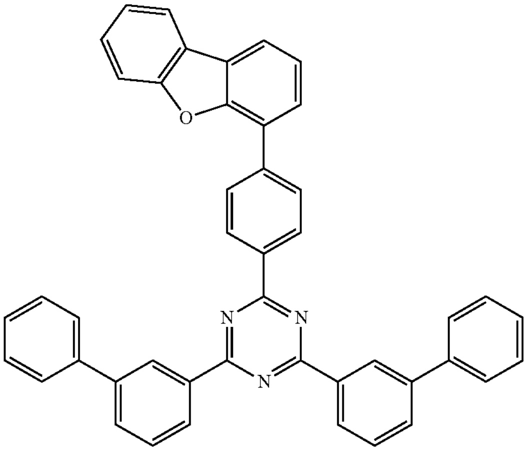
H1-206
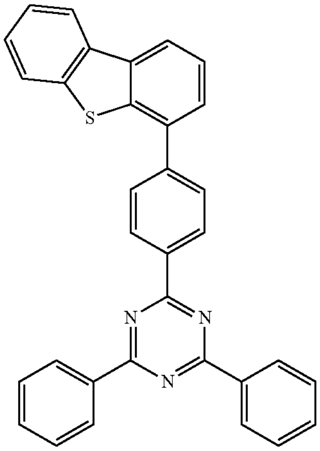
H1-207
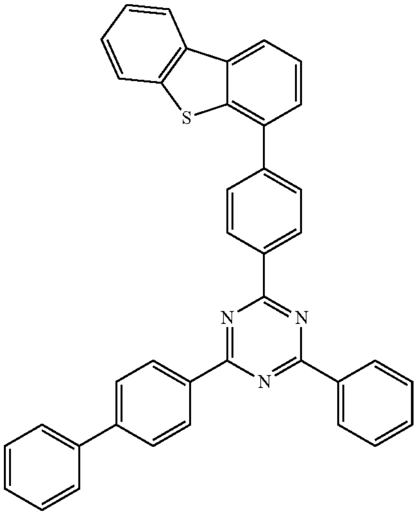
-continued
H1-208
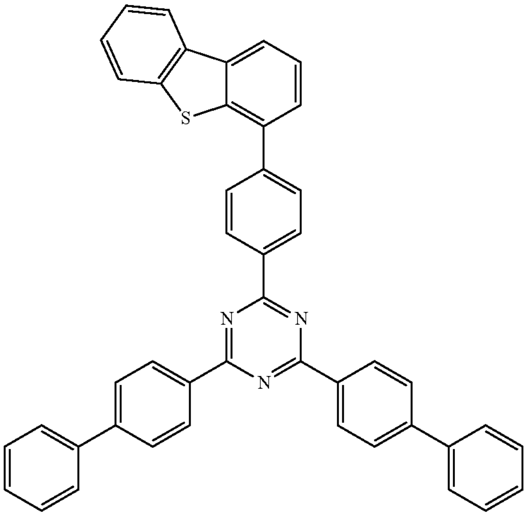
H1-209
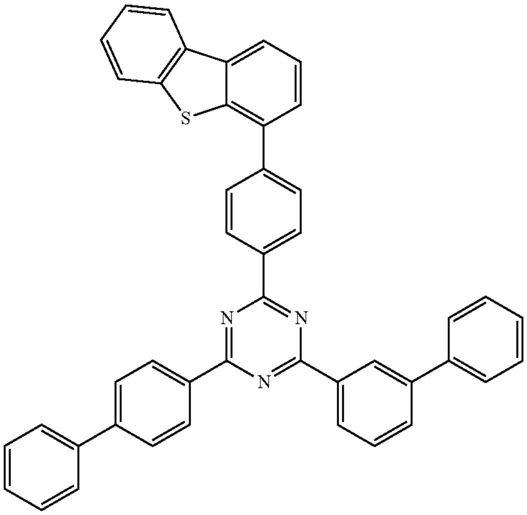
H1-210
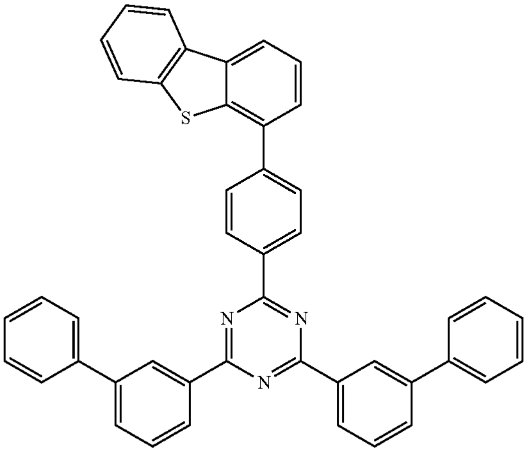

-continued
H1-211
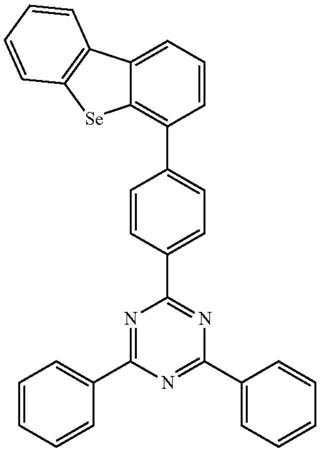
H1-212
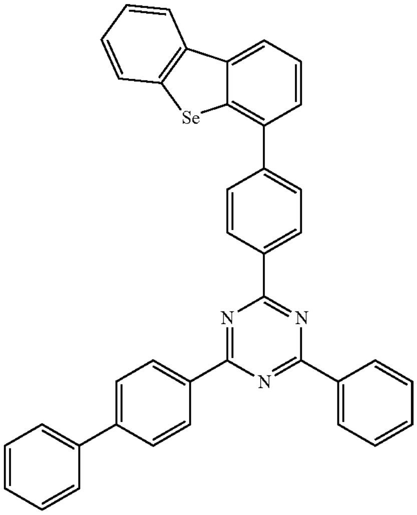
H1-213
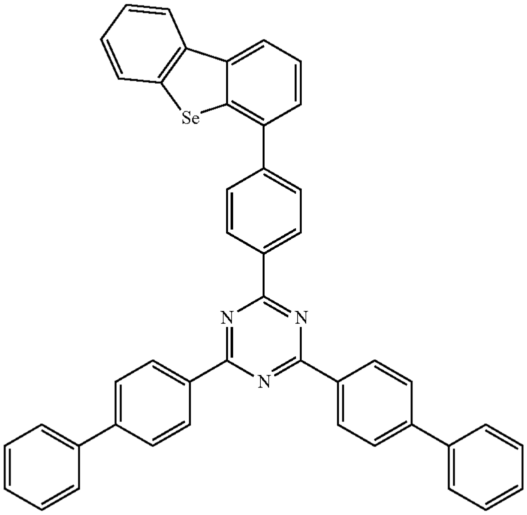
-continued
H1-214
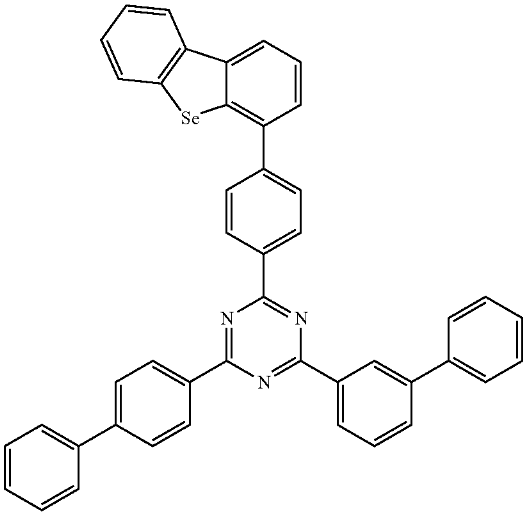
H1-215
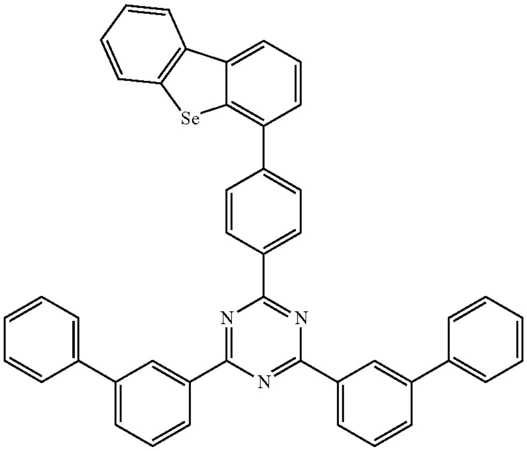
H1-216
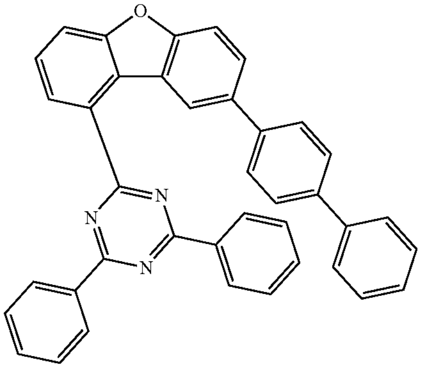

-continued
H1-217
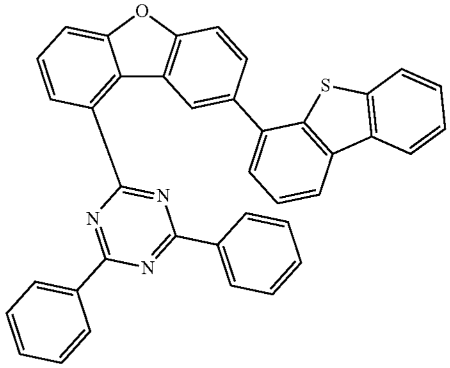
H1-218
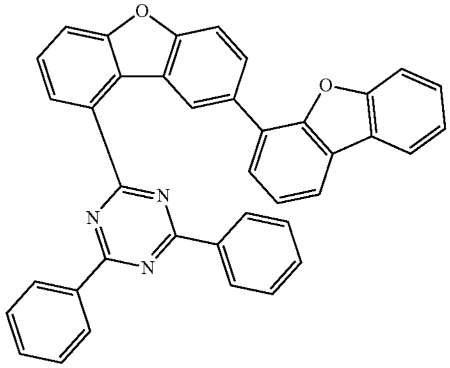
H1-219
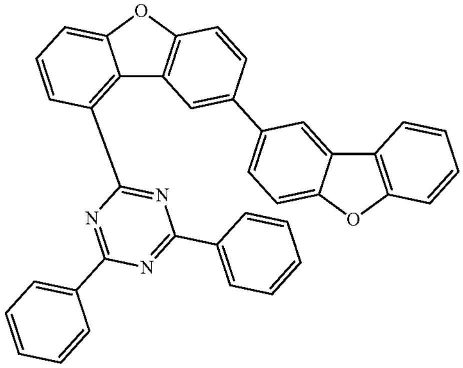
H1-220
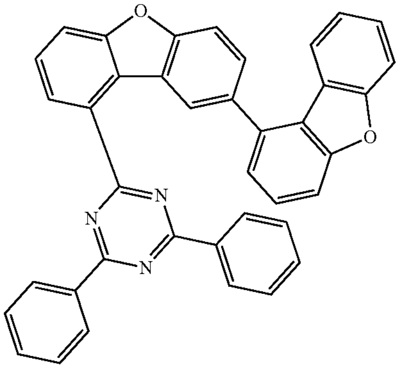
-continued
H1-221
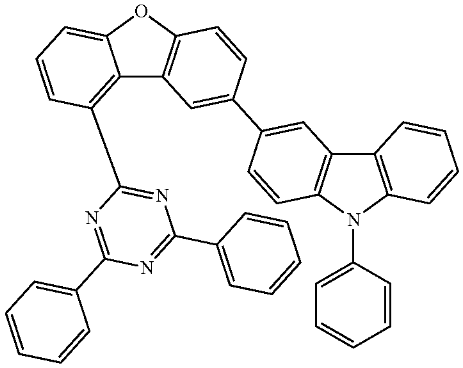
H1-222
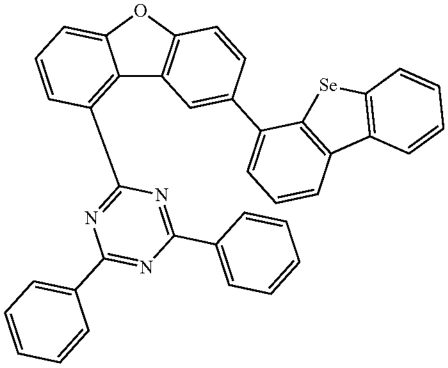
H1-223
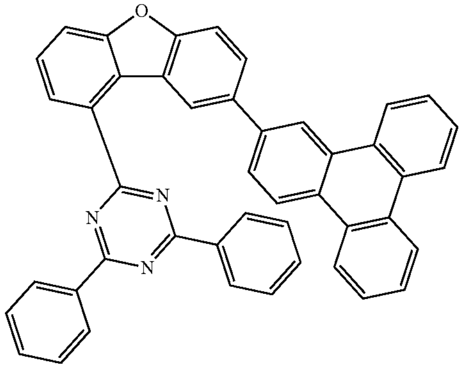
H1-224
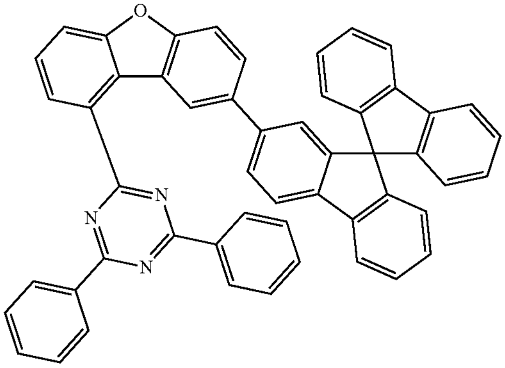

-continued
H1-225
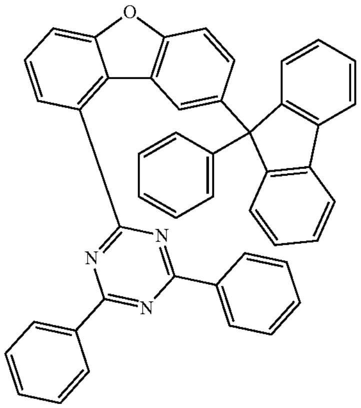
H1-226
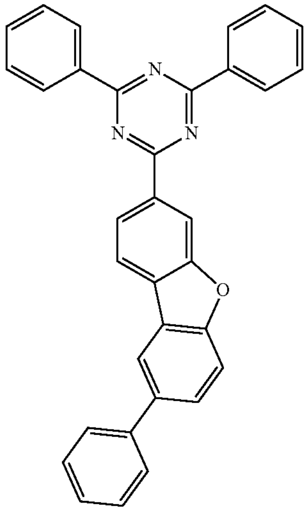
H1-227
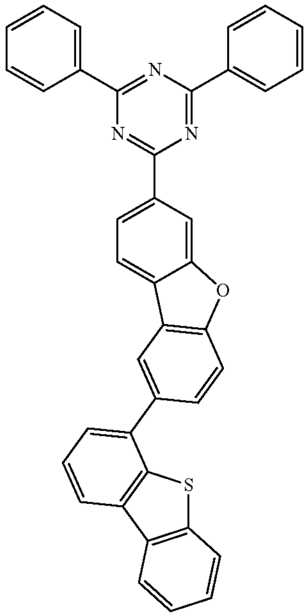
-continued
H1-228
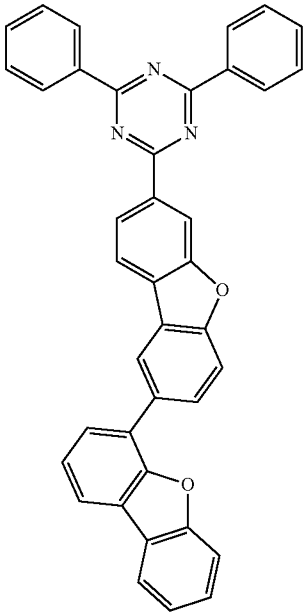
H1-229
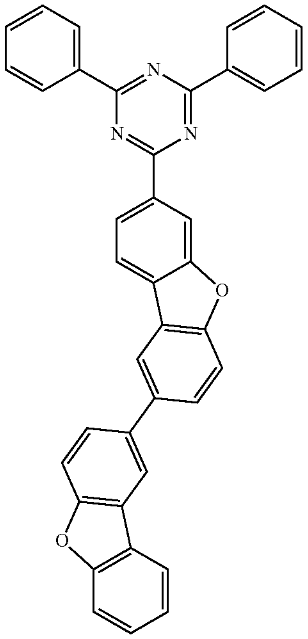

-continued
H1-230
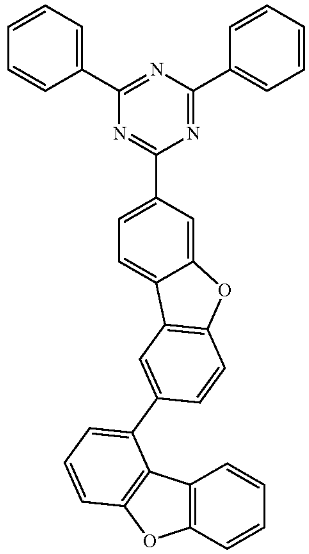
H1-231
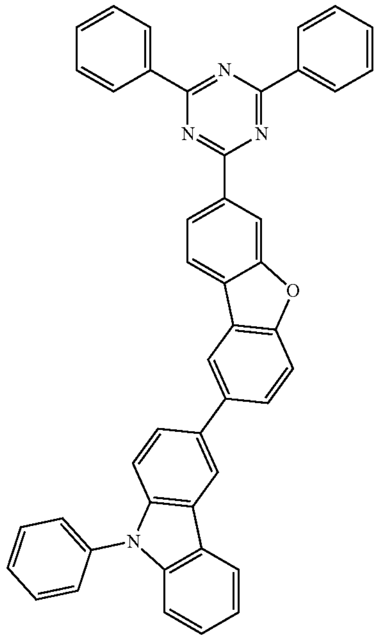
-continued
H1-232
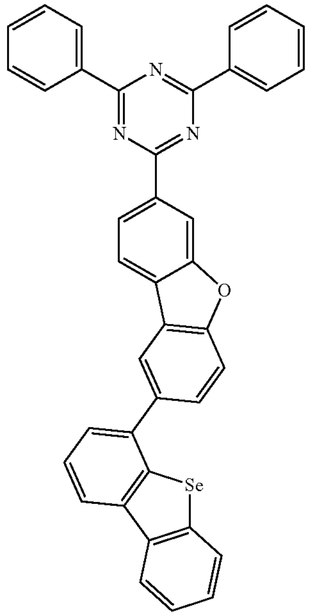
H1-233
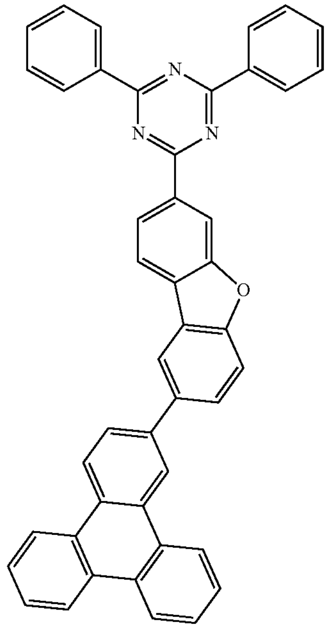

-continued
H1-234
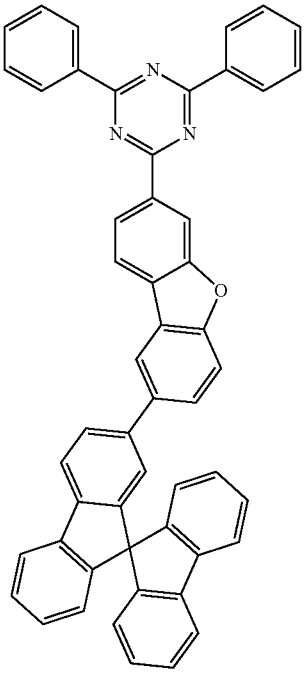
H1-235
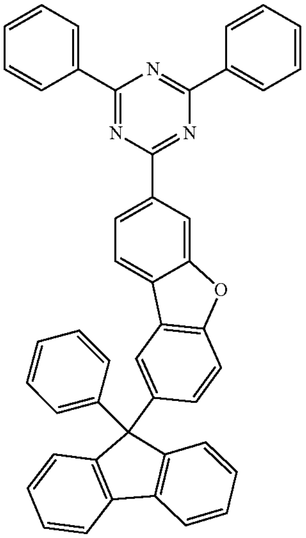
-continued
H1-236
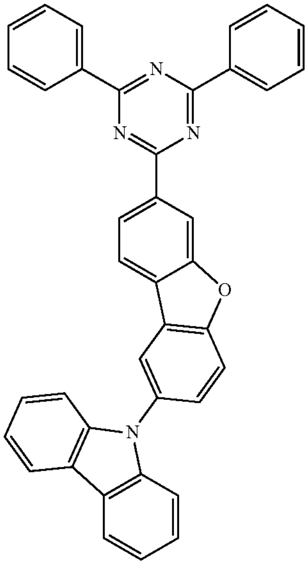
H1-237
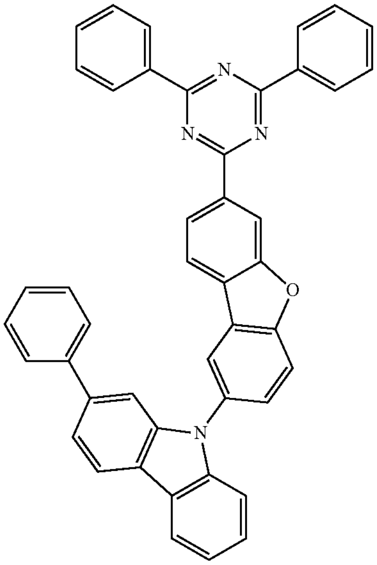

-continued
H1-238
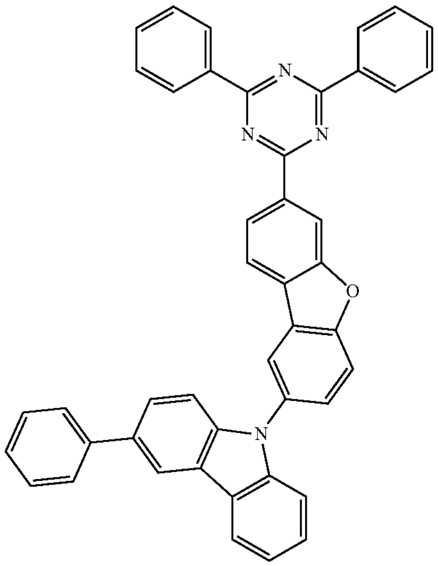
H1-239
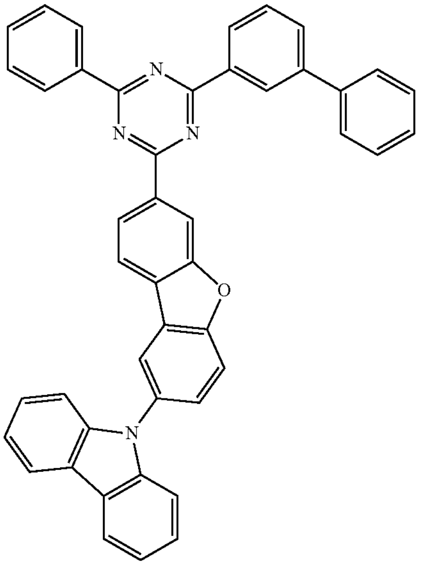
-continued
H1-240
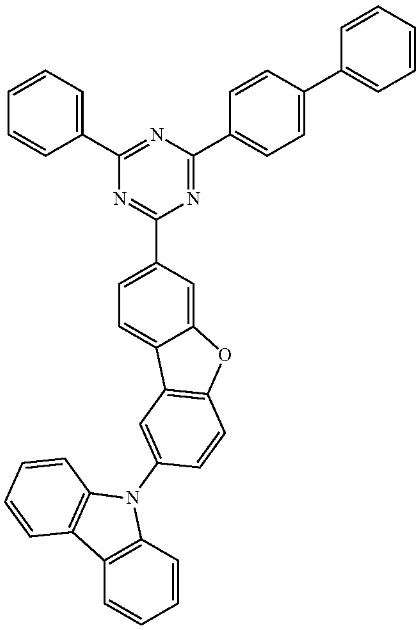
H1-241
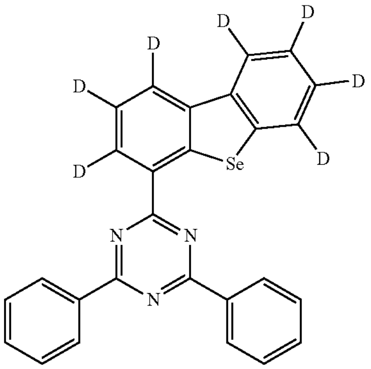
H1-242
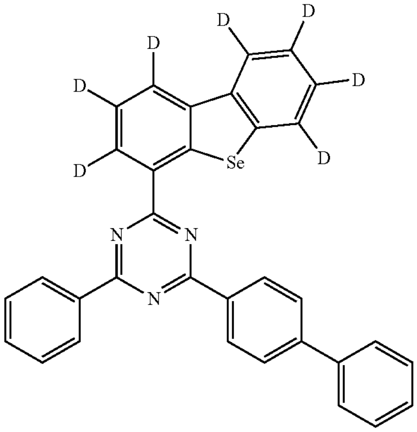

-continued
H1-243
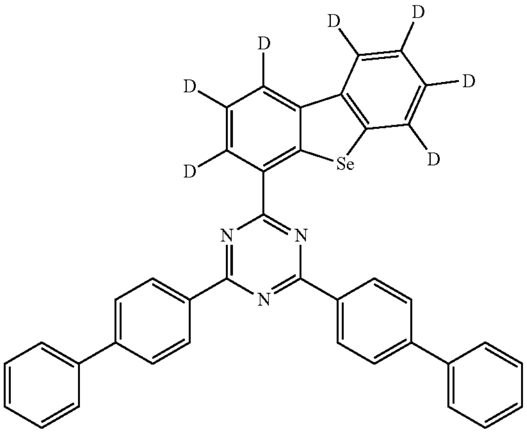
H1-244
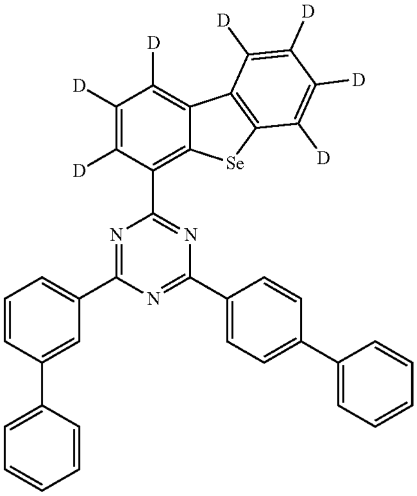
H1-245
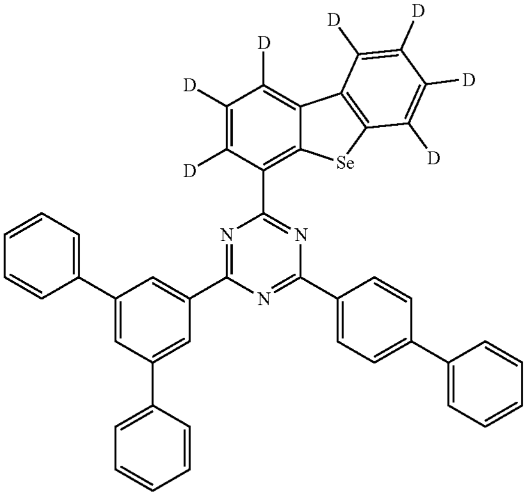
H1-246
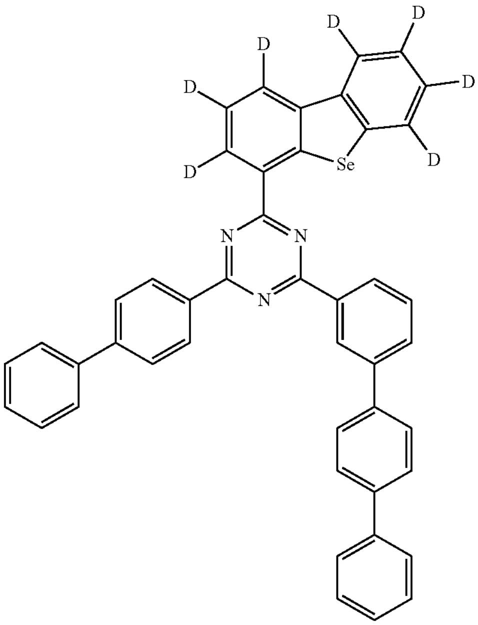
H1-247
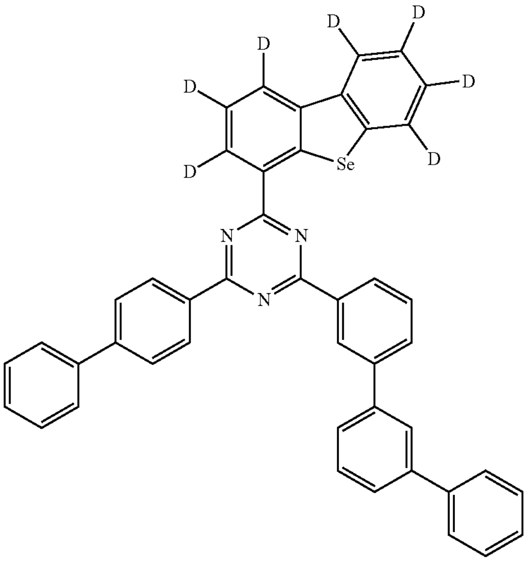

-continued
H1-248
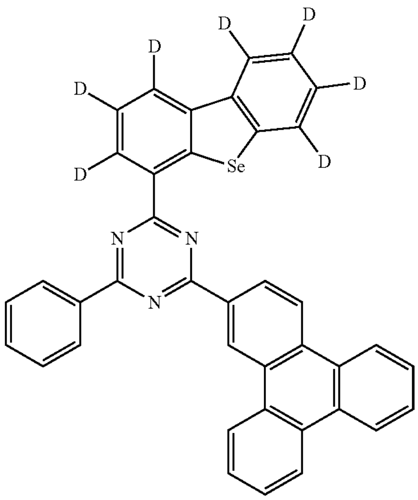
H1-249
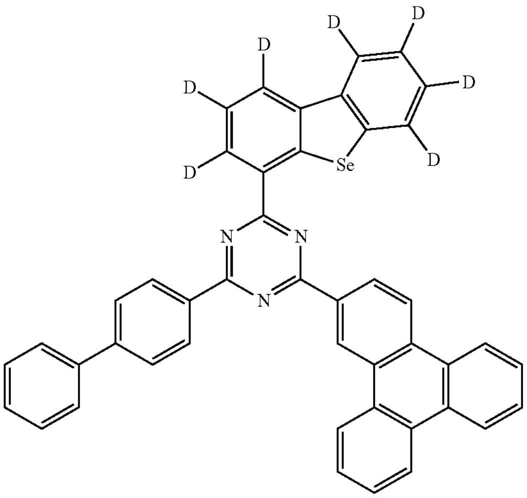
H1-250
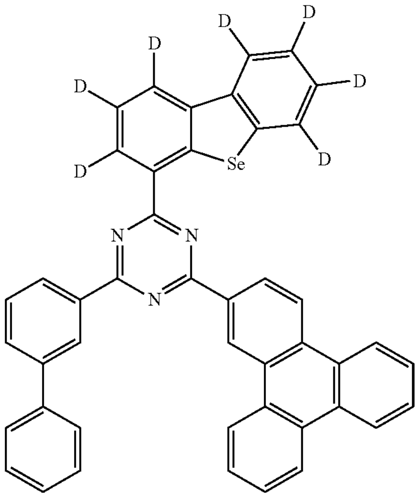
-continued
H1-251
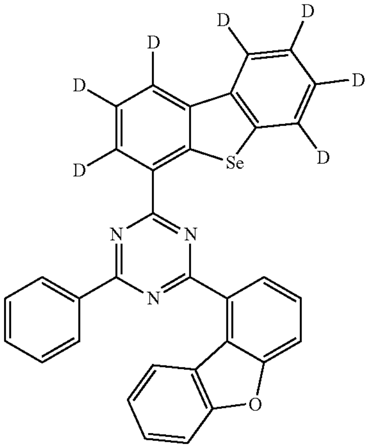
H1-252
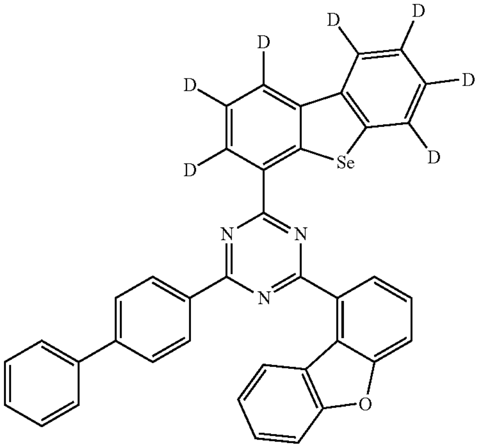
H1-253
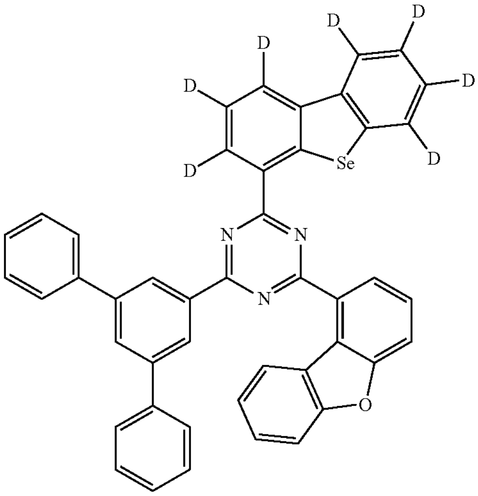

-continued
H1-254
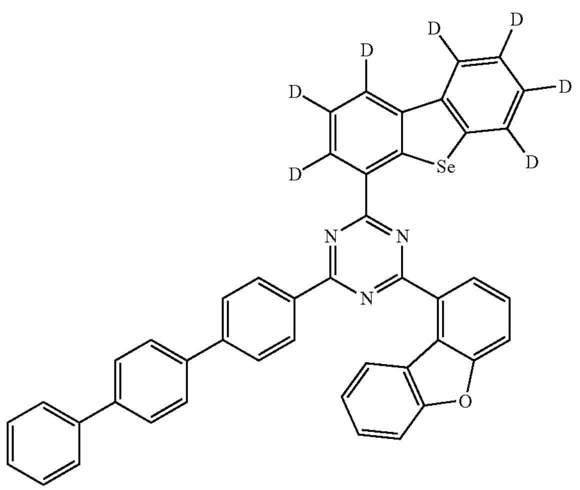
H1-255
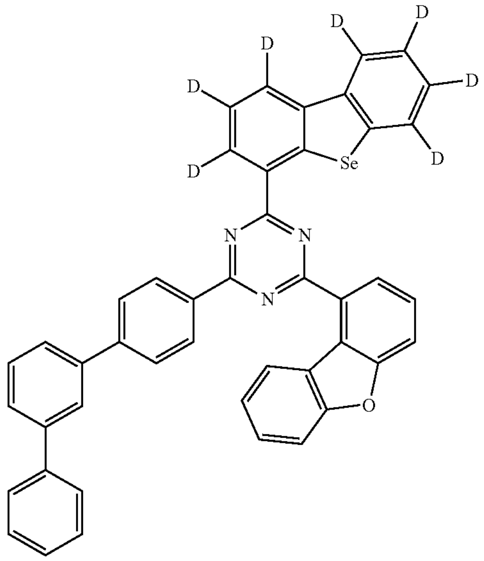
H1-256
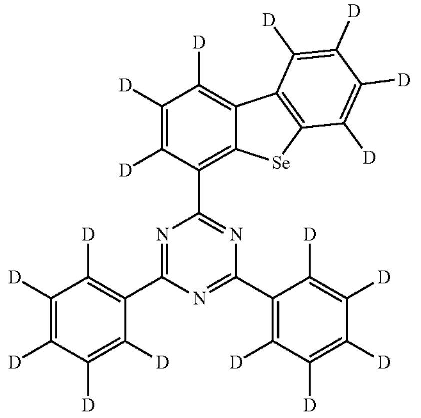
-continued
H1-257
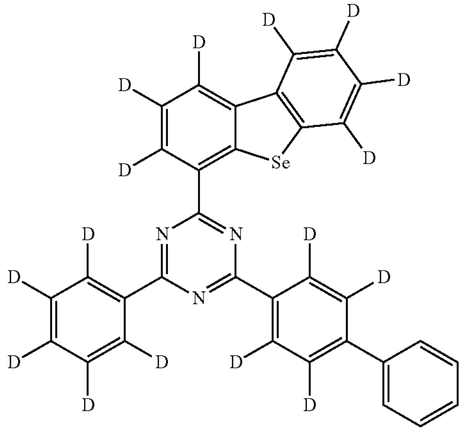
H1-258
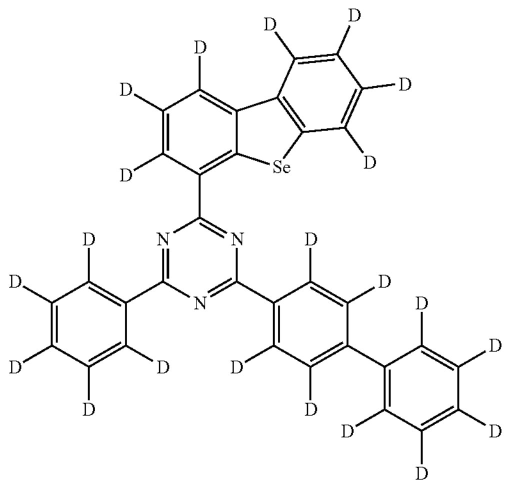
H1-259
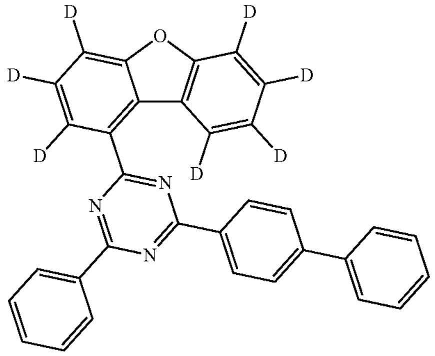

-continued
H1-260
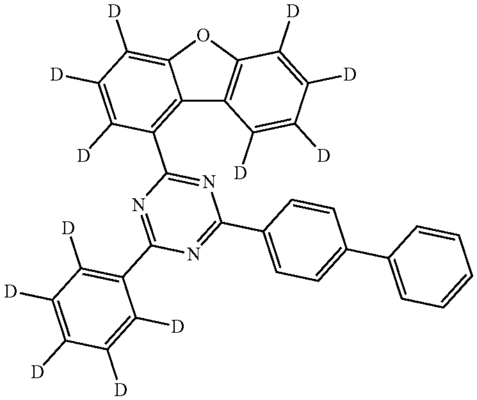
H1-261
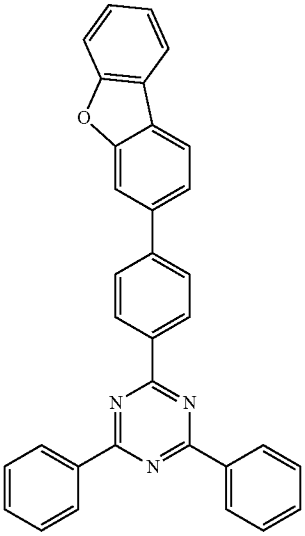
H1-262
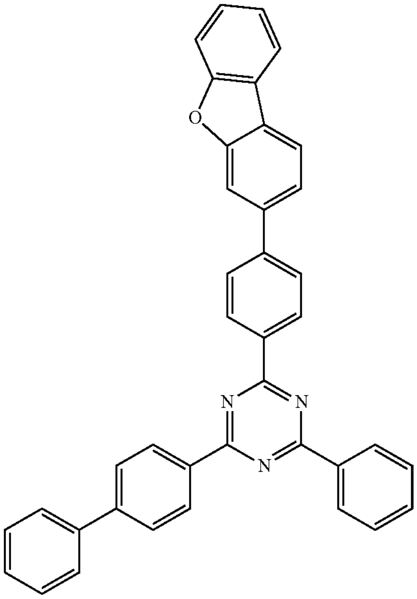
-continued
H1-263
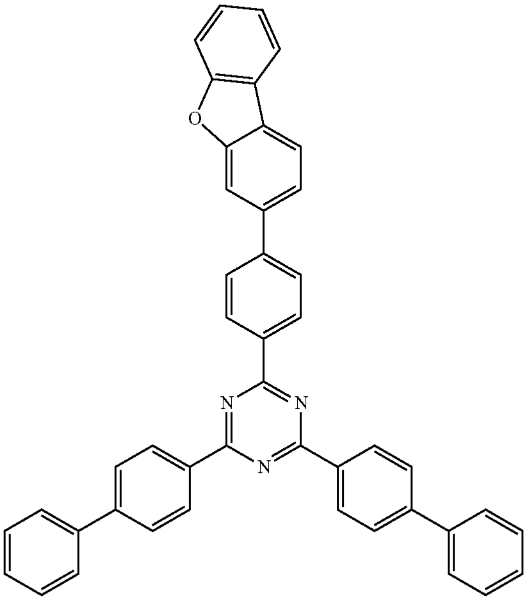
H1-264
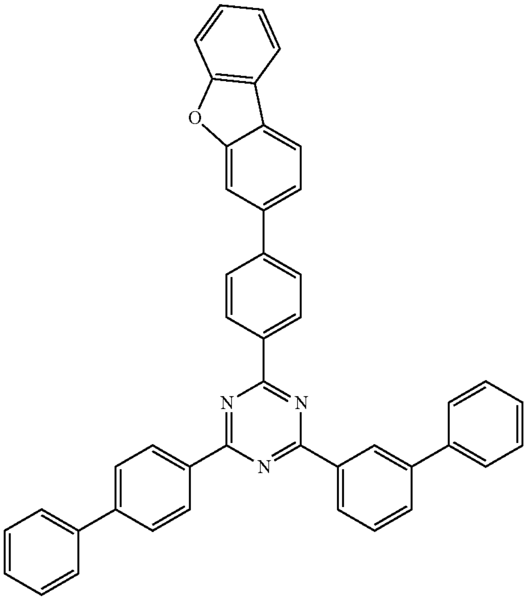

-continued
H1-265
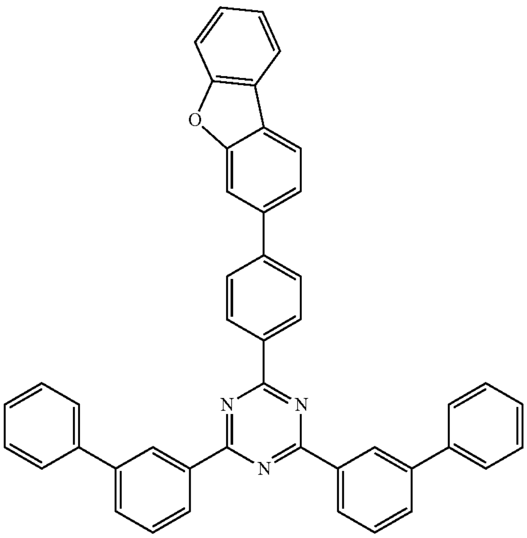
H1-266
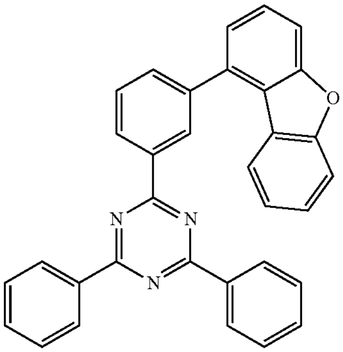
H1-267
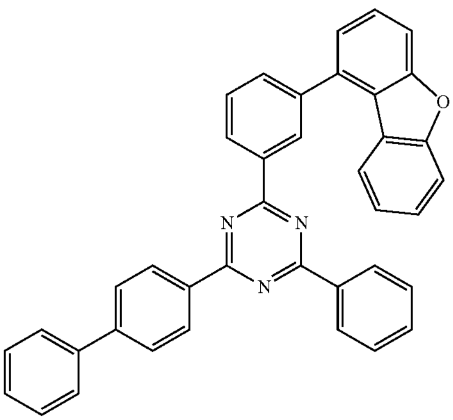
-continued
H1-268
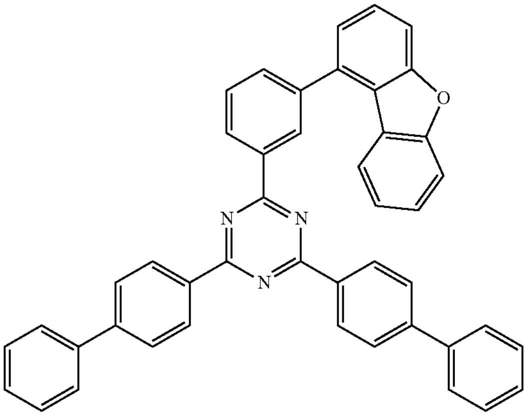
H1-269
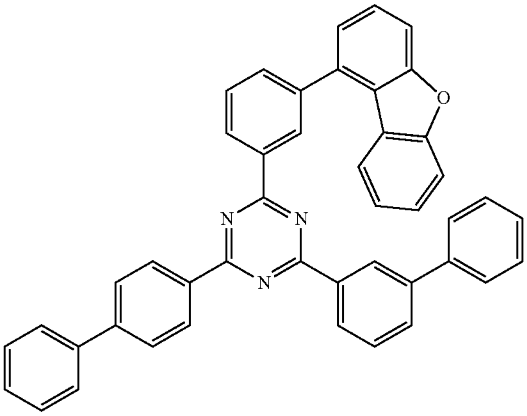
H1-270
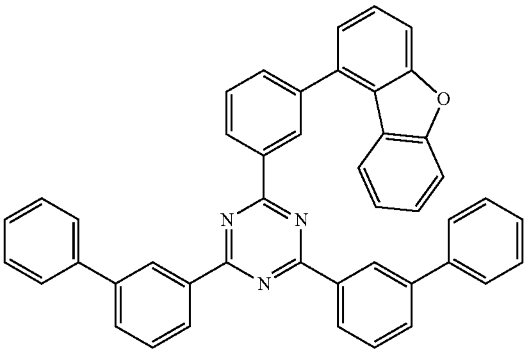

-continued
H1-271
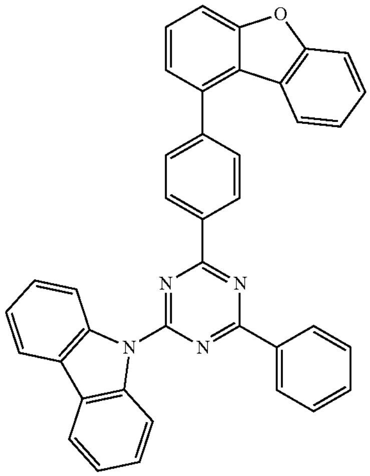
H1-272
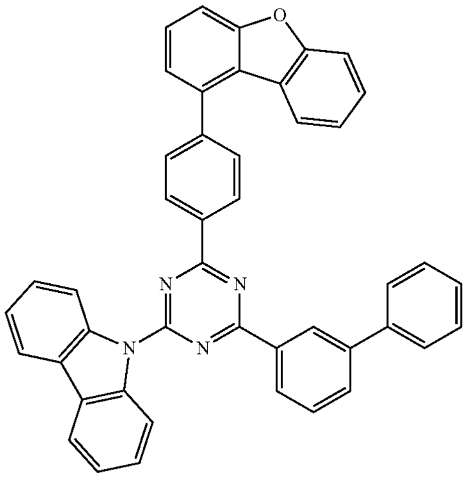
H1-273
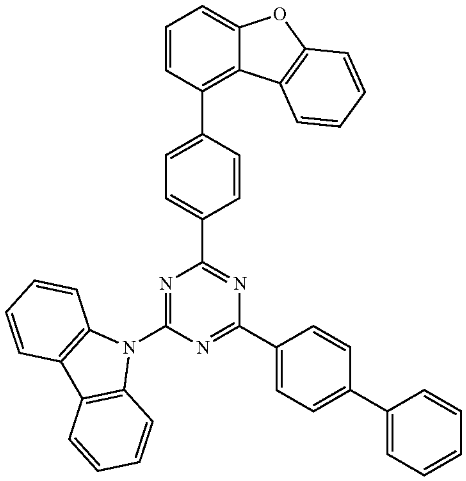
-continued
H1-274
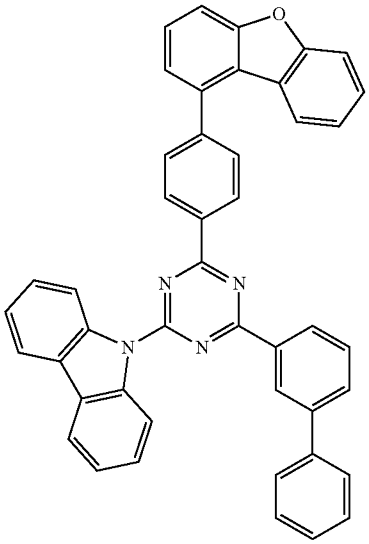
H1-275
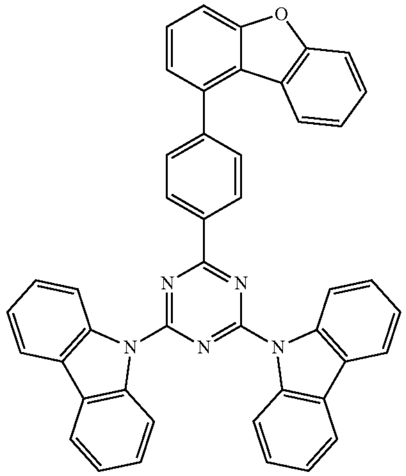
H1-276
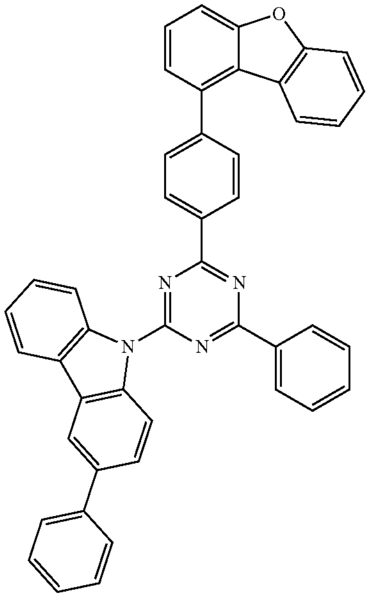

-continued
H1-277
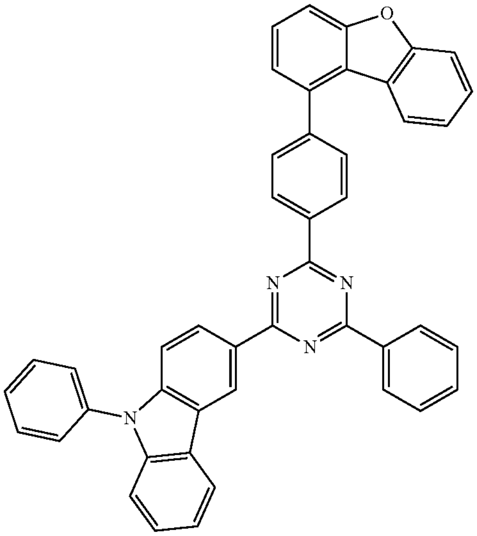
H1-278
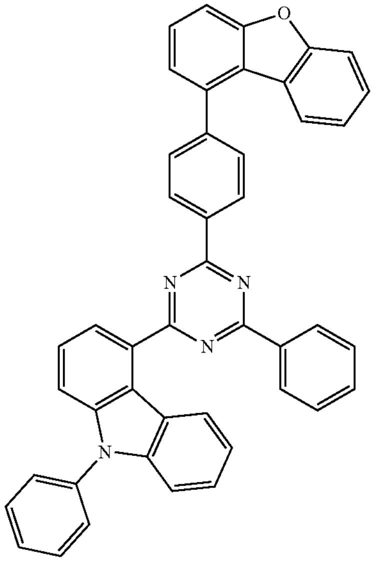
H1-279
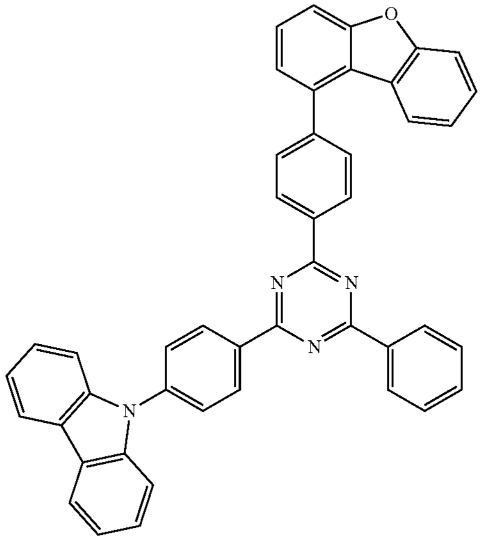
-continued
H1-280
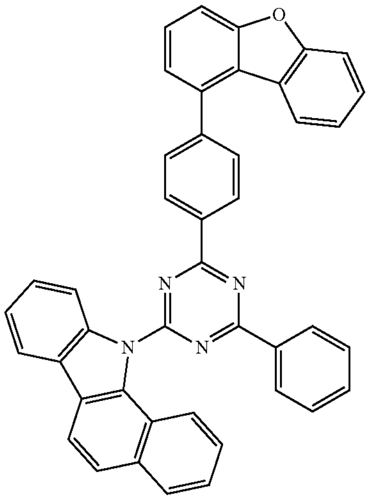
H1-281
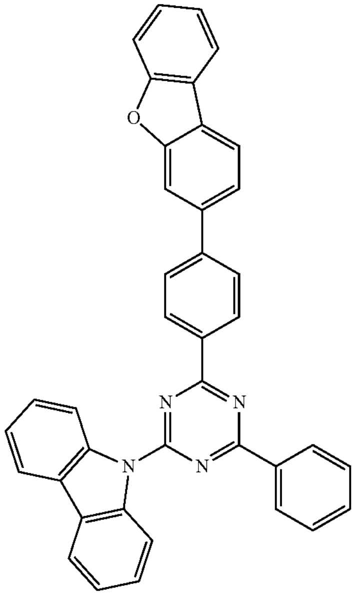

-continued
H1-282
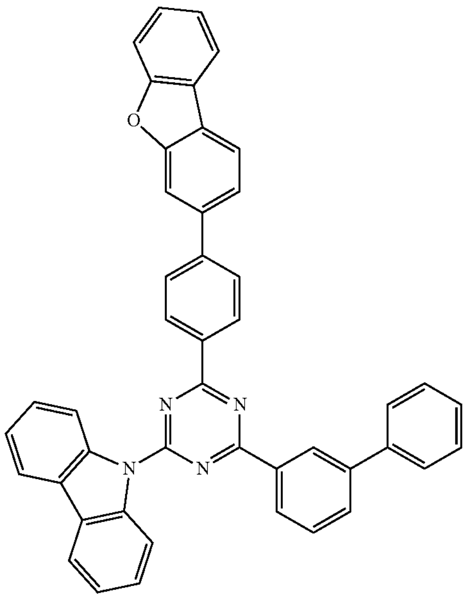
H1-283
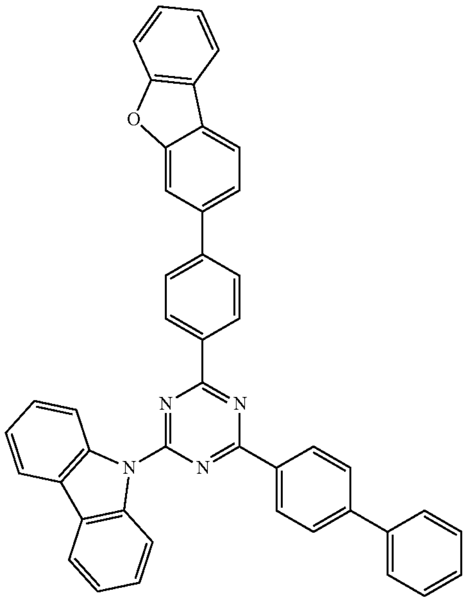
-continued
H1-284
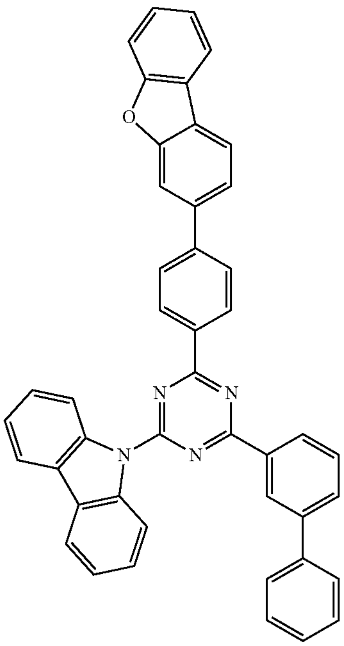
H1-285
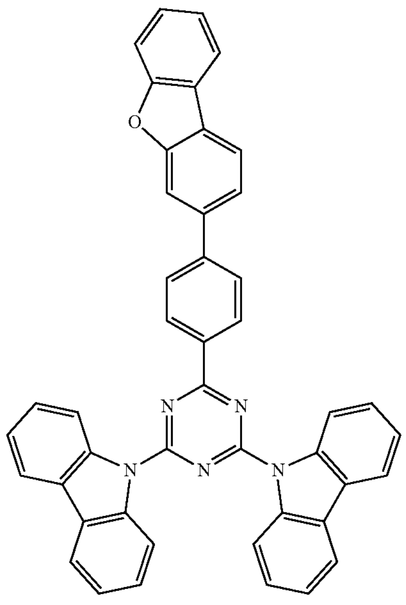

H1-286
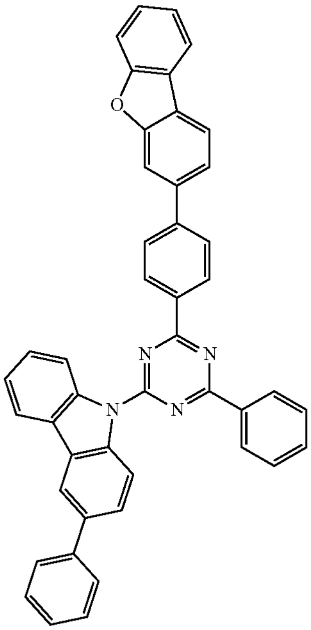
H1-287
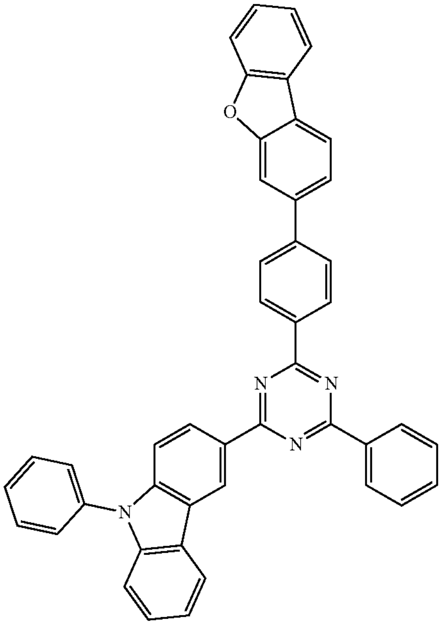
H1-288
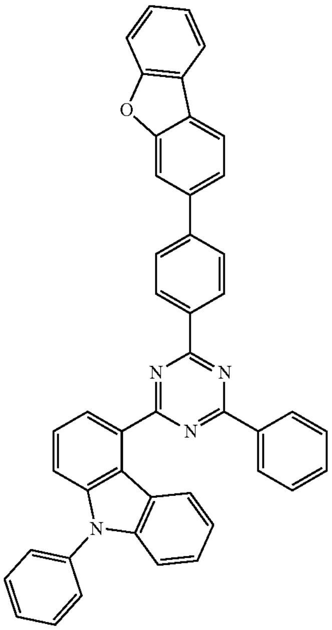
H1-289
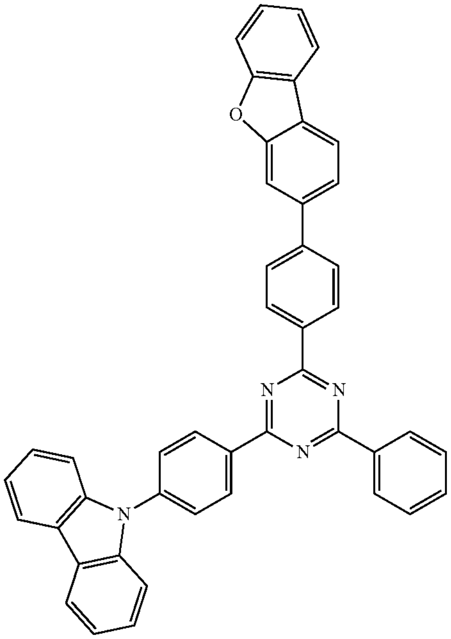

-continued
H1-290
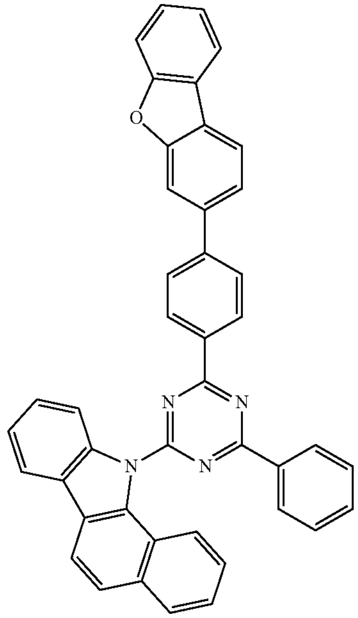
H1-291
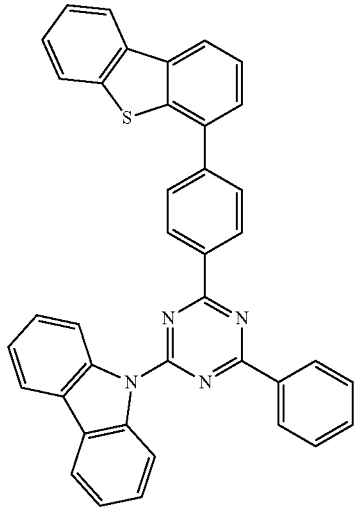
H1-292
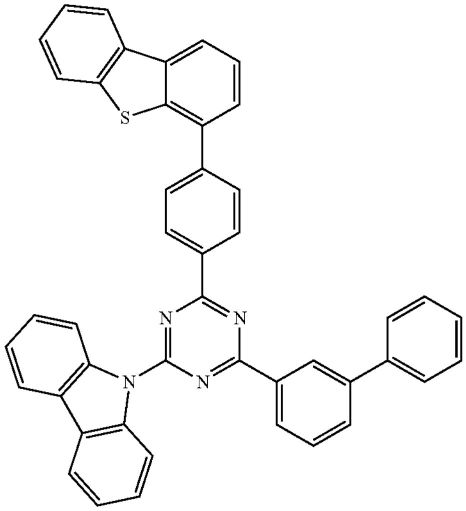
-continued
H1-293
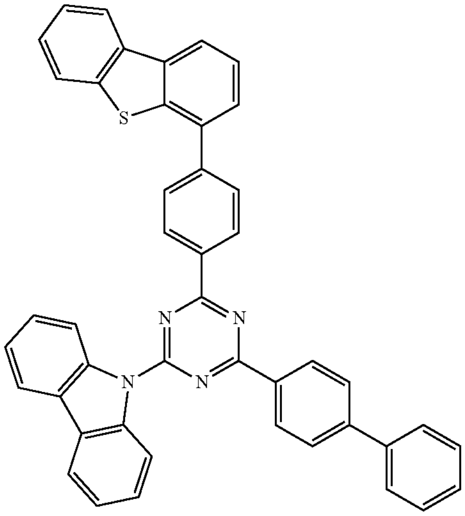
H1-294
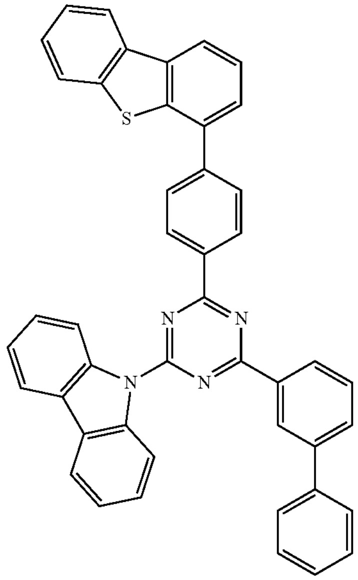
H1-295
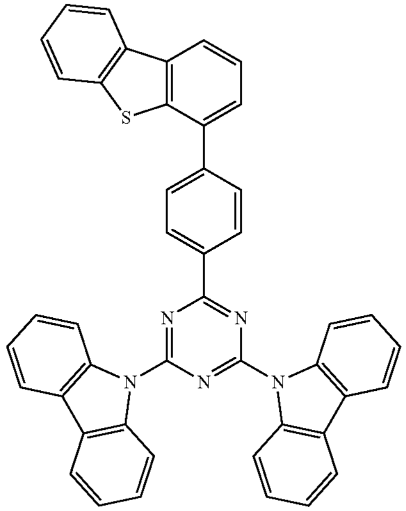

-continued
H1-296
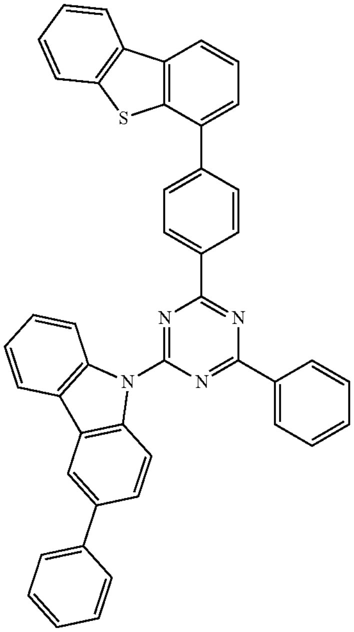
H1-297
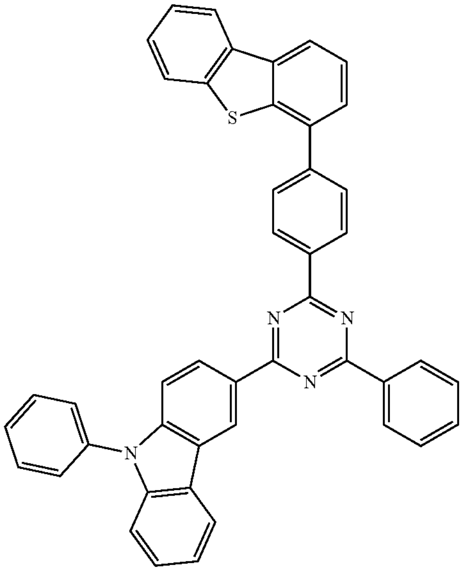
-continued
H1-298
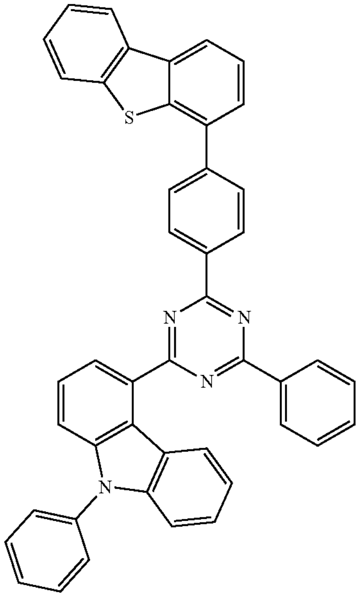
H1-299
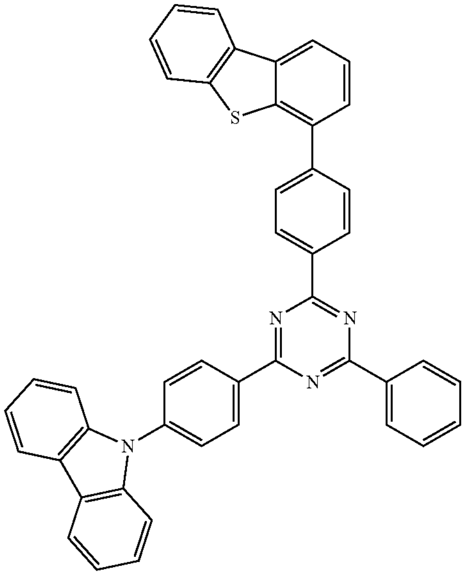

-continued
H1-300
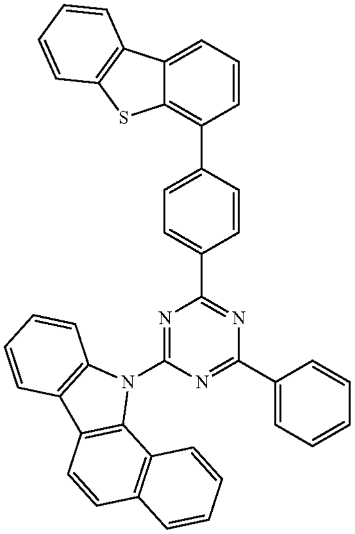
H1-301
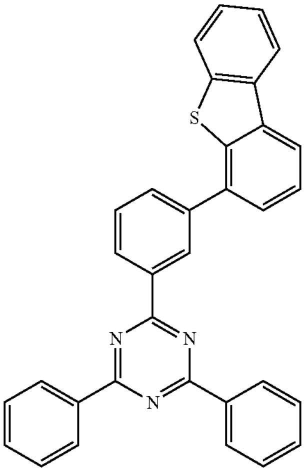
H1-302
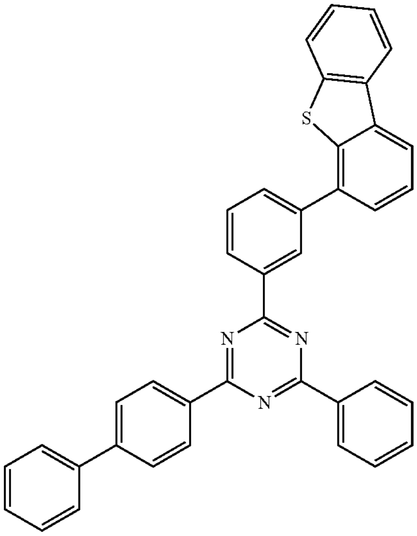
-continued
H1-303
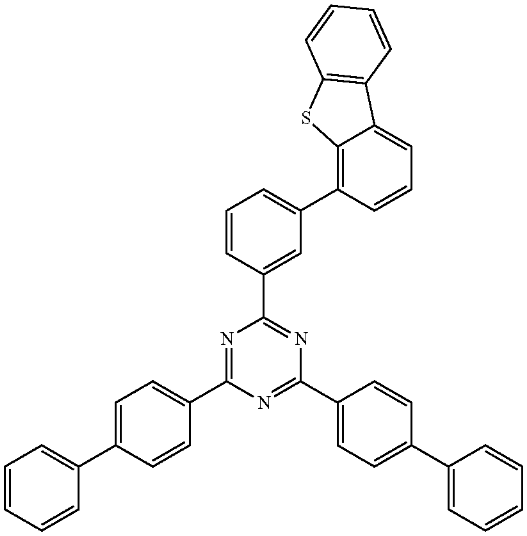
H1-304
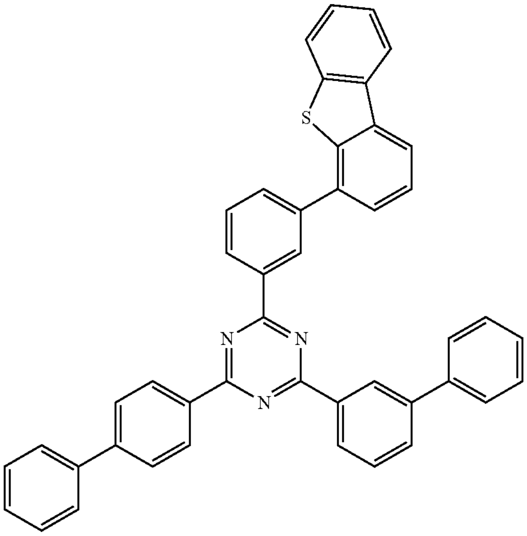
H1-305
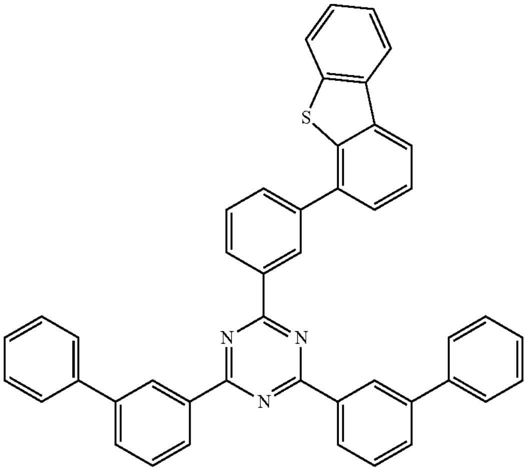

-continued
H1-306
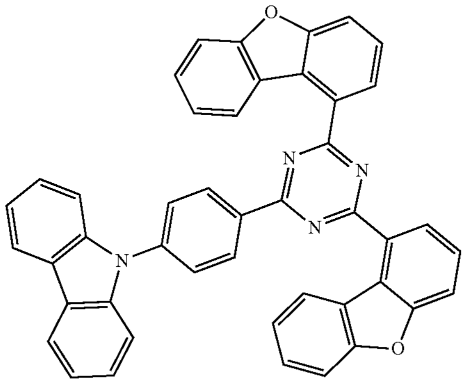
H1-307
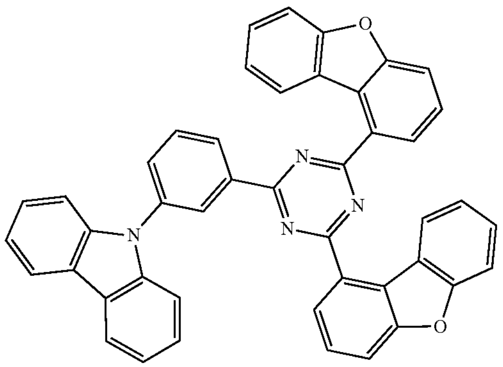
H1-308
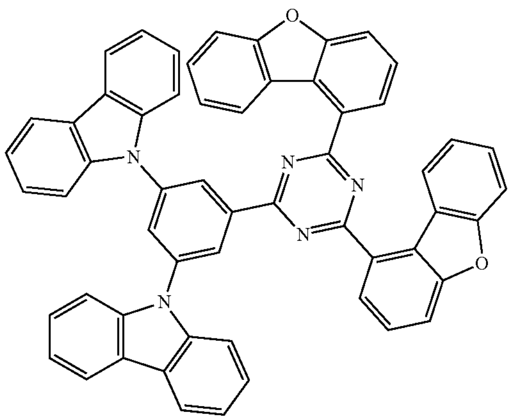
-continued
H1-309
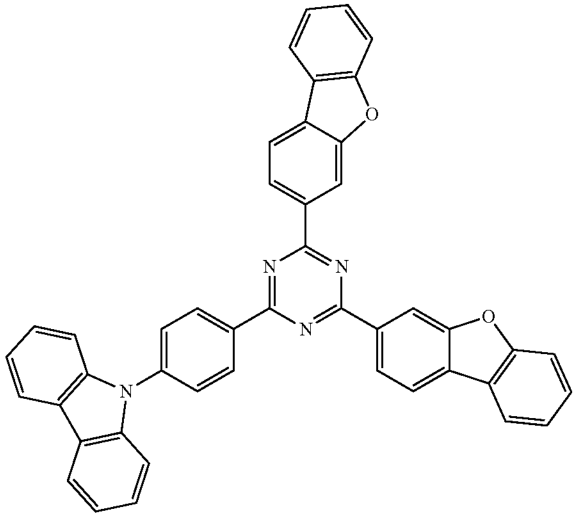
H1-310
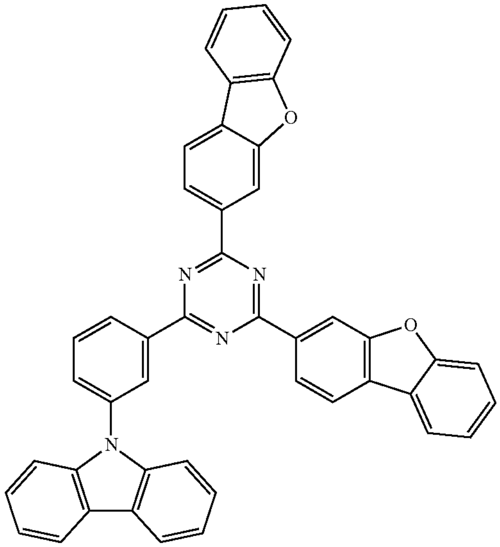
H1-311
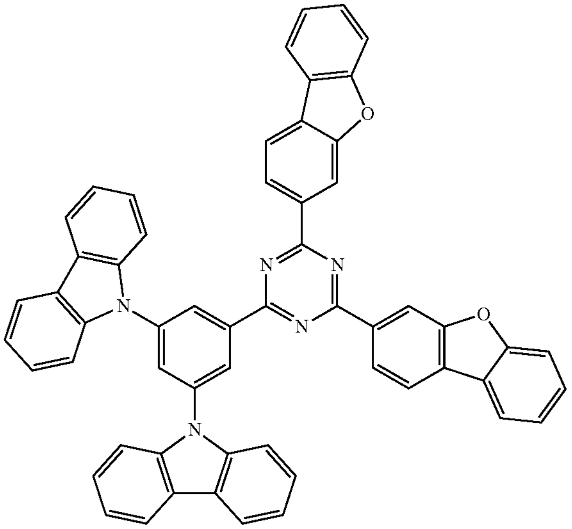

-continued
H1-312
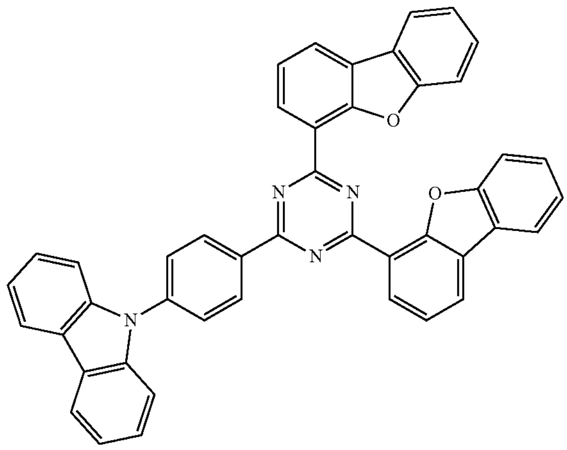
H1-313
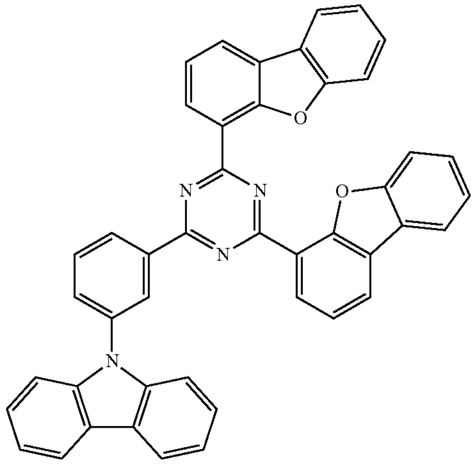
H1-314
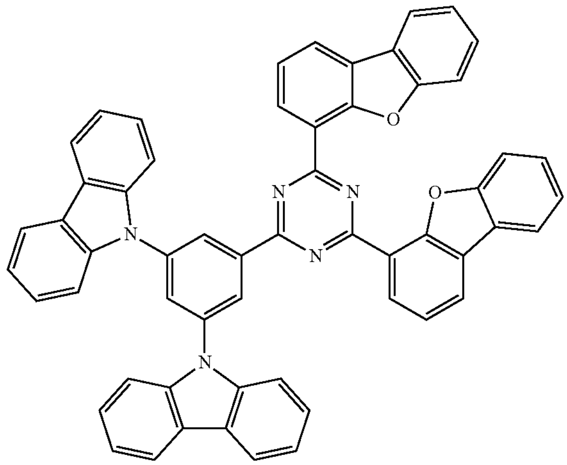
-continued
H1-315
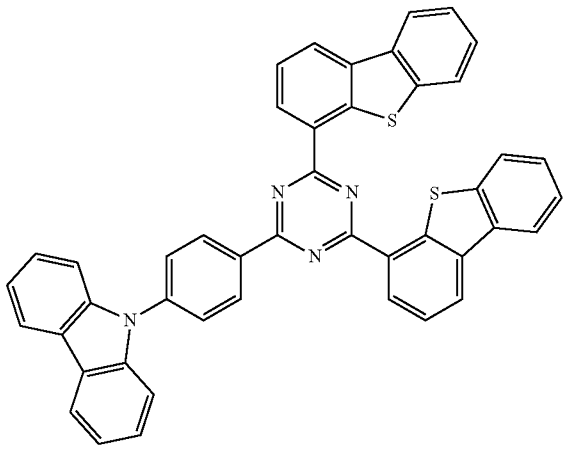
H1-316
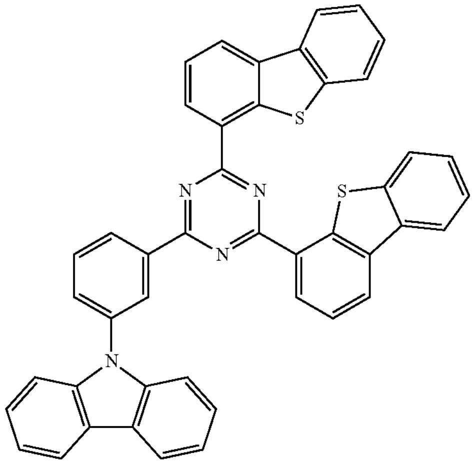
H1-317
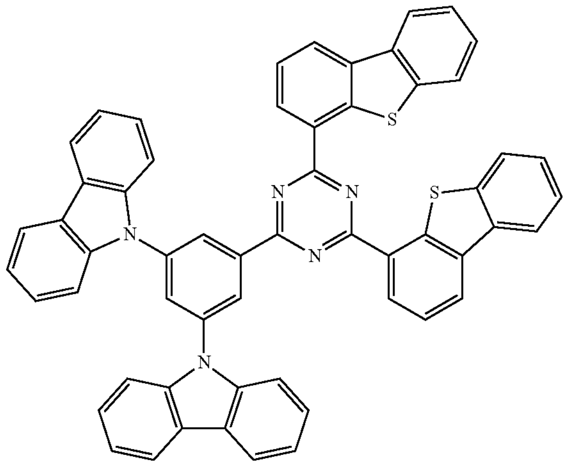

-continued
H1-318
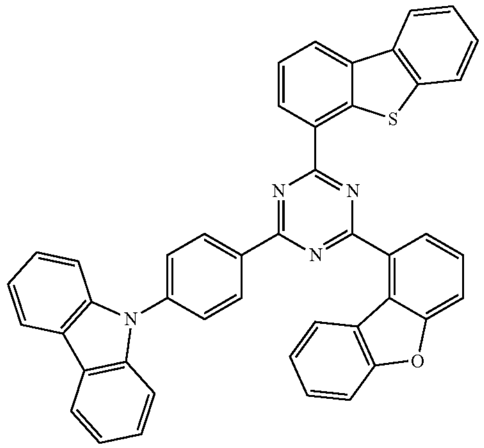
H1-319
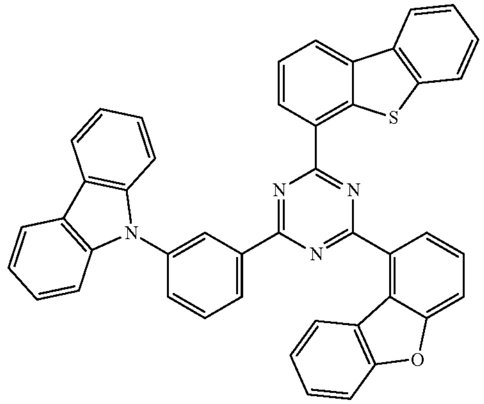
H1-320
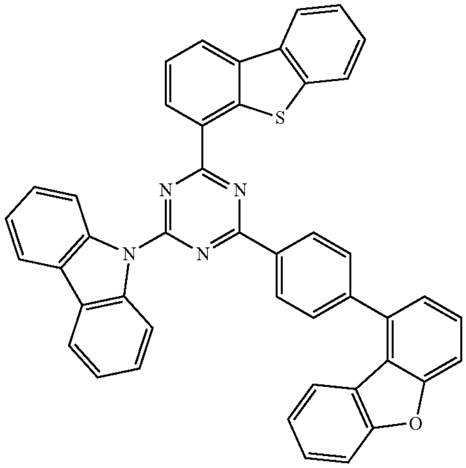
-continued
H1-321
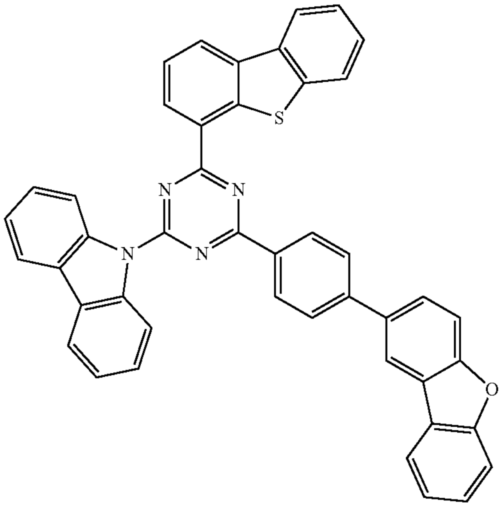
H1-322
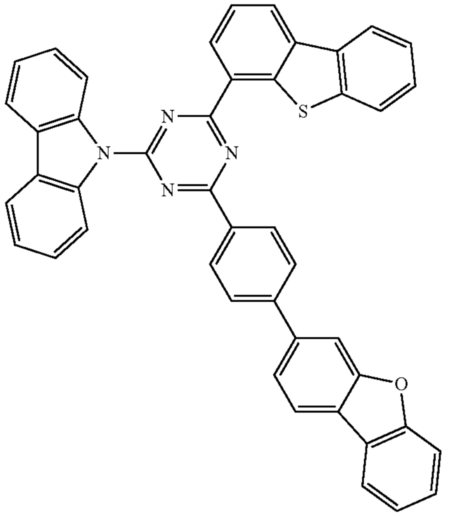
H1-323
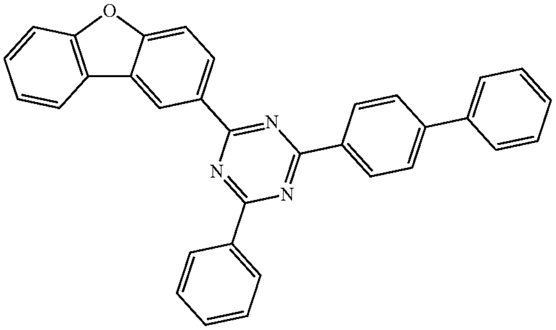

-continued
H1-324
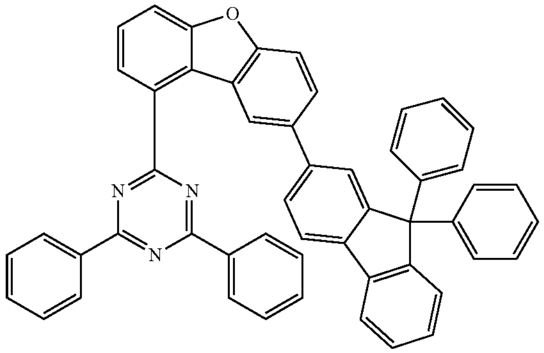
H1-325
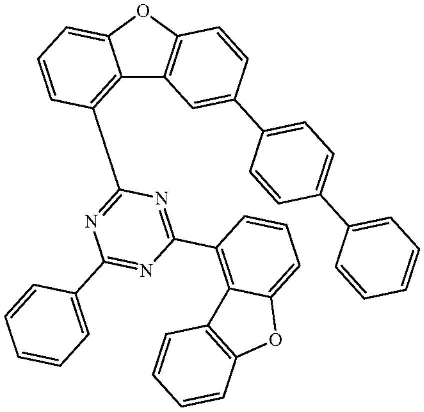
H1-326
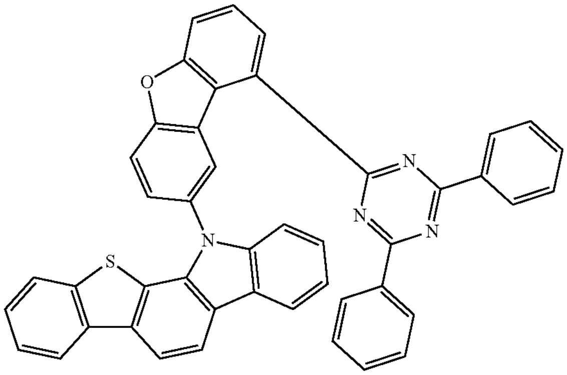
H1-327
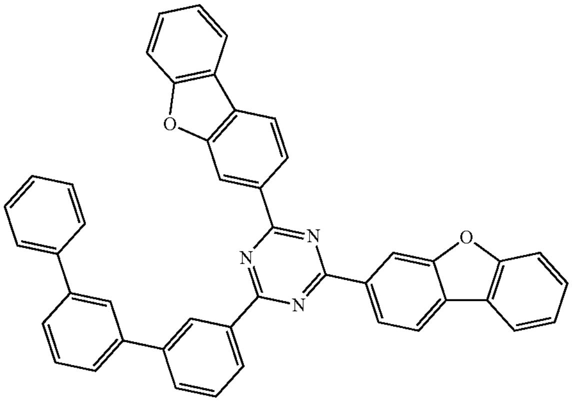
-continued
H1-328
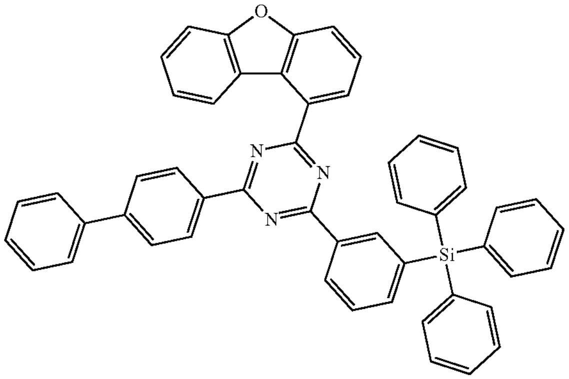
H1-329
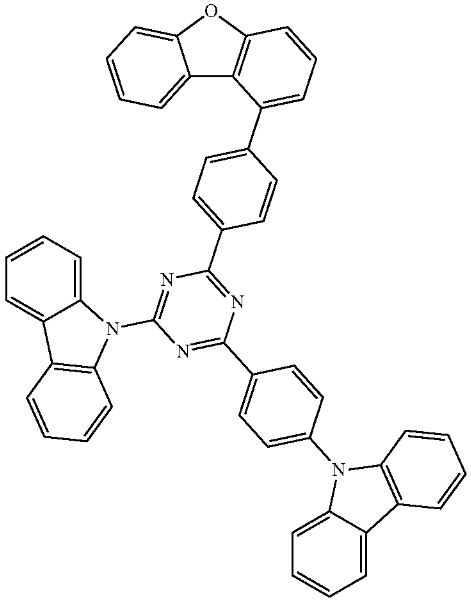
H1-330
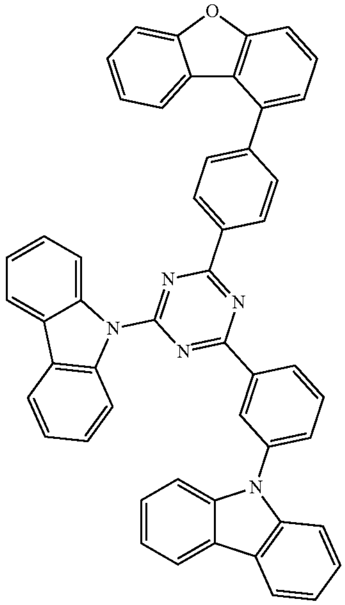

-continued
H1-331
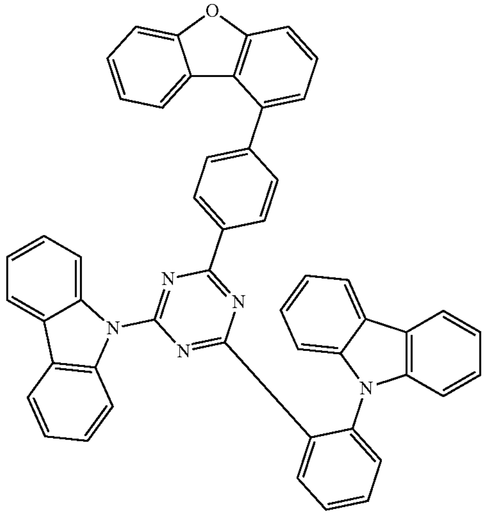
H1-332
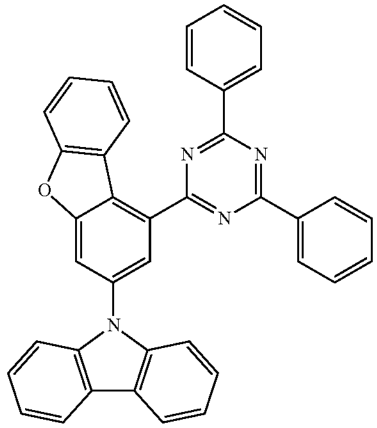
H1-333
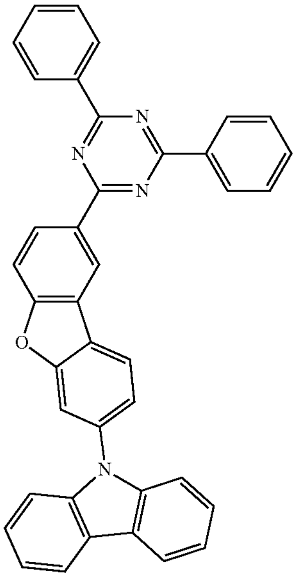
-continued
H1-334
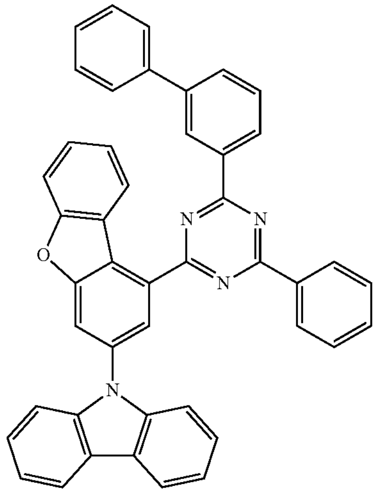
H1-335
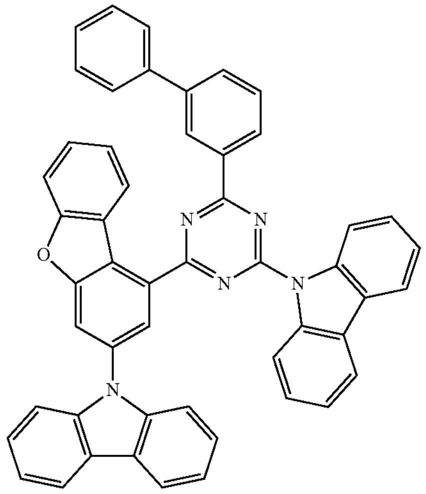
H1-336
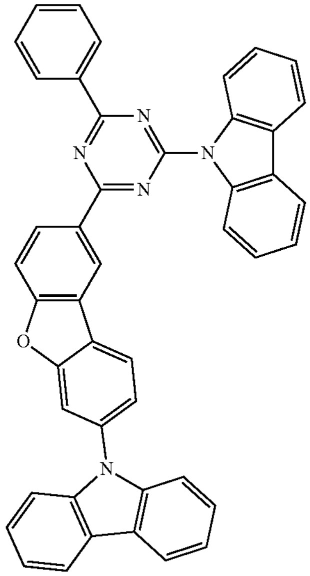

-continued
H1-337
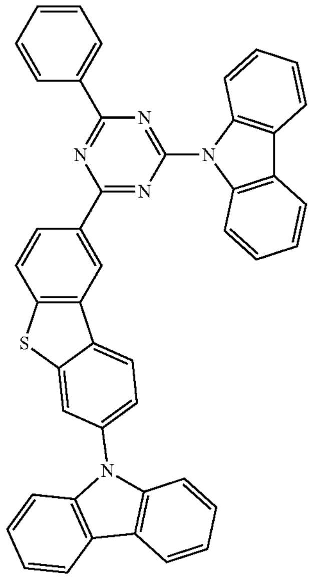
H1-338
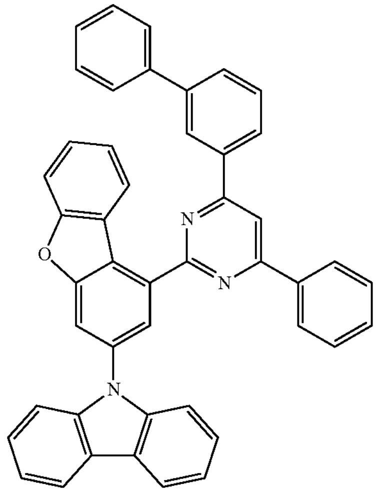
H1-339
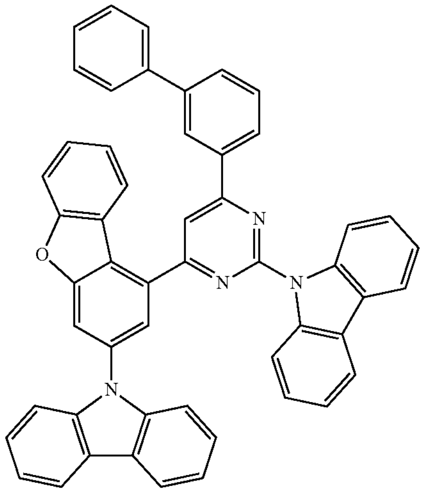
-continued
H1-340
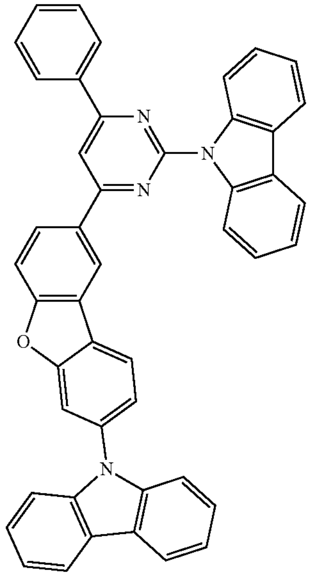
H1-341
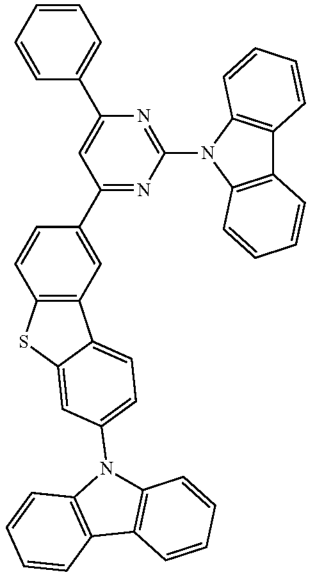
H1-342
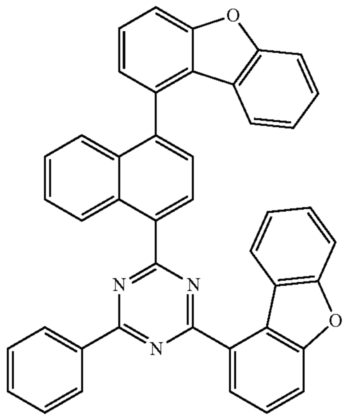

-continued
H1-343
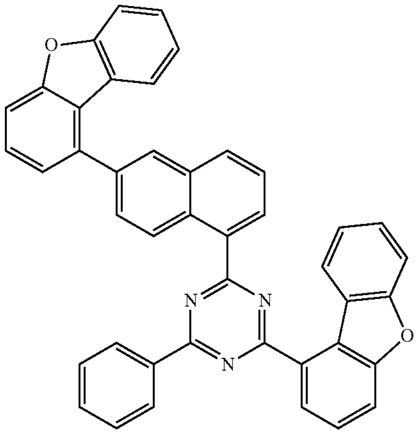
H1-344
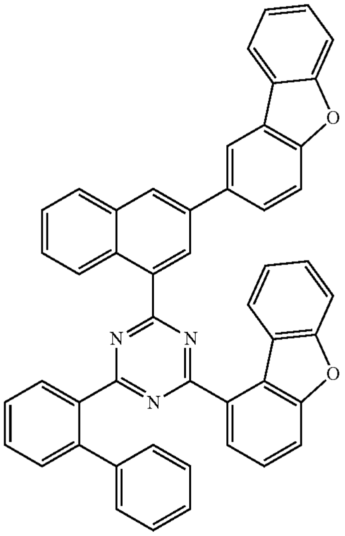
H1-345
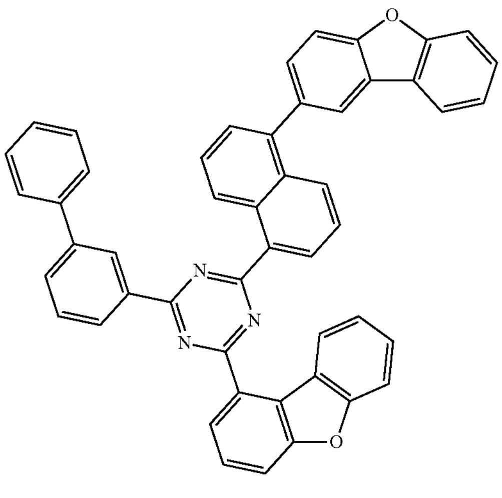
-continued
H1-346
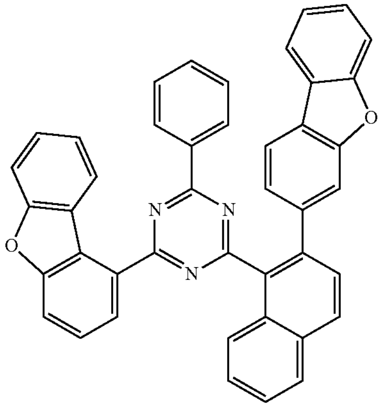
H1-347
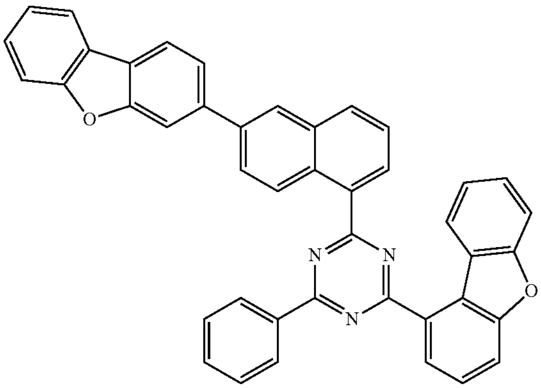
H1-348
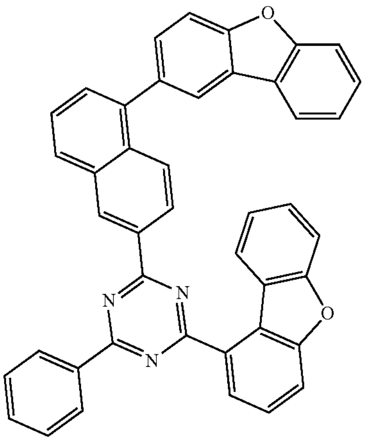

-continued
H1-349
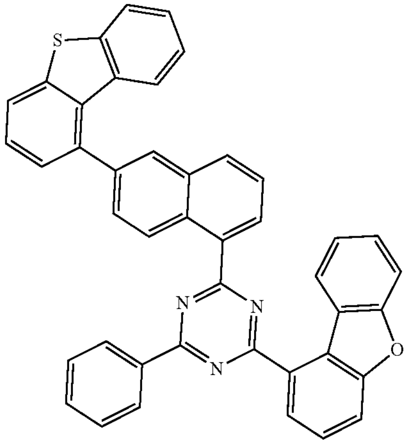
H1-350
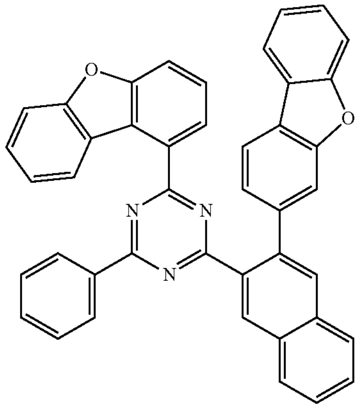
H1-351
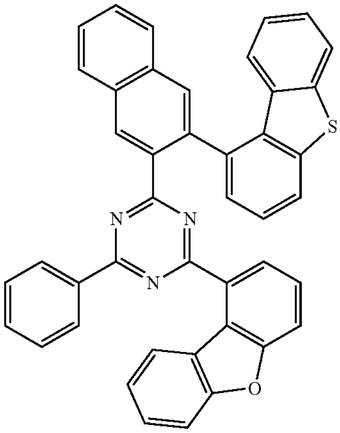
-continued
H1-352
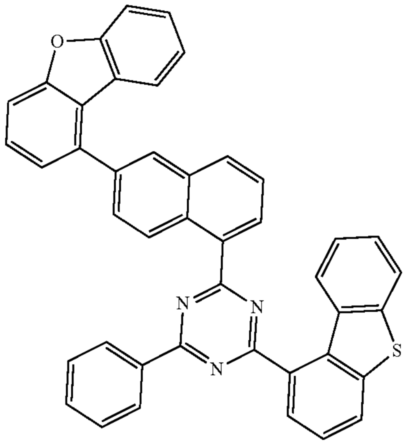
H1-353
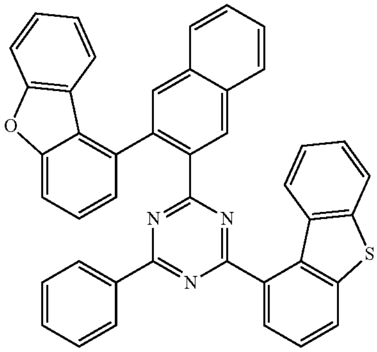
H1-354
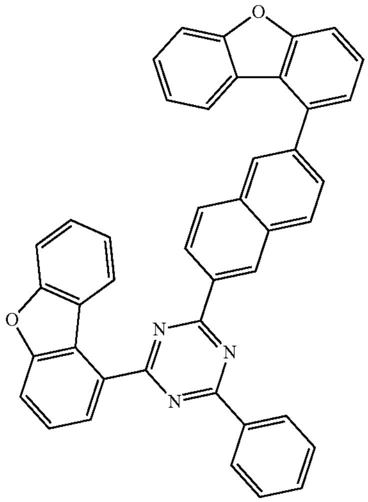

-continued
H1-355
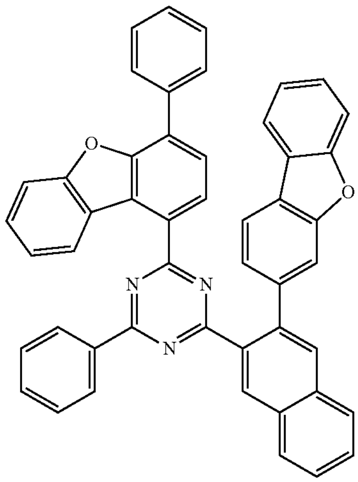
H1-356
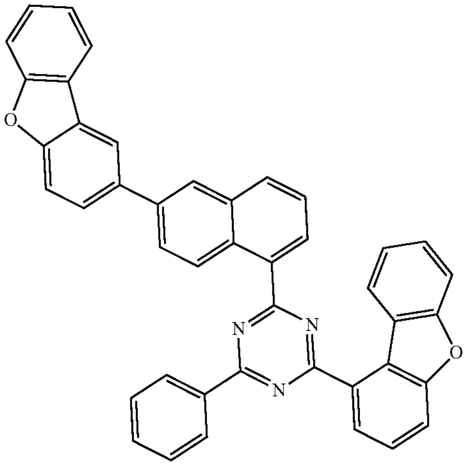
H1-357
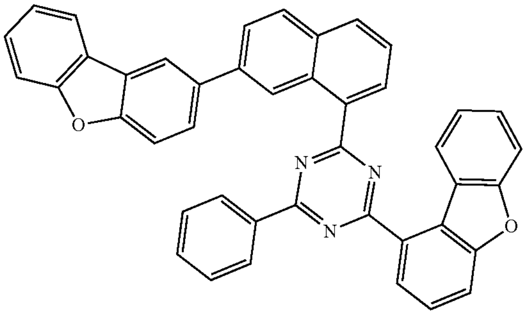
-continued
H1-358
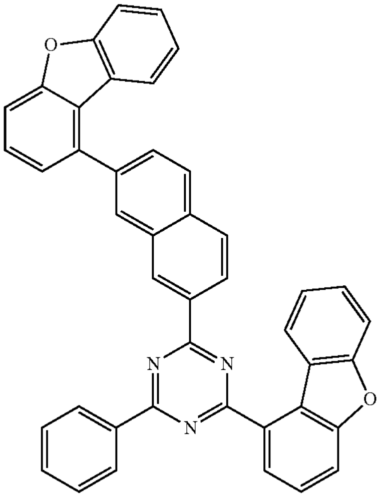
H1-359
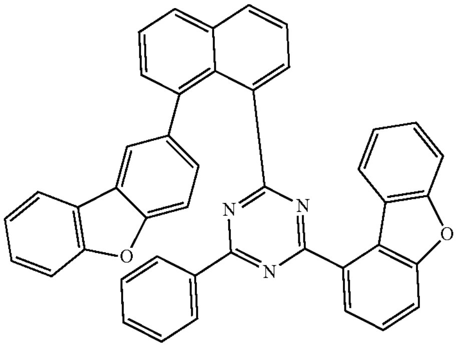
H1-360
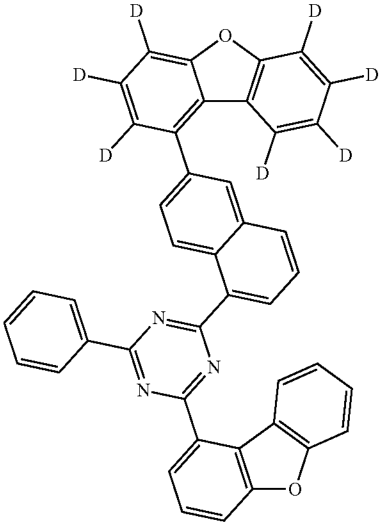

-continued
H1-361
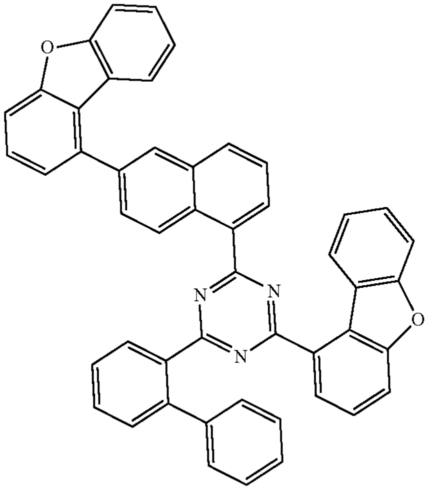
H1-362
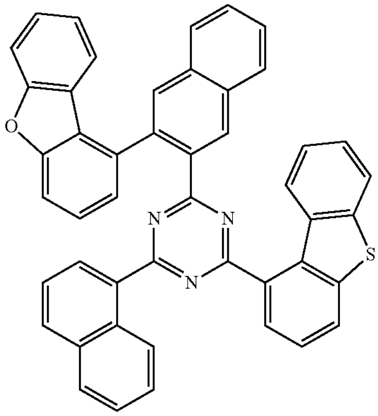
H1-363
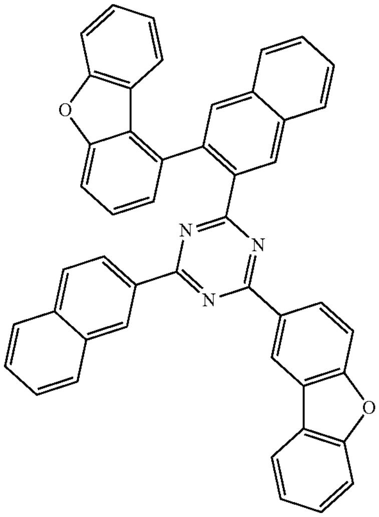
-continued
H1-364
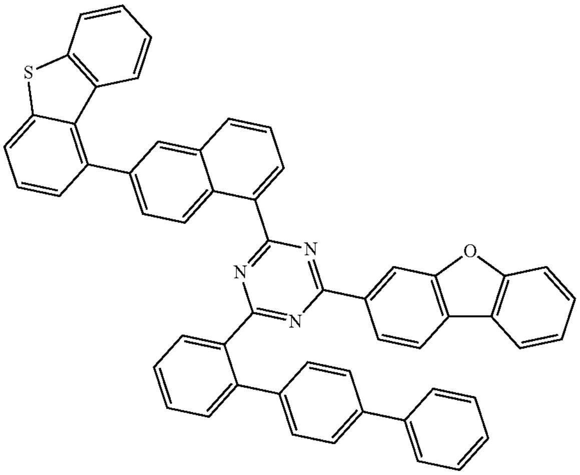
H1-365
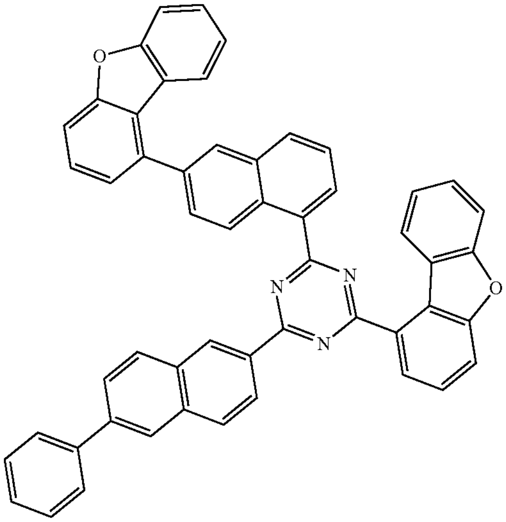
H1-366
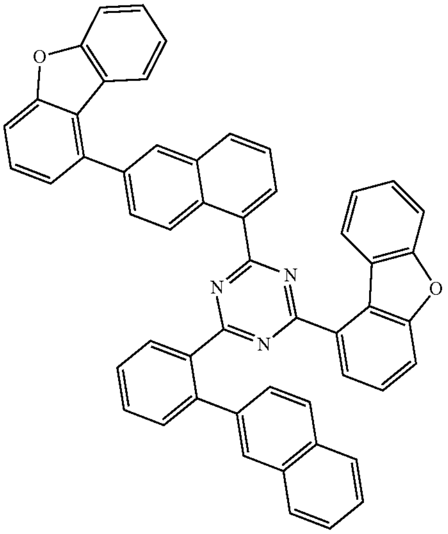

-continued
H1-367
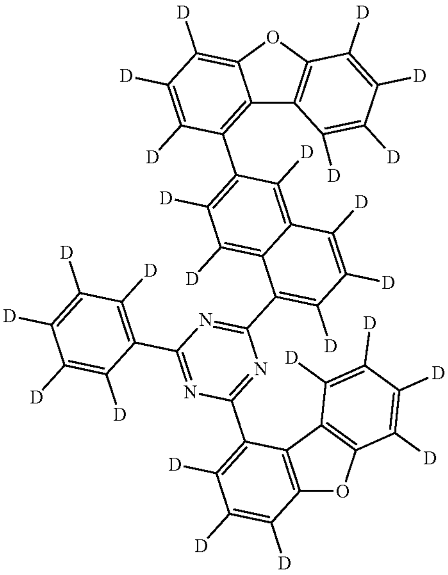
H1-368
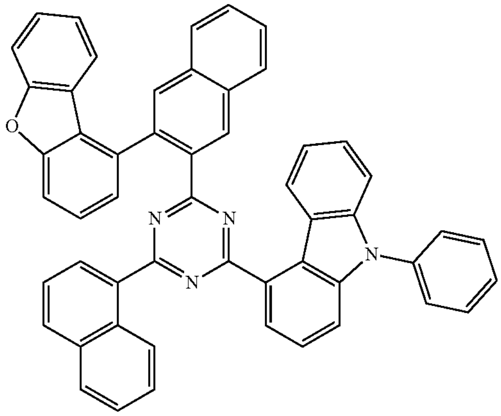
H1-369
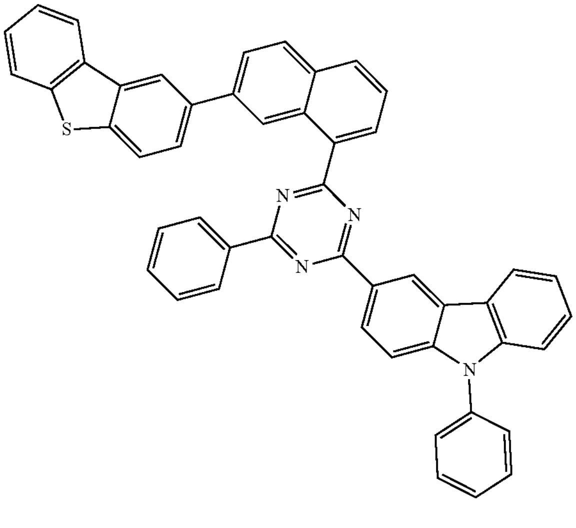
-continued
H1-370
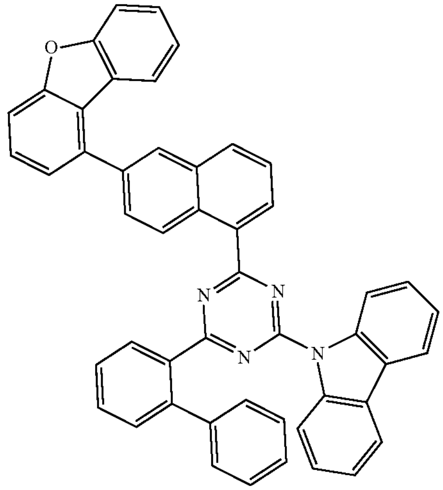
H1-371
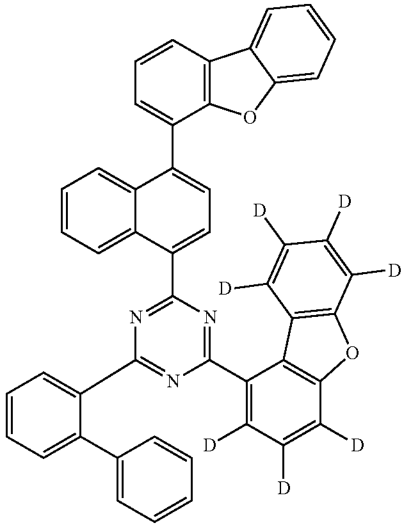
H1-372
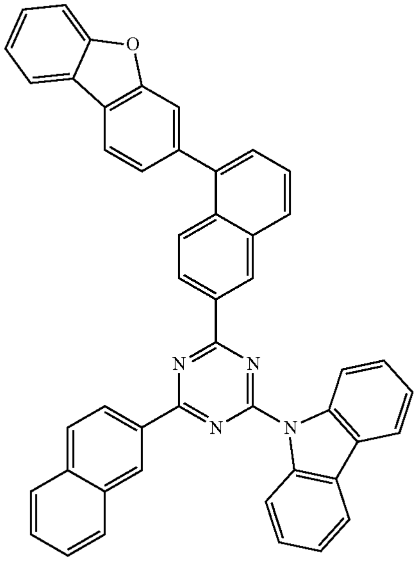

-continued
H1-373
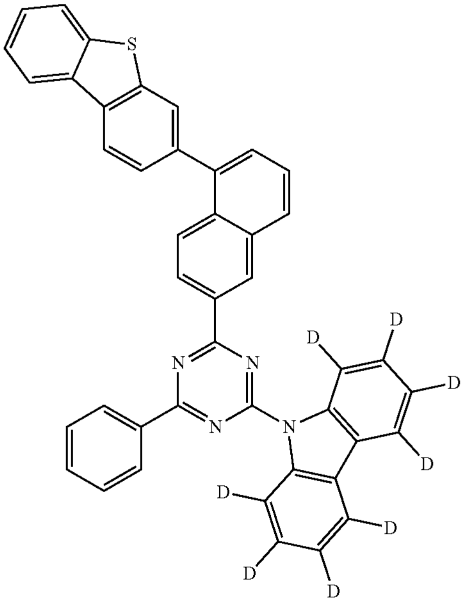
H1-374
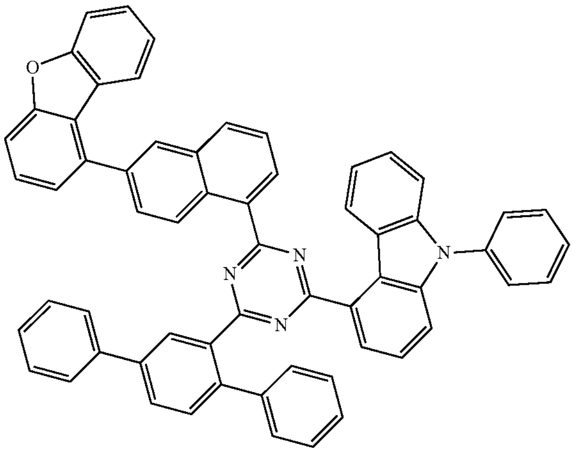
H1-375
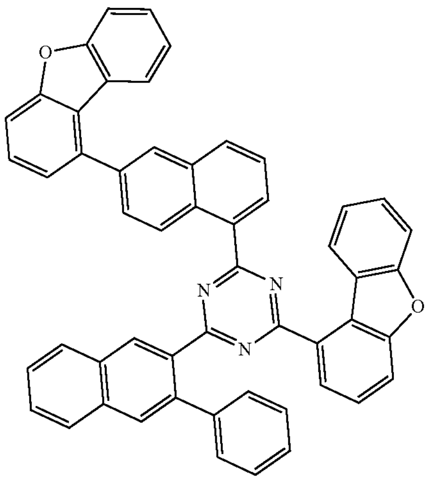
-continued
H1-376
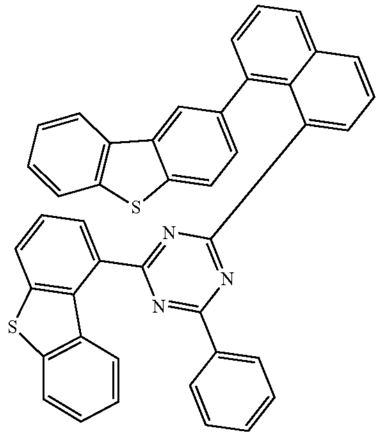
H1-377
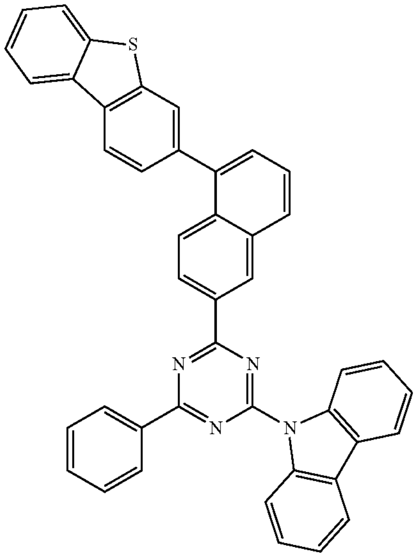
H1-378
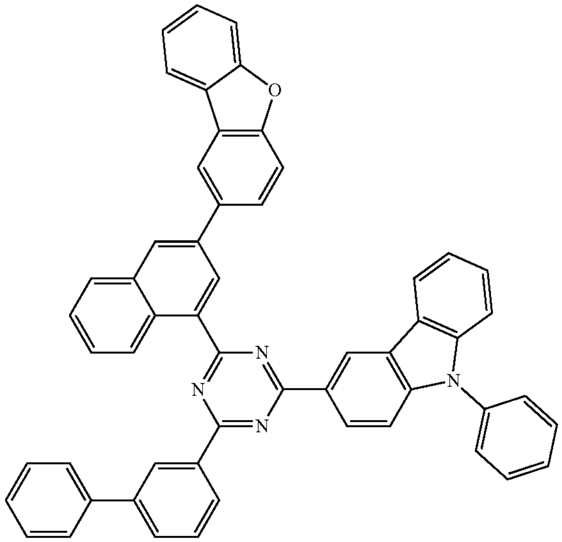

-continued
H1-379
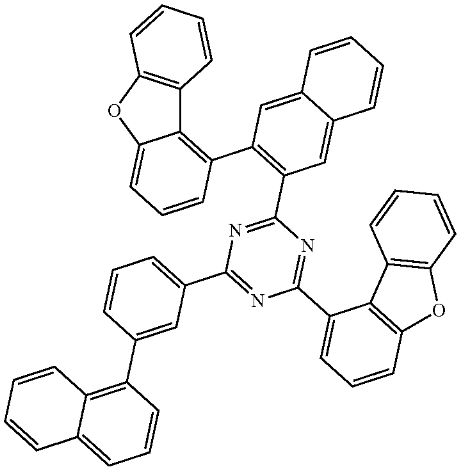
H1-380
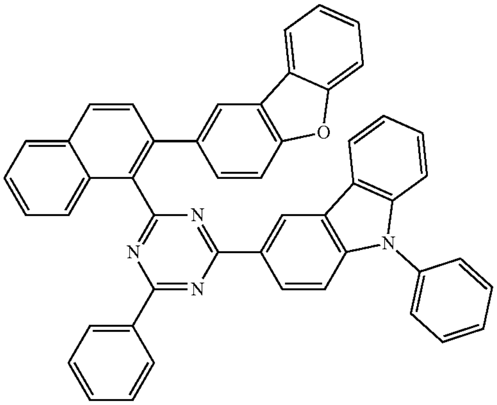
H1-381
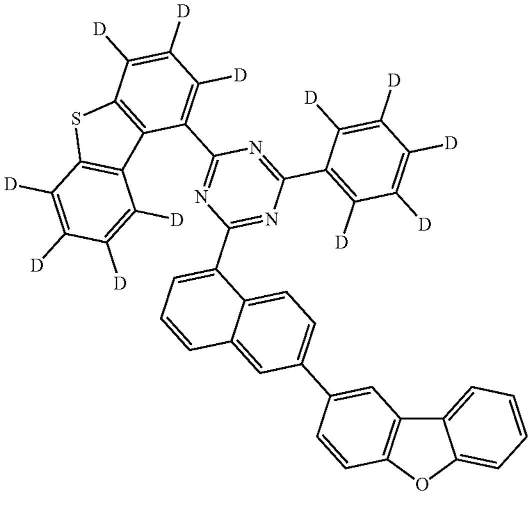
-continued
H1-382
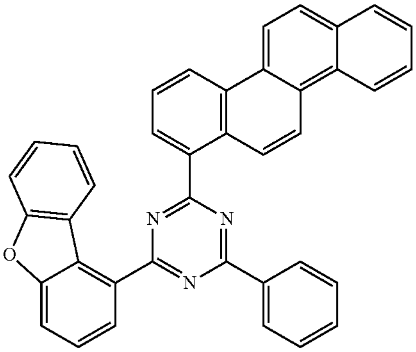
H1-383
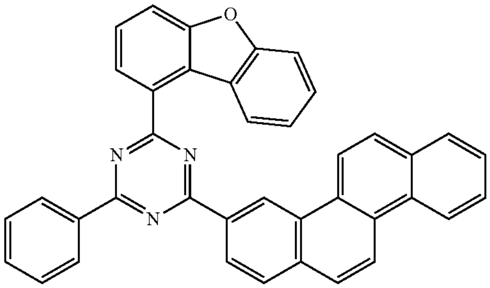
H1-384
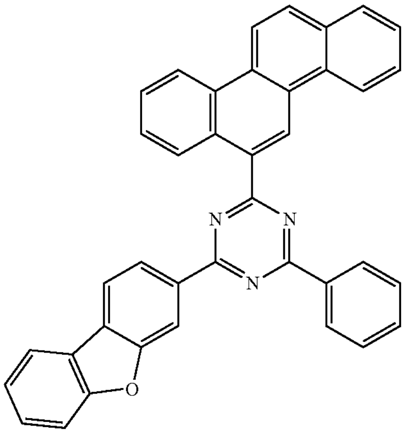
H1-385
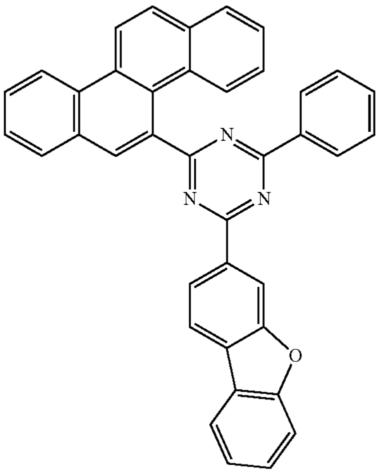

-continued
H1-386
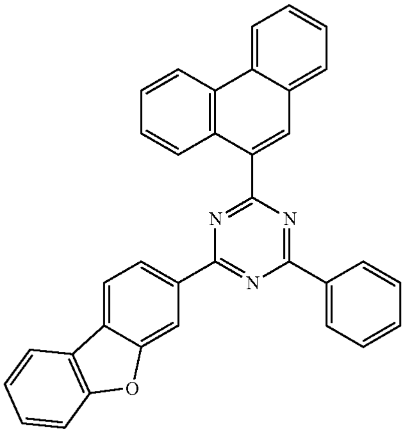
H1-387
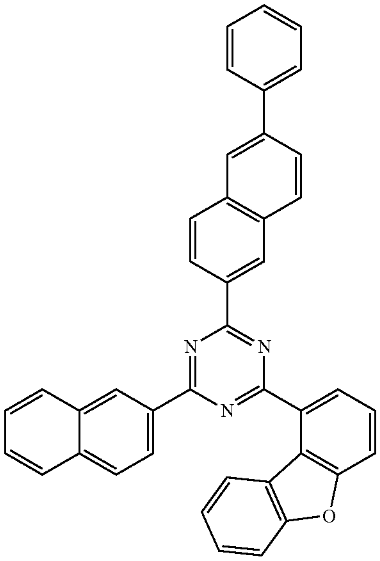
H1-388
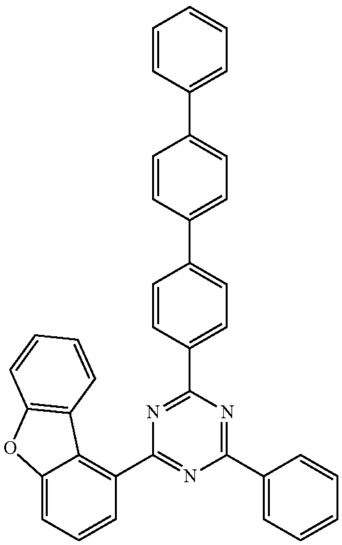
-continued
H1-389
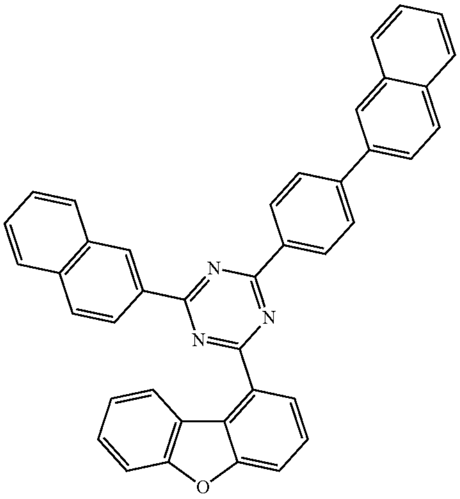
H1-390
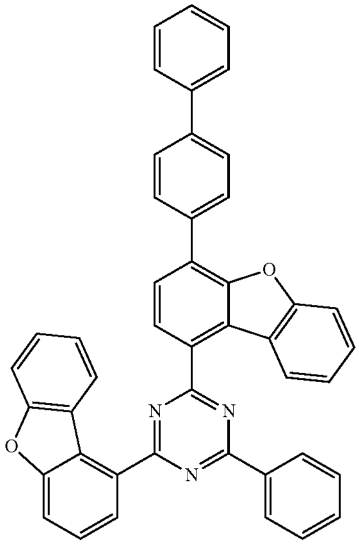
H1-391
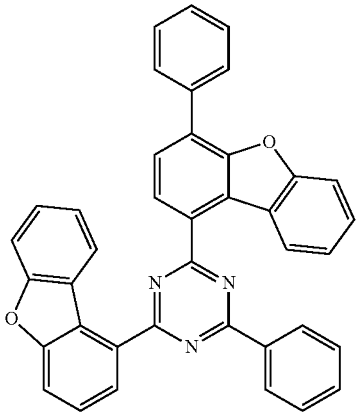

-continued

H1-392

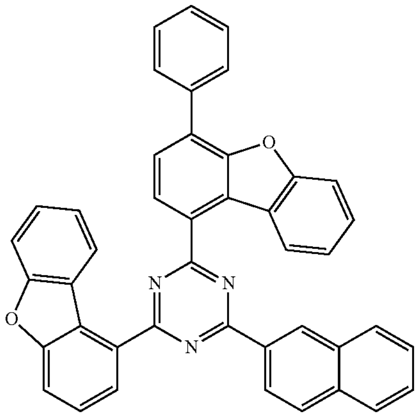

The host material of Formula 1 according to the present disclosure, may be prepared by the following reaction schemes 1 or 2, but is not limited thereto, and may be produced by a synthetic method known to a person skilled in the art.

[Reaction Scheme 1]

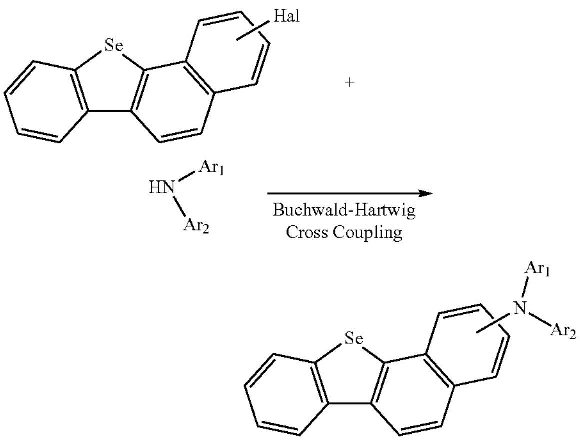

[Reaction Scheme 2]

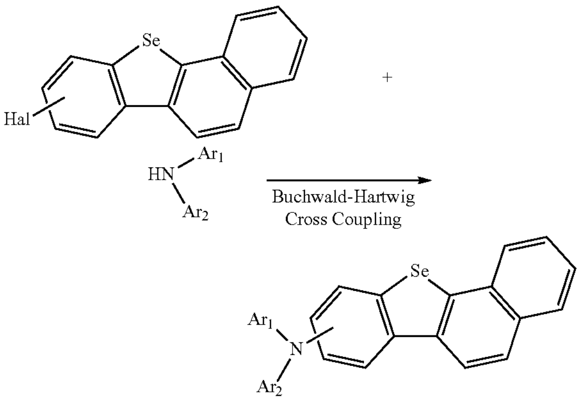

In reaction schemes 1 and 2, the definition of each of the substituents is as defined in Formula 1, and Hal means halogen atom.

As described above, exemplary synthesis examples of the compounds represented by Formula 1 are described, but they are based on Buchwald-Hartwig cross coupling reaction, Suzuki cross-coupling reaction, Wittig reaction, Miyaura borylation reaction, N-arylation reaction, H-mont-mediated etherification reaction, Intramolecular acid-induced cyclization reaction, Pd(II)-catalyzed oxidative cyclization reaction, Grignard reaction, Heck reaction, Cyclic Dehydration reaction, $SN_1$ substitution reaction, $SN_2$ substitution reaction, and Phosphine-mediated reductive cyclization reaction etc. It will be understood by one skilled in the art that the above reaction proceeds even if other substituents defined in the Formula 1 other than the substituents described in the specific synthesis examples are bonded.

The second host material as another host material according to one embodiment is represented by the following Formula 2.

(2)

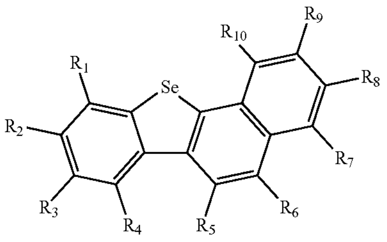

in Formula 2, $R_1$ to $R_{10}$ each independently represent hydrogen, deuterium, a substituted or unsubstituted (C1-C30)alkyl, a substituted or unsubstituted (C6-C30)aryl, or the following Formula a; provided that at least one of $R_1$ to $R_{10}$ is(are) the following Formula a;

(a)

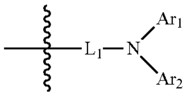

in Formula a, $L_1$ represents a single bond, a substituted or unsubstituted (C6-C30)arylene, or a substituted or unsubstituted (3- to 30-membered)heteroarylene;

$Ar_1$ and $Ar_2$ each independently represent a substituted or unsubstituted (C1-C30)alkyl, a substituted or unsubstituted (C6-C30)aryl, a substituted or unsubstituted (3- to 30-membered)heteroaryl, or $-L_3-NAr_3Ar_4$;

$L_3$ represents a substituted or unsubstituted (C6-C30) arylene or a substituted or unsubstituted (3- to 30-membered)heteroarylene; and $Ar_3$ and $Ar_4$ each independently represent a substituted or unsubstituted (C6-C30)aryl or a substituted or unsubstituted (3- to 30-membered)heteroaryl.

In one embodiment, $R_1$ to $R_{10}$ each independently may be hydrogen, deuterium, or the Formula a, and at least one of $R_1$ to $R_{10}$ is(are) the Formula a.

In one embodiment, at least two of $R_1$ to $R_{10}$ may be the Formula a.

In one embodiment, $L_1$ may be a single bond or a substituted or unsubstituted (C6-C30)arylene, preferably, a single bond or a substituted or unsubstituted (C6-C25) arylene, more preferably, a single bond or a substituted or unsubstituted (C6-C18)arylene. For example, $L_1$ may be a single bond, a substituted or unsubstituted phenylene, a substituted or unsubstituted p-biphenylene, a substituted or unsubstituted m-biphenylene, or a substituted or unsubstituted o-biphenylene.

In one embodiment, Ar and $Ar_2$ each independently may be a substituted or unsubstituted (C6-C30)aryl or a substituted or unsubstituted (5- to 30-membered)heteroaryl, preferably, a substituted or unsubstituted (C6-C25)aryl or a substituted or unsubstituted (5- to 25-membered)heteroaryl, more preferably, a substituted or unsubstituted (C6-C25)aryl or a substituted or unsubstituted (5- to 18-membered)heteroaryl. For example, $Ar_1$ and $Ar_2$ each independently may be a substituted or unsubstituted phenyl, a substituted or unsubstituted p-biphenyl, a substituted or unsubstituted m-biphenyl, a substituted or unsubstituted o-biphenyl, a substituted or unsubstituted m-terphenyl, a substituted or unsubstituted o-terphenyl, a substituted or unsubstituted o-quarterphenyl, a substituted or unsubstituted fluorenyl, a substituted or unsubstituted phenanthrenyl, benzofluorenyl unsubstituted or substituted with methyl, a substituted or unsubstituted carbazolyl, a substituted or unsubstituted dibenzofuranyl, a substituted or unsubstituted dibenzothiophenyl, a substituted or unsubstituted dibenzoselenophenyl, a substituted or unsubstituted benzocarbazolyl, a substituted or unsubstituted benzonaphthofuranyl, or a substituted or unsubstituted benzonaphthothiophenyl. Wherein, the substituents of the above substituented compounds may be at least one of methyl, phenyl, fluorenyl, and carbazolyl.

In one embodiment, $L_3$ may be a substituted or unsubstituted (C6-C30)arylene, preferably, a substituted or unsubstituted (C6-C25)arylene, more preferably, a substituted or unsubstituted (C6-C18)arylene. For example, $L_3$ may be a substituted or unsubstituted phenylene.

In one embodiment, $Ar_3$ and $Ar_4$ each independently may be a substituted or unsubstituted (C6-C30)aryl or a substituted or unsubstituted (5- to 30-membered)heteroaryl, preferably, a substituted or unsubstituted (C6-C25)aryl or a substituted or unsubstituted (5- to 25-membered)heteroaryl, more preferably, a substituted or unsubstituted (C6-C18)aryl or a substituted or unsubstituted (5- to 18-membered)heteroaryl. For example, $Ar_3$ and $Ar_4$ each independently may be a substituted or unsubstituted phenyl, a substituted or unsubstituted biphenyl, a substituted or unsubstituted fluorenyl, a substituted or unsubstituted carbazolyl, or a substituted or unsubstituted dibenzofuranyl. Wherein, the substituents of the above substituented compounds may be at least one of methyl, phenyl, and diphenylamino.

According to one embodiment, the host material represented by the Formula 2 may be represented by the following Formula 2-1 or 2-2.

(2-1)

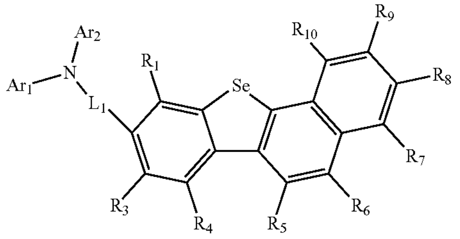

-continued (2-2)

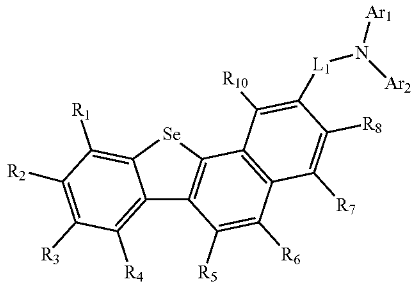

In Formulas 2-1 and 2-2, $R_1$ to $R_{10}$, $L_1$, $Ar_1$, and $Ar_2$ are as defined in Formula 2.

According to one embodiment, the second host material represented by Formula 2 may be more specifically illustrated by the following compounds, but is not limited thereto.

H2-1

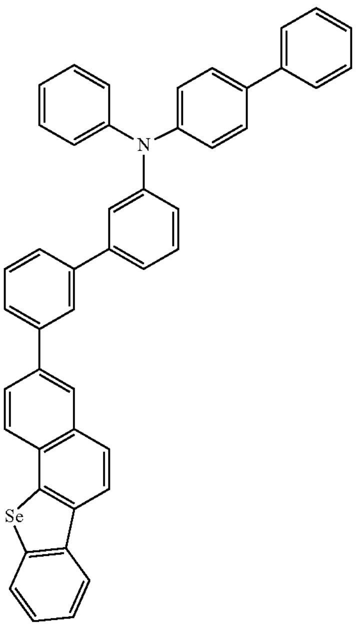

H2-2

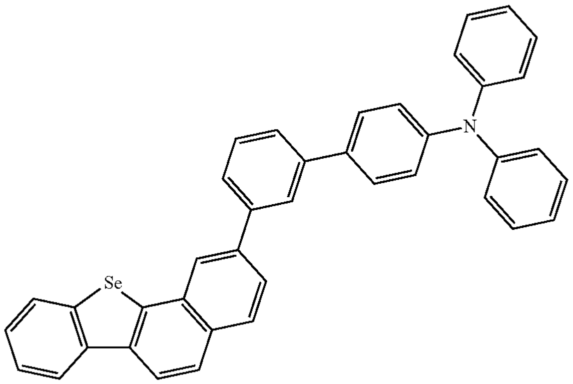

-continued
H2-3
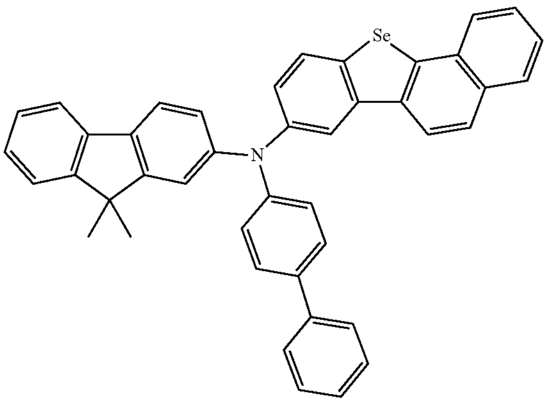
H2-4
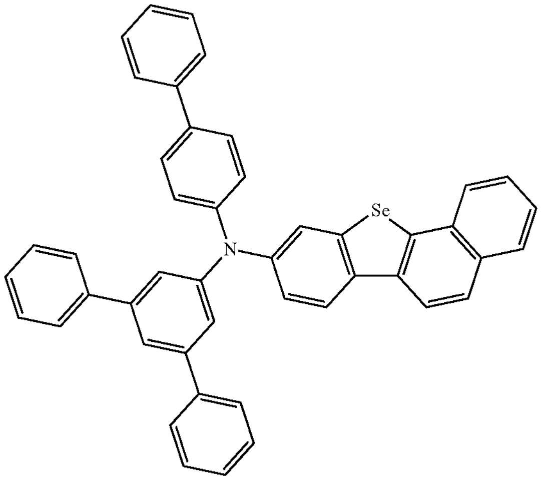
H2-5
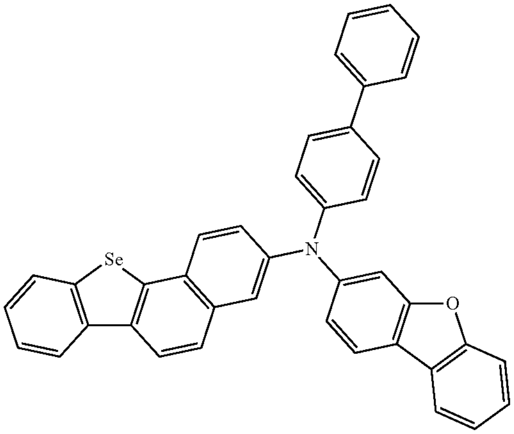
-continued
H2-6
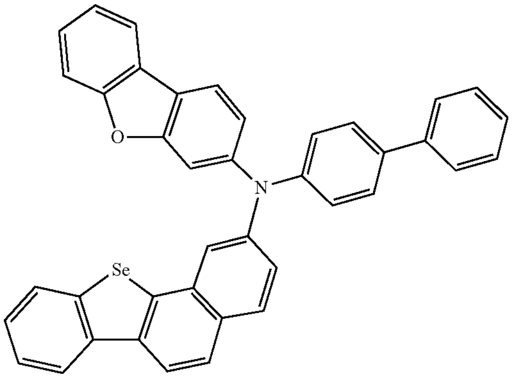
H2-7
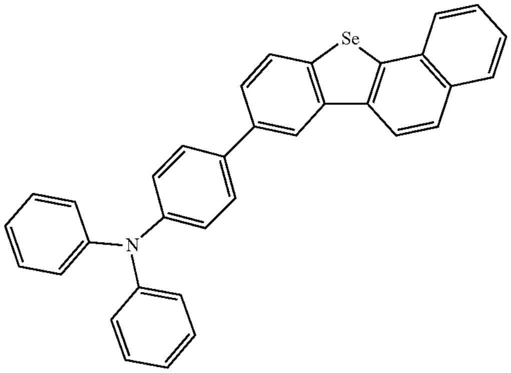
H2-8
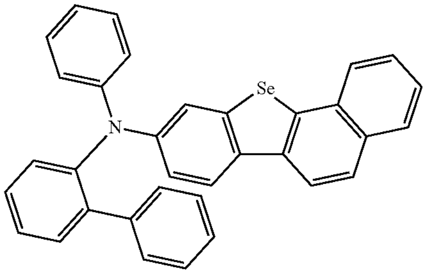
H2-9
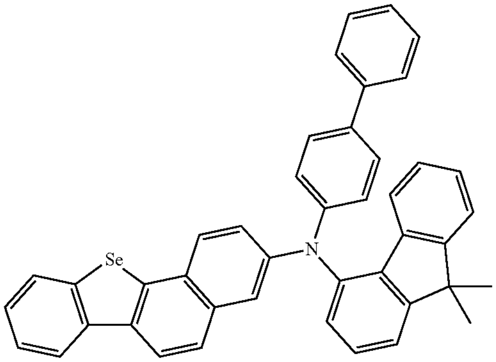

-continued
H2-10
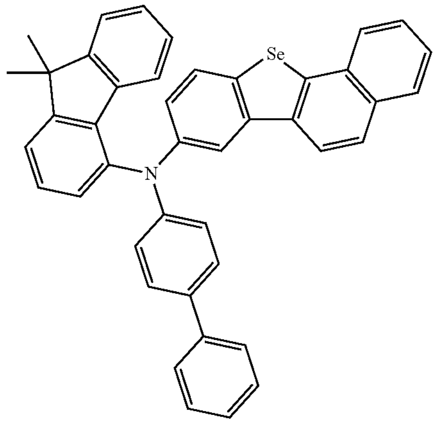
H2-11
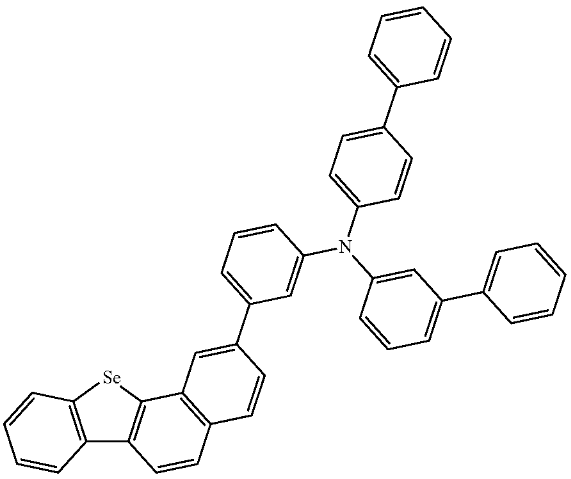
H2-12
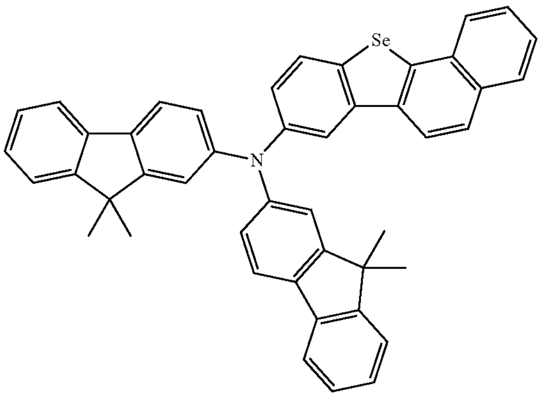
H2-13
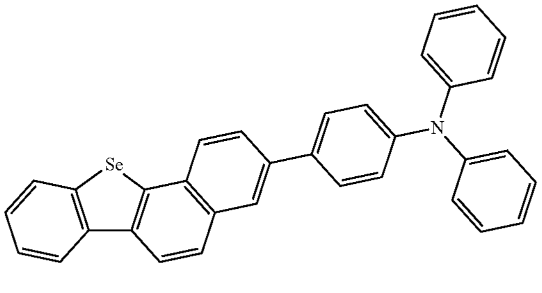
-continued
H2-14
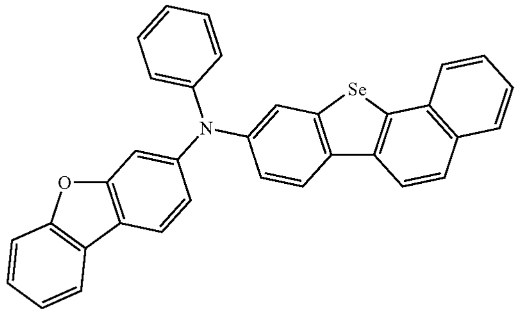
H2-15
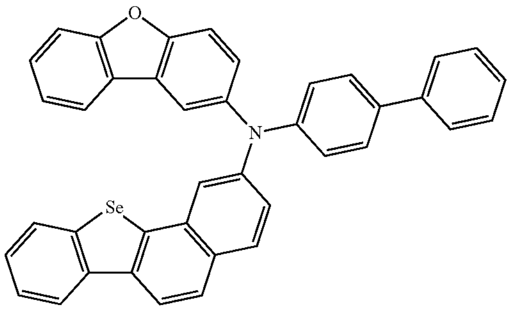
H2-16
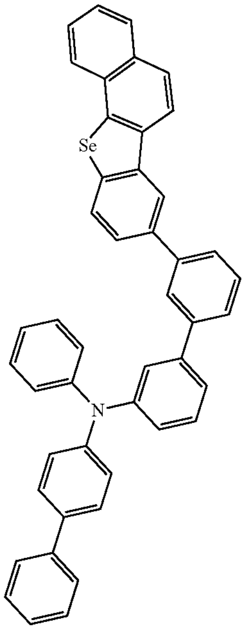

-continued
H2-17
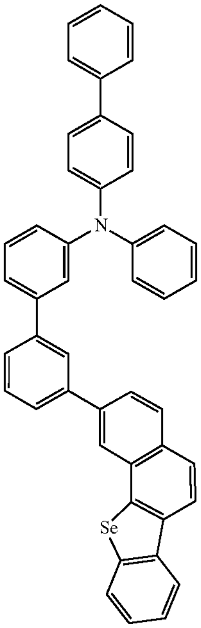
H2-18
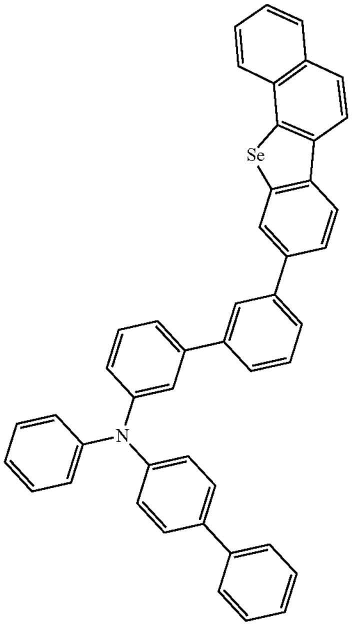
-continued
H2-19
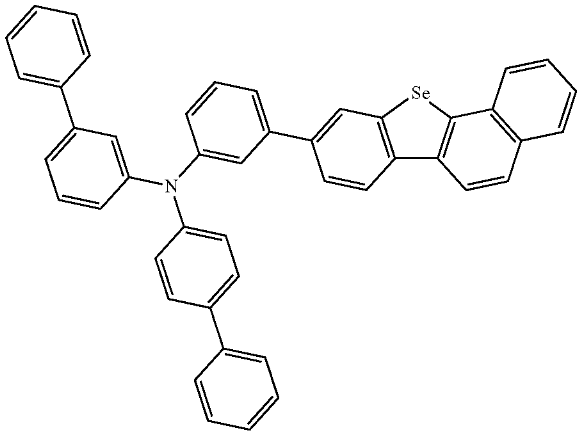
H2-20
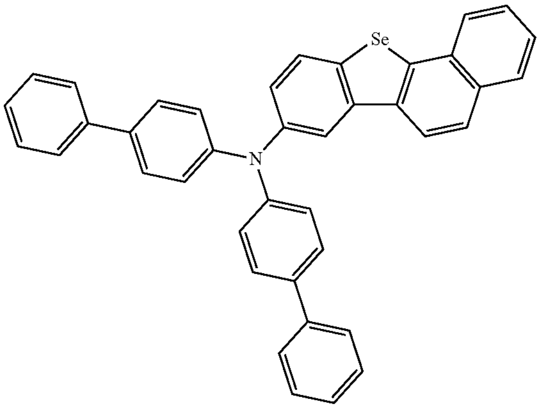
H2-21
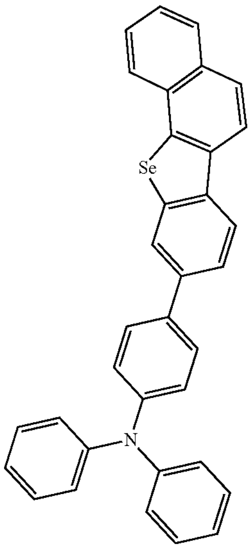

-continued
H2-22
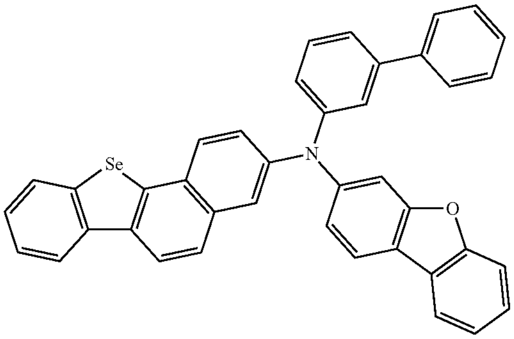
H2-23
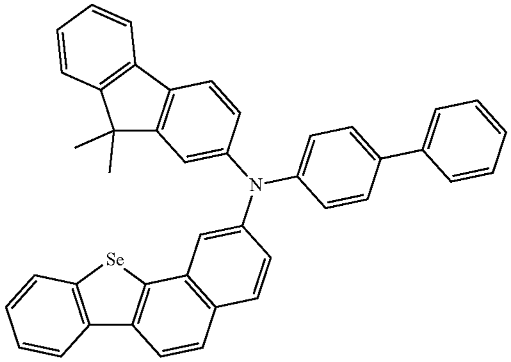
H2-24
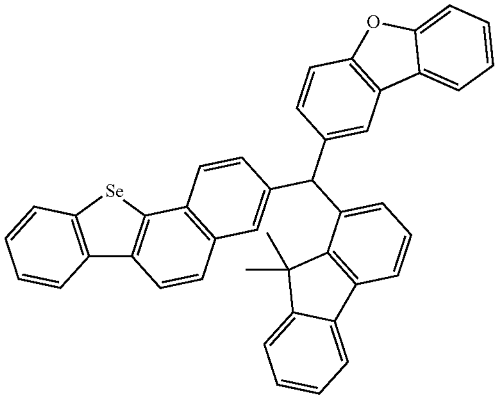
H2-25
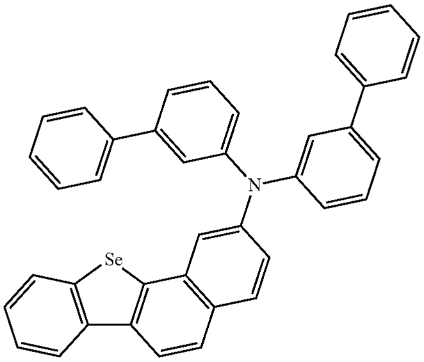
-continued
H2-26
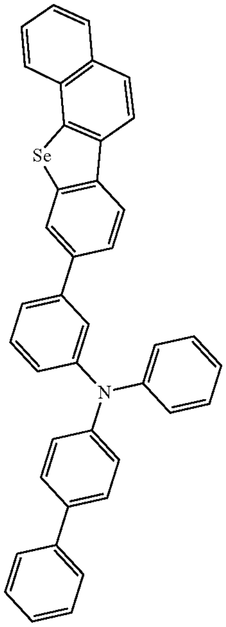
H2-27
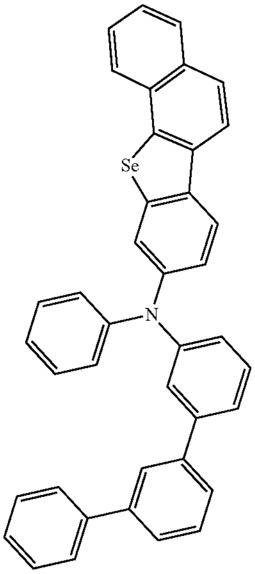
H2-28
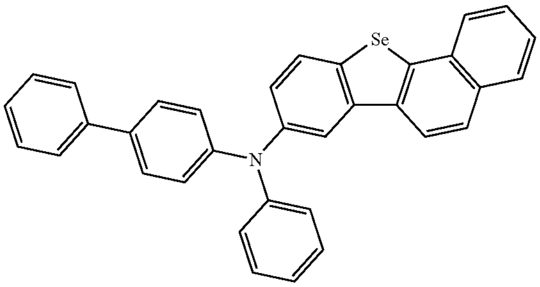

-continued
H2-29
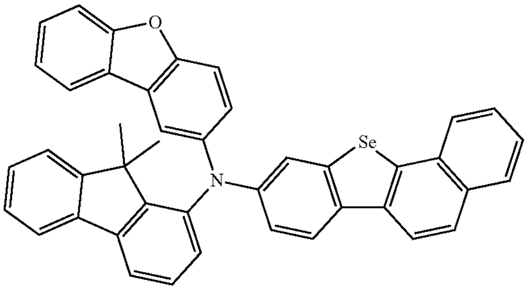
H2-30
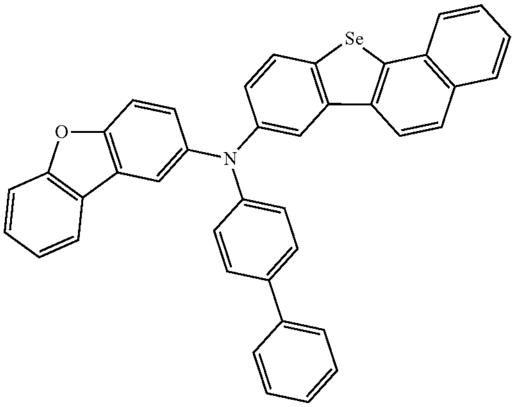
H2-31
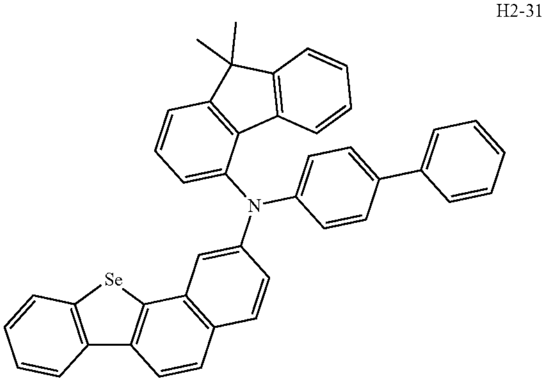
H2-32
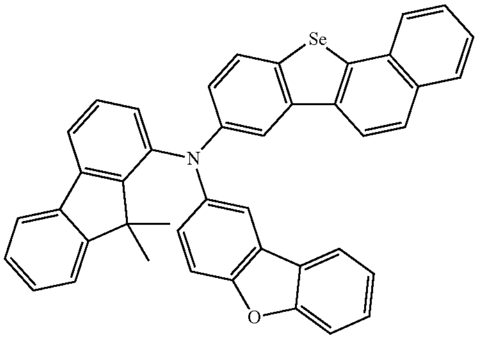
-continued
H2-33
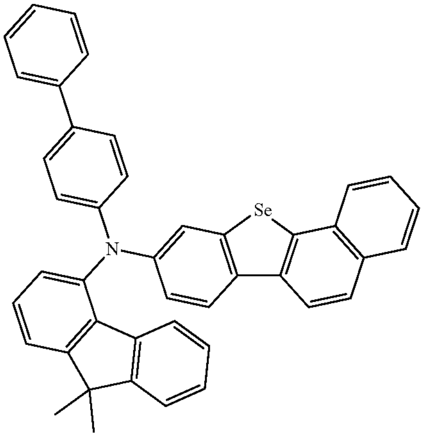
H2-34
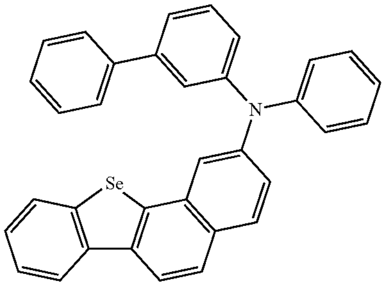
H2-35
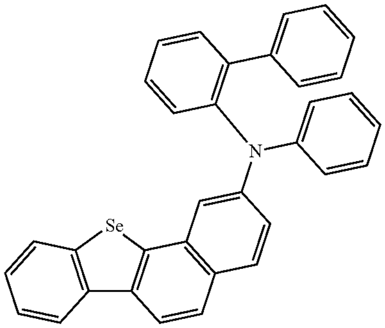
H2-36
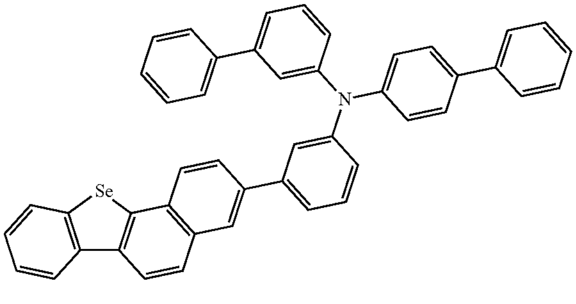

-continued
H2-37
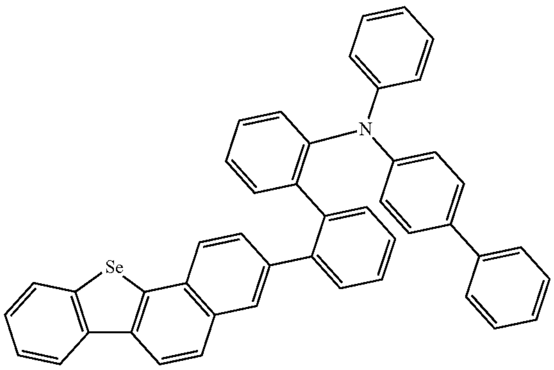
H2-38
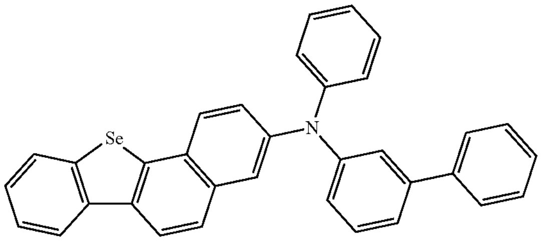
H2-39
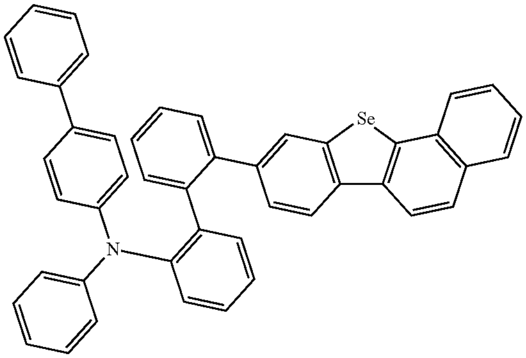
H2-40
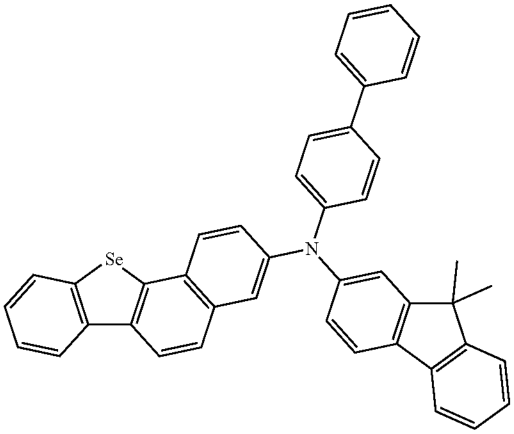
-continued
H2-41
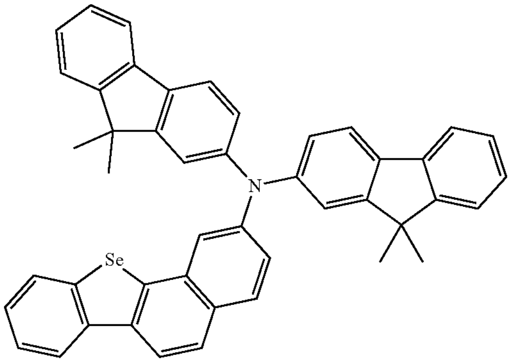
H2-42
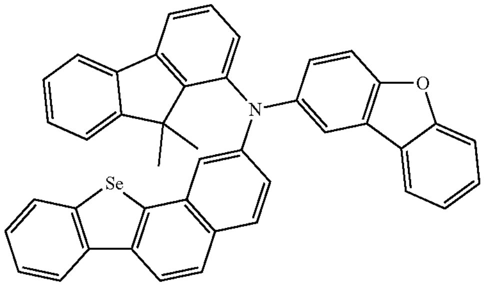
H2-43
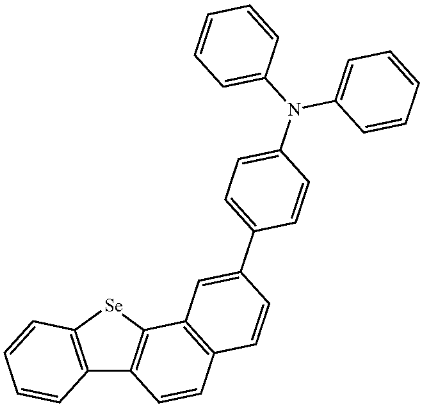
H2-44
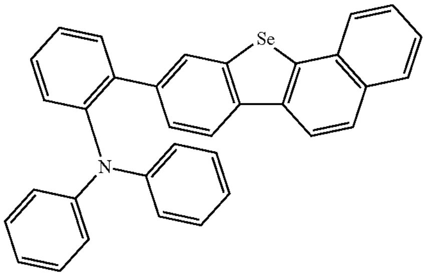

-continued
H2-45
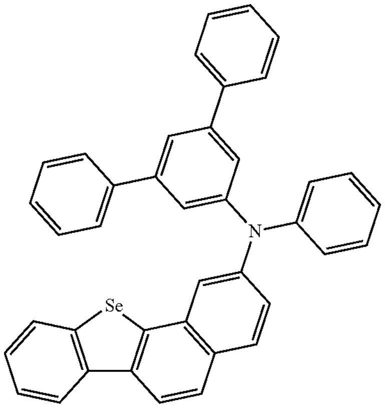
H2-46
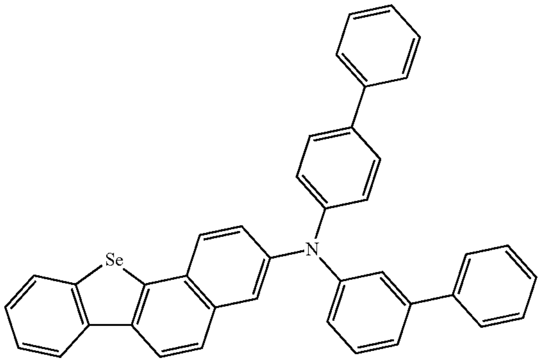
H2-47
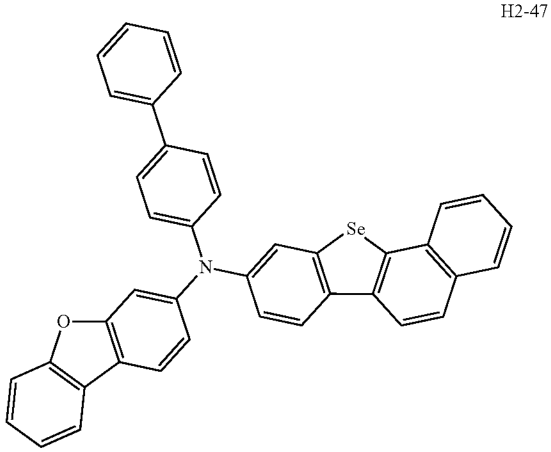
-continued
H2-48
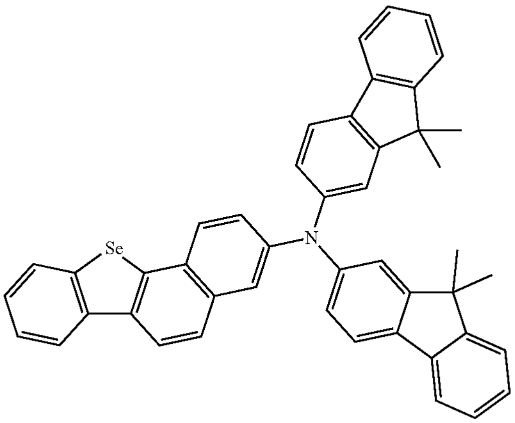
H2-49
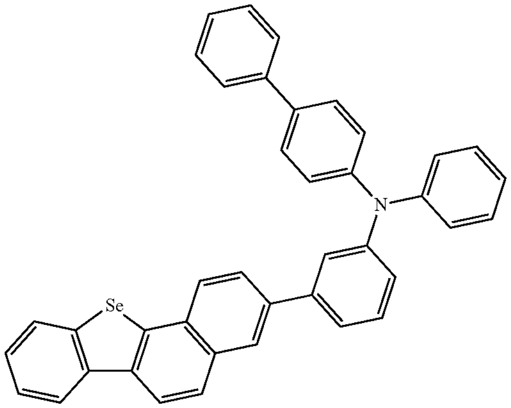
H2-50
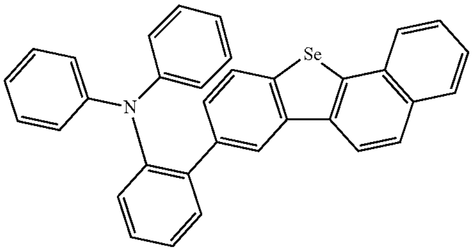
H2-51
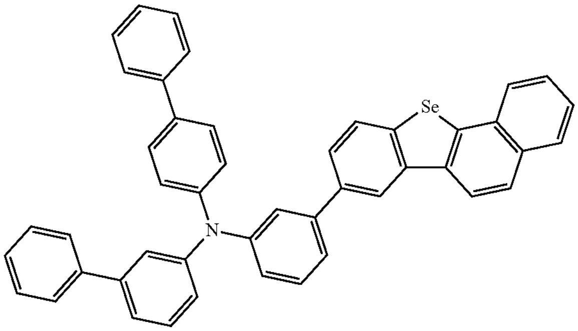

-continued
H2-52
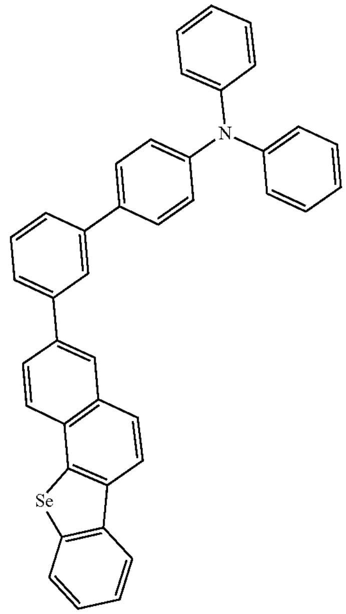
H2-53
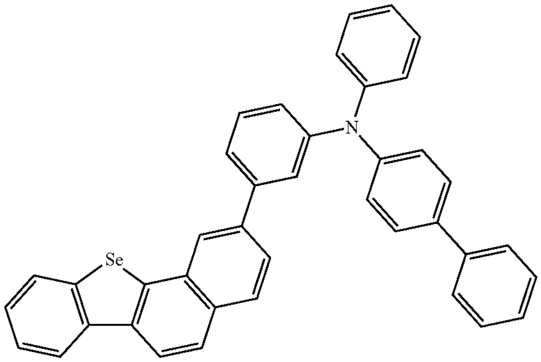
H2-54
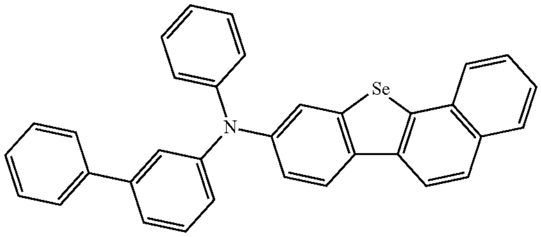
H2-55
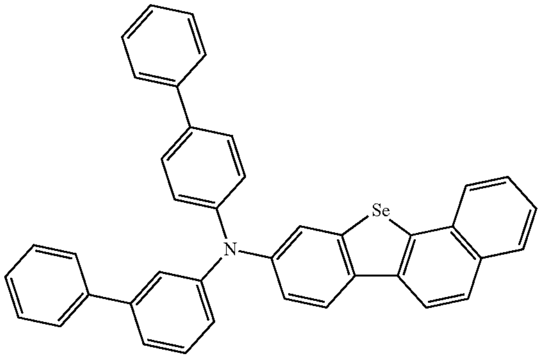
-continued
H2-56
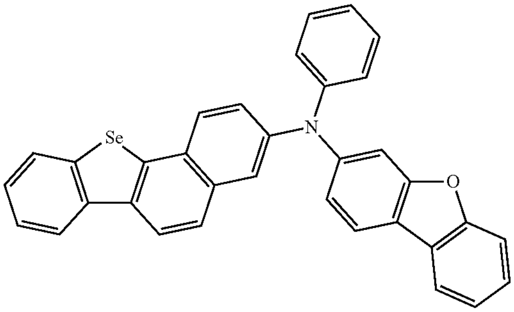
H2-57
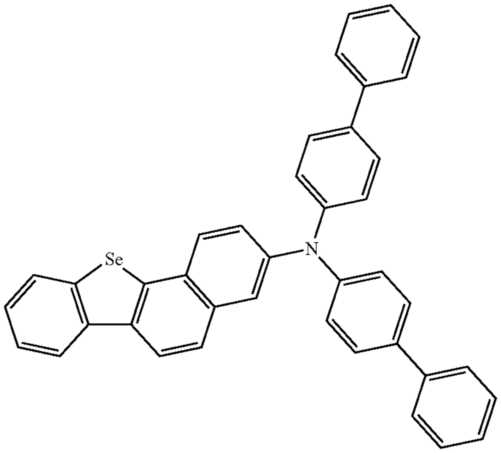
H2-58
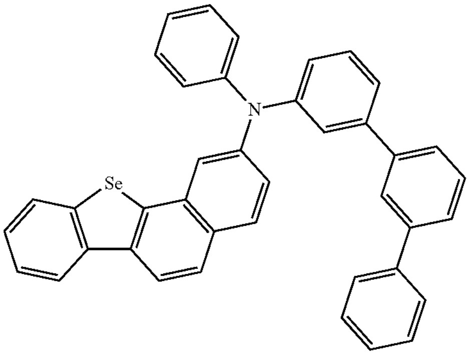
H2-59
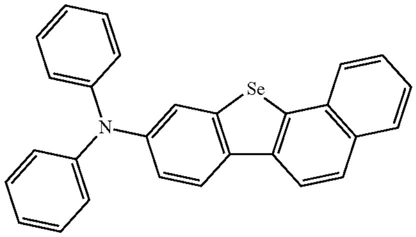

-continued
H2-60
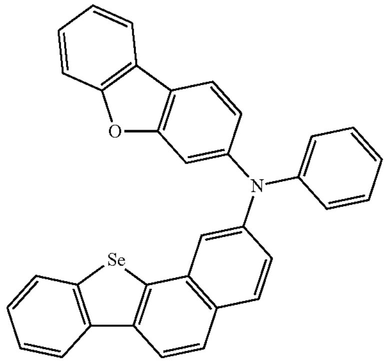
H2-61
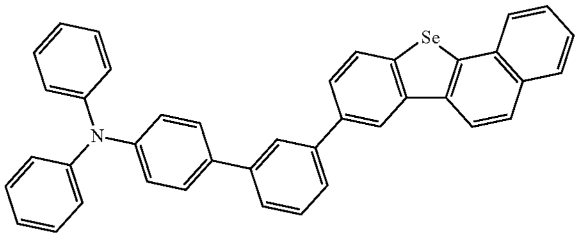
H2-62
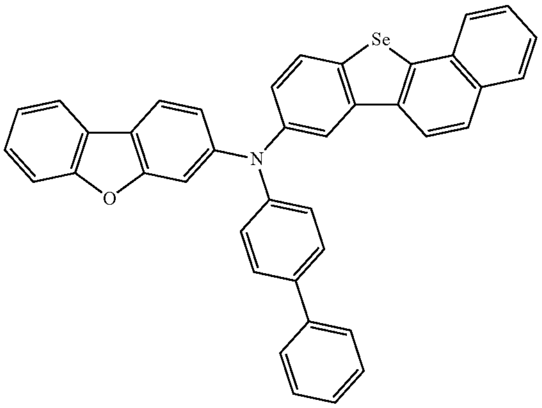
H2-63
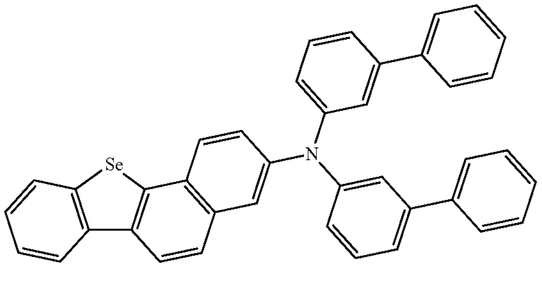
-continued
H2-64
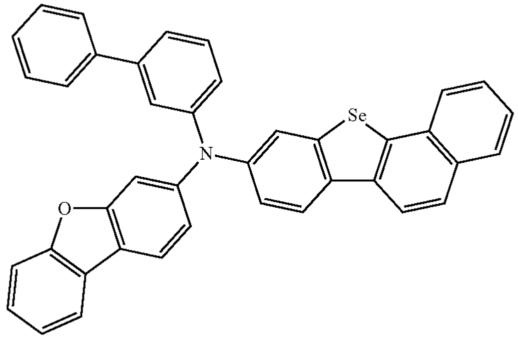
H2-65
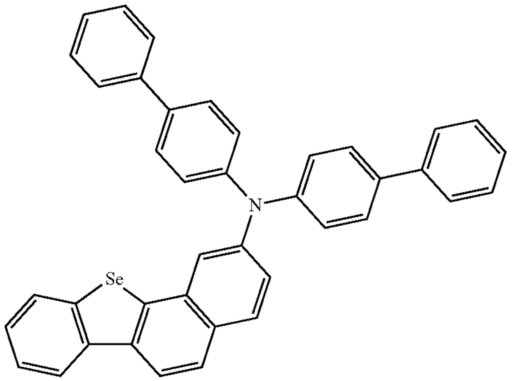
H2-66
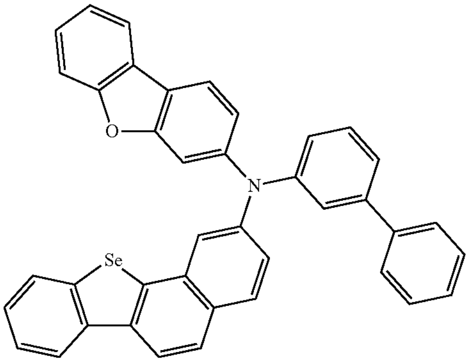
H2-67
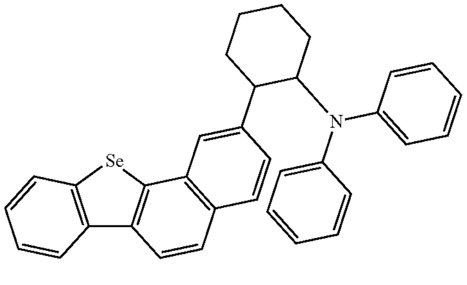

-continued
H2-68
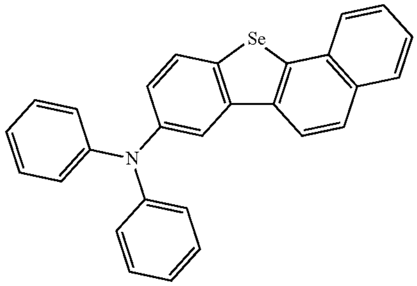
H2-69
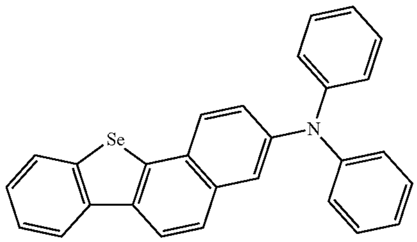
H2-70
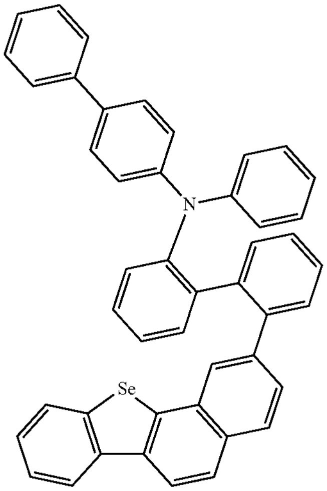
H2-71
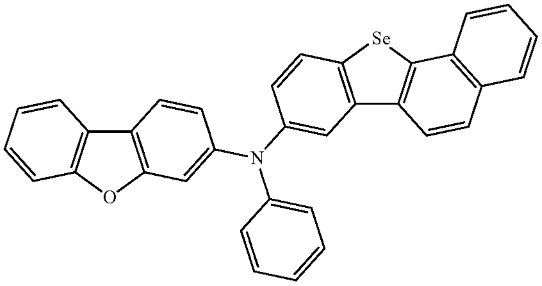
H2-72
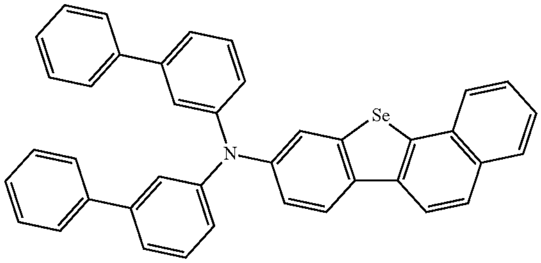
-continued
H2-73
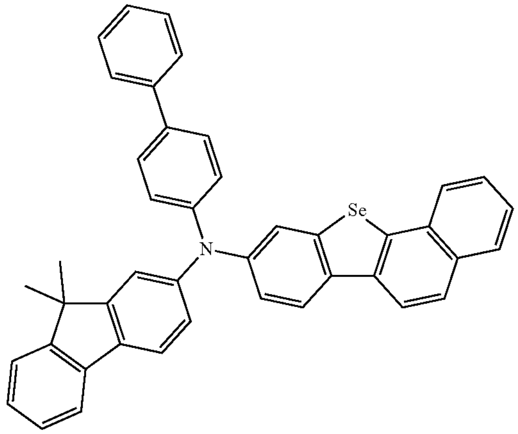
H2-74
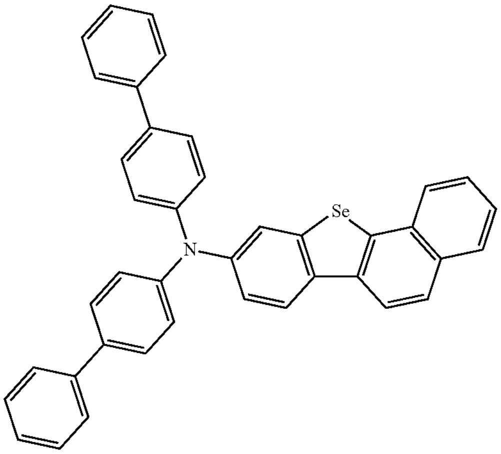
H2-75
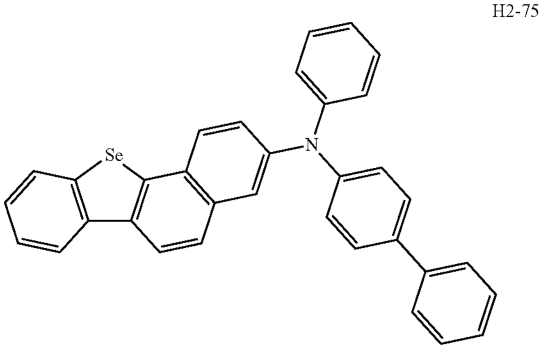
H2-76
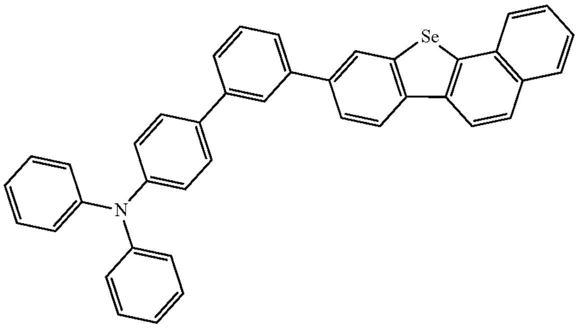

-continued
H2-77
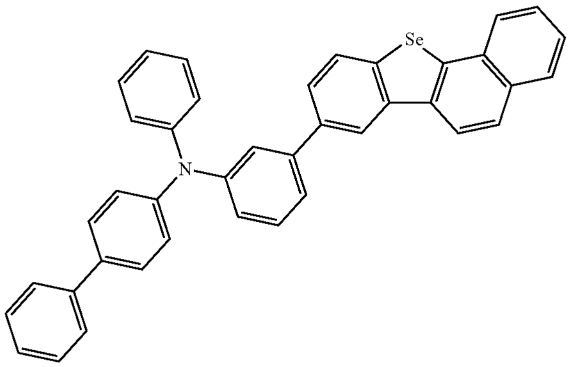
H2-78
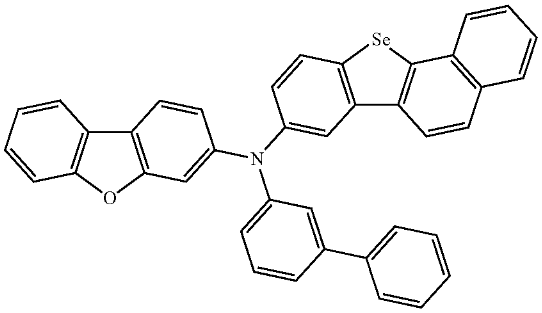
H2-79
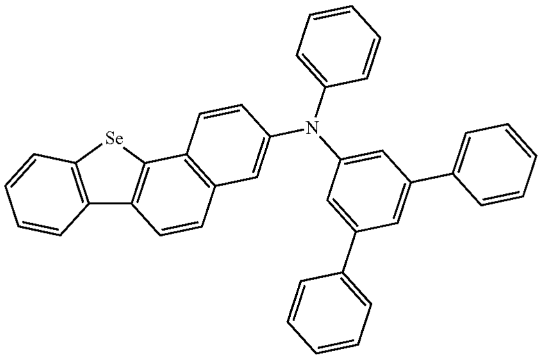
H2-80
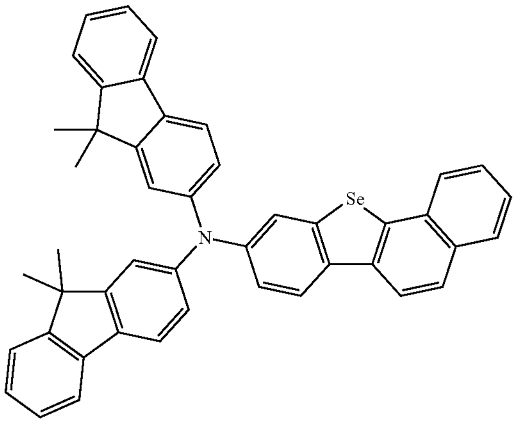
-continued
H2-81
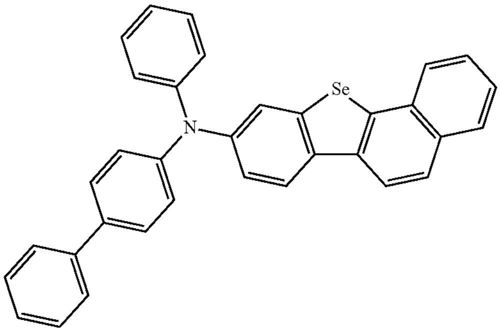
H2-82
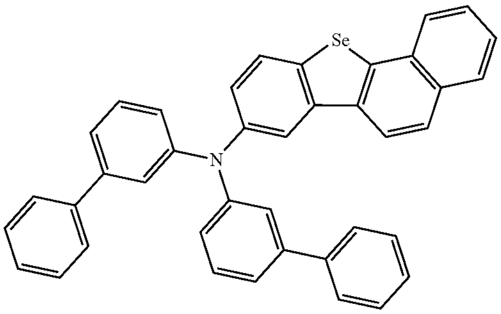
H2-83
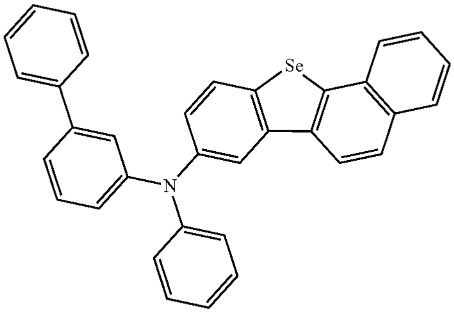
H2-84
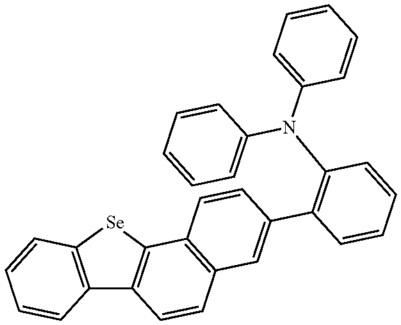
H2-85
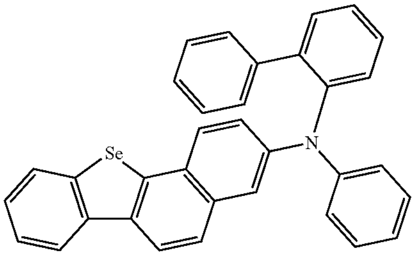

-continued
H2-86
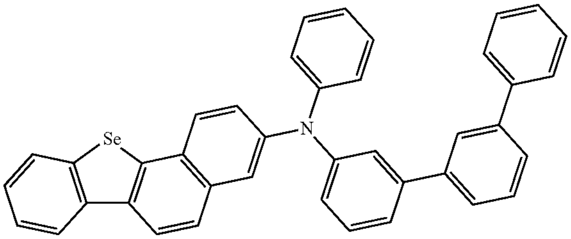
H2-87
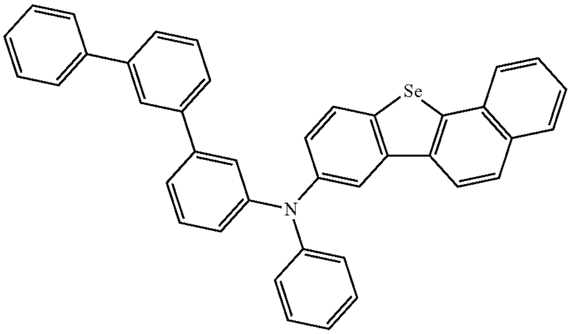
H2-88
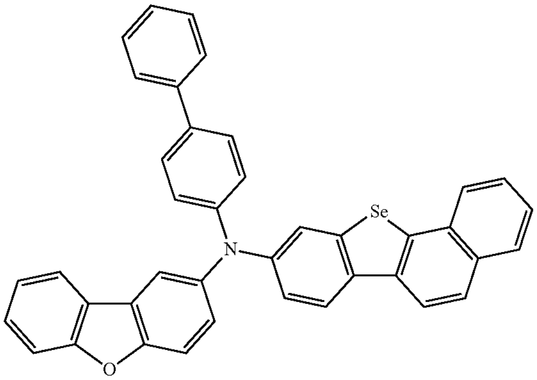
H2-89
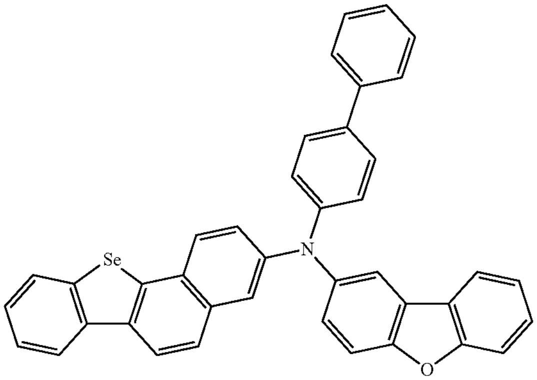
-continued
H2-90
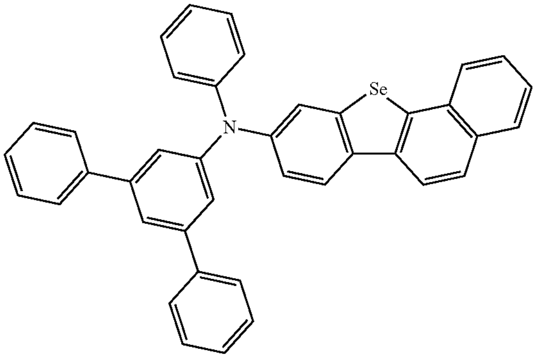
H2-91
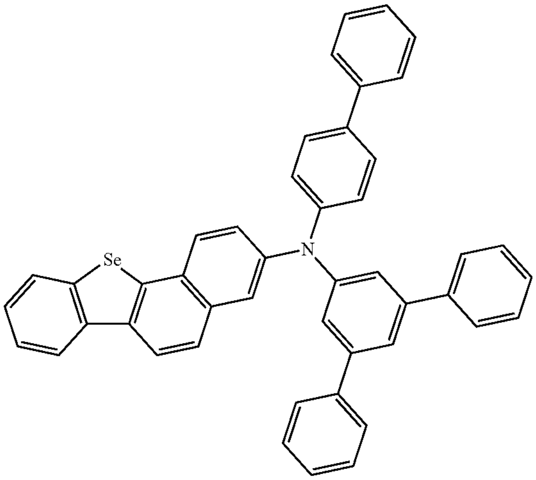
H2-92
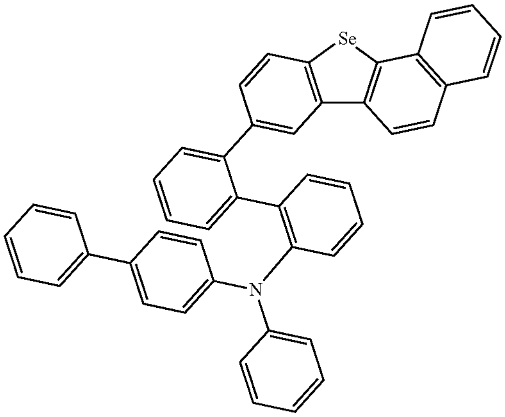
H2-93
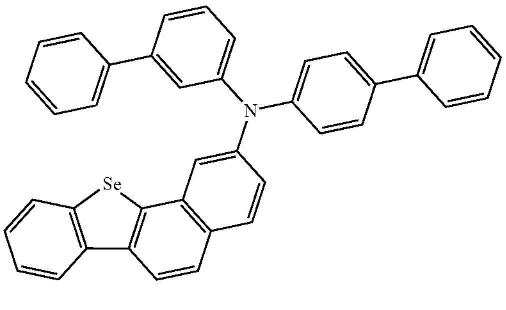

-continued
H2-94
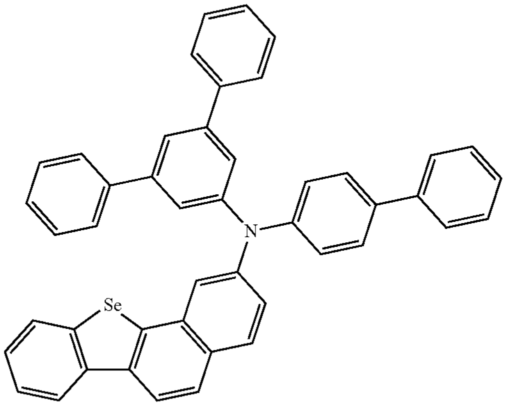
H2-95
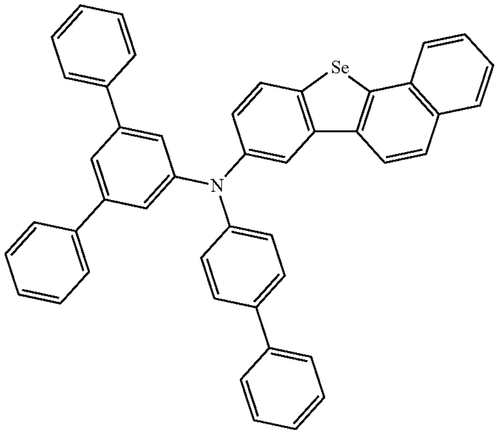
H2-96
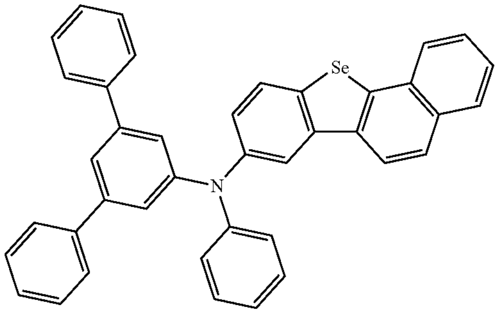
H2-97
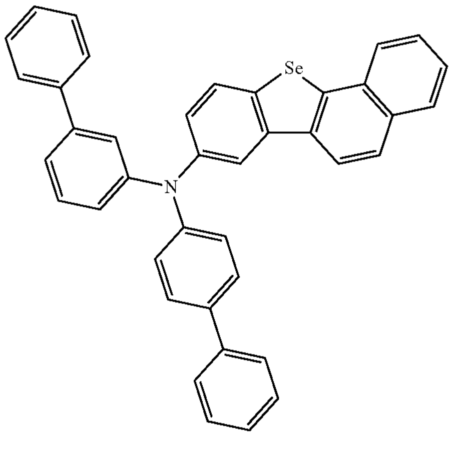
-continued
H2-98
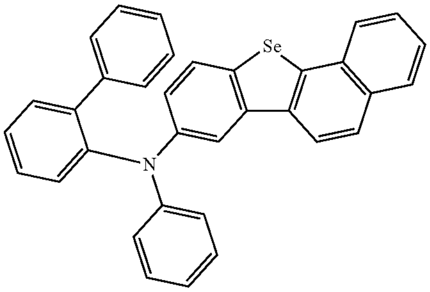
H2-99
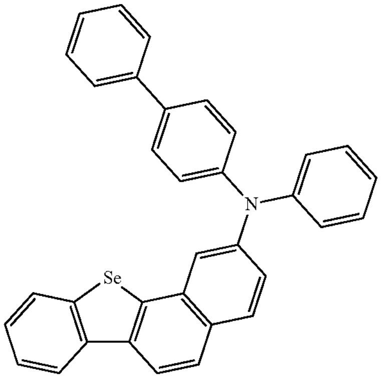
H2-100
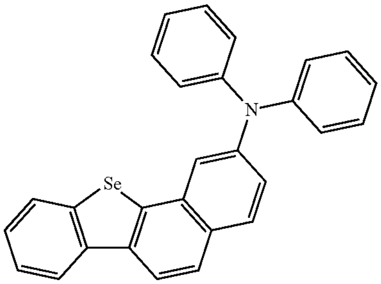
H2-101
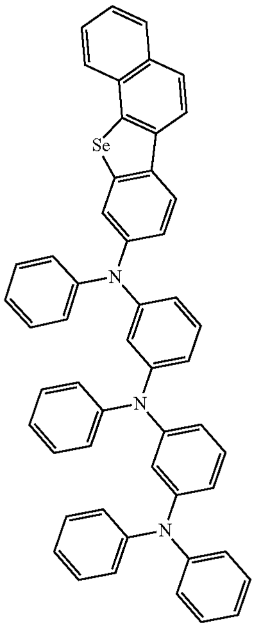

-continued
H2-102
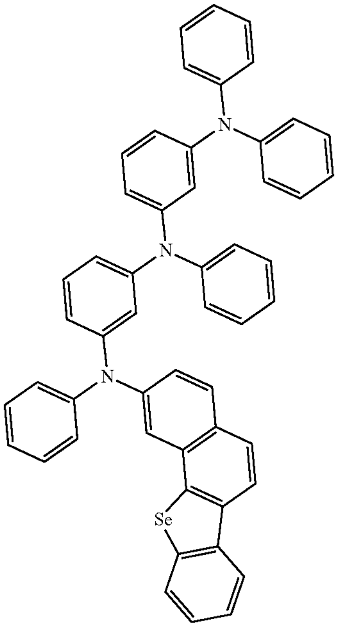
H2-103
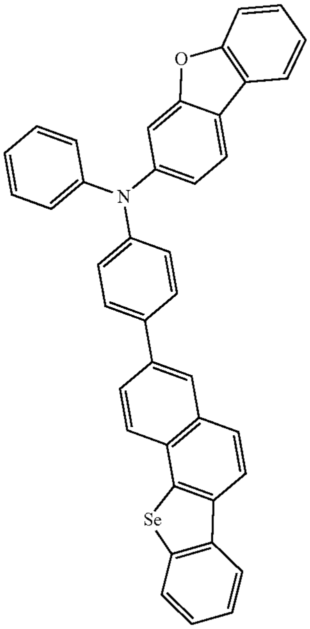
H2-104
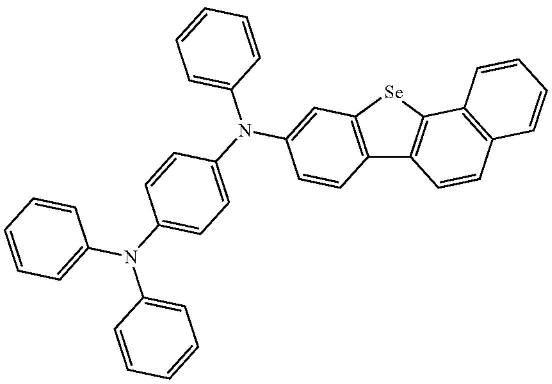
-continued
H2-105
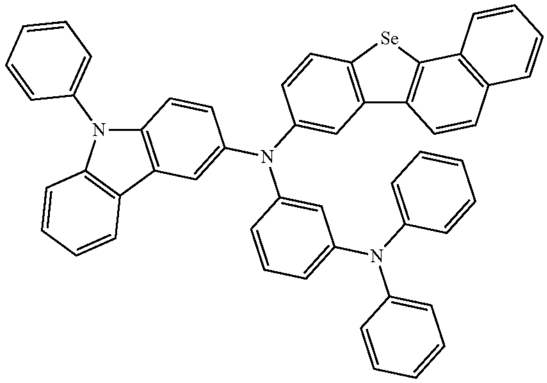
H2-106
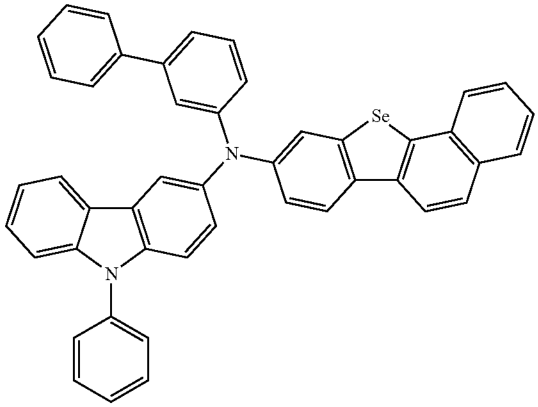
H2-107
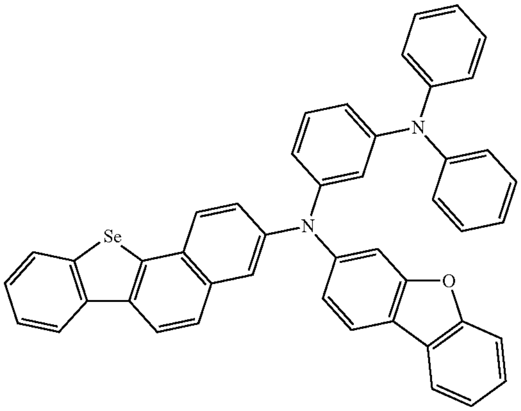

H2-108
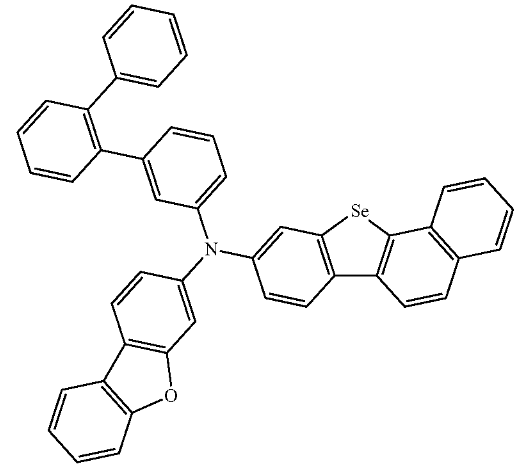
H2-109
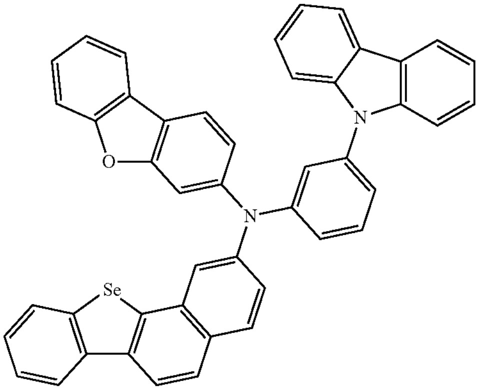
H2-110
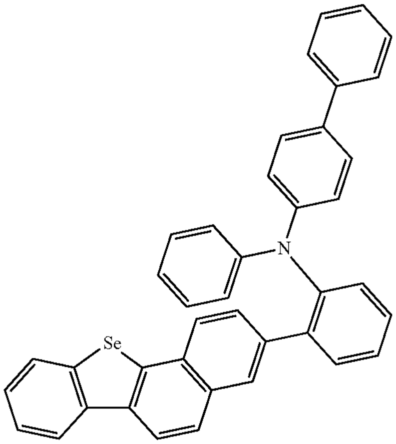
H2-111
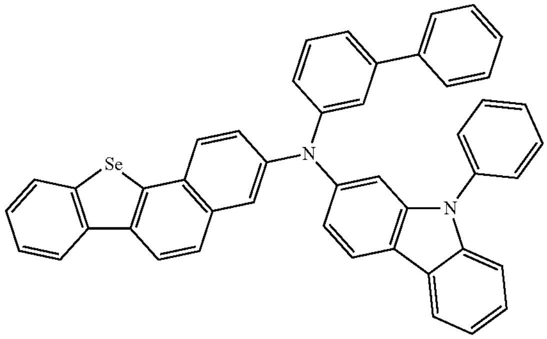
H2-112
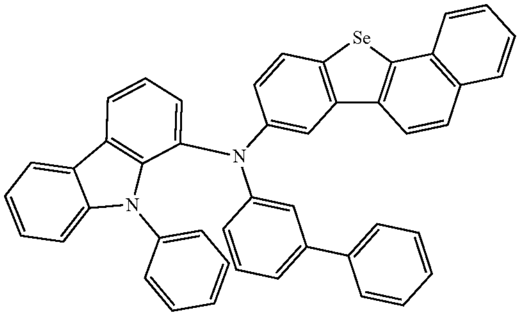
H2-113
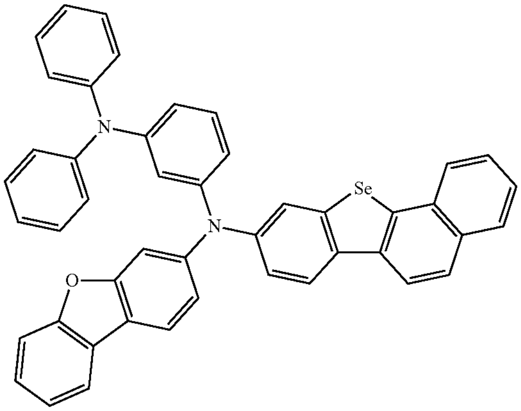
H2-114
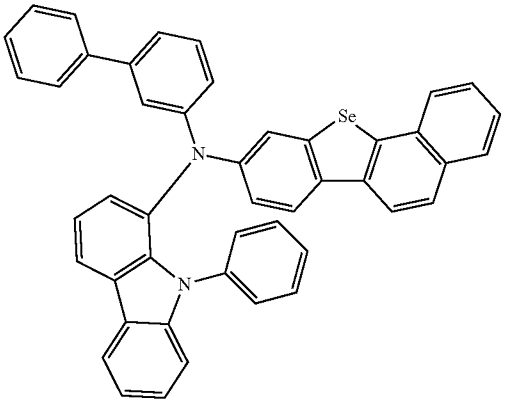

-continued
H2-115
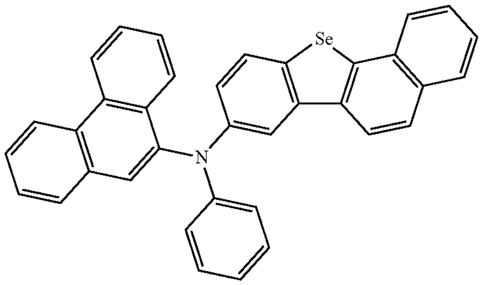
H2-116
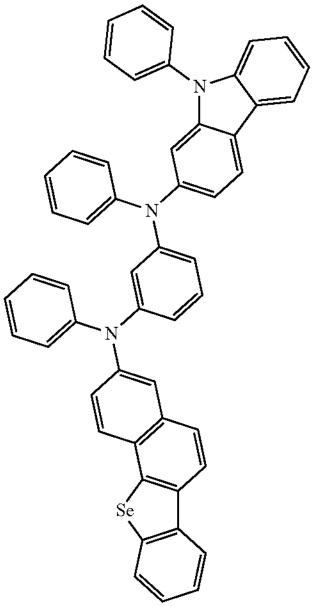
H2-117
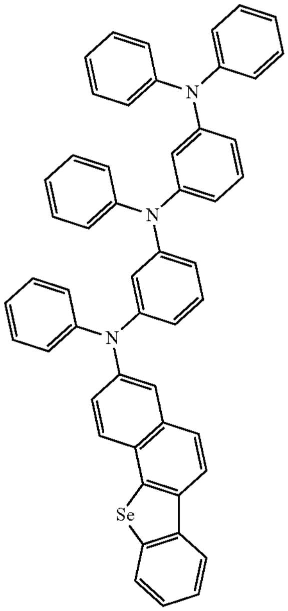
-continued
H2-118
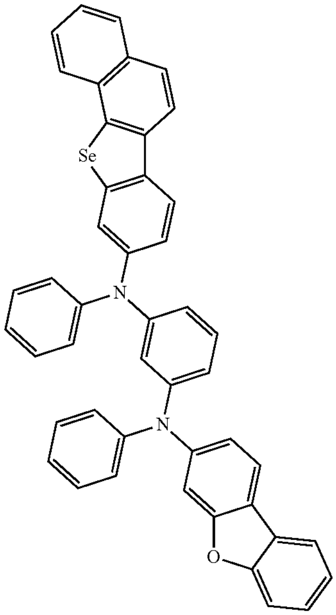
H2-119
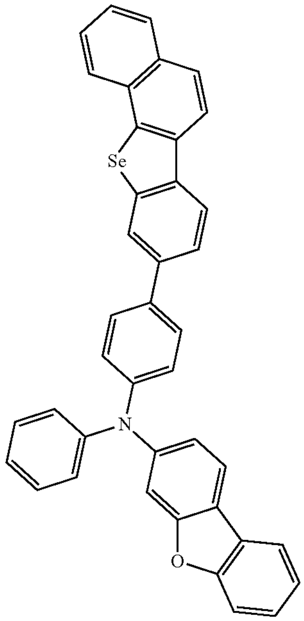
H2-120
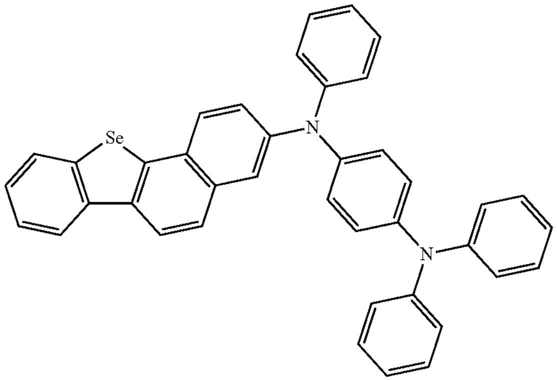

-continued
H2-121
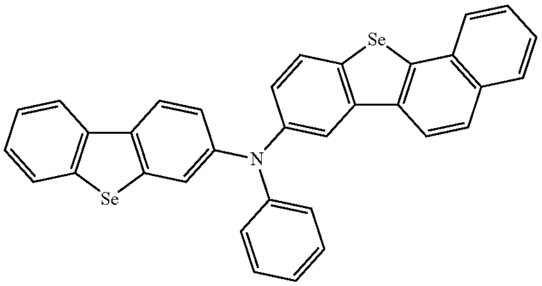
H2-122
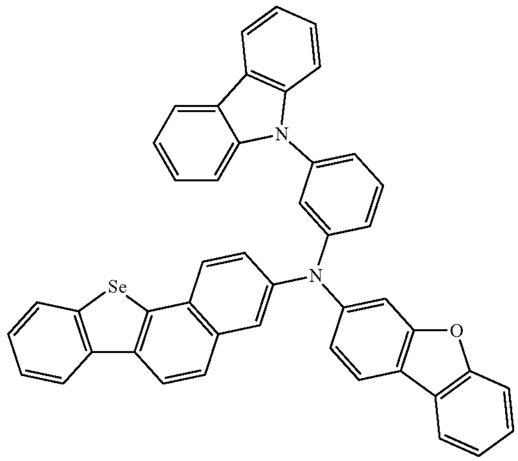
H2-123
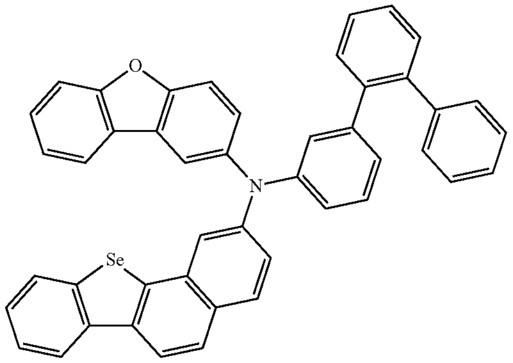
H2-124
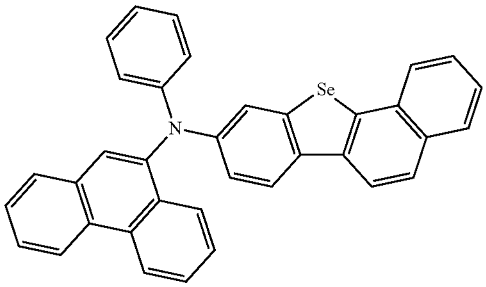
-continued
H2-125
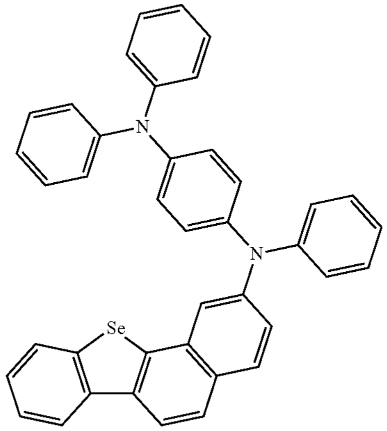
H2-126
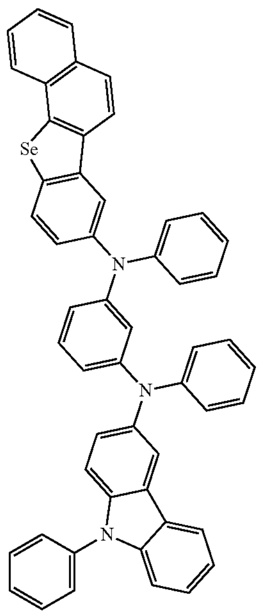
H2-127
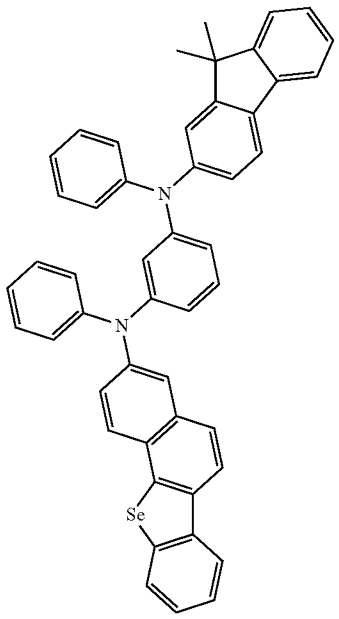

-continued
H2-128
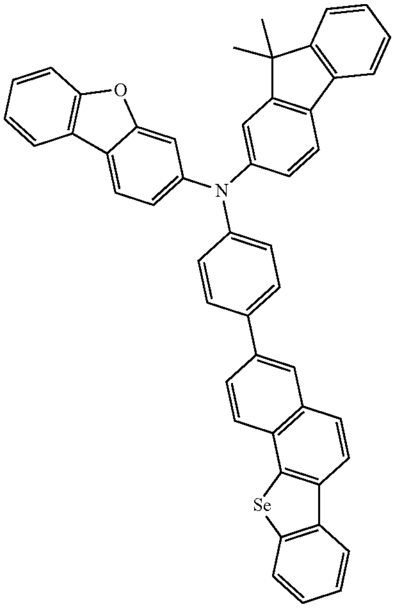
H2-129
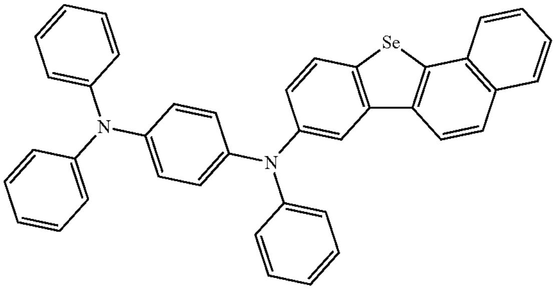
H2-130
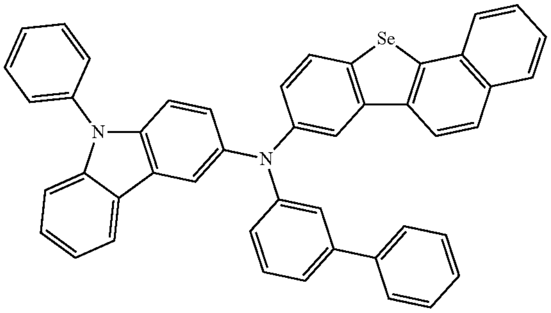
-continued
H2-131
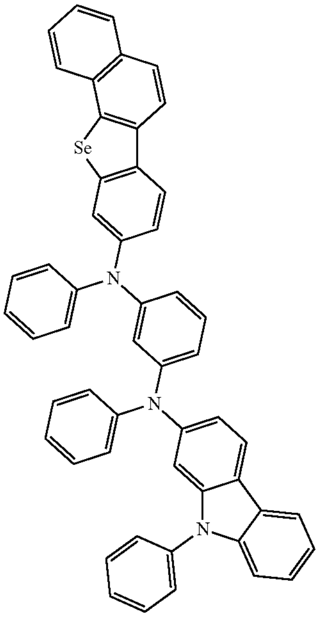
H2-132
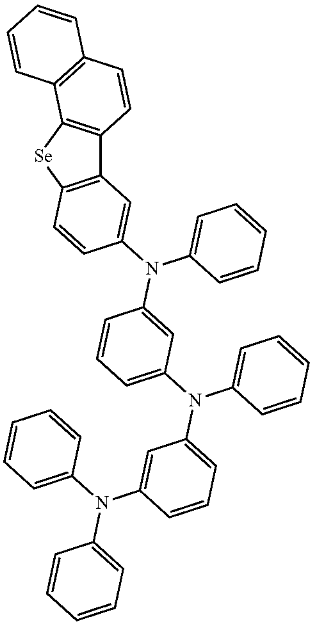

-continued
H2-133
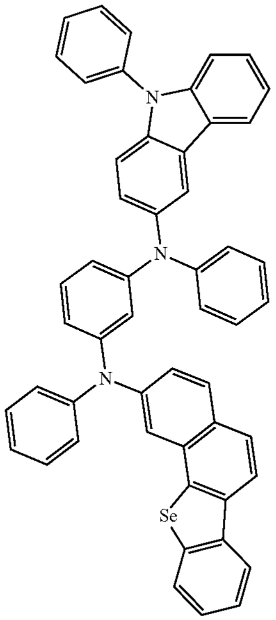
H2-134
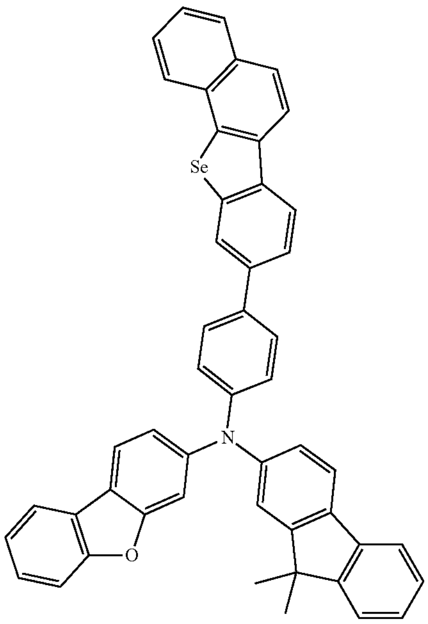
-continued
H2-135
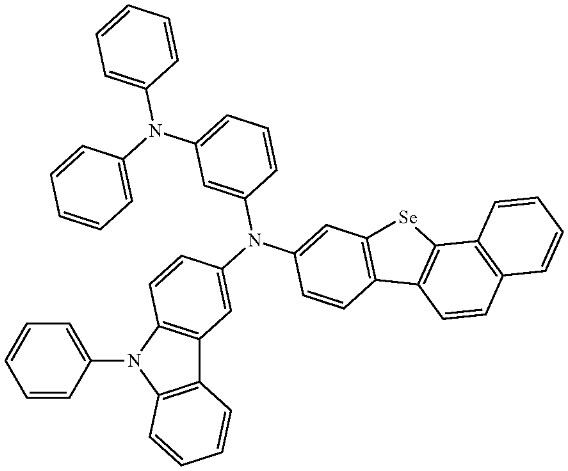
H2-136
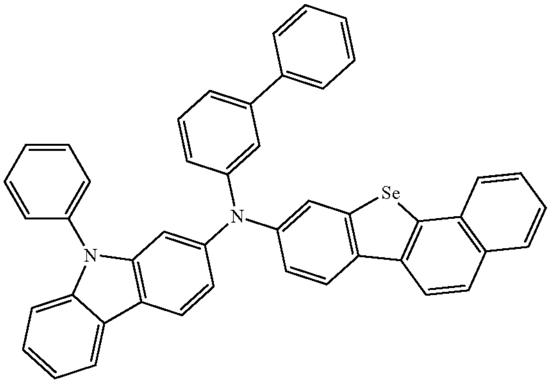
H2-137
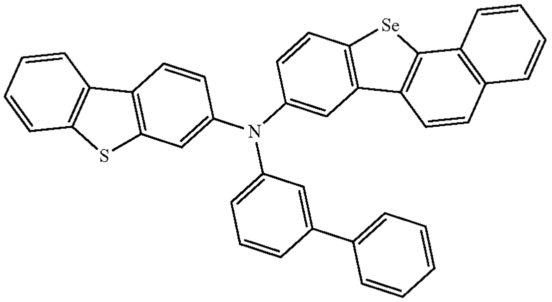
H2-138
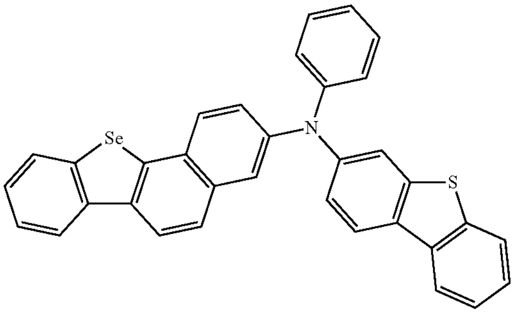

-continued
H2-139
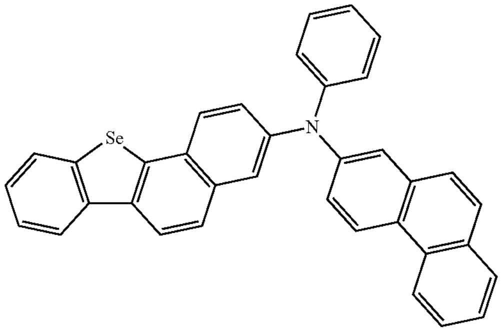
H2-140
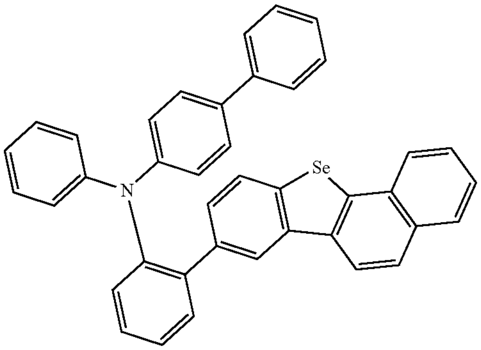
H2-141
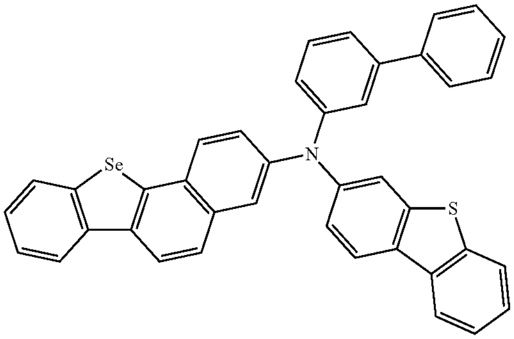
H2-142
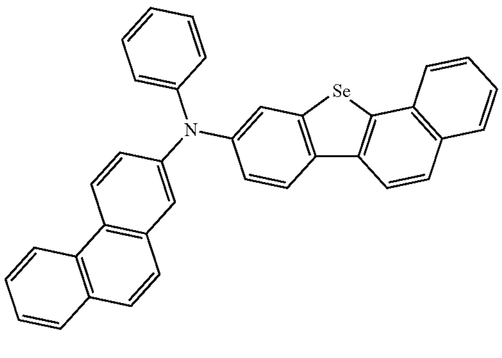
-continued
H2-143
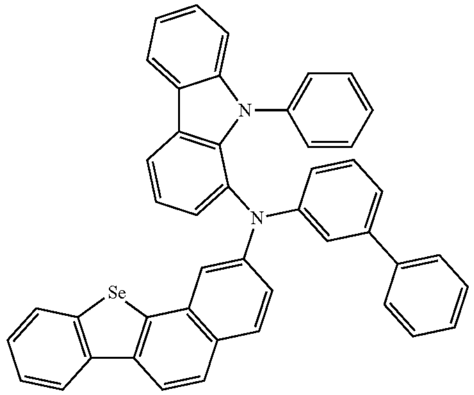
H2-144
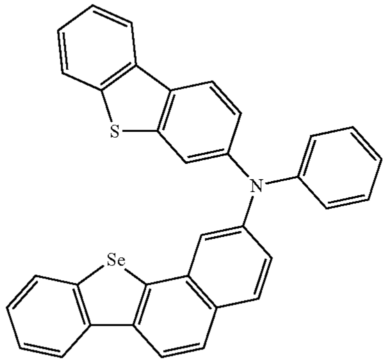
H2-145
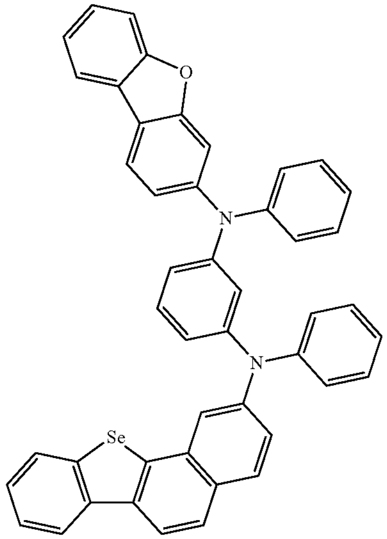
H2-146
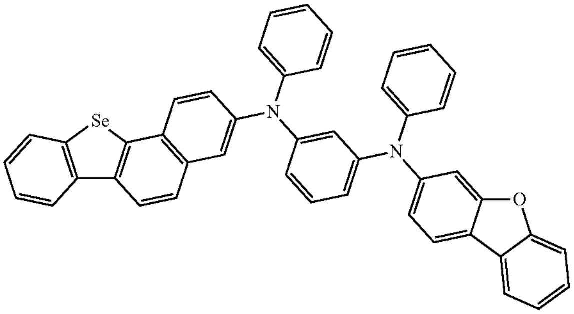

-continued
H2-147
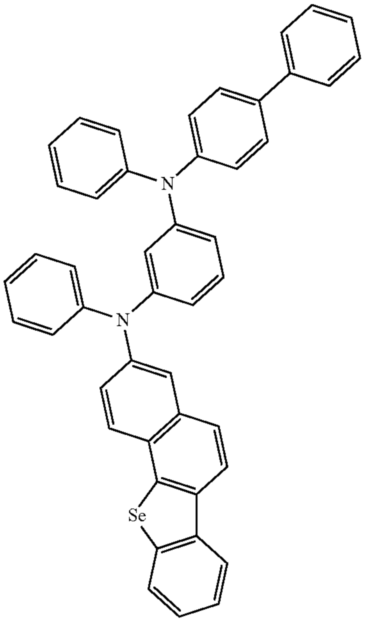
H2-148
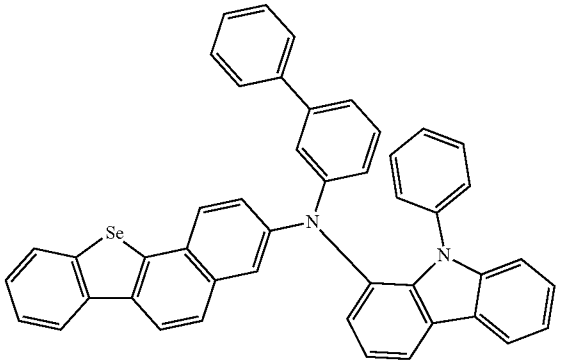
H2-149
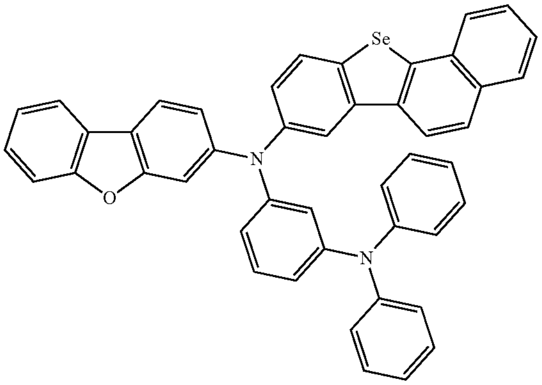
-continued
H2-150
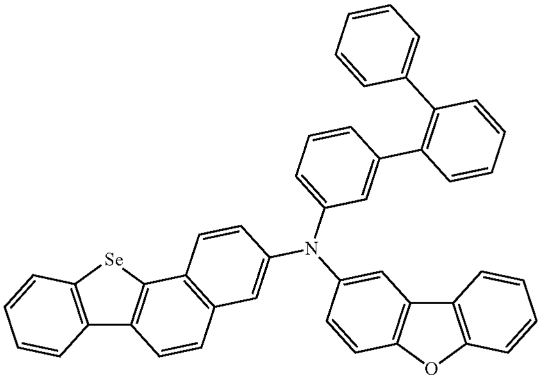
H2-151
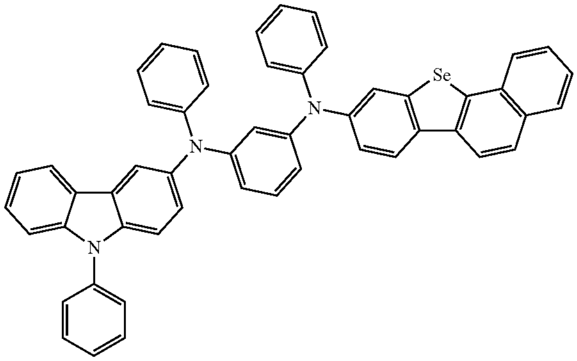
H2-152
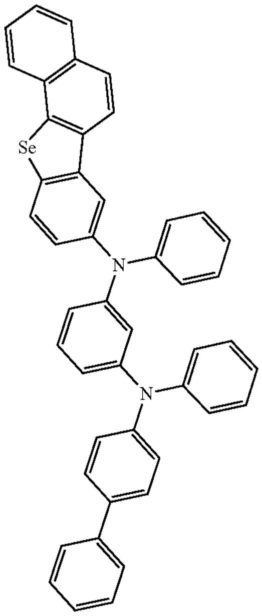

-continued
H2-153
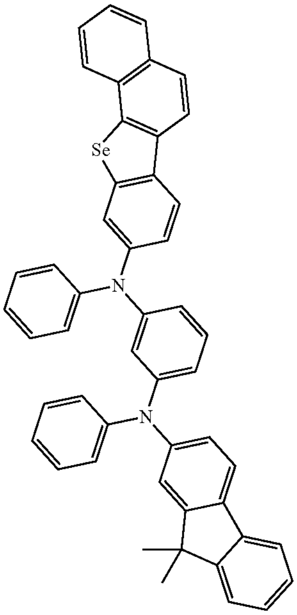
H2-154
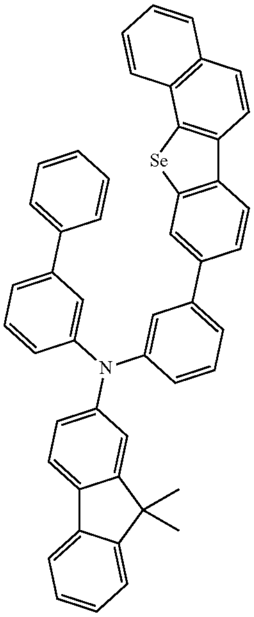
H2-155
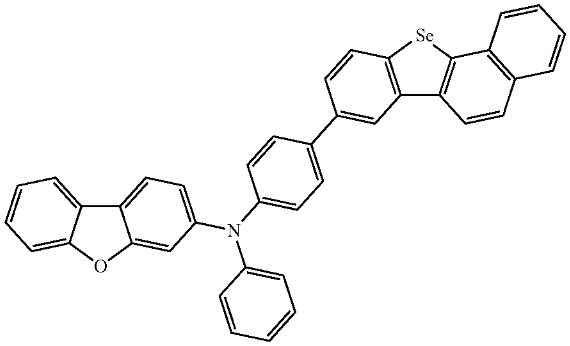
-continued
H2-156
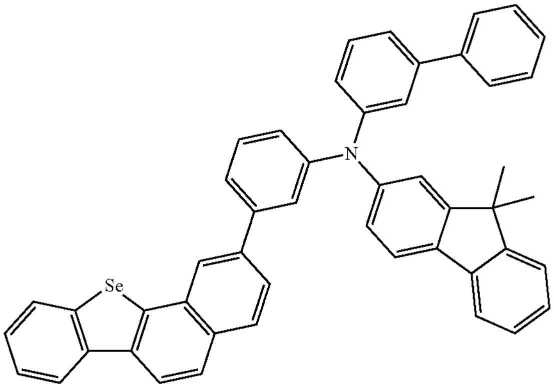
H2-157
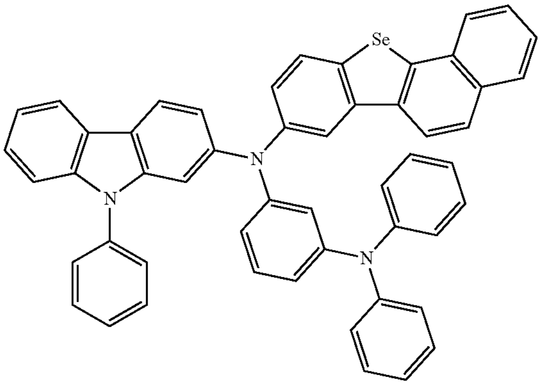
H2-158
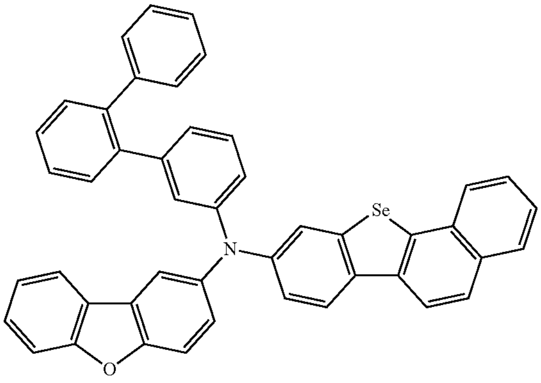
H2-159
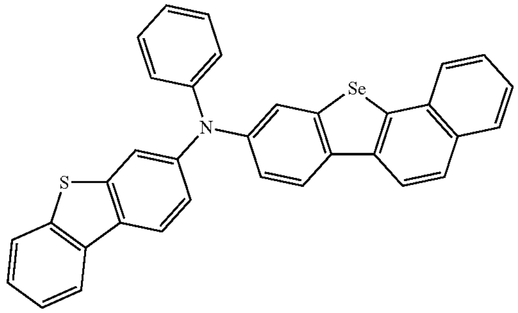

-continued
H2-160
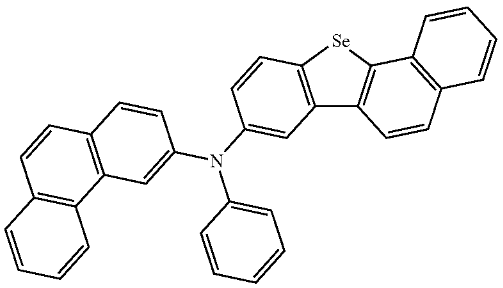
H2-161
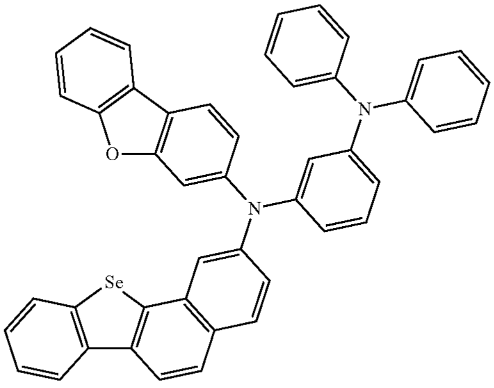
H2-162
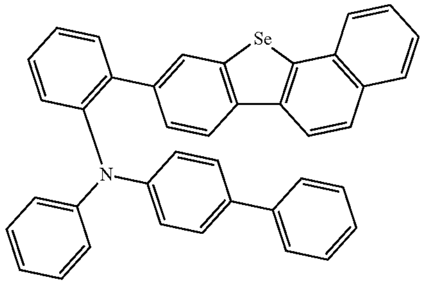
H2-163
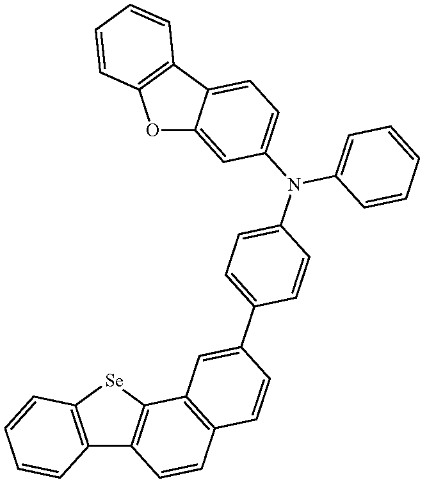
-continued
H2-164
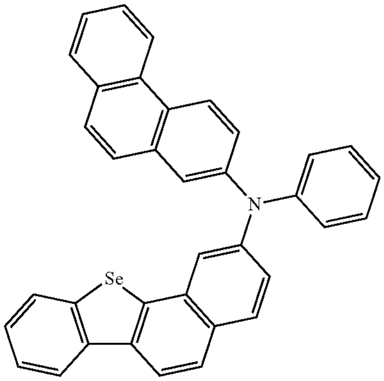
H2-165
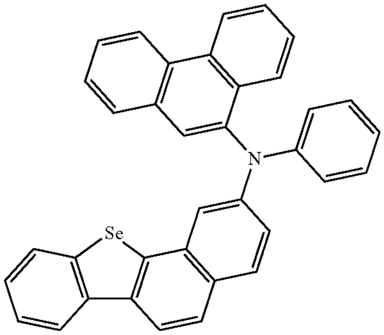
H2-166
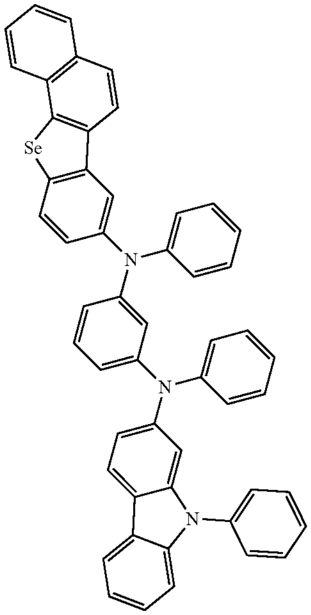

-continued
H2-167
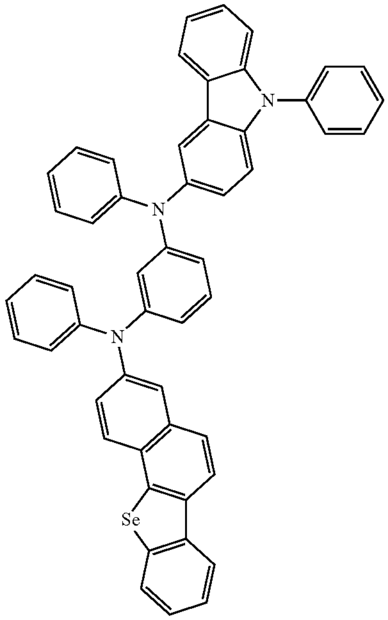
H2-168
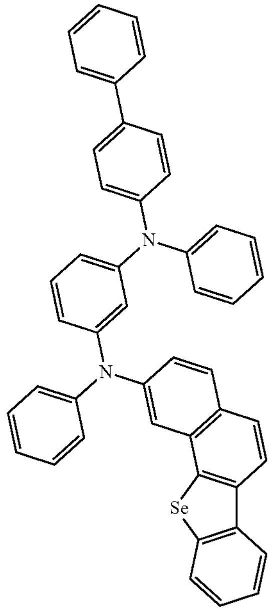
-continued
H2-169
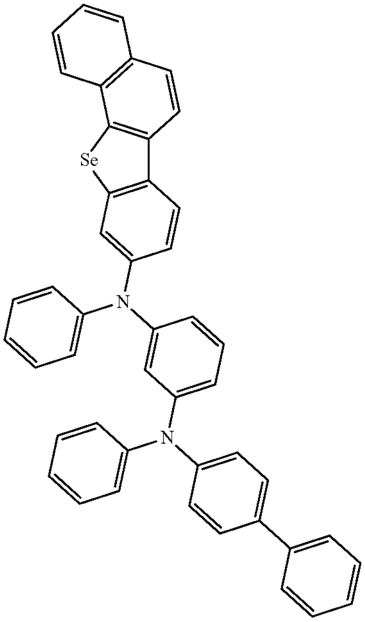
H2-170
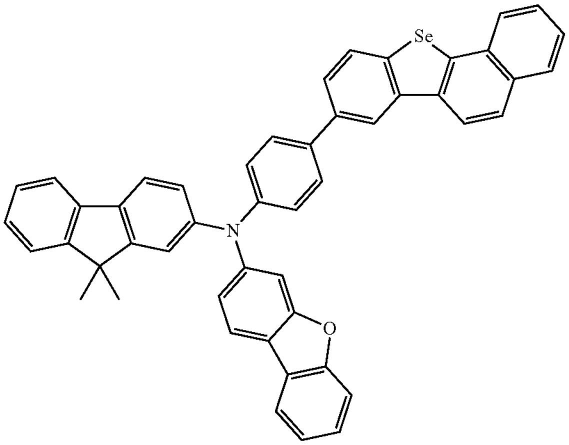
H2-171
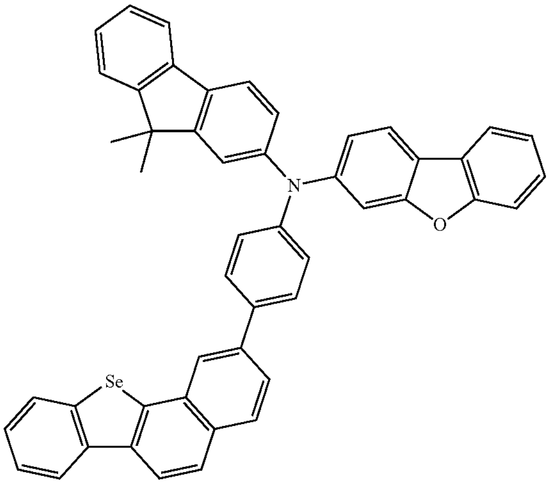

H2-172
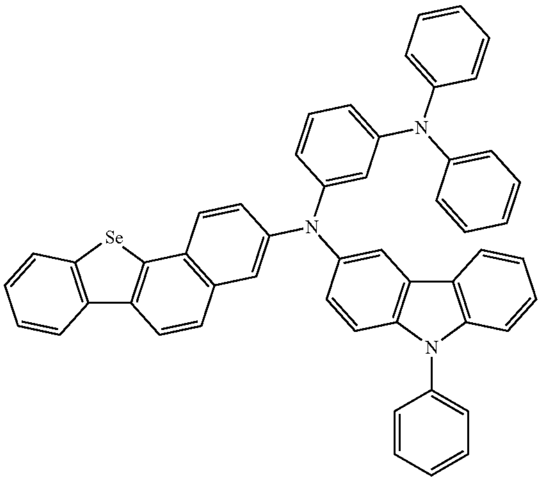
H2-173
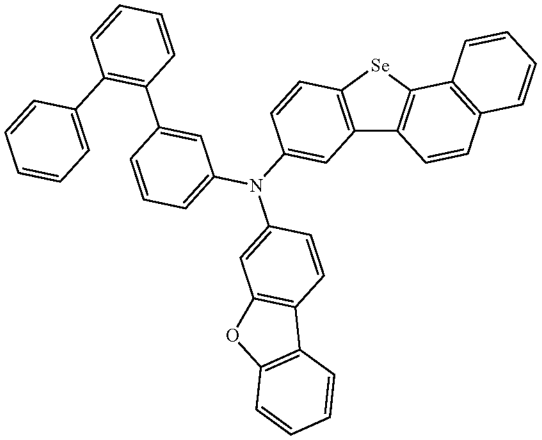
H2-174
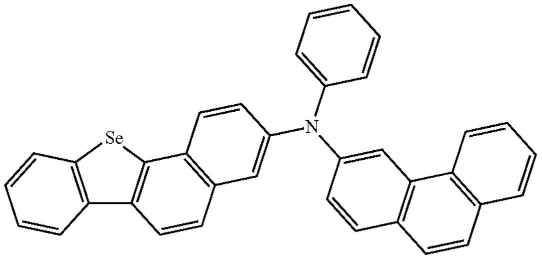
H2-175
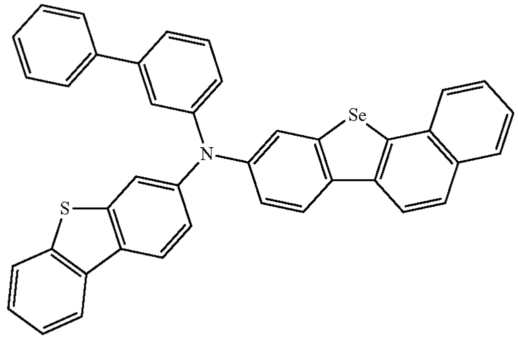
H2-176
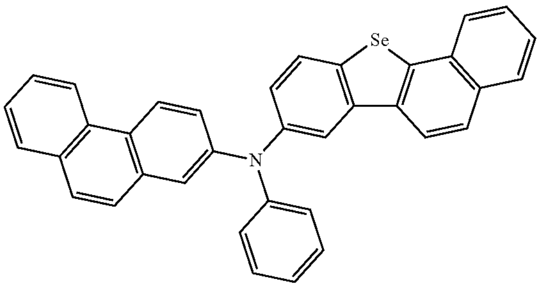
H2-177
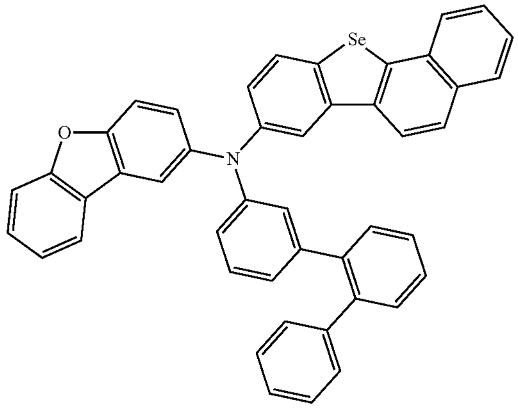
H2-178
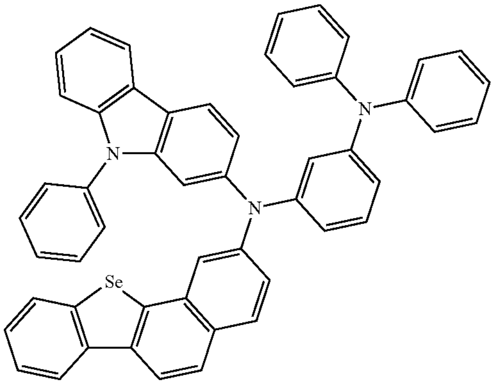
H2-179
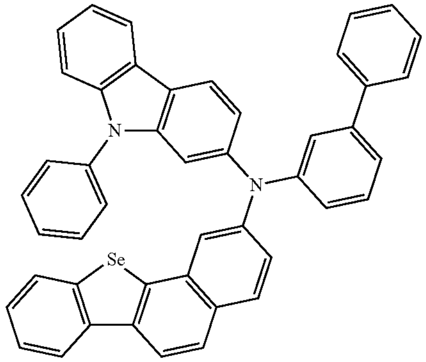

-continued
H2-180
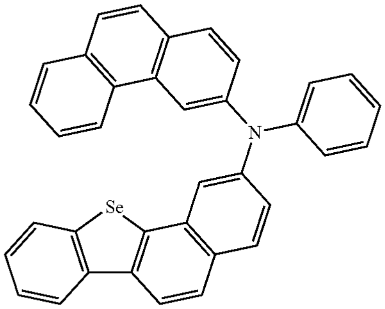
H2-181
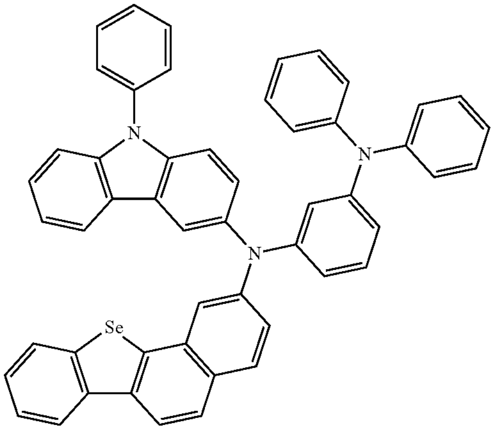
H2-182
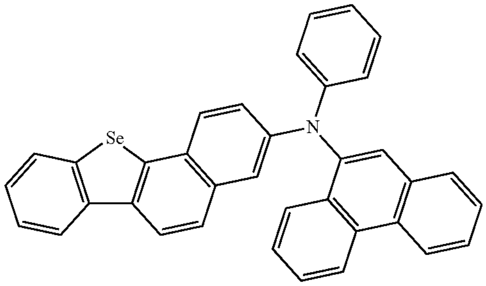
H2-183
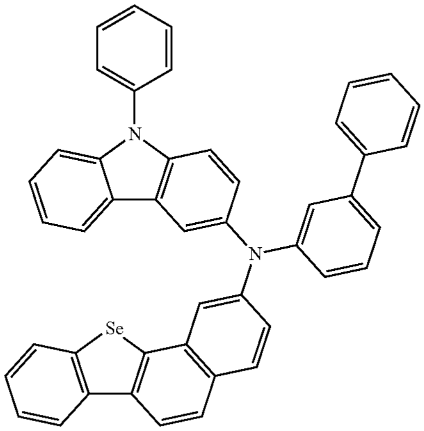
-continued
H2-184
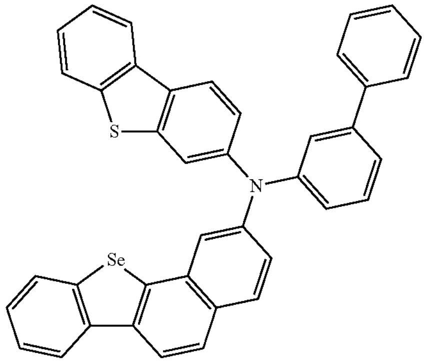
H2-185
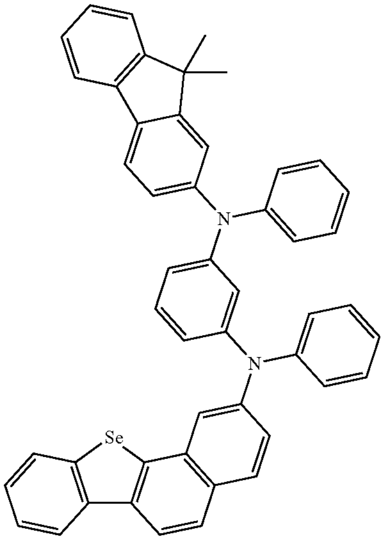
H2-186
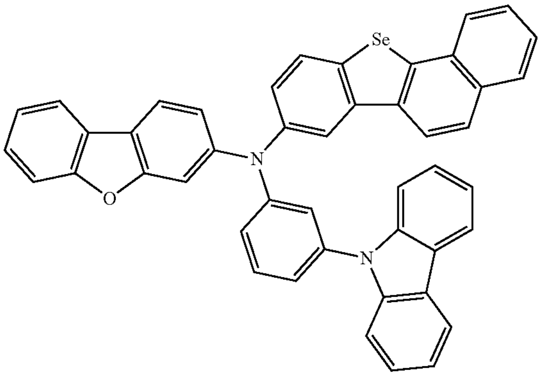
H2-187
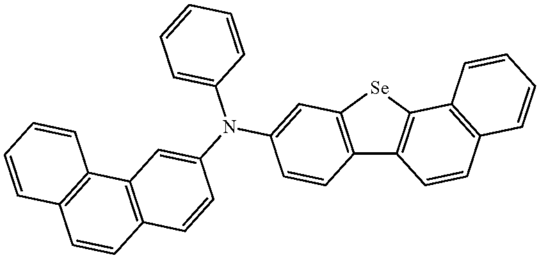

-continued
H2-188
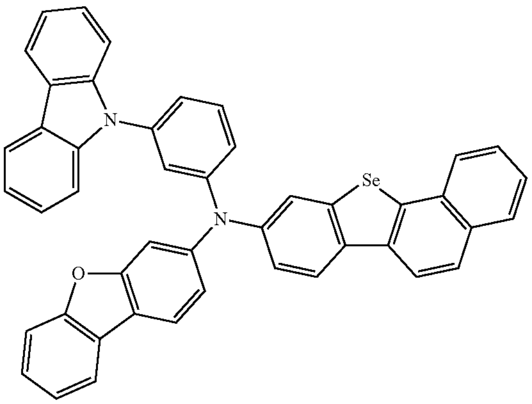
H2-189
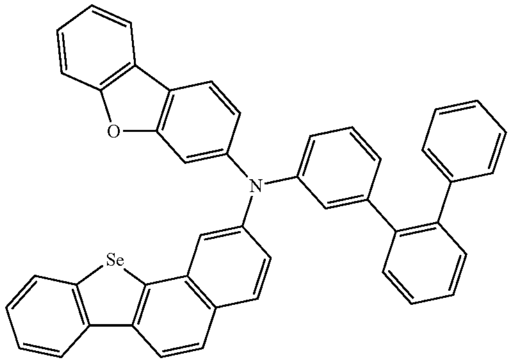
H2-190
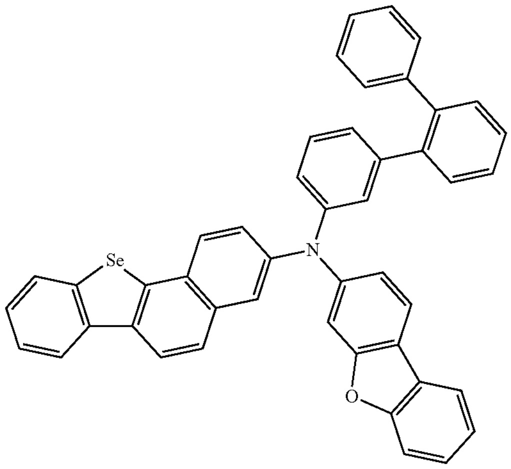
-continued
H2-191
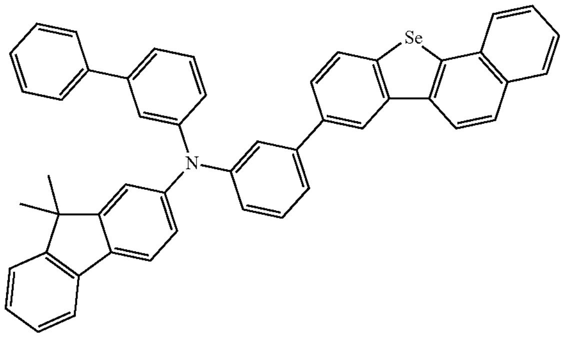
H2-192
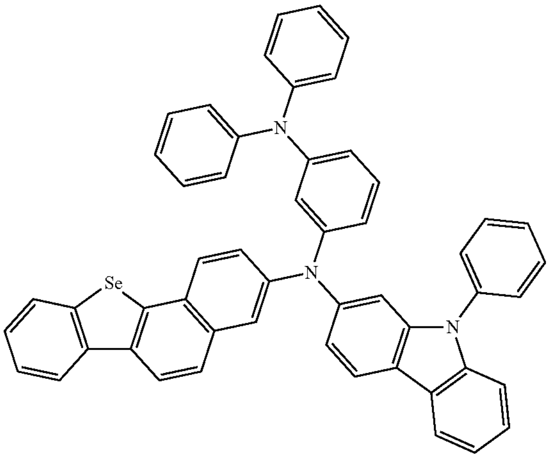
H2-193
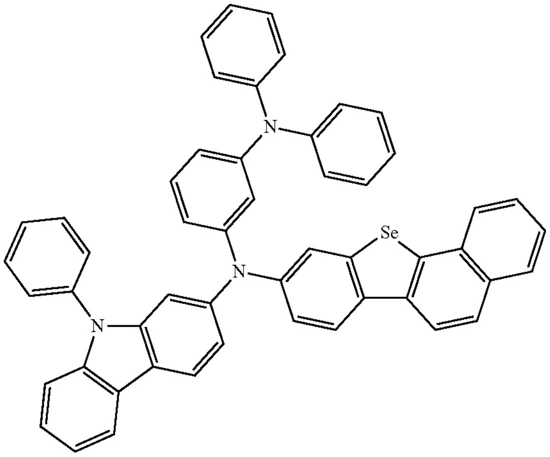

-continued
H2-194
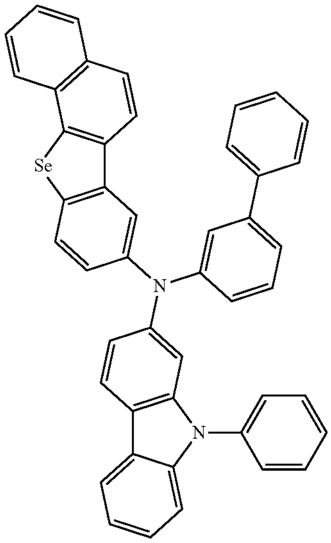
H2-195
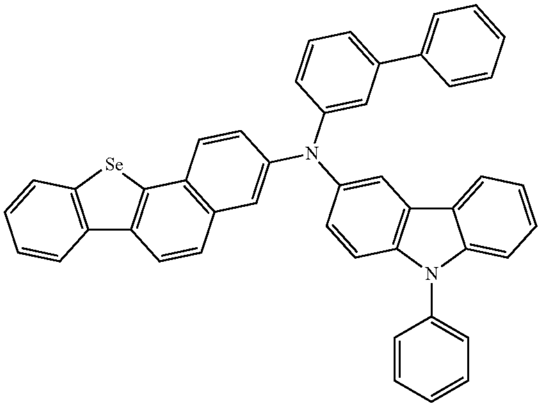
H2-196
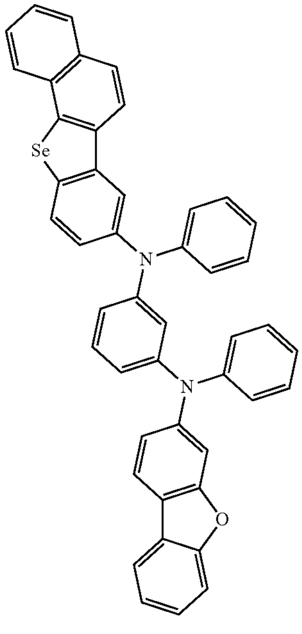
-continued
H2-197
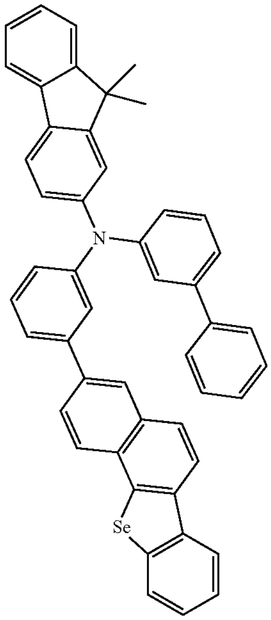
H2-198
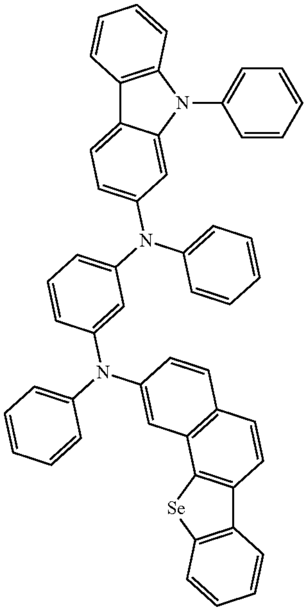
H2-199
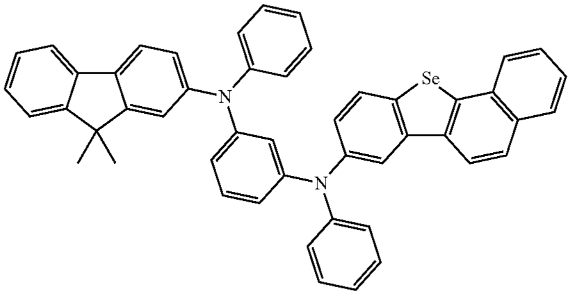

-continued
H2-200
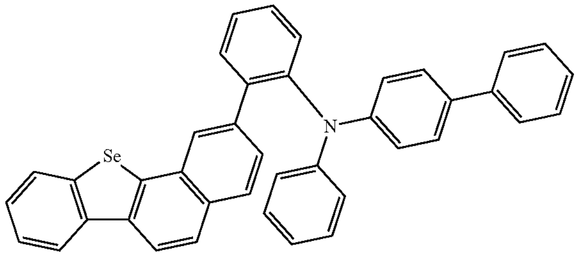
H2-201
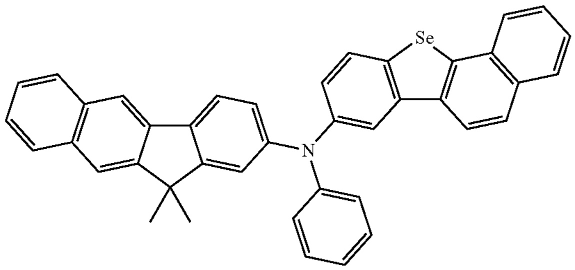
H2-202
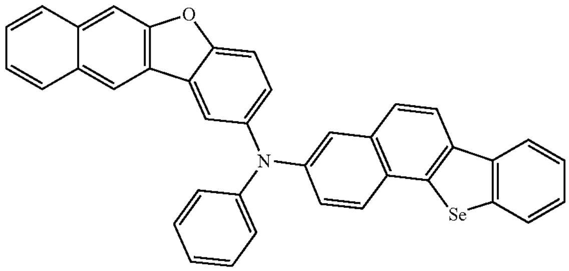
H2-203
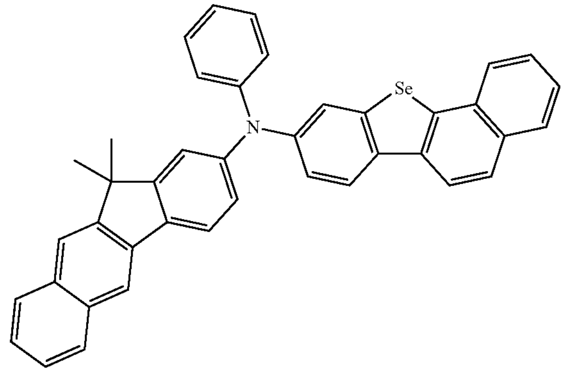
H2-204
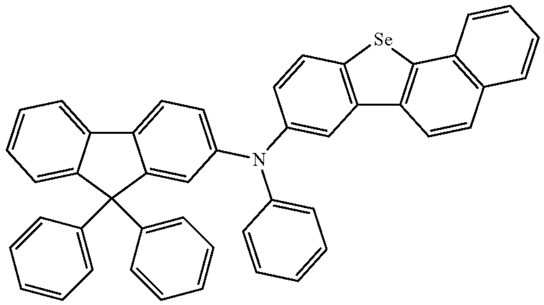
-continued
H2-205
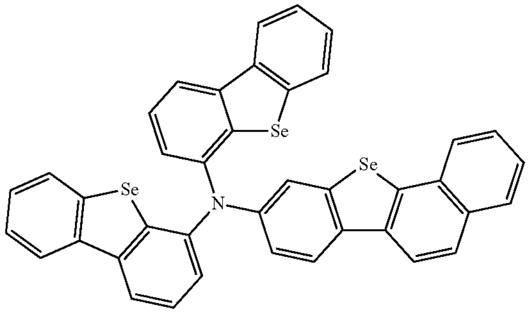
H2-206
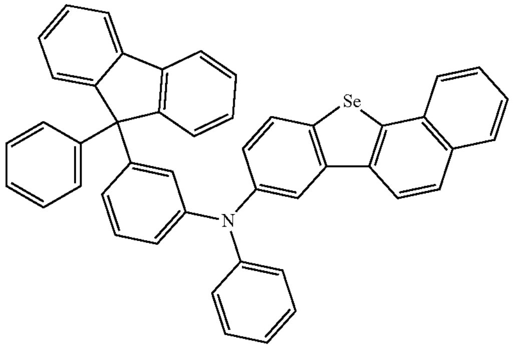
H2-207
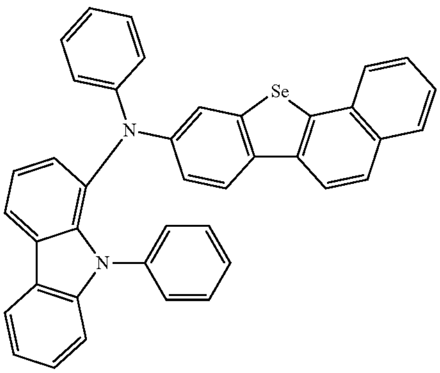
H2-208
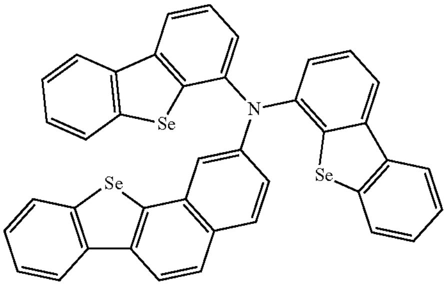

-continued
H2-209
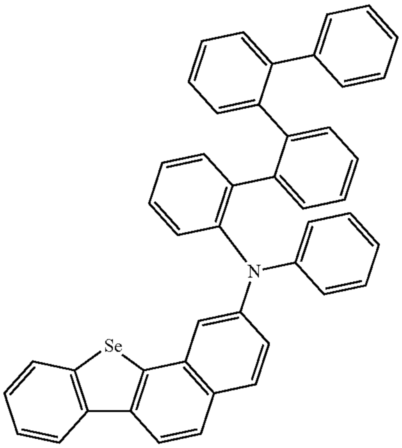
H2-210
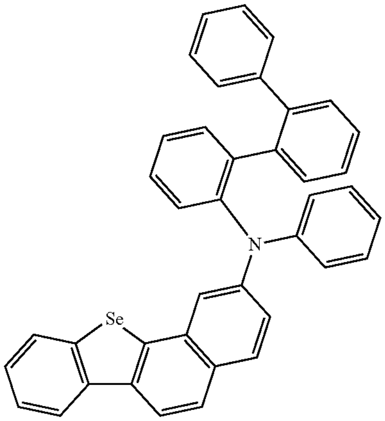
H2-211
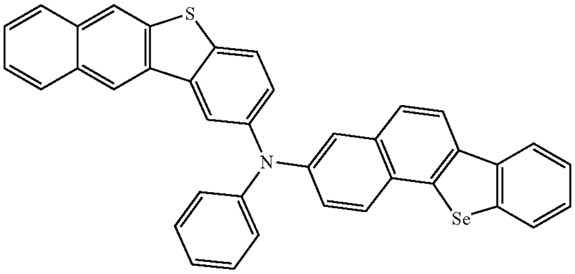
H2-212
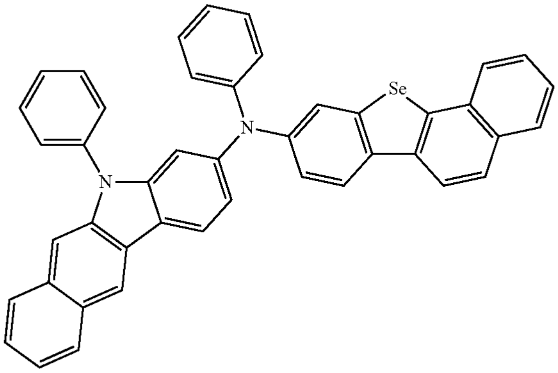
-continued
H2-213
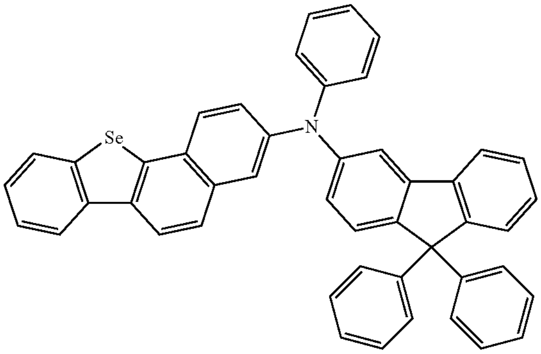
H2-214
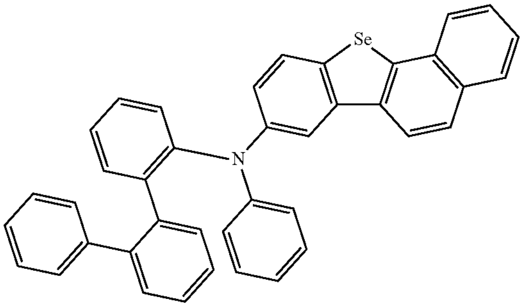
H2-215
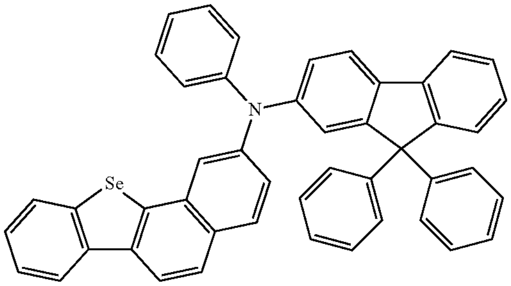
H2-216
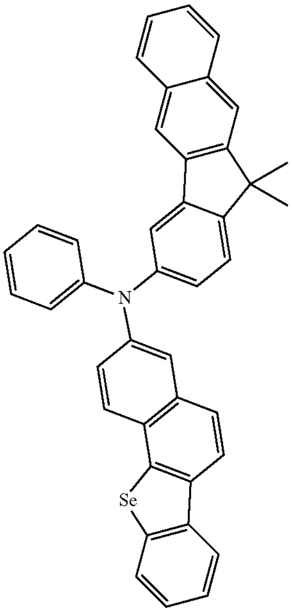

-continued
H2-217
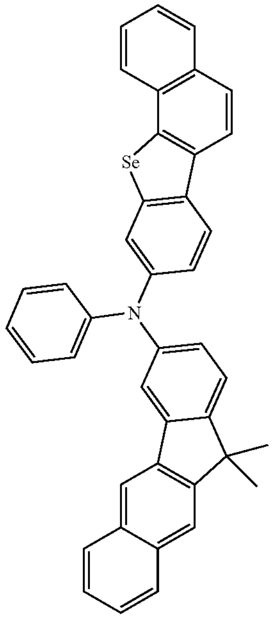
H2-218
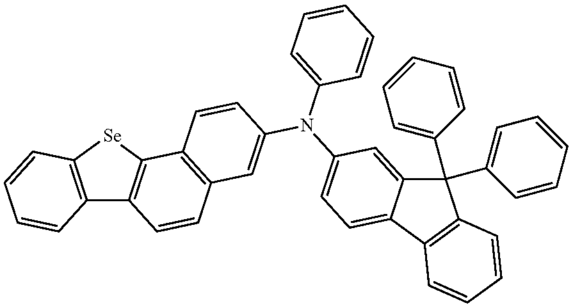
H2-219
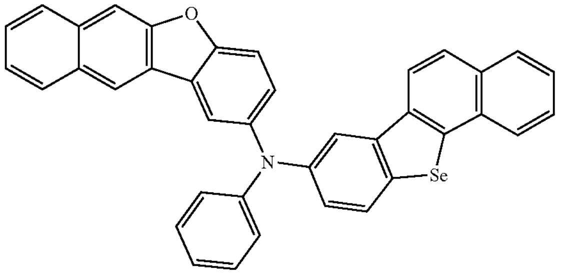
H2-220
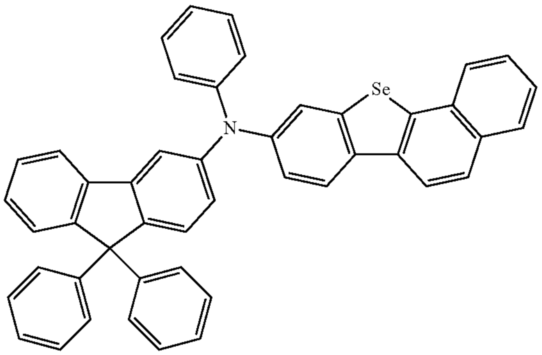
-continued
H2-221
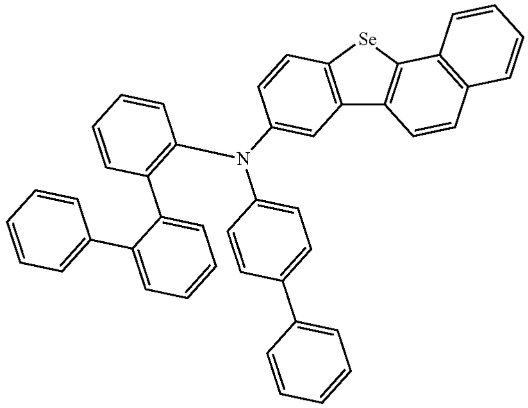
H2-222
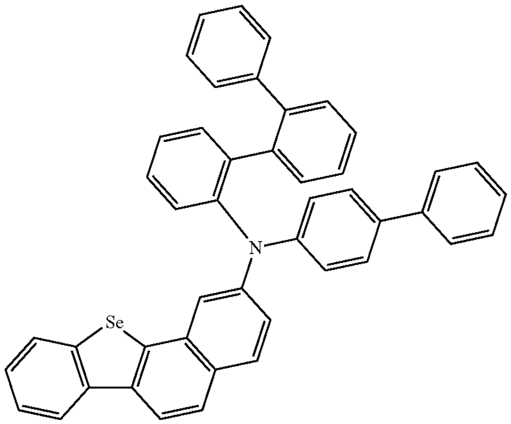
H2-223
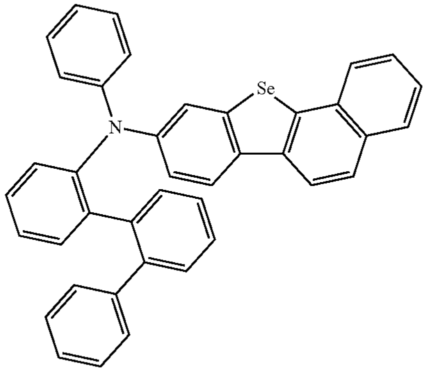
H2-224
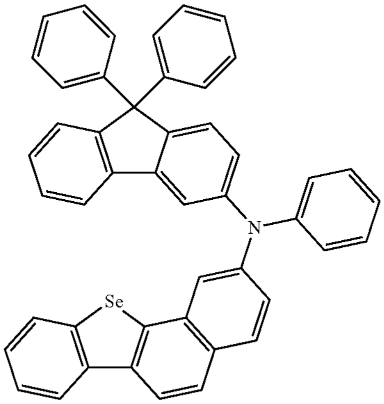

-continued
H2-225
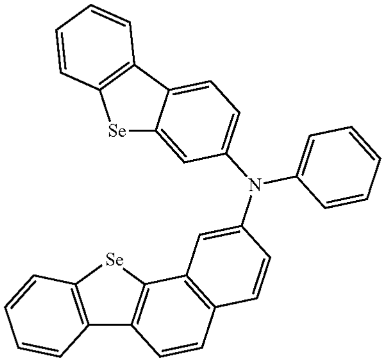
H2-226
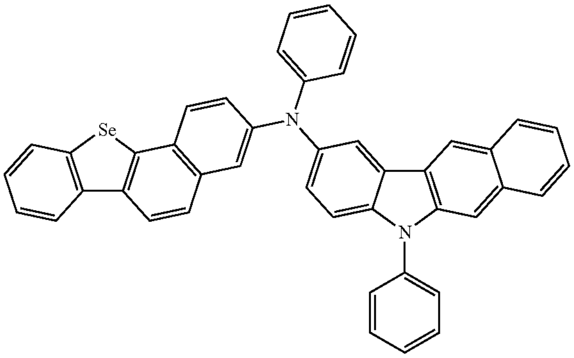
H2-227
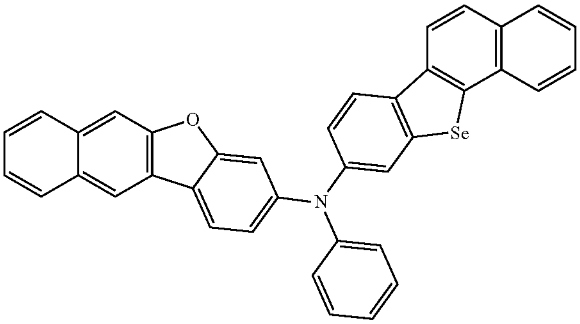
H2-228
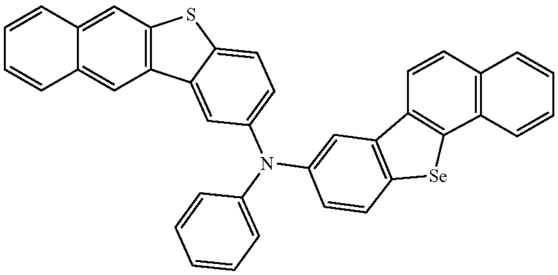
-continued
H2-229
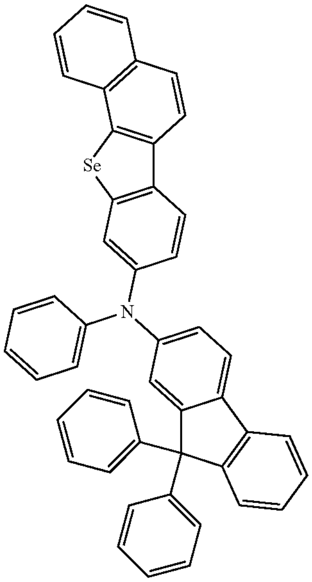
H2-230
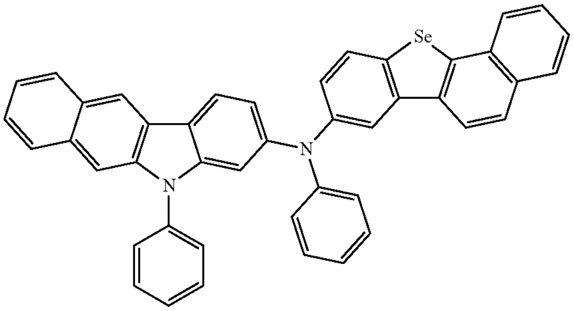
H2-231
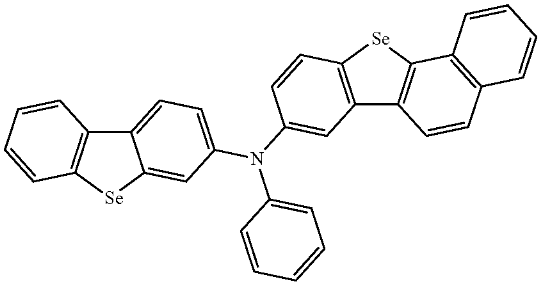
H2-232
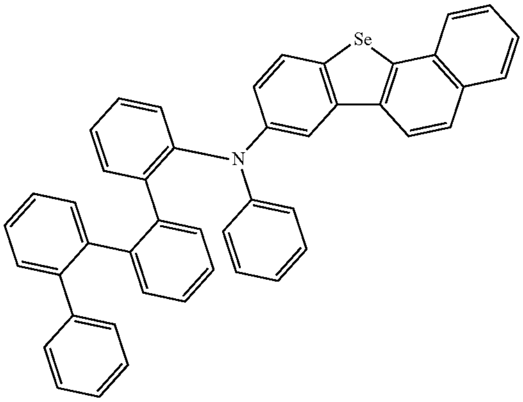

H2-233
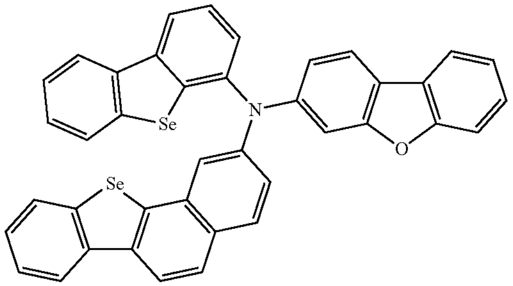
H2-234
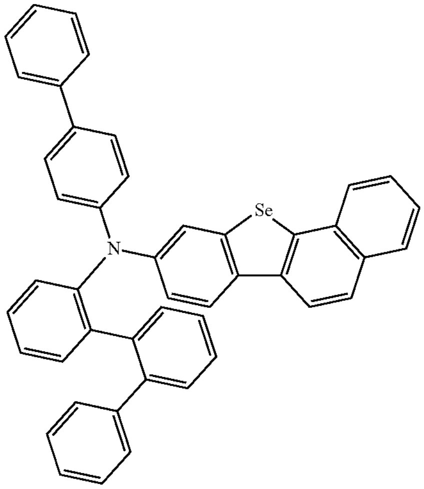
H2-235
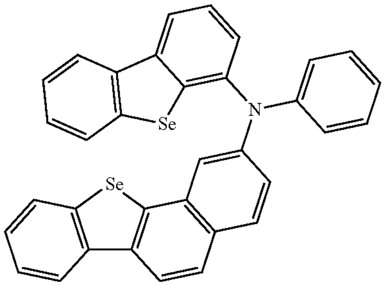
H2-236
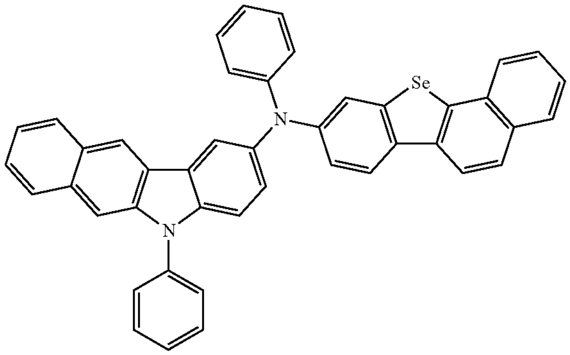
H2-237
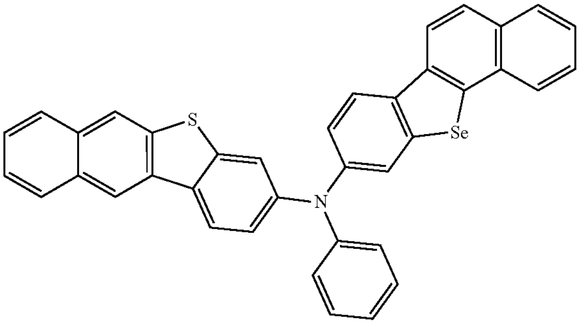
H2-238
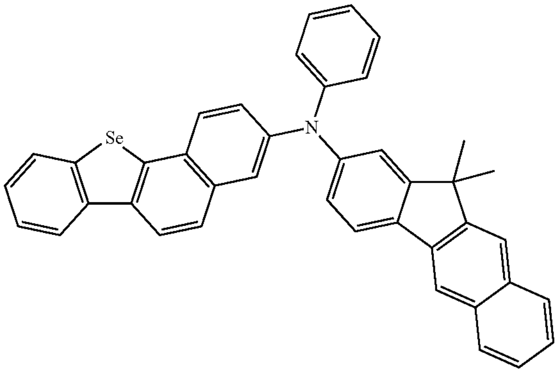
H2-239
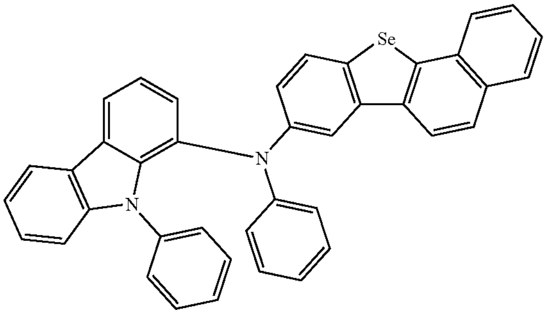
H2-240
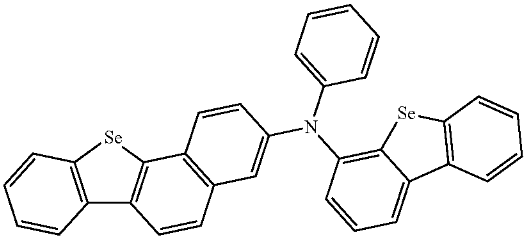

-continued
H2-241
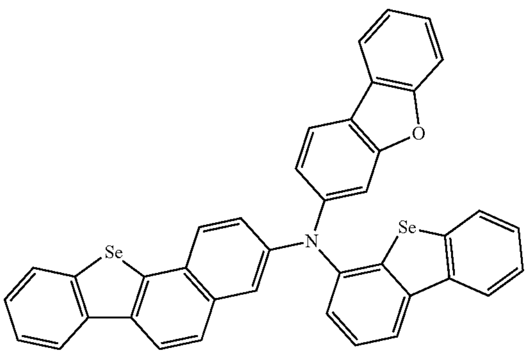
H2-242
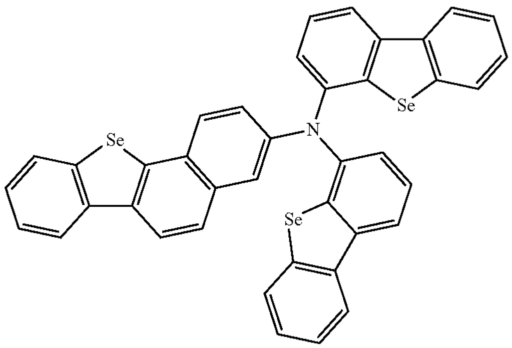
H2-243
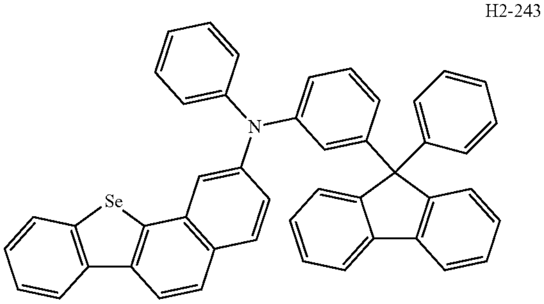
H2-244
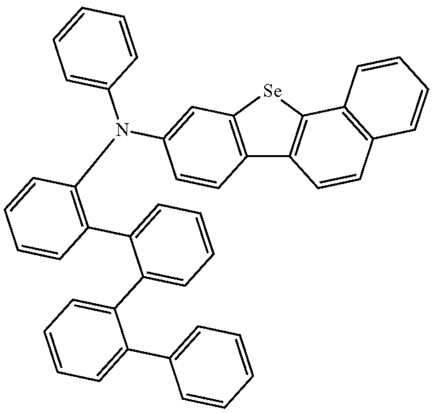
-continued
H2-245
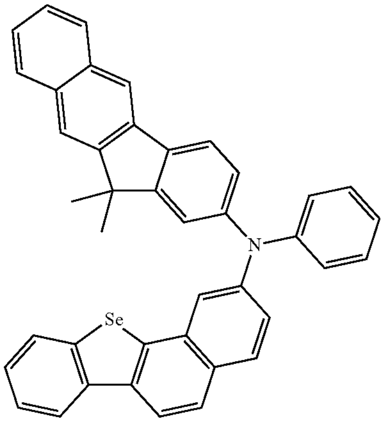
H2-246
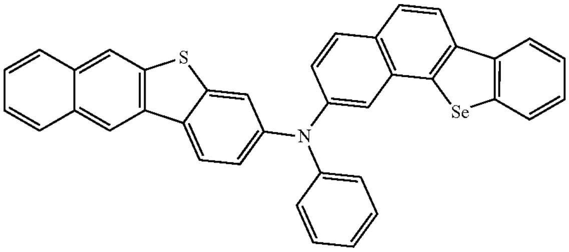
H2-247
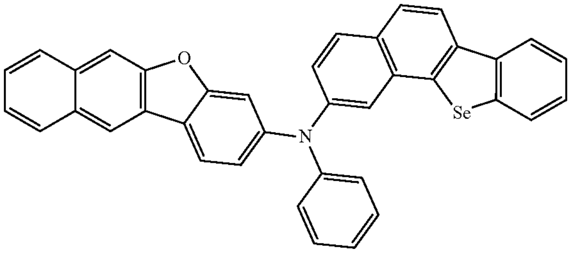
H2-248
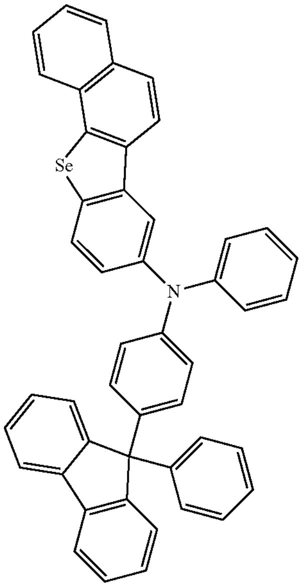

-continued
H2-249
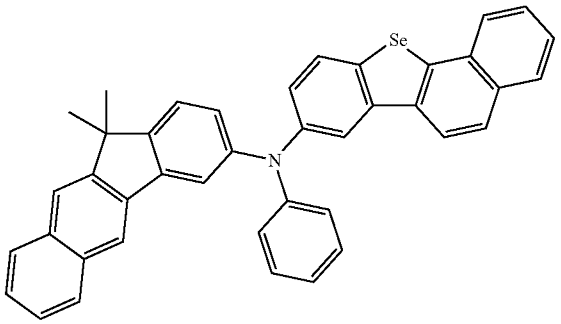
H2-250
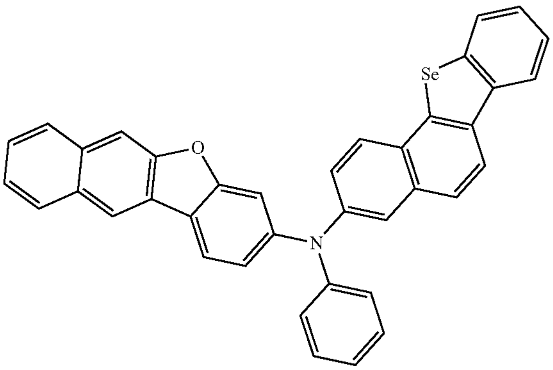
H2-251
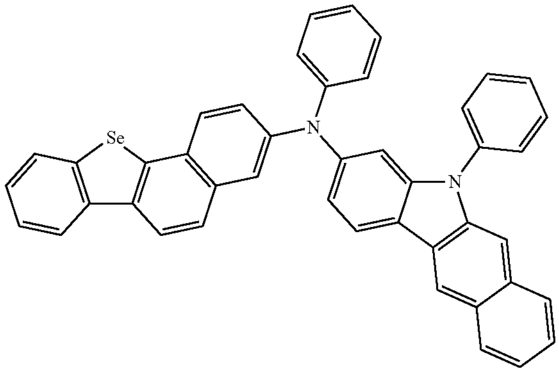
H2-252
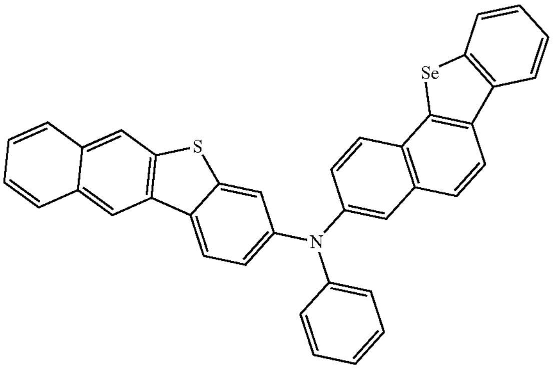
-continued
H2-253
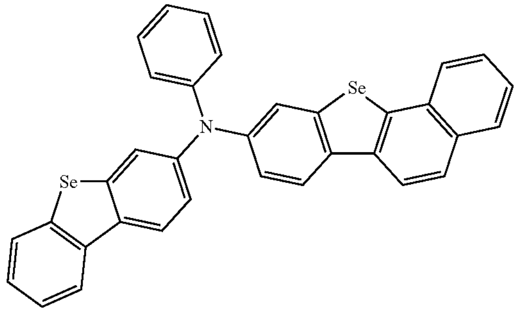
H2-254
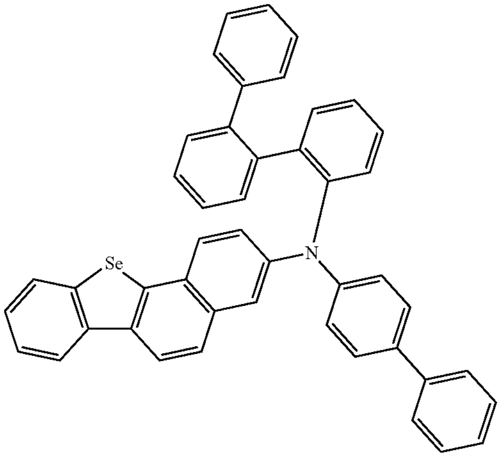
H2-255
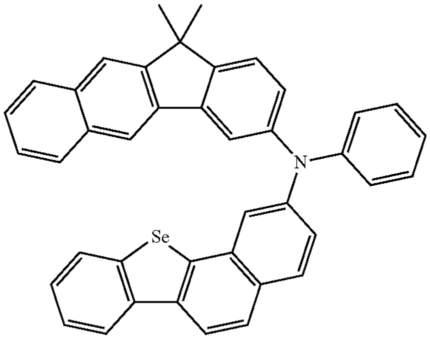
H2-256
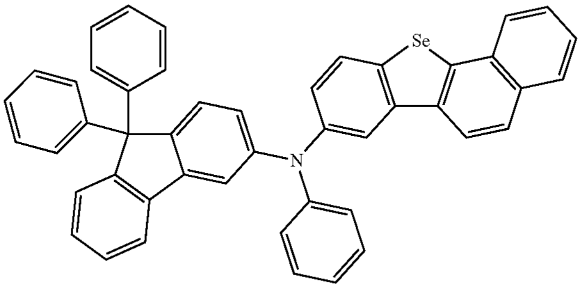

H2-257
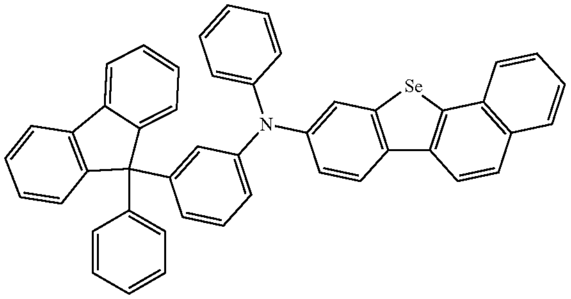
H2-258
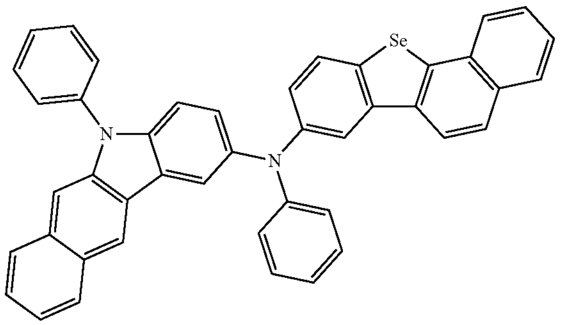
H2-259
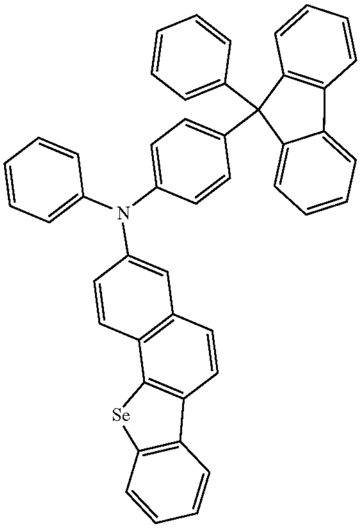
H2-260
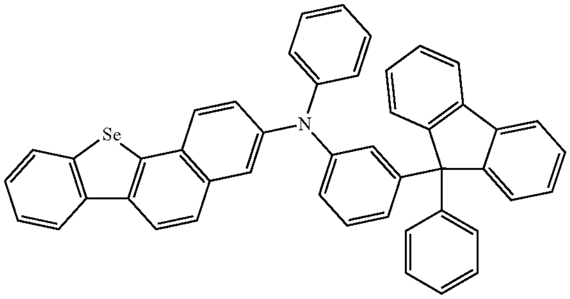
H2-261
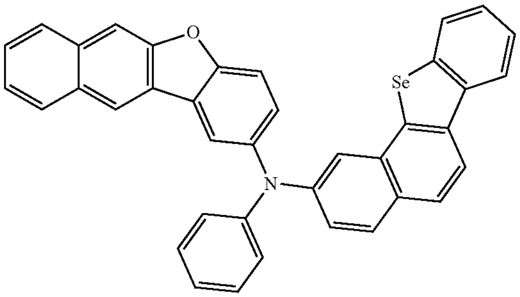
H2-262
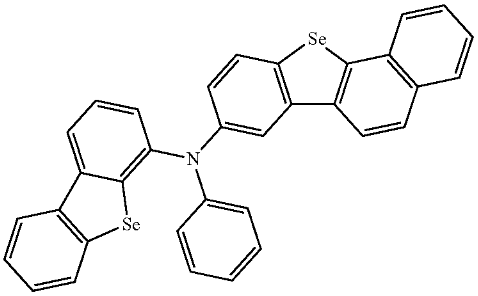
H2-263
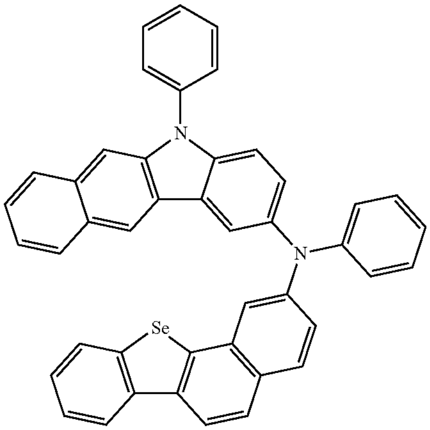
H2-264
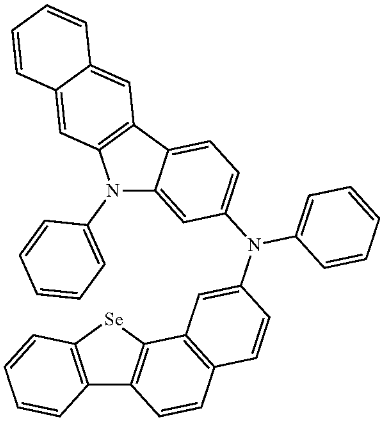

-continued
H2-265
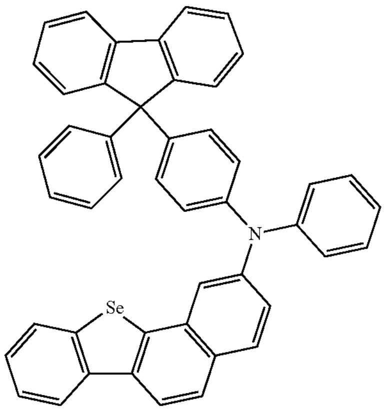
H2-266
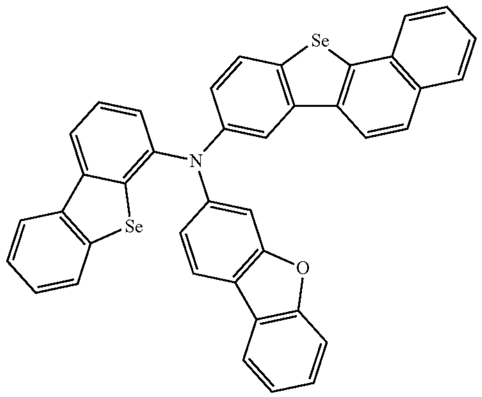
H2-267
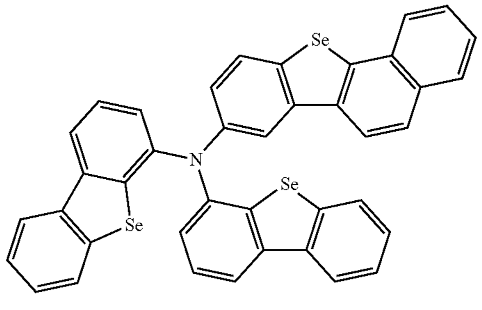
H2-268
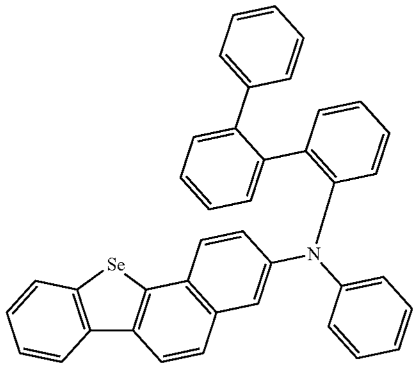
-continued
H2-269
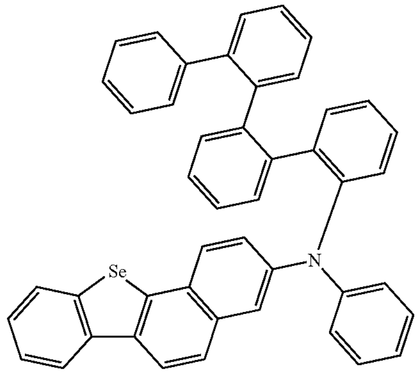
H2-270
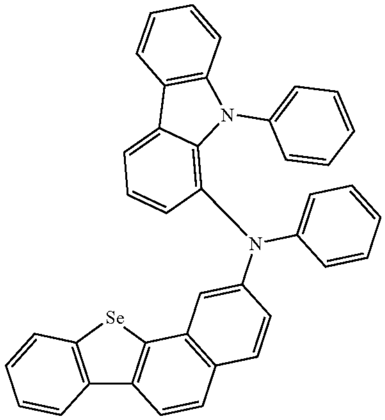
H2-271
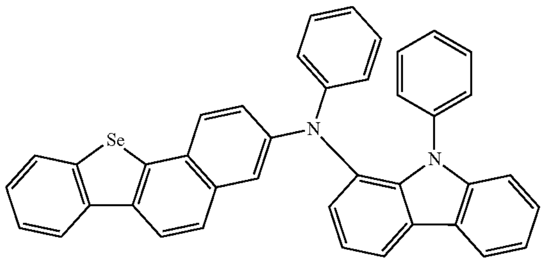
H2-272
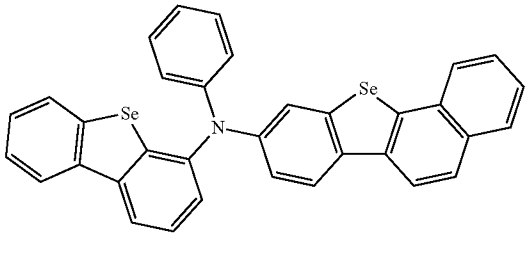

-continued
H2-273
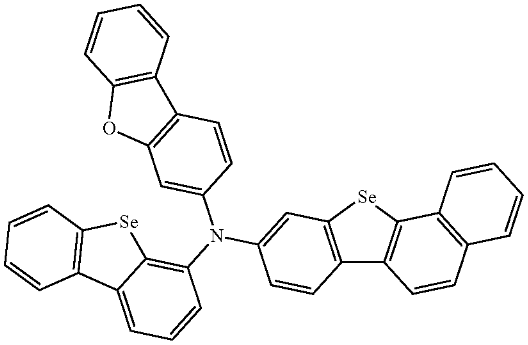
H2-274
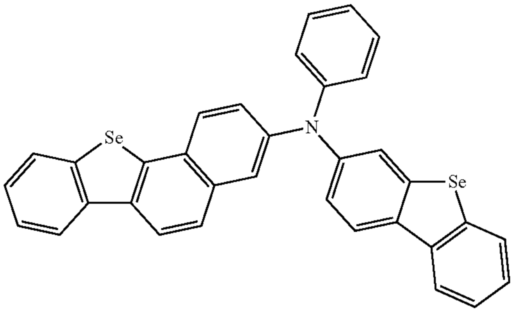
H2-275
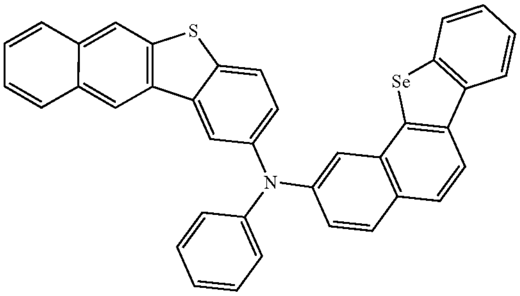
H2-276
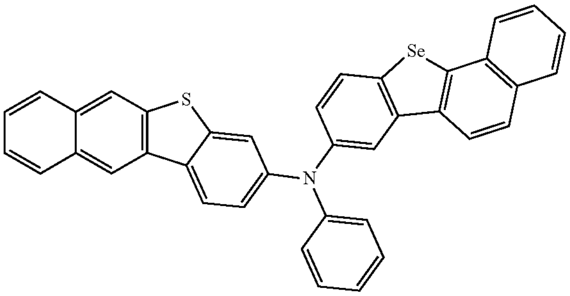
-continued
H2-277
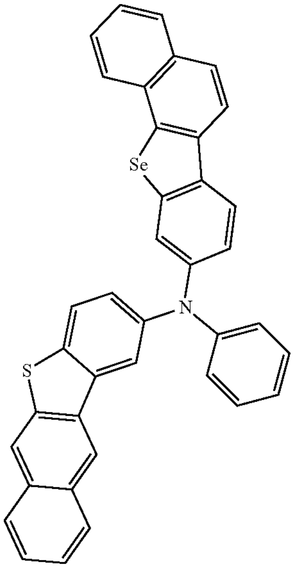
H2-278
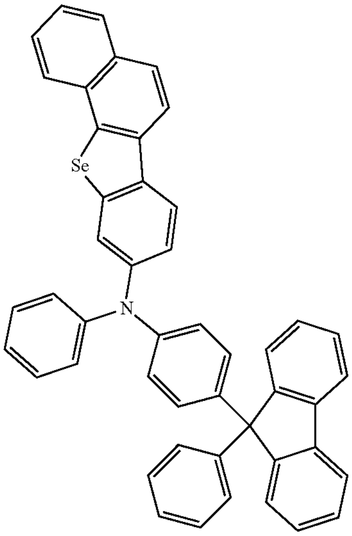

-continued
H2-279
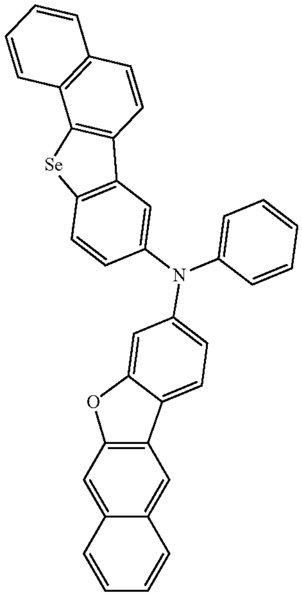
H2-280
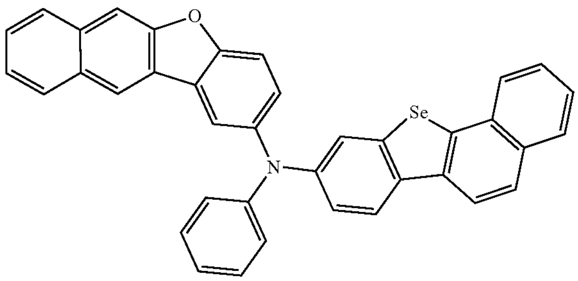
H2-281
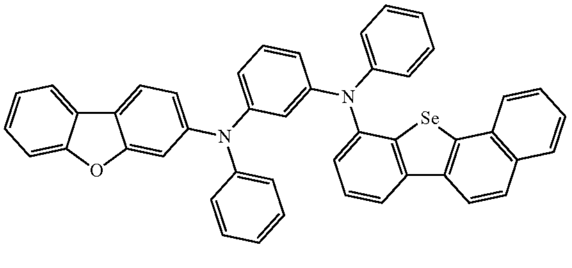
-continued
H2-282
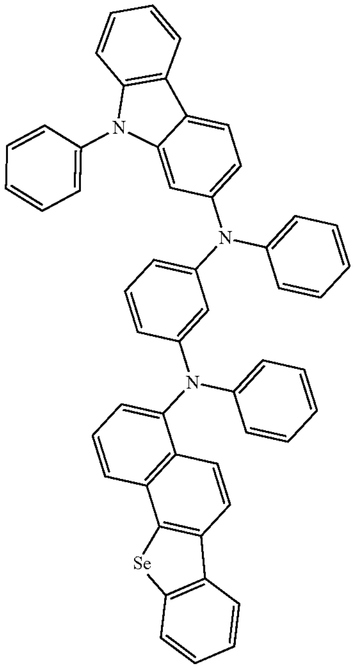
H2-283
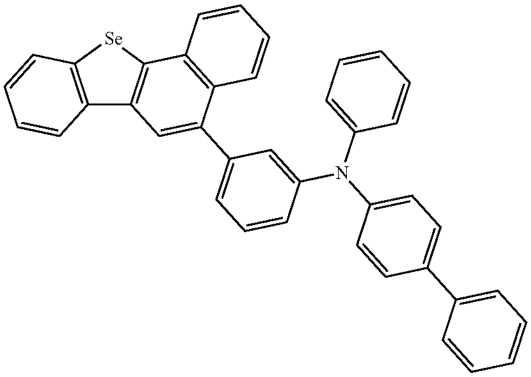
H2-284
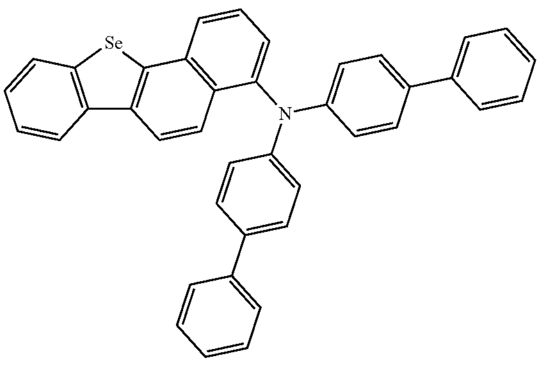

-continued
H2-285
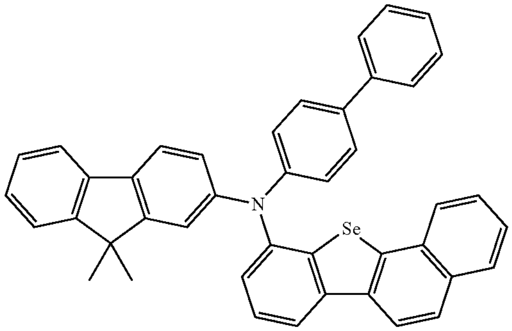
H2-286
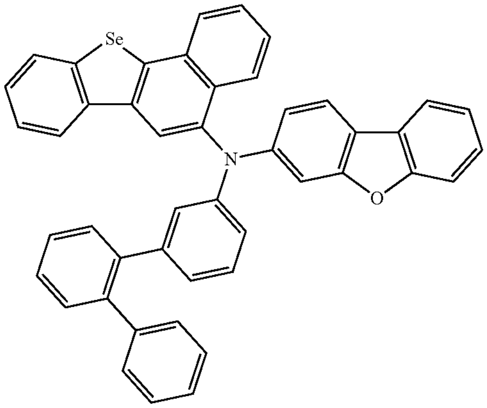
H2-287
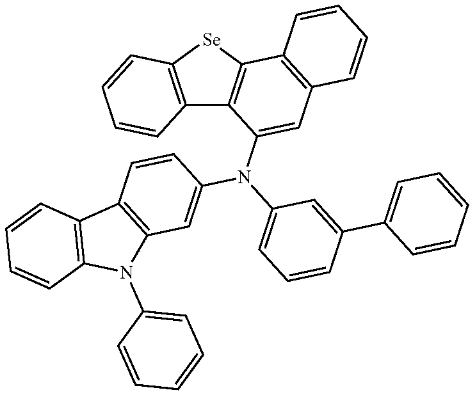
H2-288
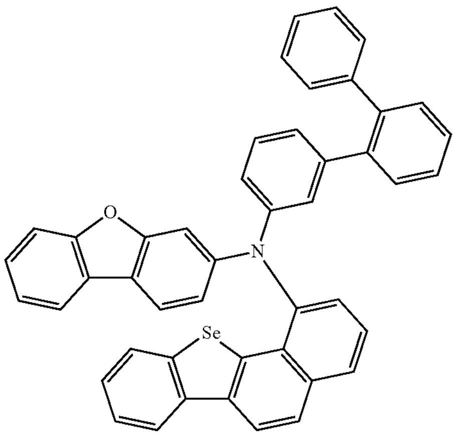
-continued
H2-289
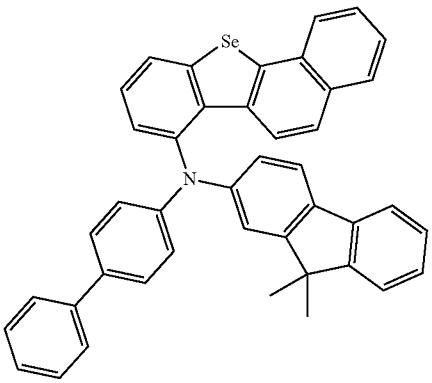
H2-290
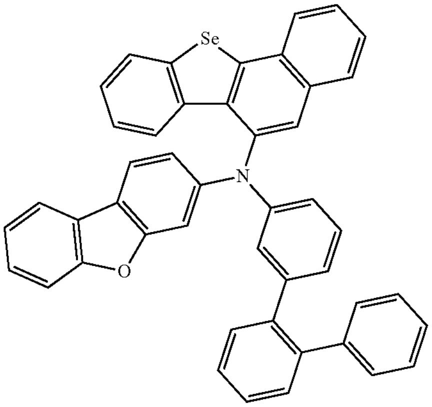
H2-291
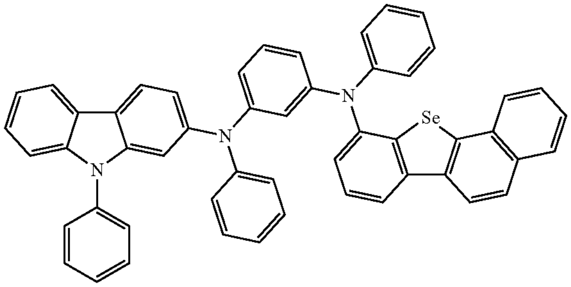
H2-292
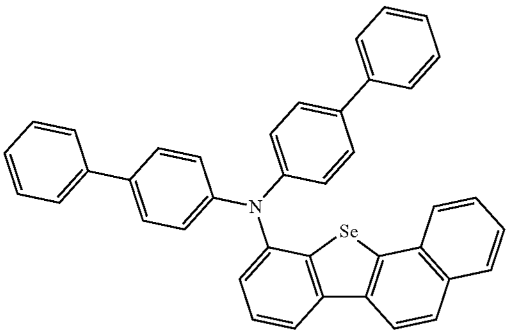

-continued
H2-293
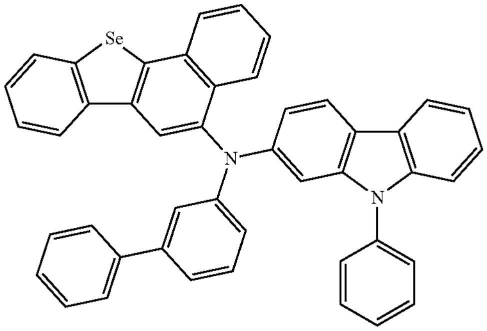
H2-294
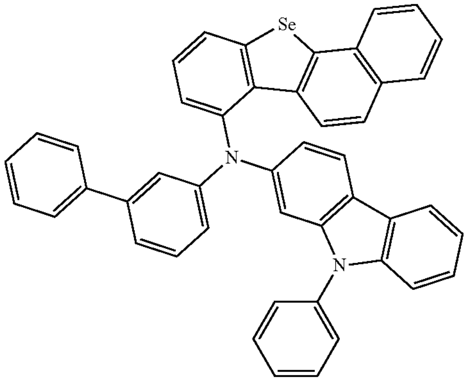
H2-295
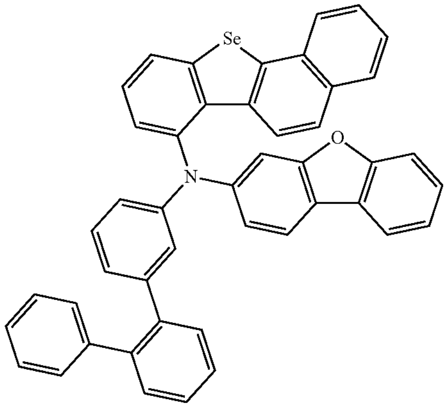
H2-296
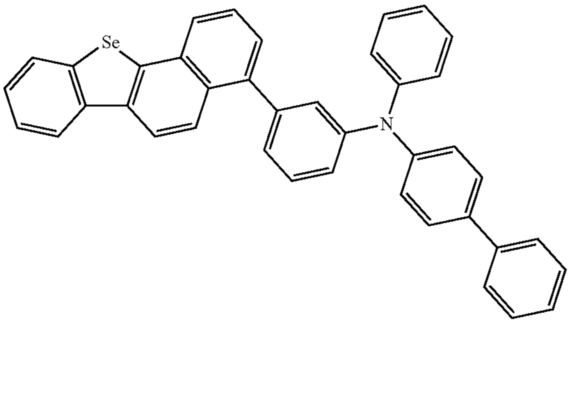
-continued
H2-297
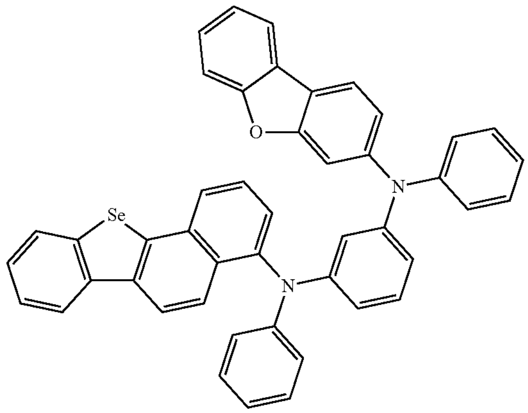
H2-298
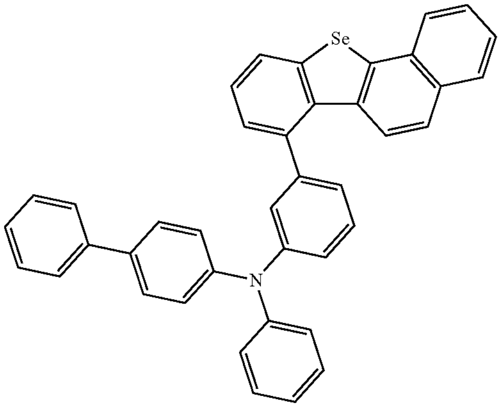
H2-299
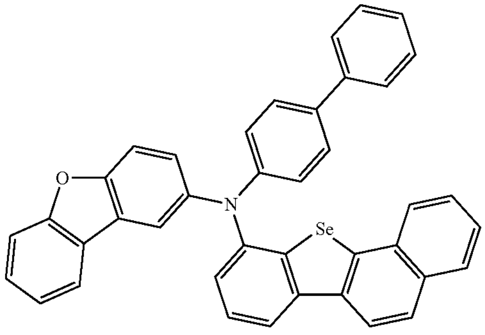
H2-300
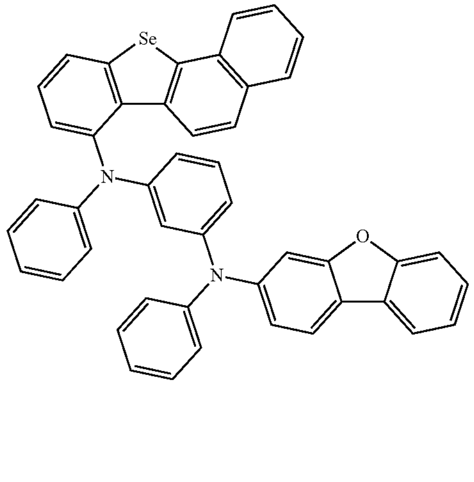

-continued
H2-301
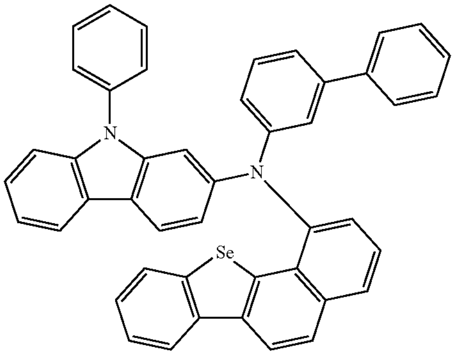
H2-302
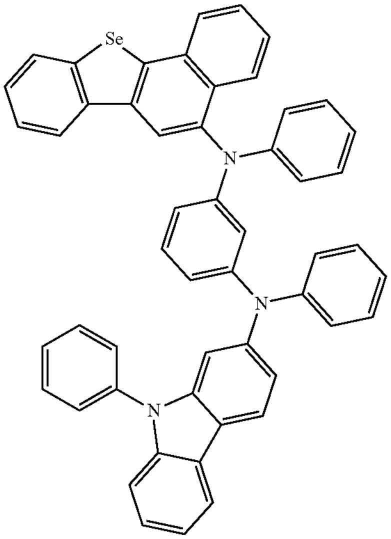
H2-303
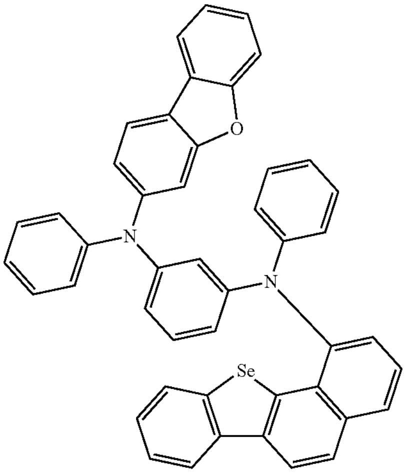
-continued
H2-304
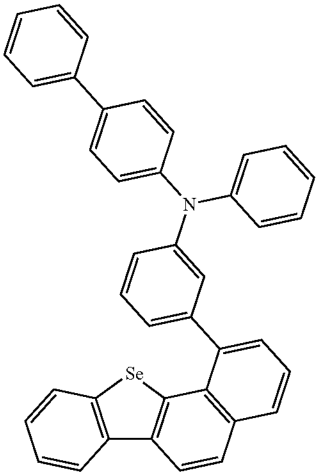
H2-305
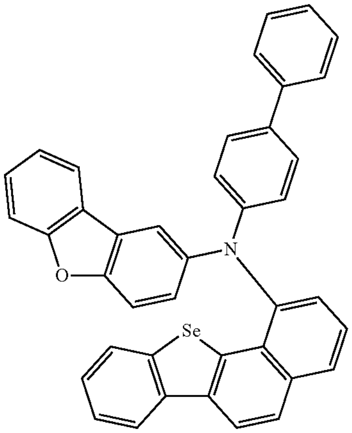
H2-306
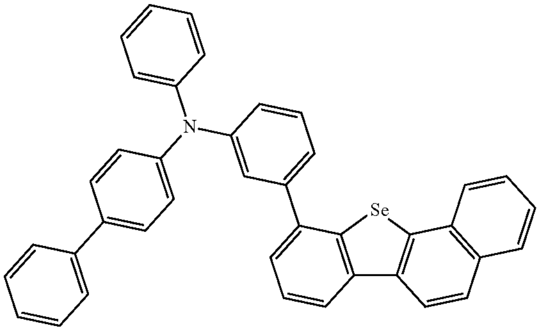

H2-307
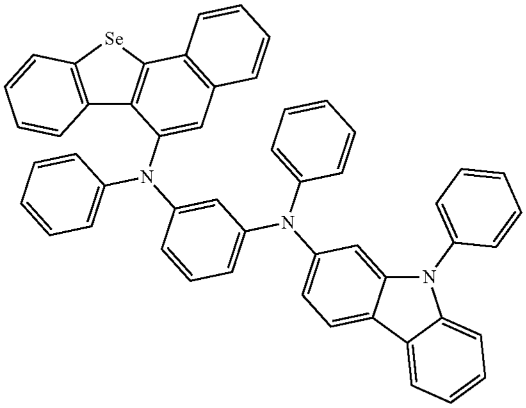
H2-308
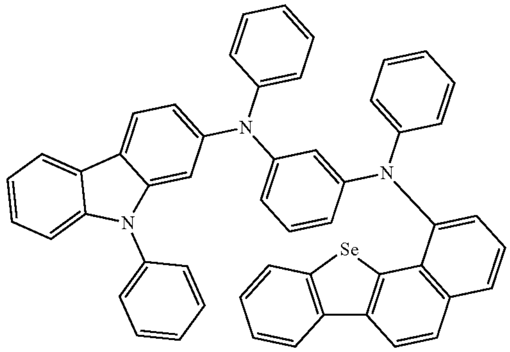
H2-309
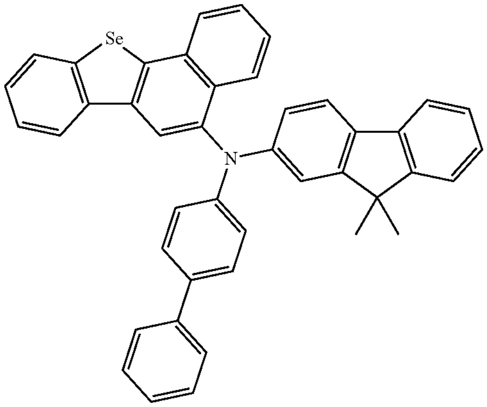
H2-310
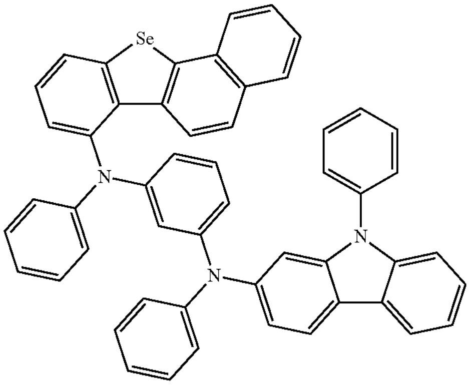
H2-311
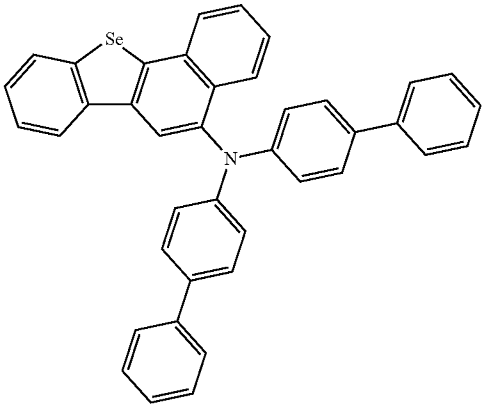
H2-312
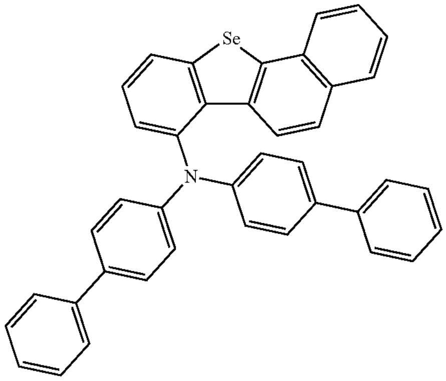
H2-313
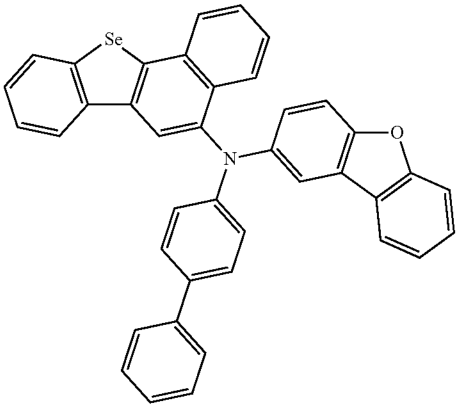
H2-314
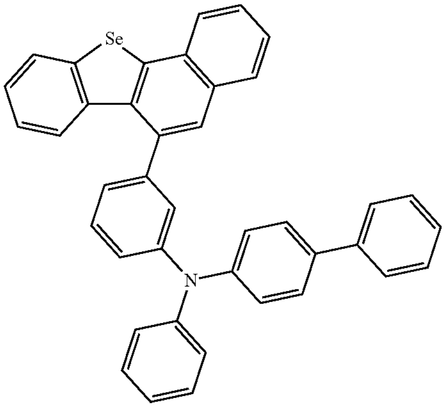

-continued
H2-315
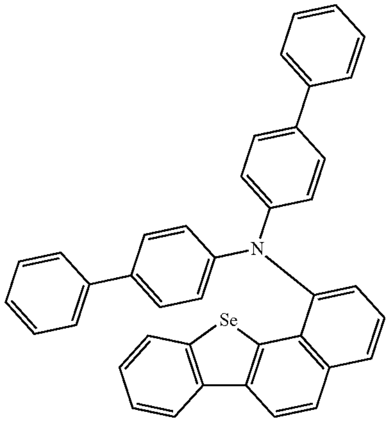
H2-316
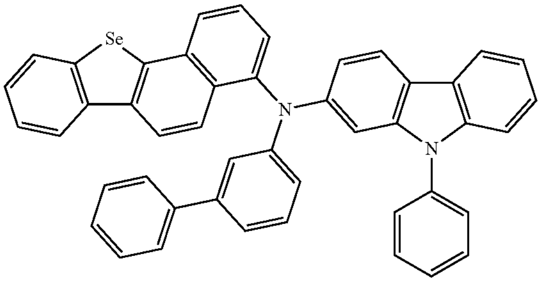
H2-317
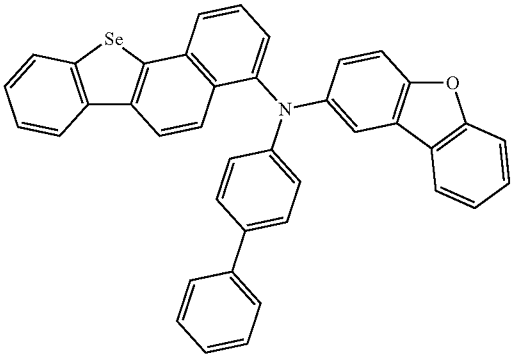
H2-318
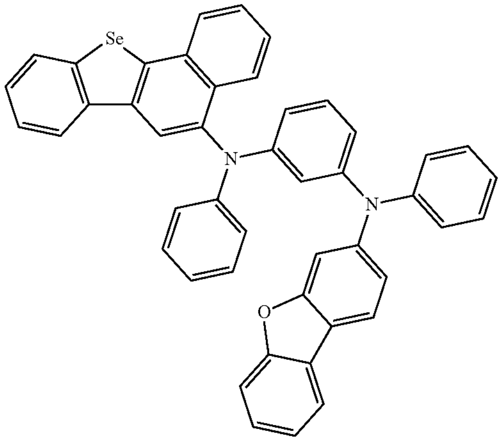
-continued
H2-319
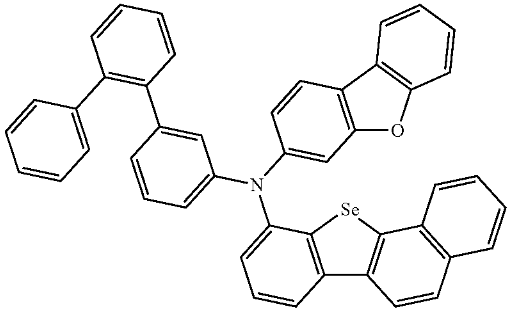
H2-320
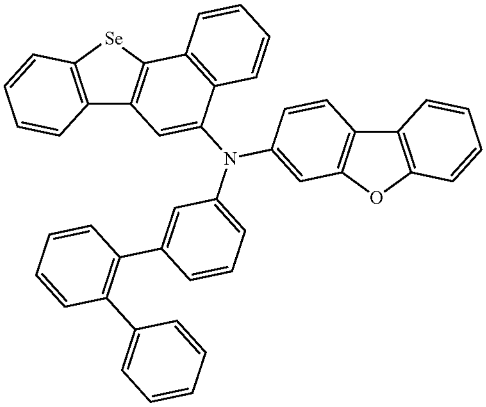
H2-321
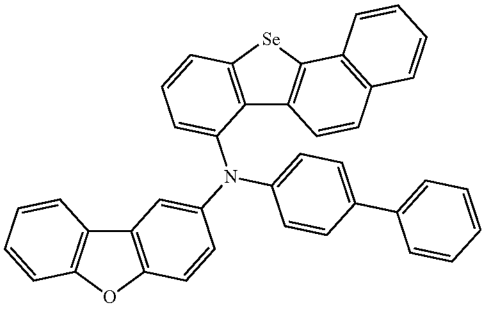
H2-322
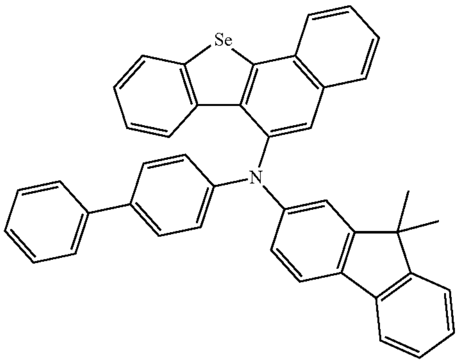

-continued
H2-323
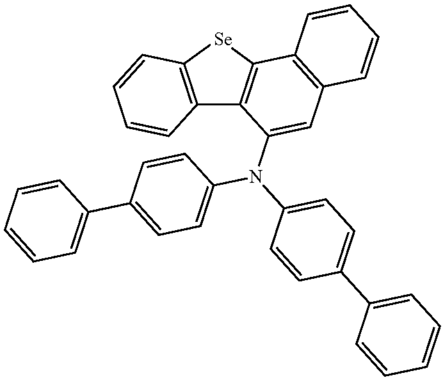
H2-324
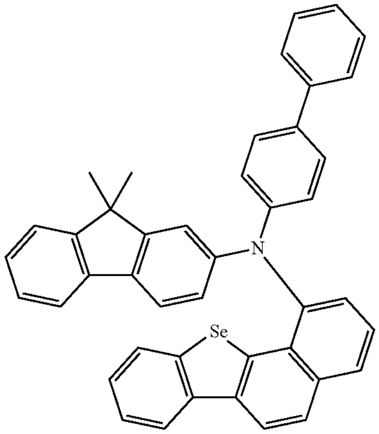
H2-325
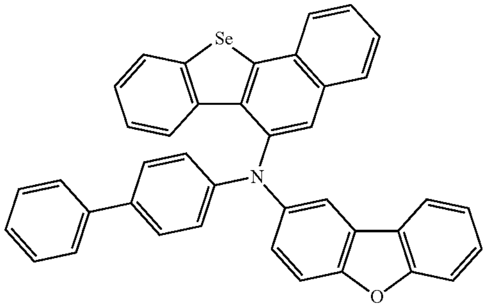
H2-326
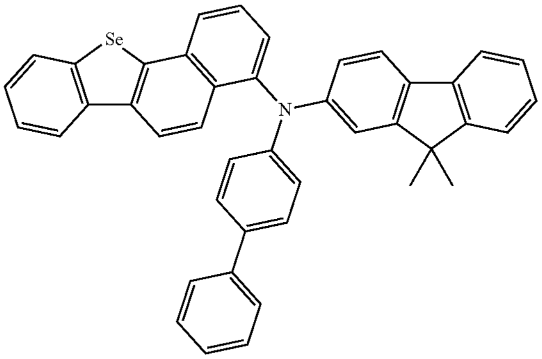
-continued
H2-327
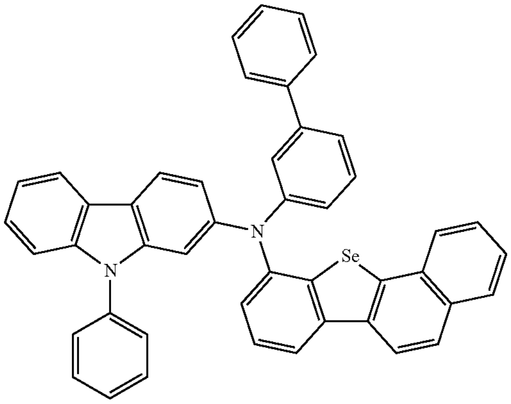
H2-328
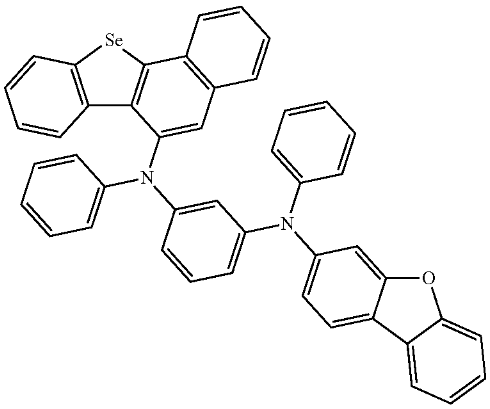
H2-329
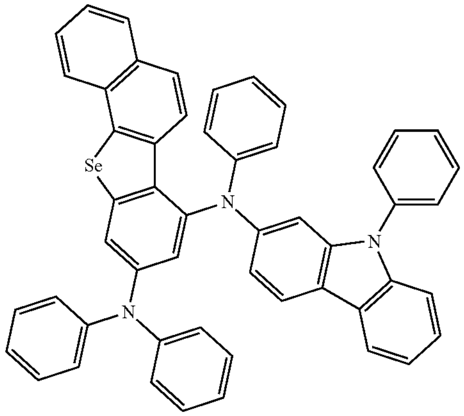
H2-330
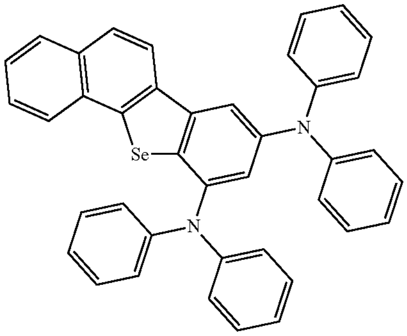

-continued

H2-331

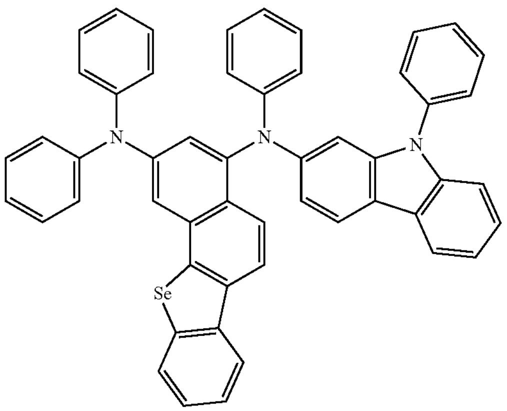

H2-332

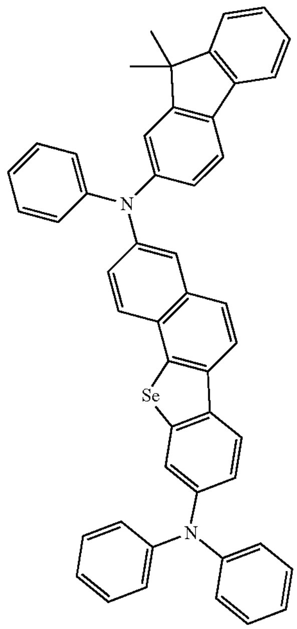

H2-333

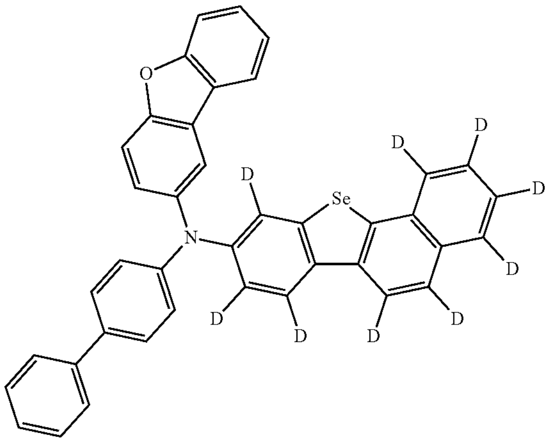

The host material of Formula 2 according to the present disclosure may be produced by a synthetic method known to a person skilled in the art.

According to another embodiment, the present disclosure provides an organic electroluminescent compound represented by the following Formula 3.

(3)

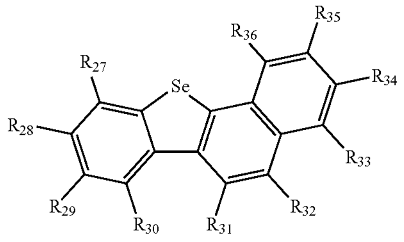

in Formula 3, $R_{27}$ to $R_{36}$ each independently represent hydrogen, deuterium, a substituted or unsubstituted (C1-C30)alkyl, a substituted or unsubstituted (C6-C30)aryl, or the following Formula b; provided that at least one of $R_{27}$ to $R_{36}$ is(are) the following Formula b;

(b)

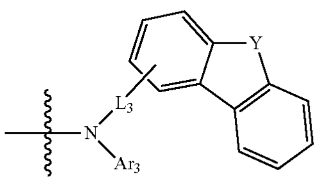

in Formula b,

Y represents O, S, $CR_{37}R_{38}$ or $NR_{39}$;

$R_{37}$ to $R_{39}$ each independently represent hydrogen, deuterium, or a substituted or unsubstituted (C6-C30)aryl;

$L_3$ represents a single bond, a substituted or unsubstituted (C6-C30)arylene, or a substituted or unsubstituted (3- to 30-membered)heteroarylene; and $Ar_3$ represents a substituted or unsubstituted (C6-C30)aryl or a substituted or unsubstituted (3- to 30-membered) heteroaryl.

Hereinafter, an organic electroluminescent device to which the aforementioned plurality of host materials and/or an organic electroluminescent compound is (are) applied, will be described.

The organic electroluminescent device according to one embodiment includes a first electrode; a second electrode; and at least one organic layer(s) interposed between the first electrode and the second electrode. The organic layer may include a light-emitting layer, and the light-emitting layer may comprise a plurality of host materials comprising at least one first host material represented by Formula 1 and at least one second host material represented by Formula 2.

According to another embodiment, the light-emitting layer may comprise an organic electroluminescent compound represented by Formula 3.

According to one embodiment, the organic electroluminescent material of the present disclosure comprises at least one compound(s) of compounds H1-1 to H1-392, which is a first host material, and at least one compound(s) of compounds H2-1 to H2-333, which is a second host material. The plurality of host materials may be included in the same organic layer, for example the same light-emitting layer, or may be included in different light-emitting layers, respectively.

According to another embodiment, the organic electroluminescent material of the present disclosure comprises an organic electroluminescent compound represented by Formula 3 alone or in combination of two or more. Such an organic electroluminescent material is included in an organic layer of an organic electroluminescent device, for example, a light-emitting layer or a hole transport layer.

The organic layer may further comprise at least one layer selected from a hole injection layer, a hole auxiliary layer, a light-emitting auxiliary layer, an electron transport layer, an electron injection layer, an interlayer, a hole blocking layer, an electron blocking layer and an electron buffer layer, in addition to the light-emitting layer and a hole transport layer. The organic layer may further comprise an amine-based compound and/or an azine-based compound other than the light-emitting material according to the present disclosure. Specifically, the hole injection layer, the hole transport layer, the hole auxiliary layer, the light-emitting layer, the light-emitting auxiliary layer, or the electron blocking layer may contain the amine-based compound, e.g., an arylamine-based compound and a styrylarylamine-based compound, etc., as a hole injection material, a hole transport material, a hole auxiliary material, a light-emitting material, a light-emitting auxiliary material, or an electron blocking material. Also, the electron transport layer, the electron injection layer, the electron buffer layer, or the hole blocking layer may contain the azine-based compound as an electron transport material, an electron injection material, an electron buffer material, or a hole blocking material. Also, the organic layer may further comprise at least one metal selected from the group consisting of metals of Group 1, metals of Group 2, transition metals of the 4$^{th}$ period, transition metals of the 5$^{th}$ period, lanthanides, and organic metals of the d-transition elements of the Periodic Table, or at least one complex compound comprising such a metal.

The plurality of host materials according to one embodiment may be used as light-emitting materials for a white organic light-emitting device. The white organic light-emitting device has suggested various structures such as a parallel side-by-side arrangement method, a stacking arrangement method, or CCM (color conversion material) method, etc., according to the arrangement of R (Red), G (Green), YG (yellowish green), or B (blue) light-emitting units. In addition, the plurality of host materials according to one embodiment may also be applied to the organic electroluminescent device comprising a QD (quantum dot).

One of the first electrode and the second electrode may be an anode and the other may be a cathode. Wherein, the first electrode and the second electrode may each be formed as a transmissive conductive material, a transflective conductive material, or a reflective conductive material. The organic electroluminescent device may be a top emission type, a bottom emission type, or a both-sides emission type according to the kinds of the material forming the first electrode and the second electrode.

A hole injection layer, a hole transport layer, an electron blocking layer, or a combination thereof can be used between the anode and the light-emitting layer. The hole injection layer may be multi-layers in order to lower the hole injection barrier (or hole injection voltage) from the anode to the hole transport layer or the electron blocking layer, wherein each of the multi-layers may use two compounds simultaneously. Also, the hole injection layer may be doped as a p-dopant. Also, the electron blocking layer may be placed between the hole transport layer (or hole injection layer) and the light-emitting layer, and can confine the excitons within the light-emitting layer by blocking the overflow of electrons from the light-emitting layer to prevent a light-emitting leakage. The hole transport layer or the electron blocking layer may be multi-layers, and wherein each layer may use a plurality of compounds.

An electron buffer layer, a hole blocking layer, an electron transport layer, an electron injection layer, or a combination thereof can be used between the light-emitting layer and the cathode. The electron buffer layer may be multi-layers in order to control the injection of the electron and improve the interfacial properties between the light-emitting layer and the electron injection layer, wherein each of the multi-layers may use two compounds simultaneously. The hole blocking layer may be placed between the electron transport layer (or electron injection layer) and the light-emitting layer, and blocks the arrival of holes to the cathode, thereby improving the probability of recombination of electrons and holes in the light-emitting layer. The hole blocking layer or the electron transport layer may also be multi-layers, wherein each layer may use a plurality of compounds. Also, the electron injection layer may be doped as an n-dopant.

The light-emitting auxiliary layer may be placed between the anode and the light-emitting layer, or between the cathode and the light-emitting layer. When the light-emitting auxiliary layer is placed between the anode and the light-emitting layer, it can be used for promoting the hole injection and/or the hole transport, or for preventing the overflow of electrons. When the light-emitting auxiliary layer is placed between the cathode and the light-emitting layer, it can be used for promoting the electron injection and/or the electron transport, or for preventing the overflow of holes. In addition, the hole auxiliary layer may be placed between the hole transport layer (or hole injection layer) and the light-emitting layer, and may be effective to promote or block the hole transport rate (or the hole injection rate), thereby enabling the charge balance to be controlled. When an organic electroluminescent device includes two or more hole transport layers, the hole transport layer, which is further included, may be used as the hole auxiliary layer or the electron blocking layer. The light-emitting auxiliary layer, the hole auxiliary layer, or the electron blocking layer may have an effect of improving the efficiency and/or the lifespan of the organic electroluminescent device.

In the organic electroluminescent device of the present disclosure, preferably, at least one layer (hereinafter, "a surface layer") selected from a chalcogenide layer, a halogenated metal layer, and a metal oxide layer may be placed on an inner surface(s) of one or both of a pair of electrodes. Specifically, a chalcogenide (including oxides) layer of silicon and aluminum is preferably placed on an anode surface of an electroluminescent medium layer, and a halogenated metal layer or a metal oxide layer is preferably placed on a cathode surface of an electroluminescent medium layer. The operation stability for the organic electroluminescent device may be obtained by the surface layer. Preferably, the chalcogenide includes $SiO_x$($1 \leq X \leq 2$), $AlO_x$ ($1 \leq X \leq 1.5$), SiON, SiAlON, etc.; the halogenated metal includes LiF, $MgF_2$, $CaF_2$, a rare earth metal fluoride, etc.; and the metal oxide includes $Cs_2O$, $Li_2O$, MgO, SrO, BaO, CaO, etc.

In addition, in the organic electroluminescent device of the present disclosure, a mixed region of an electron transport compound and a reductive dopant, or a mixed region of a hole transport compound and an oxidative dopant may be placed on at least one surface of a pair of electrodes. In this case, the electron transport compound is reduced to an anion, and thus it becomes easier to inject and transport electrons from the mixed region to an electroluminescent medium. Furthermore, the hole transport compound is oxidized to a cation, and thus it becomes easier to inject and transport holes from the mixed region to the electroluminescent medium. Preferably, the oxidative dopant includes various Lewis acids and acceptor compounds, and the reductive dopant includes alkali metals, alkali metal compounds, alkaline earth metals, rare-earth metals, and mixtures thereof. Also, a reductive dopant layer may be employed as a charge generating layer to prepare an organic electroluminescent device having two or more light-emitting layers and emitting white light.

An organic electroluminescent device according to one embodiment may further include one or more dopants in the light-emitting layer.

The dopant comprised in the organic electroluminescent device of the present disclosure may be at least one phosphorescent or fluorescent dopant, preferably a phosphorescent dopant. The phosphorescent dopant material applied to the organic electroluminescent device of the present disclosure is not particularly limited, but may be preferably a metallated complex compound(s) of a metal atom(s) selected from iridium (Ir), osmium (Os), copper (Cu), and platinum (Pt), more preferably an ortho-metallated complex compound(s) of a metal atom(s) selected from iridium (Ir), osmium (Os), copper (Cu), and platinum (Pt), and even more preferably ortho-metallated iridium complex compound(s).

The dopant comprised in the organic electroluminescent device of the present disclosure may use the compound represented by the following Formula 101, but is not limited thereto.

(101)

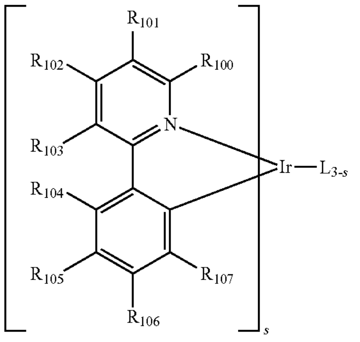

in Formula 101,

L is selected from any one of the following structures 1 to 3;

Structure (1)

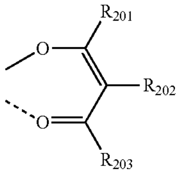

-continued

Structure (2)

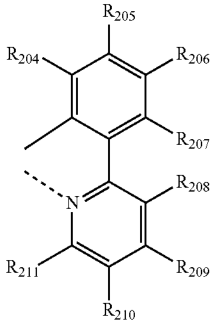

Structure (3)

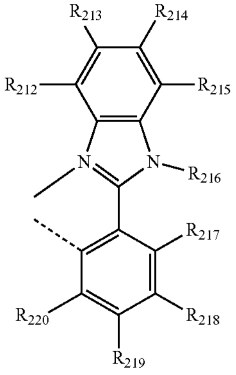

wherein, $R_{100}$ to $R_{103}$ each independently represent, hydrogen, deuterium, halogen, (C1-C30)alkyl unsubstituted or substituted with deuterium and/or halogen, a substituted or unsubstituted (C3-C30)cycloalkyl, a substituted or unsubstituted (C6-C30)aryl, cyano, a substituted or unsubstituted (C3-C30) heteroaryl, or a substituted or unsubstituted (C1-C30)alkoxy; or $R_{100}$ to $R_{103}$ may be linked to the adjacent substituents to form a ring(s), for example, to form a ring(s) with a benzene, e.g., a substituted or unsubstituted quinoline, a substituted or unsubstituted benzofuropyridine, a substituted or unsubstituted benzothienopyridine, a substituted or unsubstituted indenopyridine, a substituted or unsubstituted benzofuroquinoline, a substituted or unsubstituted benzothienoquinoline, or a substituted or unsubstituted indenoquinoline;

$R_{104}$ to $R_{107}$ each independently represent, hydrogen, deuterium, halogen, (C1-C30)alkyl unsubstituted or substituted with deuterium and/or halogen, a substituted or unsubstituted (C3-C30)cycloalkyl, a substituted or unsubstituted (C6-C30)aryl, a substituted or unsubstituted (C3-C30)heteroaryl, cyano, or a substituted or unsubstituted (C1-C30)alkoxy; or $R_{104}$ to $R_{107}$ may be linked to the adjacent substituents to form a substituted or unsubstituted ring(s), for example to form a substituted or unsubstituted ring(s) with a benzene, e.g., a substituted or unsubstituted naphthalene, a substituted or unsubstituted fluorene, a substituted or unsubstituted dibenzothiophene, a substituted or unsubstituted dibenzofuran, a substituted or unsubstituted indenopyridine, a substituted or unsubstituted benzofuropyridine, or a substituted or unsubstituted benzothienopyridine;

$R_{201}$ to $R_{220}$ each independently represent hydrogen, deuterium, halogen, (C1-C30)alkyl unsubstituted or substituted with deuterium and/or halogen, a substituted or unsubstituted (C3-C30)cycloalkyl, or a substituted or unsubstituted (C6-C30)aryl; or $R_{201}$ to $R_{220}$ may be linked to an adjacent substituent(s) to form a substituted or unsubstituted ring(s); and s represents an integer of 1 to 3.

Specifically, the specific examples of the dopant compound include the following, but are not limited thereto.

D-1

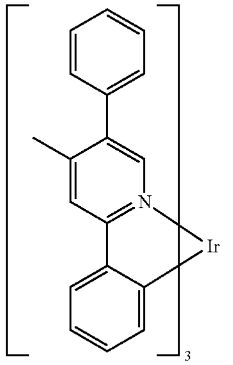

D-2

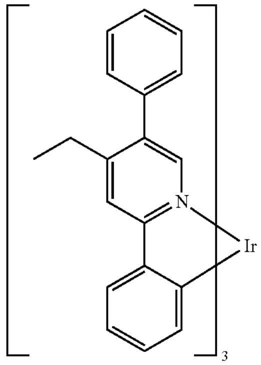

D-3

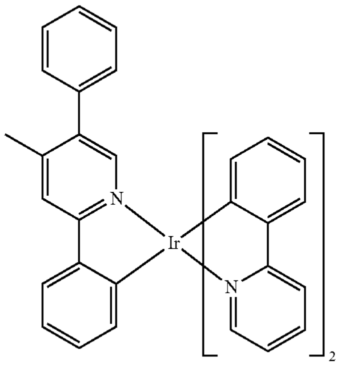

-continued

D-4

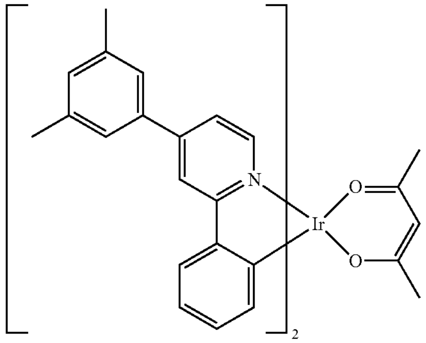

D-5

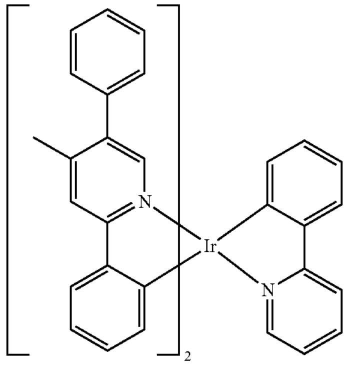

D-6

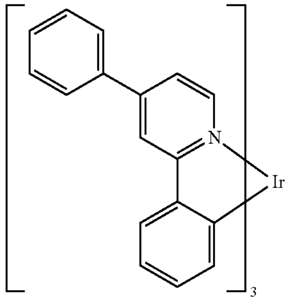

D-7

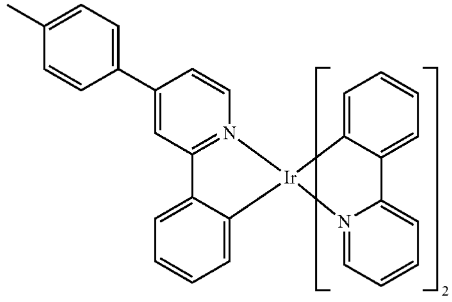

-continued
D-8
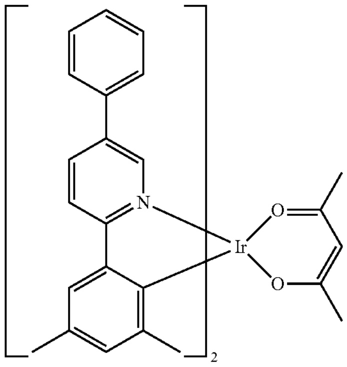
D-9
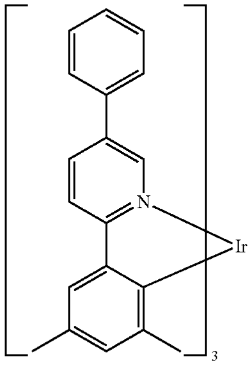
D-10
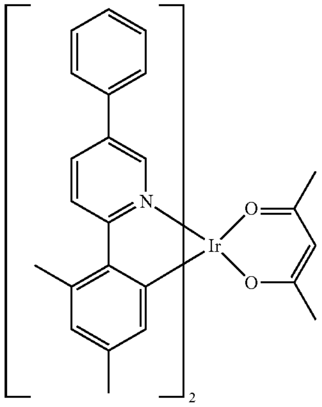
D-11
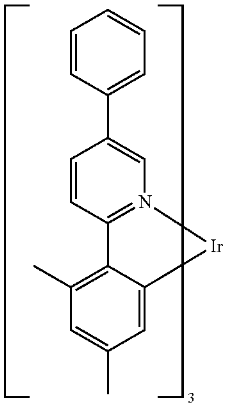
-continued
D-12
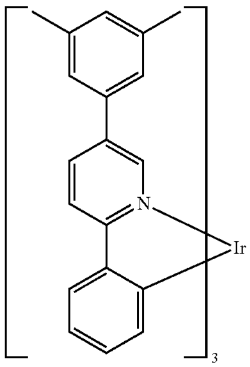
D-13
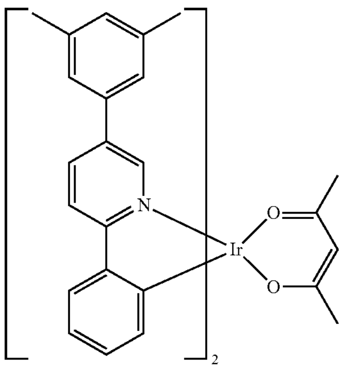
D-14
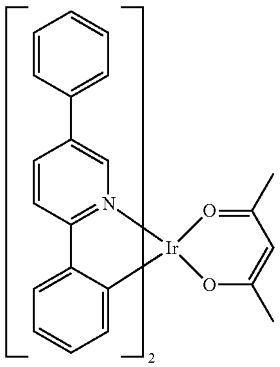
D-15
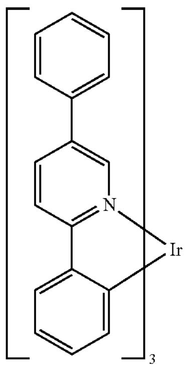

-continued
D-16
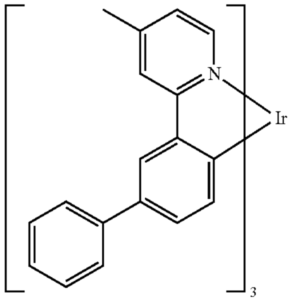
D-17
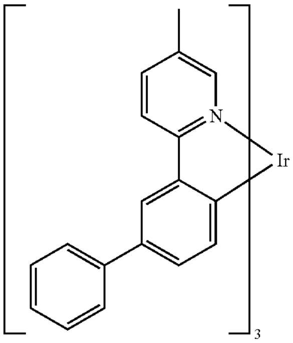
D-18
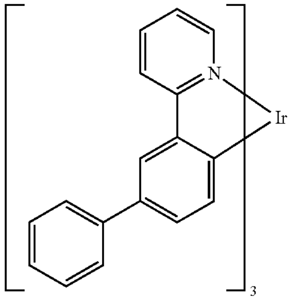
D-19
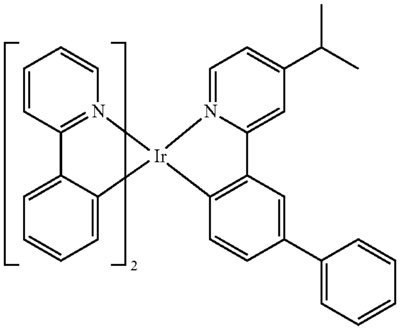
D-20
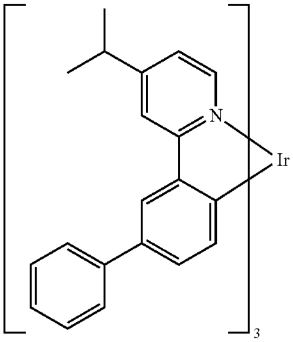
-continued
D-21
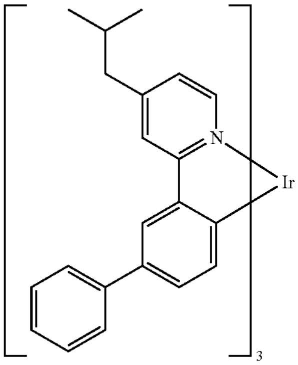
D-22
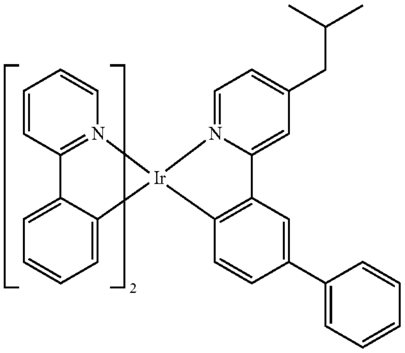
D-23
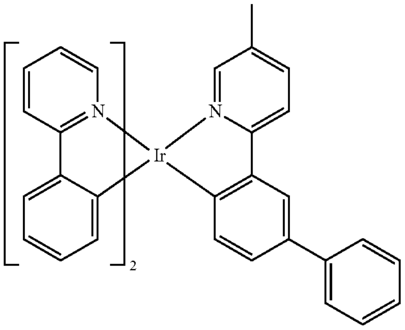
D-24
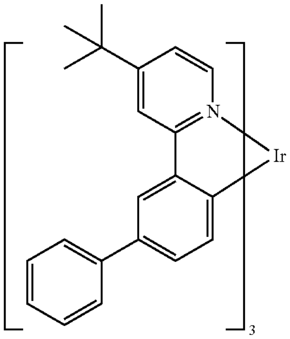

-continued
D-25
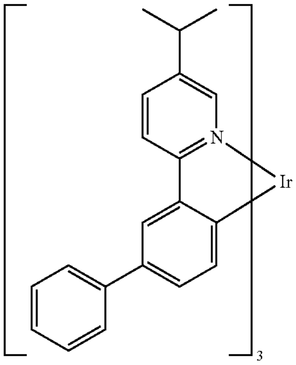
D-26
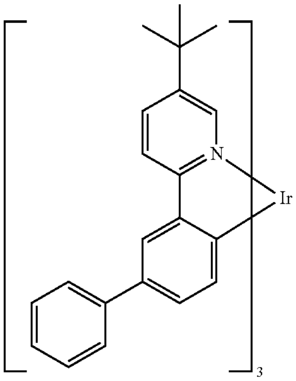
D-27
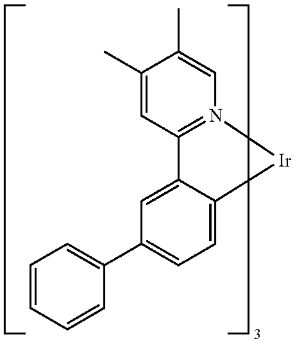
D-28
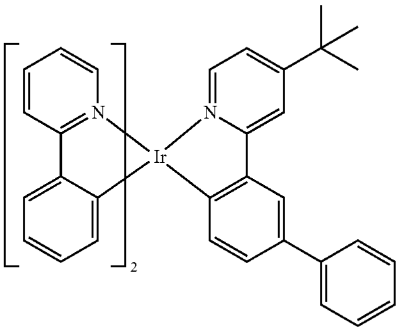
-continued
D-29
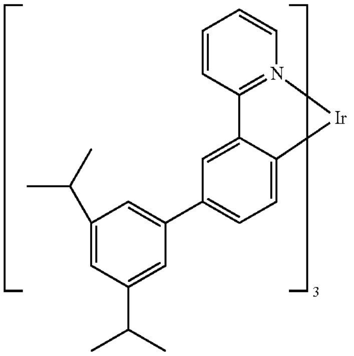
D-30
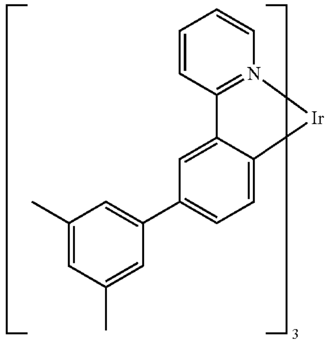
D-31
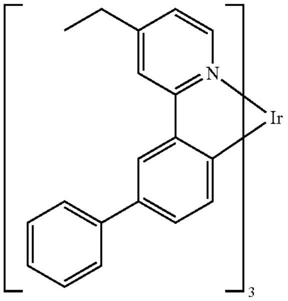
D-32
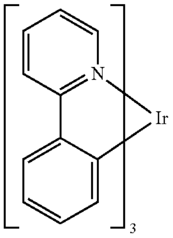
D-33
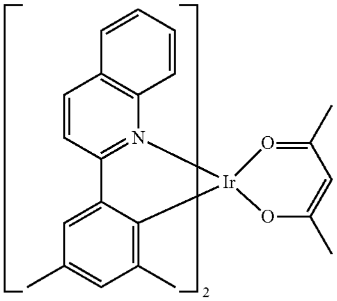

-continued
D-34
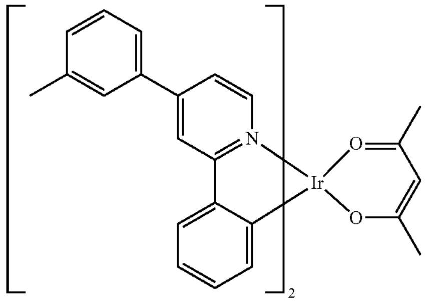
D-35
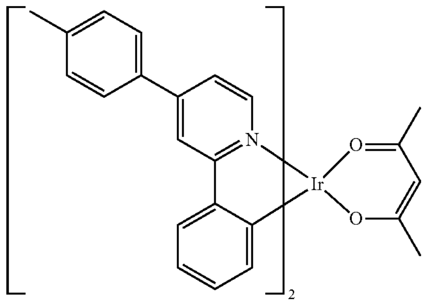
D-36
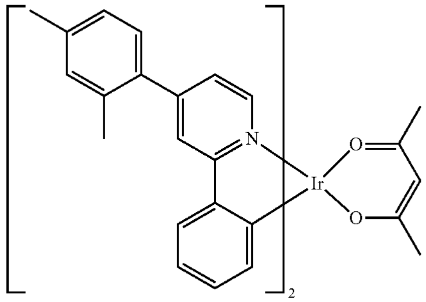
D-37
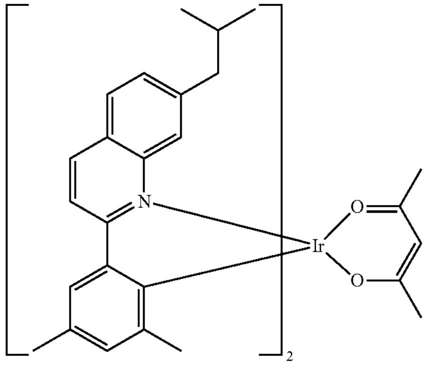
-continued
D-38
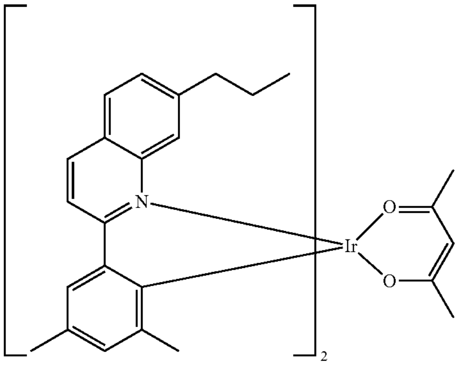
D-39
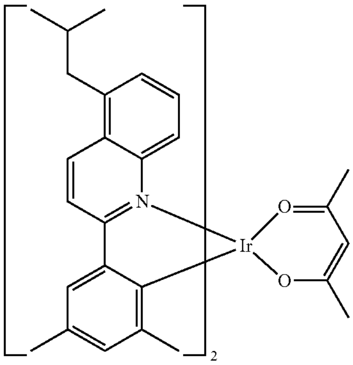
D-40
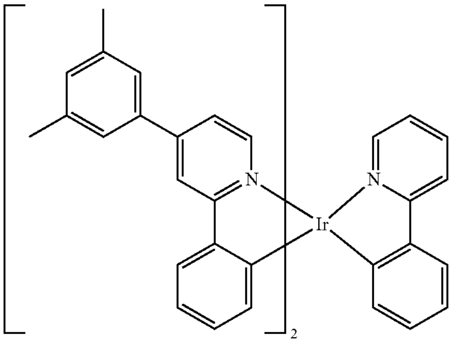
D-41
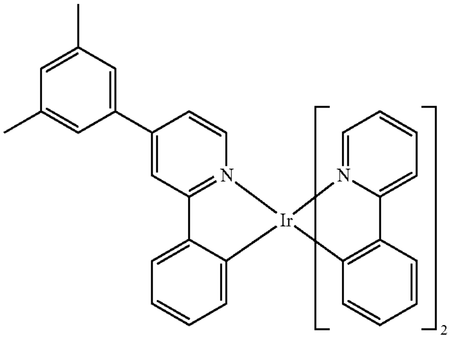

-continued
D-42
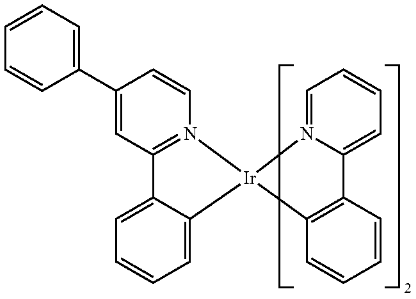
D-43
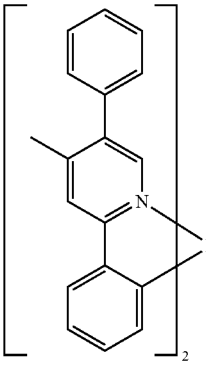
D-44
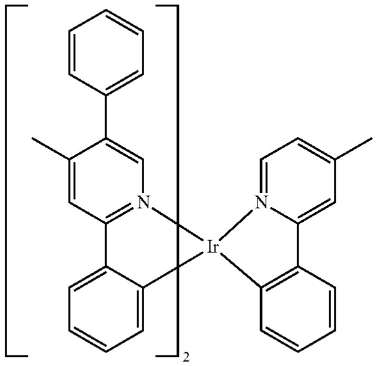
D-45
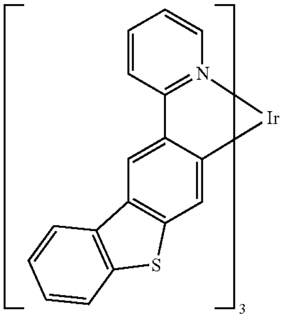
-continued
D-46
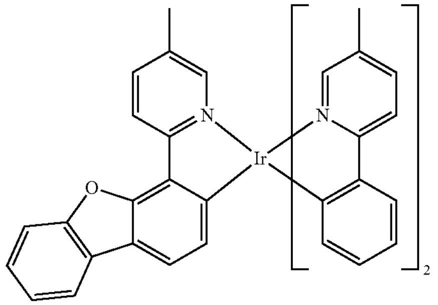
D-47
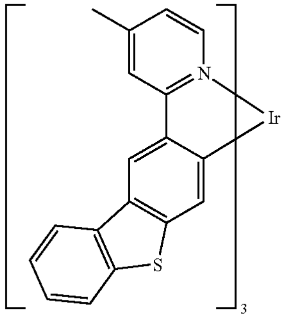
D-48
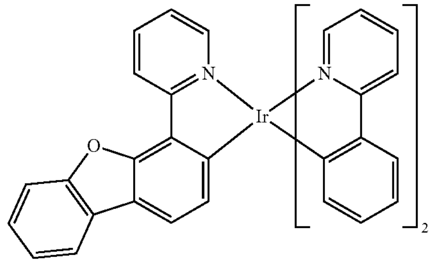
D-49
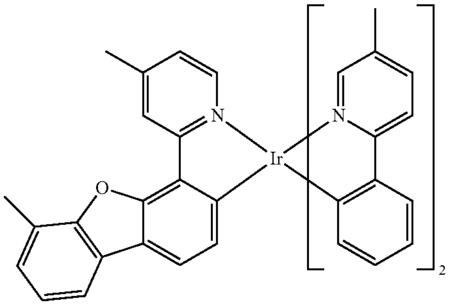
D-50
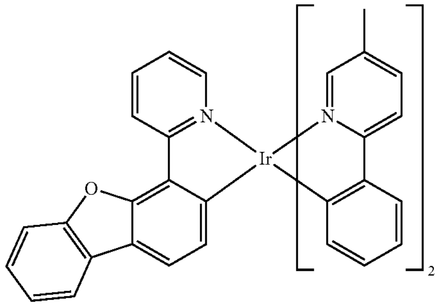

-continued
D-51
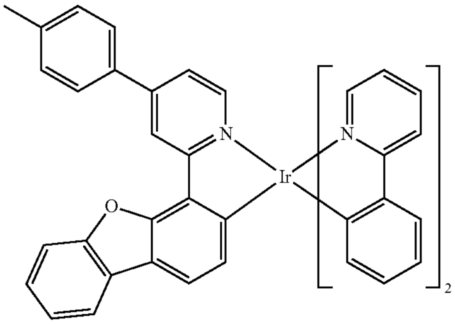
D-52
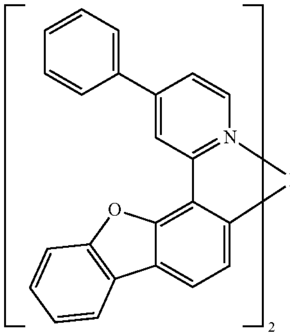
D-53
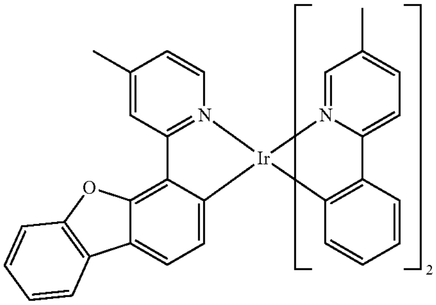
D-54
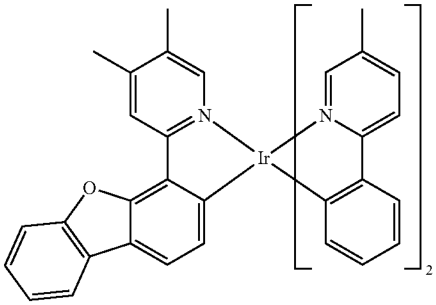
D-55
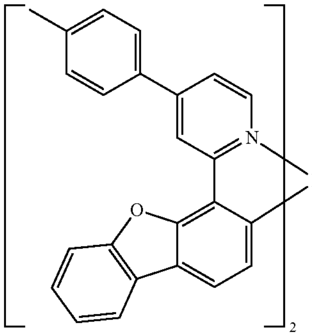
-continued
D-56
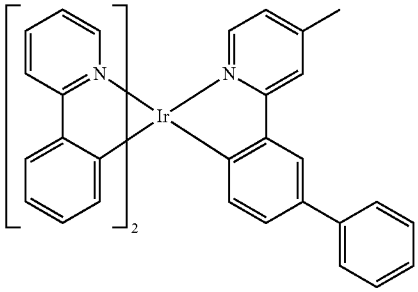
D-57
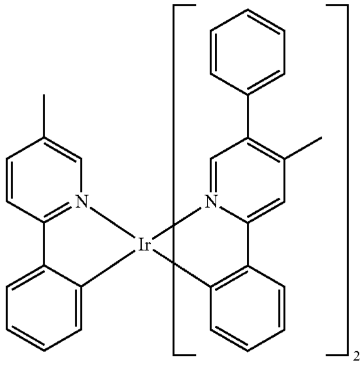
D-58
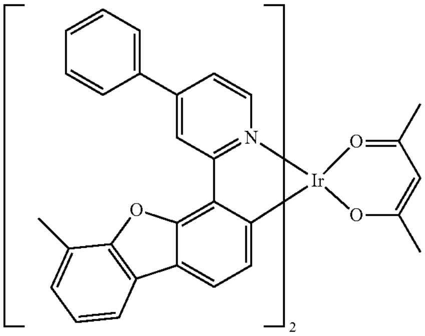
D-59
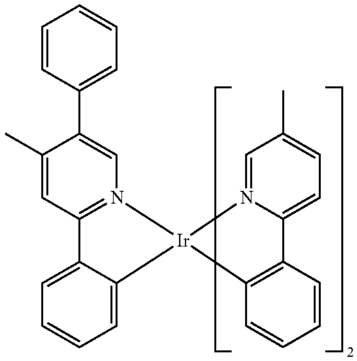

-continued
D-60
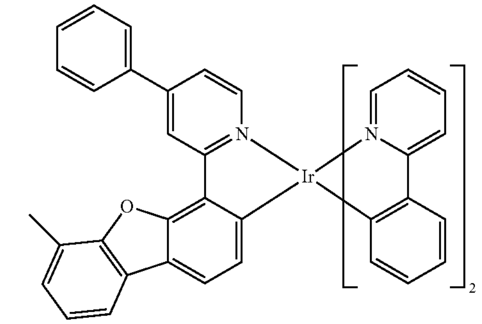
D-61
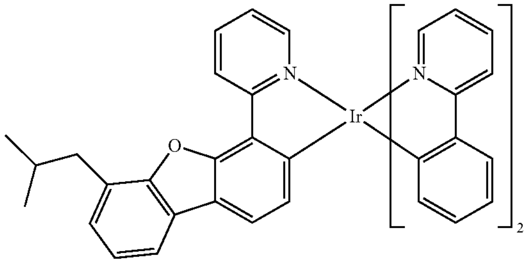
D-62
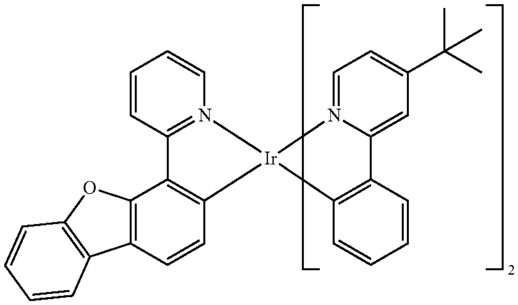
D-63
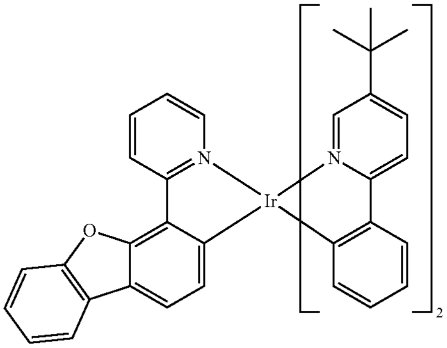
D-64
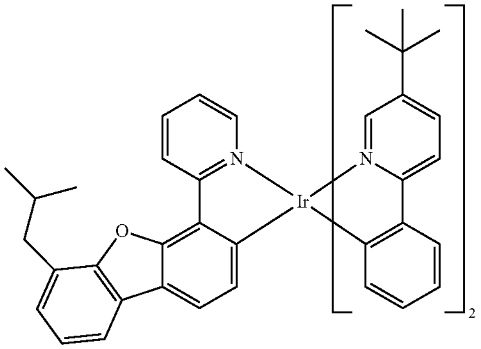
-continued
D-65
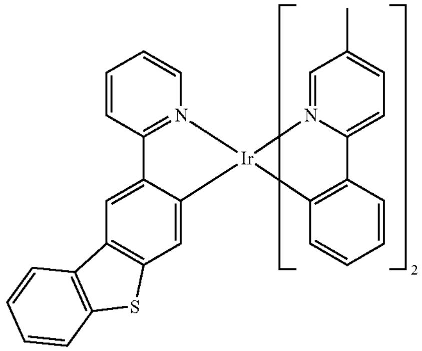
D-66
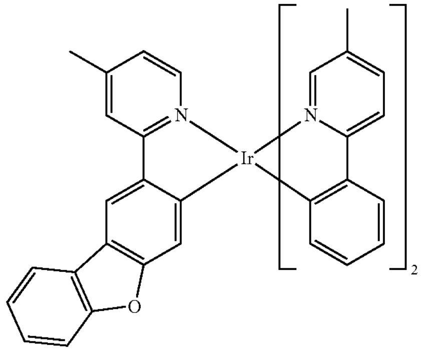
D-67
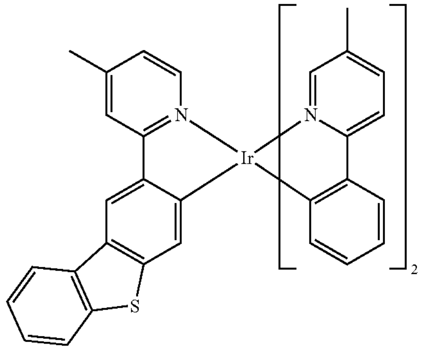
D-68
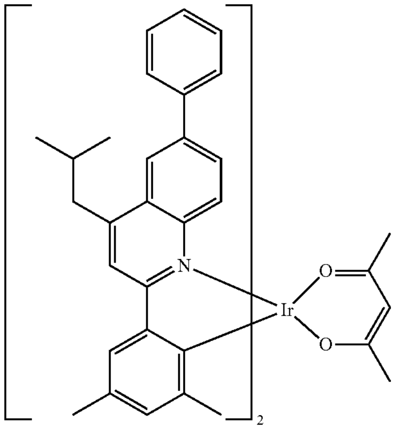

-continued
D-69
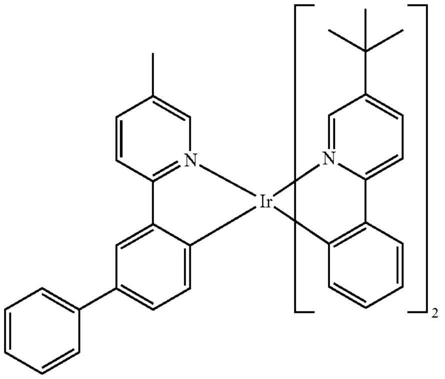
D-70
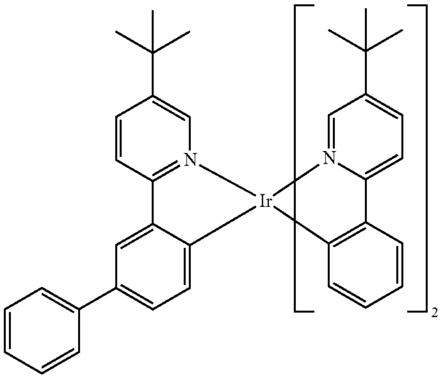
D-71
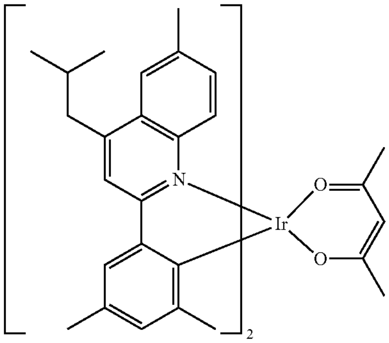
D-72
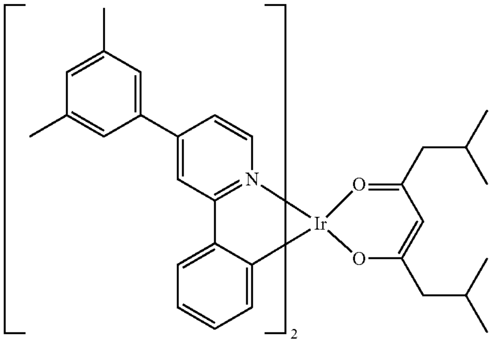
-continued
D-73
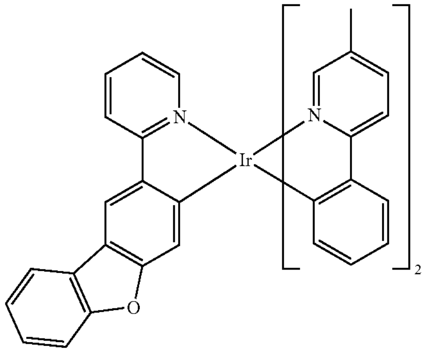
D-74
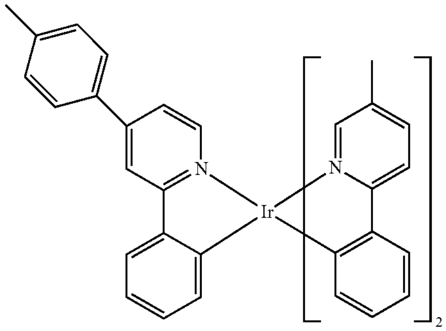
D-75
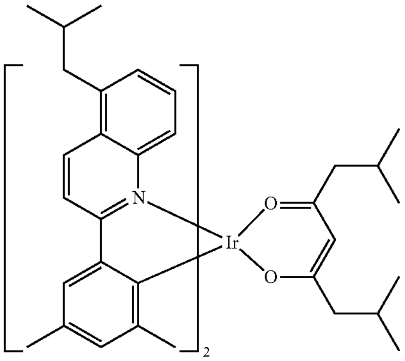
D-76
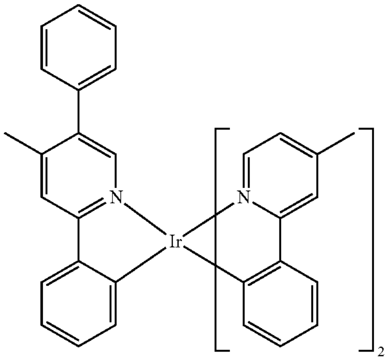

-continued
D-77
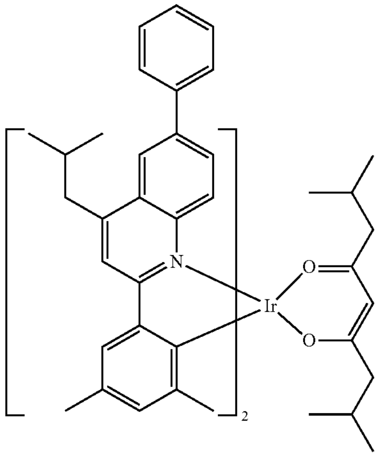
D-78
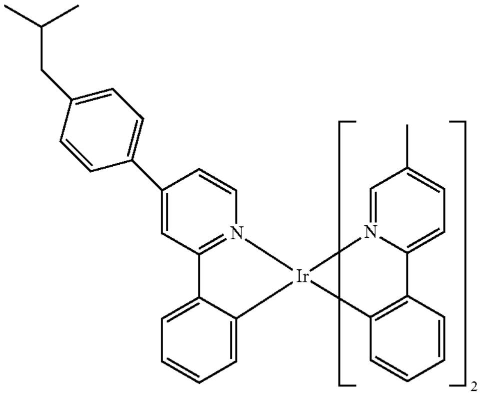
D-79
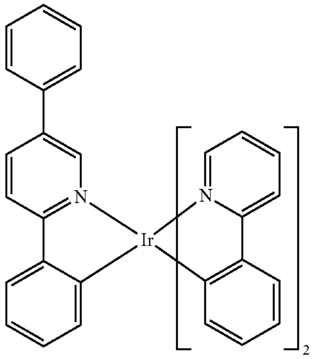
-continued
D-80
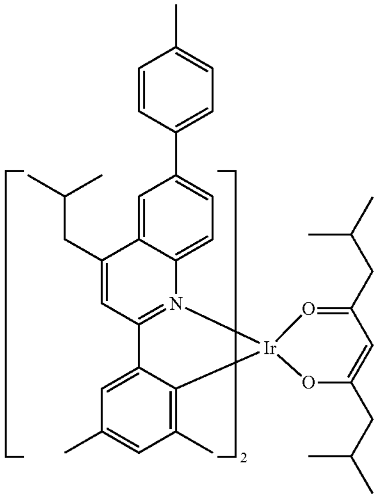
D-81
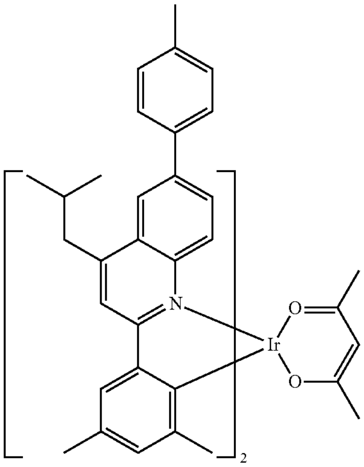
D-82
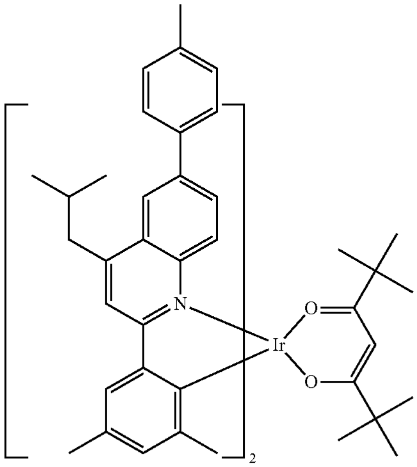

-continued
D-83
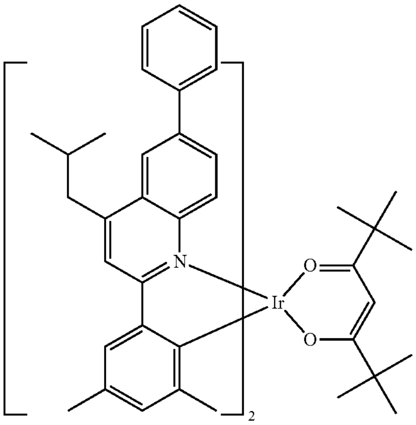
D-84
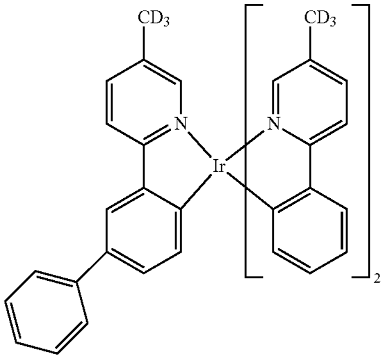
D-85
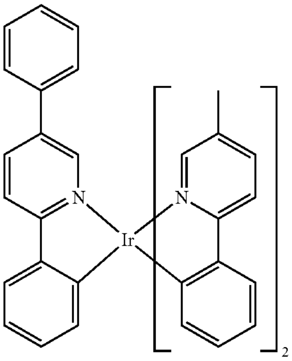
D-86
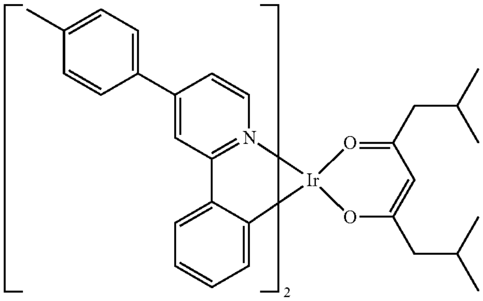
-continued
D-87
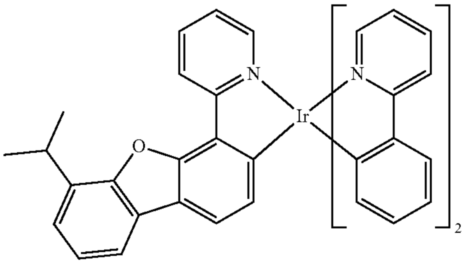
D-88
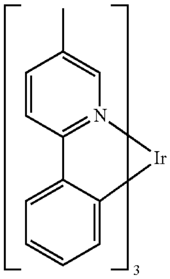
D-89
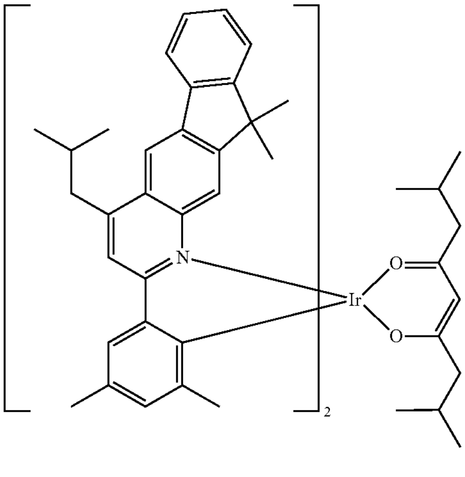
D-90
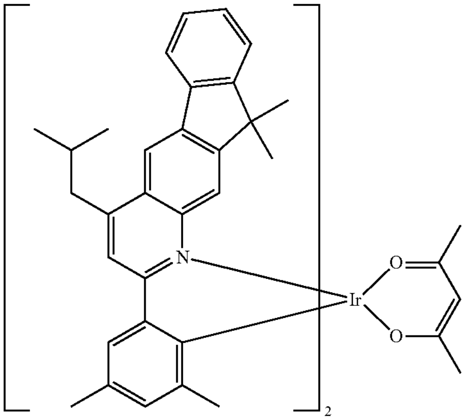

D-91
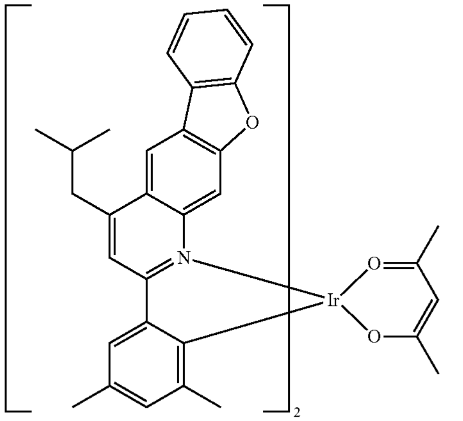
D-92
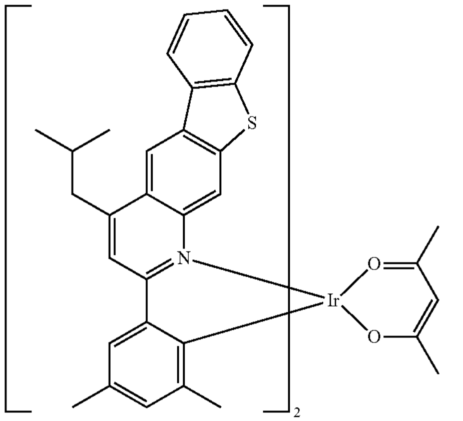
D-93
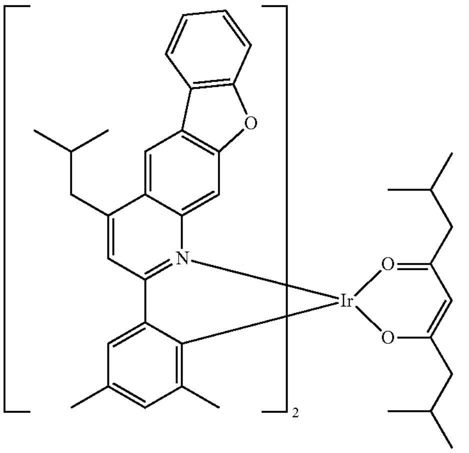
D-94
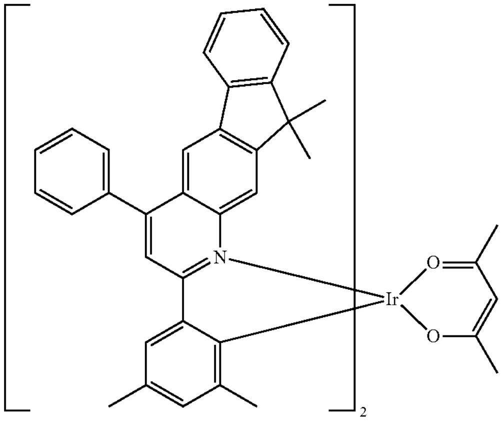
D-95
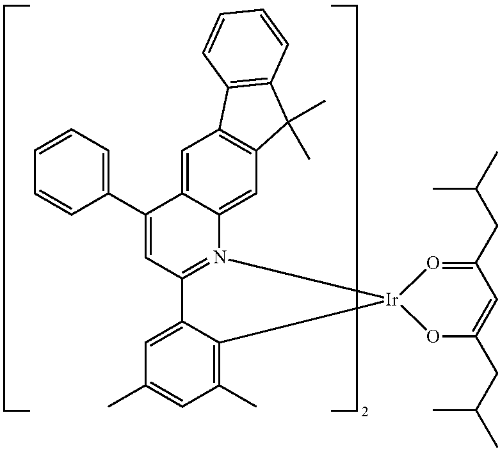
D-96
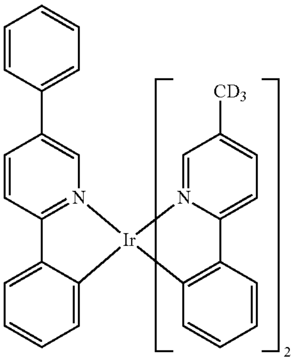
D-97
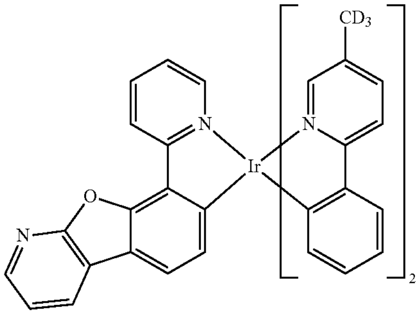

-continued
D-98
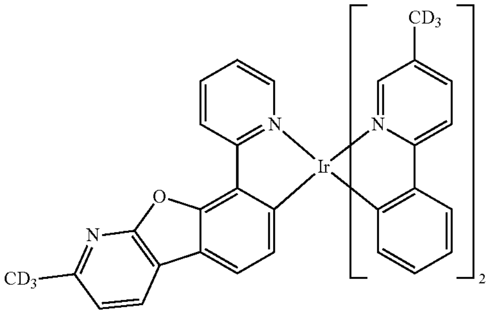
D-99
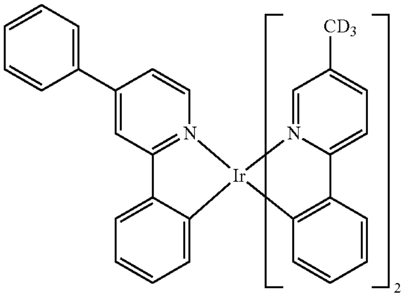
D-100
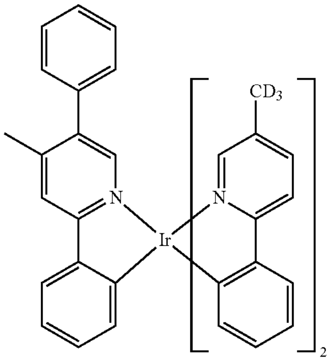
D-101
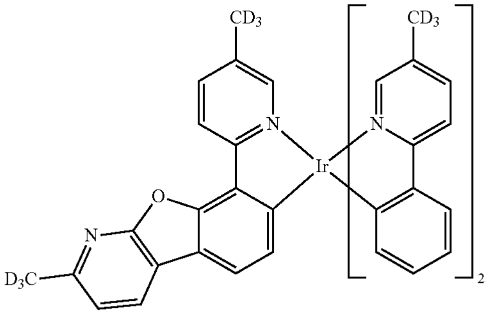
D-102
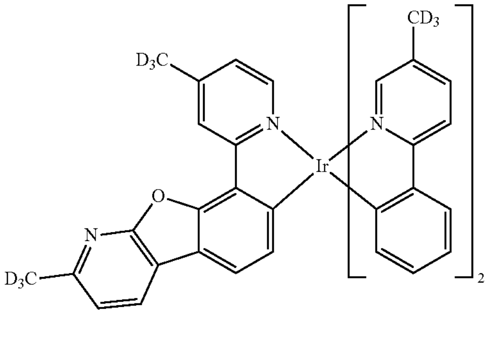
-continued
D-103
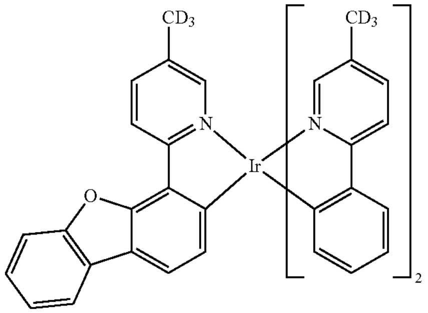
D-104
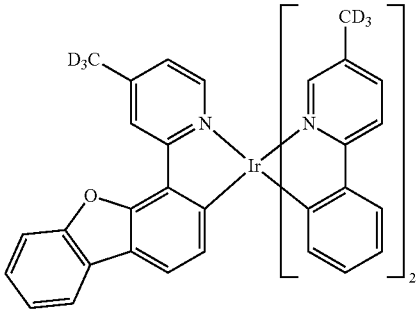
D-105
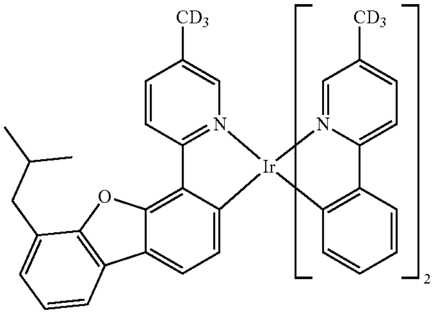
D-106
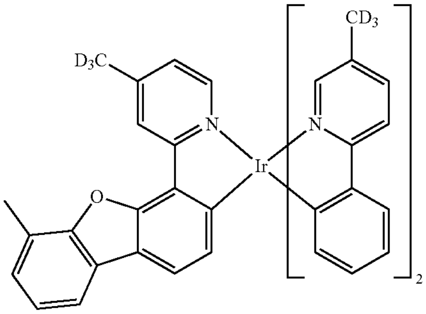
D-107
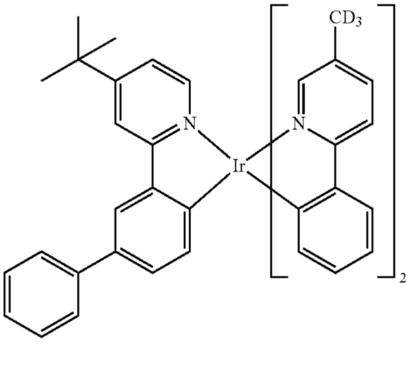

-continued
D-108
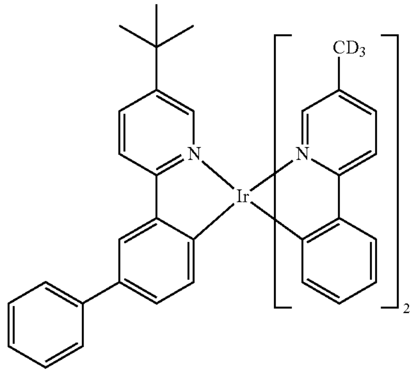
D-109
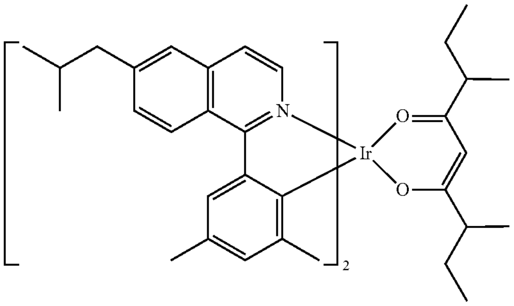
D-110
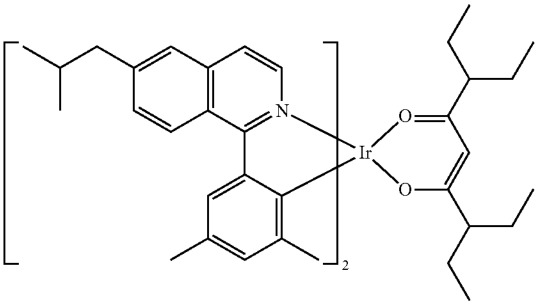
D-111
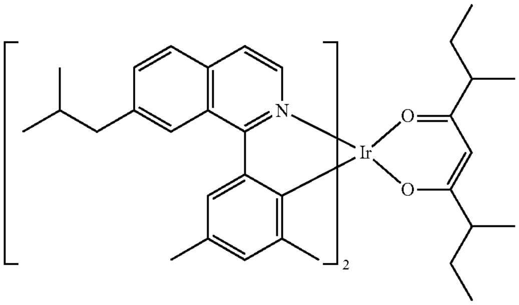
-continued
D-112
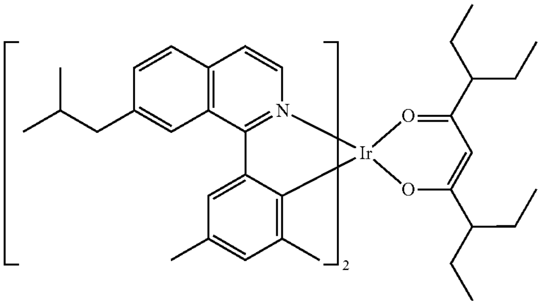
D-113
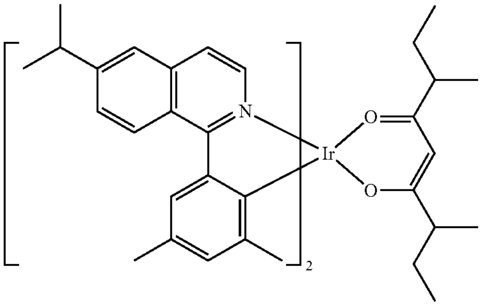
D-114
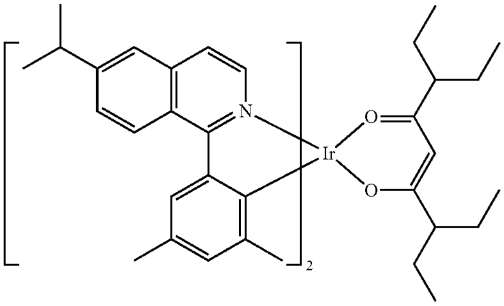
D-115
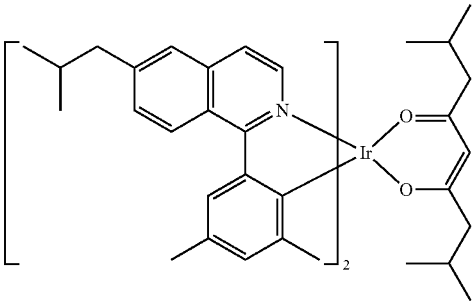
D-116
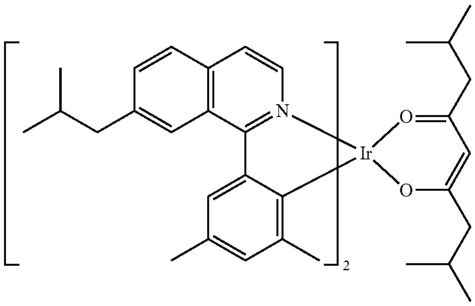

D-117
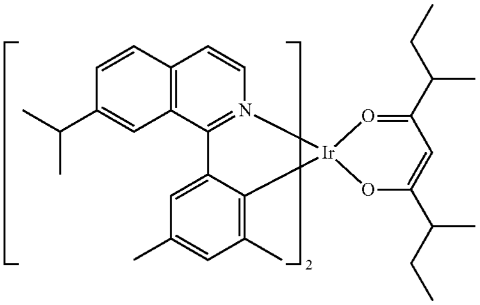
D-118
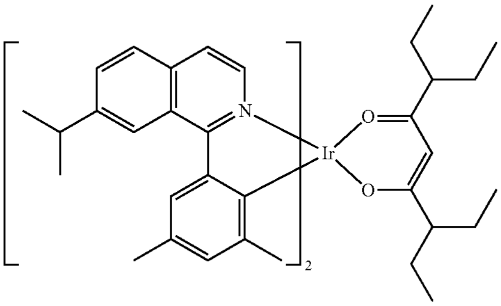
D-119
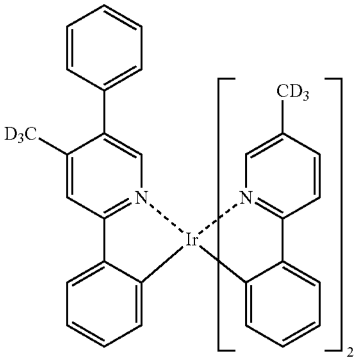
D-120
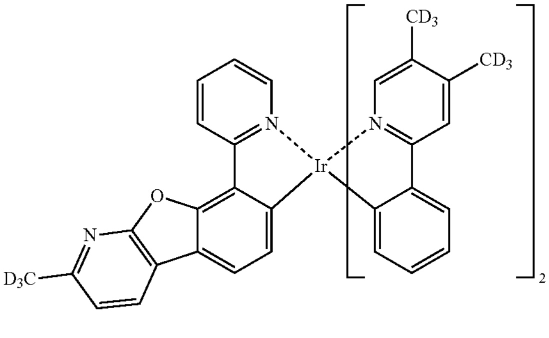
D-121
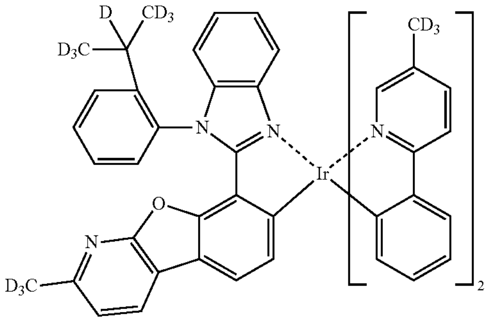
D-122
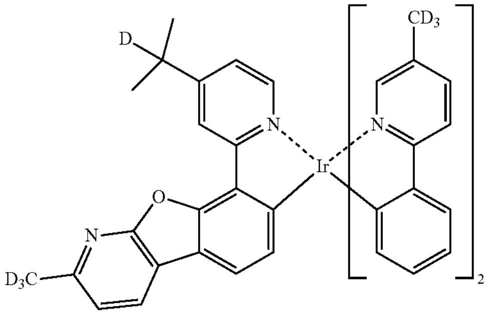
D-123
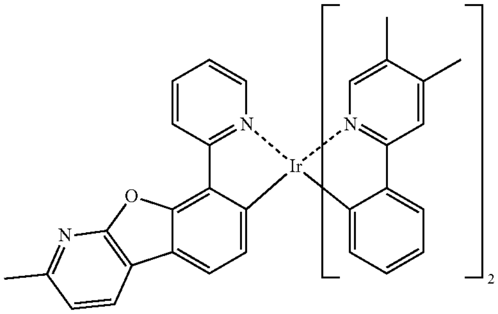
D-124
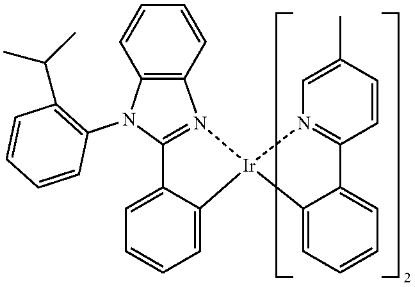
D-125
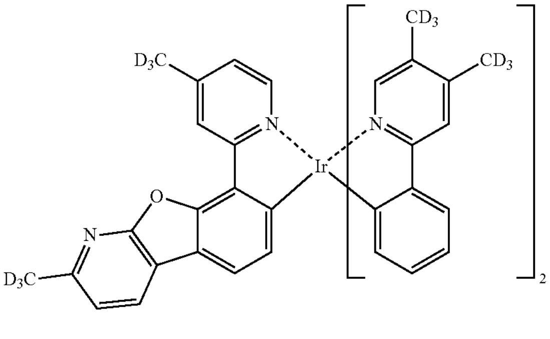

-continued
D-126
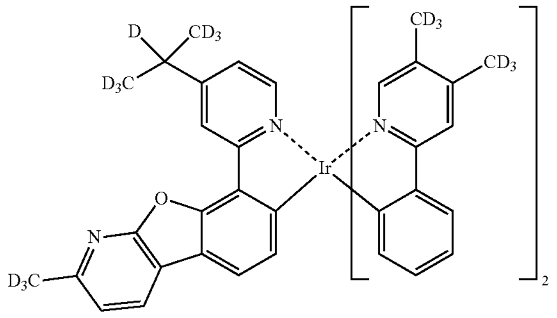
D-127
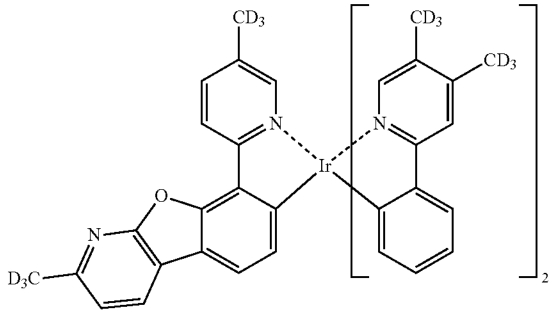
D-128
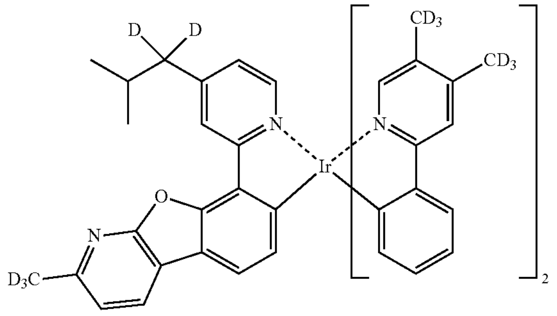
D-129
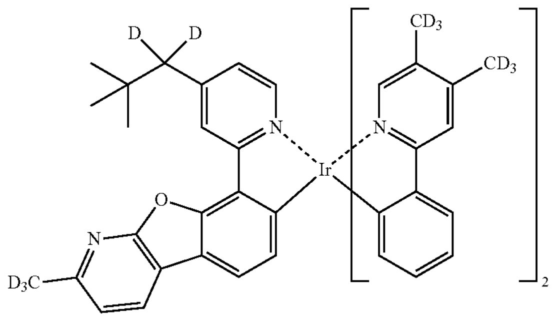
-continued
D-130
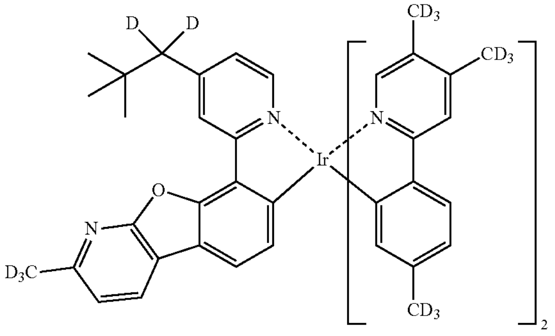
D-131
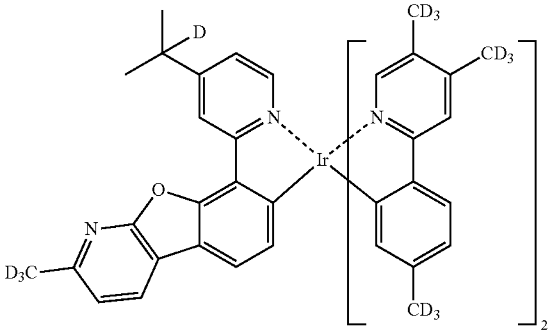
D-132
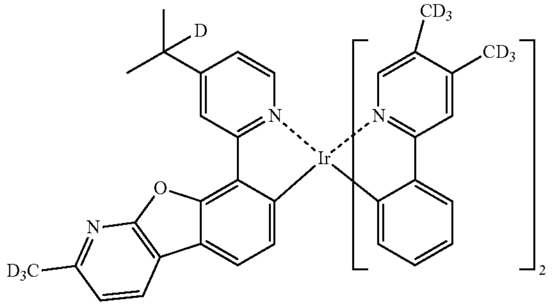
D-133
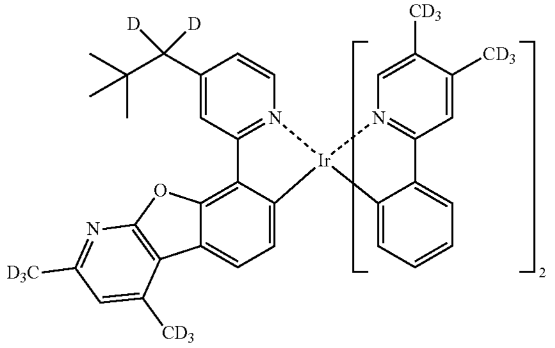

-continued
D-134
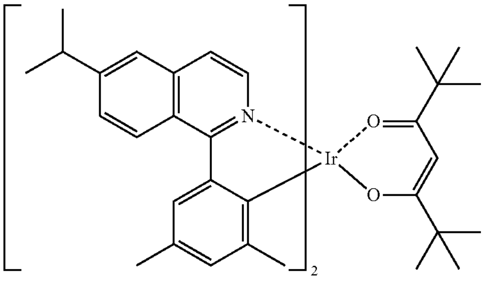
D-135
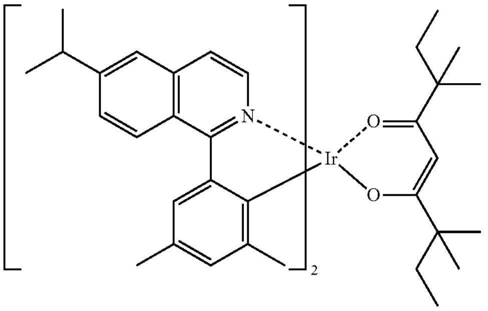
D-136
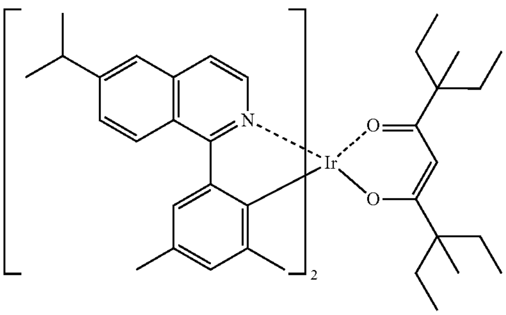
D-137
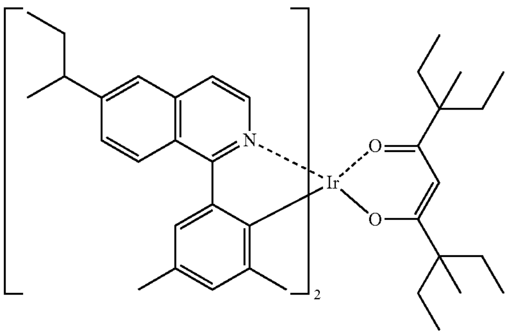
D-138
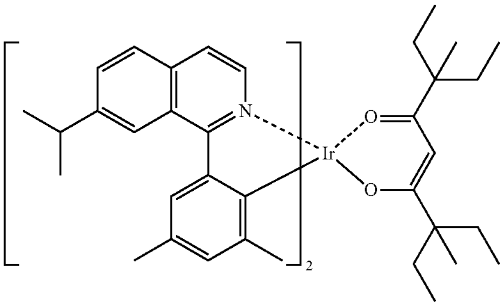
-continued
D-139
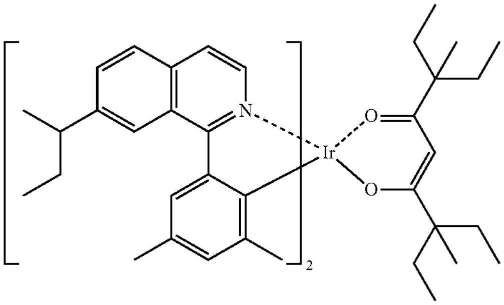
D-140
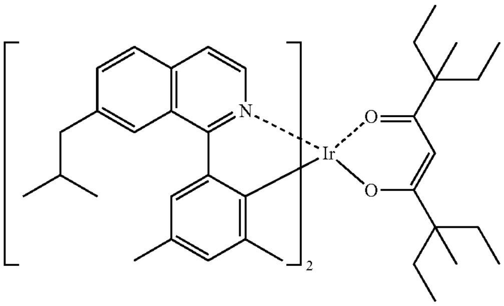
D-141
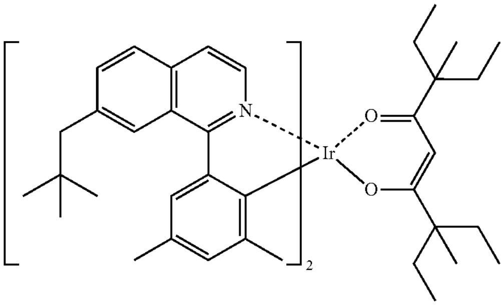
D-142
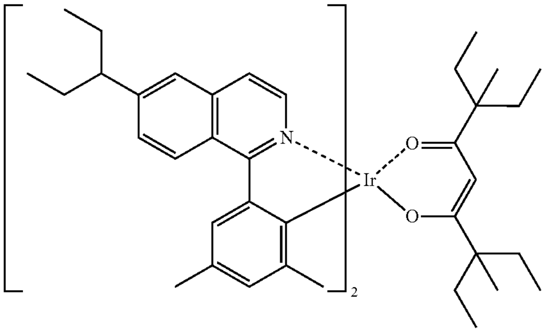

-continued

D-143

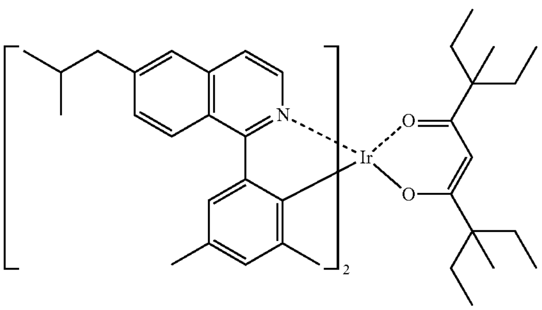

D-144

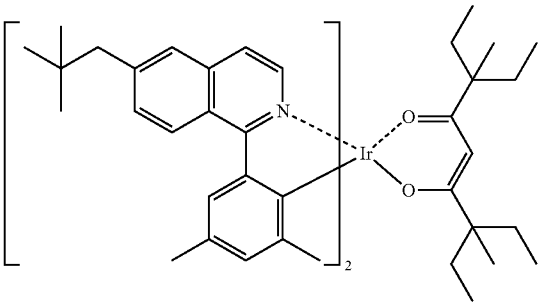

D-145

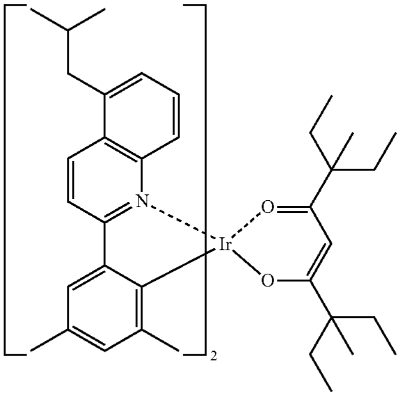

D-146

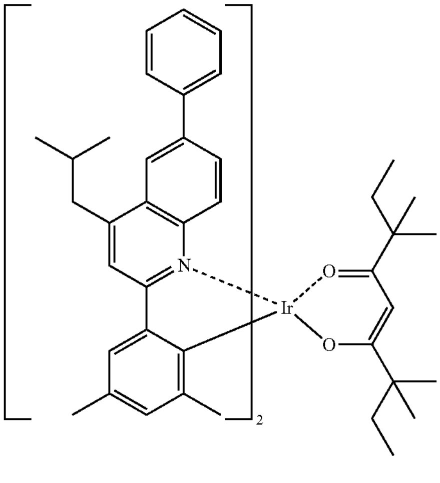

-continued

D-147

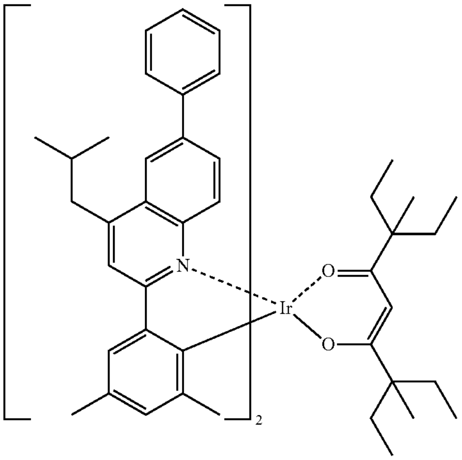

D-148

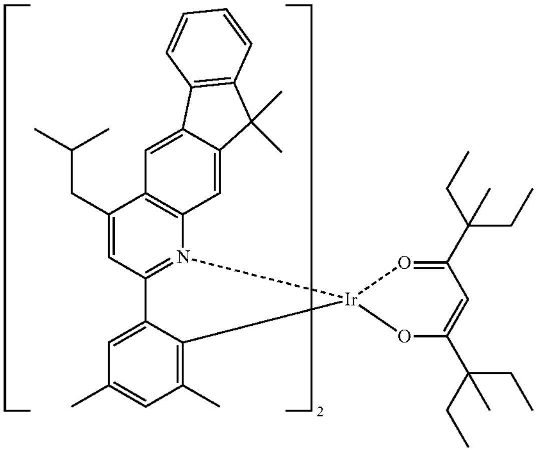

In order to form each layer of the organic electroluminescent device of the present disclosure, dry film-forming methods such as vacuum evaporation, sputtering, plasma, ion plating methods, etc., or wet film-forming methods such as spin coating, dip coating, flow coating methods, etc., can be used. When using a wet film-forming method, a thin film may be formed by dissolving or diffusing materials forming each layer into any suitable solvent such as ethanol, chloroform, tetrahydrofuran, dioxane, etc. The solvent may be any solvent where the materials forming each layer can be dissolved or diffused, and where there are no problems in film-formation capability.

When forming a layer by the first host material and the second host material according to one embodiment, the layer can be formed by the above-listed methods, and can often be formed by co-deposition or mixed-deposition. The co-deposition is a mixed deposition method in which two or more materials are put into respective individual crucible sources and a current is applied to both cells simultaneously to evaporate the materials; and the mixed deposition is a method in which two or more materials are mixed in one crucible source before deposition, and then a current is applied to one cell to evaporate the materials.

According to one embodiment, when the first host material and the second host material exist in the same layer or different layers in the organic electroluminescent device, the layers by the two host compounds may be separately formed. For example, after depositing the first host material, a second host material may be deposited.

According to one embodiment, the present disclosure can provide display devices comprising a plurality of host materials including a first host material represented by the Formula 1 and a second host material represented by the Formula 2. In addition, by using the organic electroluminescent device of the present disclosure, display devices such as smartphones, tablets, notebooks, PCs, TVs, or display devices for vehicles, or lighting devices such as outdoor or indoor lighting can be prepared.

Hereinafter, the preparation method of the host materials according to the present disclosure will be explained with reference to the synthesis method of a representative compound or intermediate compound in order to understand the present disclosure in detail.

[Example 1] Synthesis of Compound H2-15

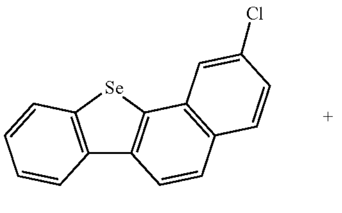

1-1

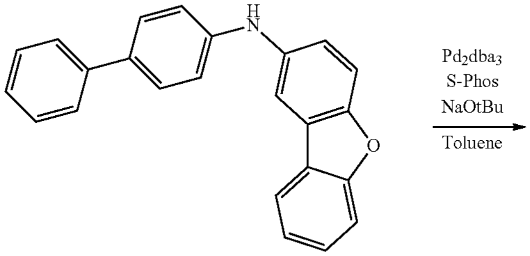

1-2

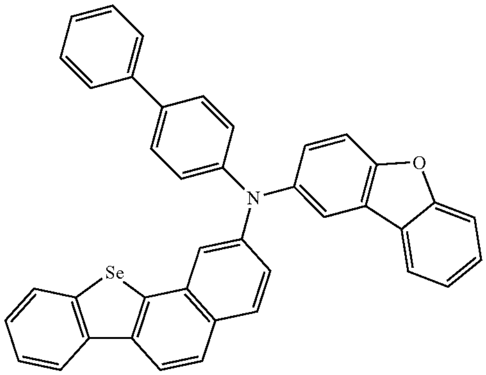

H2-15

Compound 1-1 (5 g, 15.84 mmol), Compound 1-2 (5.3 g, 15.99 mmol), tris(dibenzylideneacetone)dipalladium ($Pd_2dba_3$) (0.72 g, 0.79 mmol), 2-dichlorohexylphosphine-2',6'-dimethoxybiphenyl(S-Phos) (0.65 g, 1.58 mmol), sodium tert-butoxide (NaOtBu) (3.8 g, 39.6 mmol), and 80 mL of toluene were added into a flask, and dissolved, followed by stirring under reflux for 3 hours. After completion of the reaction, the reaction mixture was cooled to room temperature, and filtered through silica followed by dried. Thereafter, it was separated by column chromatography to obtain Compound H2-15 (9.2 g, yield: 95%).

| | MW | M.P |
|---|---|---|
| H2-15 | 614.6 | 351° C. |

[Example 2] Synthesis of Compound H2-23

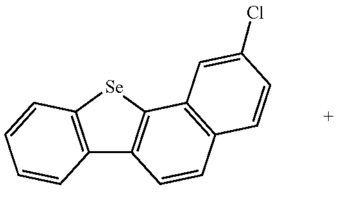

1-1

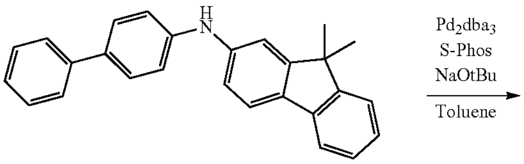

2-1

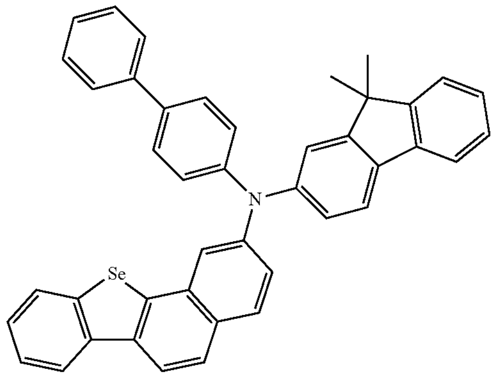

H2-23

Compound 1-1 (5 g, 15.84 mmol), Compound 2-1 (5.8 g, 15.99 mmol), $Pd_2dba_3$ (0.72 g, 0.79 mmol), S-Phos (0.65 g, 1.58 mmol), NaOtBu (3.8 g, 39.6 mmol), and 80 mL of toluene were added into a flask, and dissolved, followed by stirring under reflux for 2 hours. After completion of the reaction, the reaction mixture was cooled to room temperature, and filtered through silica followed by dried. Thereafter, it was separated by column chromatography to obtain Compound H2-23 (9.8 g, yield: 96%).

| | MW | M.P |
|---|---|---|
| H2-23 | 640.7 | 365° C. |

[Example 3] Synthesis of Compound H2-88

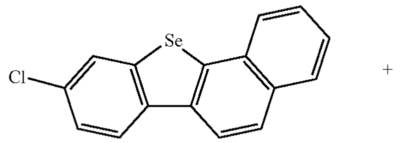

3-1

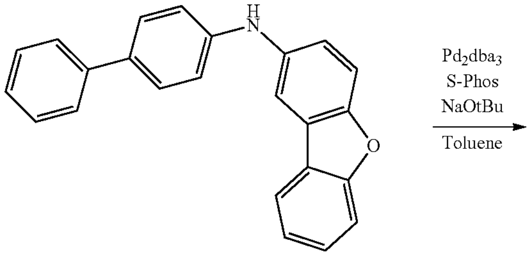

1-2

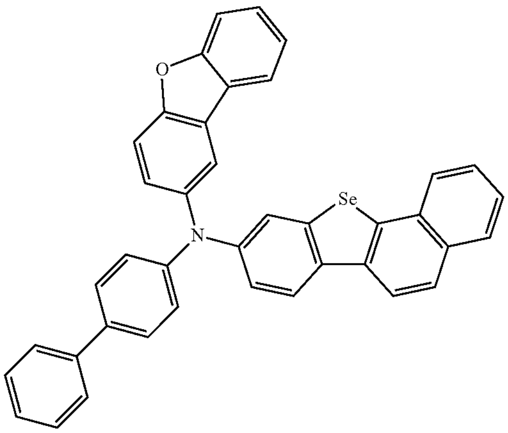

H2-88

Compound 3-1 (5 g, 15.84 mmol), Compound 1-2 (5.3 g, 15.99 mmol), $Pd_2dba_3$ (0.72 g, 0.79 mmol), S-Phos (0.65 g, 1.58 mmol), NaOtBu (3.8 g, 39.6 mmol), and 80 mL of toluene were added into a flask, and dissolved, followed by stirring under reflux for 3 hours. After completion of the reaction, the reaction mixture was cooled to room temperature, and filtered through silica followed by dried. Thereafter, it was separated by column chromatography to obtain Compound H2-88 (8.6 g, yield: 88%).

| | MW | M.P |
|---|---|---|
| H2-88 | 614.6 | 174° C. |

[Example 4] Synthesis of Compound H2-73

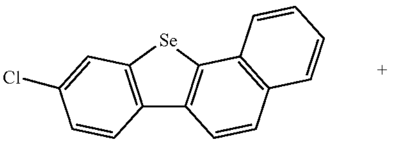

3-1

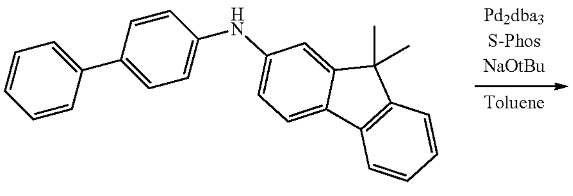

2-1

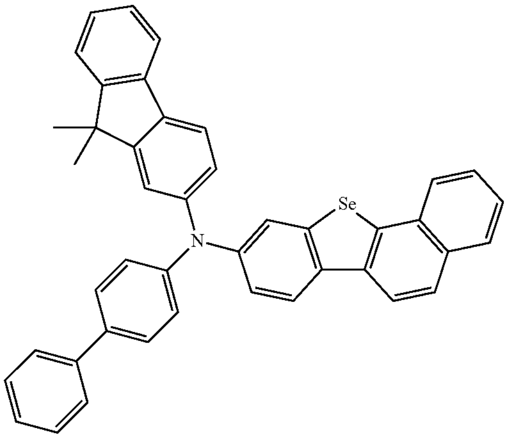

H2-73

Compound 3-1 (5 g, 15.84 mmol), Compound 2-1 (5.8 g, 15.99 mmol), $Pd_2dba_3$ (0.72 g, 0.79 mmol), S-Phos (0.65 g, 1.58 mmol), NaOtBu (3.8 g, 39.6 mmol), and 80 mL of toluene were added into a flask, and dissolved, followed by stirring under reflux for 3 hours. After completion of the reaction, the reaction mixture was cooled to room temperature, and filtered through silica followed by dried. Thereafter, it was separated by column chromatography to obtain Compound H2-73 (8.4 g, yield: 83%).

| | MW | M.P |
|---|---|---|
| H2-73 | 640.7 | 176° C. |

Hereinafter, the preparation method of an organic electroluminescent device comprising a plurality of host materials and/or an organic electroluminescent compound according to the present disclosure, and the device property thereof will be explained, in order to understand the present disclosure in detail.

[Device Examples 1 to 5] Preparation of OLEDs by Co-Depositing the First Host Material and the Second Host Material According to the Present Disclosure OLEDs according to the present disclosure were produced. First, a transparent electrode indium tin oxide (ITO) thin film (10 Ω/sq) on a glass substrate for an OLED (GEOMATEC CO., LTD., Japan) was subjected to an ultrasonic washing with acetone and isopropyl alcohol, sequentially, and thereafter was stored in isopropyl alcohol and then used. Thereafter, the ITO substrate was mounted on a substrate holder of a vacuum vapor deposition apparatus. Then, Compound HI-1 was introduced into a cell of the vacuum vapor deposition apparatus, and Compound HT-1 was introduced into another cell. The two materials were evaporated at different rates and Compound HI-1 was deposited in a doping amount of 3 wt % based on the total amount of the compounds HI-1 and HT-1 to form an injection layer having a thickness of 10 nm. Next, Compound HT-1 was deposited as a first hole transport layer having a thickness of 80 nm on the hole injection layer. Compound HT-2 was then introduced into another cell of the vacuum vapor deposition apparatus and was evaporated by applying an electric current to the cell, thereby forming a second hole transport layer having a thickness of 60 nm on the first hole transport layer. After forming the hole injection layer and the hole transport layers, a light-emitting layer was formed thereon as follows: The first host material and the second host material described in the following Table 1 were introduced into two cells of the vacuum vapor deposition apparatus as hosts, respectively, and Compound D-39 was introduced into another cell as a dopant. The two host materials were evaporated at a rate of 1:1, and the dopant material was evaporated at a different rate, simultaneously and deposited in a doping amount of 3 wt % based on the total amount of the hosts and dopant to form a light-emitting layer having a thickness of 40 nm on the second hole transport layer. Next, compounds ET-1 and EI-1 as electron transport materials were deposited at a weight ratio of 50:50 to form an electron transport layer having a thickness of 35 nm on the light-emitting layer. After depositing Compound EI-1 as an electron injection layer having a thickness of 2 nm on the electron transport layer, an Al cathode having a thickness of 80 nm was deposited on the electron injection layer by another vacuum vapor deposition apparatus. Thus, OLEDs were produced. Each compound used for all the materials were purified by vacuum sublimation under $10^{-6}$ torr.

[Device Comparative Example 1] Preparation of OLED Including Comparative Compounds as Hosts OLED was manufactured in the same manner as in Device Example 1, except that the host compound described in the following Table 1 was used as the second host material of the light-emitting layer.

The driving voltage, luminous efficiency, and the luminous color at a luminance of 1,000 nits and the time taken for luminance to decrease from 100% to 95% at a luminance of 10,000 nits (lifespan: T95) of the OLEDs of Device Examples 1 to 5 and Device Comparative Example 1 produced as described above, are measured, and the results thereof are shown in the following Table 1.

TABLE 1

| | First Host Material | Second Host Material | Driving Voltage (V) | Luminous Efficiency (cd/A) | Luminous Color | Lifespan (T95, hr) |
|---|---|---|---|---|---|---|
| Device Example 1 | H1-382 | H2-15 | 3.2 | 35.5 | Red | 344 |
| Device Example 2 | H1-382 | H2-23 | 3.2 | 34.9 | Red | 172 |
| Device Example 3 | H1-382 | H2-73 | 3.0 | 34.2 | Red | 514 |
| Device Example 4 | H1-382 | H2-88 | 3.2 | 34.5 | Red | 124 |
| Device Example 5 | H1-382 | H2-131 | 3.2 | 35.2 | Red | 295 |
| Device Comparative Example 1 | H1-382 | C1 | 3.6 | 29.6 | Red | 107 |

From the results shown in Table 1 above, it can be confirmed that an organic electroluminescent device using an organic electroluminescent compound according to the present invention as a plurality of host material, shows low driving voltage and high luminous efficiency, and long lifespan characteristics compared to an organic electroluminescent device using a conventional host compound.

The compounds used in Device Examples 1 to 5 and Device Comparative Example 1 are specifically shown in the following Table 2.

TABLE 2
| | |
|---|---|
| Hole Injection Layer/ Hole Transport Layer | 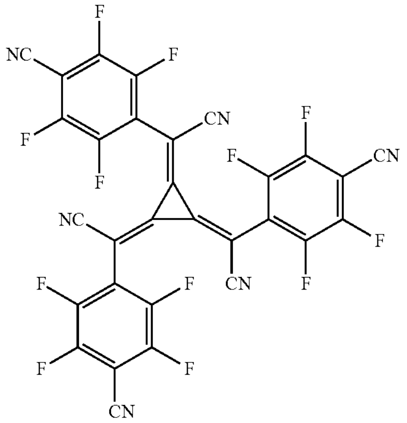 HI-1 |
| | 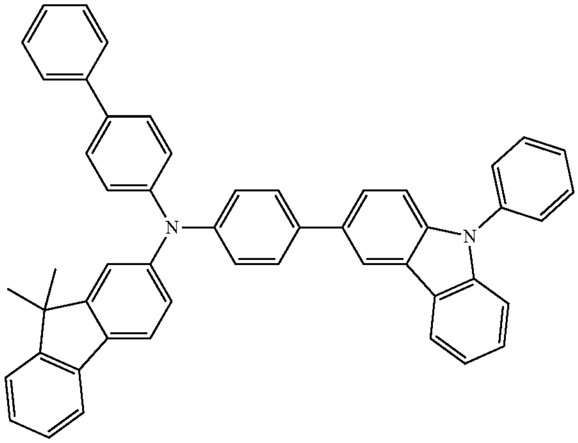 HT-1 |
| | 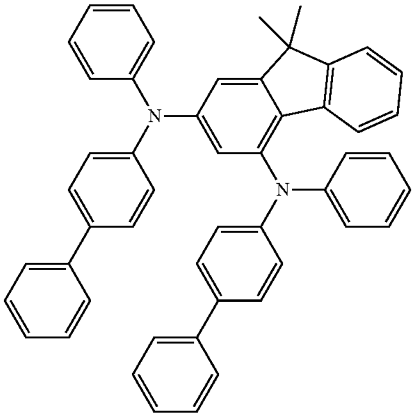 HT-2 |

TABLE 2-continued
Light-Emitting Layer
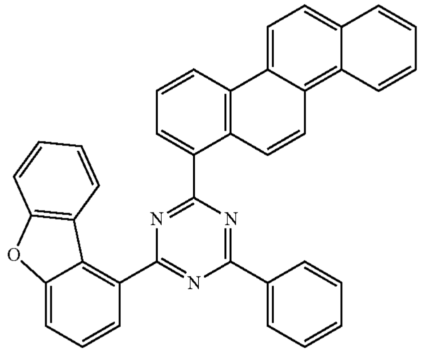
H1-382
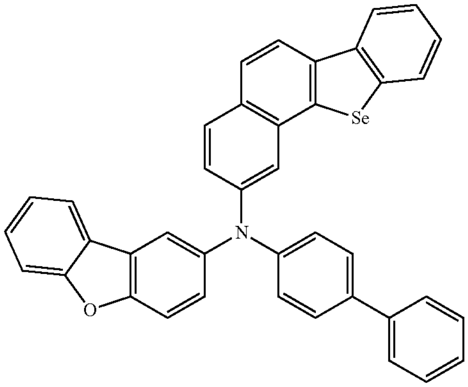
H2-15
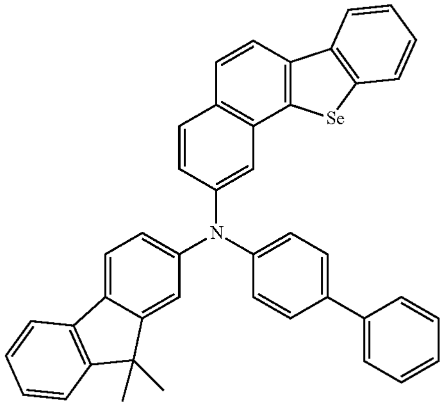
H2-23

TABLE 2-continued
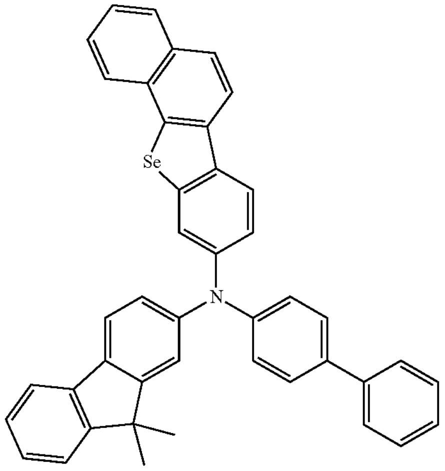
H2-73
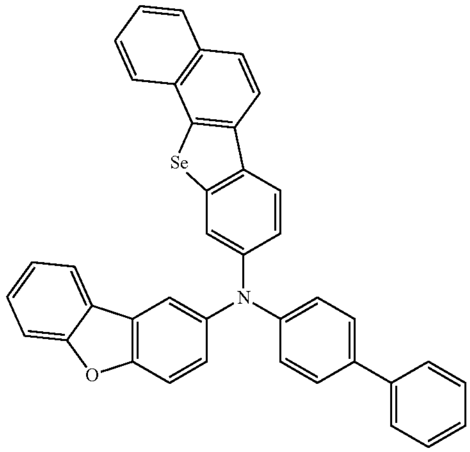
H2-88
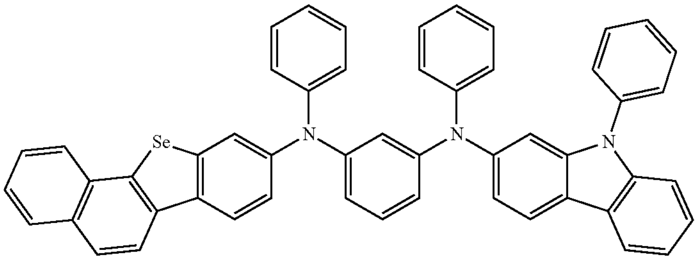
H2-131

TABLE 2-continued
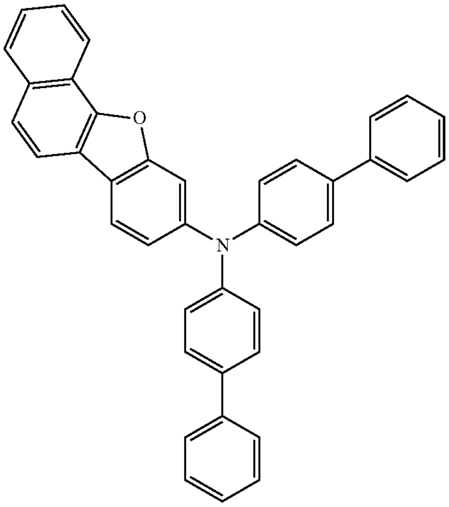
C1
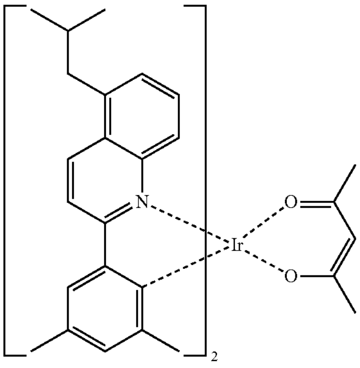
D-39
Electron Transport Layer/ Electron Injection Layer
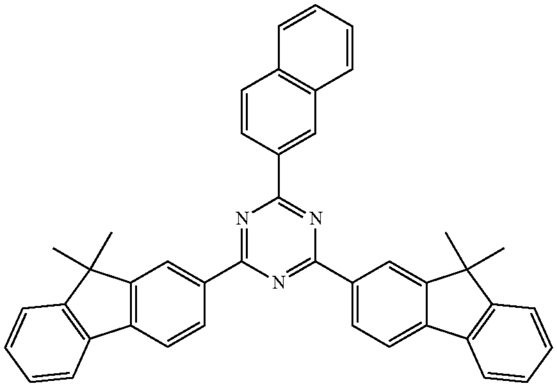
ET-1
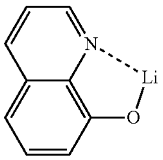
EI-1

[Device Examples 6 to 10] Preparing OLEDs by Depositing the Compound According to the Present Disclosure as a Hole Transport Material OLEDs according to the present disclosure were produced. First, a transparent electrode indium tin oxide (ITO) thin film (10 Ω/sq) on a glass substrate for an OLED (GEOMATEC CO., LTD., Japan) was subjected to an ultrasonic washing with acetone and isopropyl alcohol, sequentially, and thereafter was stored in isopropyl alcohol and then used. Thereafter, the ITO substrate was mounted on a substrate holder of a vacuum vapor deposition apparatus. Then, Compound HI-1 was introduced into a cell of the vacuum vapor deposition apparatus, and Compound HT-3 was introduced into another cell. The two materials were evaporated at different rates and Compound HI-1 was deposited in a doping amount of 3 wt % based on the total amount of the compounds HI-1 and HT-3 to form an injection layer having a thickness of 10 nm. Next, Compound HT-3 was deposited as a first hole transport layer having a thickness of 80 nm on the hole injection layer. Next, compound described in the following Table 3 as materials for a second hole transport layer was then introduced into another cell of the vacuum vapor deposition apparatus and was evaporated by applying an electric current to the cell, thereby forming a second hole transport layer having a thickness of 60 nm on the first hole transport layer. After forming the hole injection layer and the hole transport layers, a light-emitting layer was formed thereon as follows: Compounds H1-382 and B1 as host materials were introduced into two cells of the vacuum vapor deposition apparatus as hosts, respectively, and Compound D-39 was introduced into another cell as a dopant. The two host materials were evaporated at a rate of 1:1, and the dopant material was evaporated at a different rate, simultaneously and deposited in a doping amount of 3 wt % based on the total amount of the hosts and dopant to form a light-emitting layer having a thickness of 40 nm on the second hole transport layer. Next, Compound HBL was deposited to a thickness of 5 nm as an electron buffer layer on the light emitting layer, and then compounds ET-2 and EI-1 as electron transport materials were deposited at a weight ratio of 50:50 to form an electron transport layer having a thickness of 30 nm thereon. After depositing Compound EI-1 as an electron injection layer having a thickness of 2 nm on the electron transport layer, an Al cathode having a thickness of 80 nm was deposited on the electron injection layer by another vacuum vapor deposition apparatus. Thus, OLEDs were produced. Each compound used for all the materials were purified by vacuum sublimation under $10^{-6}$ torr.

[Device Comparative Examples 2 and 3] Preparation of OLEDs Including Comparative Compounds as Hole Transport Material OLEDs were manufactured in the same manner as in Device Example 6, except for using the compounds in Table 3 below as a material for the second hole transport layer.

The driving voltage, power efficiency, and the luminous color at a luminance of 1,000 nits and the time taken for luminance to decrease from 100% to 95% at a luminance of 10,000 nits (lifespan: T95) of the OLEDs of Device Examples 6 to 9 and Device Comparative Examples 2 and 3 produced as described above, are measured, and the results thereof are shown in the following Table 3.

TABLE 3

| | Second hole transport layer material | Driving Voltage (V) | Power Efficiency (lm/W) | Luminous Color | Lifespan (T95, hr) |
|---|---|---|---|---|---|
| Device Example 6 | H2-15 | 4.1 | 22.2 | Red | 156 |
| Device Example 7 | H2-88 | 3.2 | 27.2 | Red | 194 |
| Device Example 8 | H2-23 | 3.3 | 28.1 | Red | 110 |
| Device Example 9 | H2-73 | 2.8 | 30.9 | Red | 124 |
| Device Comparative Example 2 | C2 | 4.3 | 19.5 | Red | 93.8 |
| Device Comparative Example 3 | C1 | 5.3 | 17.3 | Red | 85.2 |

From the results shown in Table 3 above, it can be confirmed that an organic electroluminescent device using an organic electroluminescent compound according to the present invention as a hole transport layer material, shows low driving voltage and high power efficiency, and significantly improved long lifespan characteristics, compared to an organic electroluminescent devices that include a conventional organic electroluminescent compound as hole transport layer materials.

The compounds used in Device Examples 6 to 9 and Device Comparative Examples 2 and 3 are specifically shown in the following Table 4.

TABLE 4
| | |
|---|---|
| Hole Injection Layer/ Hole Transport Layer | 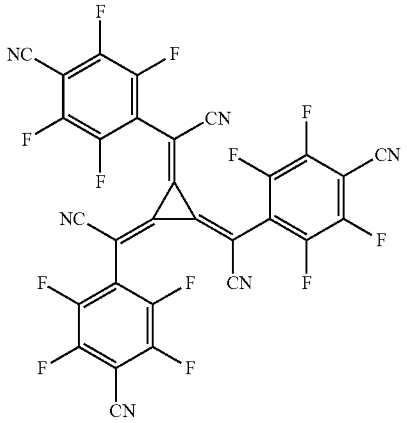 HI-1 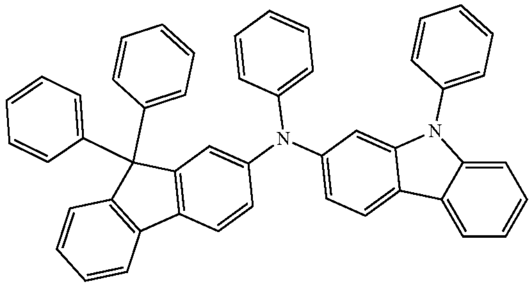 HT-3 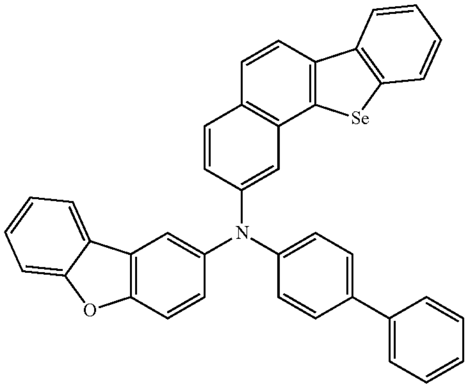 H2-15 |

TABLE 4-continued
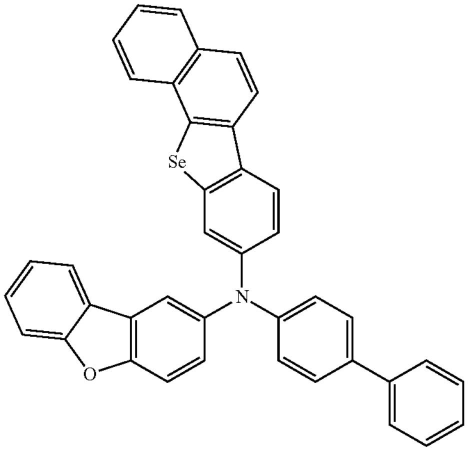
H2-88
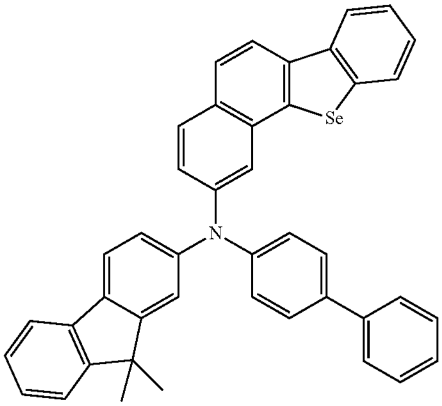
H2-23
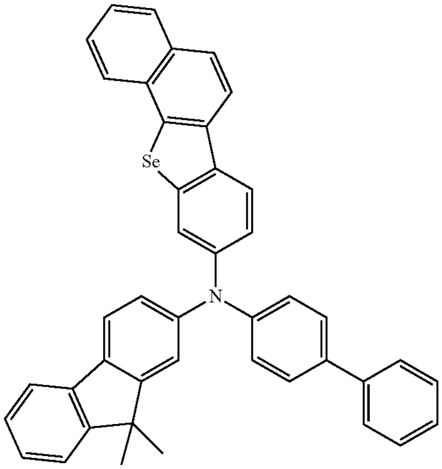
H2-73

TABLE 4-continued
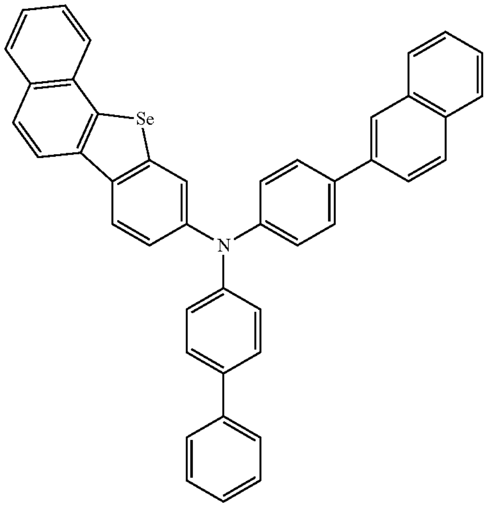
C2
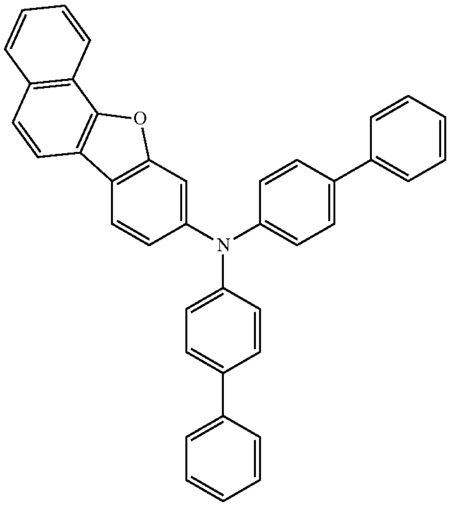
C1
Light-Emitting Layer/ Electron Buffer Layer
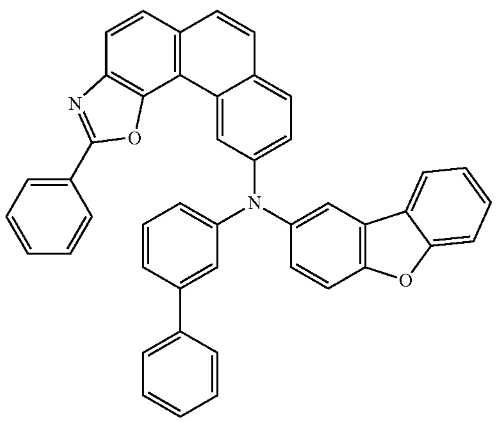
B1

TABLE 4-continued
| | |
|---|---|
| | 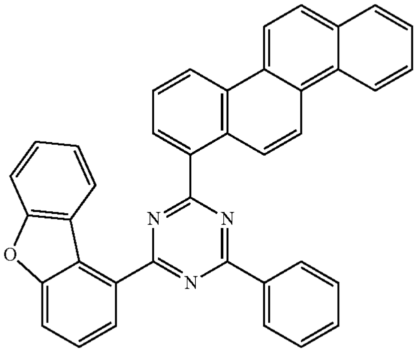<br>H1-382 |
| | 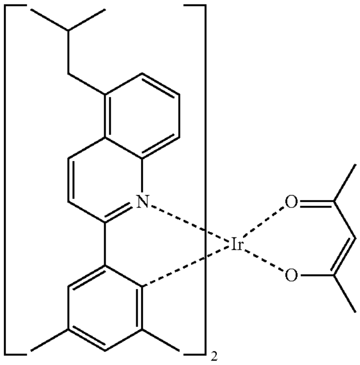<br>D-39 |
| | 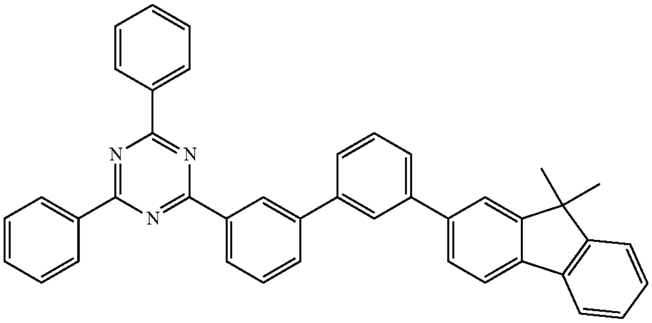<br>HBL |
| Electron Transport Layer/ Electron Injection Layer | 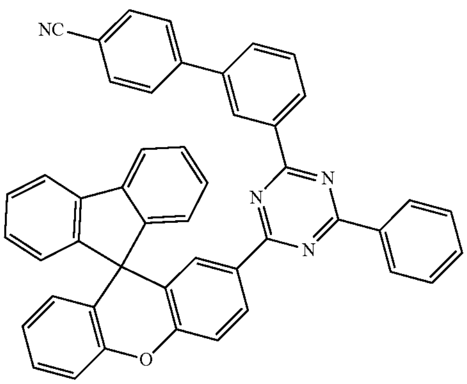<br>ET-2 |

TABLE 4-continued

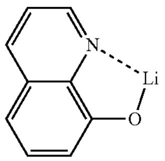

EI-1

The invention claimed is:

1. A plurality of host materials comprising at least one first host material represented by the following Formula 1 and at least one second host material represented by the following Formula 2:

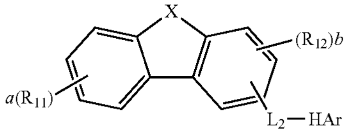

(1)

wherein,

X represents O, S, Se, $CR_{13}R_{14}$, or $NR_{15}$;

$R_{11}$ and $R_{12}$ each independently represent hydrogen, deuterium, a substituted or unsubstituted (C6-C30) aryl, a substituted or unsubstituted (3- to 30-membered) heteroaryl, or $—SiR_{16}R_{17}R_{18}$;

$R_{13}$ to $R_{18}$ each independently represent hydrogen, deuterium, a substituted or unsubstituted (C1-C30) alkyl, a substituted or unsubstituted (C6-C30) aryl, or a substituted or unsubstituted (3- to 30-membered) heteroaryl;

$L_2$ represents a single bond, a substituted or unsubstituted (C6-C30) arylene, or a substituted or unsubstituted (3- to 30-membered) heteroarylene;

HAr represents a substituted or unsubstituted (3- to 30-membered) heteroaryl containing at least one nitrogen atom(s);

a represents an integer of 1 to 4, and b represents an integer of 1 to 3;

when a is 2 or more, each of $R_{11}$ is the same or different, and when b is 2 or more, each of $R_{12}$ is the same or different;

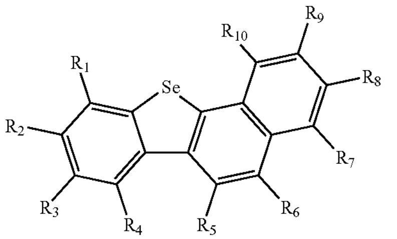

(2)

wherein, $R_1$ to $R_{10}$ each independently represent hydrogen, deuterium, a substituted or unsubstituted (C1-C30) alkyl, a substituted or unsubstituted (C6-C30) aryl, or the following Formula a; provided that, at least one of $R_1$ to $R_{10}$ is (are) the following Formula a;

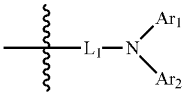

(a)

wherein, $L_1$ represents a single bond, a substituted or unsubstituted (C6-C30) arylene, or a substituted or unsubstituted (3- to 30-membered) heteroarylene;

$Ar_1$ and $Ar_2$ each independently represent a substituted or unsubstituted (C1-C30) alkyl, a substituted or unsubstituted (C6-C30) aryl, a substituted or unsubstituted (3- to 30-membered) heteroaryl, or $-L_3-NAr_3Ar_4$;

$L_3$ represents a substituted or unsubstituted (C6-C30) arylene or a substituted or unsubstituted (3- to 30-membered) heteroarylene; and $Ar_3$ and $Ar_4$ each independently represent a substituted or unsubstituted (C6-C30) aryl or a substituted or unsubstituted (3- to 30-membered) heteroaryl.

2. The plurality of host materials according to claim 1, wherein HAr of Formula 1 represents a substituted or unsubstituted triazinyl, a substituted or unsubstituted pyridyl, a substituted or unsubstituted pyrimidinyl, a substituted or unsubstituted quinazolinyl, a substituted or unsubstituted benzoquinazolinyl, a substituted or unsubstituted quinoxalinyl, a substituted or unsubstituted benzoquinoxalinyl, a substituted or unsubstituted quinolyl, a substituted or unsubstituted benzoquinolyl, a substituted or unsubstituted isoquinolyl, a substituted or unsubstituted benzoisoquinolyl, a substituted or unsubstituted triazolyl, a substituted or unsubstituted pyrazolyl, a substituted or unsubstituted naphthyridinyl, a substituted or unsubstituted benzothienopyrimidinyl, a substituted or unsubstituted carbazolyl, or a substituted or unsubstituted pyridopyrazinyl.

3. The plurality of host materials according to claim 1, wherein the Formula 1 is represented by the following Formula 1-A:

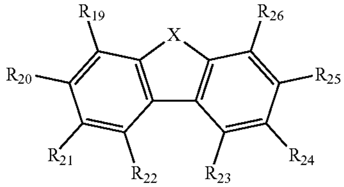

(1-A)

wherein,

X represents as defined in claim 1;

$R_{19}$ to $R_{26}$ each independently represent hydrogen, deuterium, (C6-C18) aryl unsubstituted or substituted with at least one of deuterium, (C1-C6) alkyl, and (C6-C18) aryl, a substituted or unsubstituted (3- to 30-membered) heteroaryl, or the following Formula 1-a; provided that at least one of $R_{19}$ to $R_{26}$ is (are) the following Formula 1-a;

(1-a)

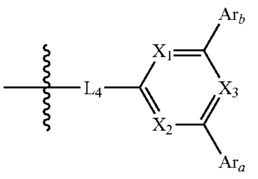

wherein, $L_4$ represents a single bond or a substituted or unsubstituted (C6-C30) arylene;

$X_1$ to $X_3$ each independently represent CR or N; provided that, at least two of $X_1$ to $X_3$ are N; and $Ar_a$ and $Ar_b$ each independently represent a substituted or unsubstituted (C6-C30) aryl or a substituted or unsubstituted (3- to 30-membered) heteroaryl.

4. The plurality of host materials according to claim 1, wherein the Formula 2 is represented by the following Formula 2-1 or 2-2:

(2-1)

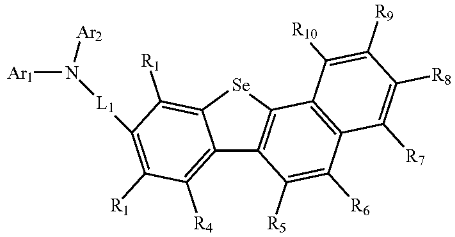

(2-2)

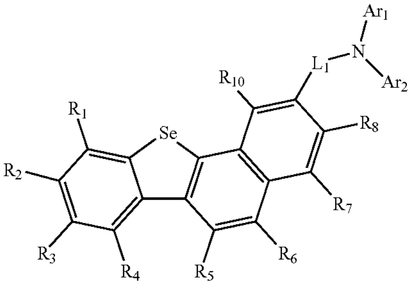

wherein, $R_1$ to $R_{10}$, $L_1$, $Ar_1$ and $Ar_2$ are as defined in claim 1.

5. The plurality of host materials according to claim 1, wherein $Ar_1$ and $Ar_2$ in Formula 2 each independently represent a substituted or unsubstituted phenyl, a substituted or unsubstituted p-biphenyl, a substituted or unsubstituted m-biphenyl, a substituted or unsubstituted o-biphenyl, a substituted or unsubstituted m-terphenyl, a substituted or unsubstituted o-terphenyl, a substituted or unsubstituted o-quarterphenyl, a substituted or unsubstituted fluorenyl, a substituted or unsubstituted phenanthrenyl, benzofluorenyl unsubstituted or substituted with methyl, a substituted or unsubstituted carbazolyl, a substituted or unsubstituted dibenzofuranyl, a substituted or unsubstituted dibenzothiophenyl, a substituted or unsubstituted dibenzoselenophenyl, a substituted or unsubstituted benzocarbazolyl, a substituted or unsubstituted benzonaphthofuranyl, or a substituted or unsubstituted benzonaphthothiophenyl.

6. The plurality of host materials according to claim 1, wherein the compound represented by the Formula 1 is selected from the following compounds:

H1-1

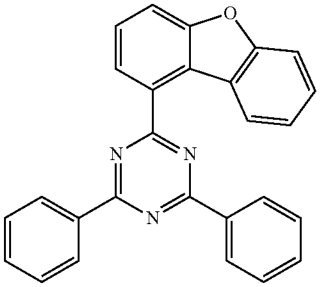

H1-2

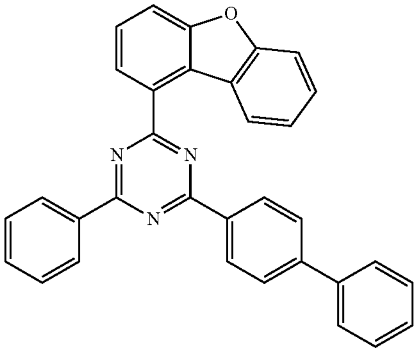

H1-3

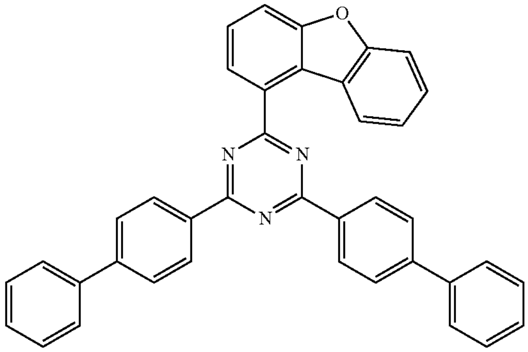

H1-4

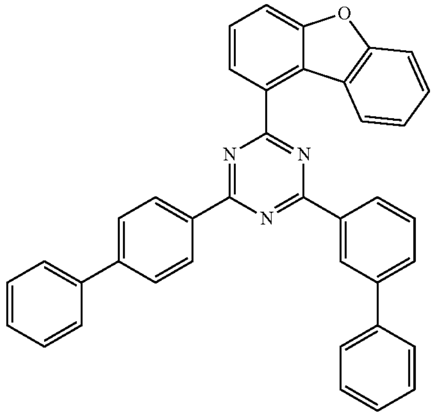

-continued
H1-5
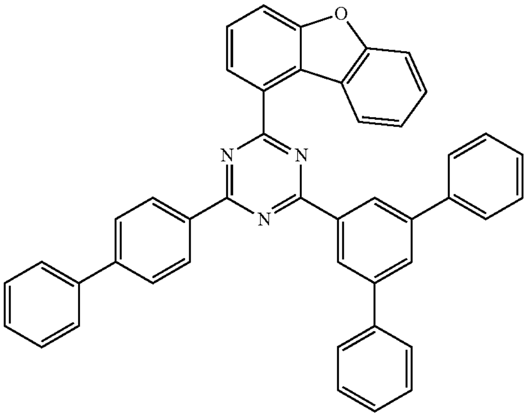
H1-6
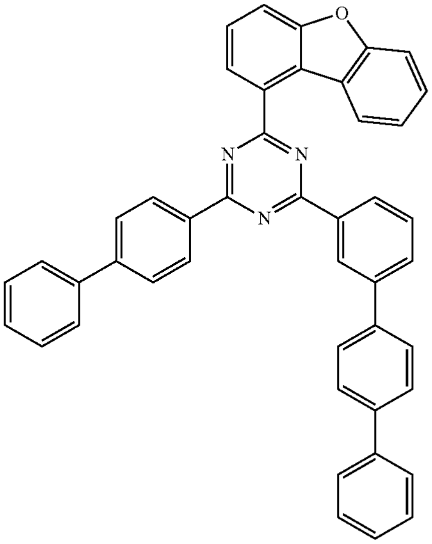
H1-7
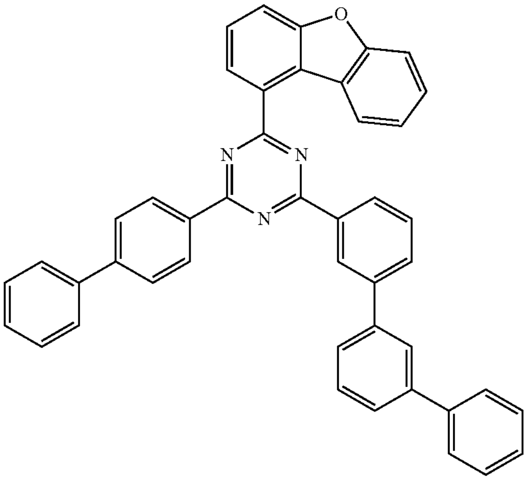
-continued
H1-8
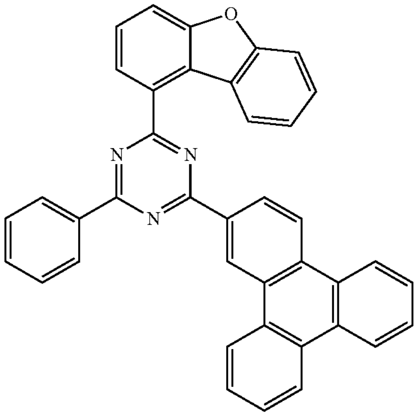
H1-9
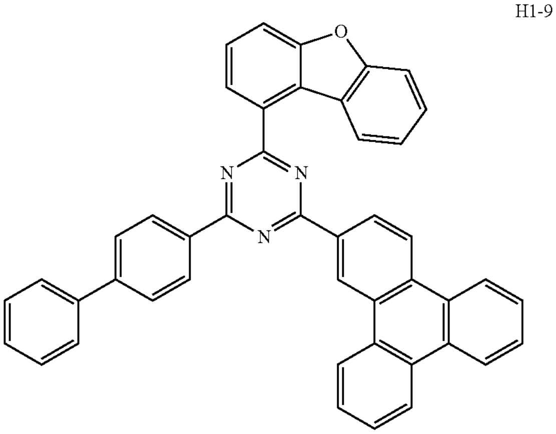
H1-10
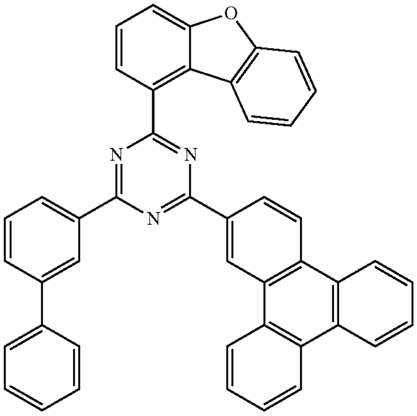
H1-11
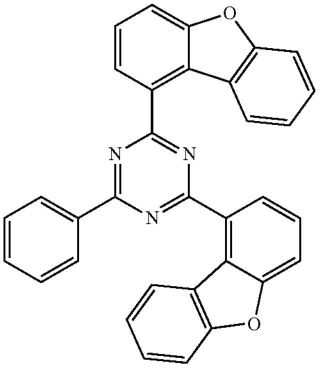

-continued
H1-12
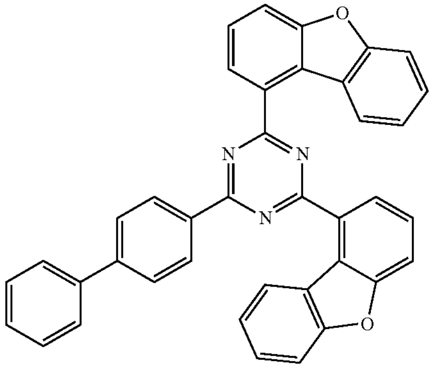
H1-13
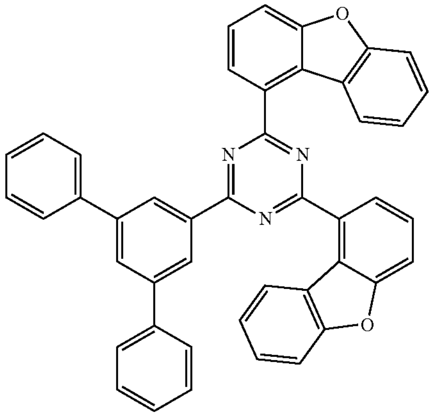
H1-14
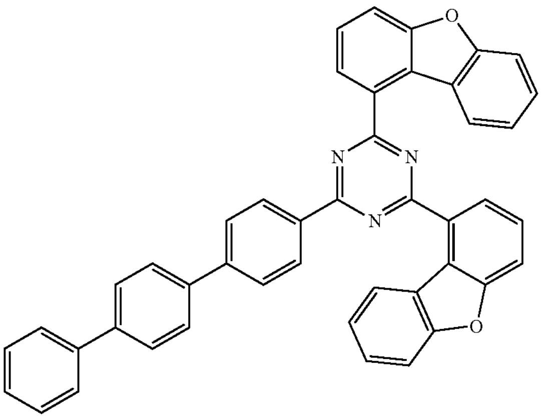
-continued
H1-15
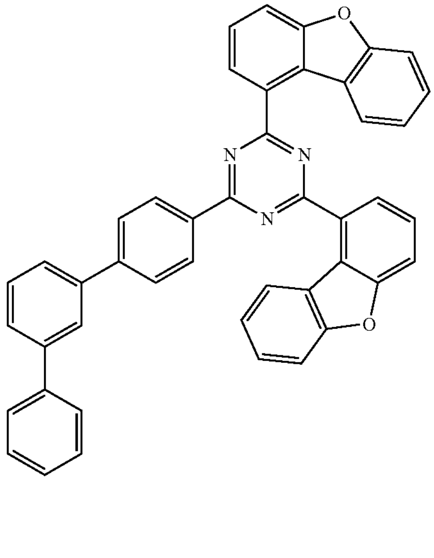
H1-16
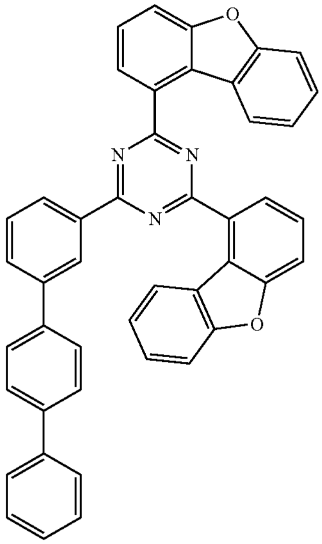
H1-17
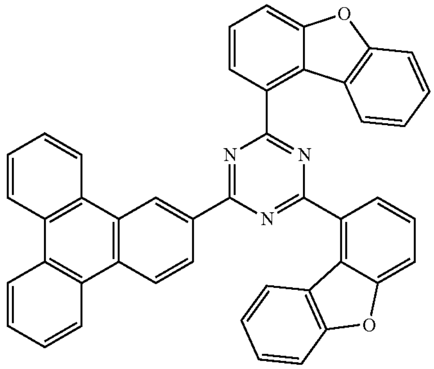

H1-18
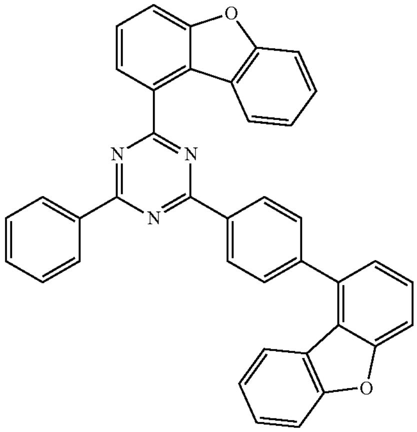
H1-19
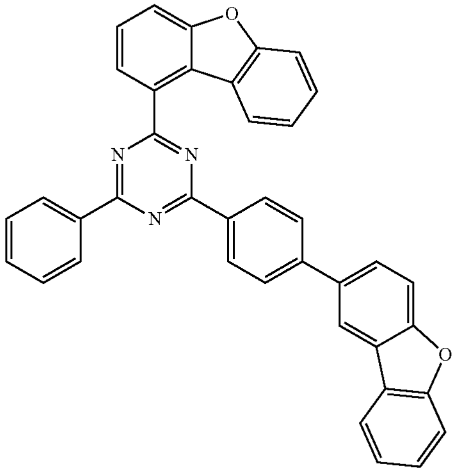
H1-20
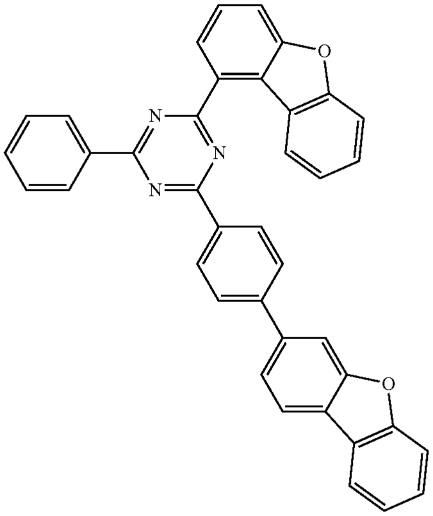
H1-21
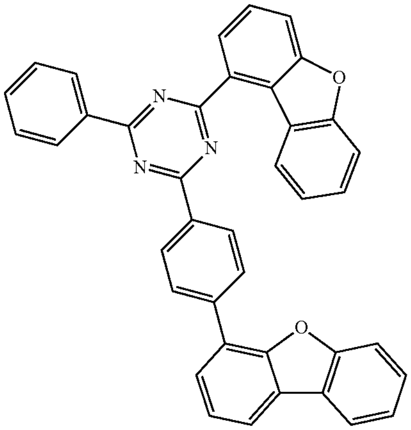
H1-22
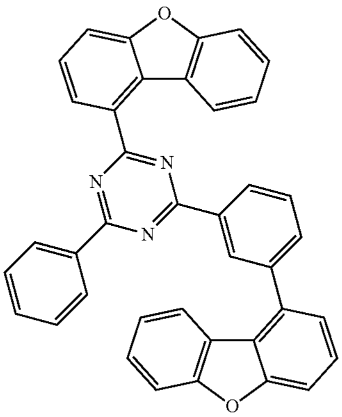
H1-23
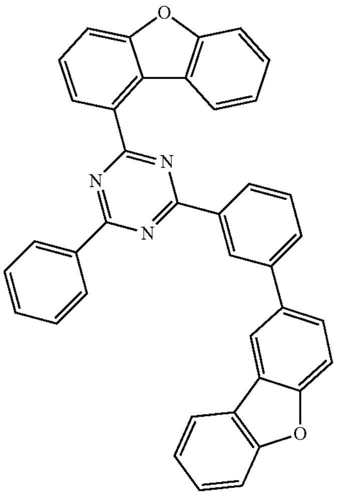

-continued
H1-24
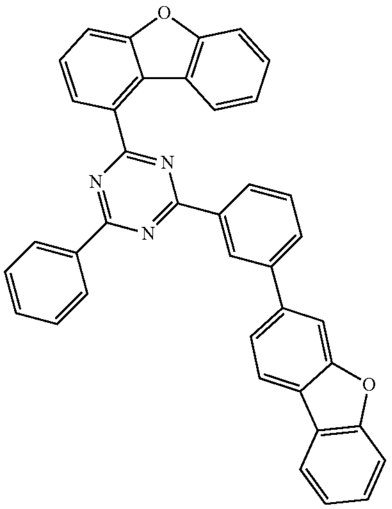
H1-25
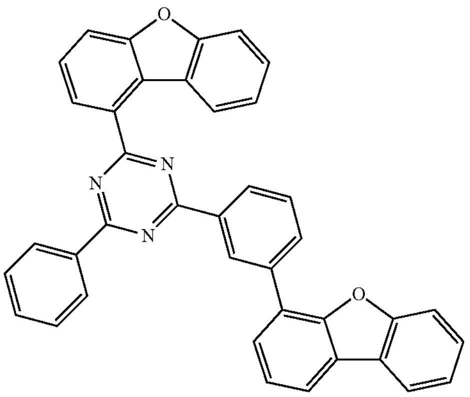
H1-26
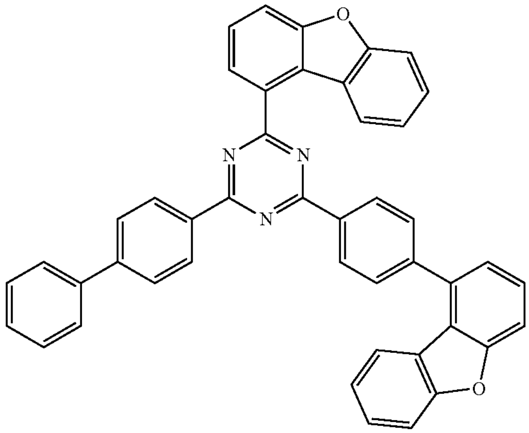
-continued
H1-27
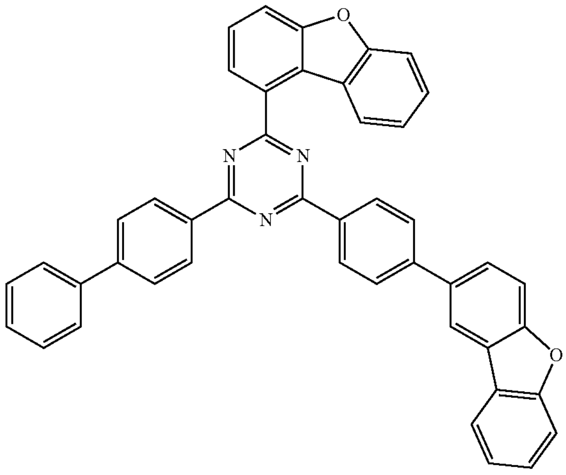
H1-28
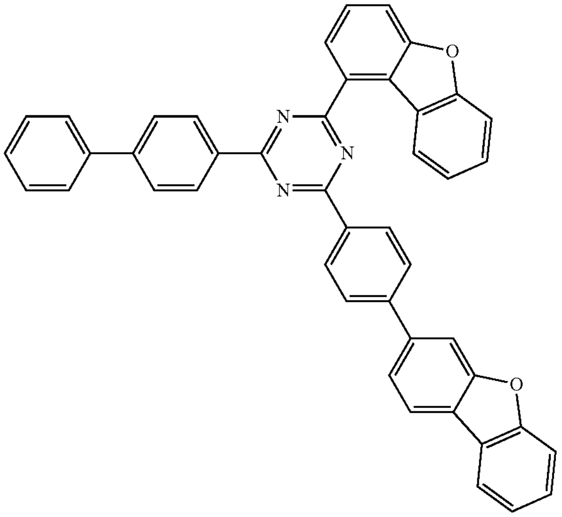
H1-29
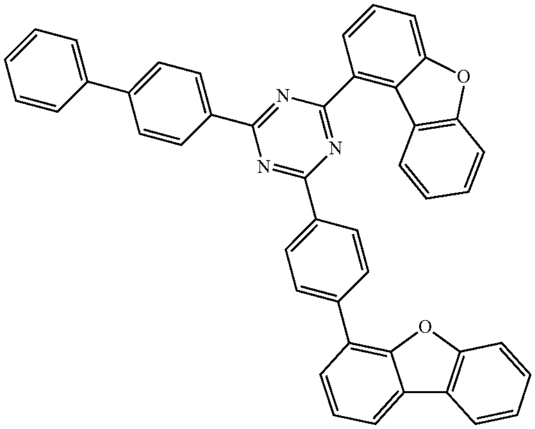

-continued
H1-30
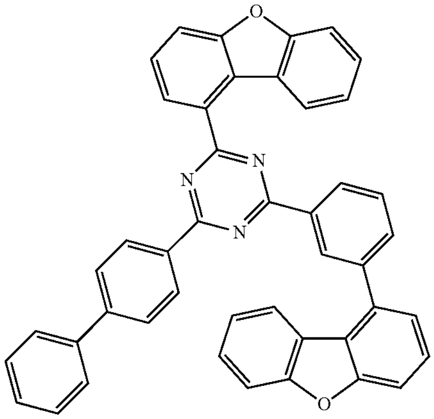
H1-31
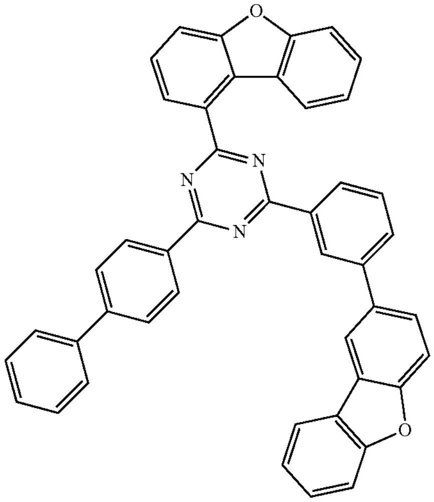
H1-32
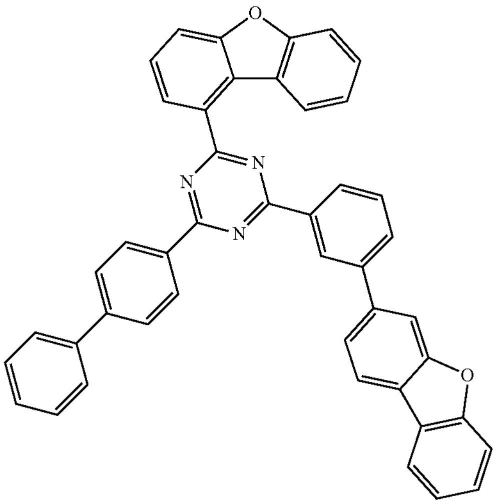
-continued
H1-33
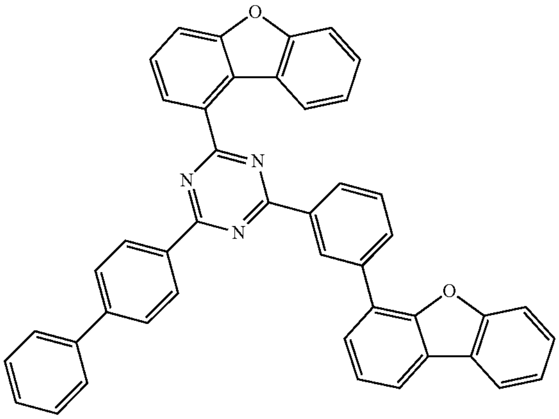
H1-34
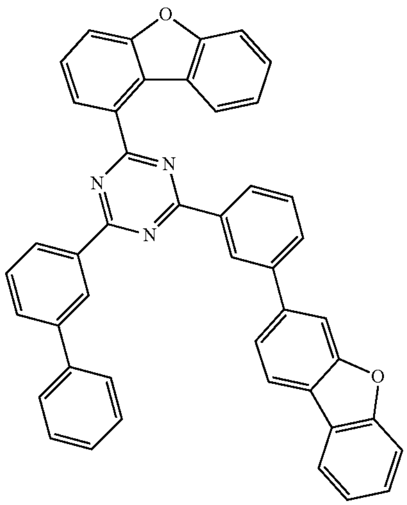
H1-35
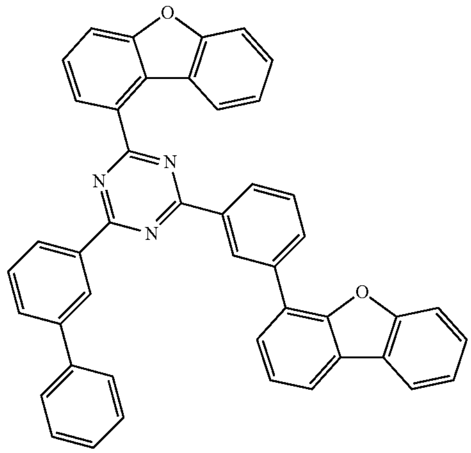

-continued
H1-36
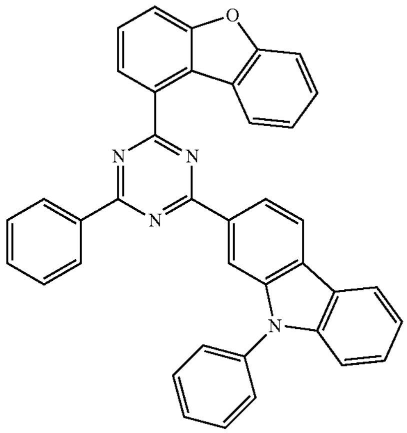
H1-37
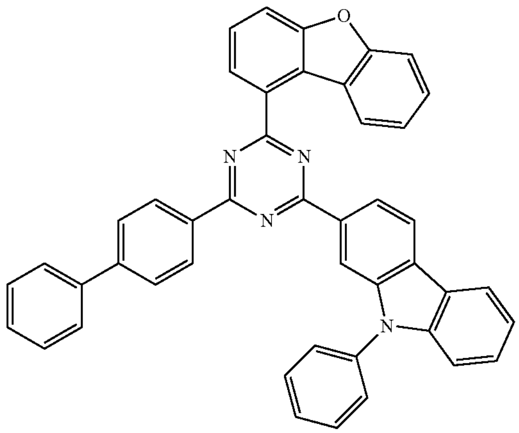
H1-38
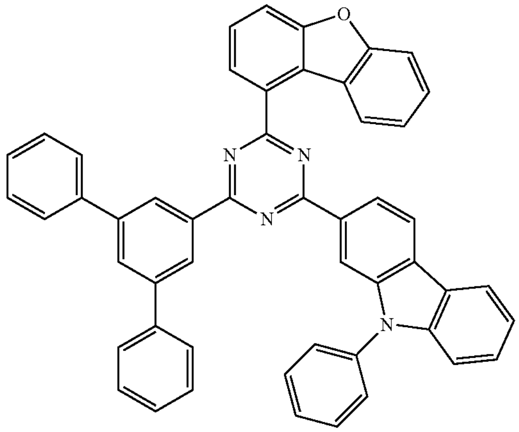
-continued
H1-39
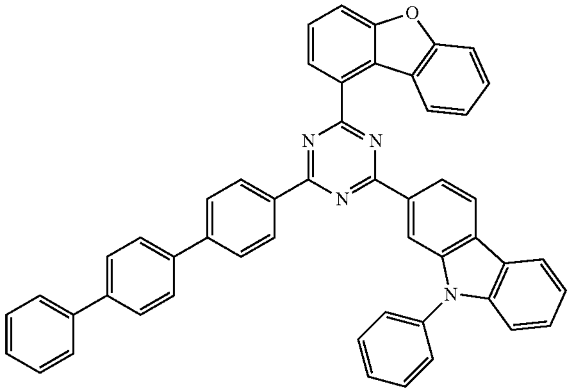
H1-40
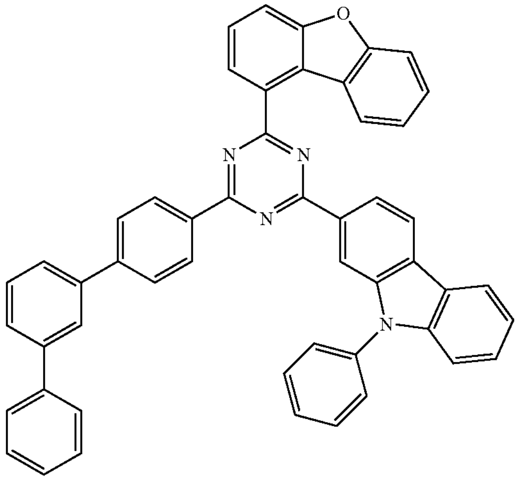
H1-41
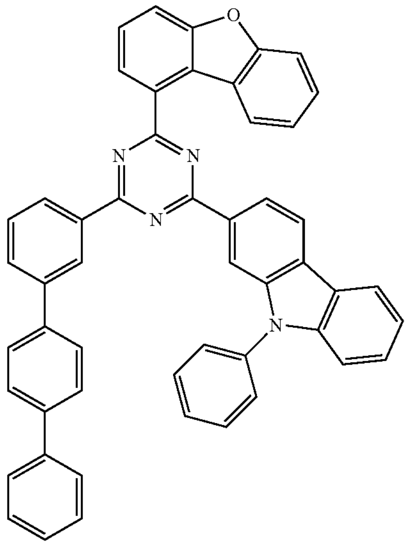

-continued
H1-42
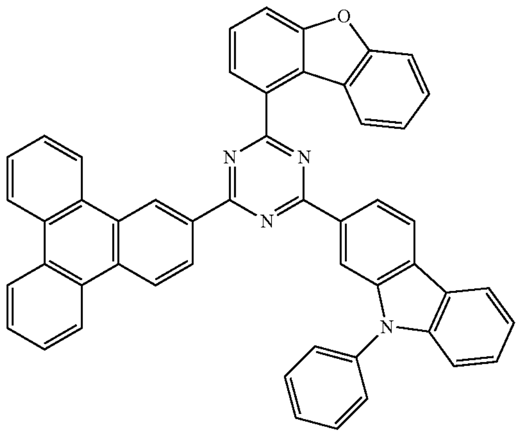
H1-43
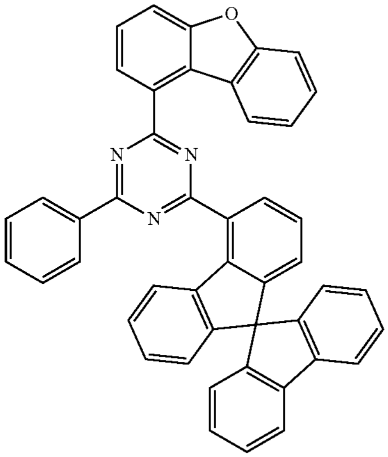
H1-44
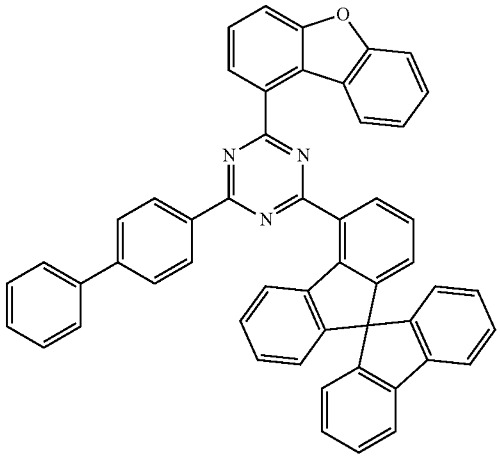
-continued
H1-45
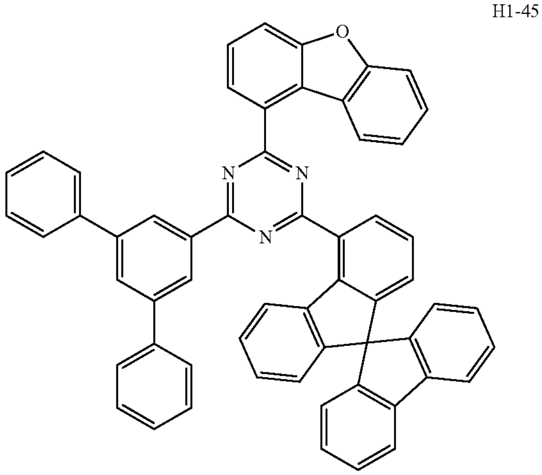
H1-46
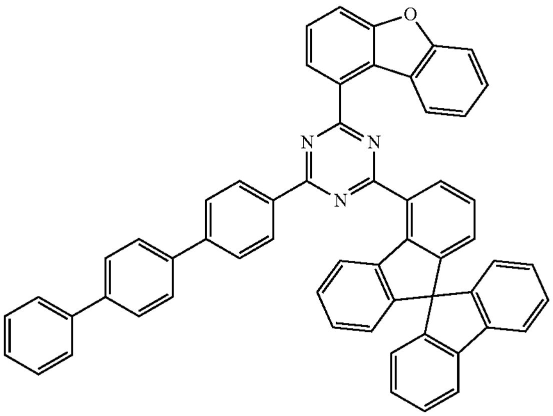
H1-47
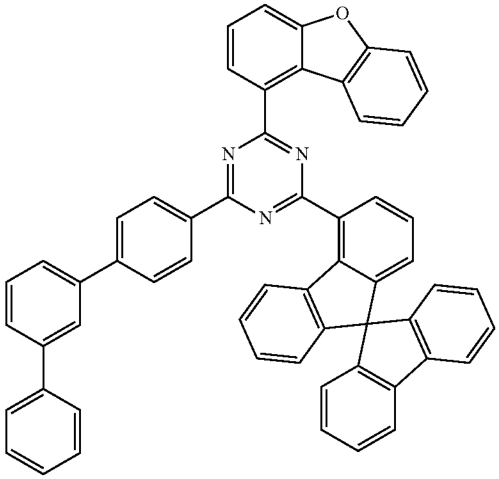

-continued
H1-48
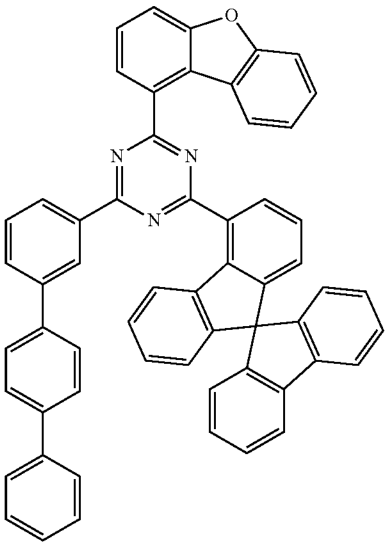
H1-49
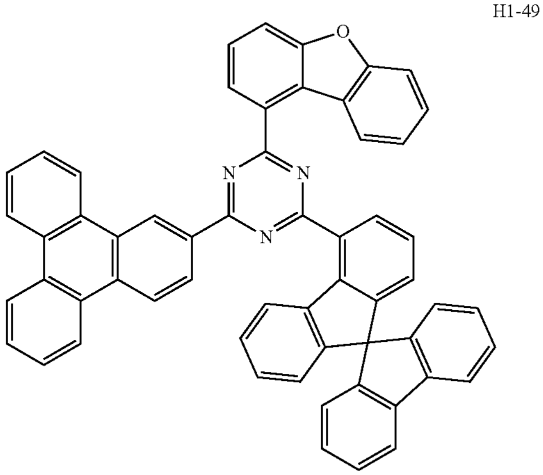
H1-50
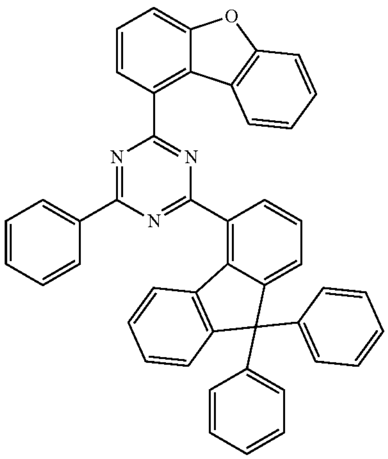
-continued
H1-51
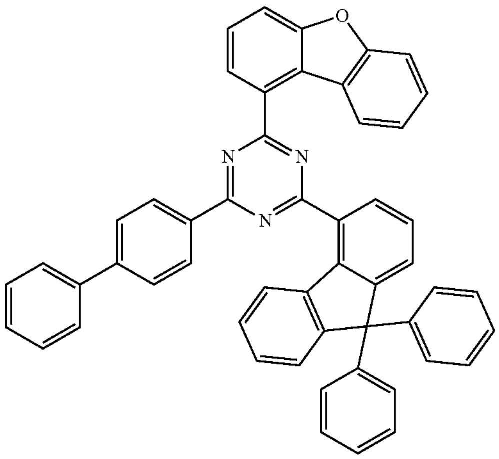
H1-52
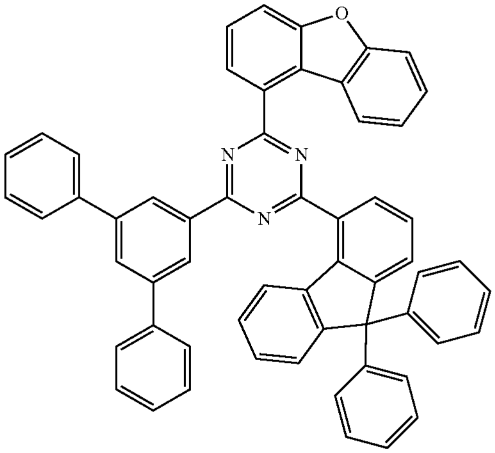
H1-53
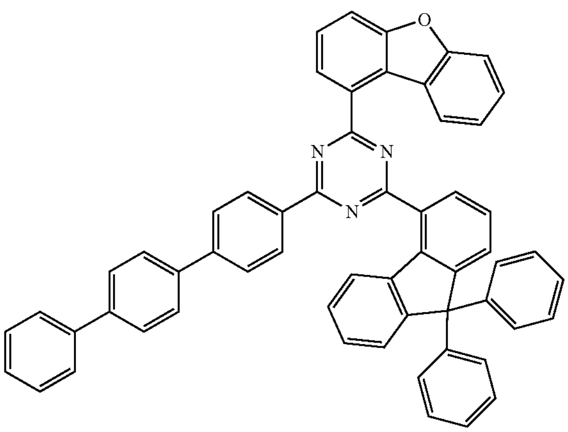

-continued
H1-54
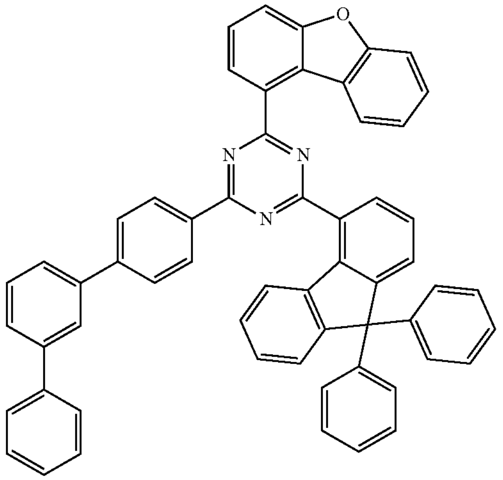
H1-55
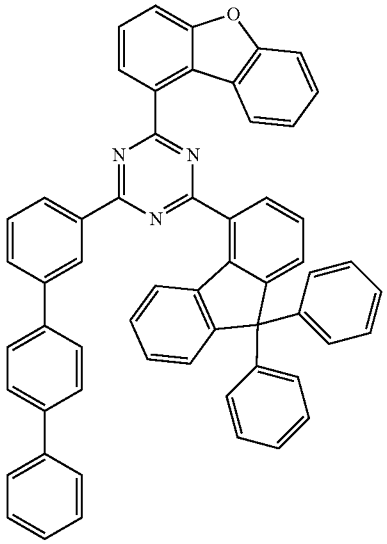
H1-56
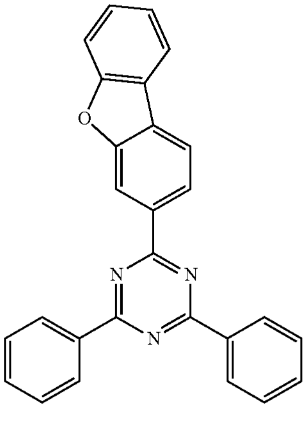
-continued
H1-57
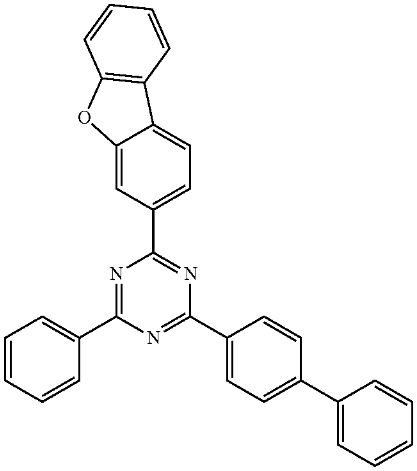
H1-58
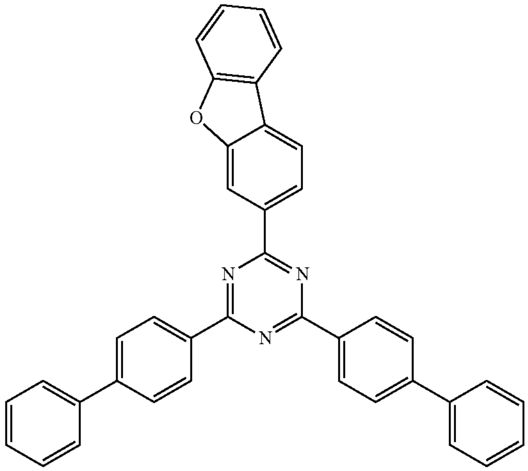
H1-59
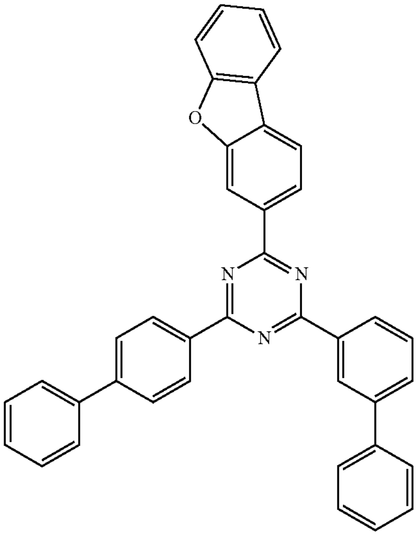

-continued
H1-60
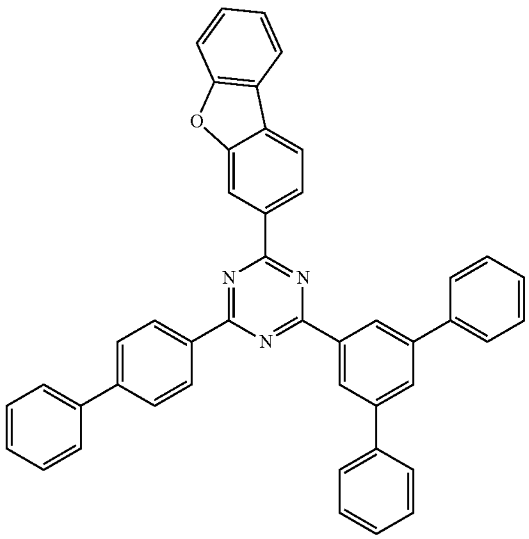
H1-61
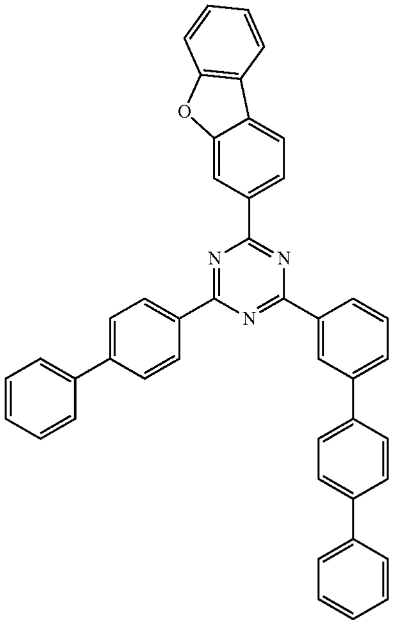
-continued
H1-62
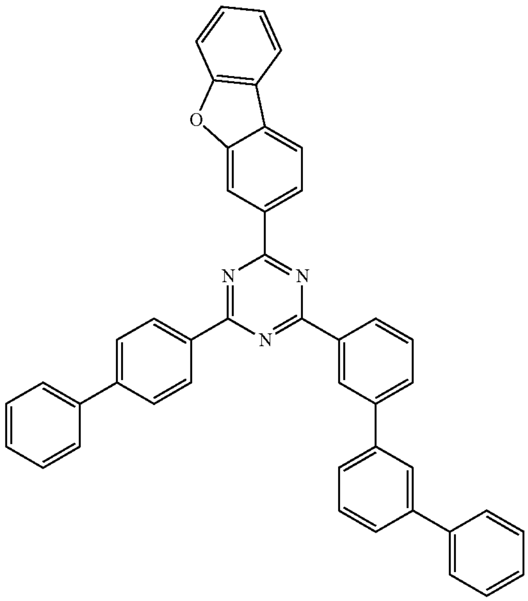
H1-63
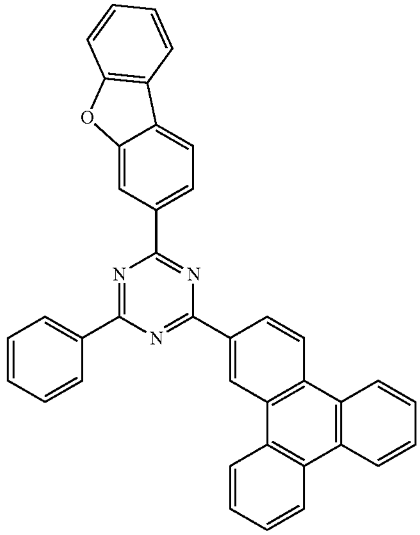

-continued
H1-64
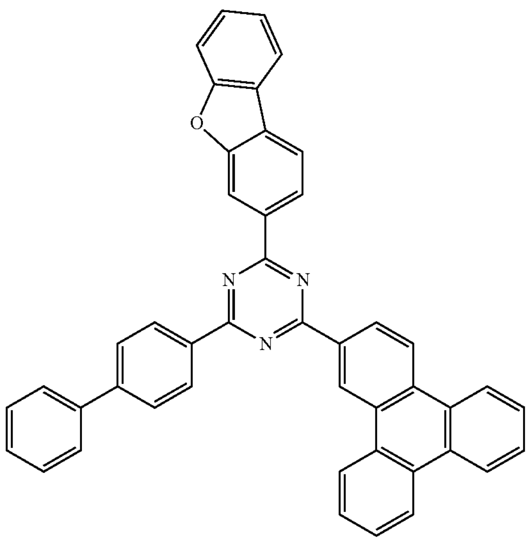
H1-65
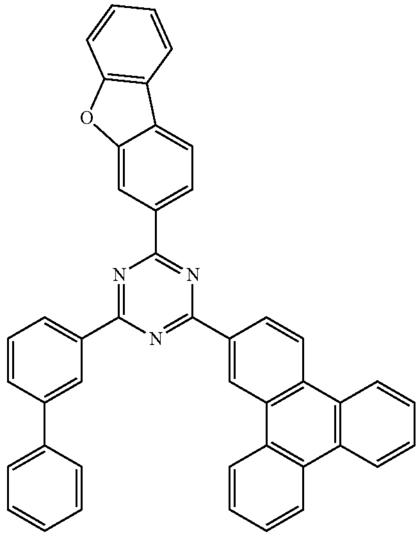
H1-66
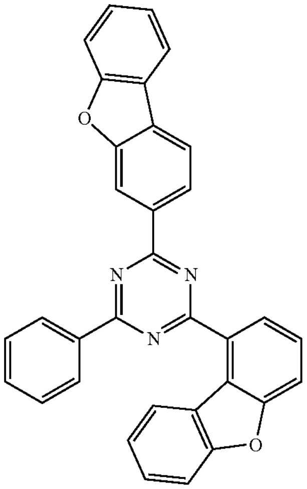
-continued
H1-67
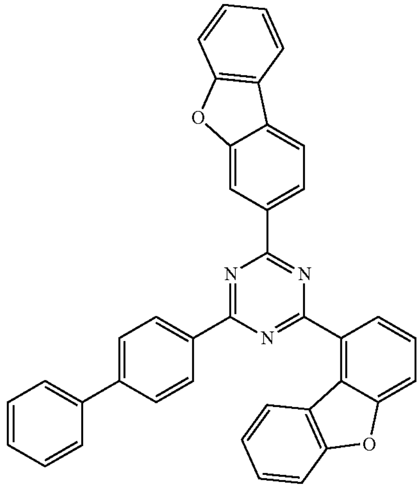
H1-68
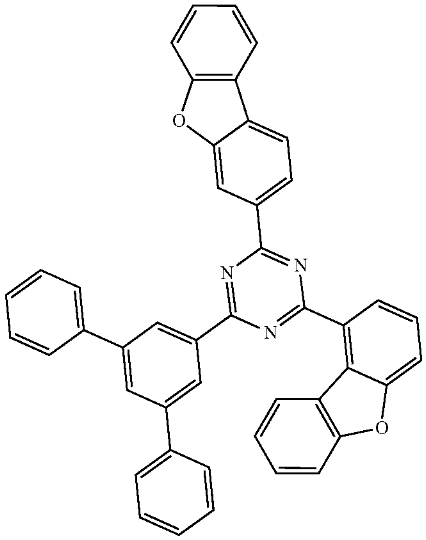
H1-69
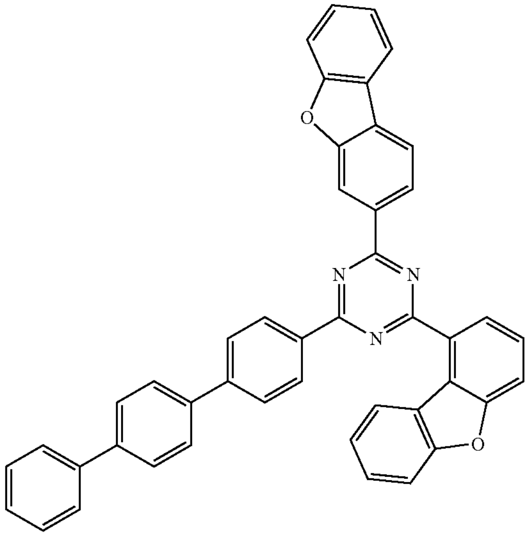

-continued
H1-70
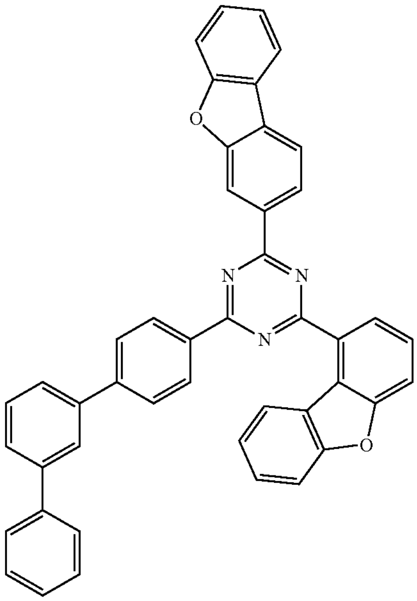
H1-71
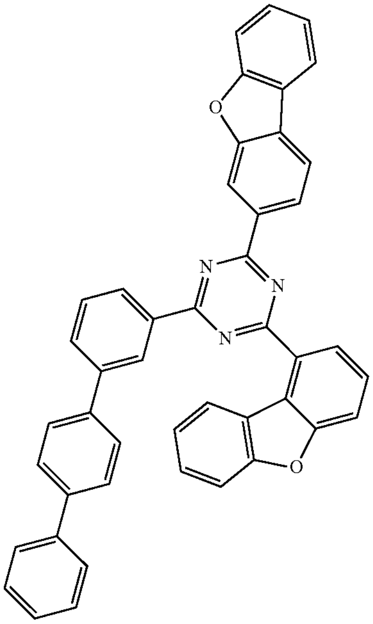
-continued
H1-72
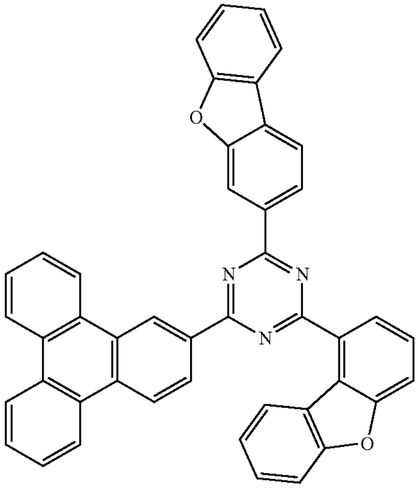
H1-73
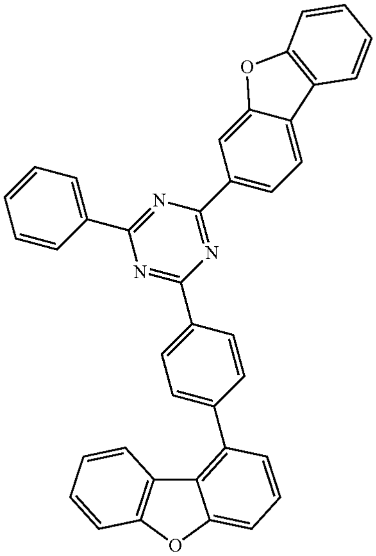
H1-74
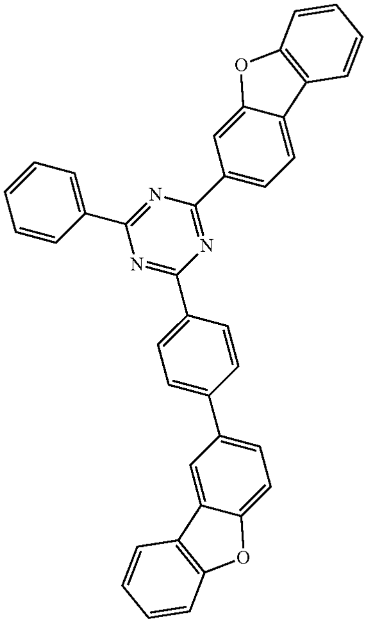

-continued
H1-75
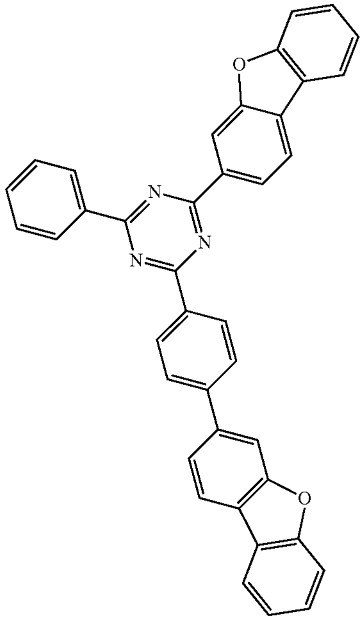
H1-76
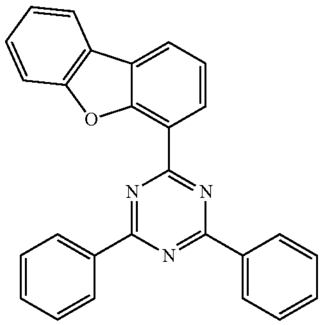
H1-77
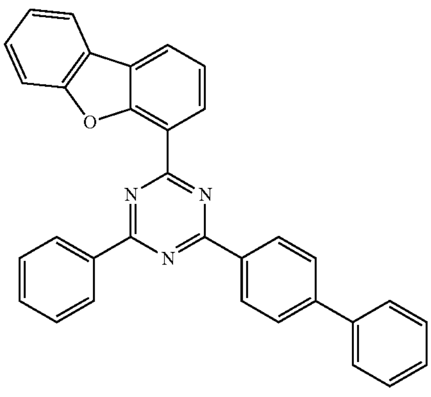
-continued
H1-78
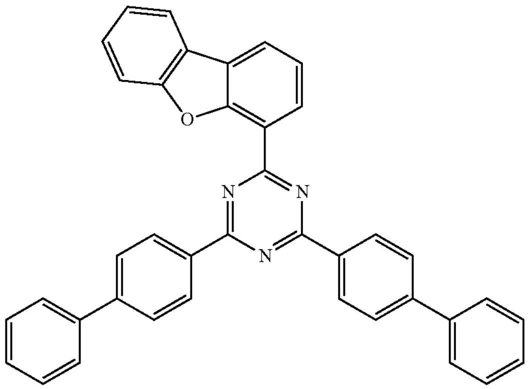
H1-79
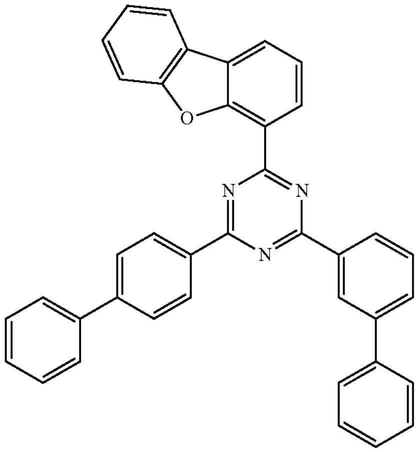
H1-80
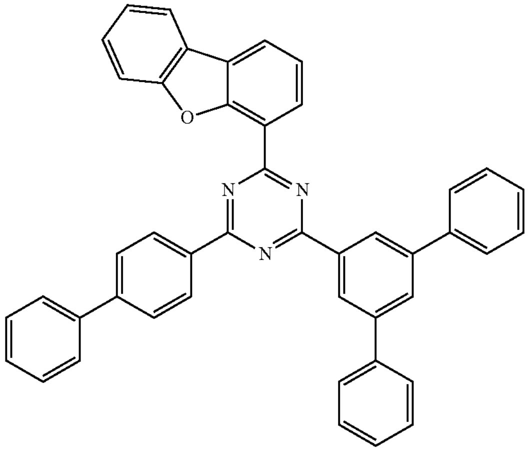

-continued
H1-81
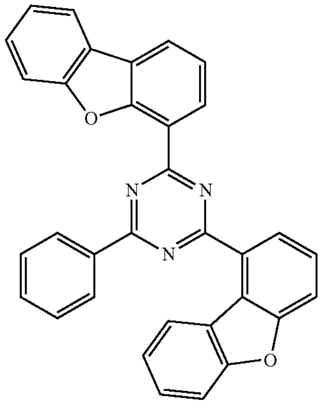
H1-82
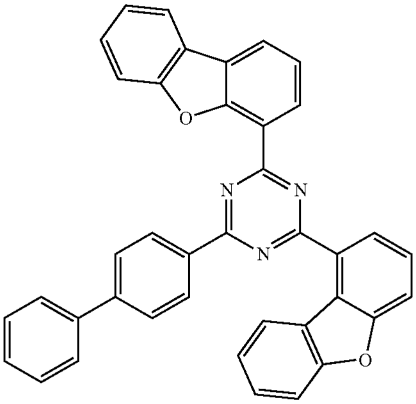
H1-83
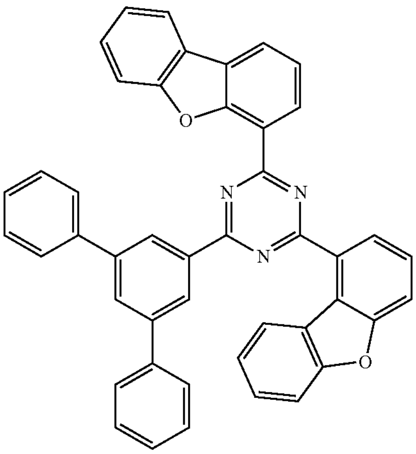
-continued
H1-84
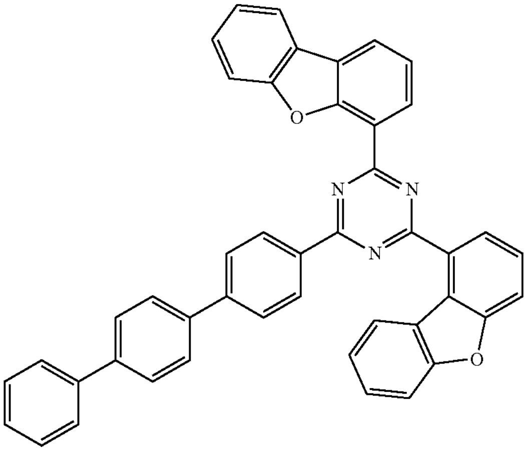
H1-85
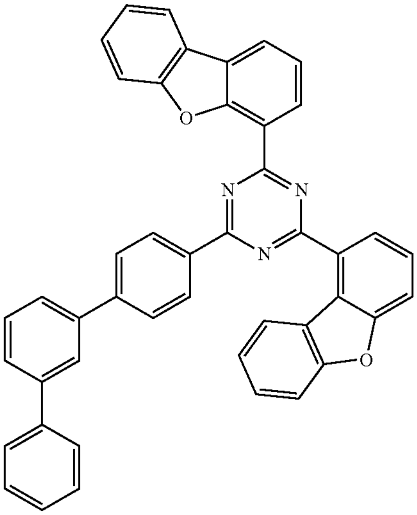
H1-86
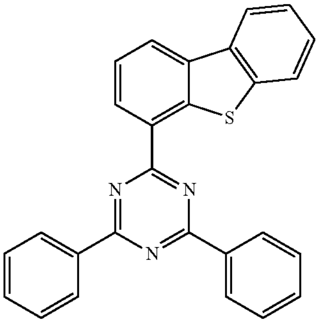

-continued
H1-87
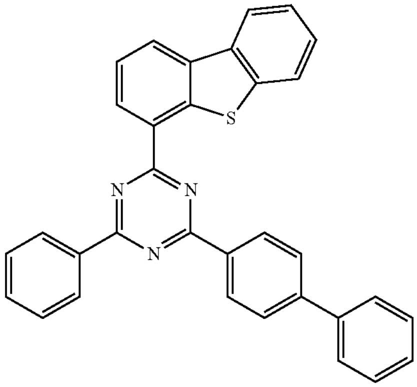
H1-88
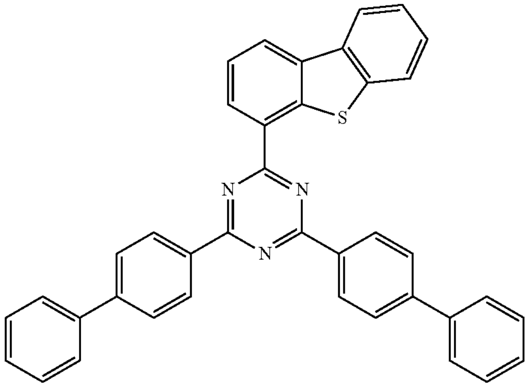
H1-89
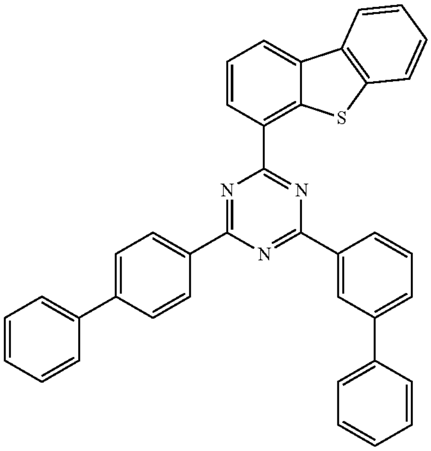
-continued
H1-90
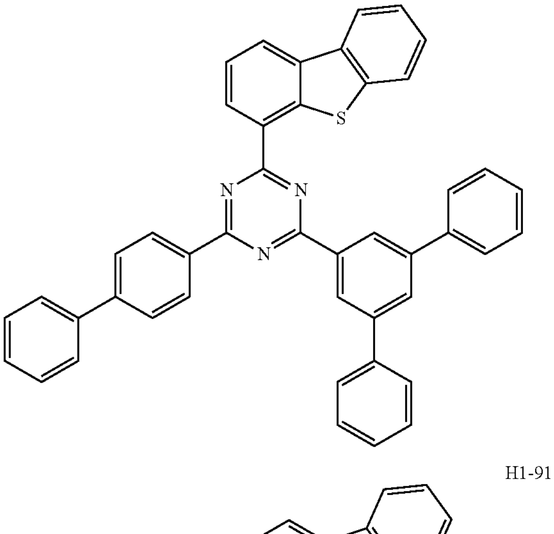
H1-91
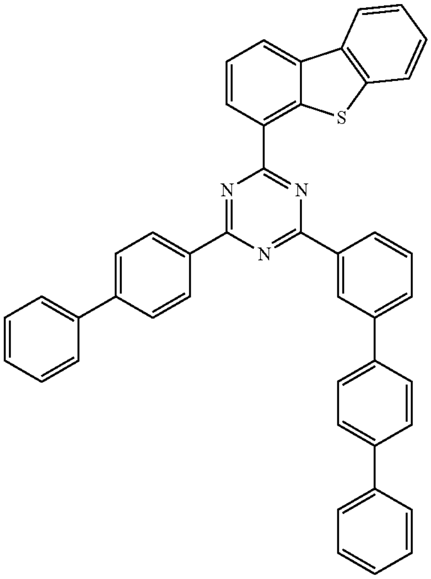
H1-92
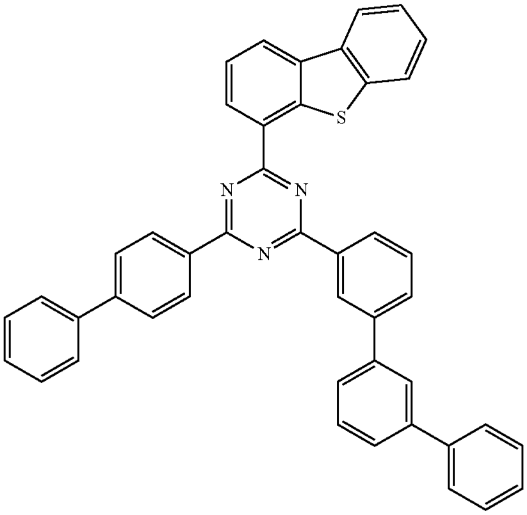

-continued
H1-93
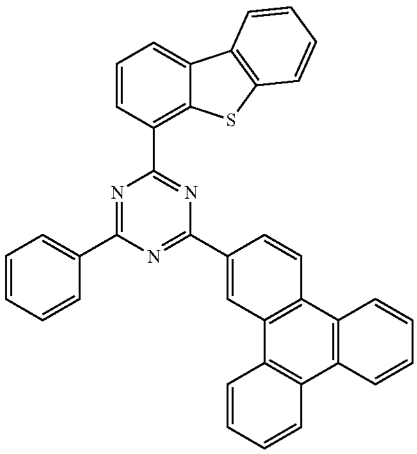
H1-94
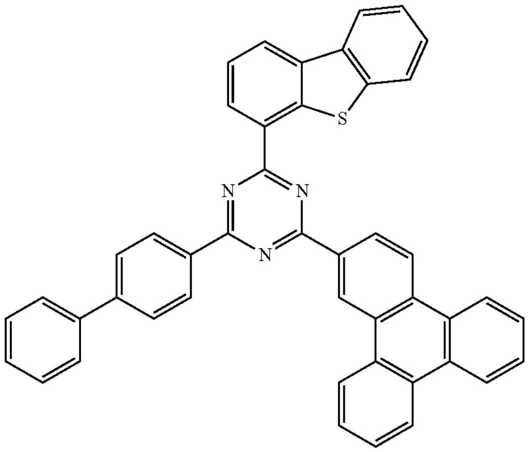
H1-95
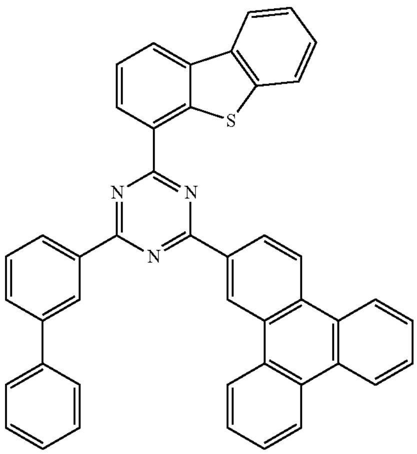
-continued
H1-96
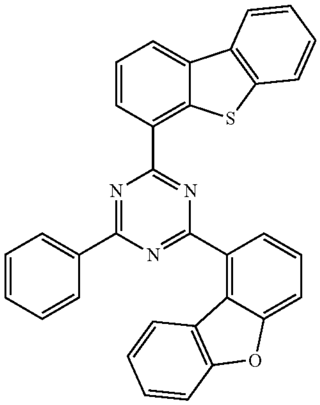
H1-97
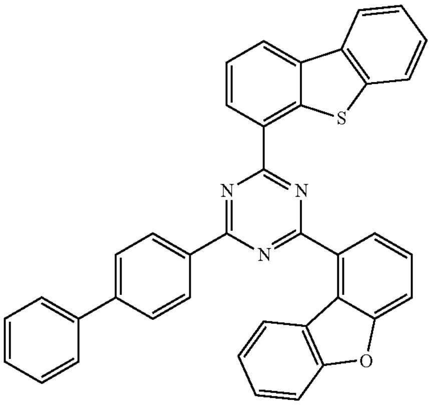
H1-98
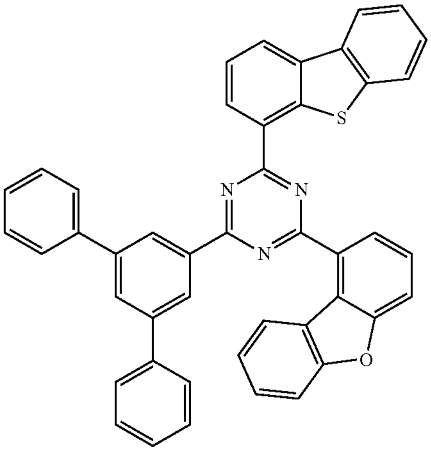

-continued
H1-99
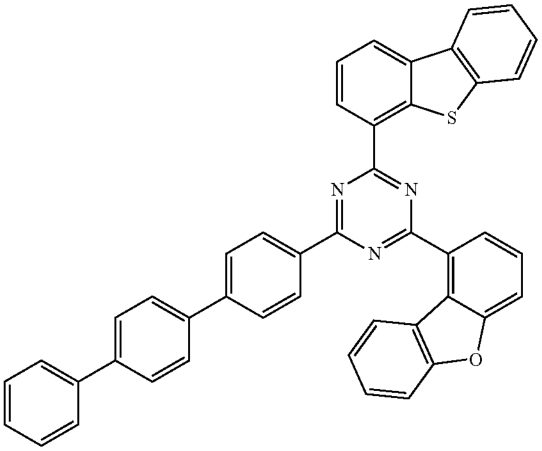
H1-100
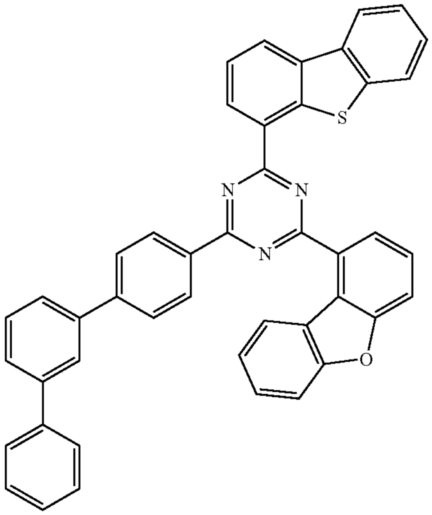
H1-101
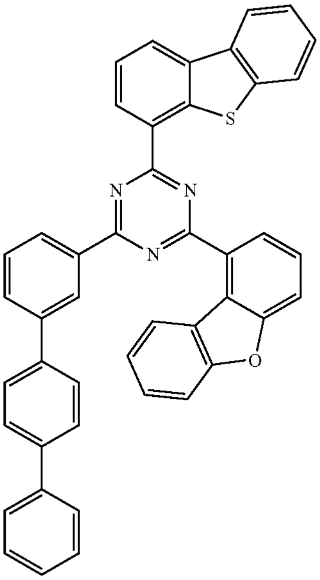
-continued
H1-102
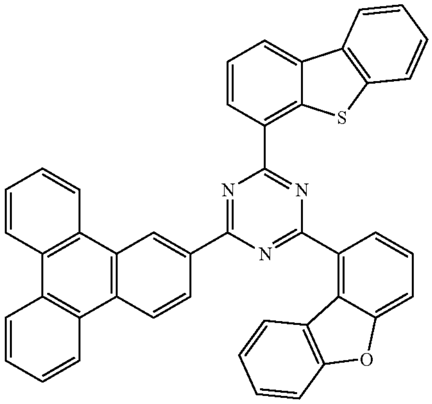
H1-103
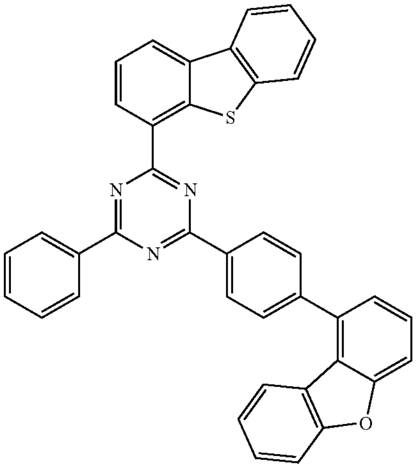
H1-104
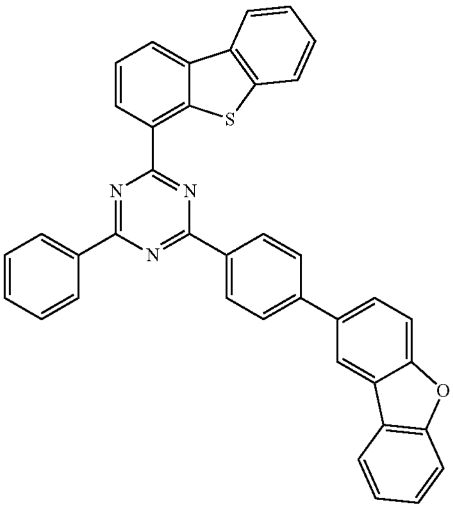

-continued
H1-105
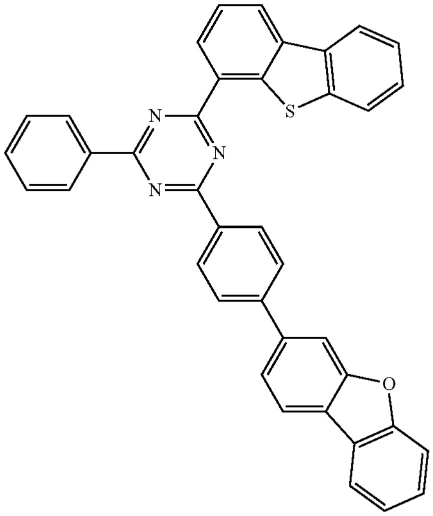
H1-106
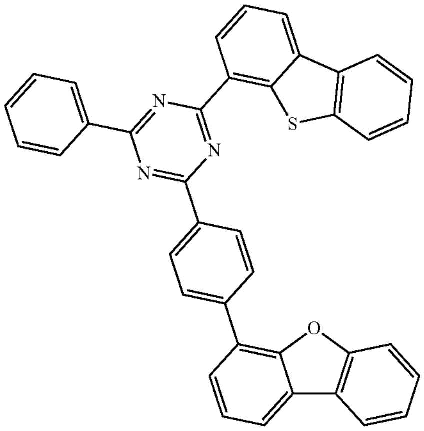
H1-107
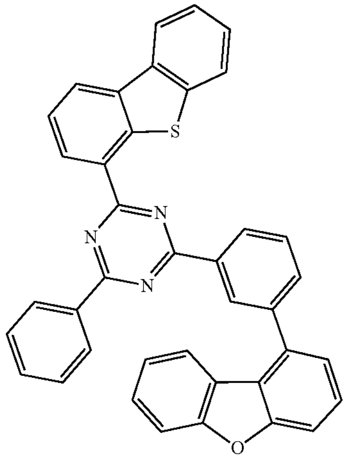
-continued
H1-108
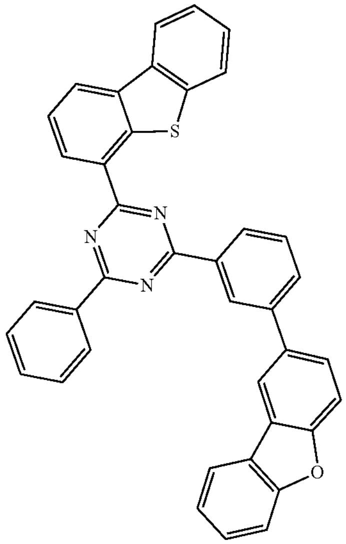
H1-109
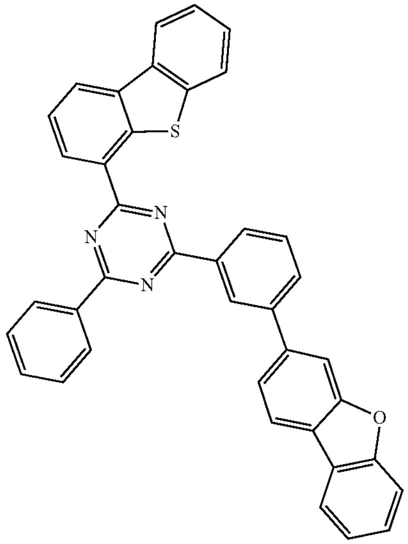
H1-110
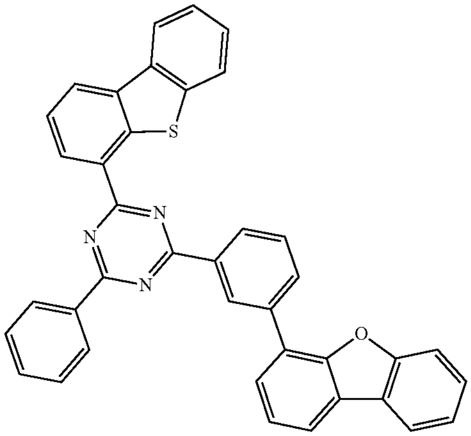

-continued
H1-111
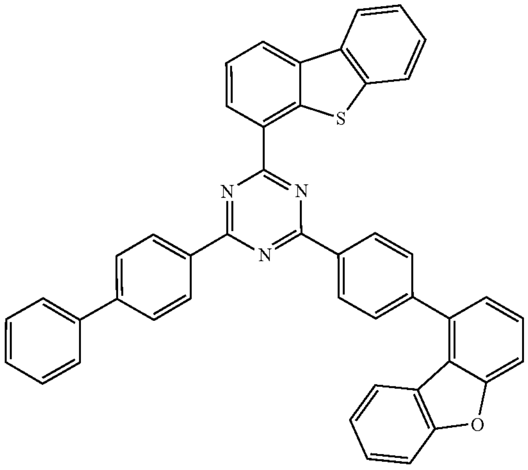
H1-112
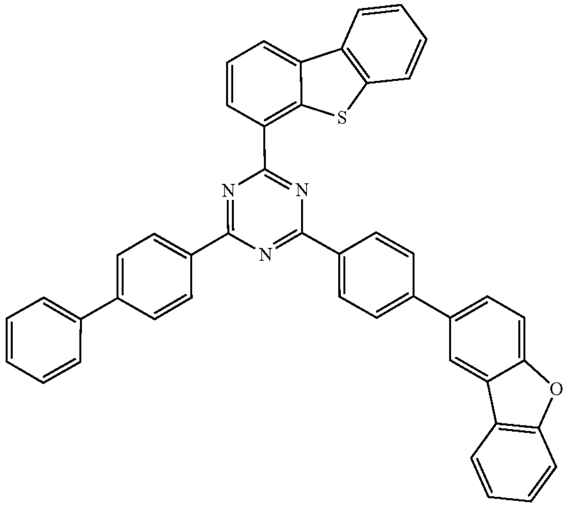
H1-113
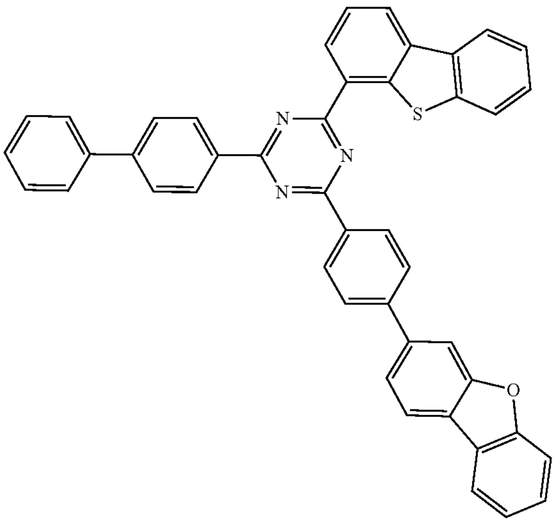
-continued
H1-114
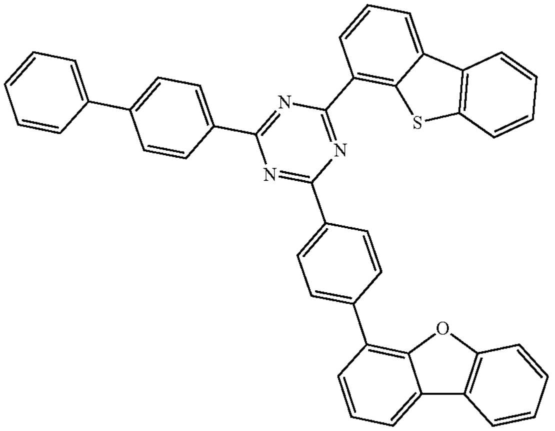
H1-115
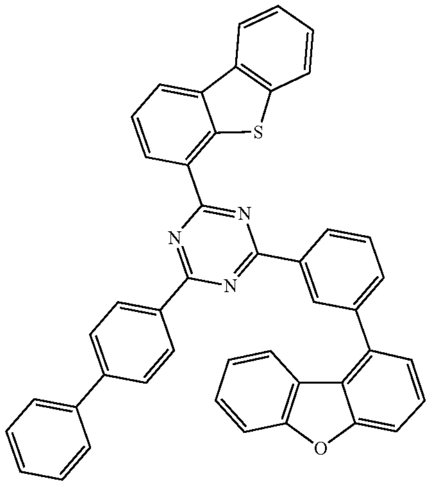
H1-116
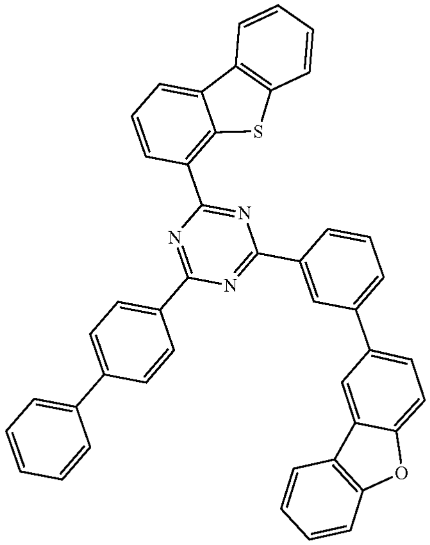

-continued
H1-117
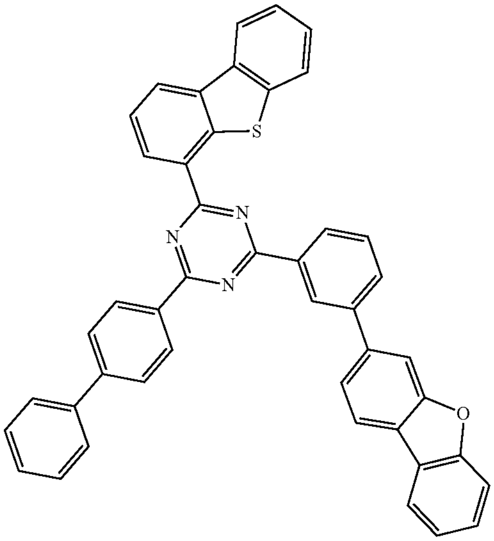
H1-118
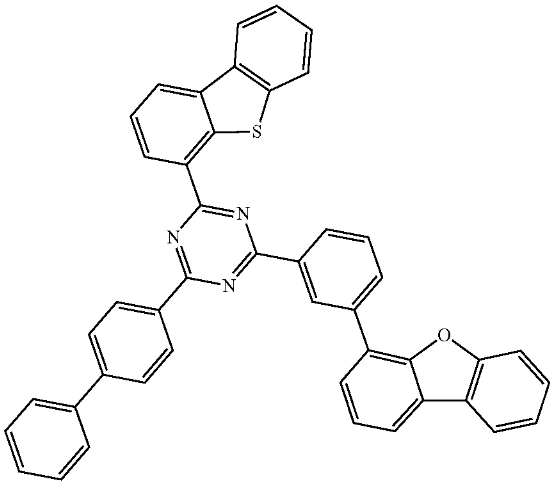
H1-119
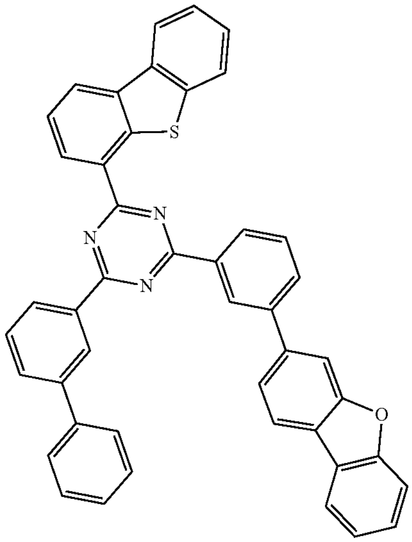
-continued
H1-120
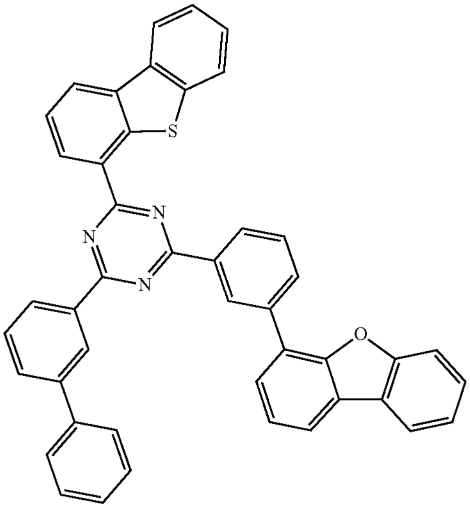
H1-121
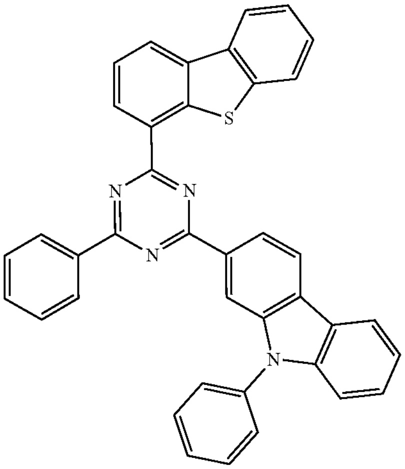
H1-122
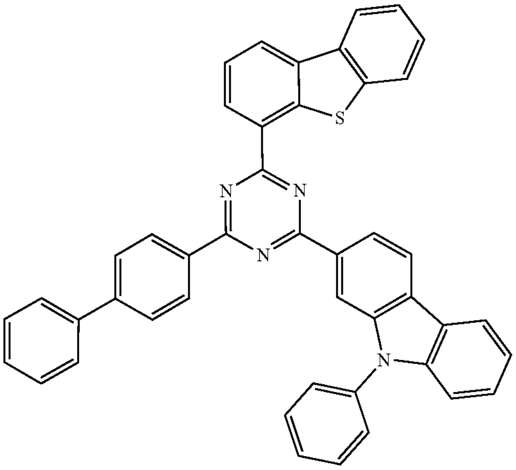

-continued
H1-123
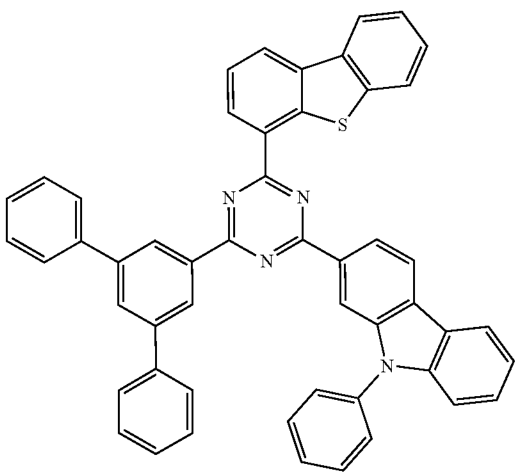
H1-124
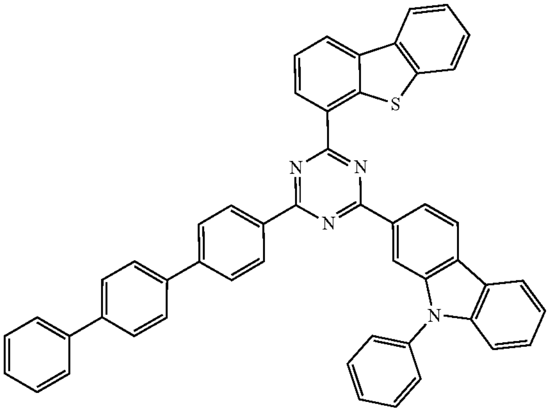
H1-125
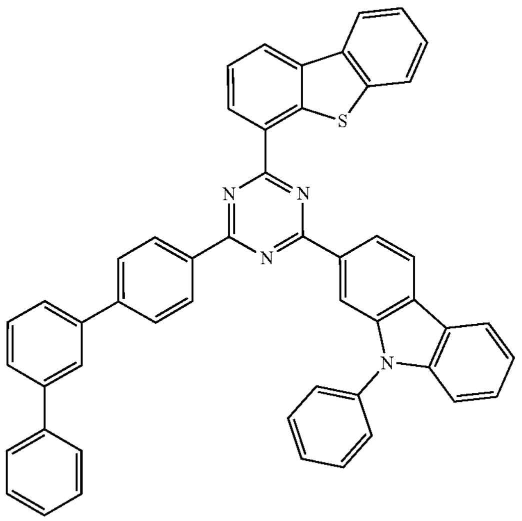
-continued
H1-126
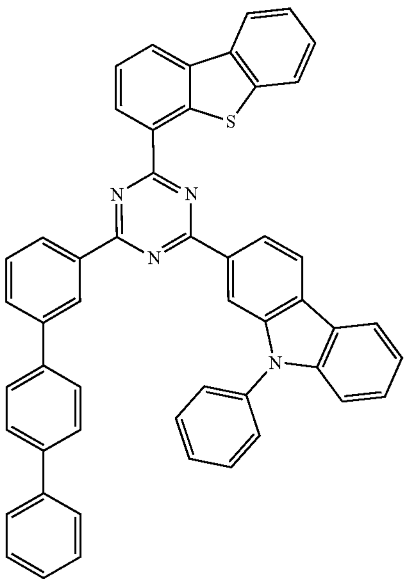
H1-127
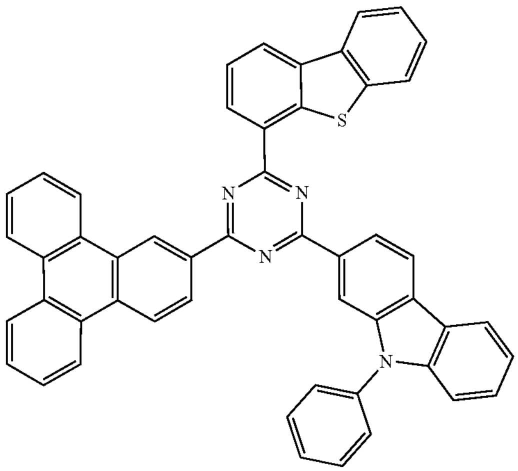
H1-128
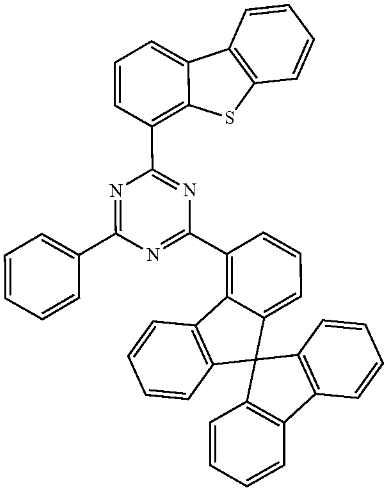

-continued
H1-129
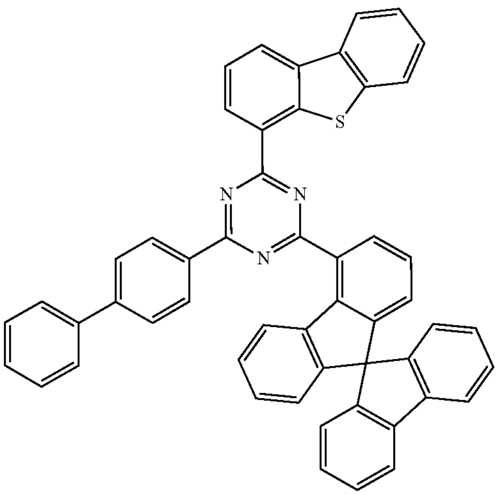
H1-130
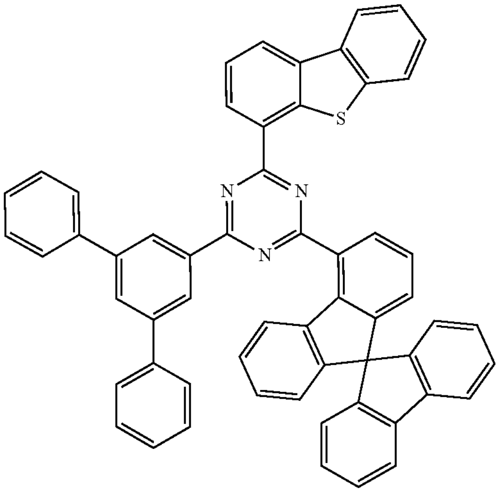
H1-131
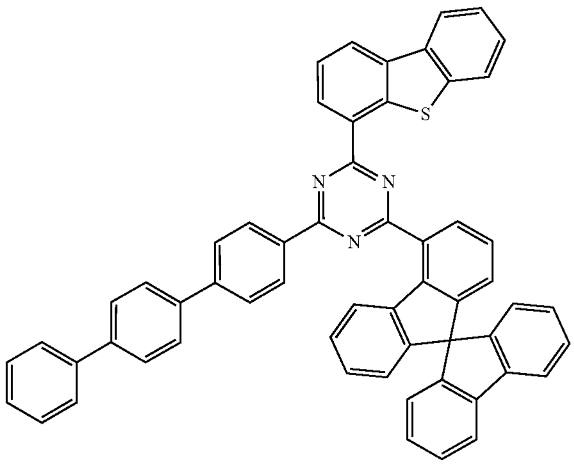
-continued
H1-132
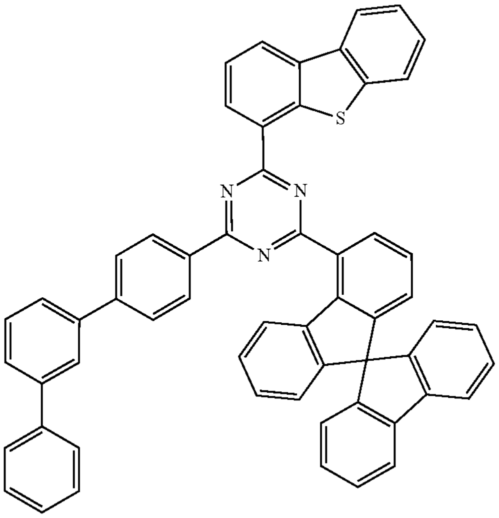
H1-133
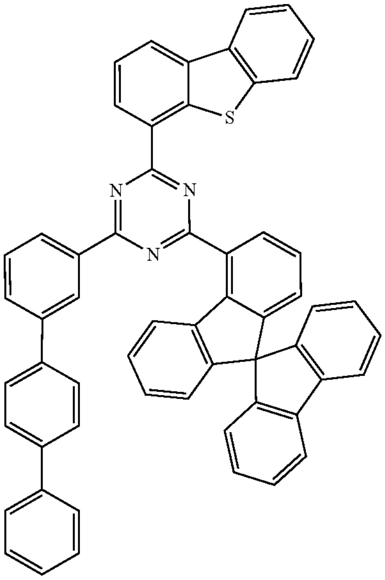
H1-134
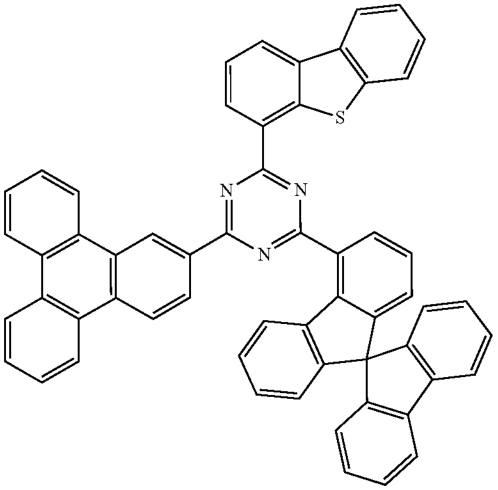

-continued
H1-135
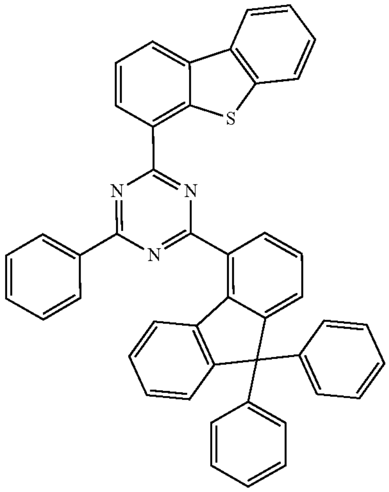
H1-136
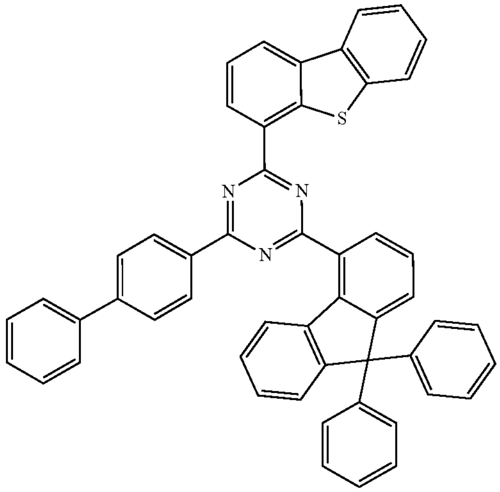
H1-137
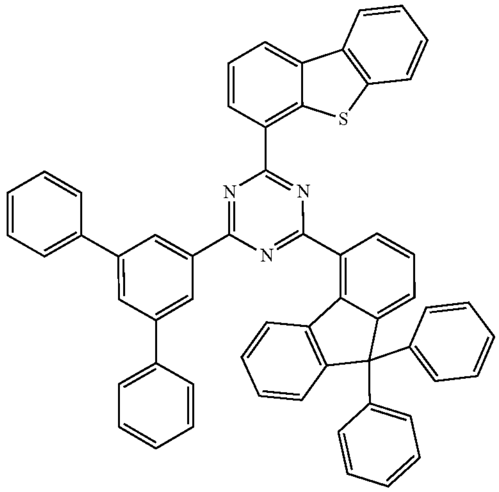
-continued
H1-138
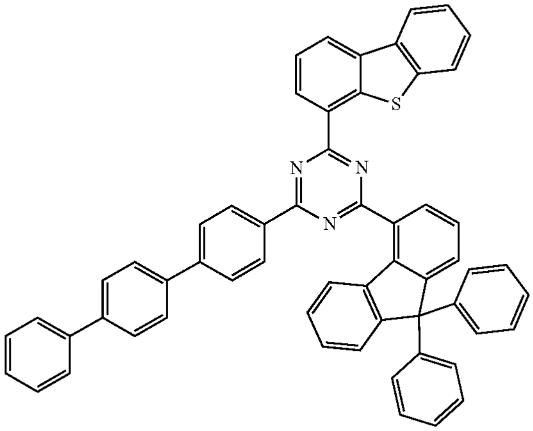
H1-139
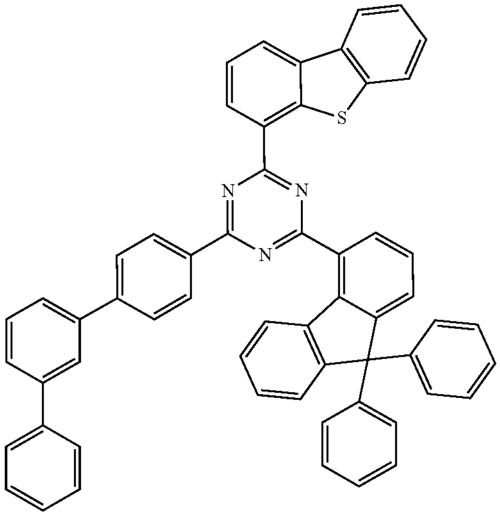
H1-140
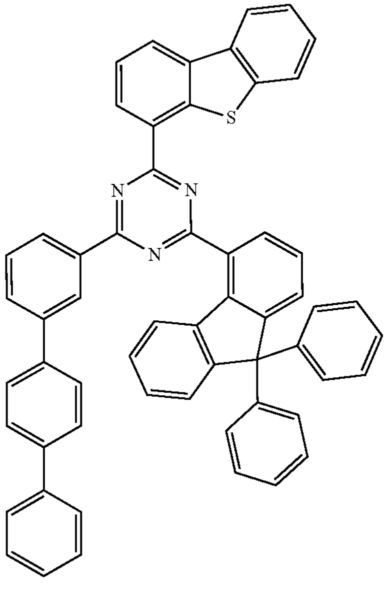

-continued
H1-141
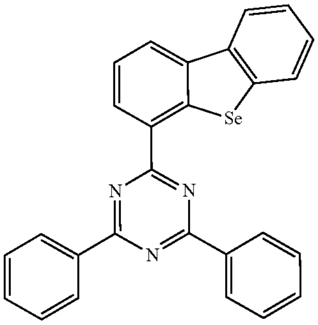
H1-142
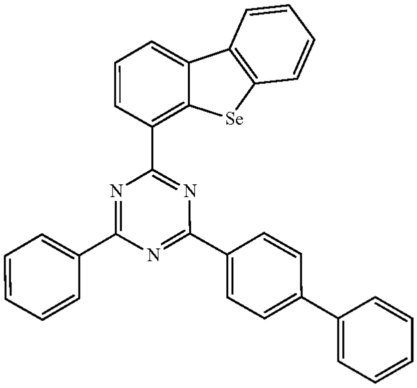
H1-143
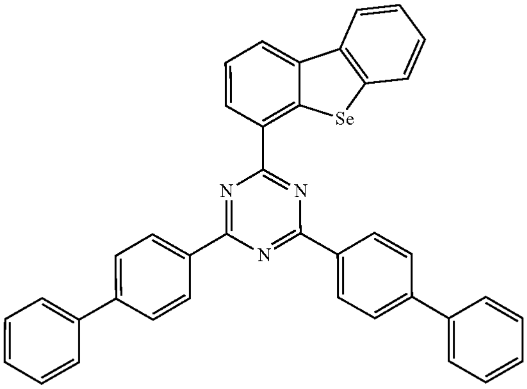
H1-144
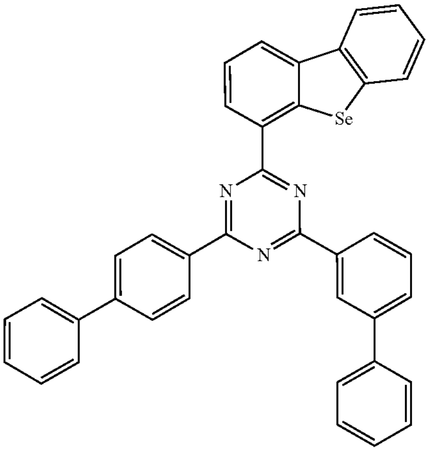
-continued
H1-145
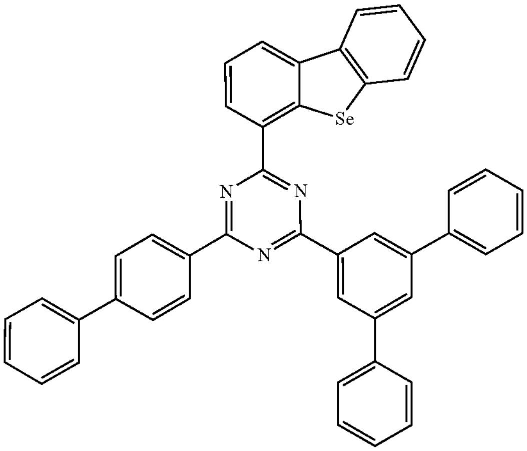
H1-146
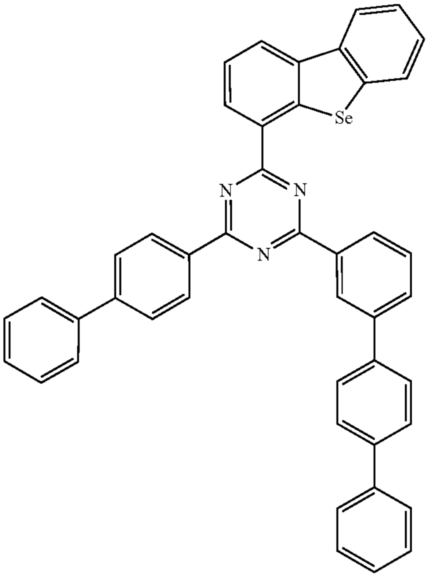
H1-147
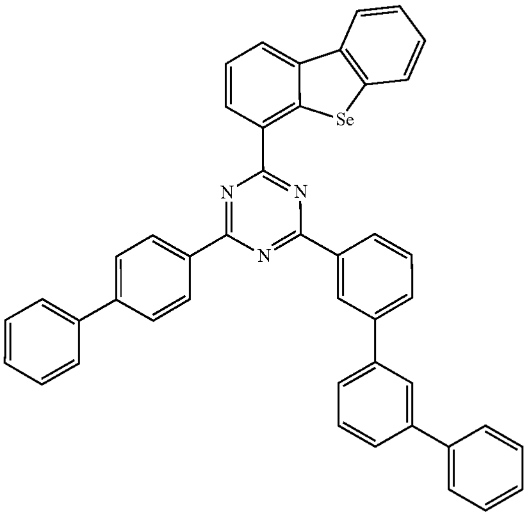

-continued
H1-148
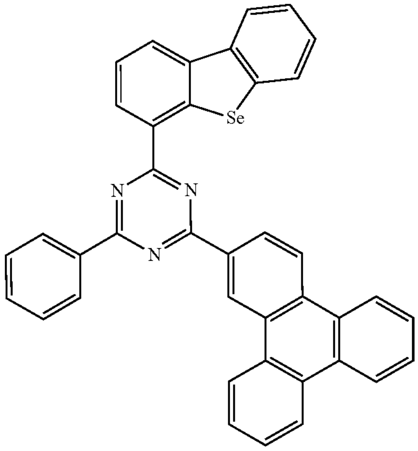
H1-149
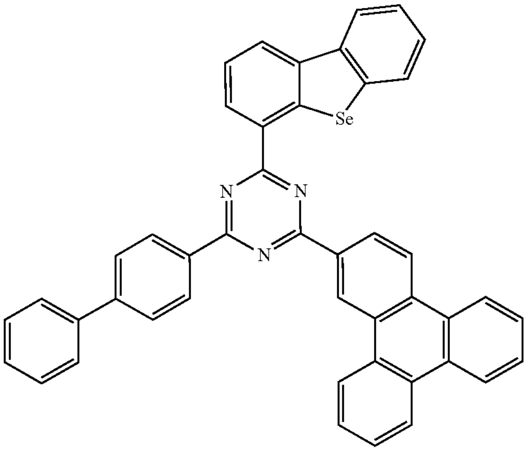
H1-150
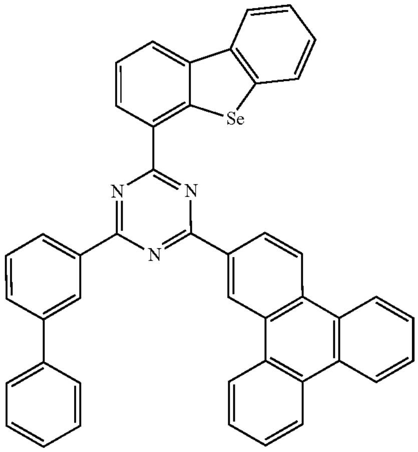
-continued
H1-151
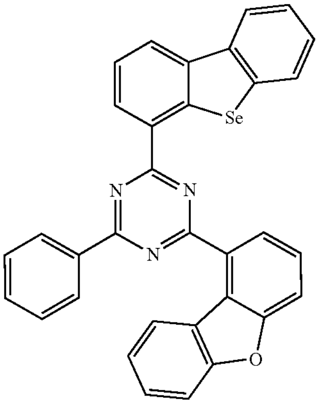
H1-152
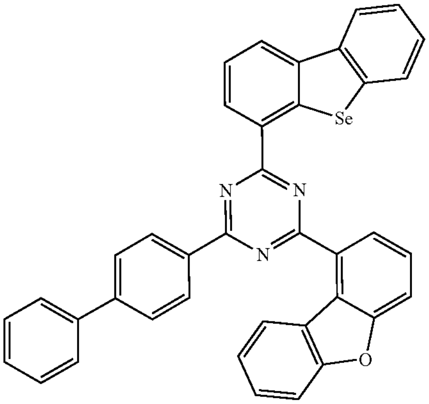
H1-153
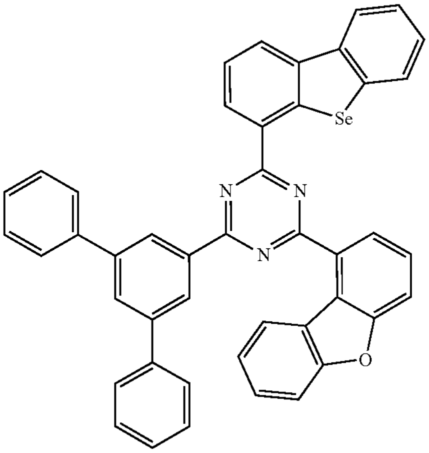

H1-154
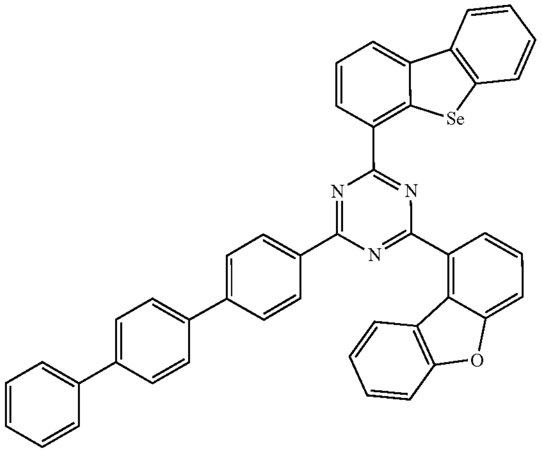
H1-155
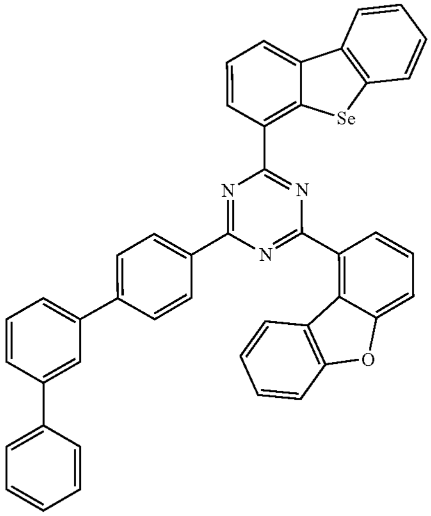
H1-156
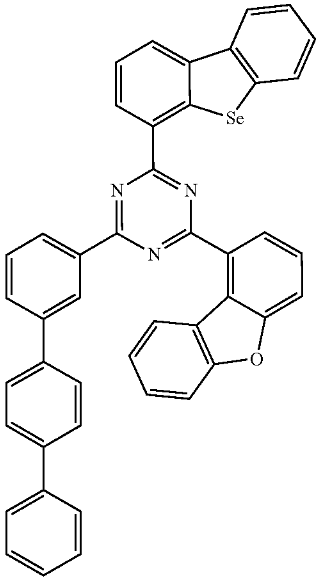
H1-157
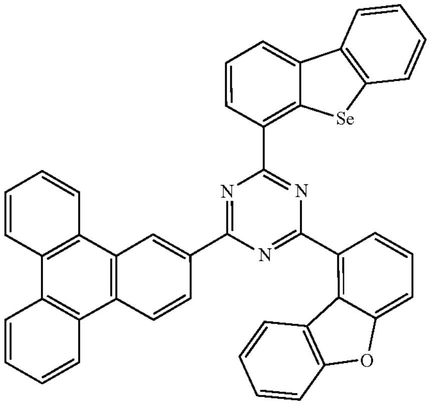
H1-158
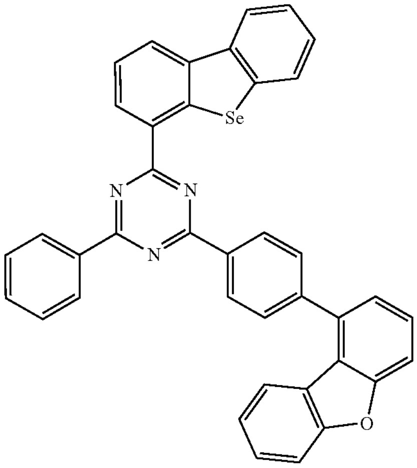
H1-159
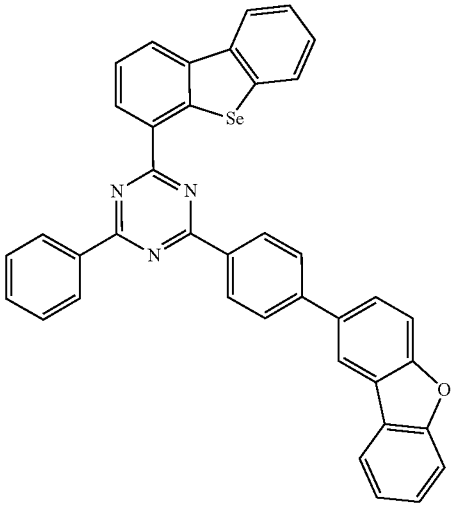

-continued
H1-160
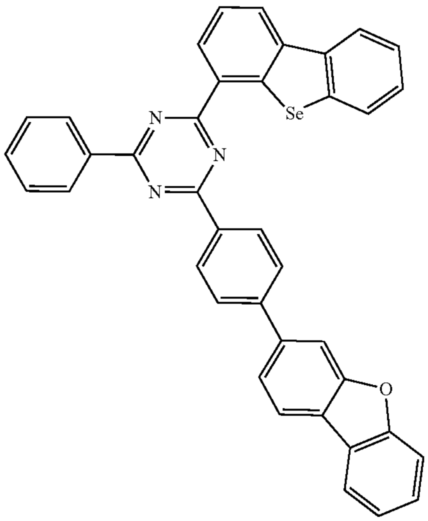
H1-161
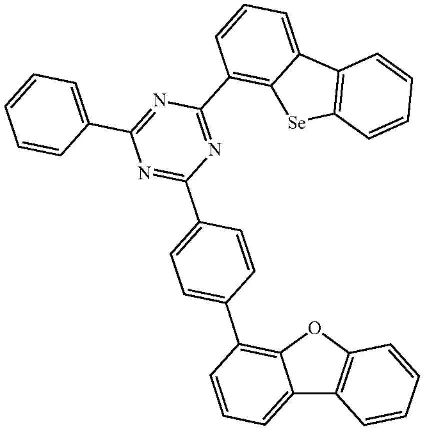
H1-162
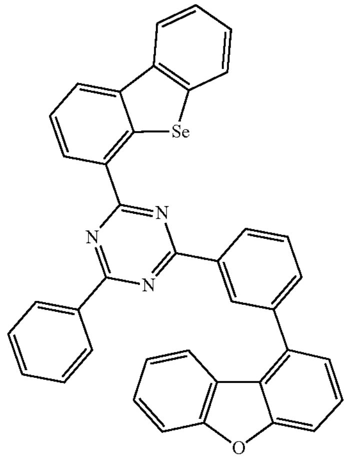
-continued
H1-163
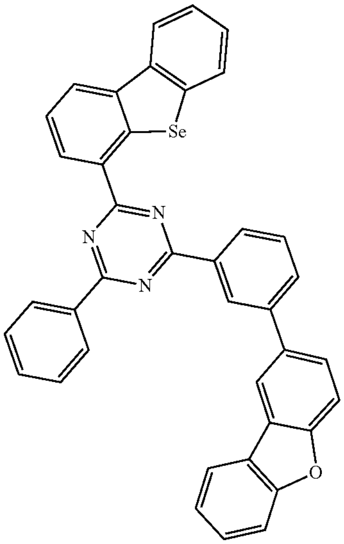
H1-164
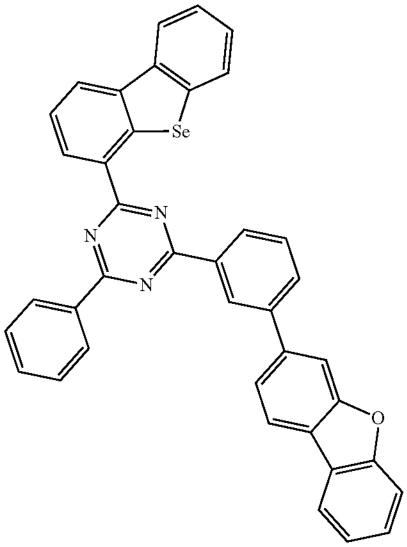
H1-165
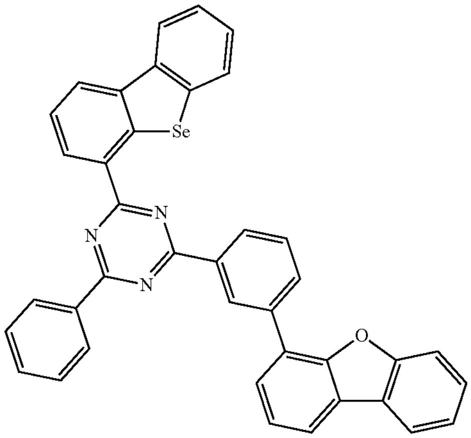

-continued
H1-166
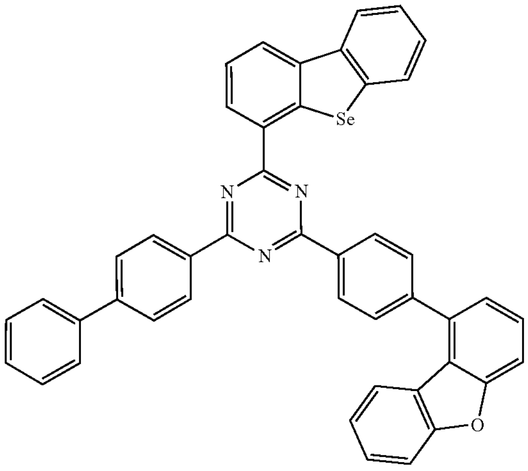
H1-167
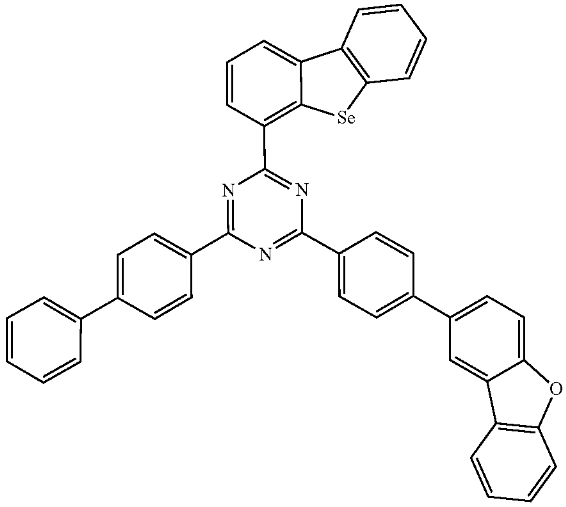
H1-168
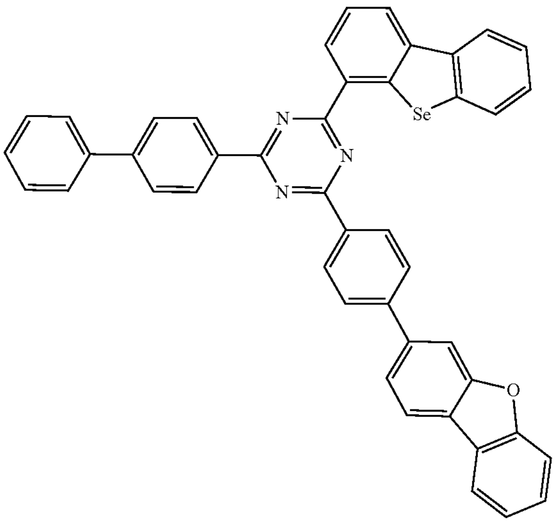
-continued
H1-169
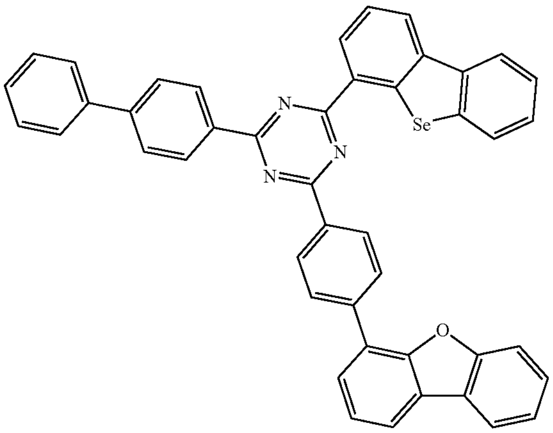
H1-170
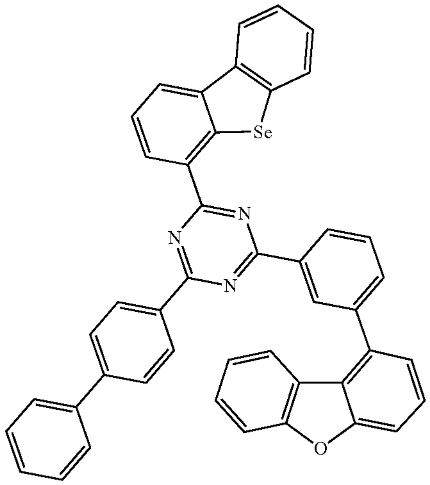
H1-171
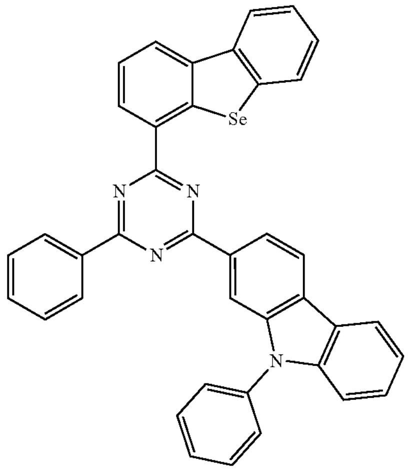

-continued
H1-172
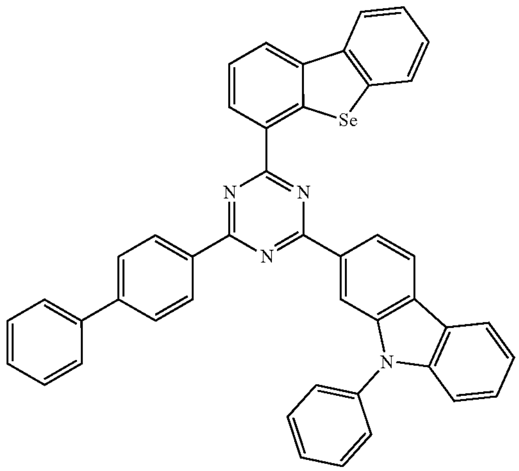
H1-173
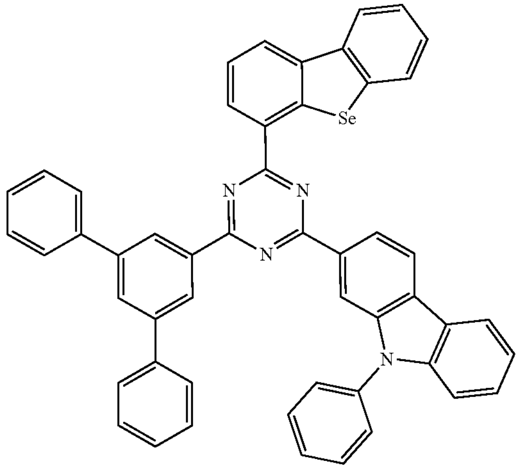
H1-174
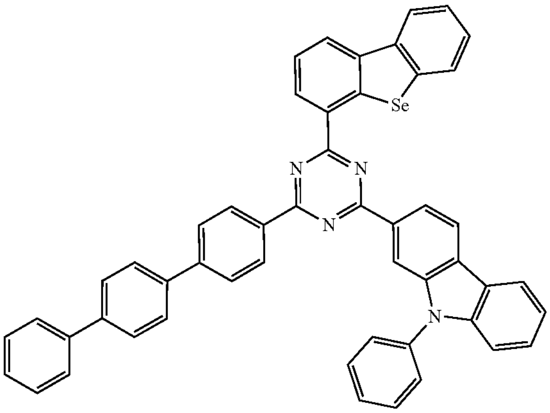
-continued
H1-175
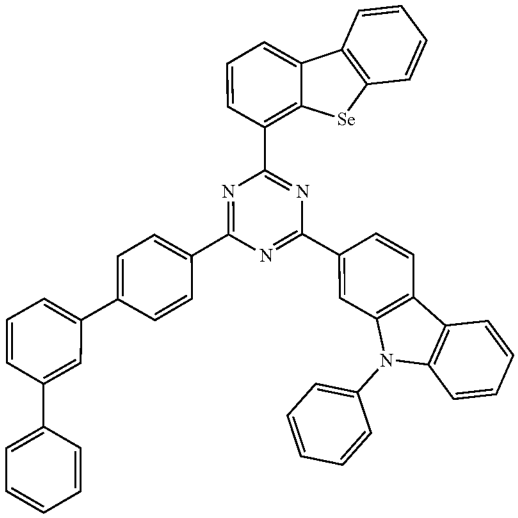
H1-176
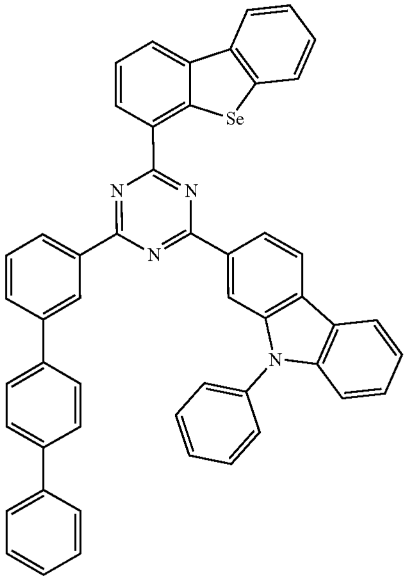
H1-177
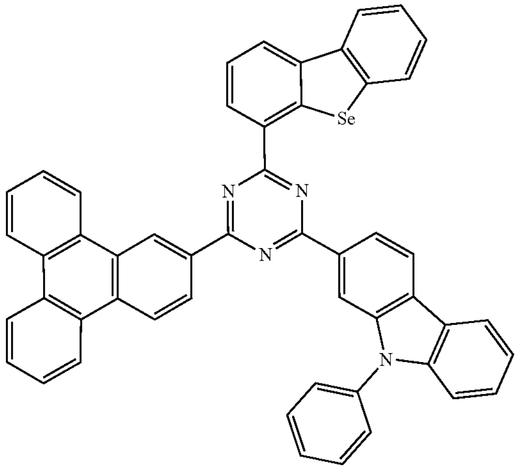

-continued
H1-178
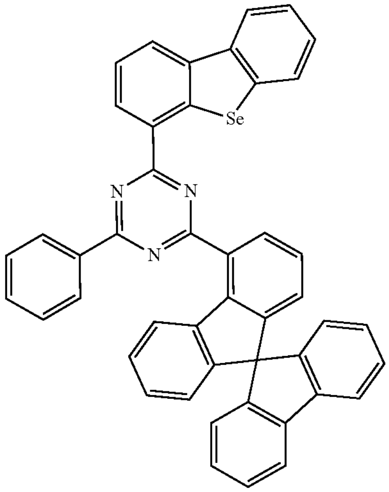
H1-179
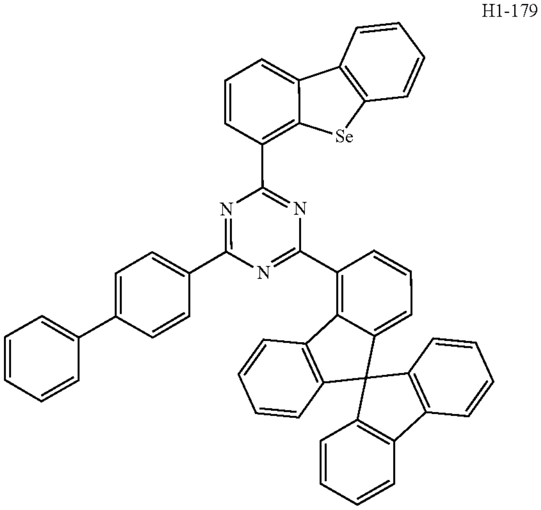
H1-180
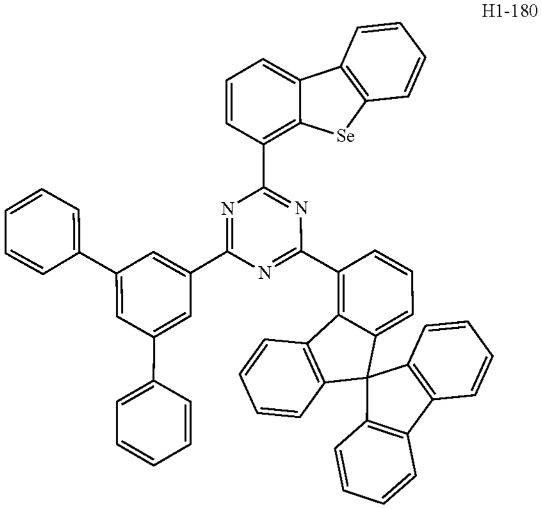
-continued
H1-181
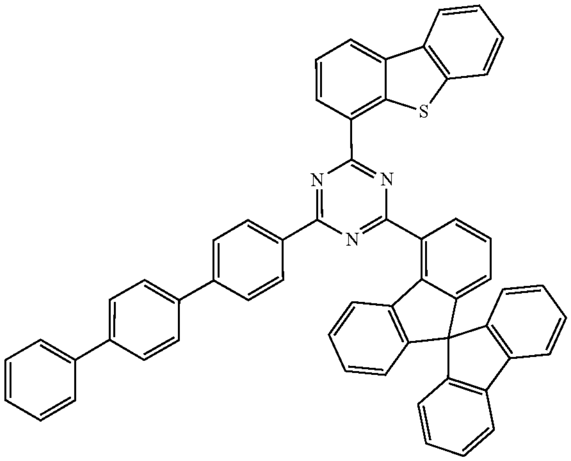
H1-182
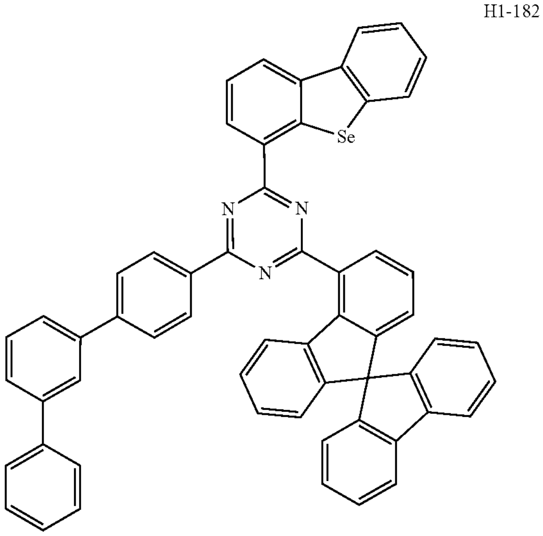
H1-183
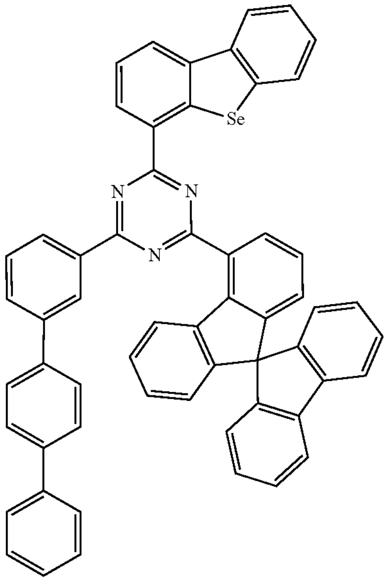

-continued
H1-184
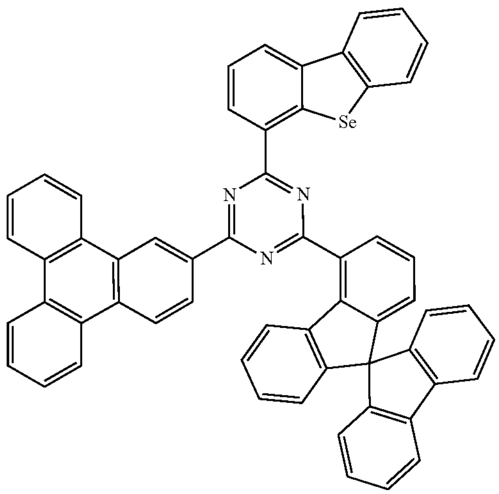
H1-185
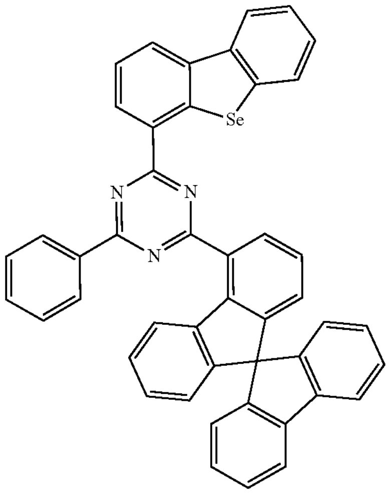
H1-186
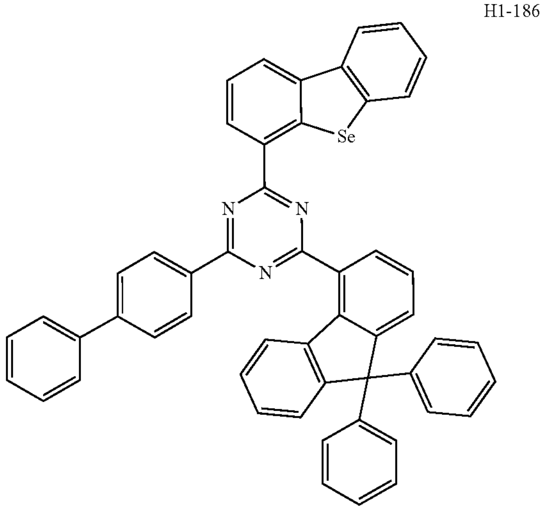
-continued
H1-187
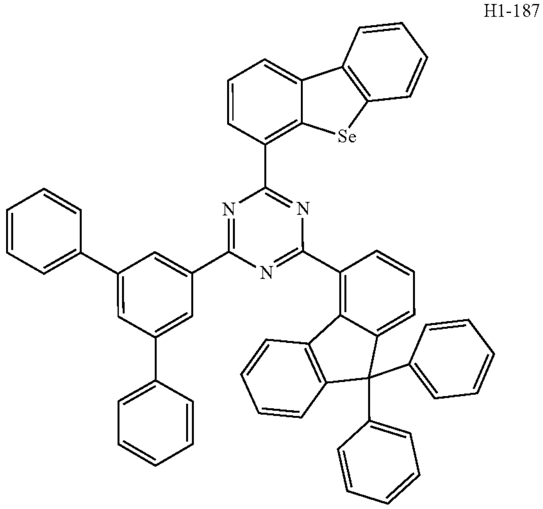
H1-188
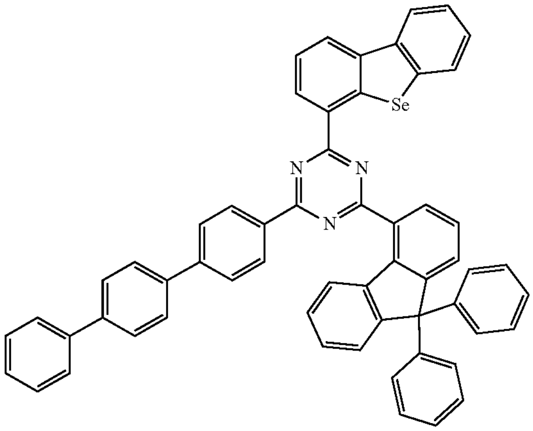
H1-189
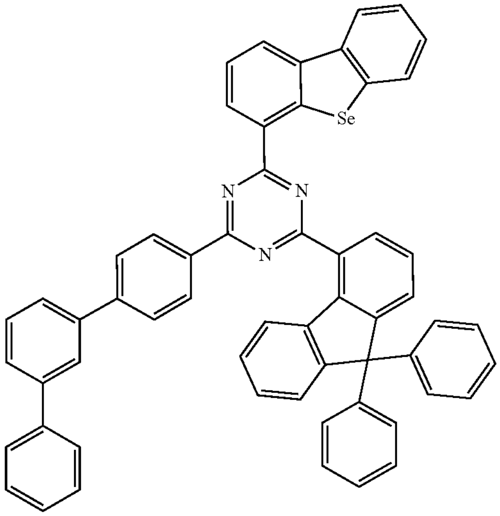

-continued
H1-190
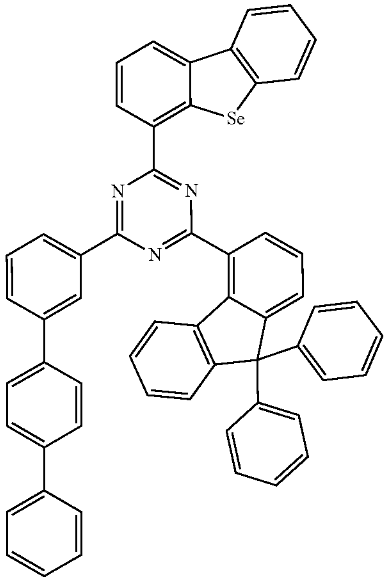
H1-191
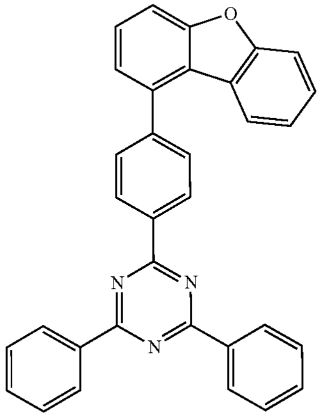
H1-192
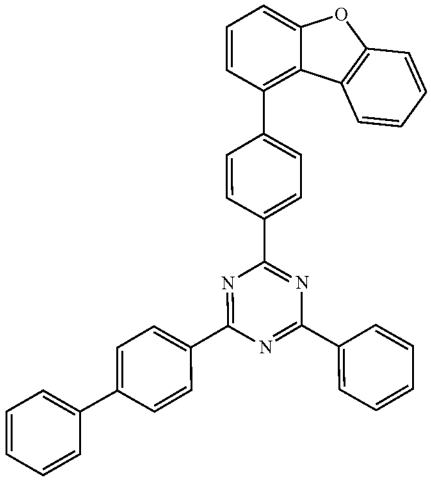
-continued
H1-193
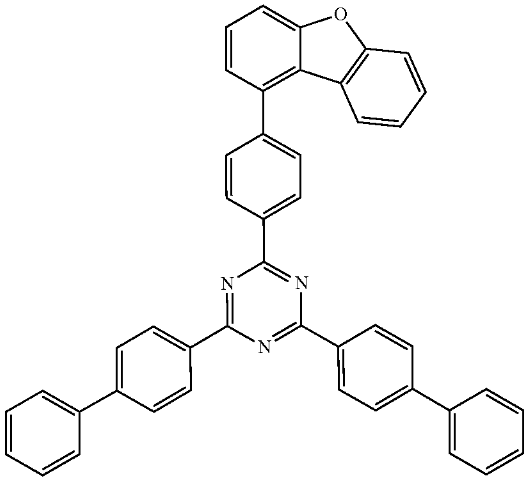
H1-194
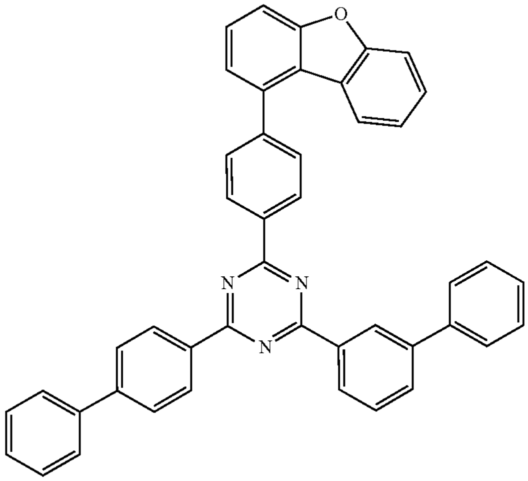
H1-195
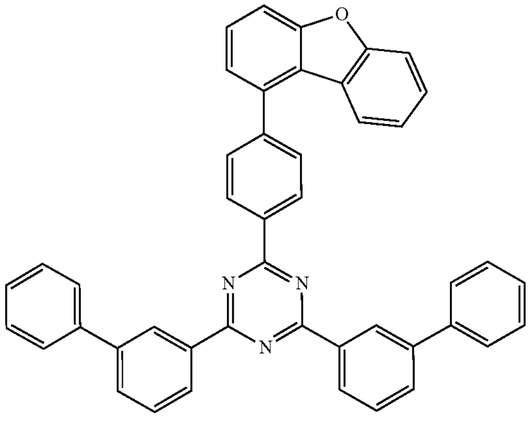

-continued
H1-196
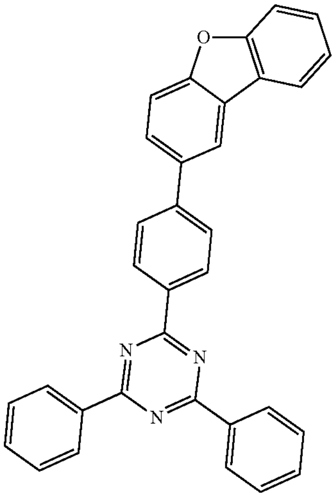
H1-197
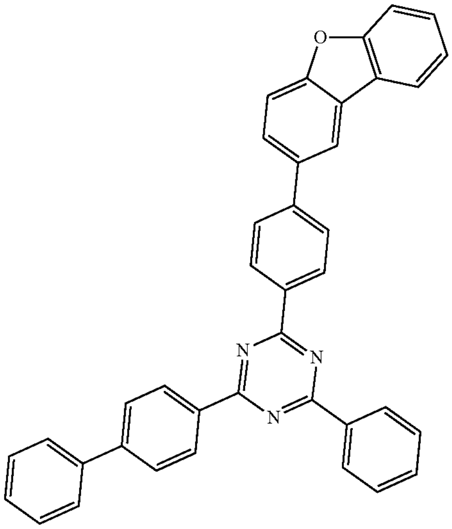
H1-198
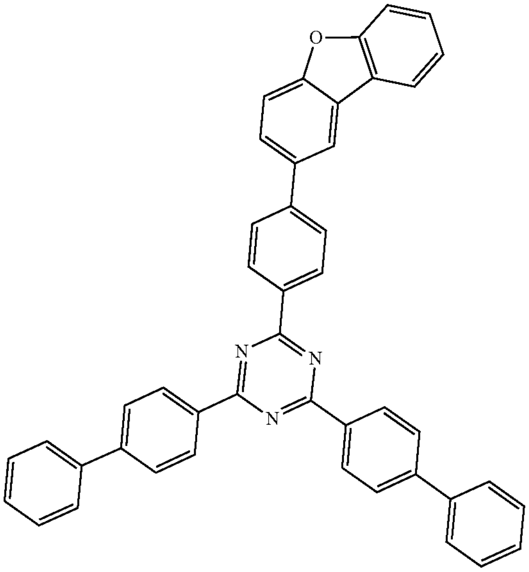
-continued
H1-199
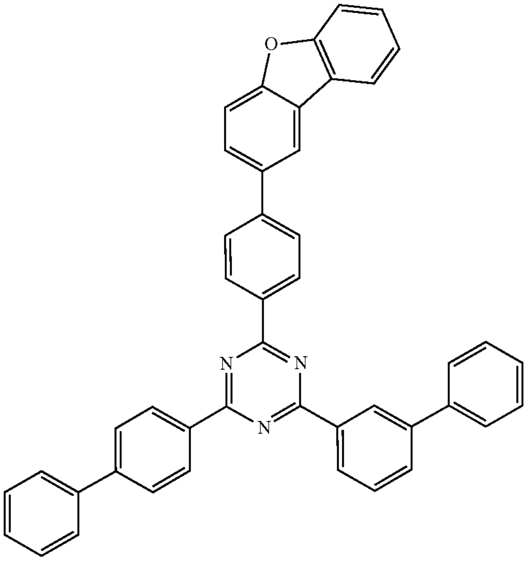
H1-200
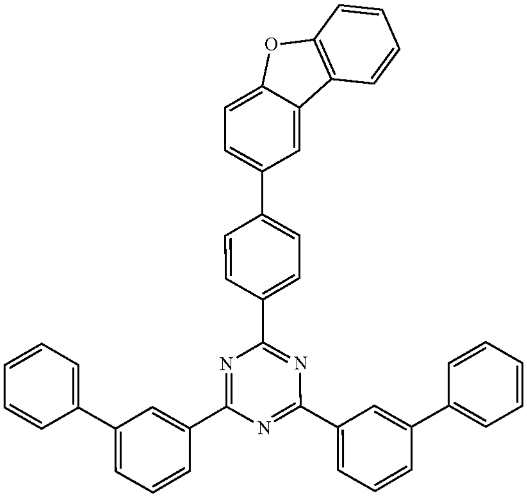
H1-201
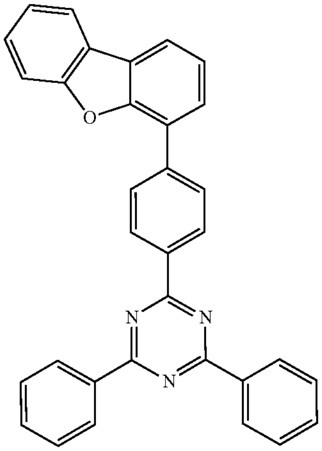

-continued
H1-202
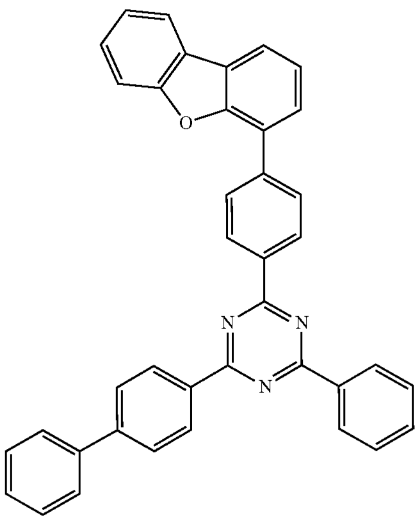
H1-203
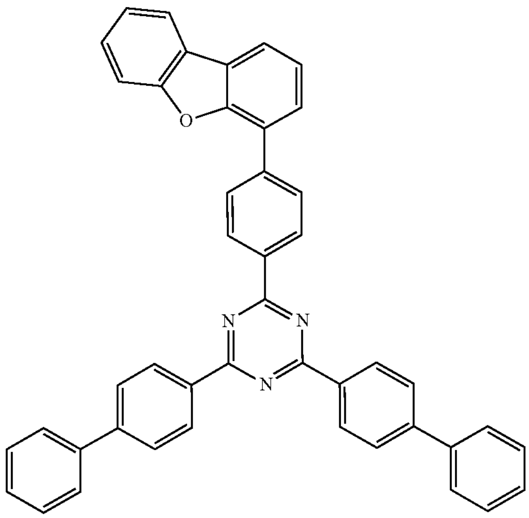
H1-204
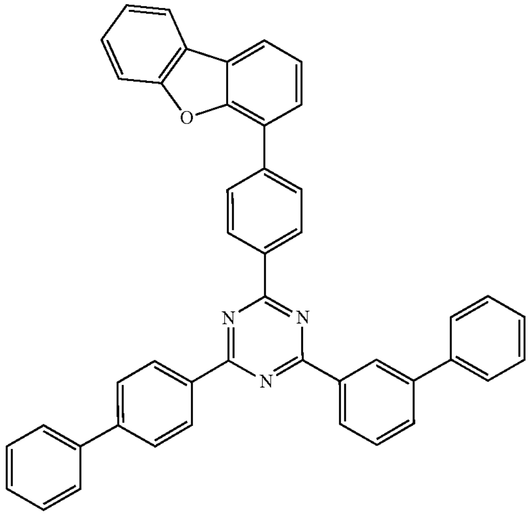
-continued
H1-205
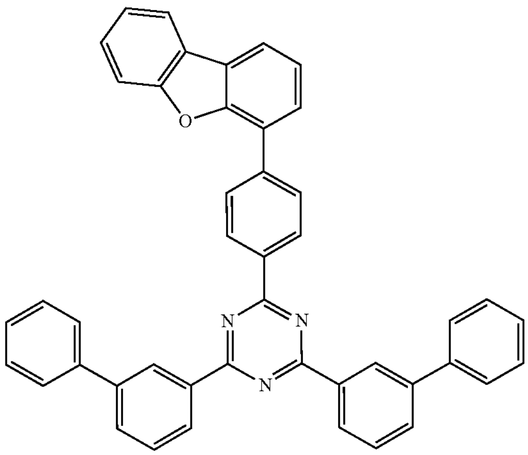
H1-206
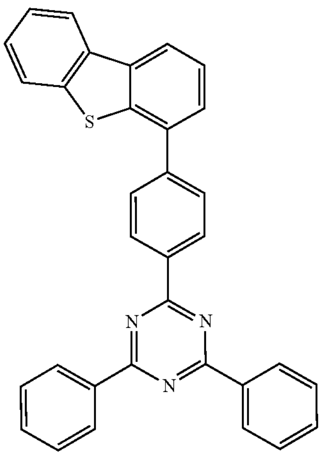
H1-207
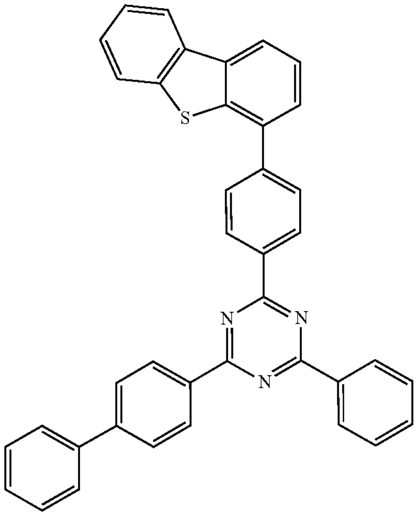

-continued
H1-208
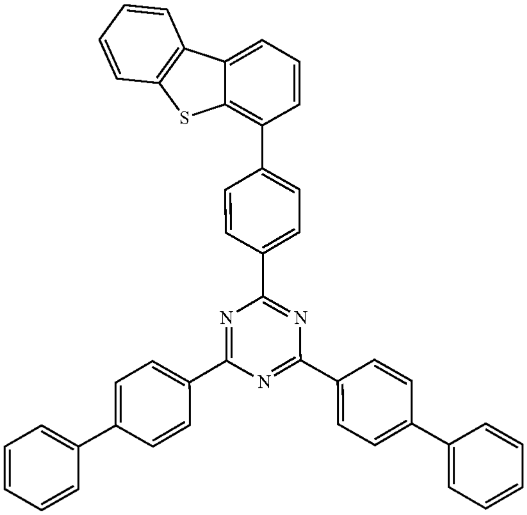
H1-209
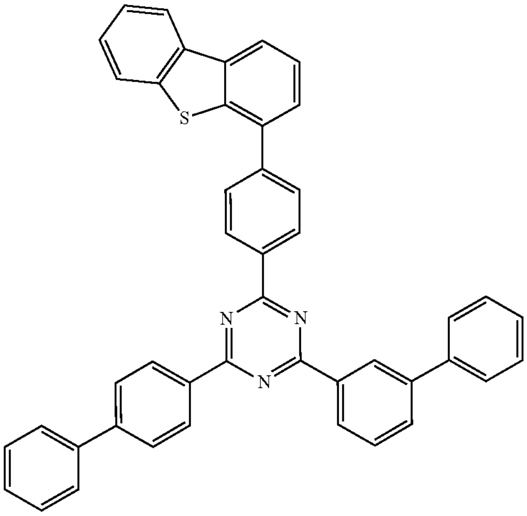
H1-210
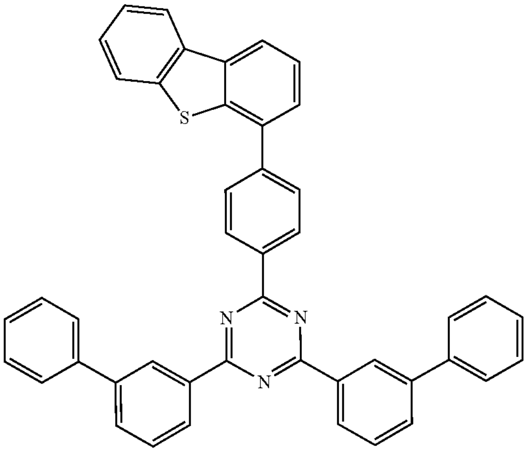
-continued
H1-211
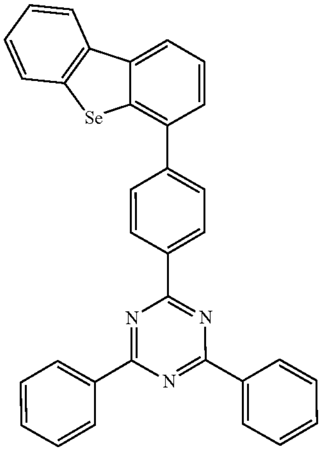
H1-212
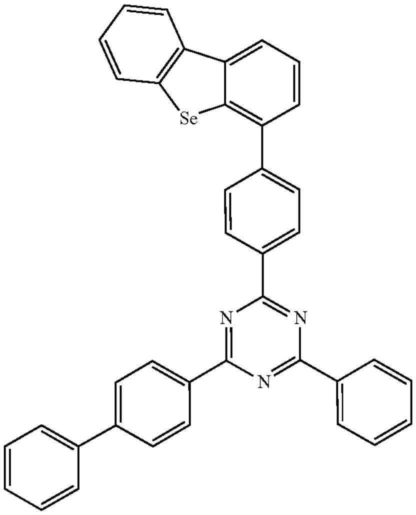
H1-213
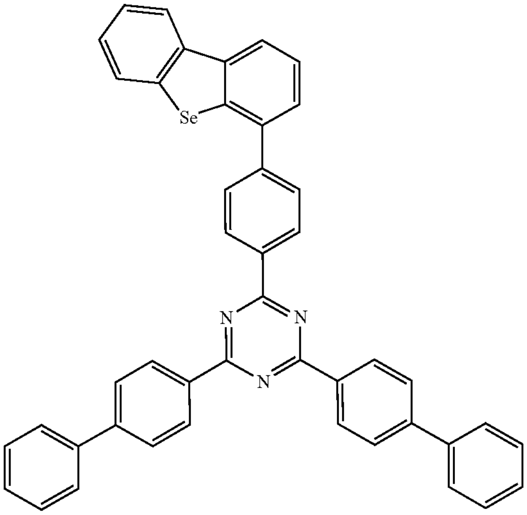

-continued
H1-214
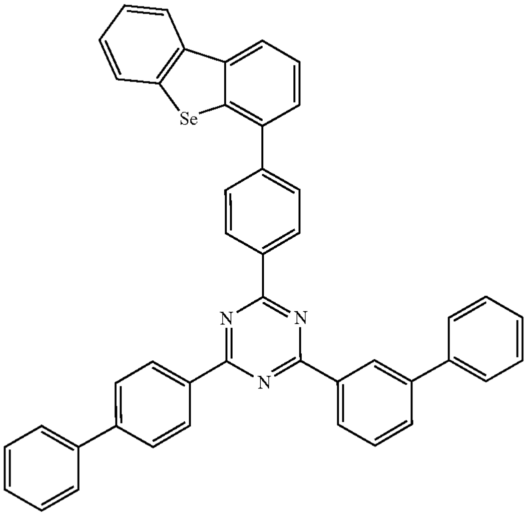
H1-215
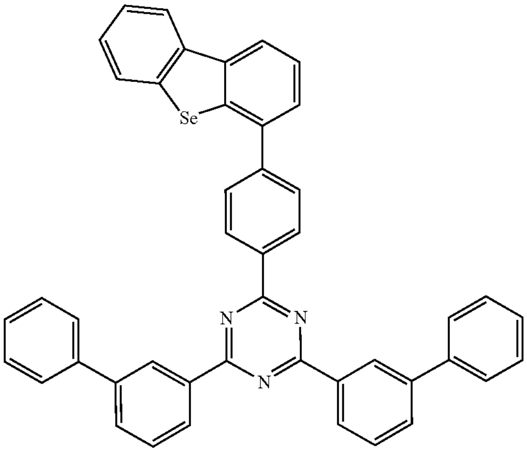
H1-216
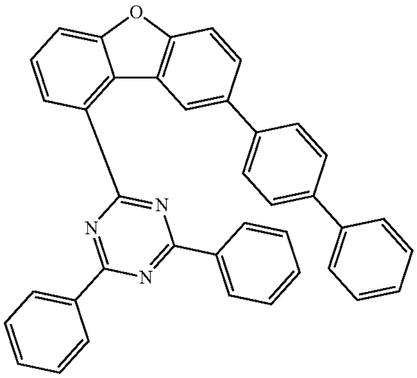
-continued
H1-217
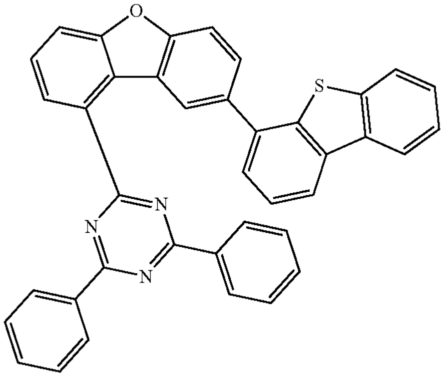
H1-218
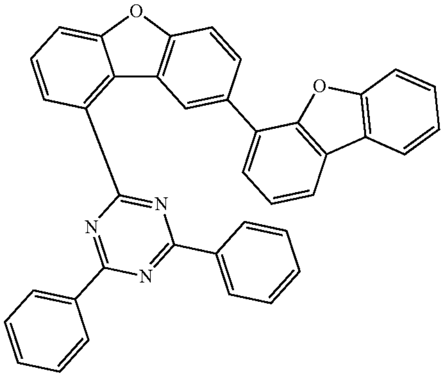
H1-219
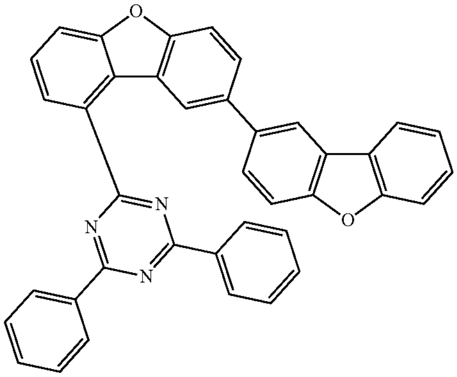
H1-220
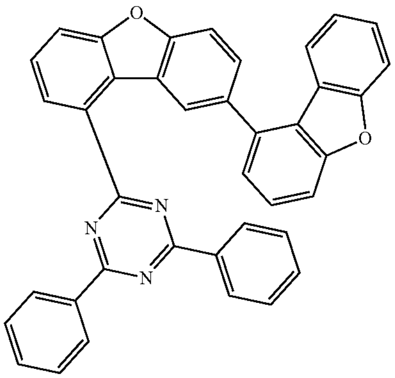

-continued
H1-221
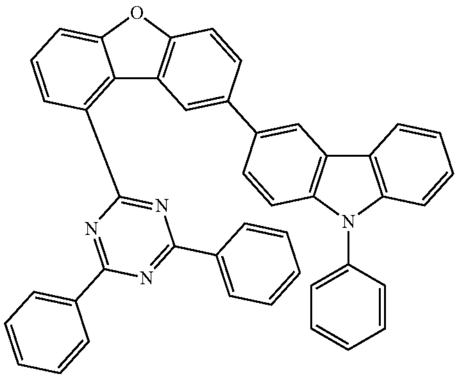
H1-222
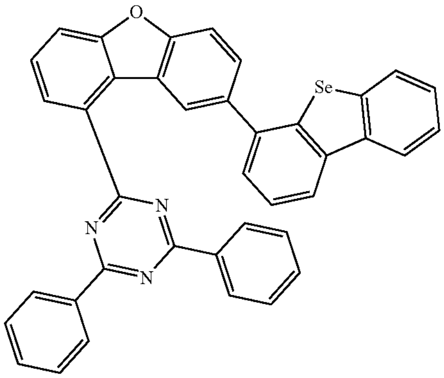
H1-223
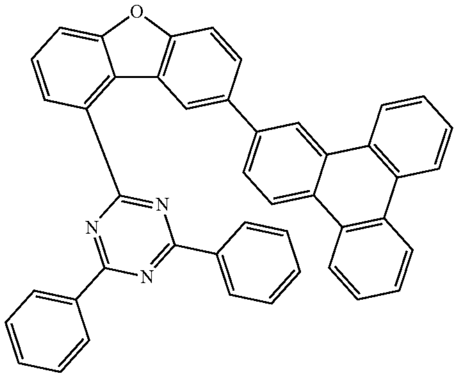
H1-224
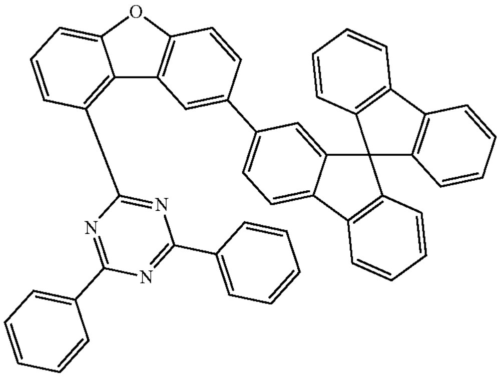
-continued
H1-225
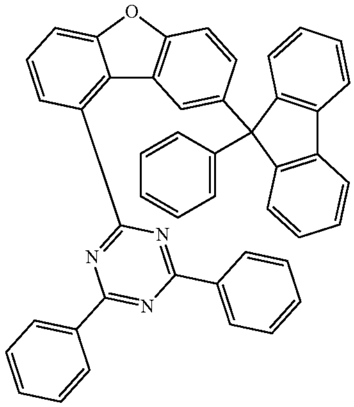
H1-226
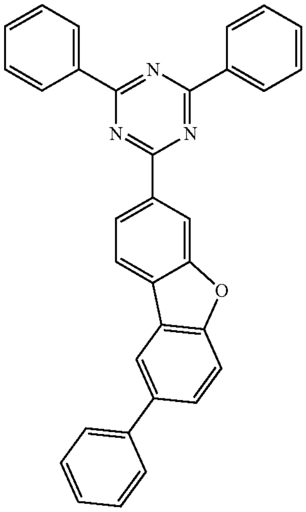
H1-227
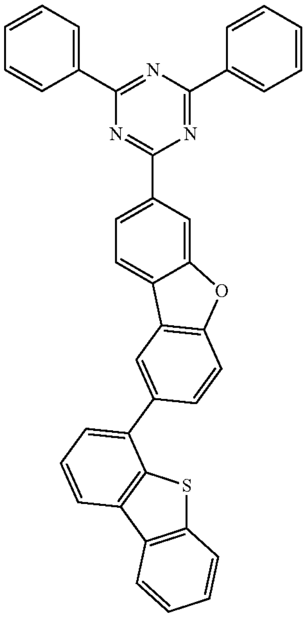

-continued
H1-228
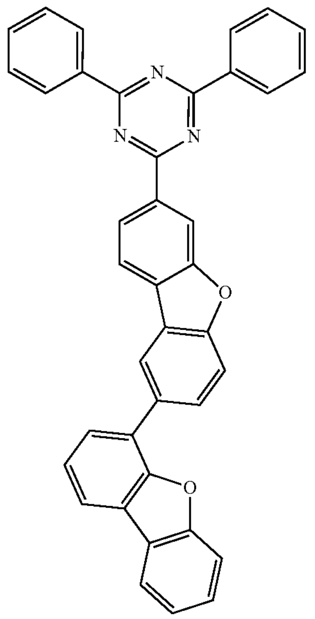
H1-229
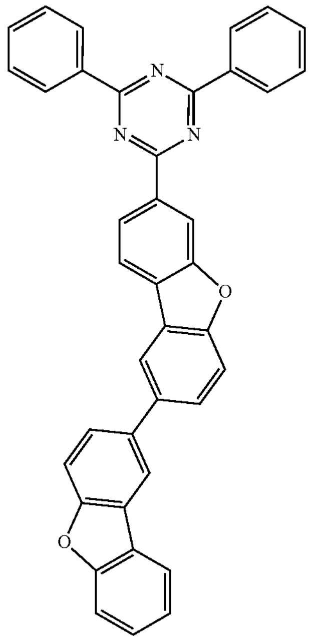
-continued
H1-230
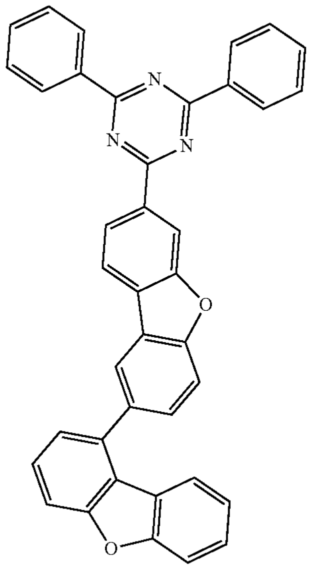
H1-231
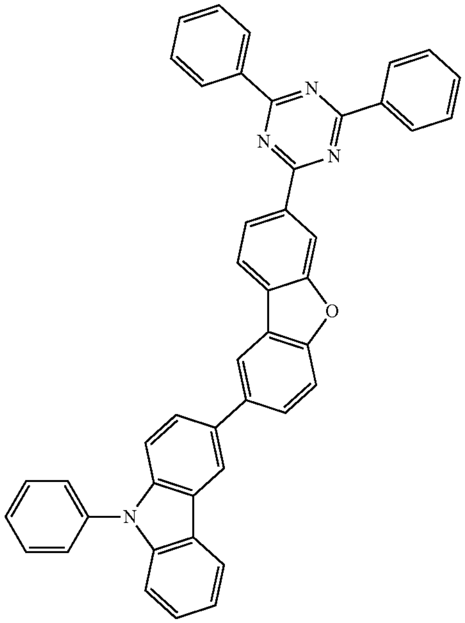

H1-232
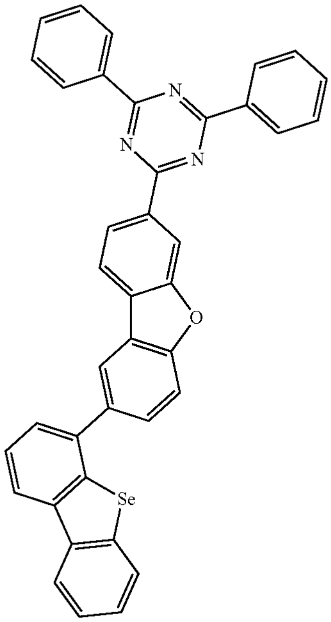
H1-233
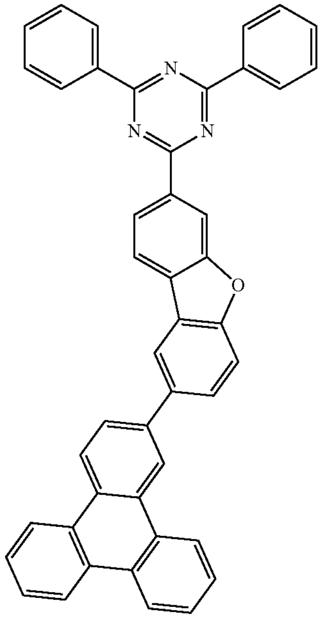
H1-234
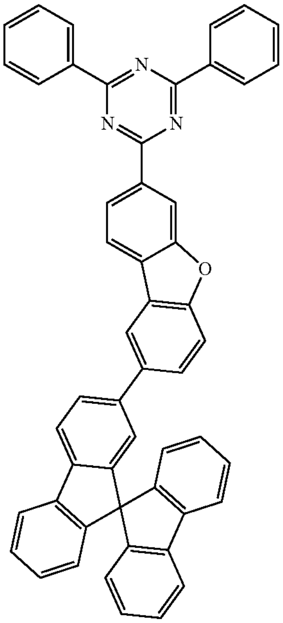
H1-235
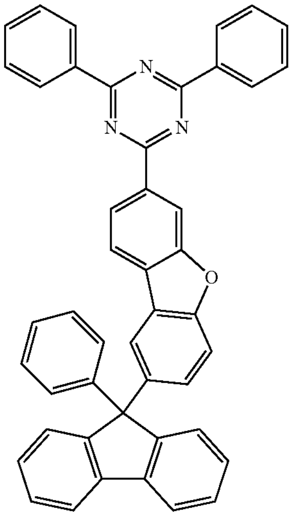

-continued
H1-236
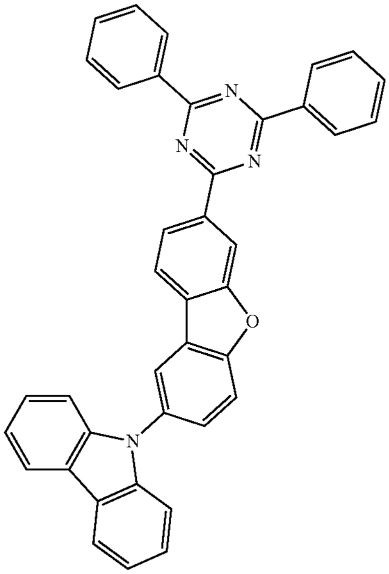
-continued
H1-238
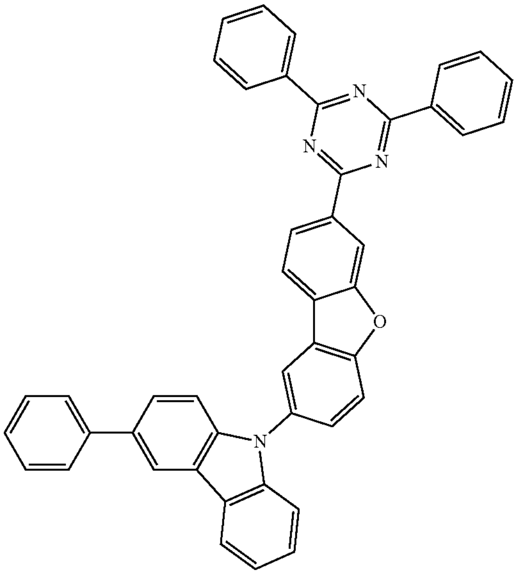
H1-237
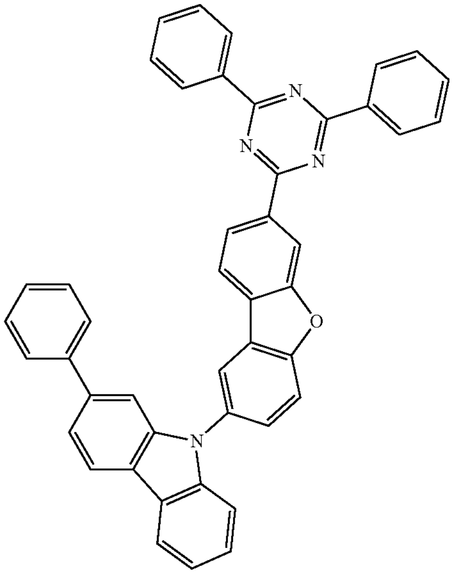
H1-239
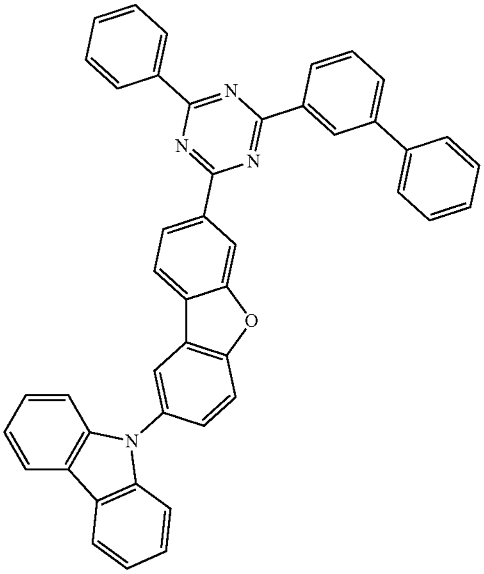

-continued
H1-240
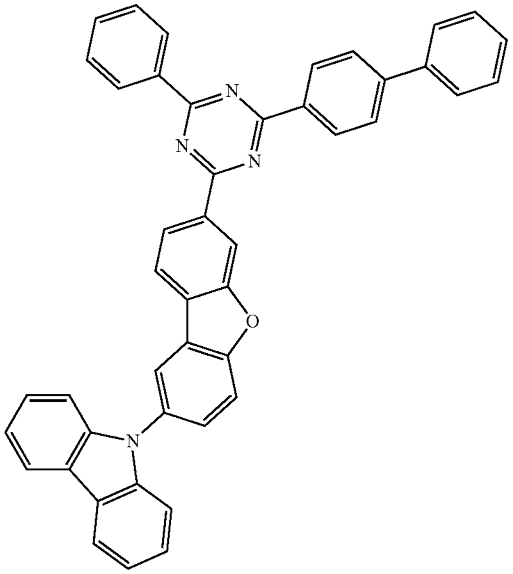
H1-241
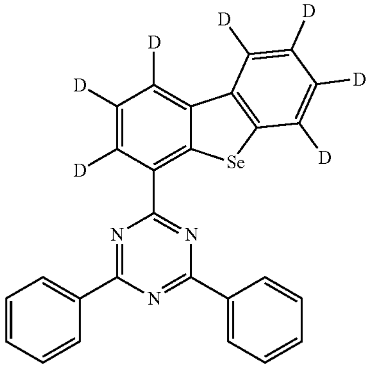
H1-242
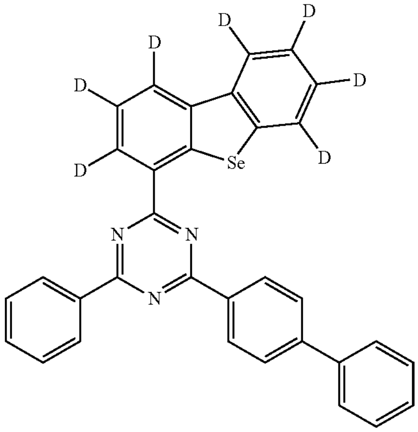
-continued
H1-243
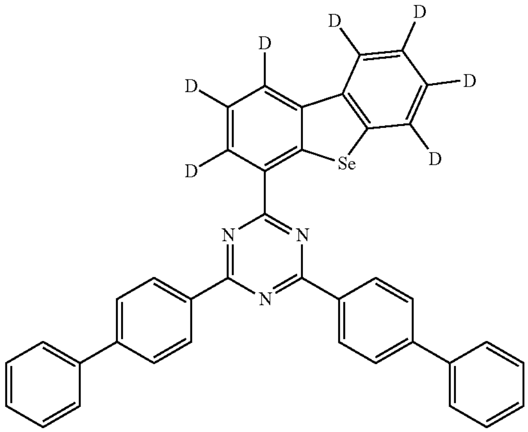
H1-244
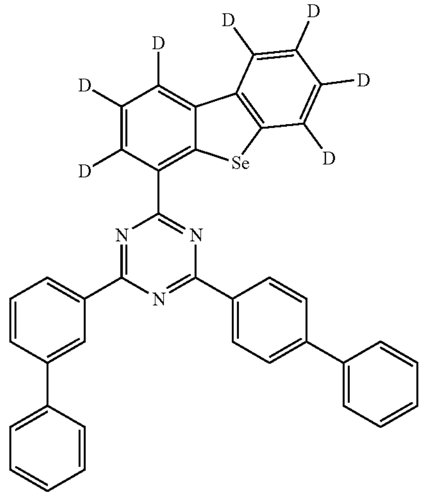
H1-245
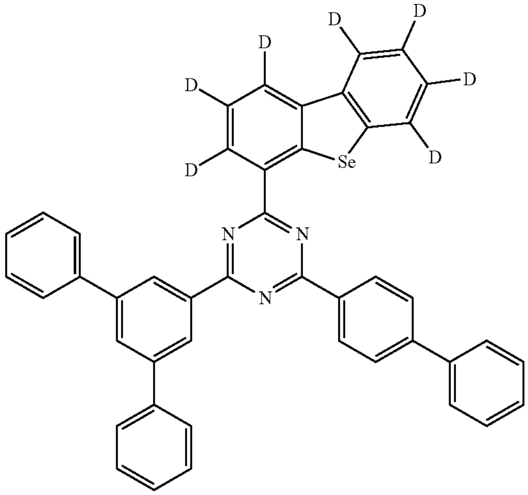

-continued
H1-246
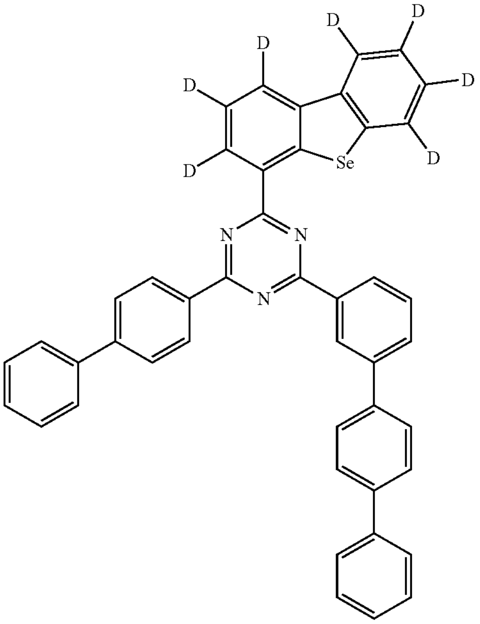
H1-247
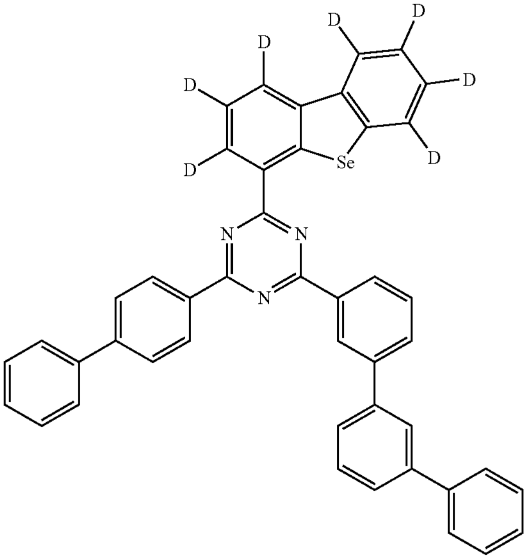
-continued
H1-248
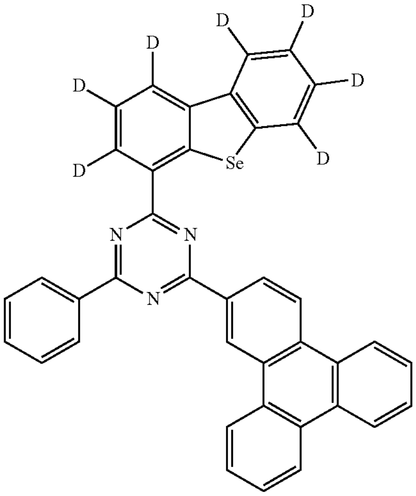
H1-249
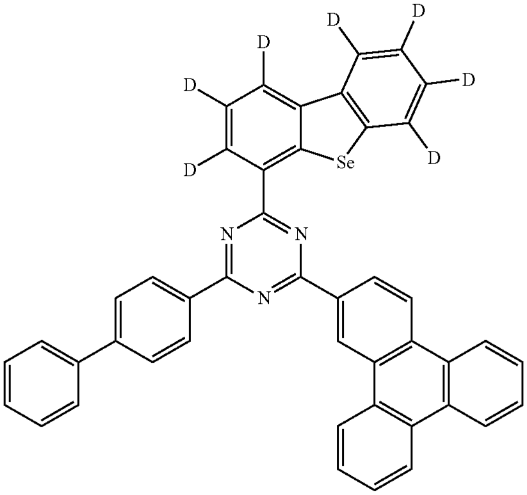
H1-250
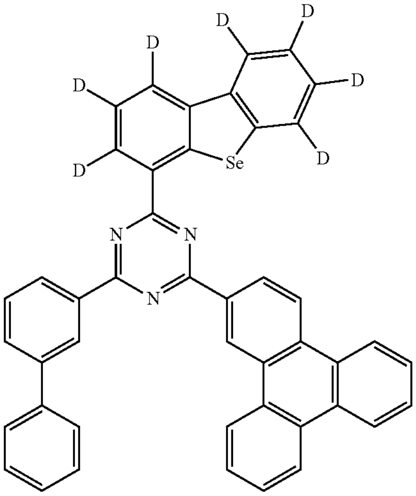

-continued
H1-251
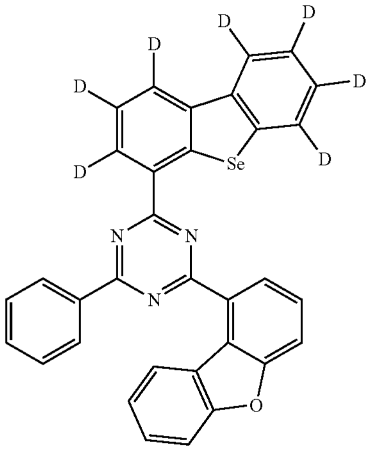
H1-252
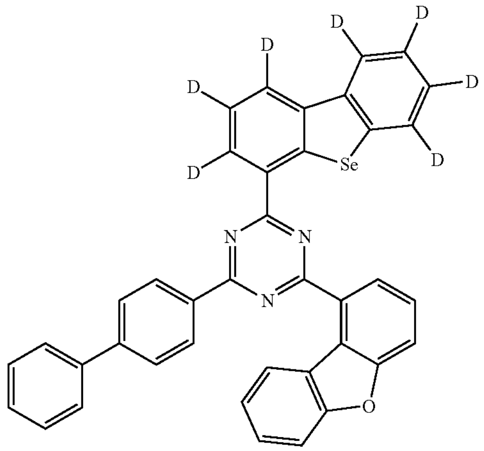
H1-253
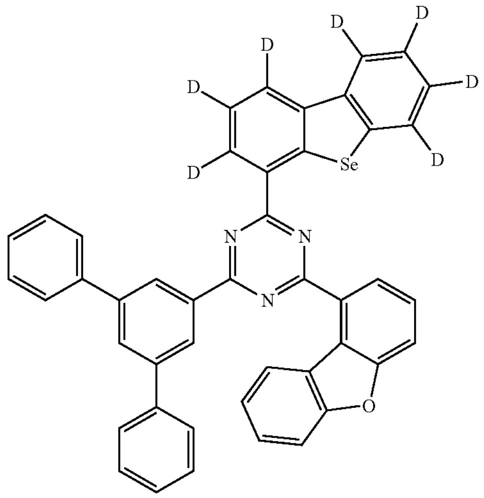
-continued
H1-254
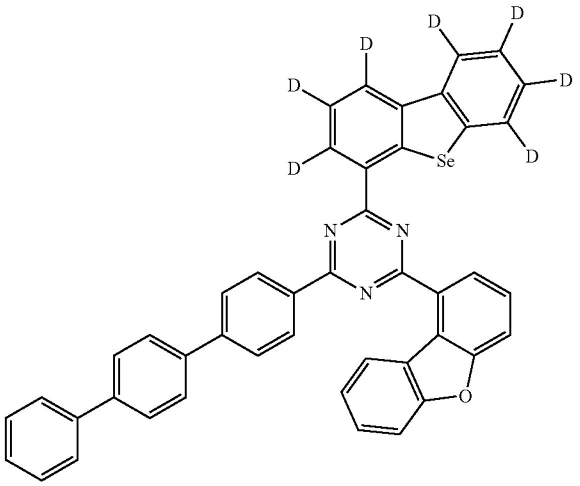
H1-255
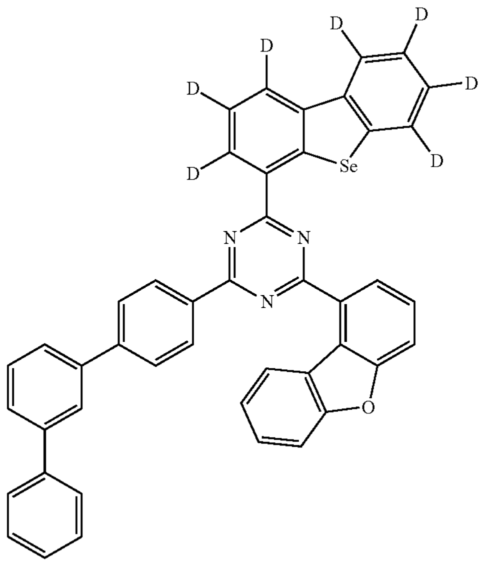
H1-256
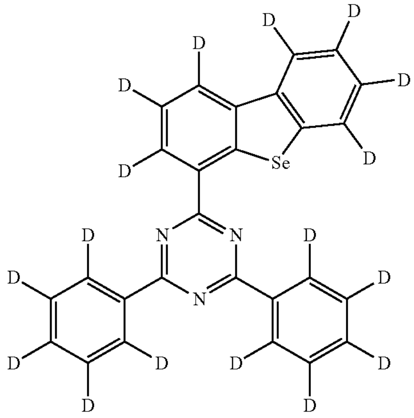

-continued
H1-257
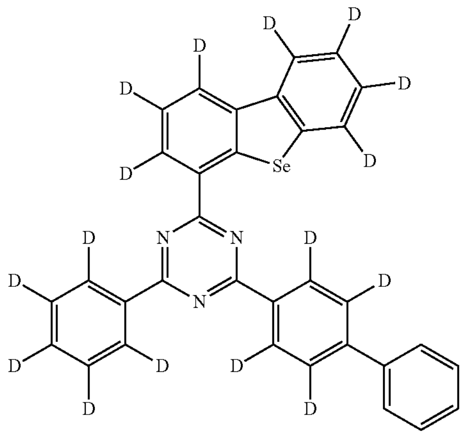
H1-258
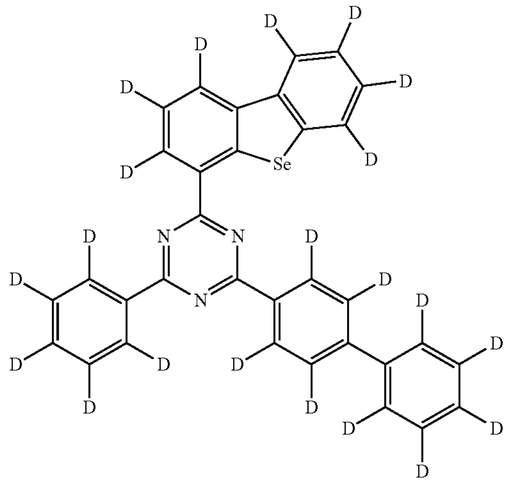
H1-259
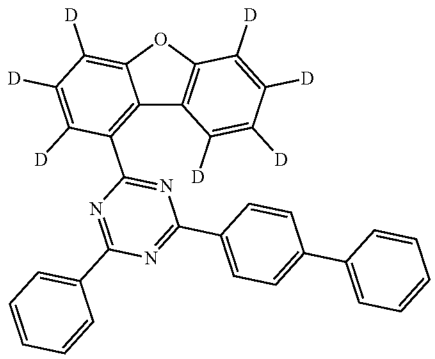
-continued
H1-260
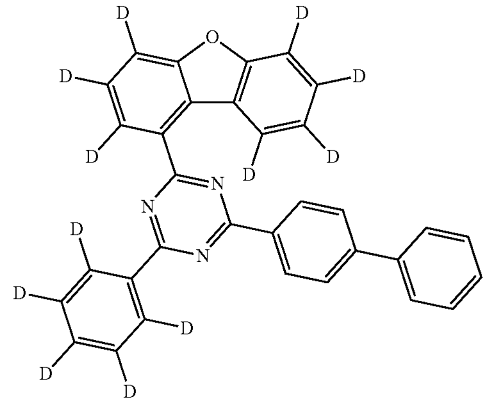
H1-261
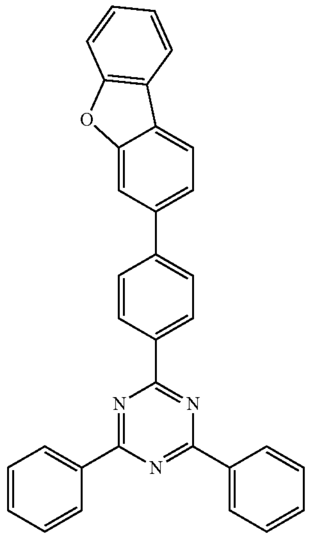
H1-262
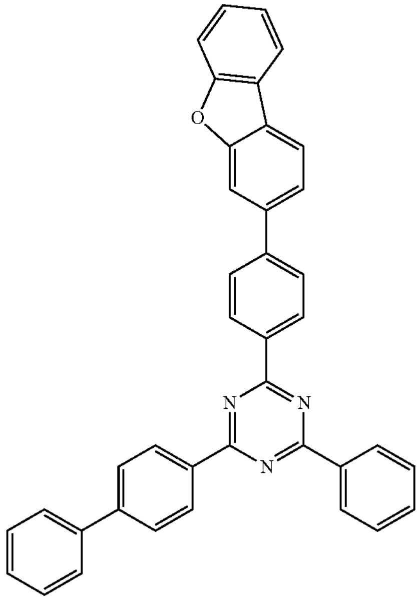

-continued
H1-263
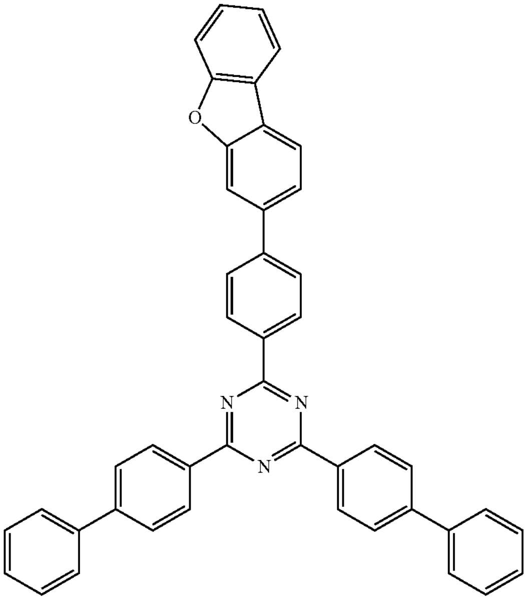
H1-264
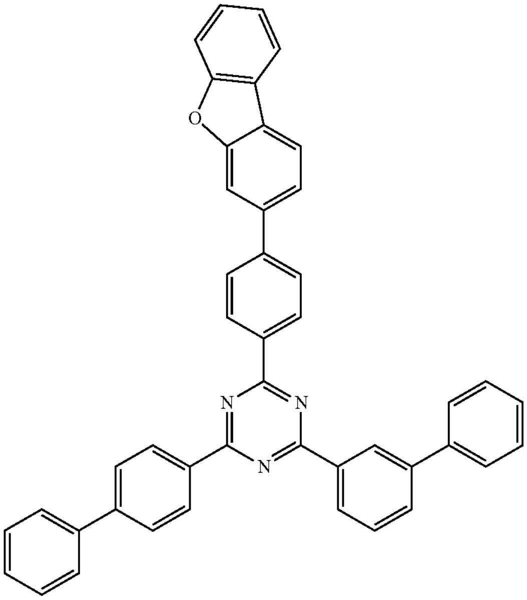
-continued
H1-265
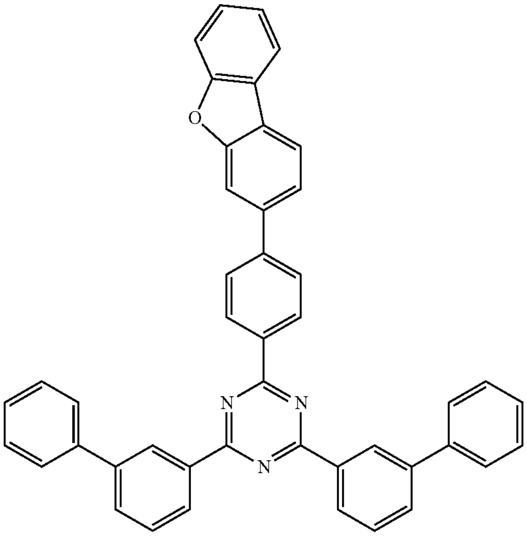
H1-266
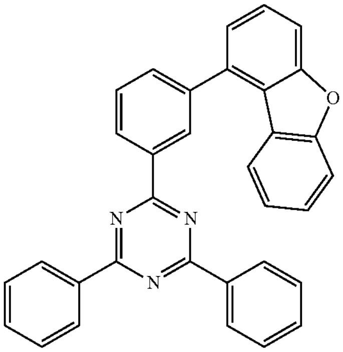
H1-267
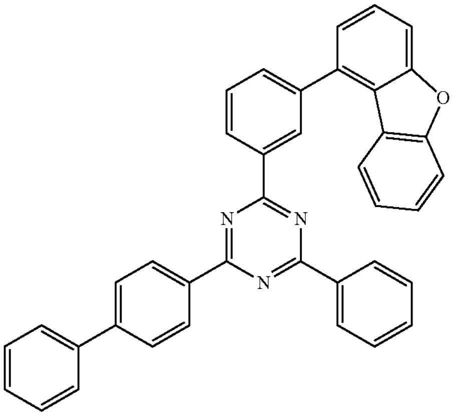

-continued
H1-268
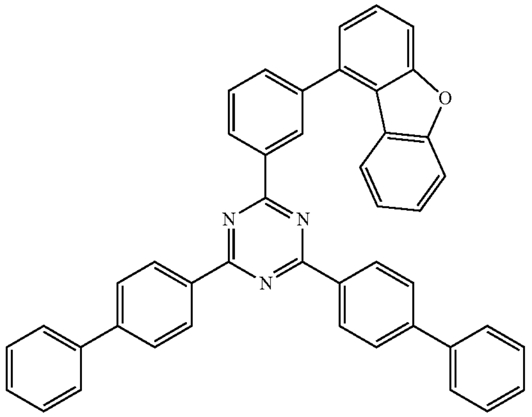
H1-269
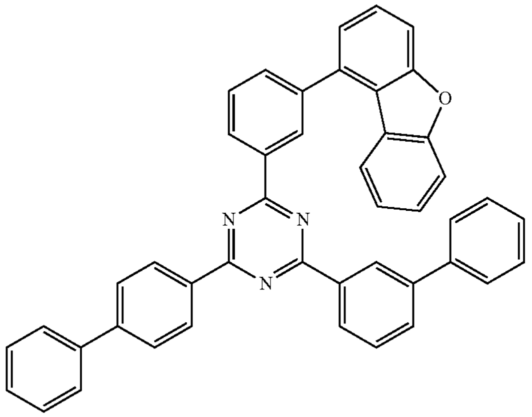
H1-270
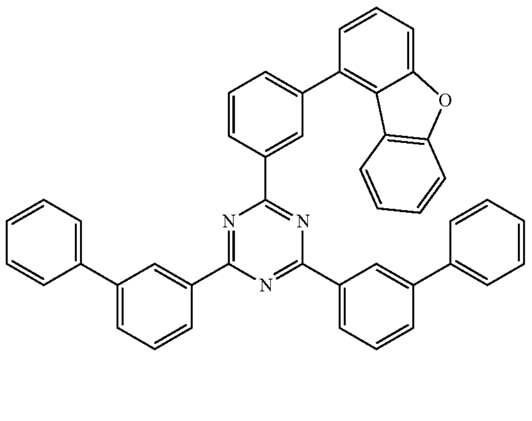
-continued
H1-271
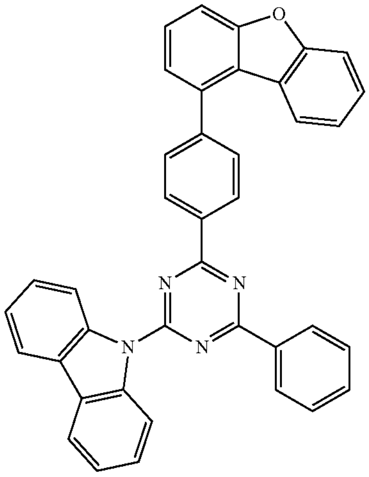
H1-272
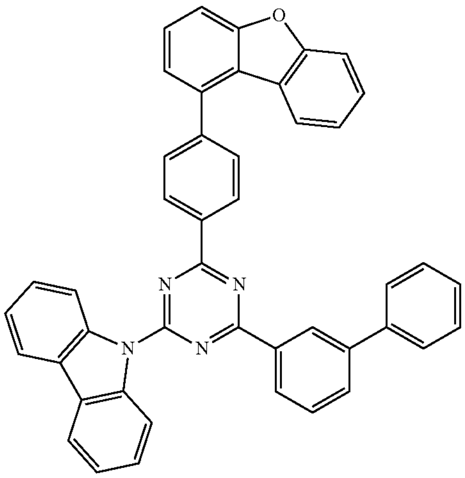
H1-273
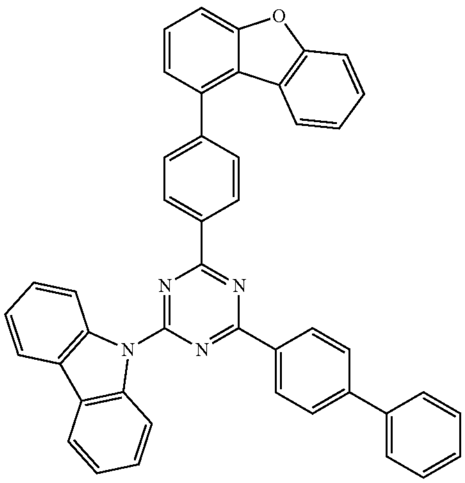

-continued
H1-274
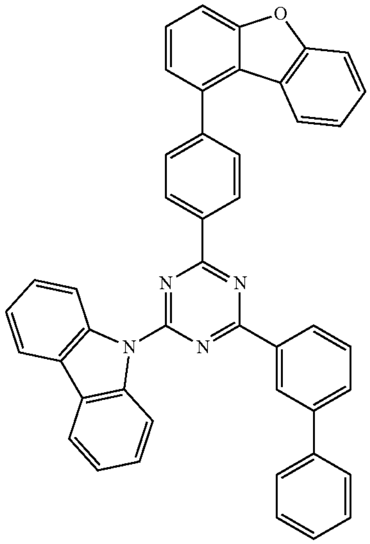
H1-275
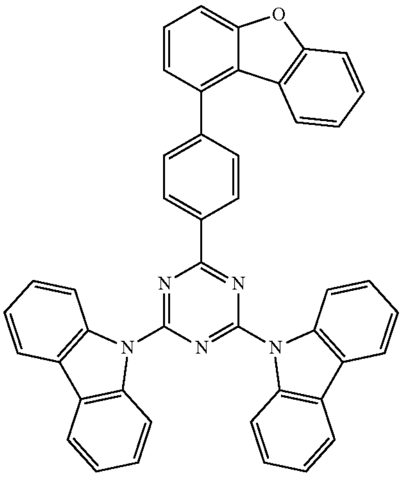
H1-276
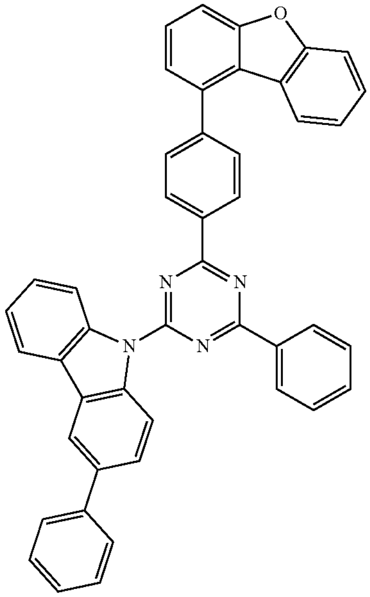
-continued
H1-277
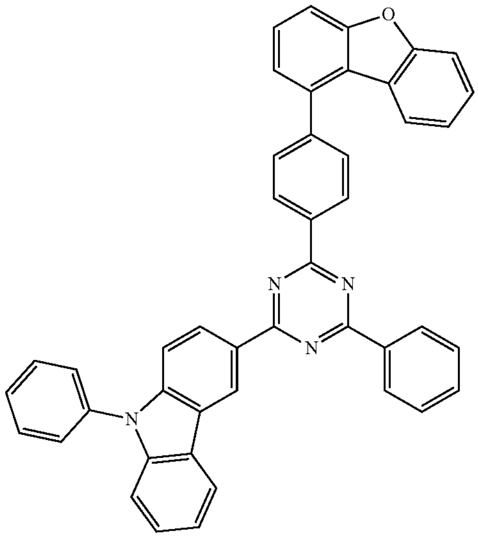
H1-278
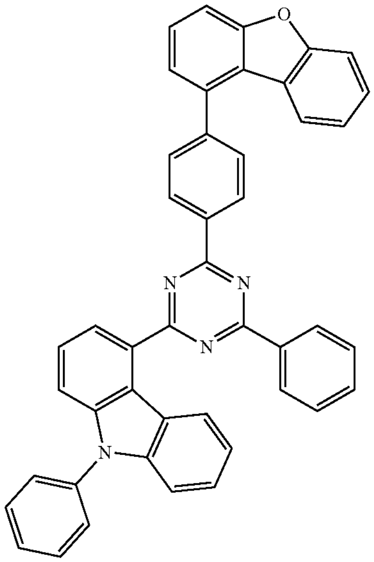
H1-279
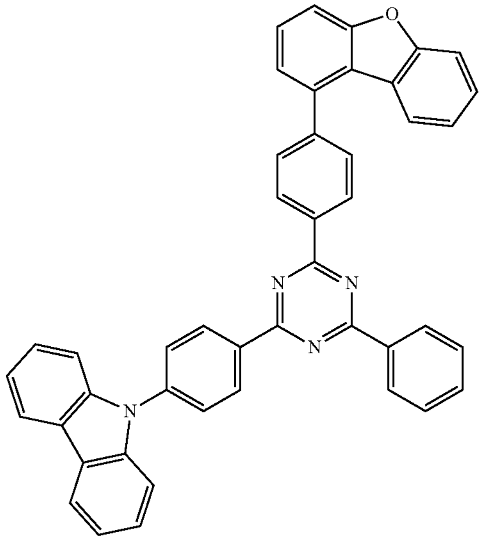

-continued
H1-280
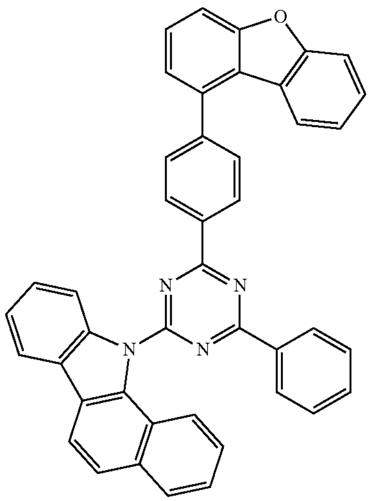
H1-281
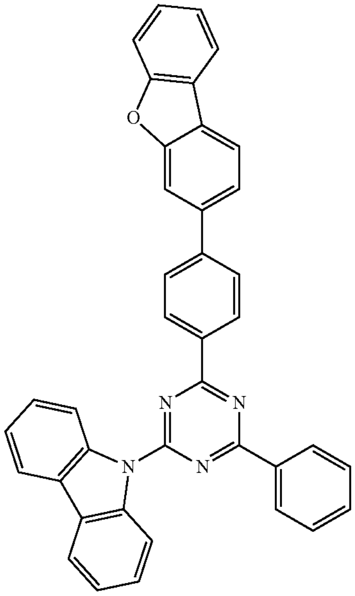
-continued
H1-282
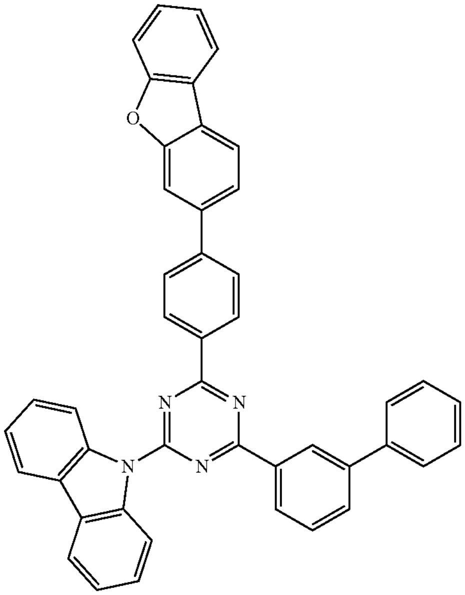
H1-283
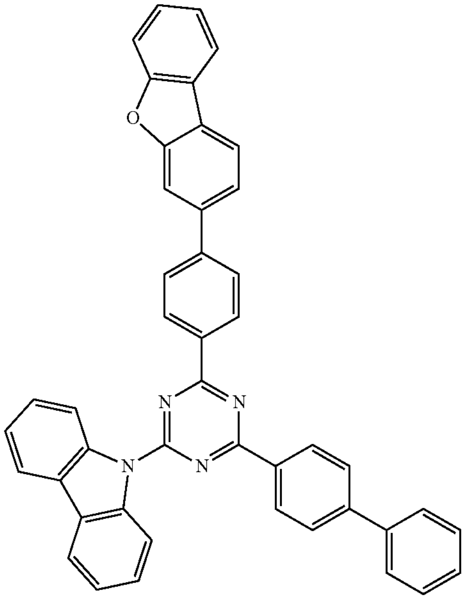

-continued
H1-284
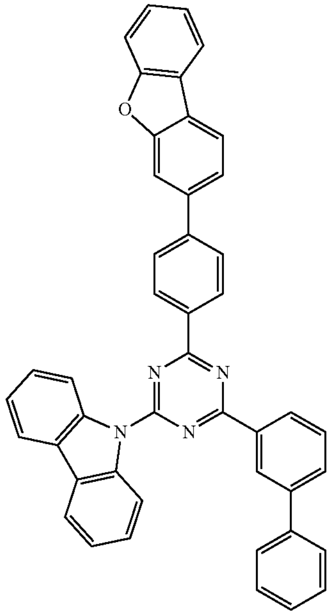
H1-285
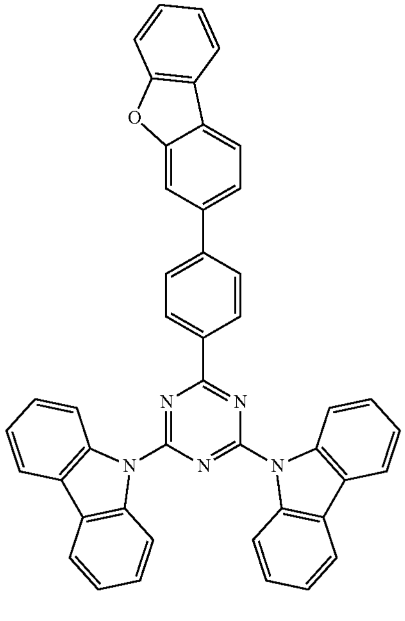
-continued
H1-286
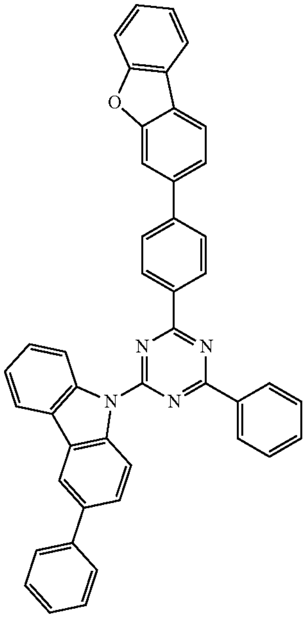
H1-287
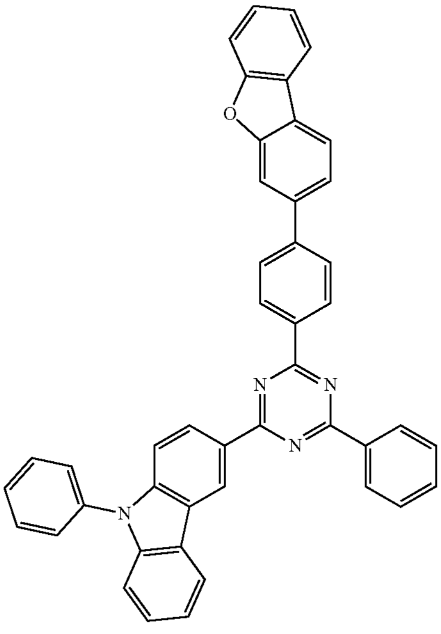

H1-288
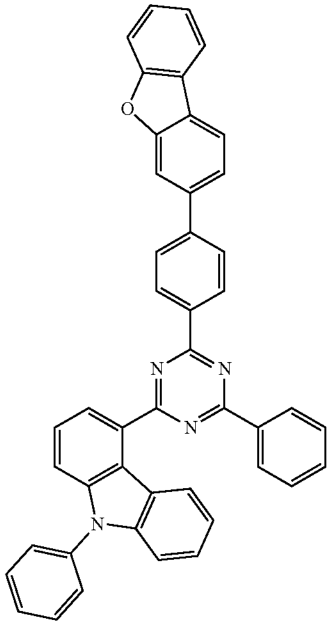
H1-289
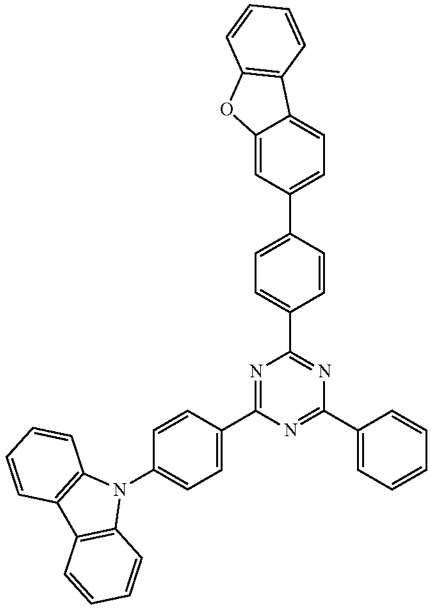
H1-290
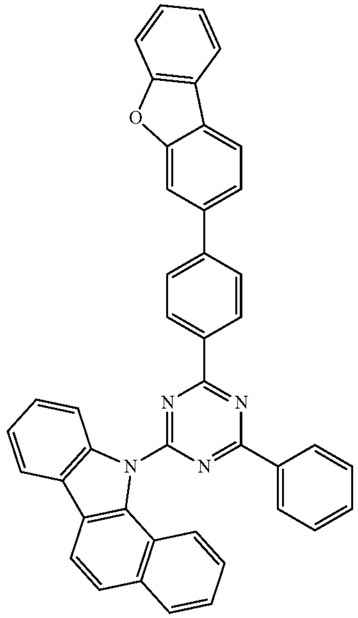
H1-291
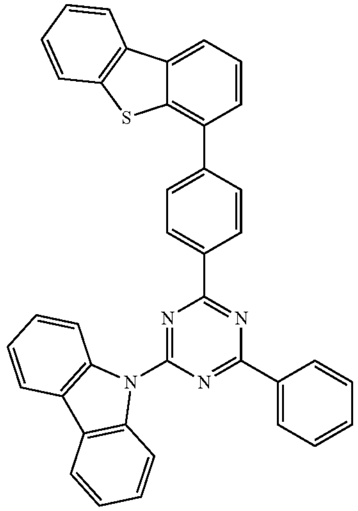
H1-292
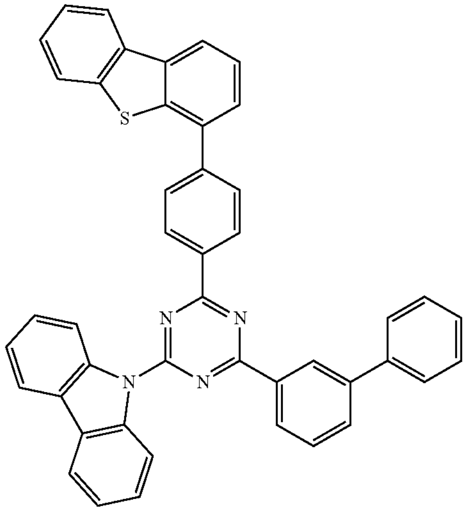

-continued
H1-293
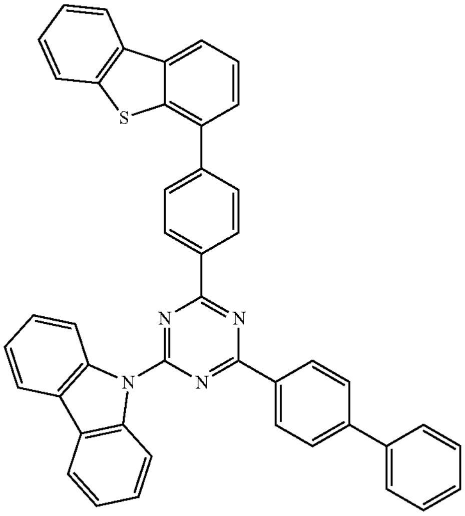
H1-294
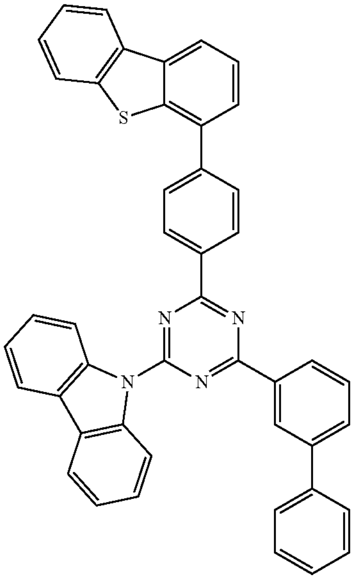
H1-295
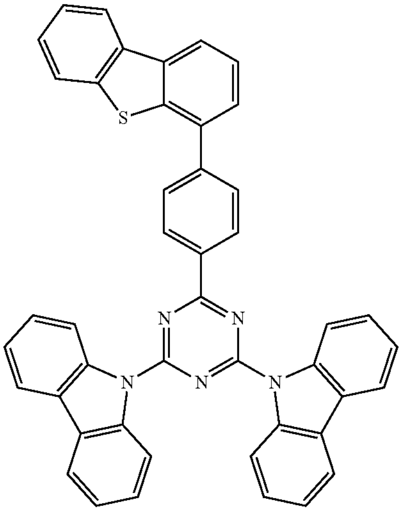
-continued
H1-296
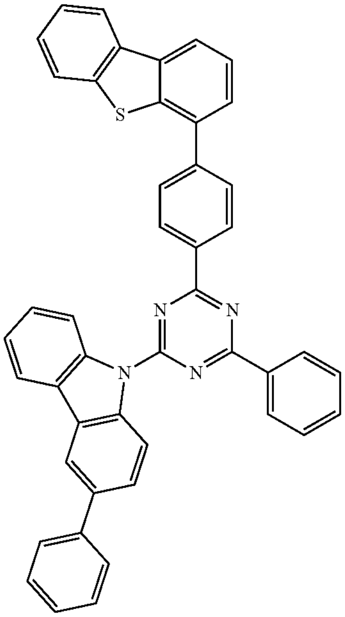
H1-297
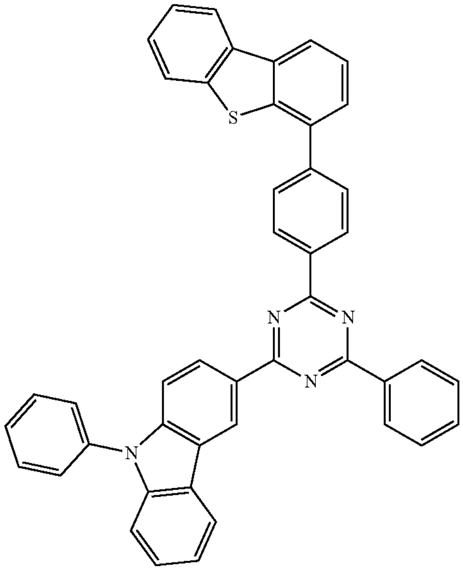

-continued
H1-298
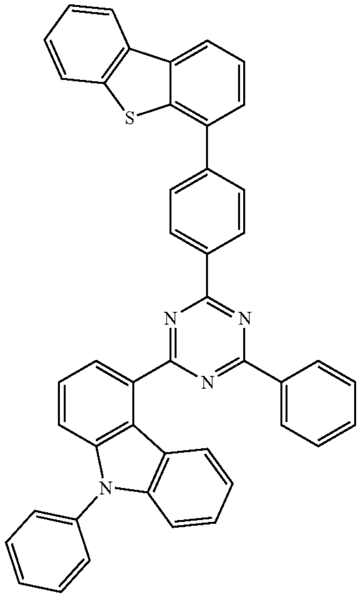
H1-299
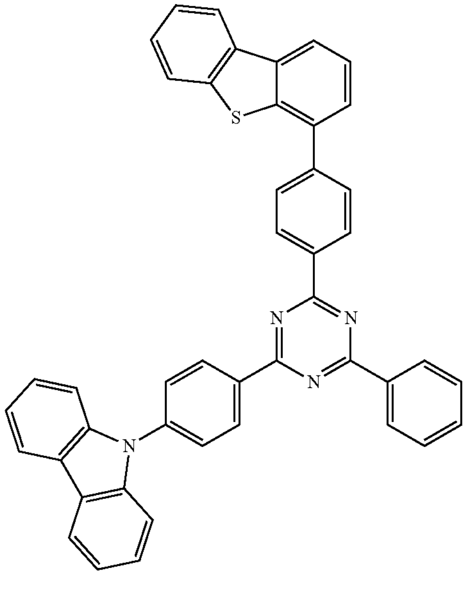
-continued
H1-300
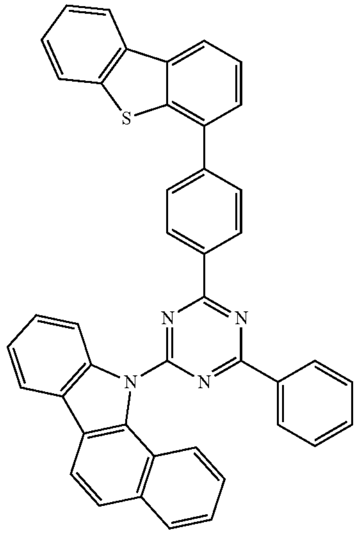
H1-301
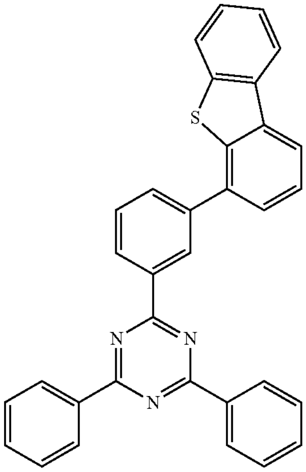
H1-302
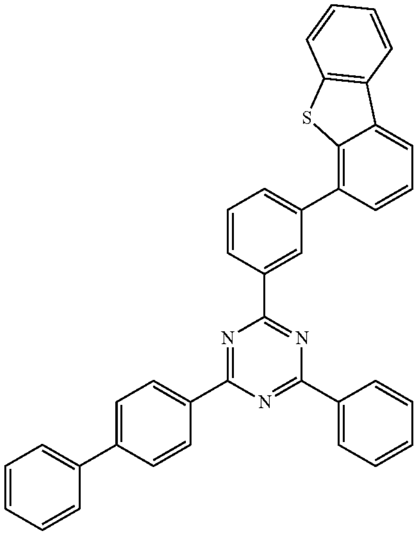

-continued
H1-303
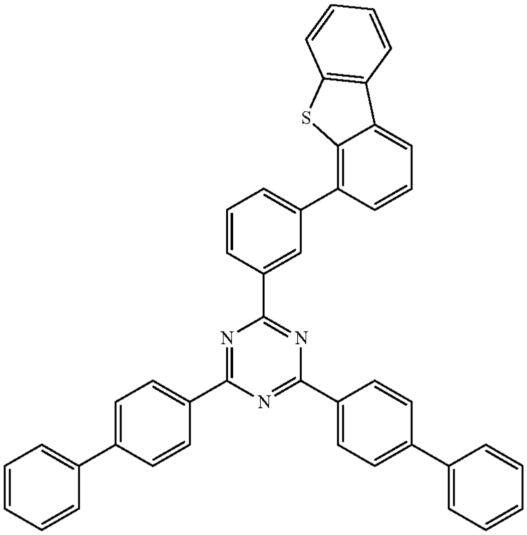
H1-304
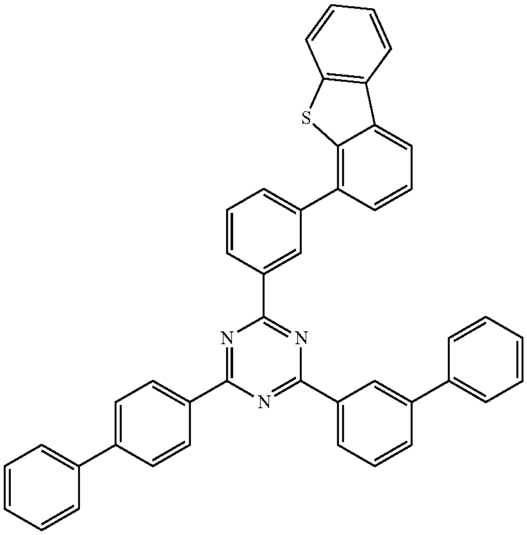
H1-305
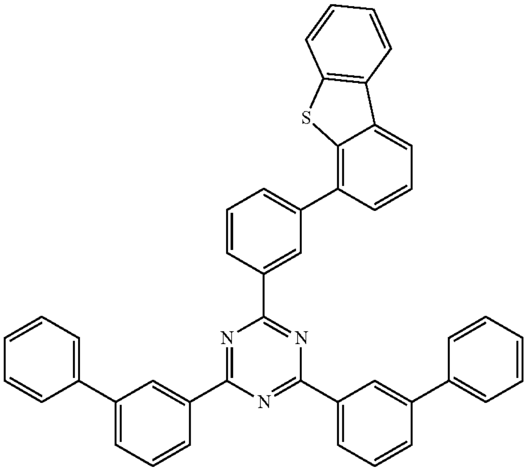
-continued
H1-306
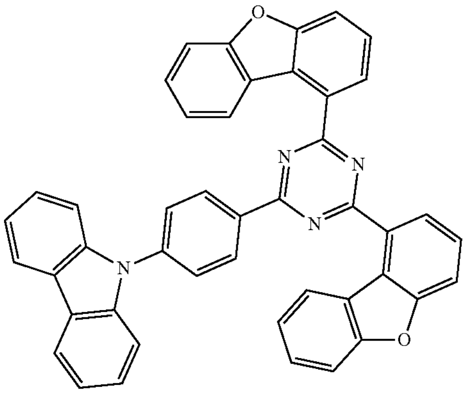
H1-307
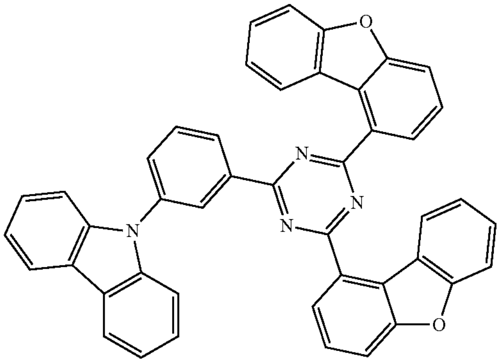
H1-308
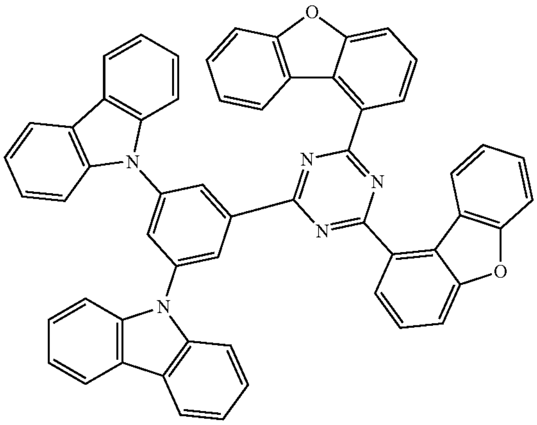

-continued
H1-309
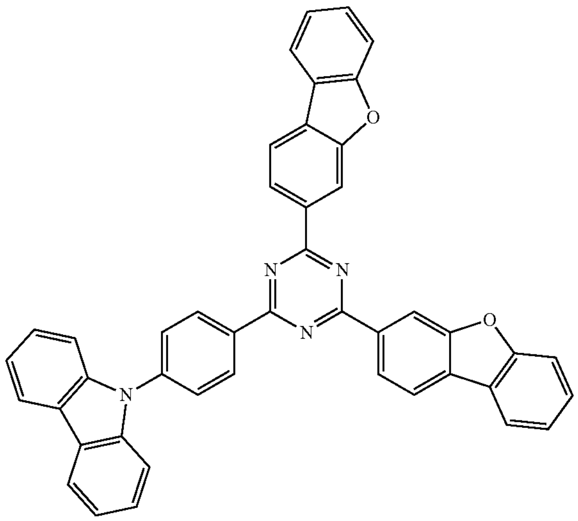
H1-310
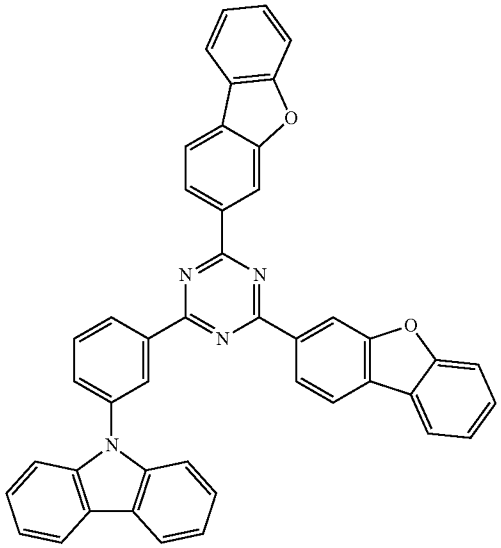
H1-311
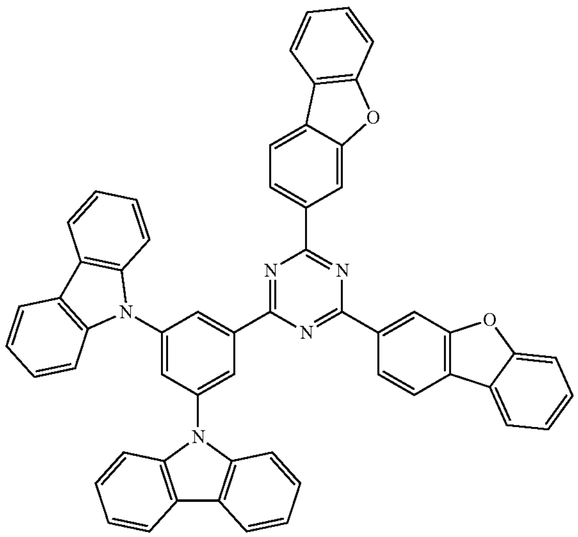
-continued
H1-312
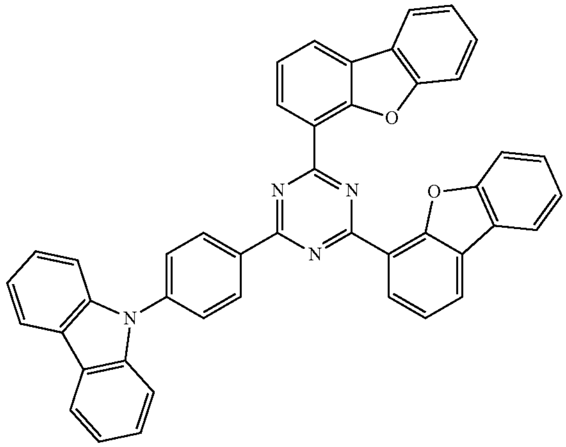
H1-313
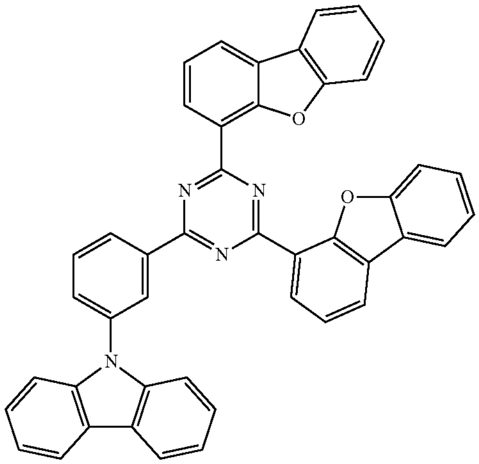
H1-314
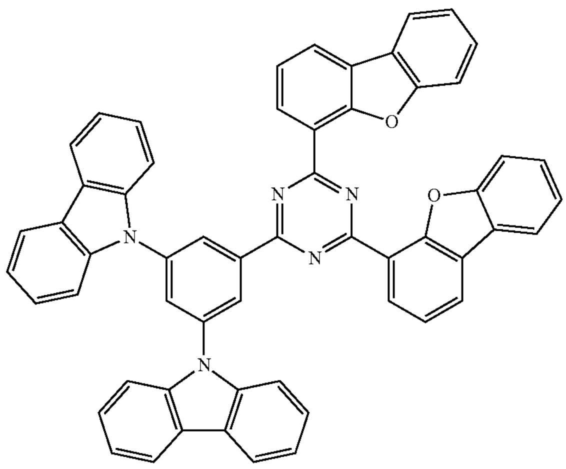

-continued
H1-315
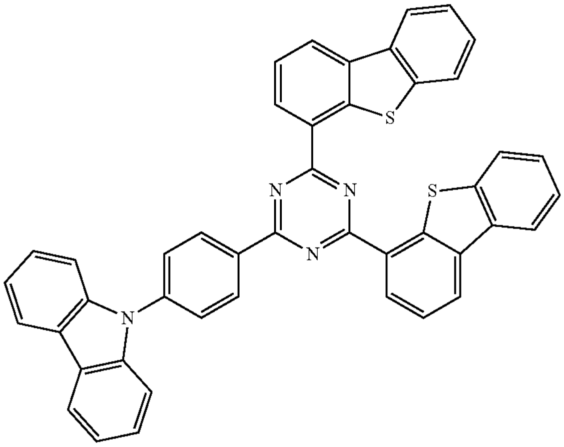
H1-316
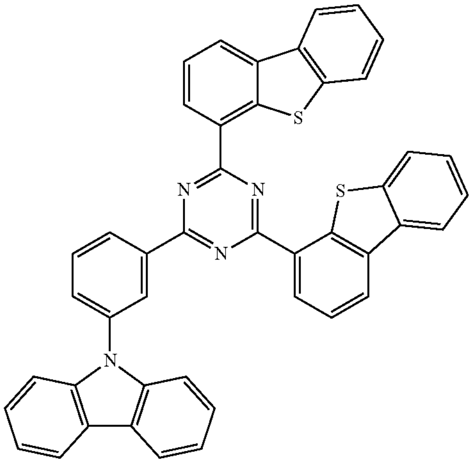
H1-317
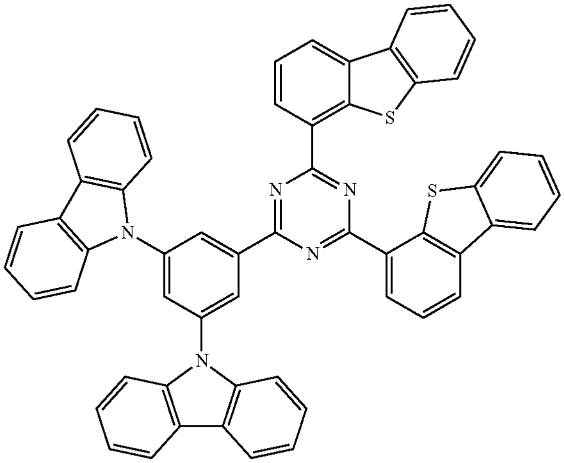
-continued
H1-318
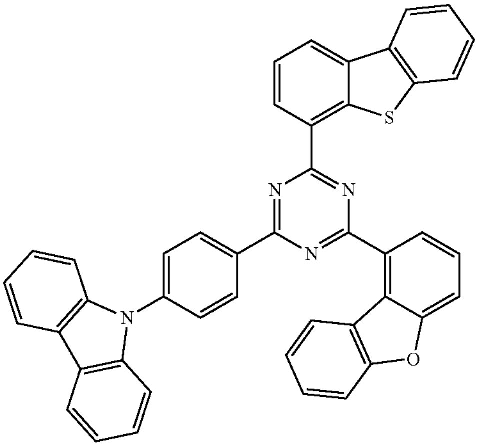
H1-319
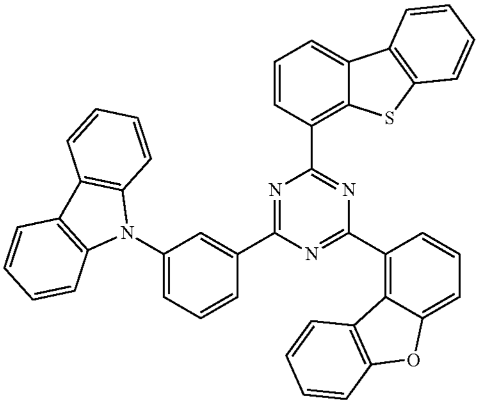
H1-320
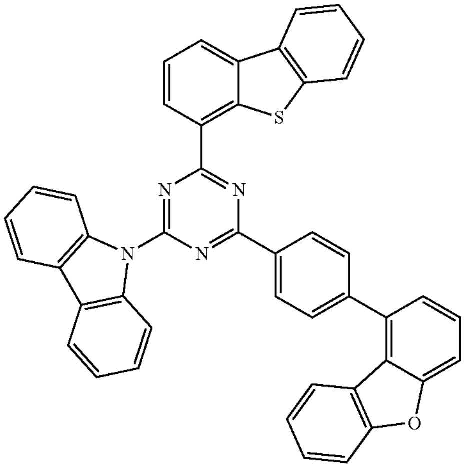

-continued
H1-321
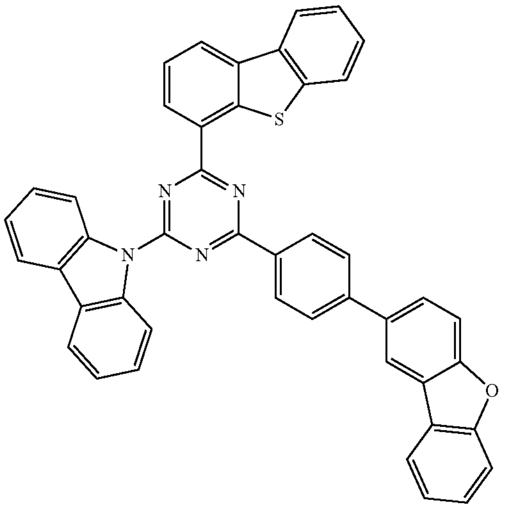
H1-322
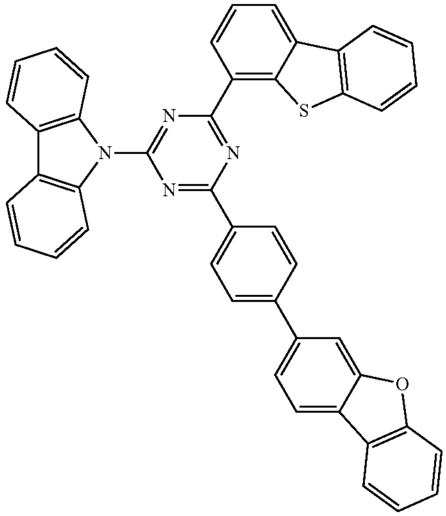
H1-323
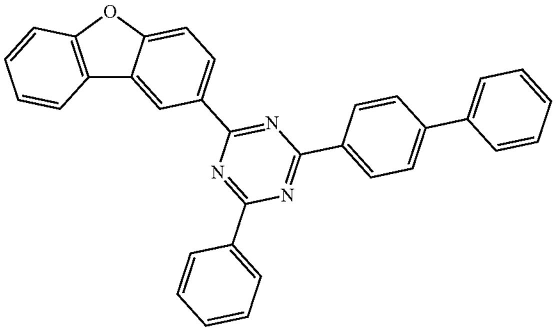
-continued
H1-324
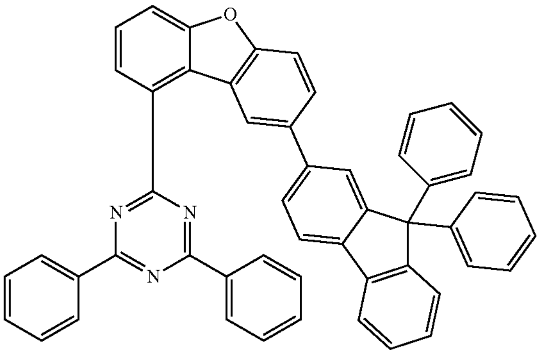
H1-325
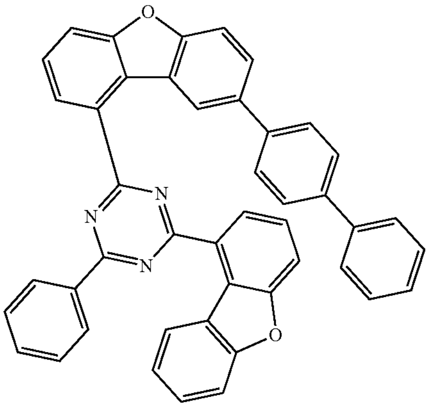
H1-326
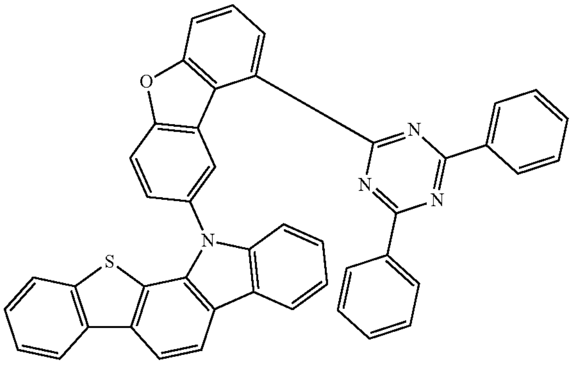
H1-327
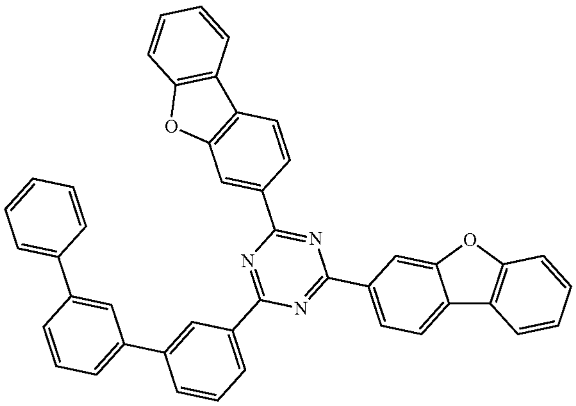

-continued
H1-328
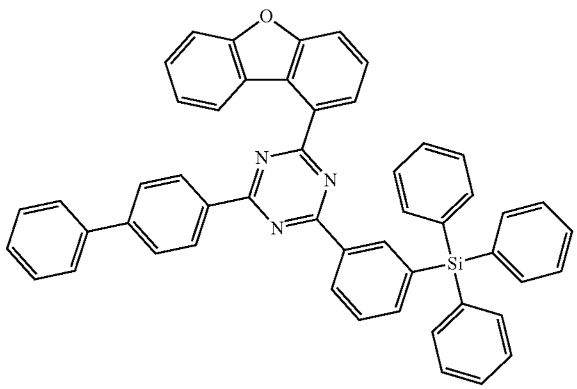
H1-329
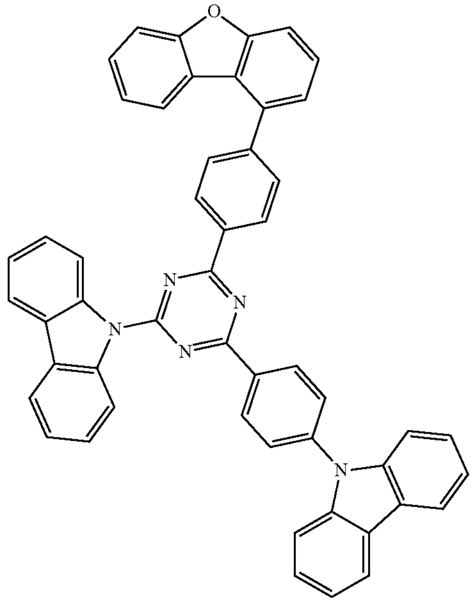
H1-330
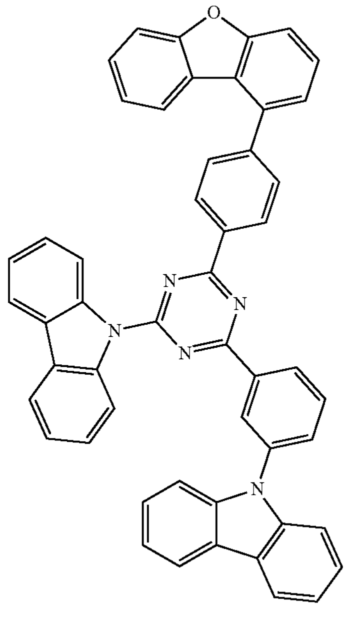
-continued
H1-331
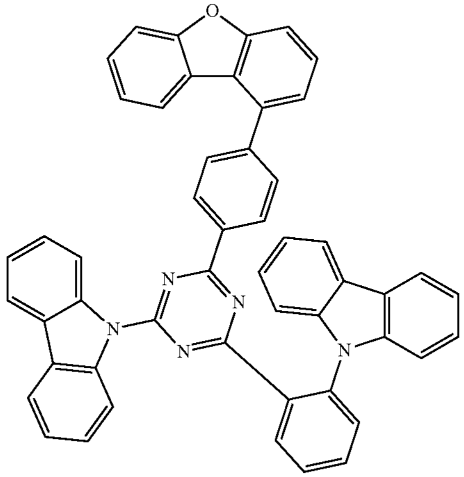
H1-332
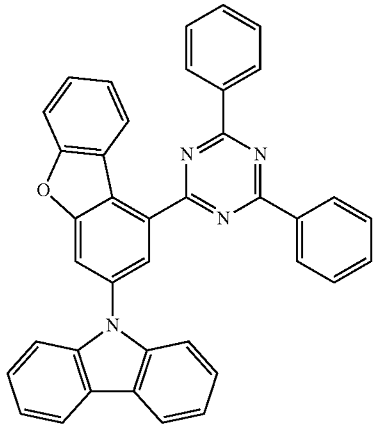
H1-333
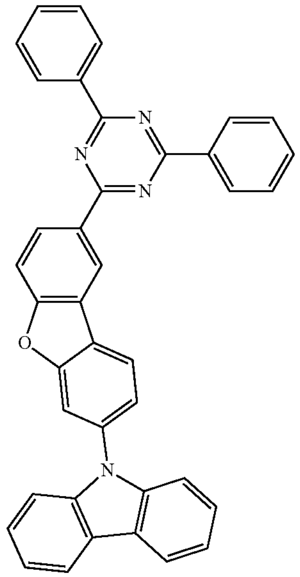

-continued
H1-334
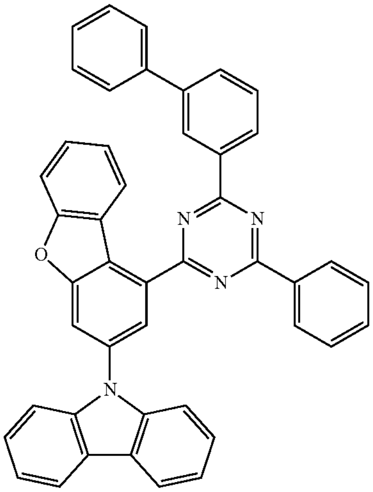
H1-335
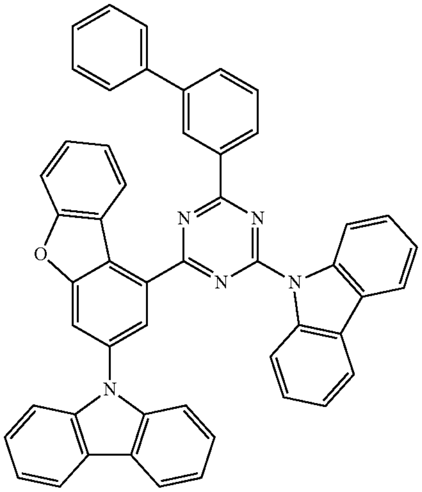
H1-336
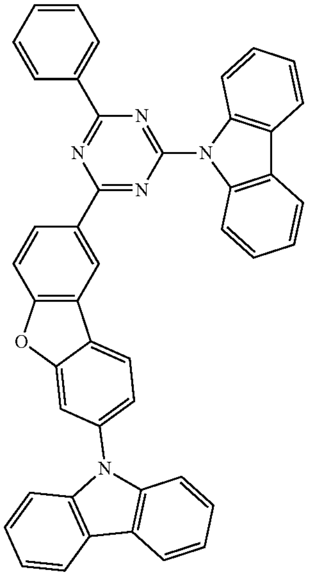
-continued
H1-337
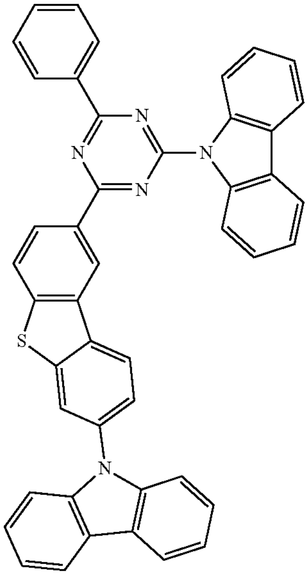
H1-338
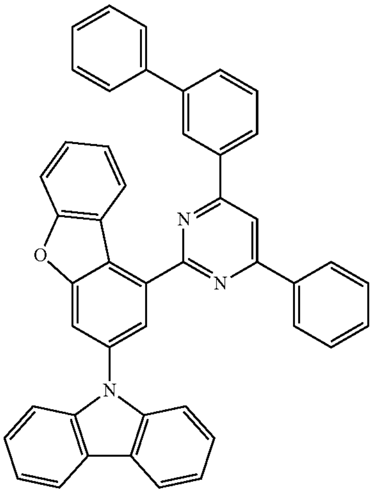
H1-339
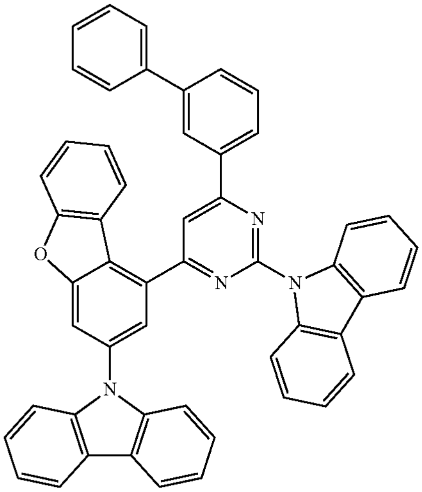

-continued
H1-340
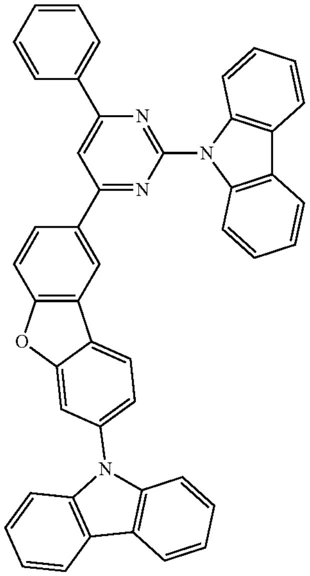
H1-341
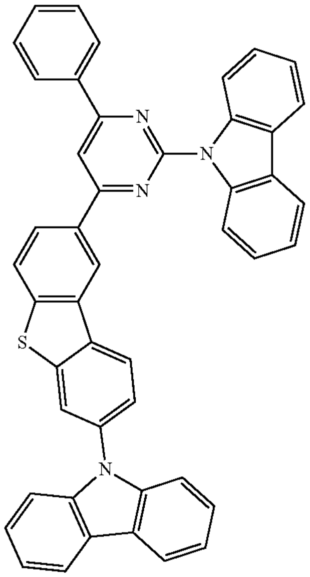
H1-342
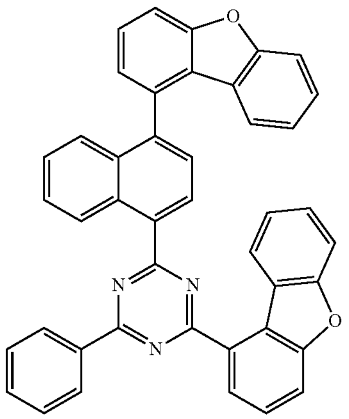
-continued
H1-343
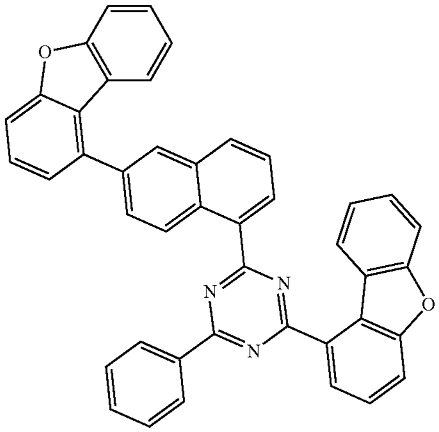
H1-344
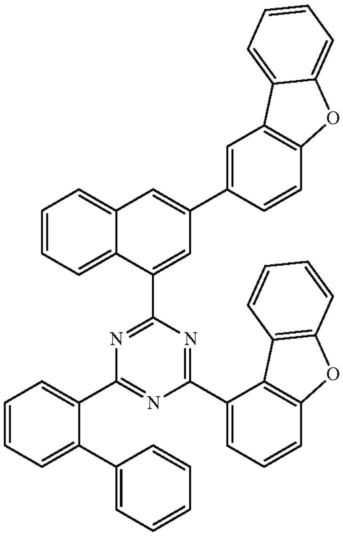
H1-345
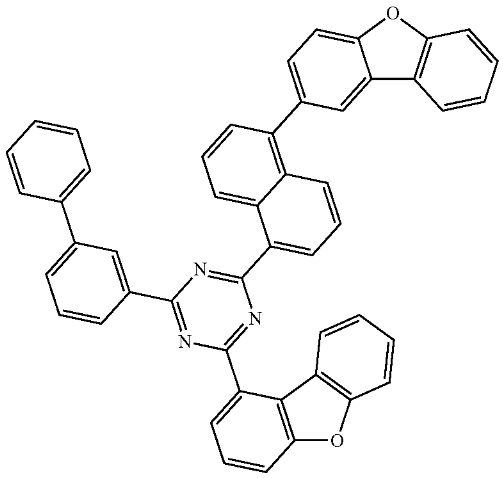

-continued
H1-346
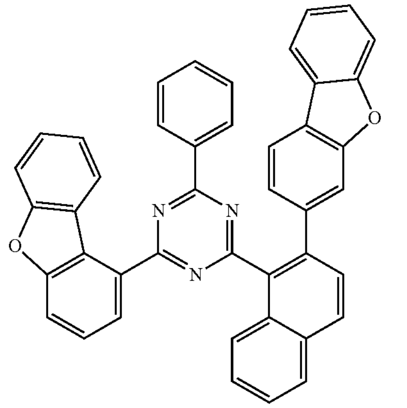
H1-347
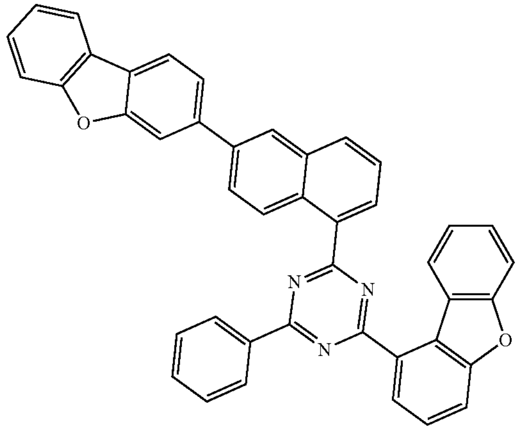
H1-348
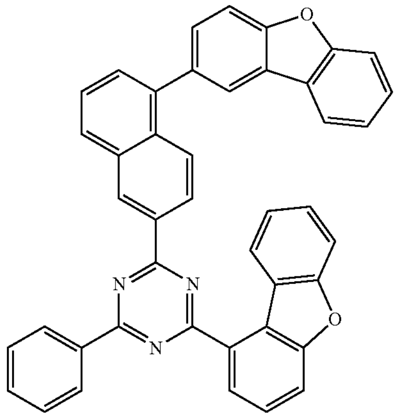
-continued
H1-349
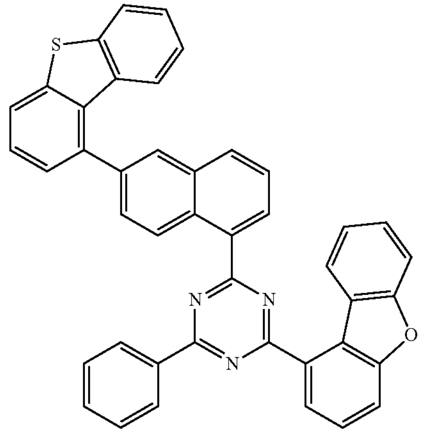
H1-350
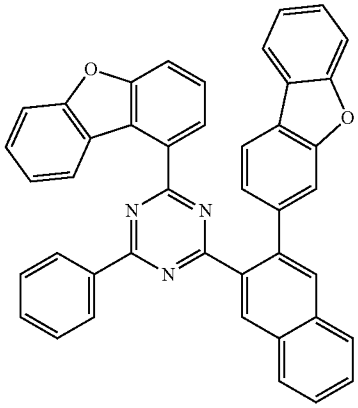
H1-351
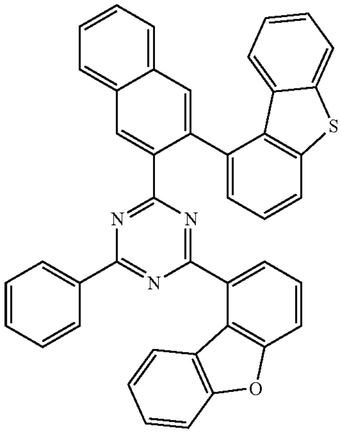

-continued
H1-352
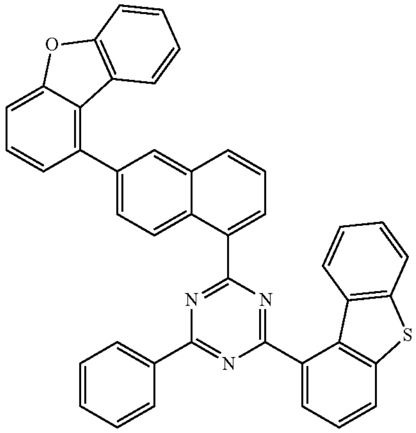
H1-353
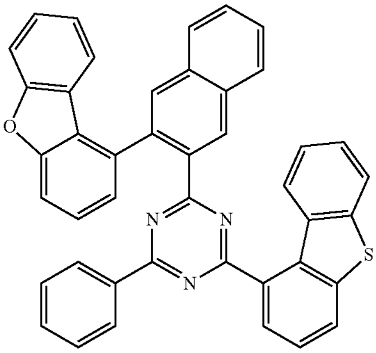
H1-354
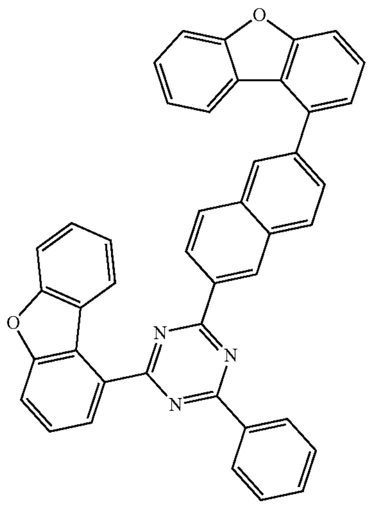
-continued
H1-355
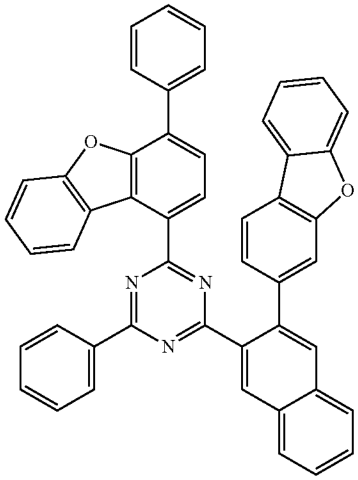
H1-356
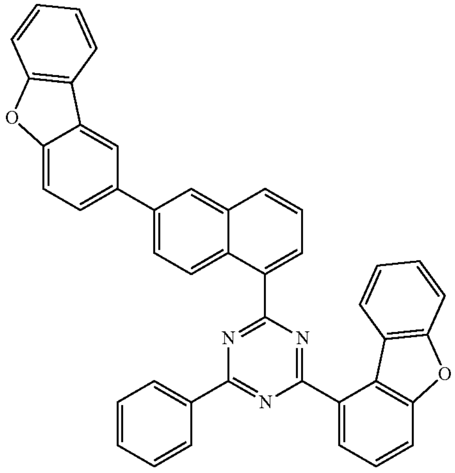
H1-357
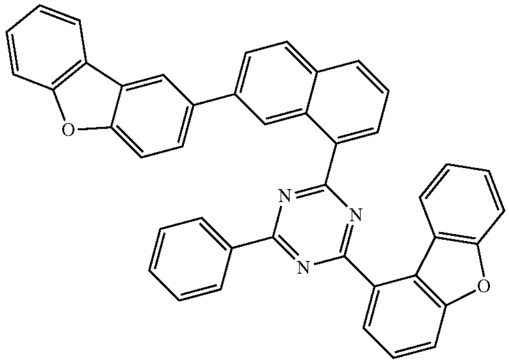

-continued
H1-358
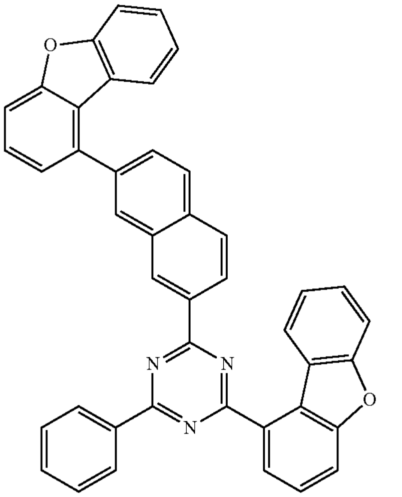
H1-359
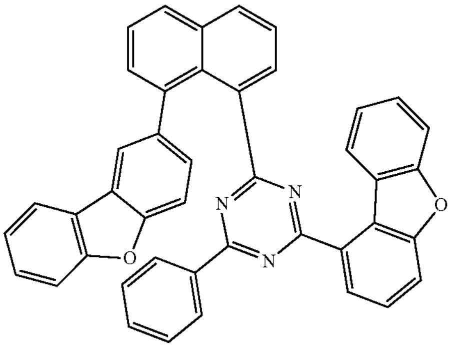
H1-360
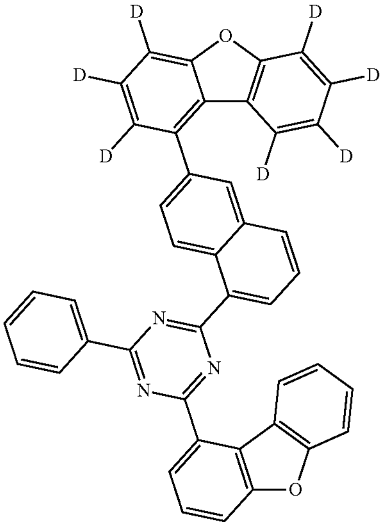
-continued
H1-361
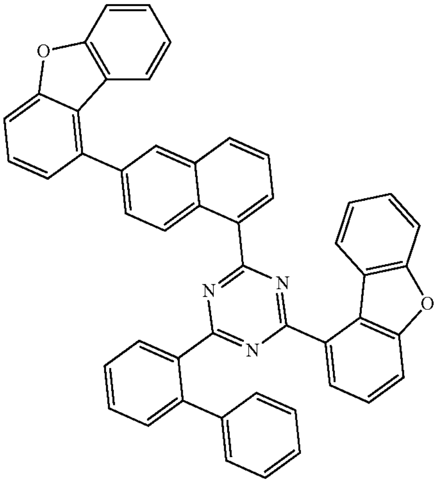
H1-362
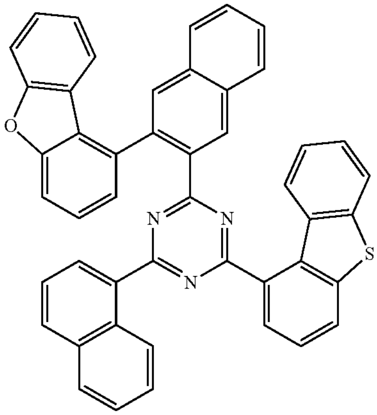
H1-363
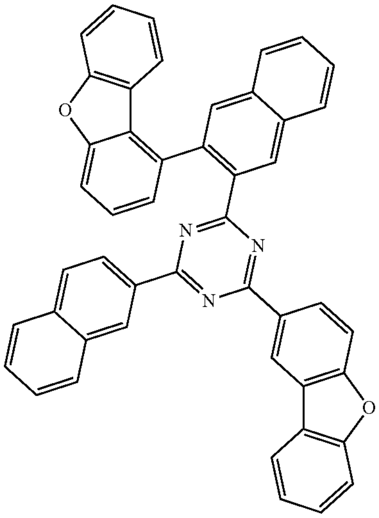

-continued
H1-364
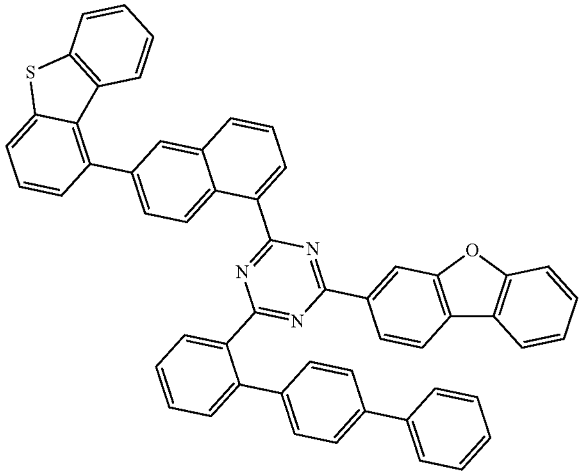
H1-365
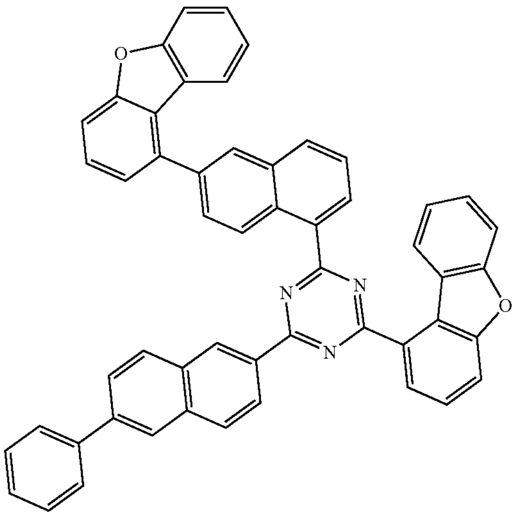
H1-366
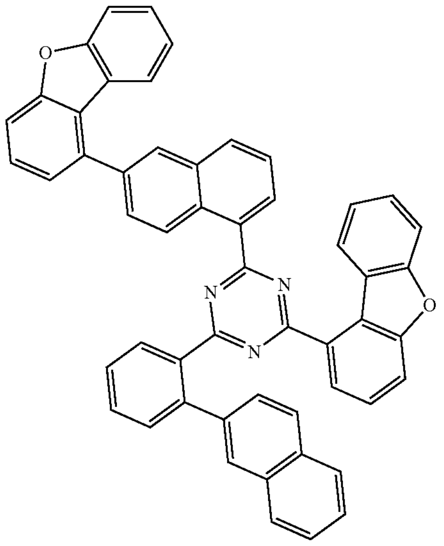
-continued
H1-367
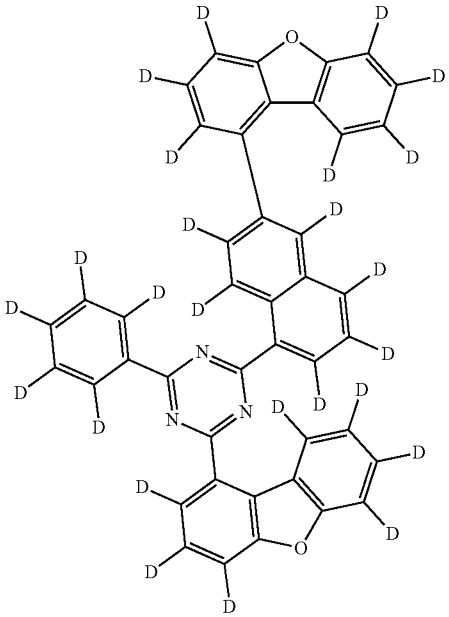
H1-368
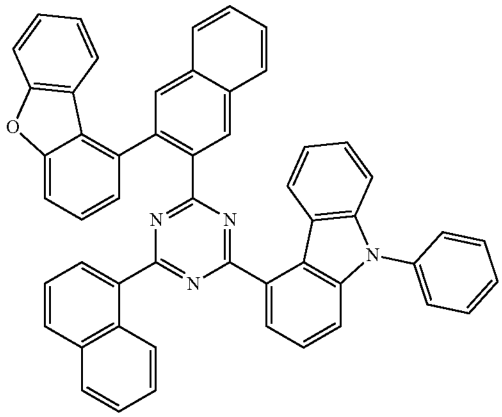
H1-369
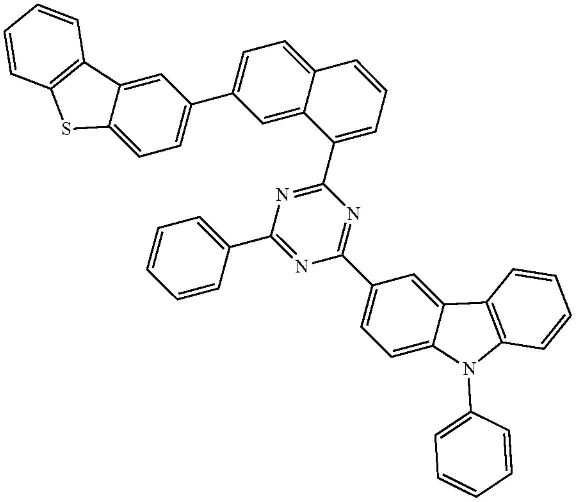

-continued
H1-370
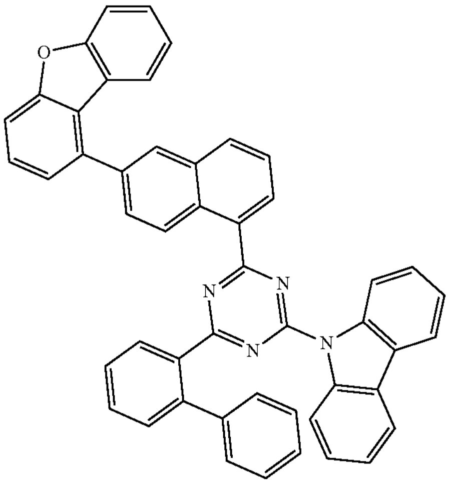
H1-371
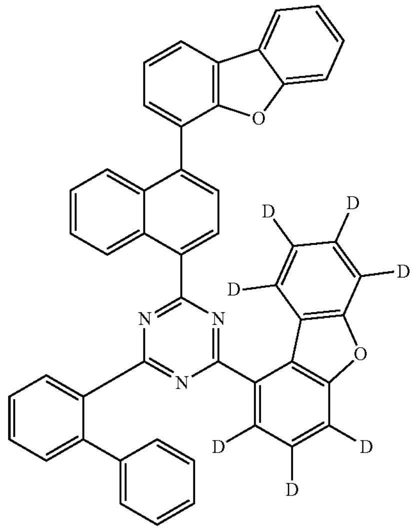
H1-372
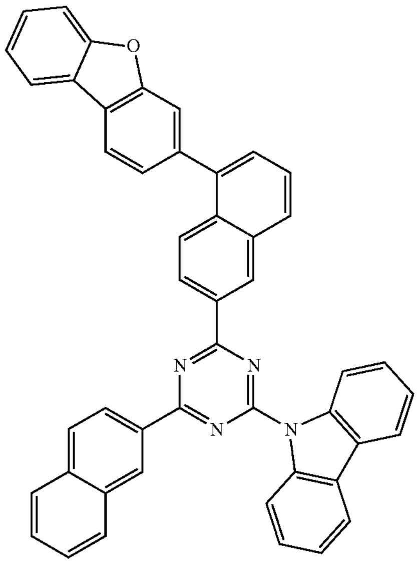
-continued
H1-373
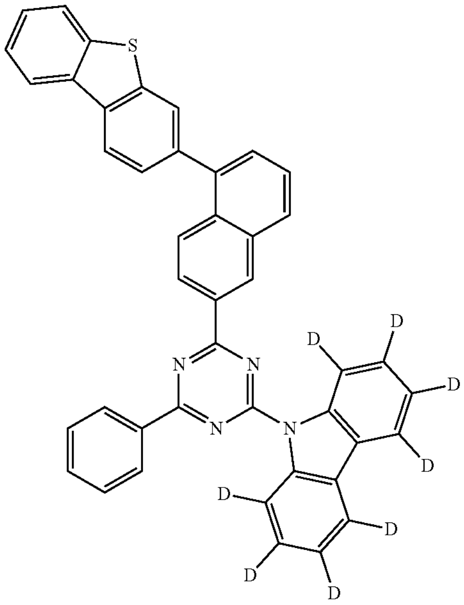
H1-374
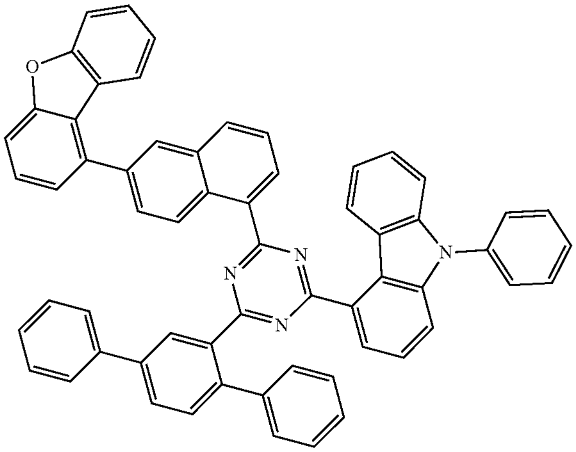
H1-375
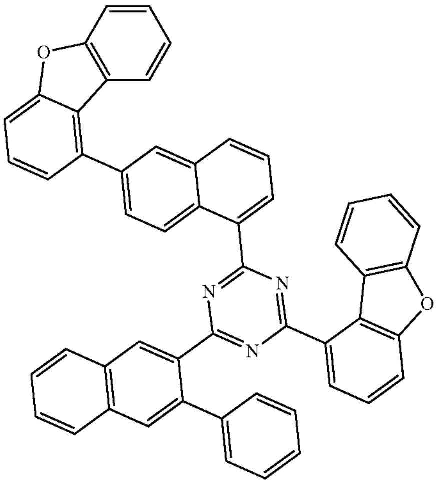

-continued
H1-376
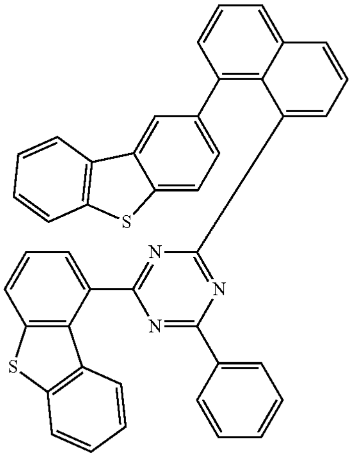
H1-377
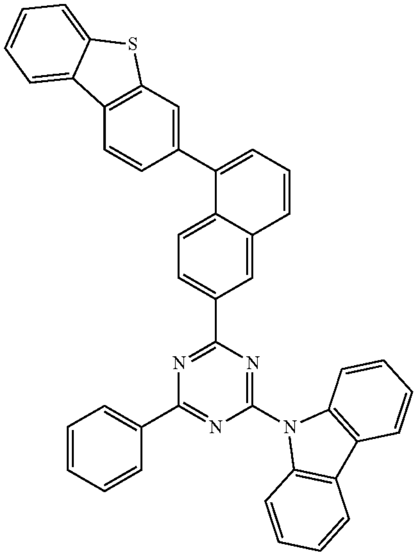
H1-378
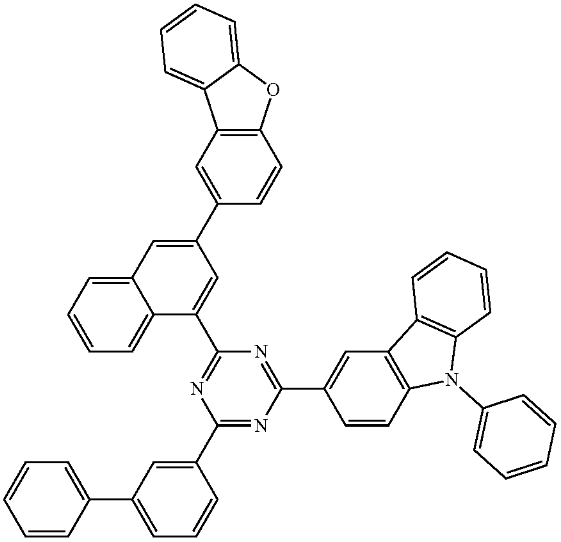
-continued
H1-379
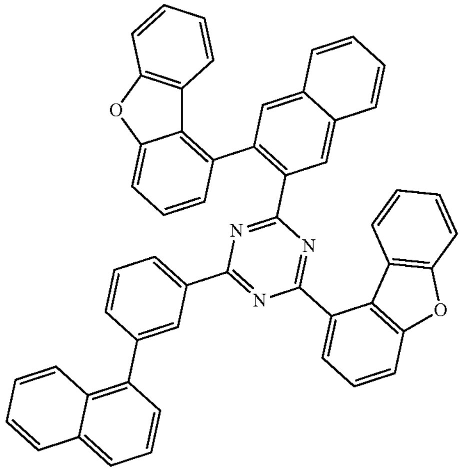
H1-380
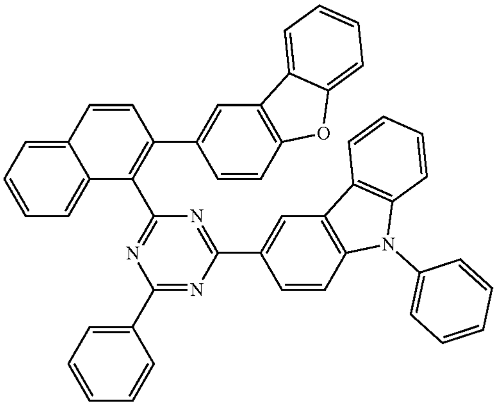
H1-381
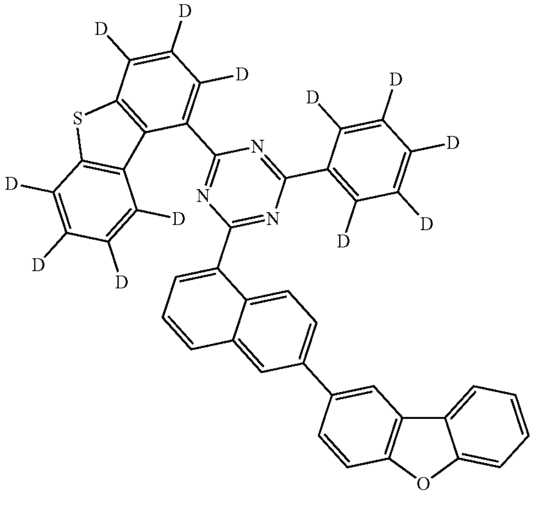

-continued
H1-382
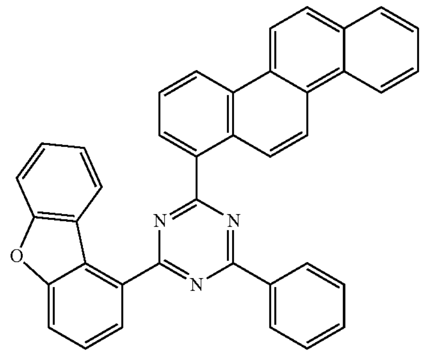
H1-383
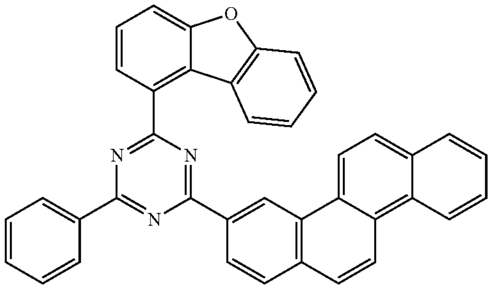
H1-384
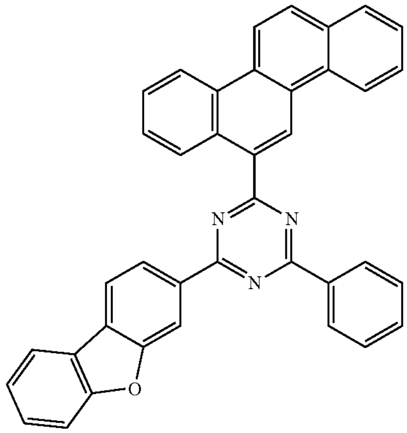
H1-385
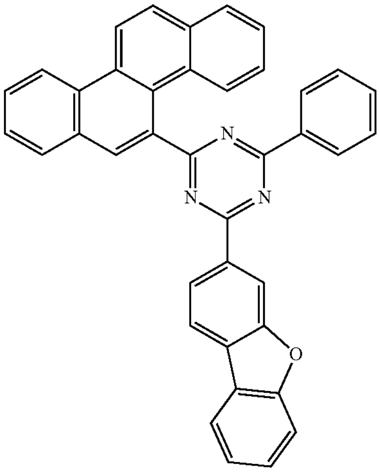
-continued
H1-386
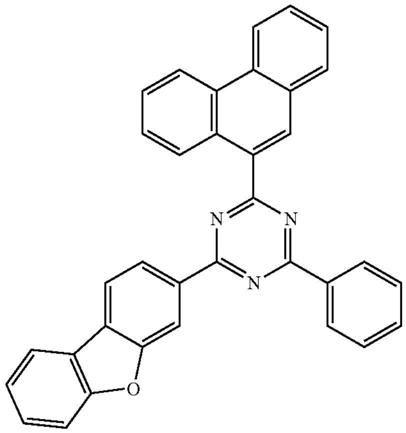
H1-387
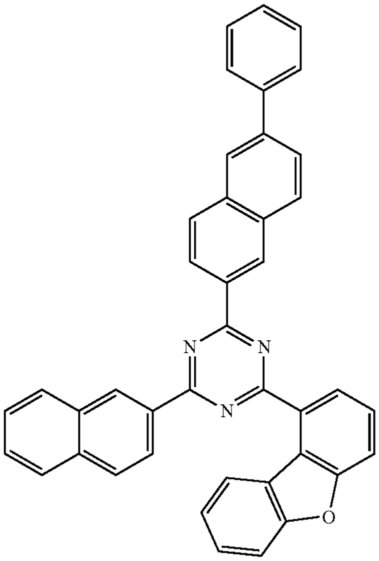
H1-388
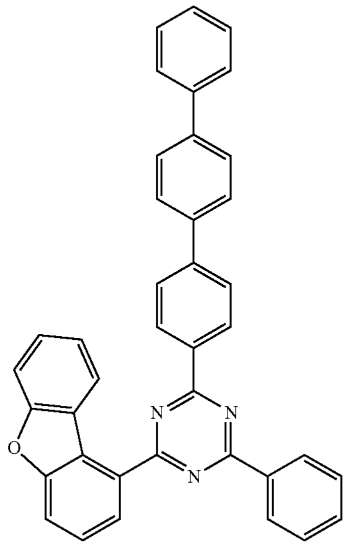

-continued
H1-389
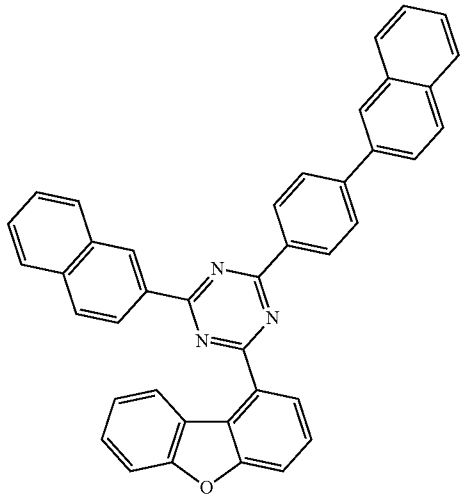
H1-390
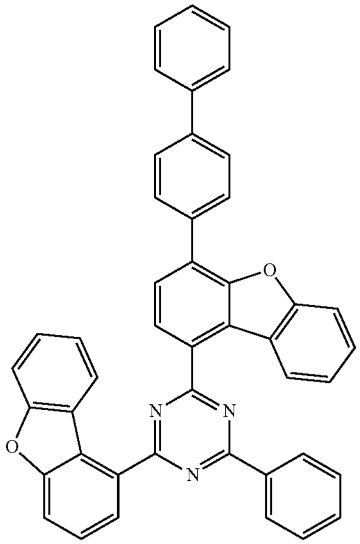
H1-391
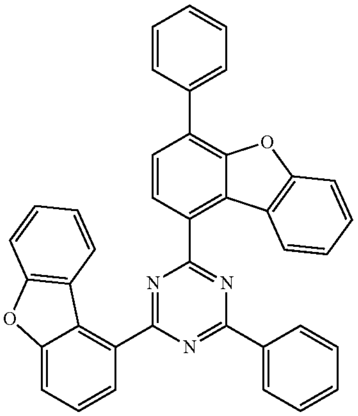
and
-continued
H1-392
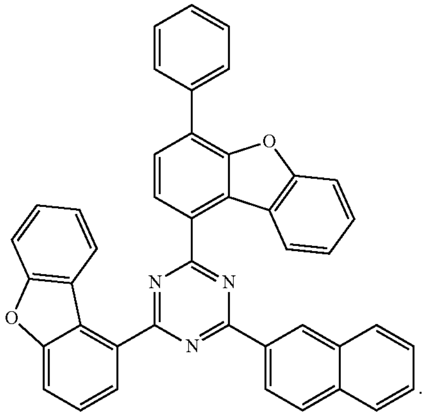
.
7. The plurality of host materials according to claim 1, wherein the compound represented by the Formula 2 is selected from the following compounds:
H2-1
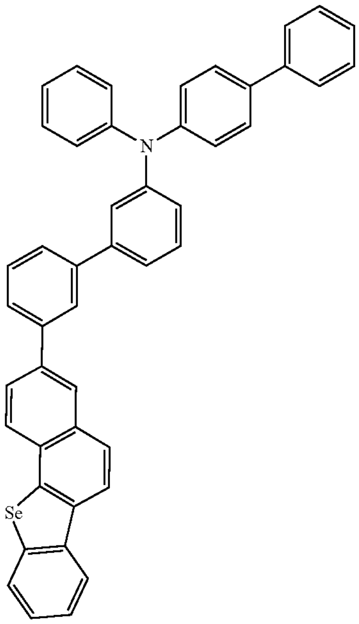
H2-2
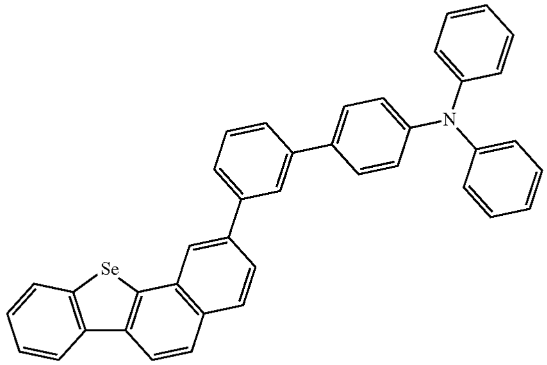

-continued
H2-3
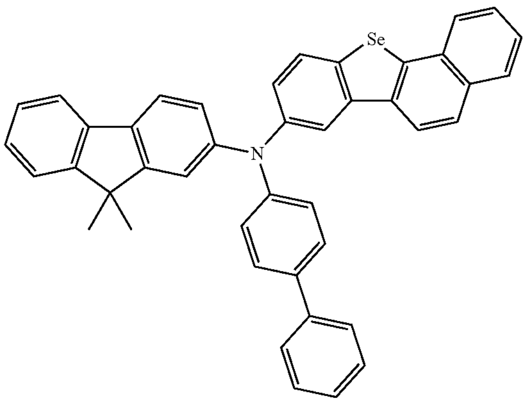
H2-4
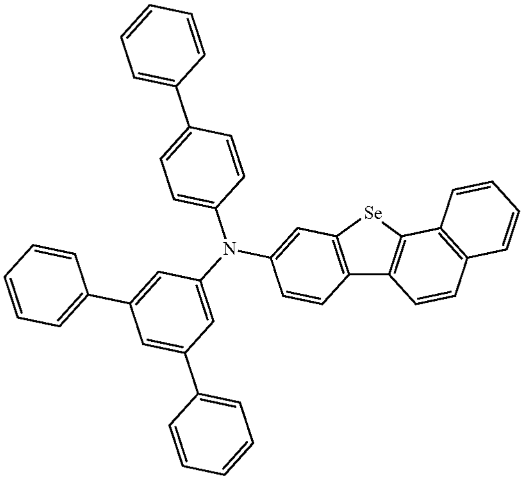
H2-5
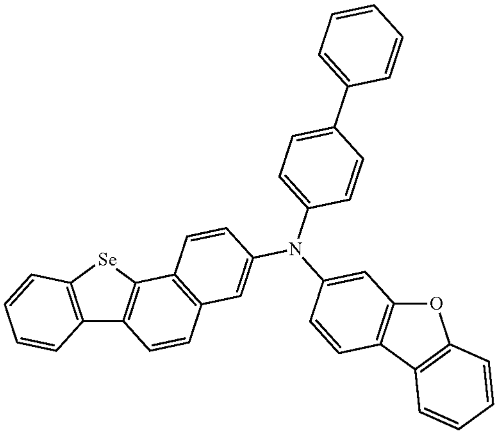
-continued
H2-6
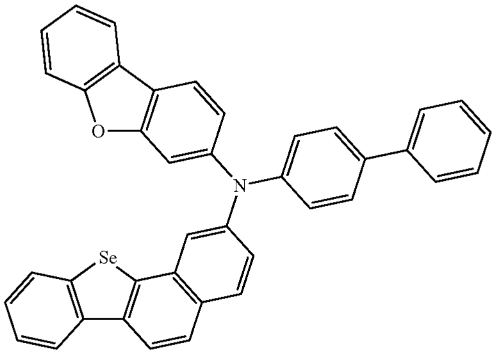
H2-7
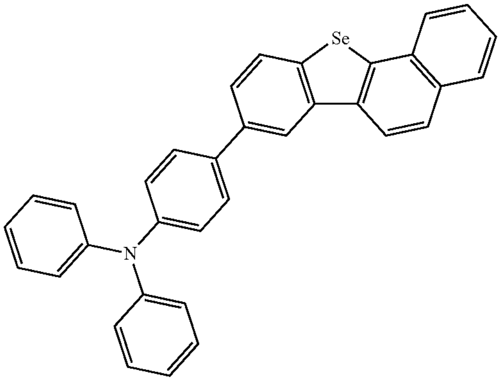
H2-8
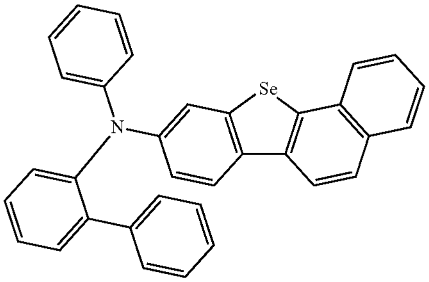
H2-9
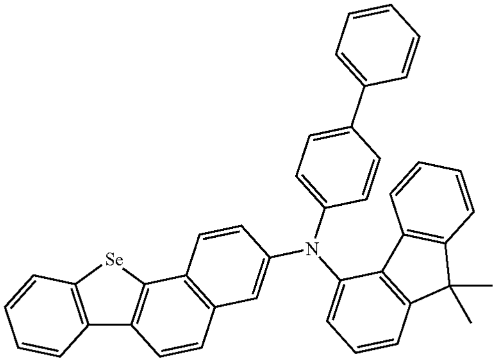

-continued
H2-10
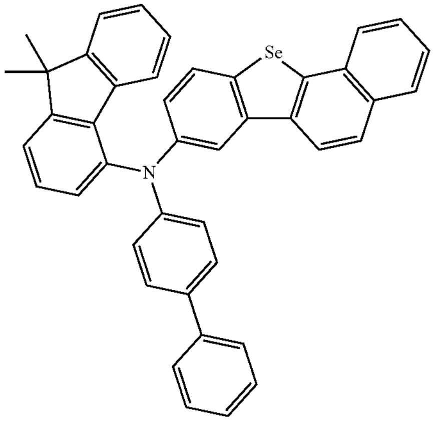
H2-11
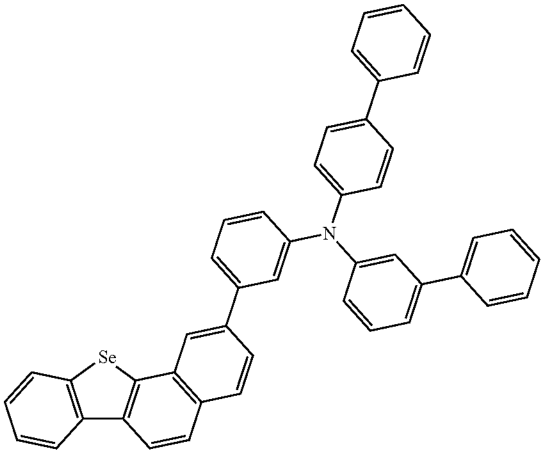
H2-12
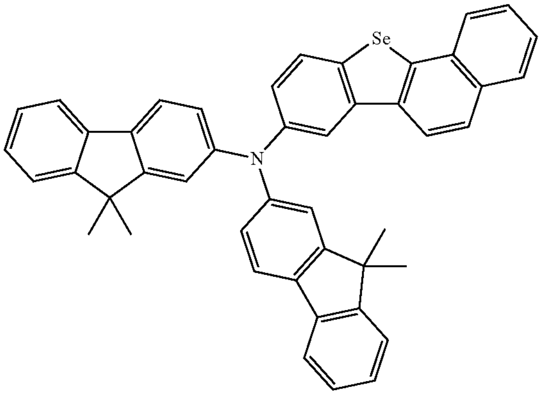
H2-13
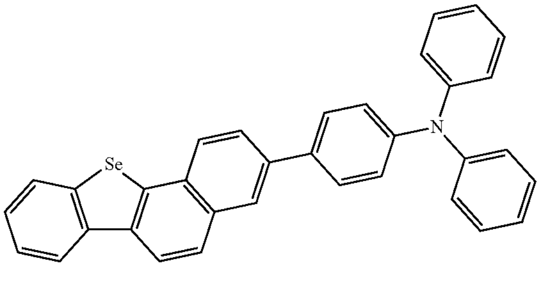
-continued
H2-14
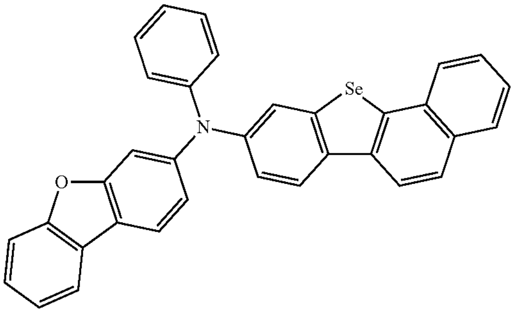
H2-15
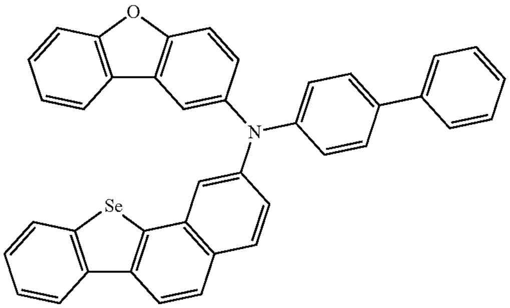
H2-16
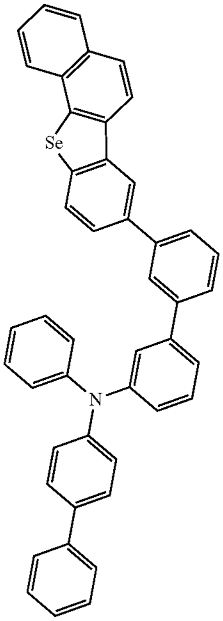

-continued
H2-17
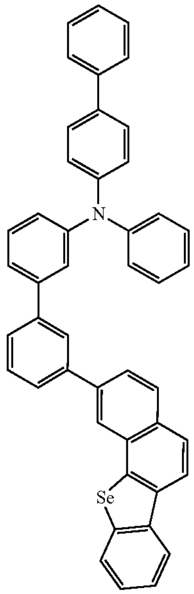
H2-18
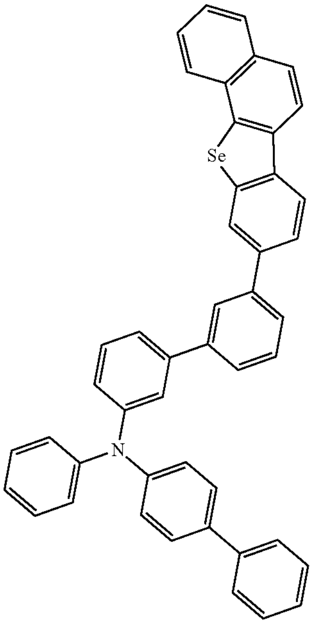
H2-19
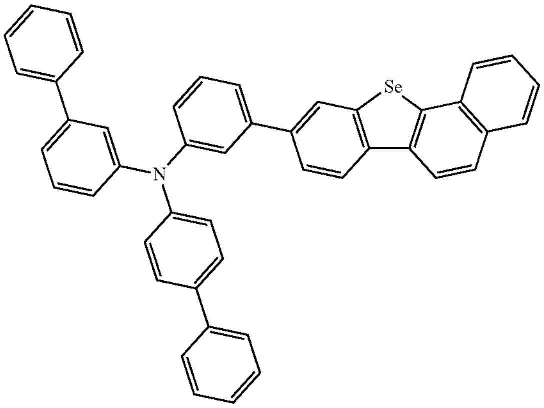
-continued
H2-20
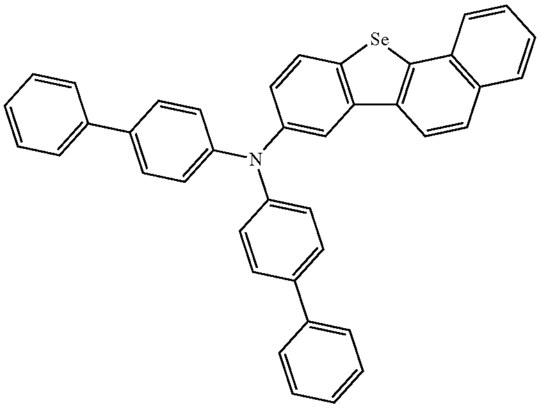
H2-21
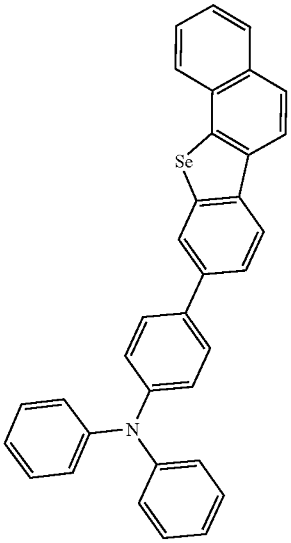
H2-22
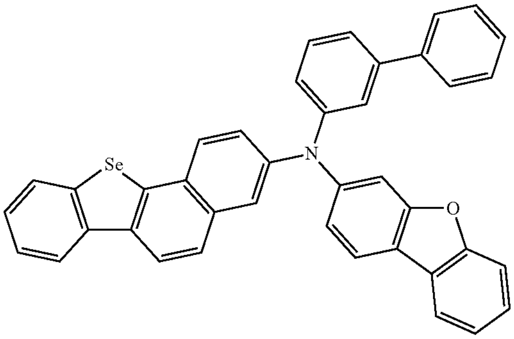

-continued
H2-23
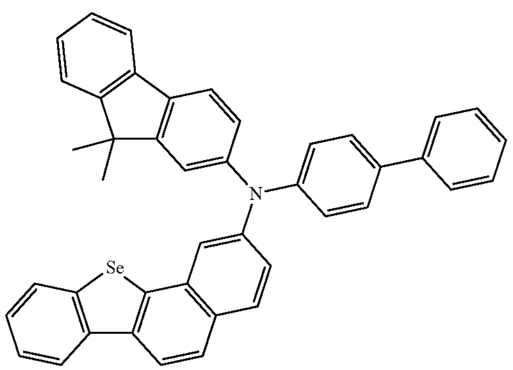
H2-24
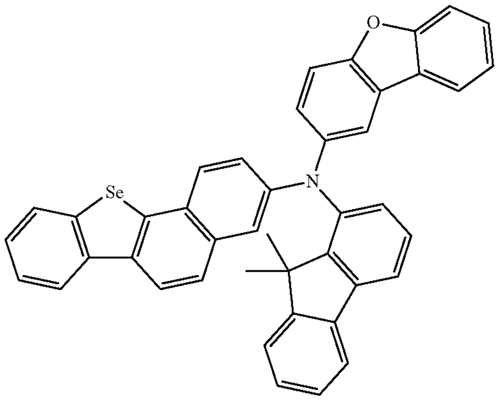
H2-25
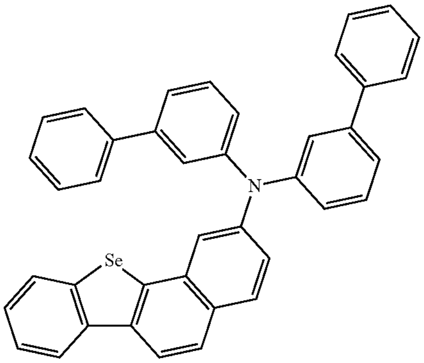
-continued
H2-26
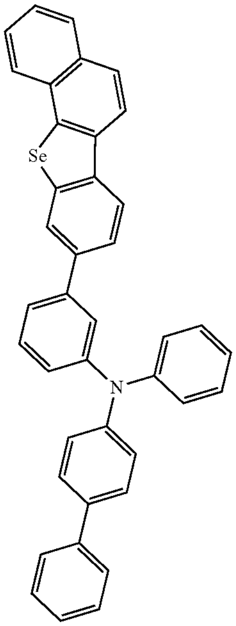
H2-27
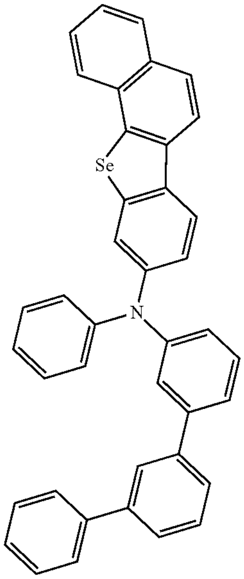
H2-28
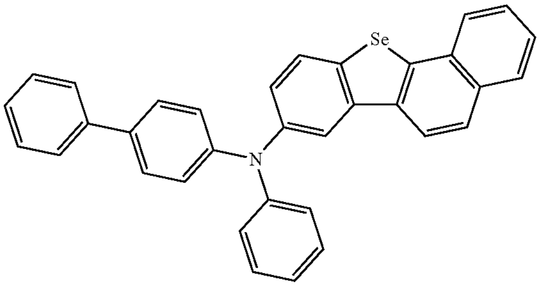

-continued
H2-29
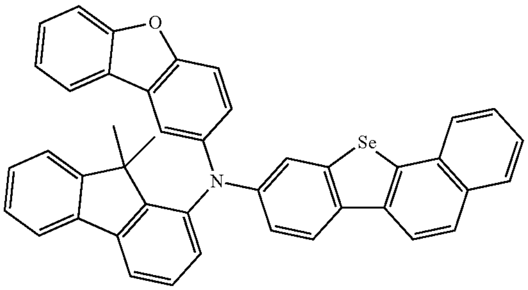
H2-30
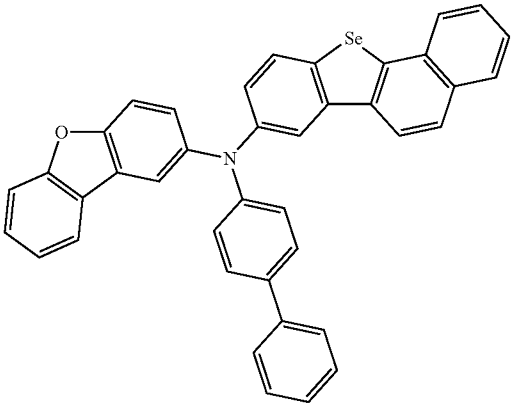
H2-31
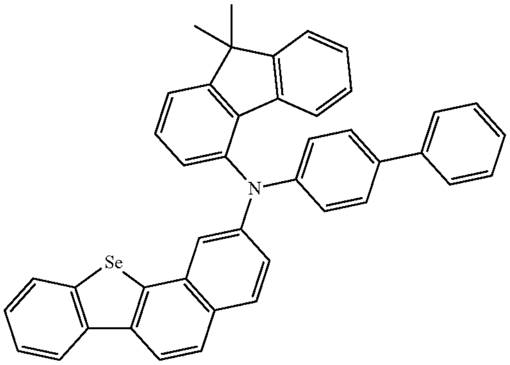
H2-32
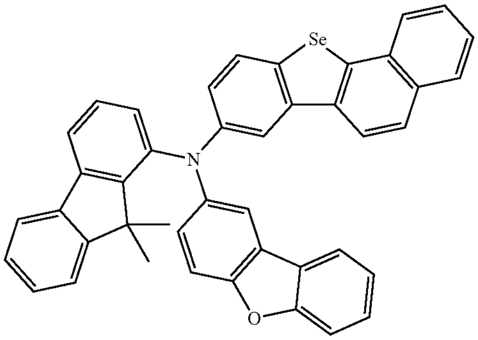
-continued
H2-33
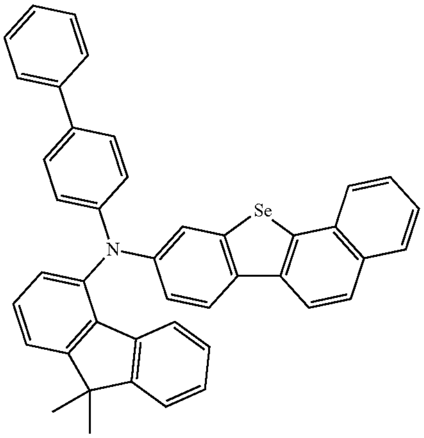
H2-34
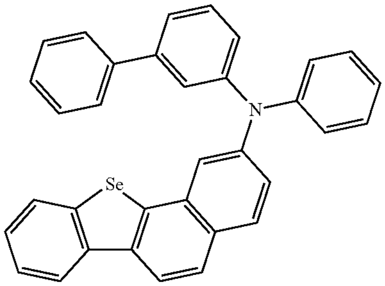
H2-35
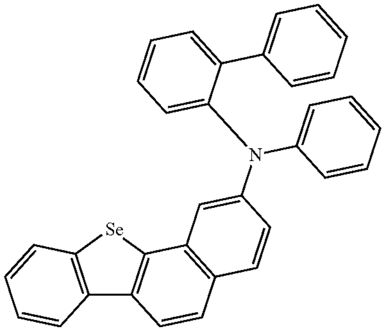
H2-36
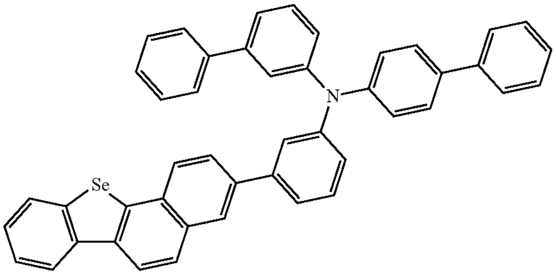

-continued
H2-37
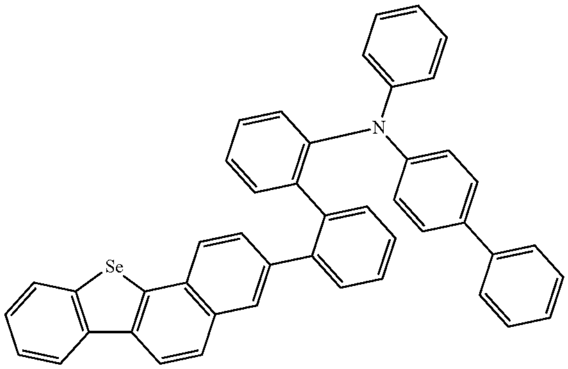
H2-38
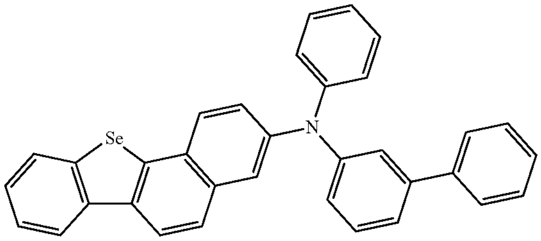
H2-39
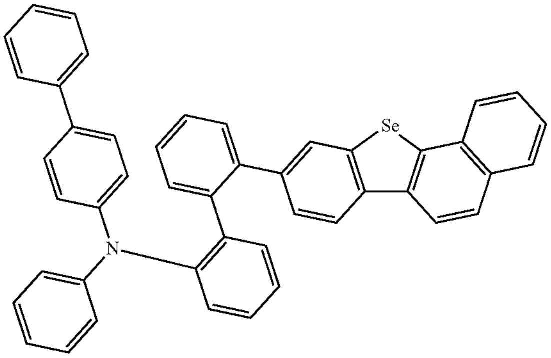
H2-40
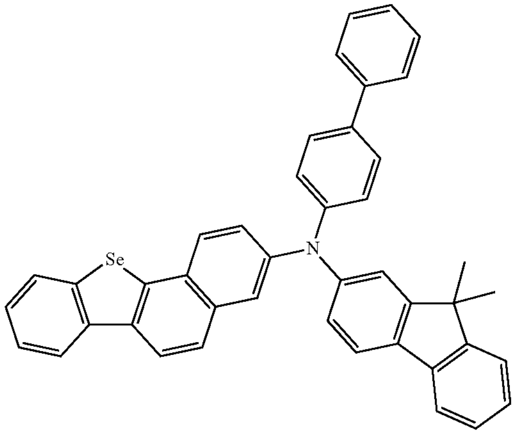
-continued
H2-41
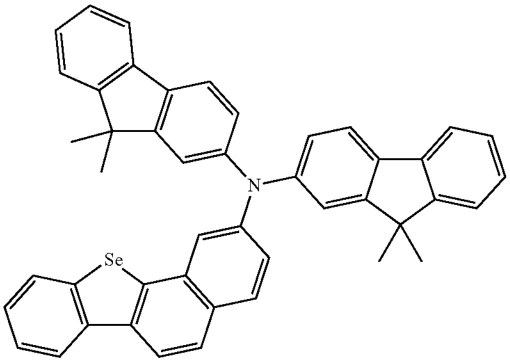
H2-42
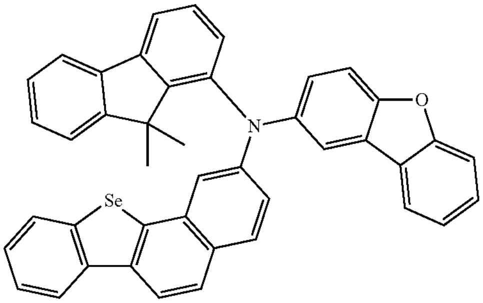
H2-43
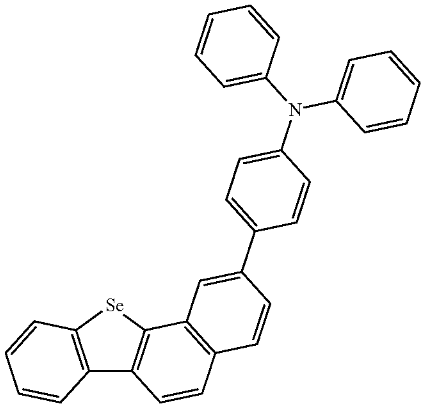
H2-44
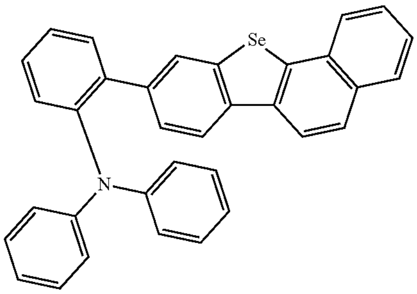

-continued
H2-45
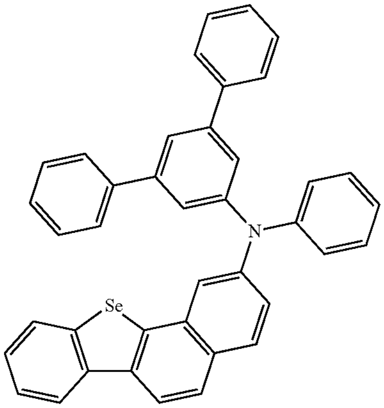
H2-46
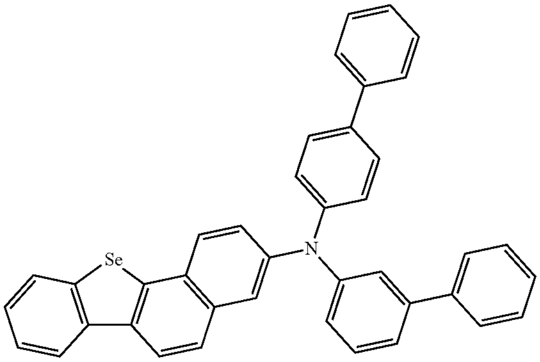
H2-47
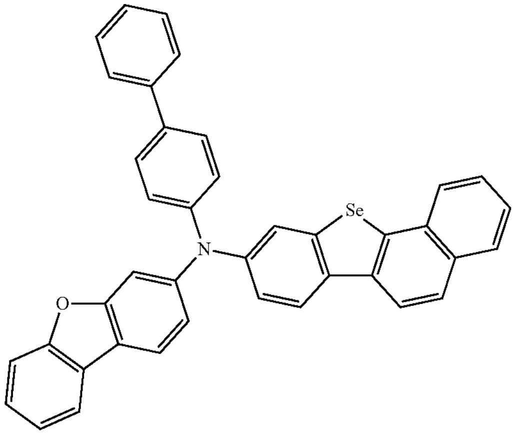
-continued
H2-48
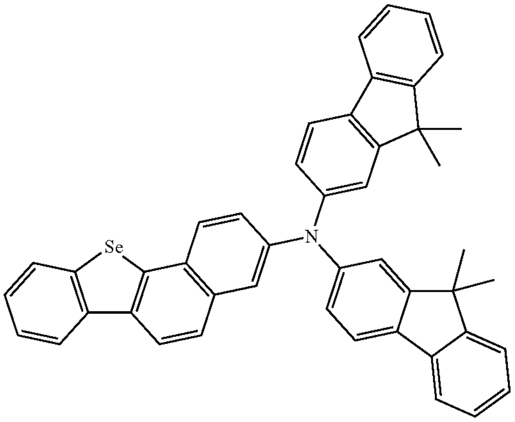
H2-49
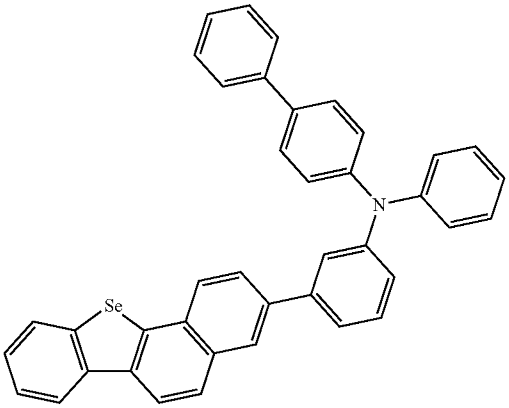
H2-50
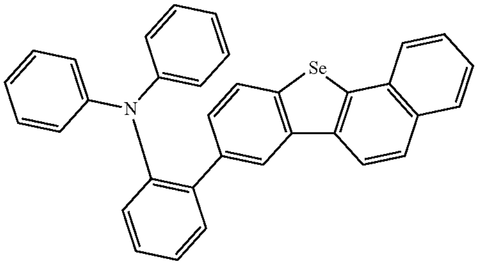
H2-51
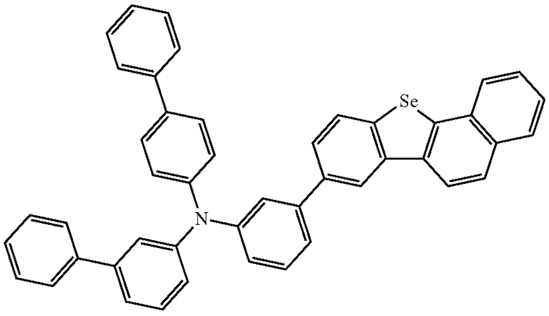

-continued
H2-52
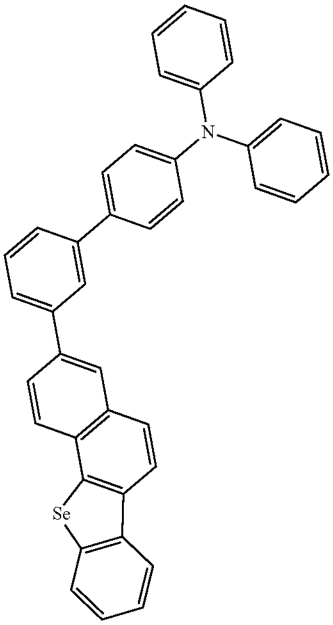
H2-53
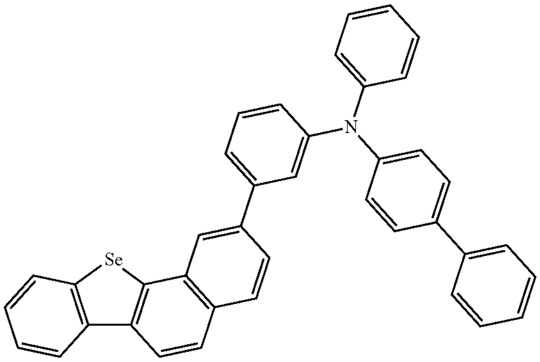
H2-54
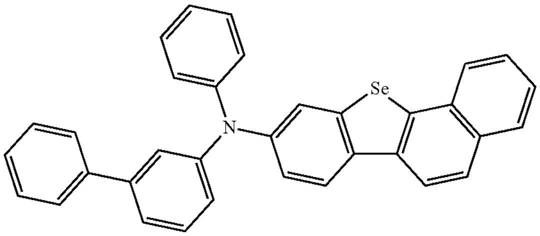
H2-55
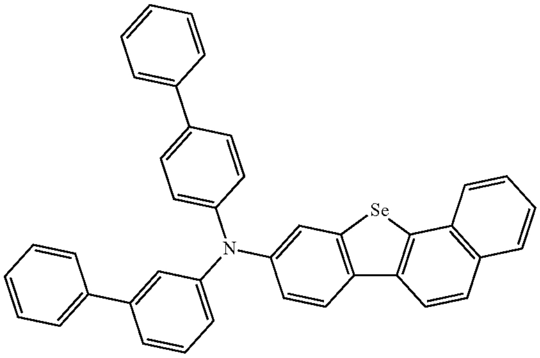
-continued
H2-56
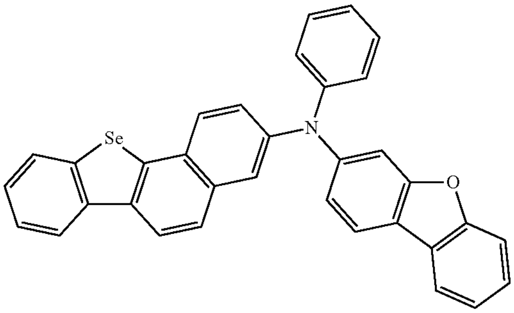
H2-57
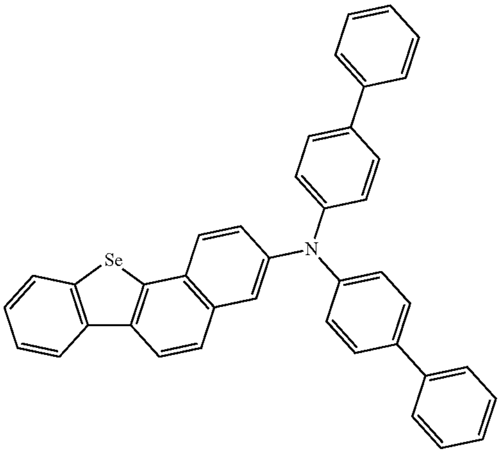
H2-58
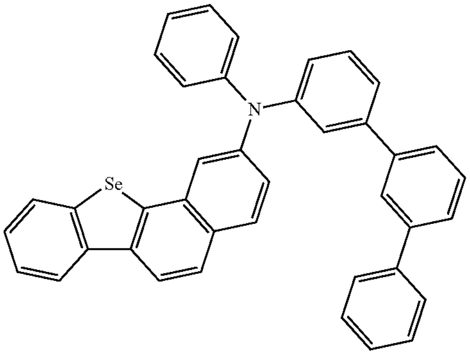
H2-59
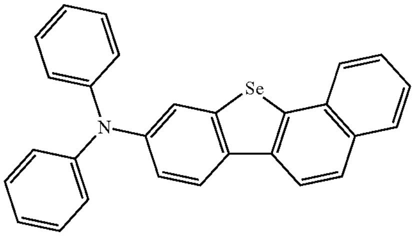

-continued
H2-60
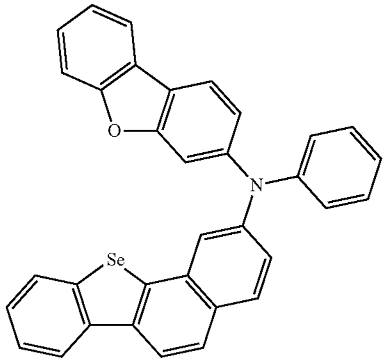
H2-61
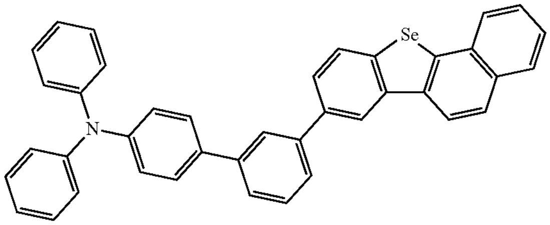
H2-62
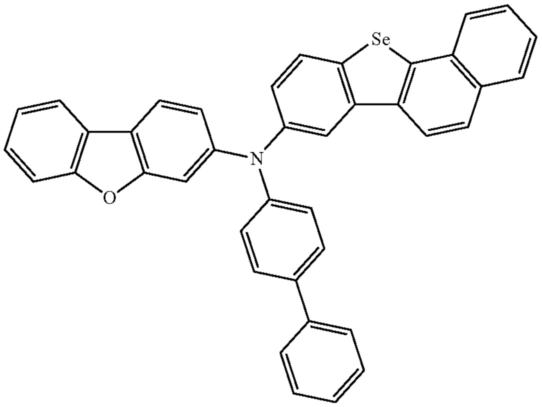
H2-63
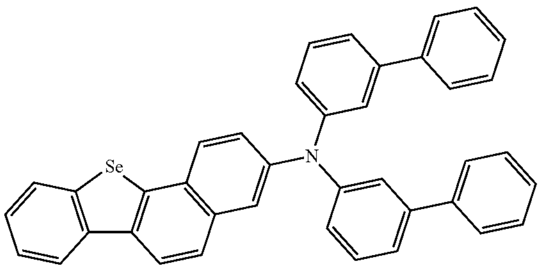
-continued
H2-64
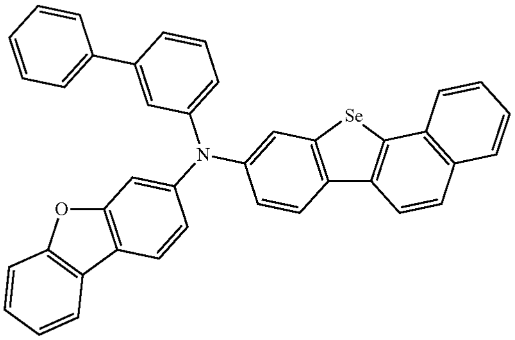
H2-65
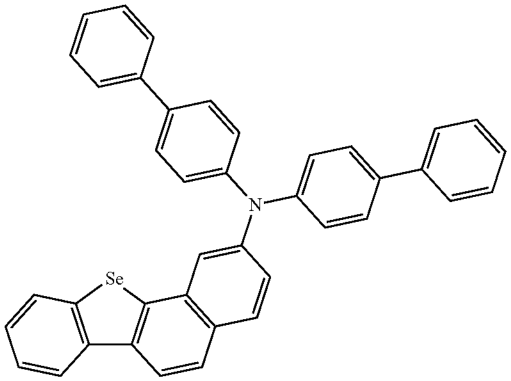
H2-66
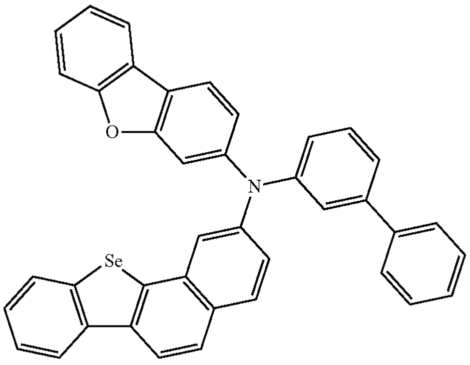
H2-67
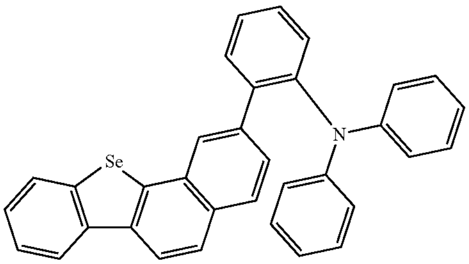

-continued
H2-68
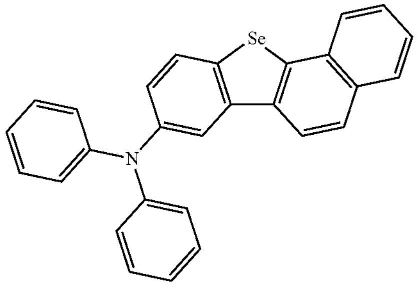
H2-69
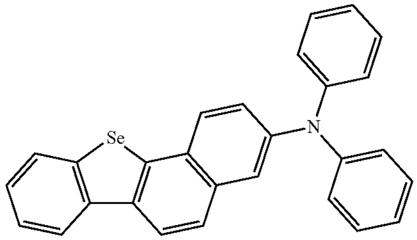
H2-70
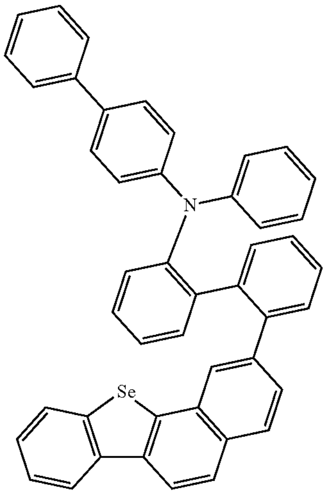
H2-71
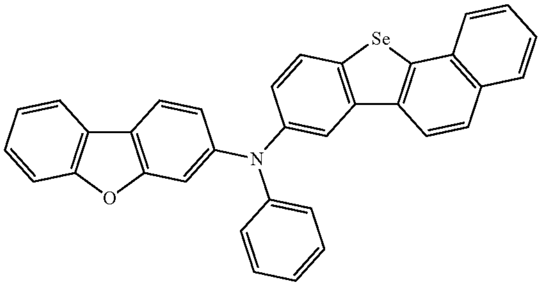
H2-72
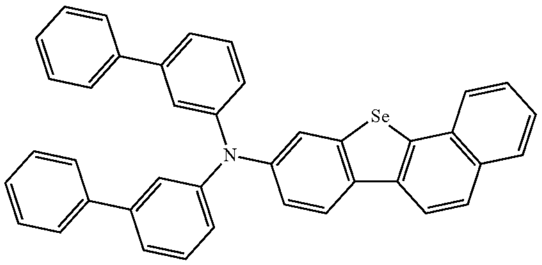
-continued
H2-73
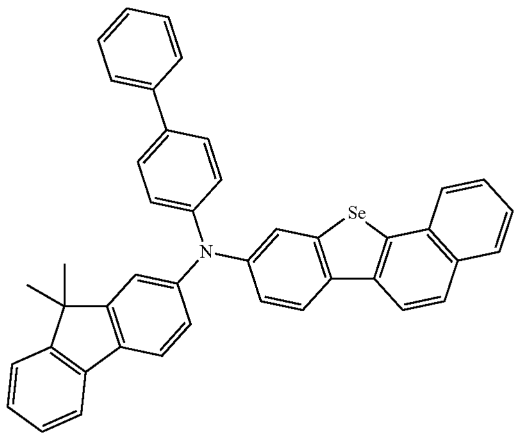
H2-74
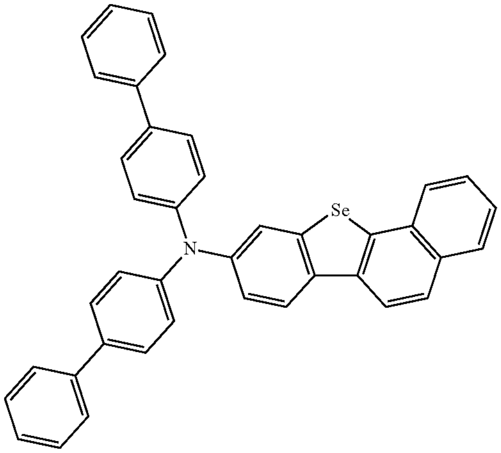
H2-75
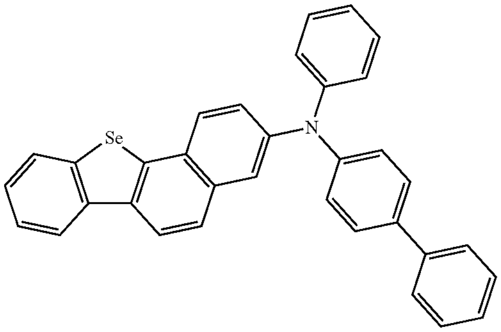
H2-76
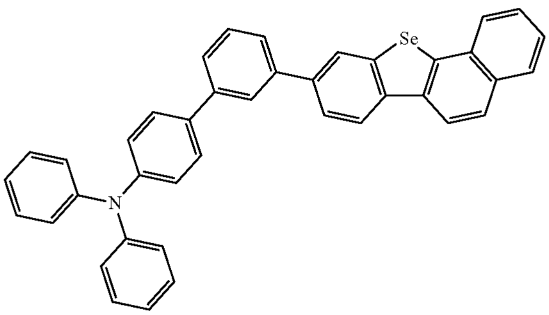

-continued
H2-77
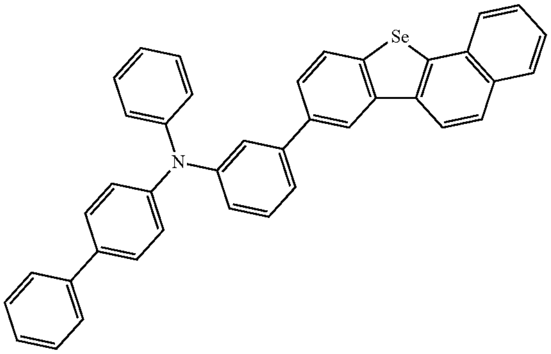
H2-78
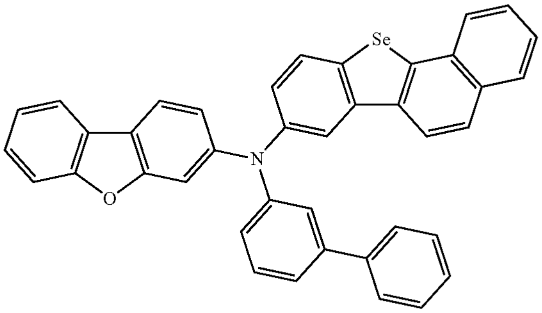
H2-79
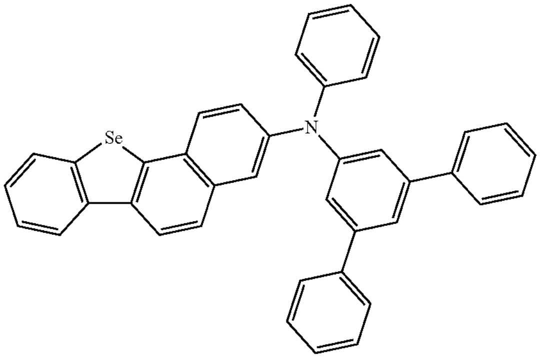
H2-80
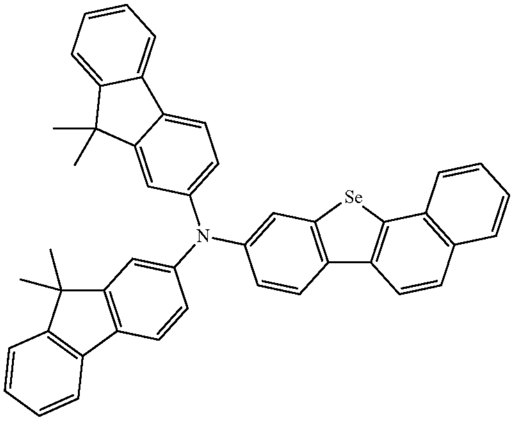
H2-81
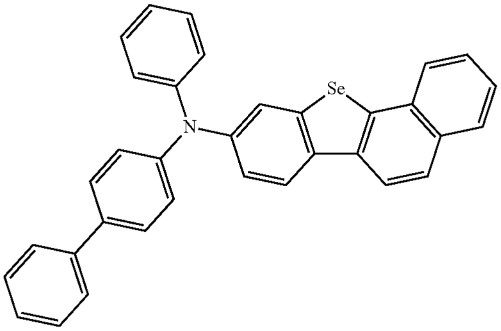
H2-82
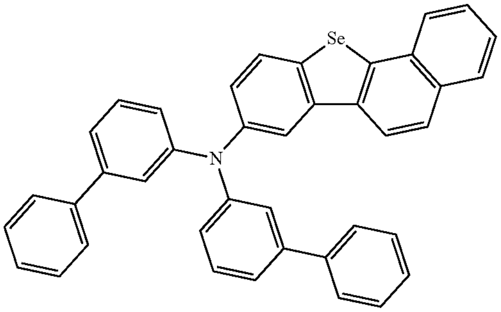
H2-83
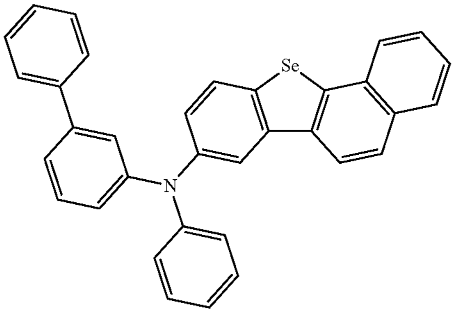
H2-84
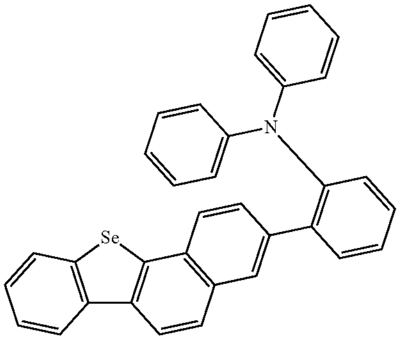
H2-85
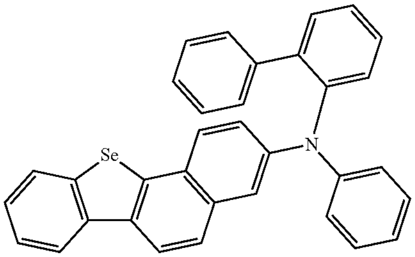

H2-86
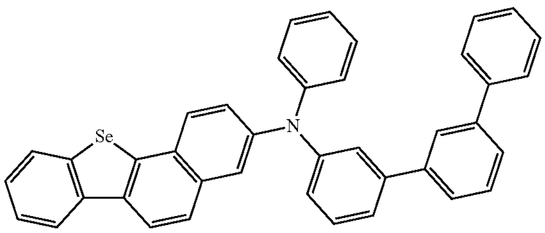
H2-87
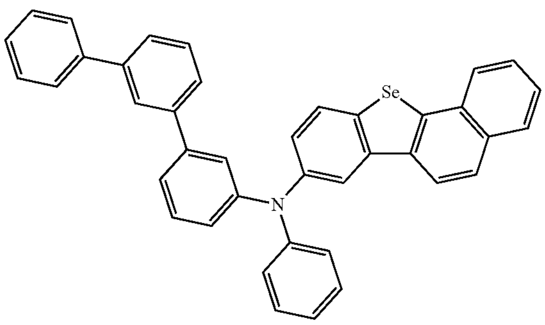
H2-88
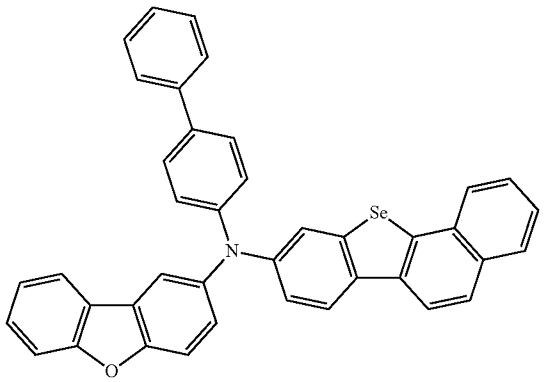
H2-89
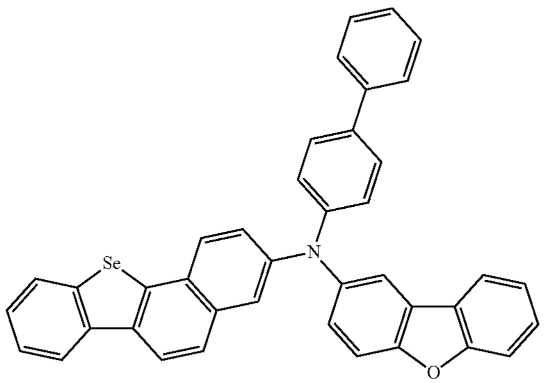
H2-90
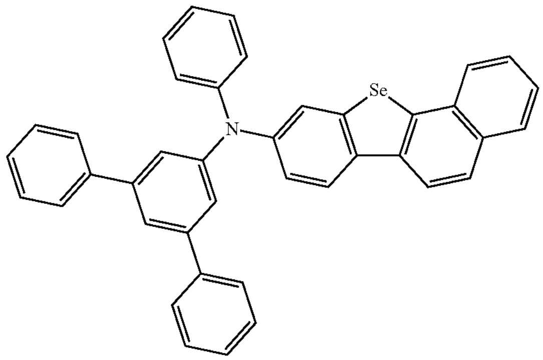
H2-91
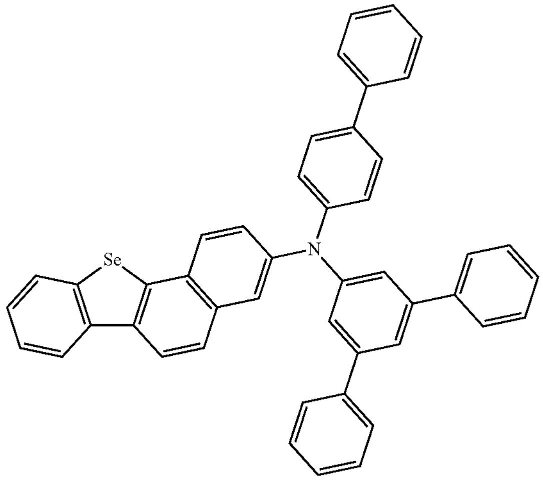
H2-92
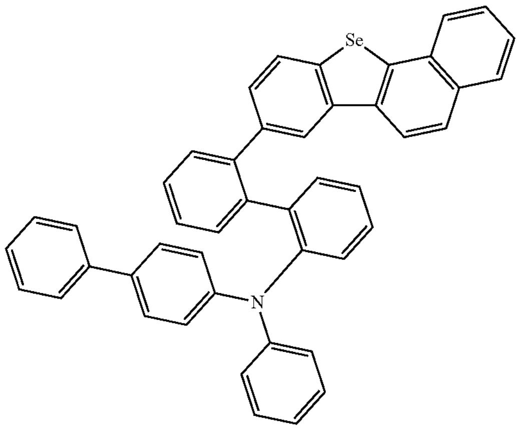
H2-93
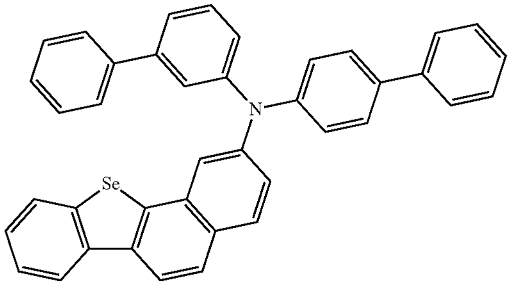

-continued
H2-94
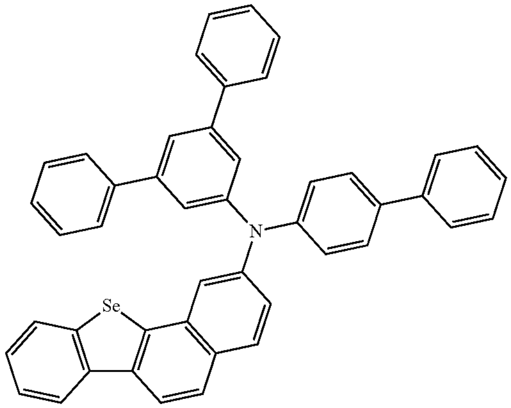
H2-95
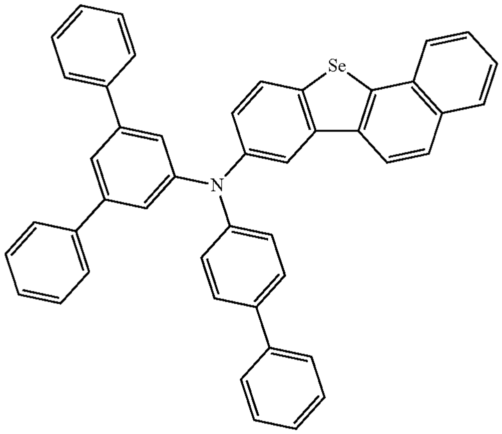
H2-96
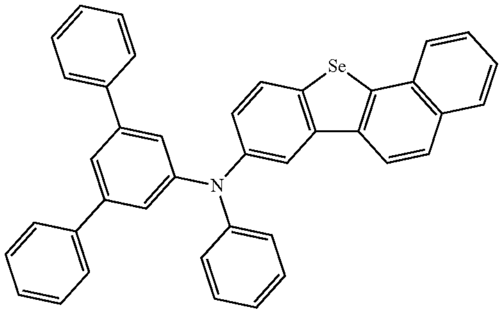
-continued
H2-97
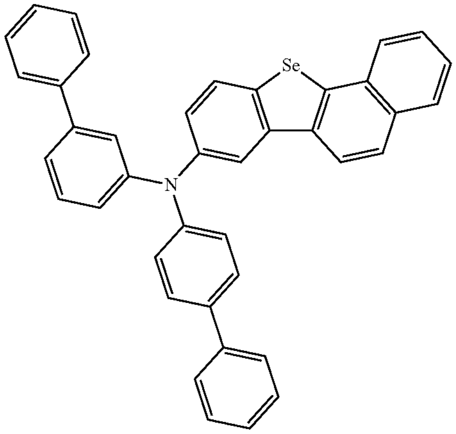
H2-98
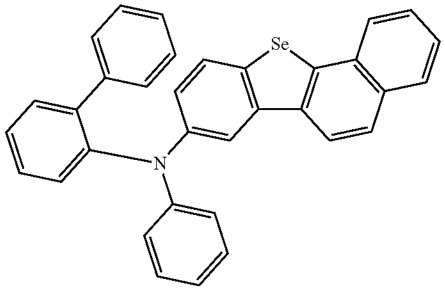
H2-99
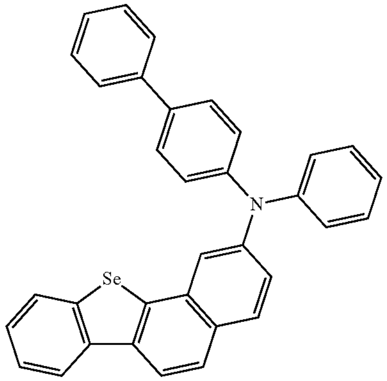
H2-100
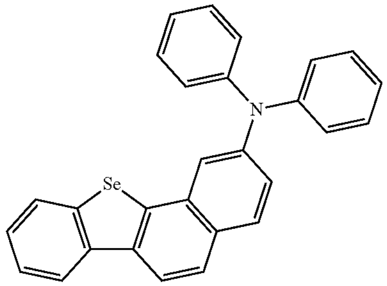

-continued
H2-101
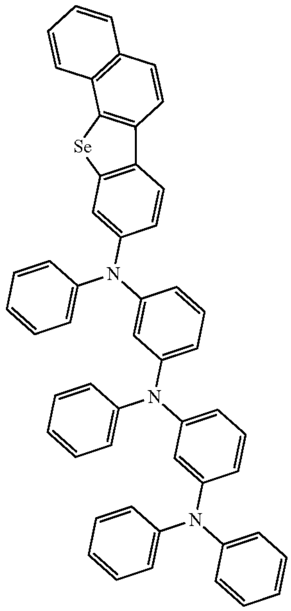
H2-102
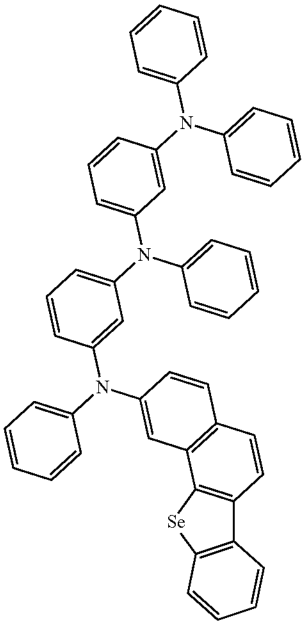
-continued
H2-103
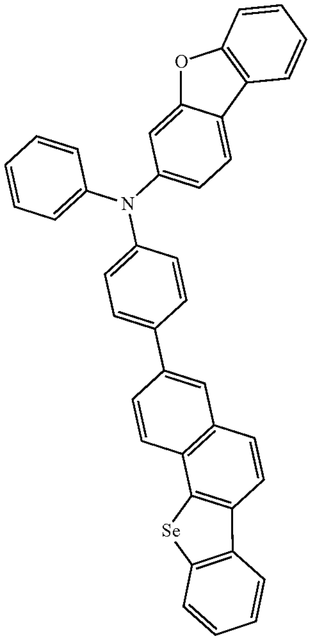
H2-104
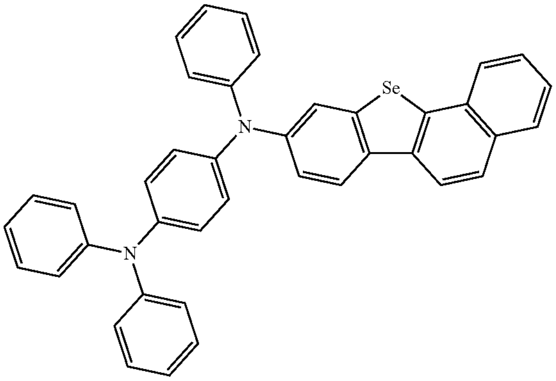
H2-105
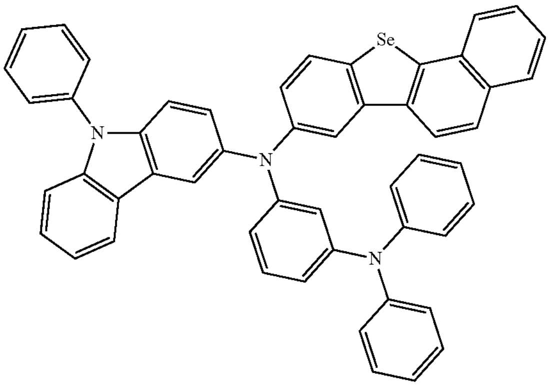

-continued
H2-106
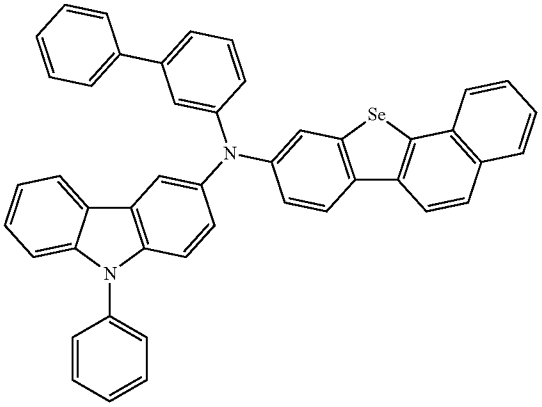
H2-107
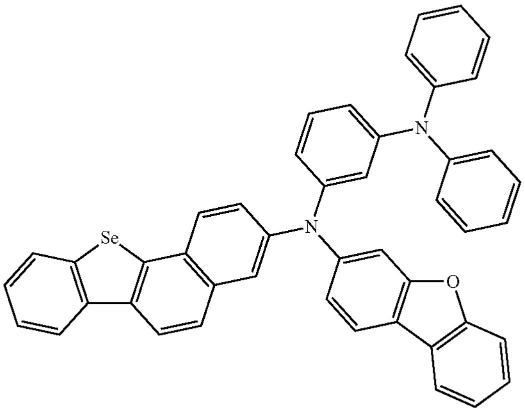
H2-108
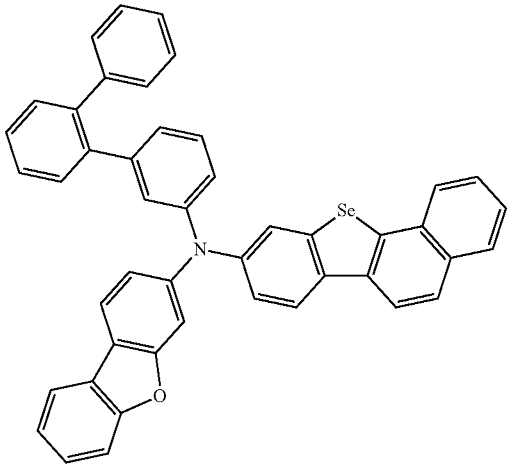
-continued
H2-109
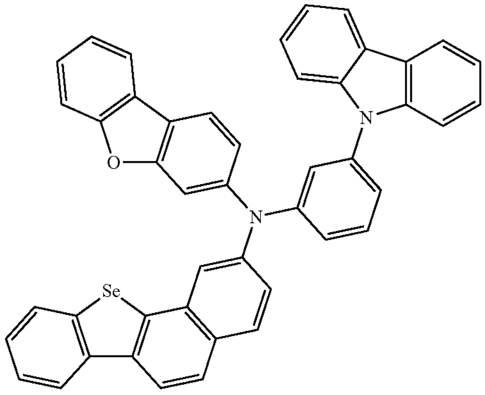
H2-110
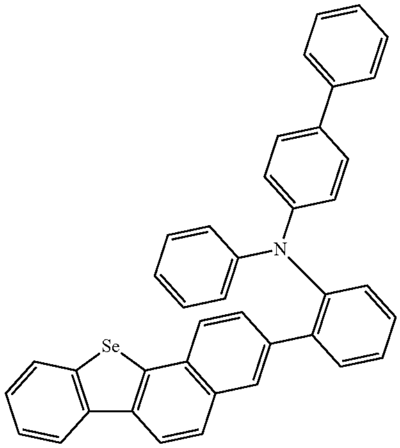
H2-111
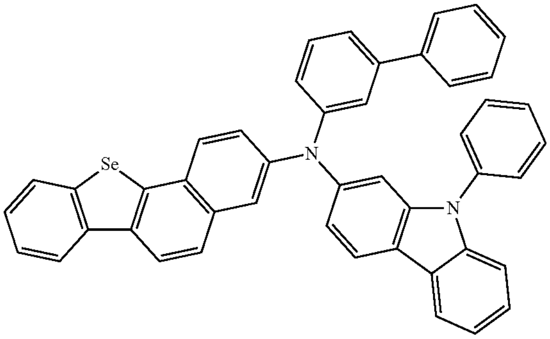
H2-112
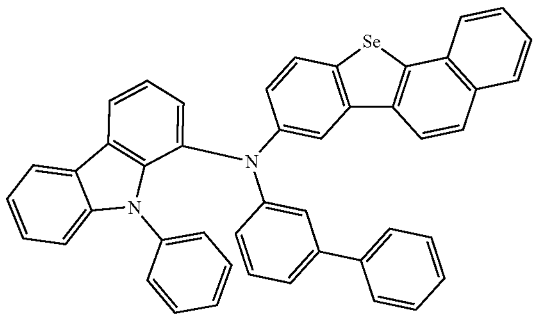

-continued
H2-113
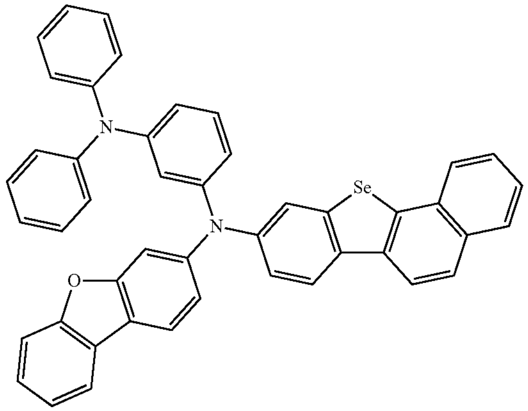
H2-114
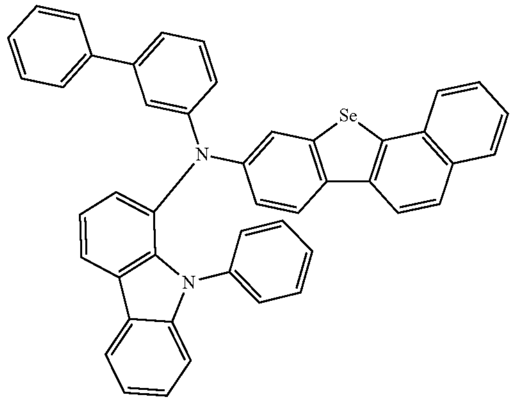
H2-115
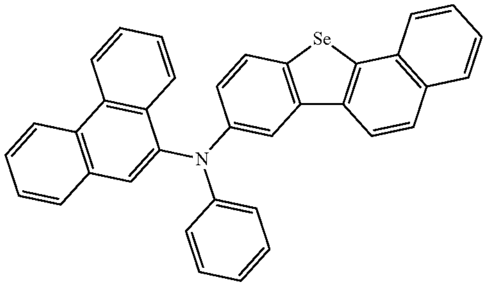
-continued
H2-116
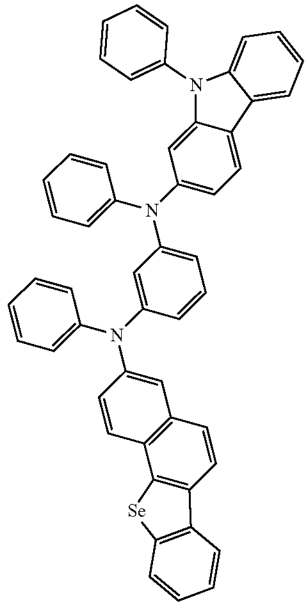
H2-117
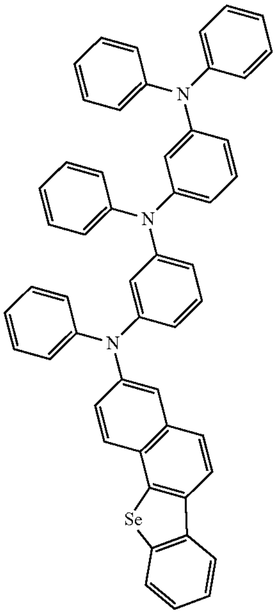

-continued
H2-118
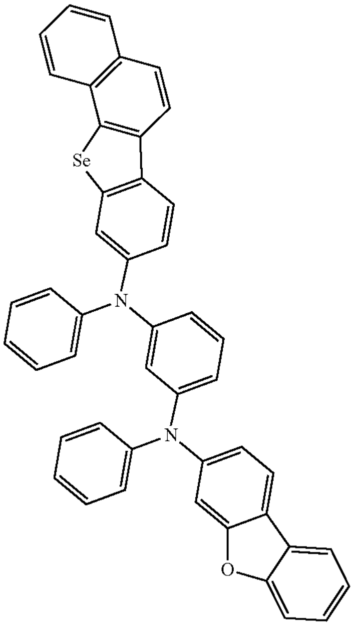
H2-119
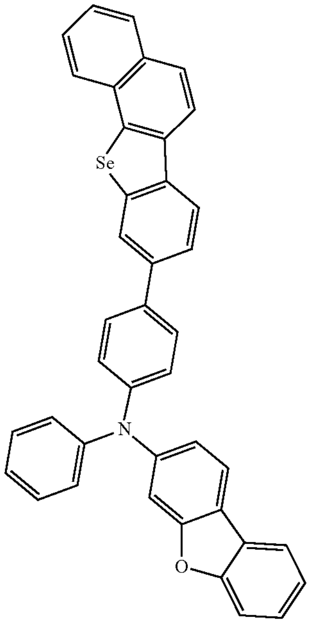
H2-120
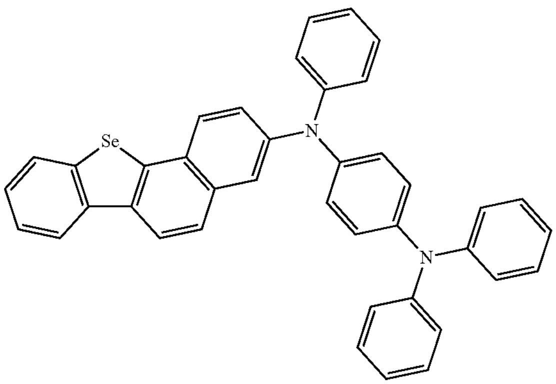
-continued
H2-121
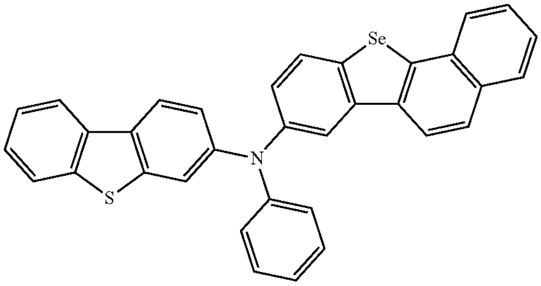
H2-122
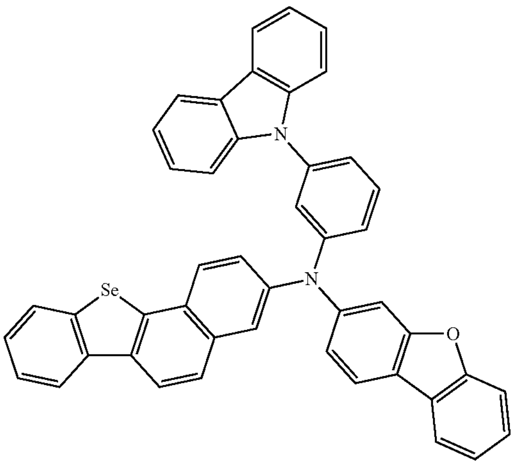
H2-123
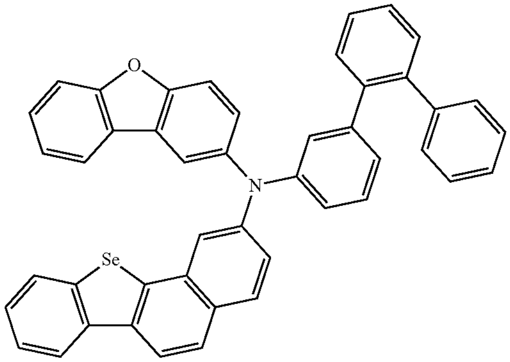
H2-124
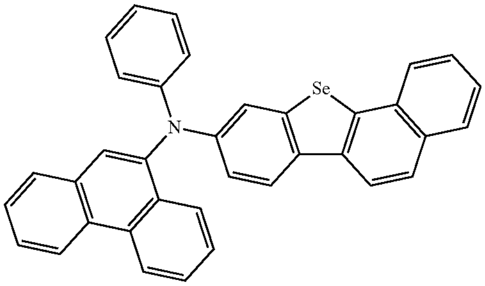

-continued
H2-125
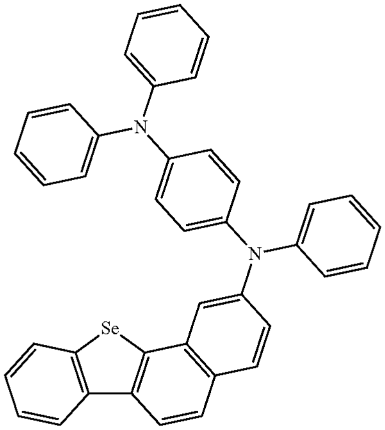
H2-126
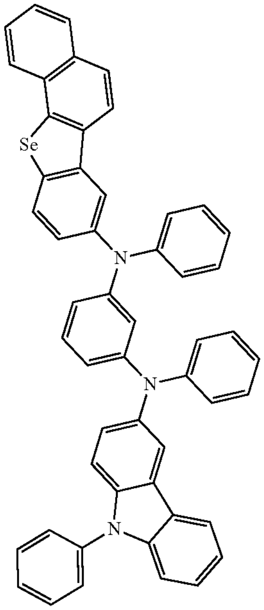
-continued
H2-127
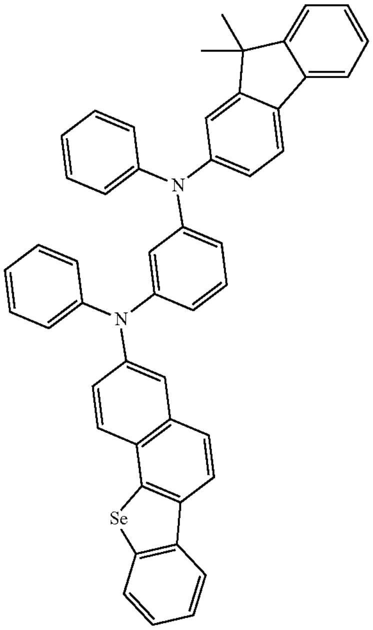
H2-128
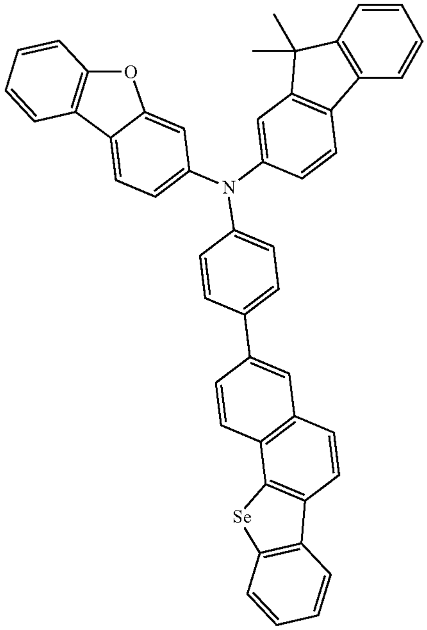
H2-129
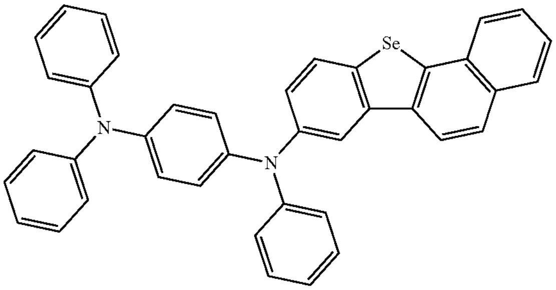

-continued
H2-130
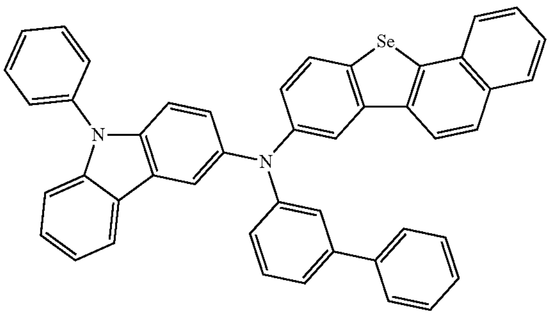
H2-131
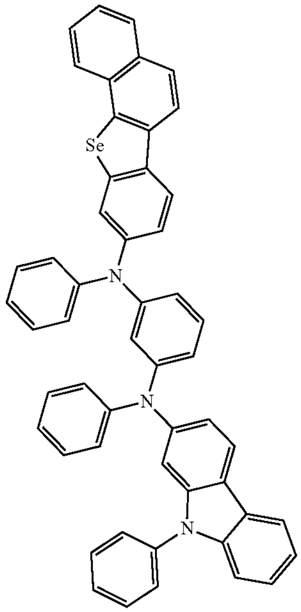
H2-132
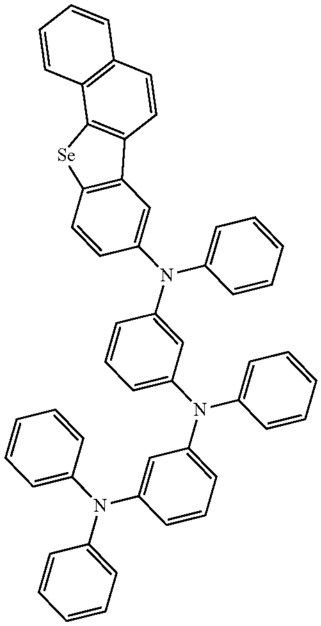
-continued
H2-133
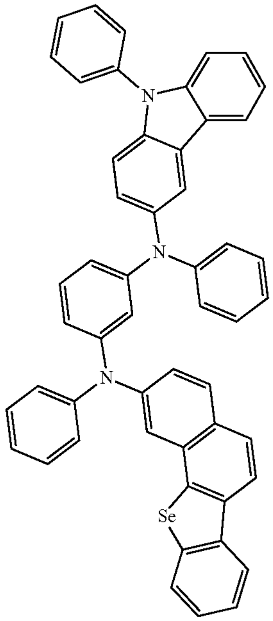
H2-134
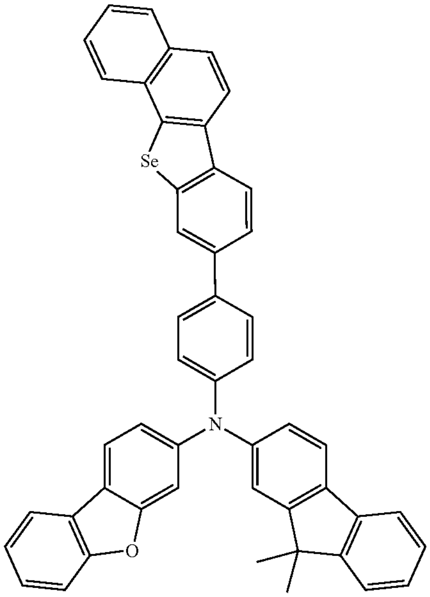

-continued
H2-135
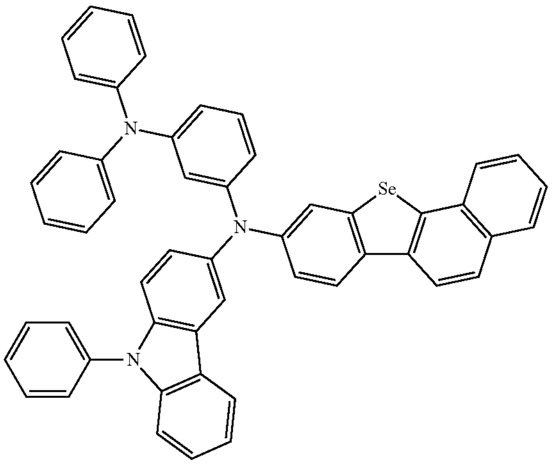
H2-136
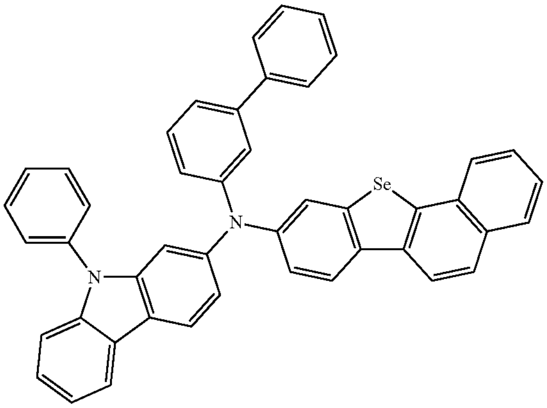
H2-137
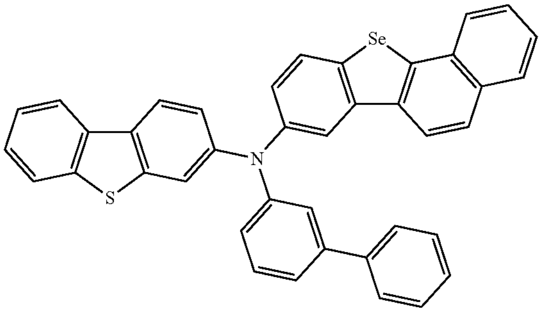
H2-138
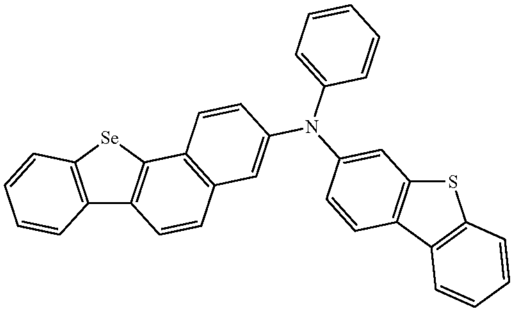
-continued
H2-139
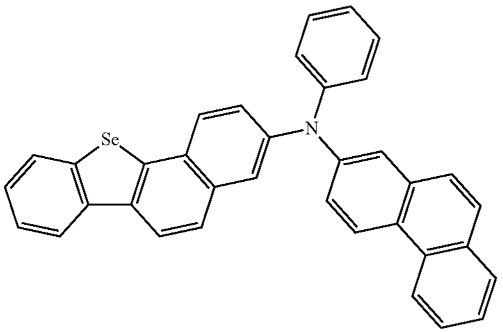
H2-140
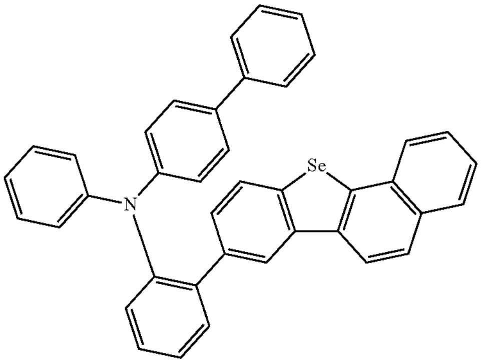
H2-141
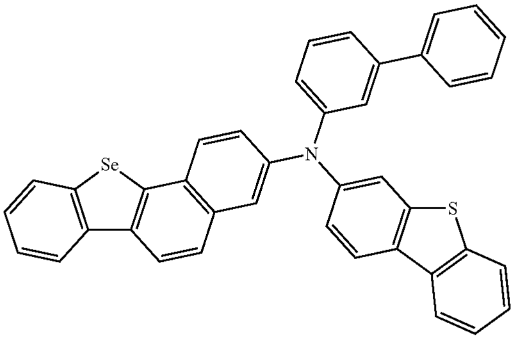
H2-142
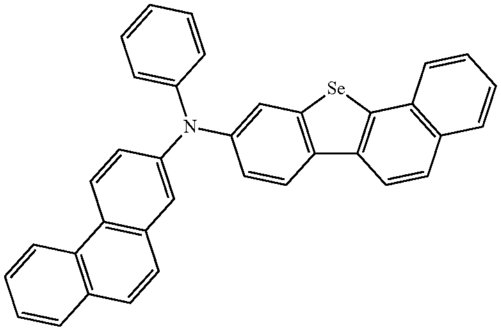

-continued
H2-143
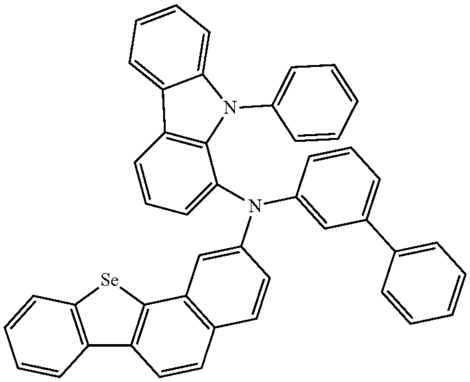
H2-144
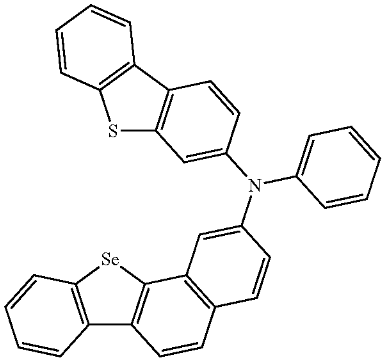
H2-145
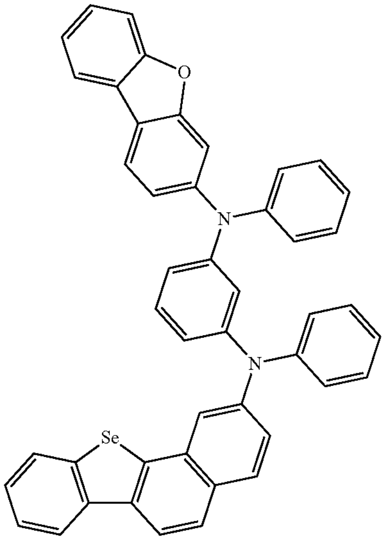
H2-146
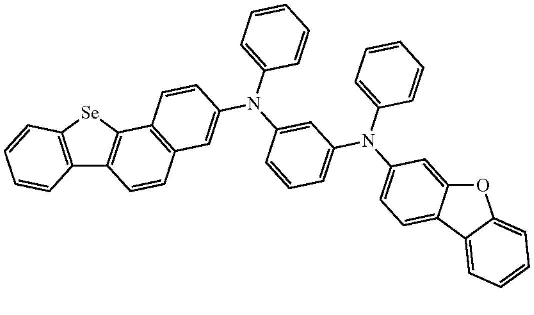
-continued
H2-147
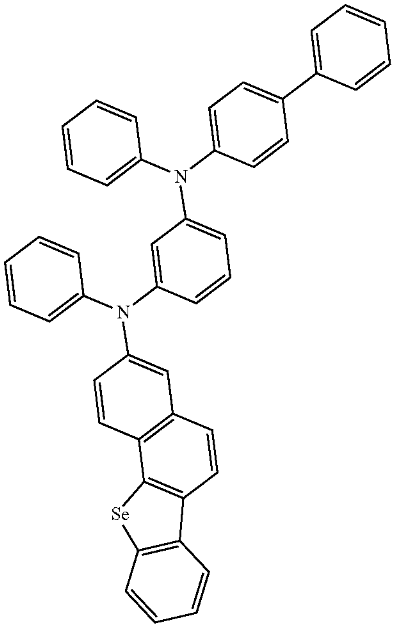
H2-148
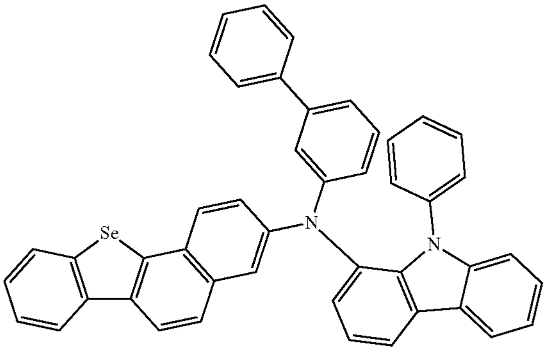
H2-149
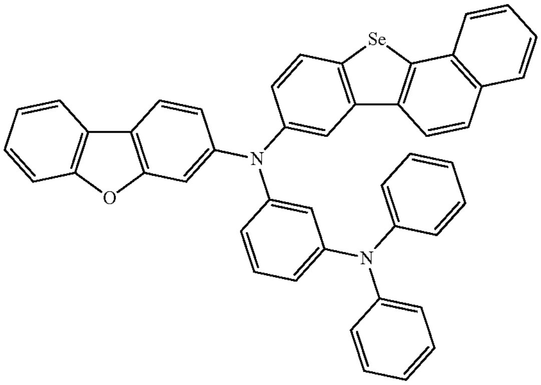

-continued
H2-150
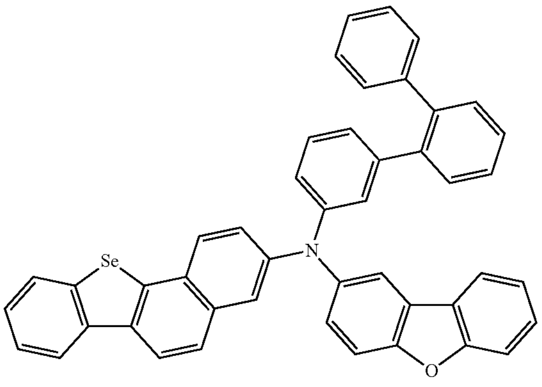
H2-151
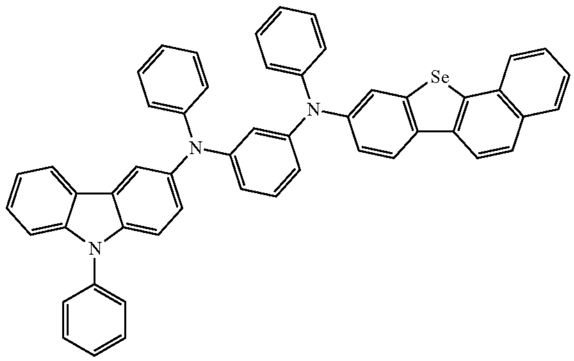
H2-152
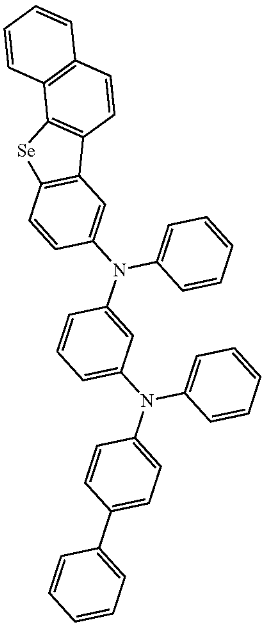
-continued
H2-153
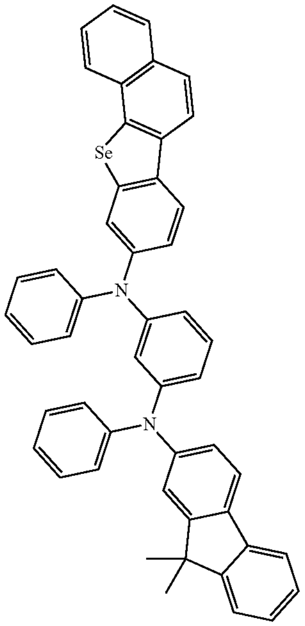
H2-154
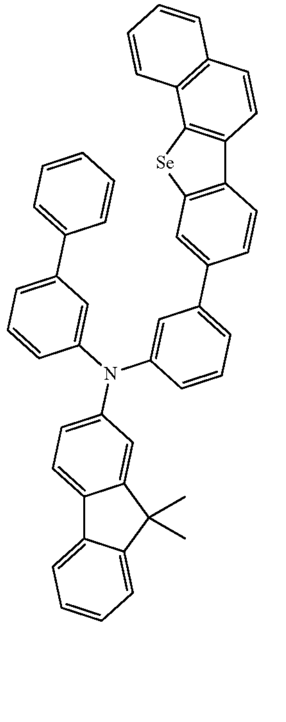
H2-155
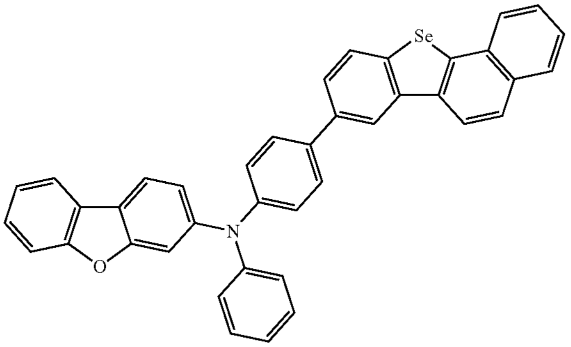

-continued
H2-156
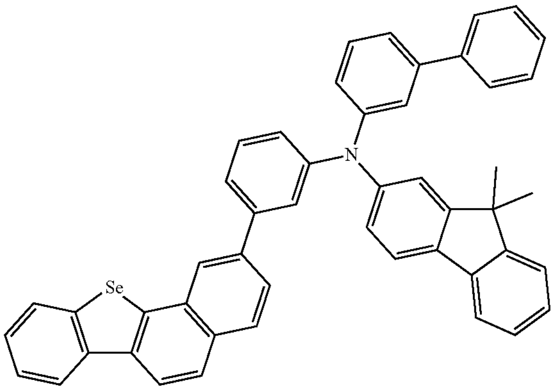
H2-157
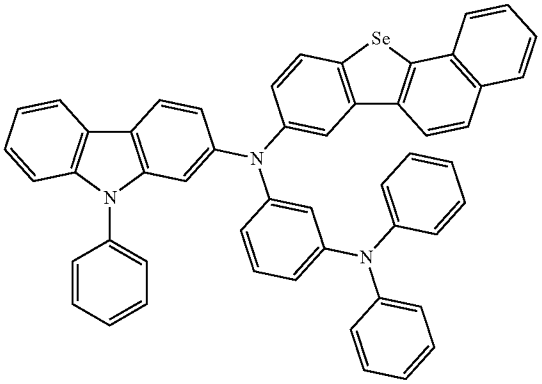
H2-158
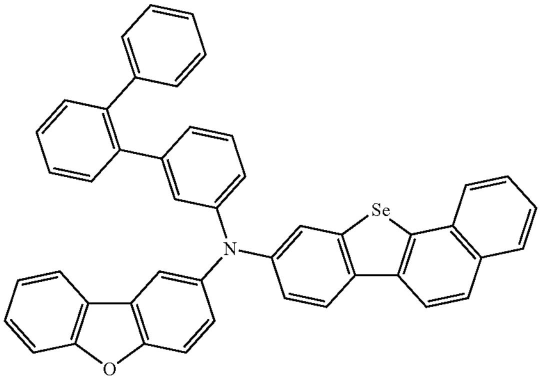
H2-159
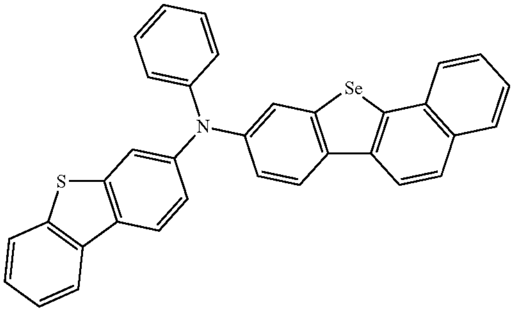
-continued
H2-160
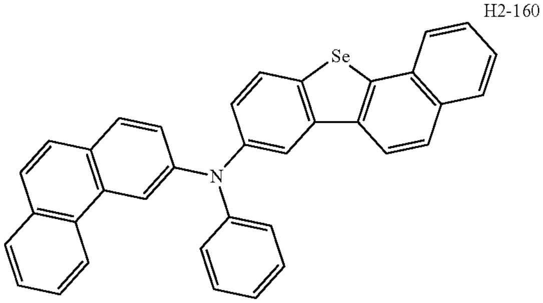
H2-161
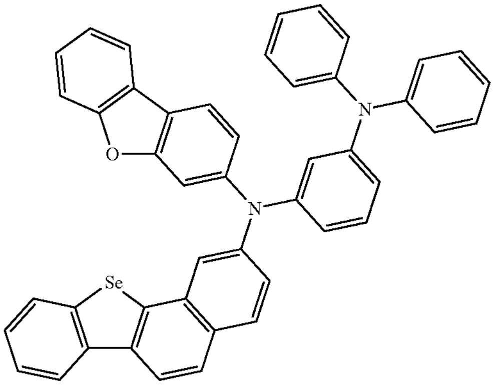
H2-162
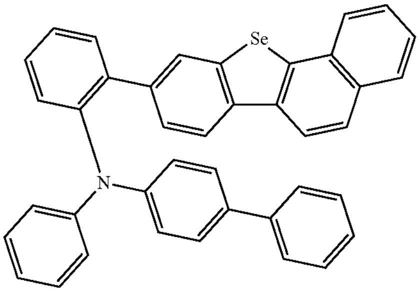
H2-163
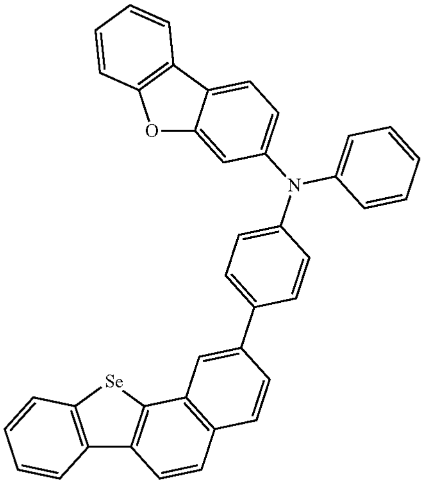

-continued
H2-164
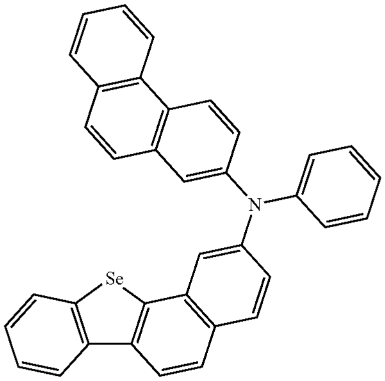
H2-165
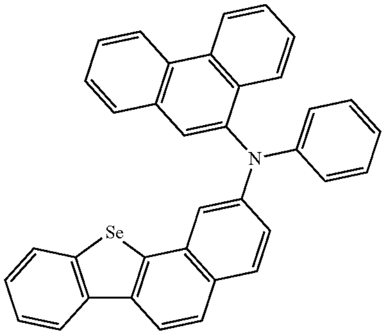
H2-166
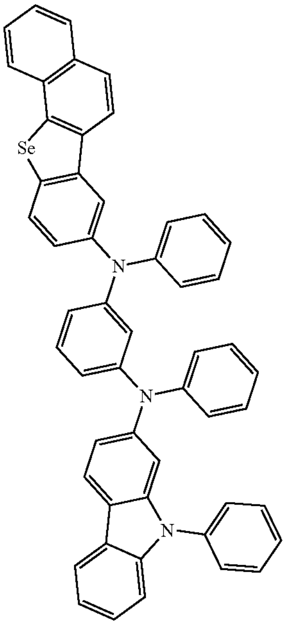
-continued
H2-167
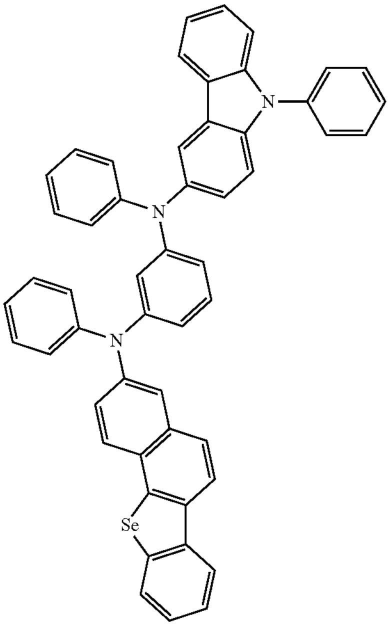
H2-168
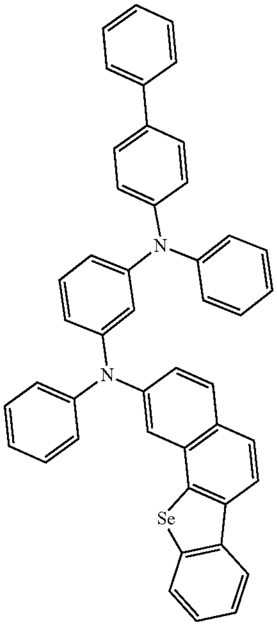

-continued
H2-169
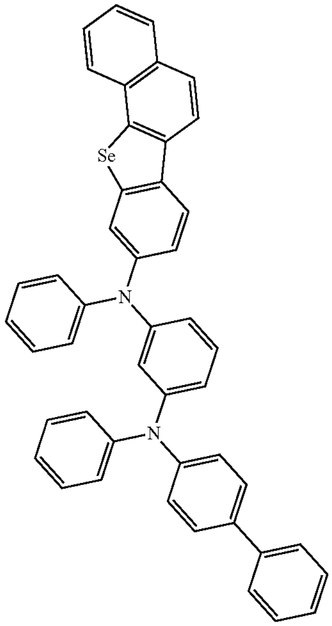
H2-170
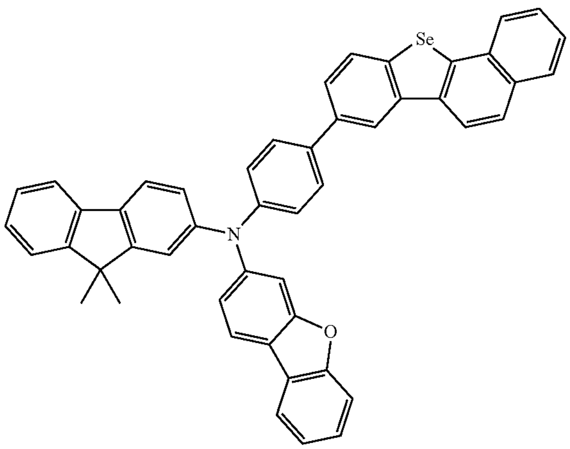
H2-171
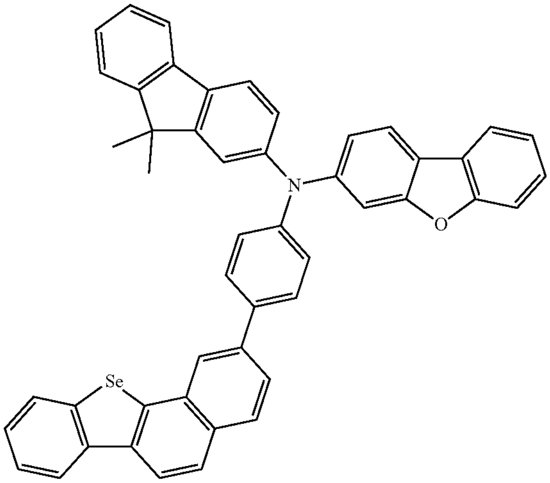
-continued
H2-172
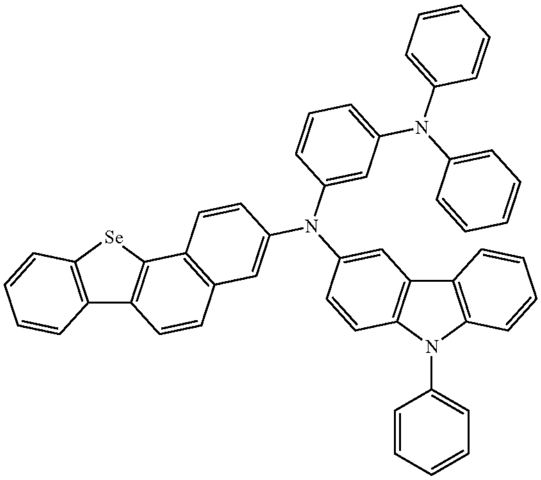
H2-173
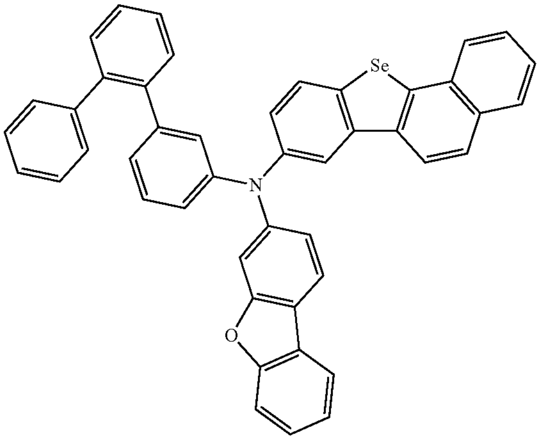
H2-174
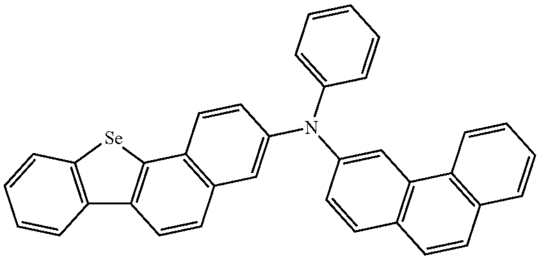
H2-175
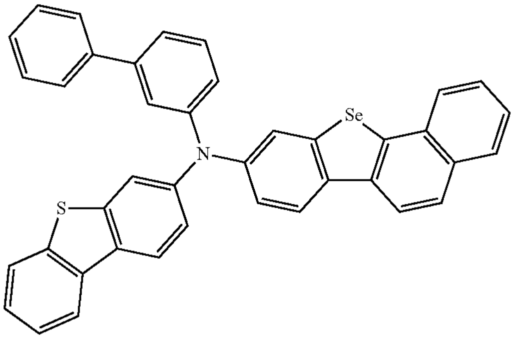

-continued
H2-176
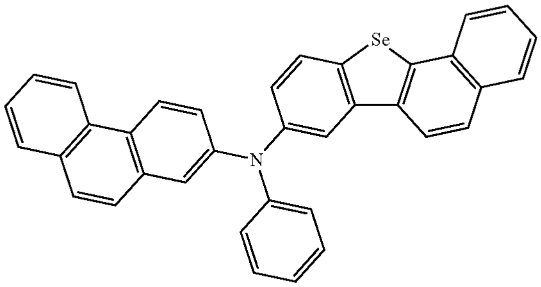
H2-177
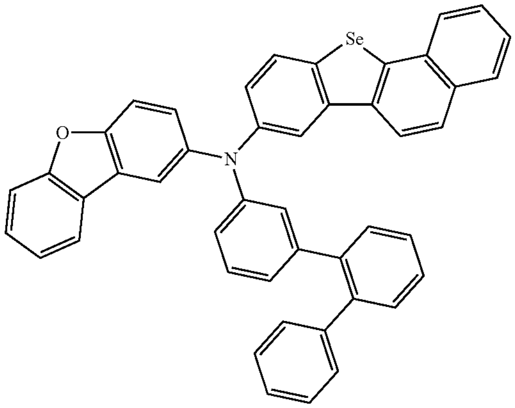
H2-178
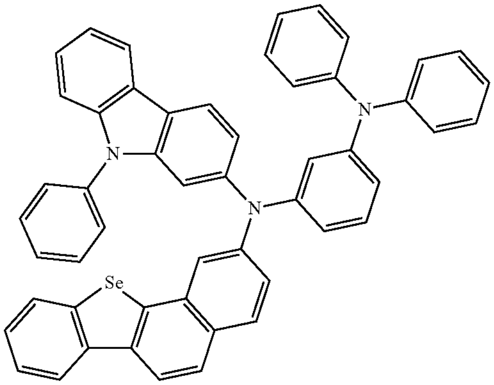
H2-179
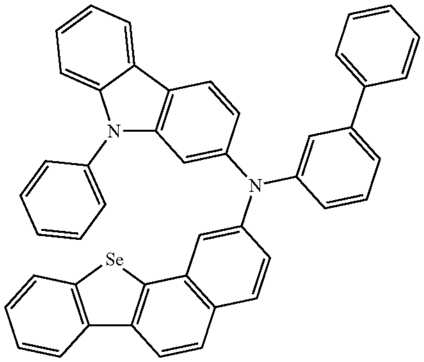
-continued
H2-180
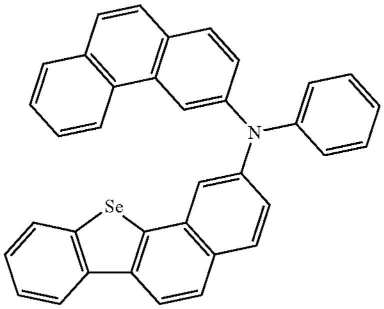
H2-181
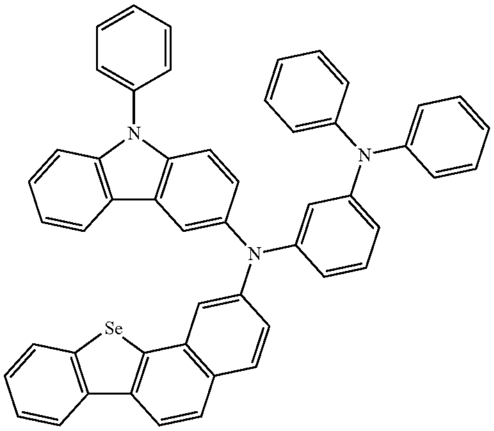
H2-182
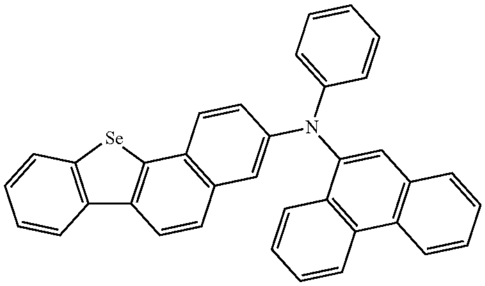
H2-183
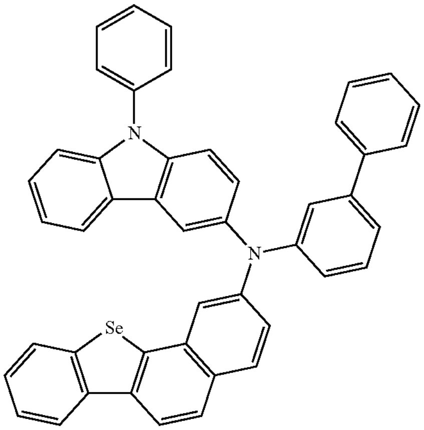

-continued
H2-184
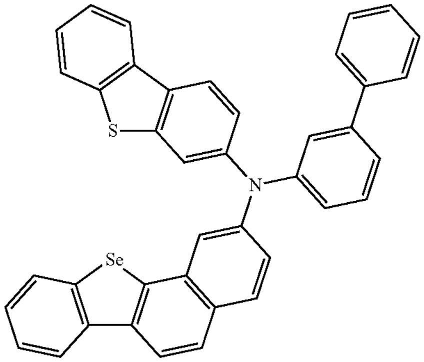
H2-185
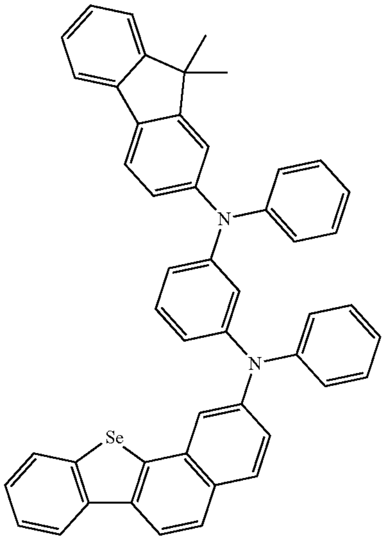
H2-186
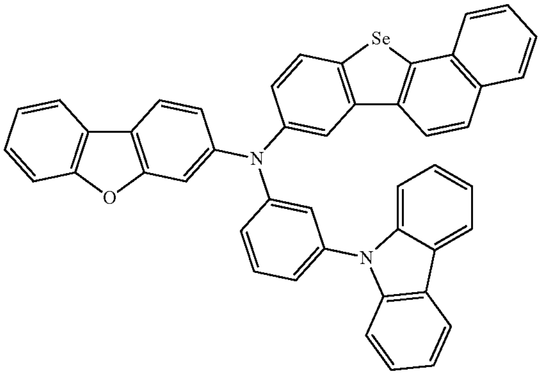
H2-187
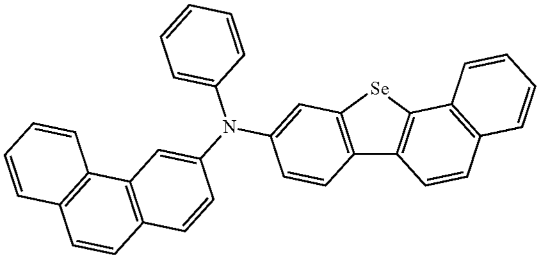
-continued
H2-188
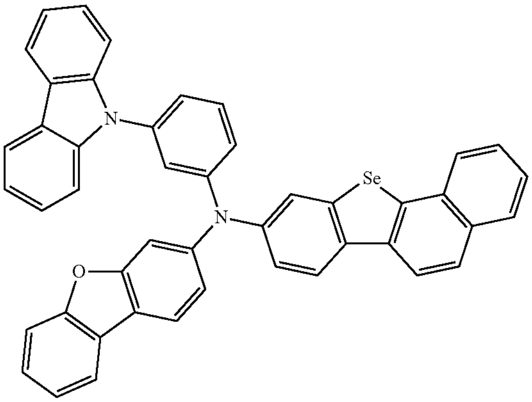
H2-189
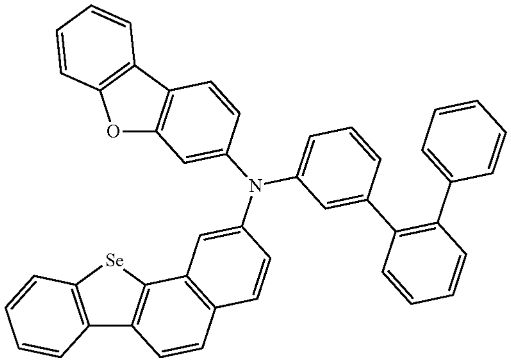
H2-190
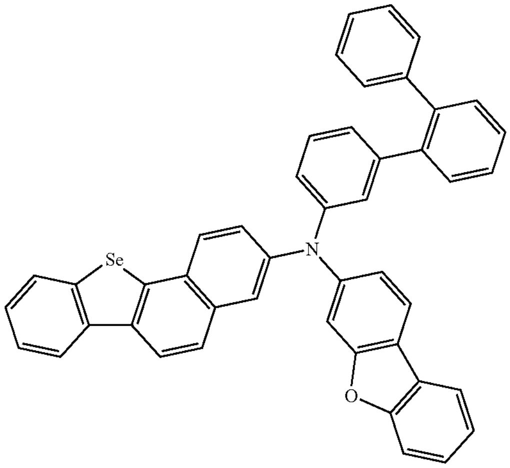

-continued
H2-191
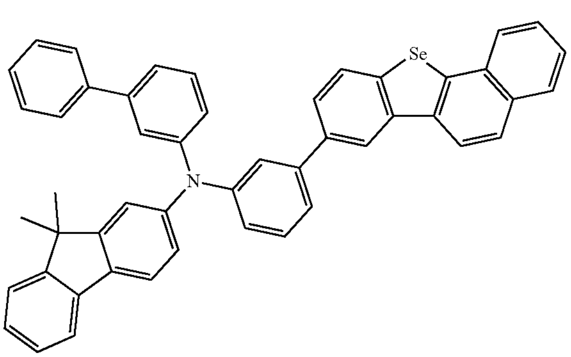
H2-192
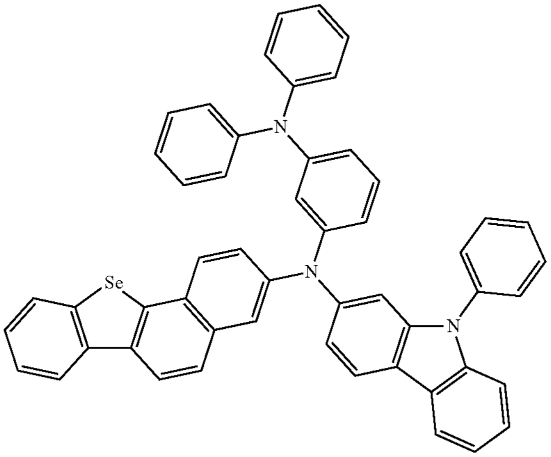
H2-193
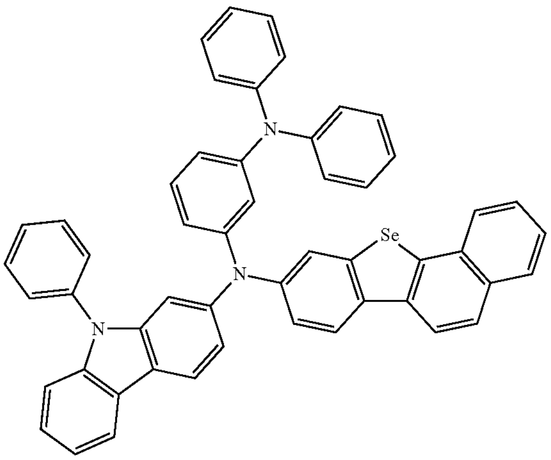
-continued
H2-194
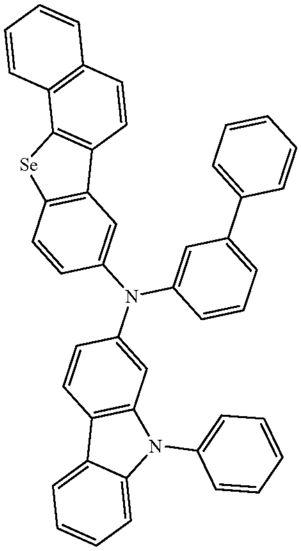
H2-195
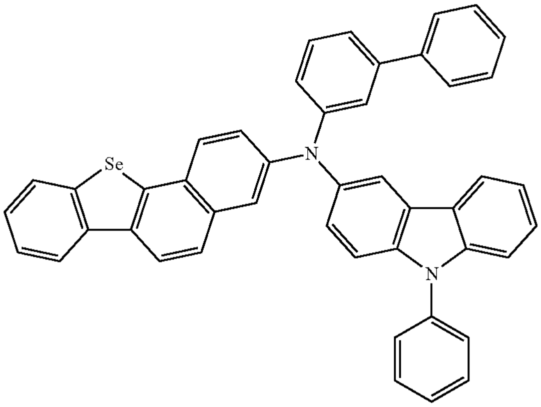
H2-196
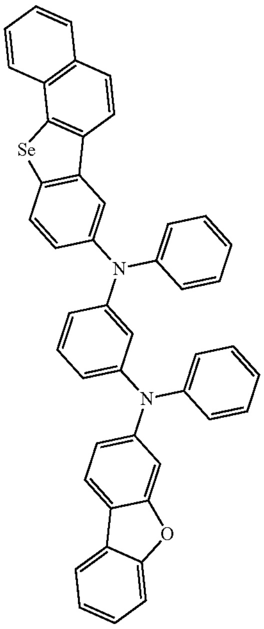

-continued
H2-197
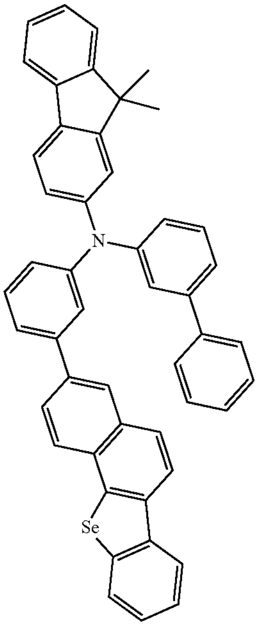
H2-198
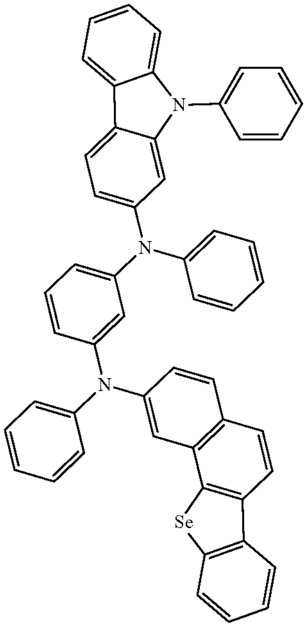
H2-199
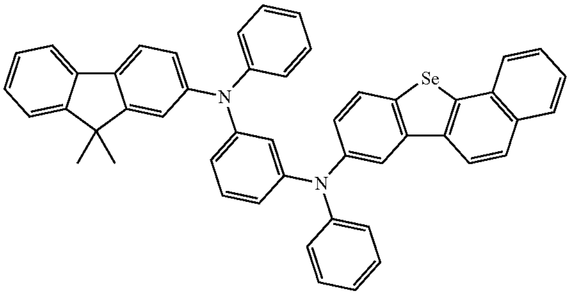
-continued
H2-200
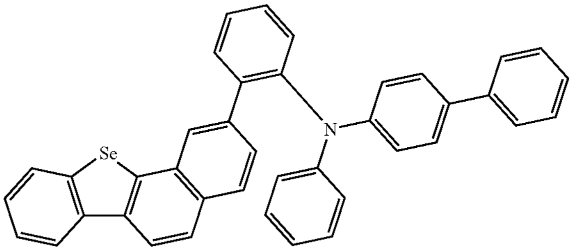
H2-201
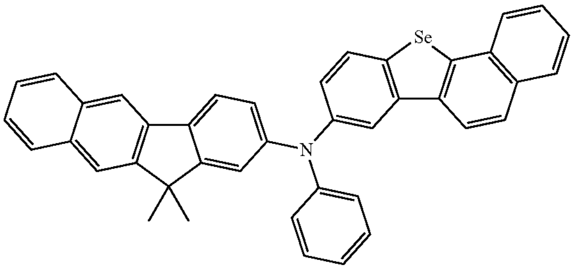
H2-202
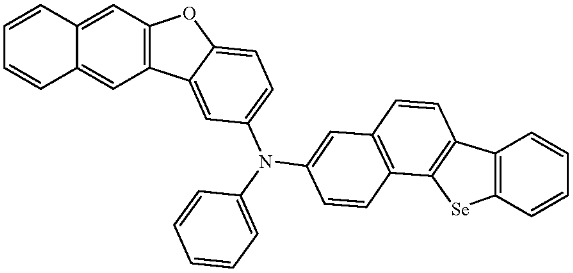
2-203
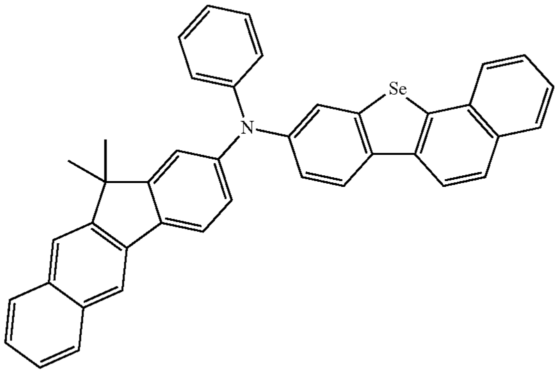
H2-204
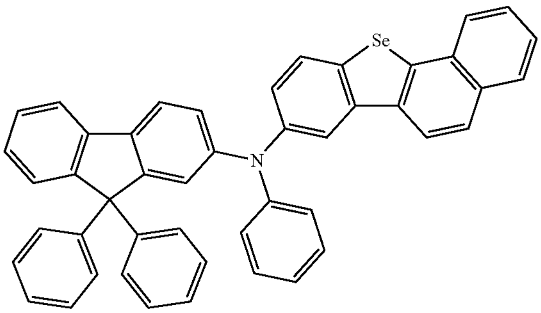

-continued
H2-205
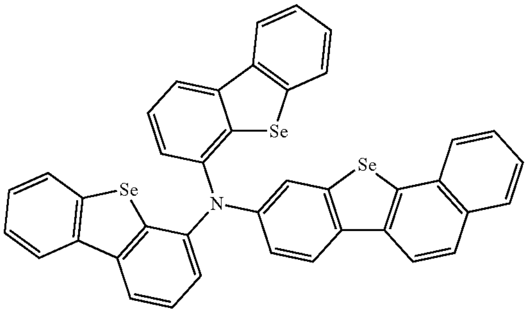
H2-206
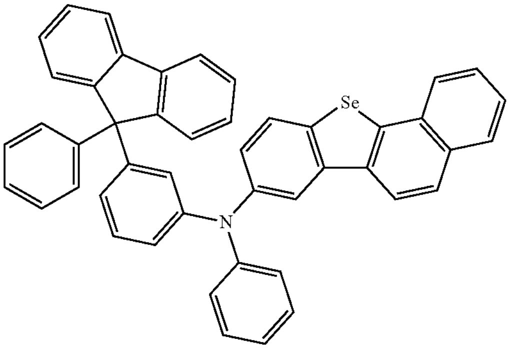
H2-207
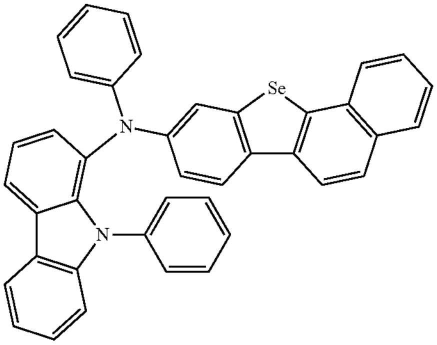
H2-208
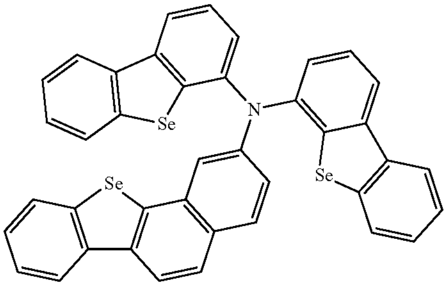
-continued
H2-209
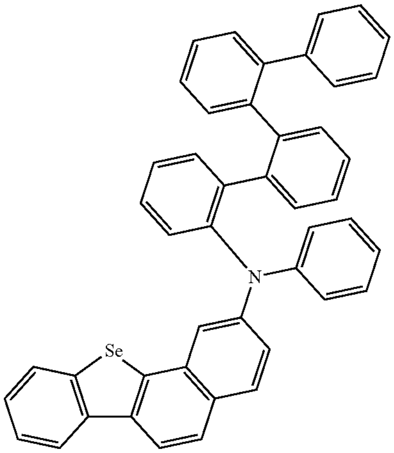
H2-210
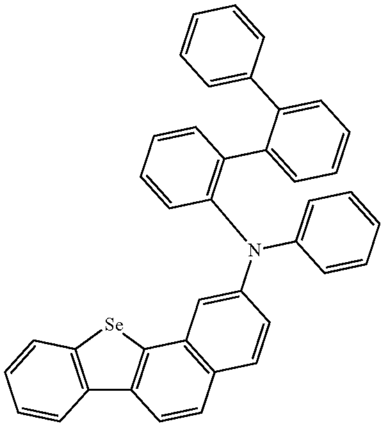
H2-211
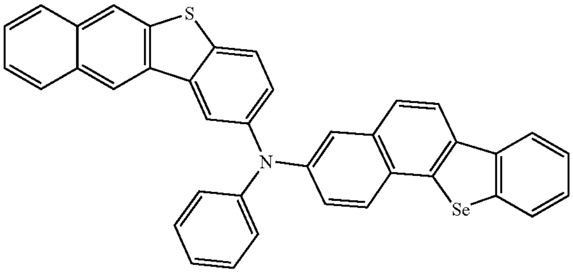
H2-212
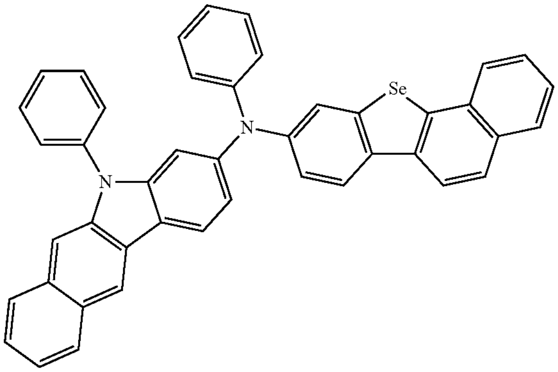

-continued
H2-213
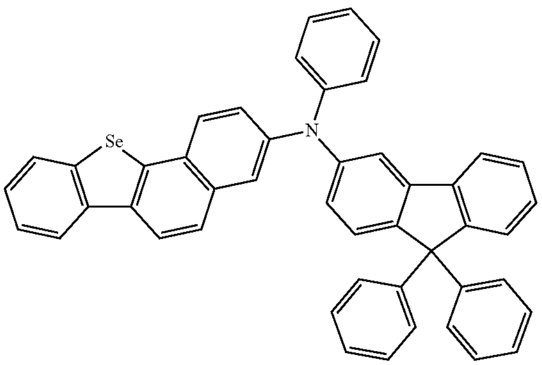
H2-214
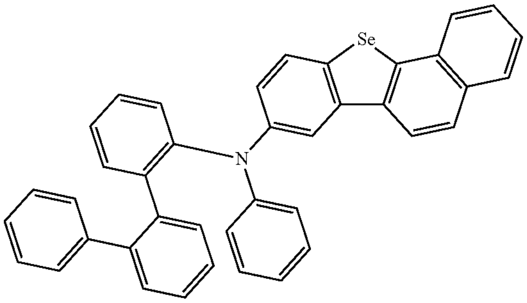
H2-215
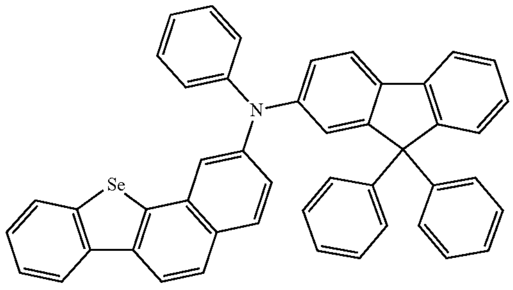
H2-216
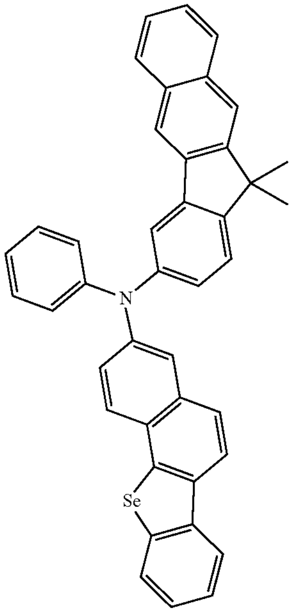
-continued
H2-217
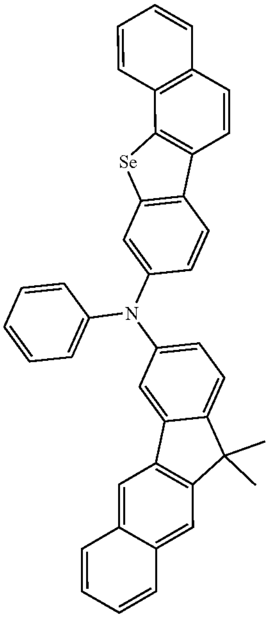
H2-218
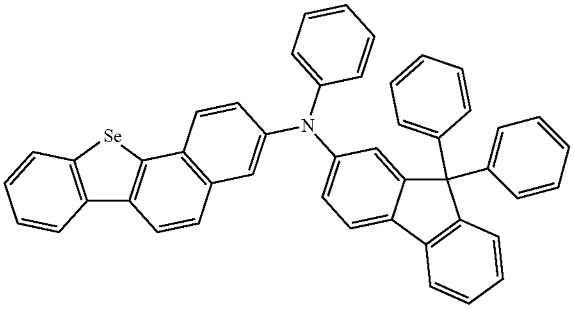
H2-219
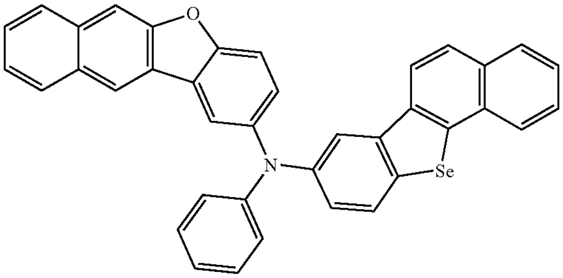
H2-220
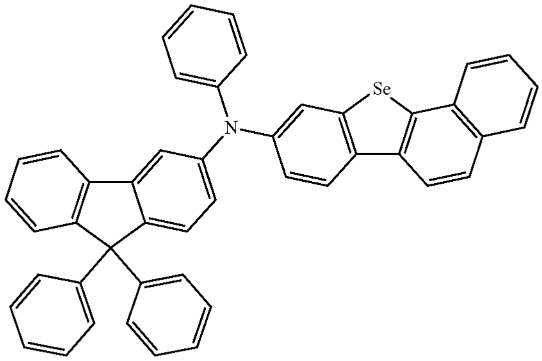

H2-221
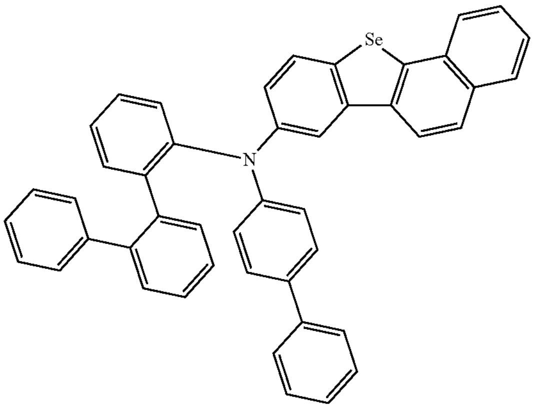
H2-222
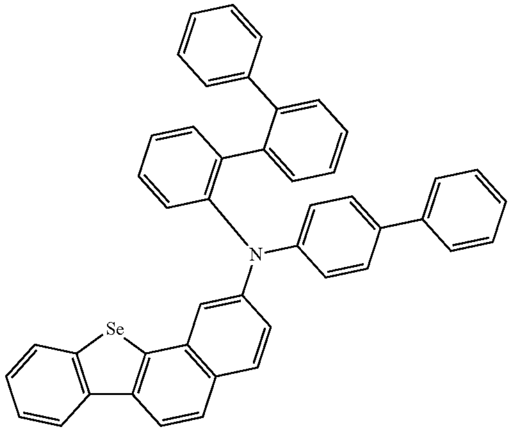
H2-223
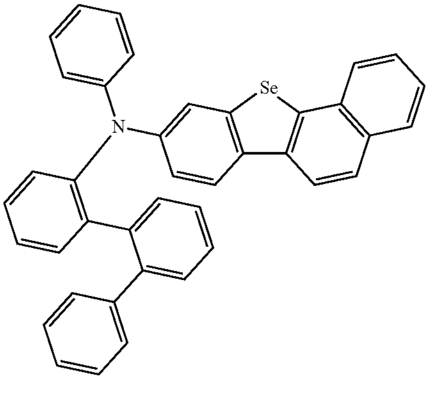
H2-224
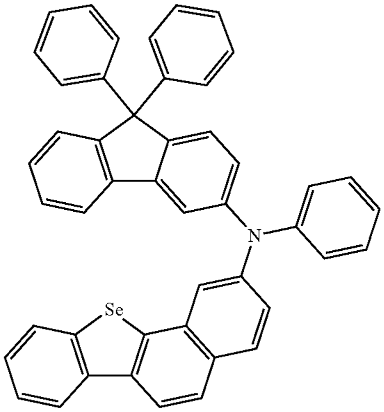
H2-225
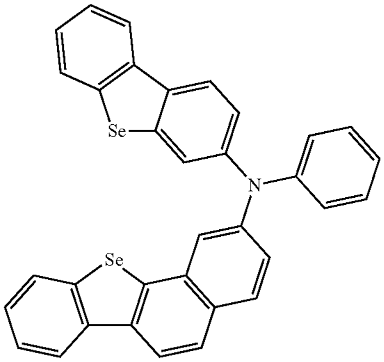
H2-226
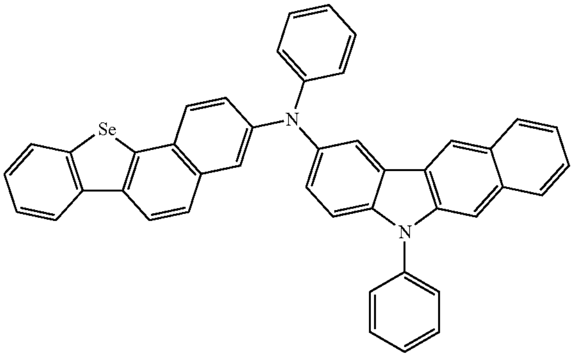
H2-227
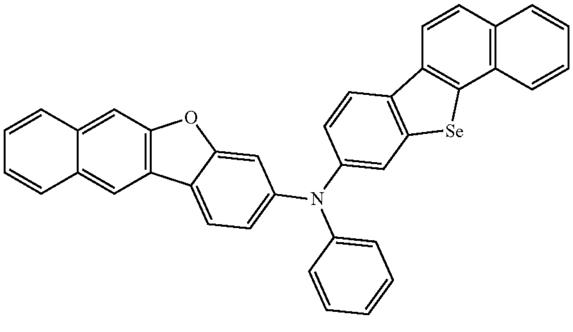

-continued
H2-228
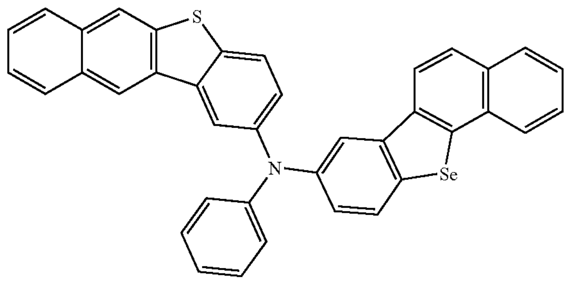
H2-229
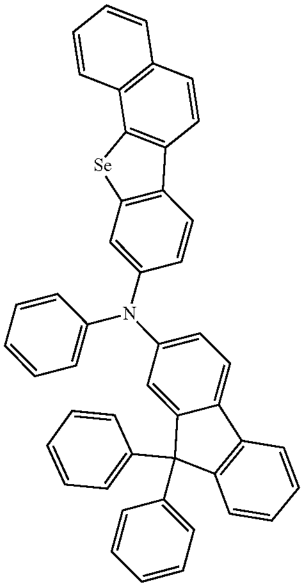
H2-230
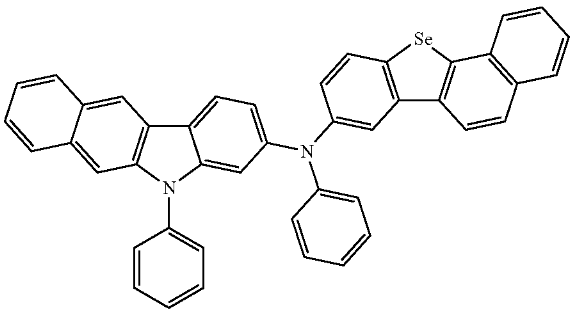
H2-231
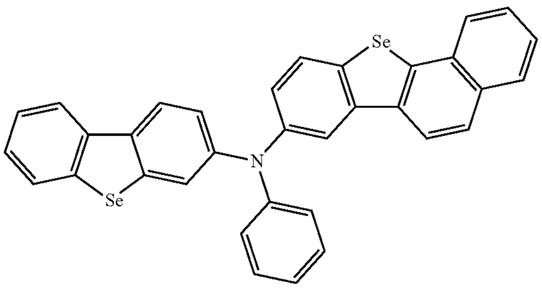
-continued
H2-232
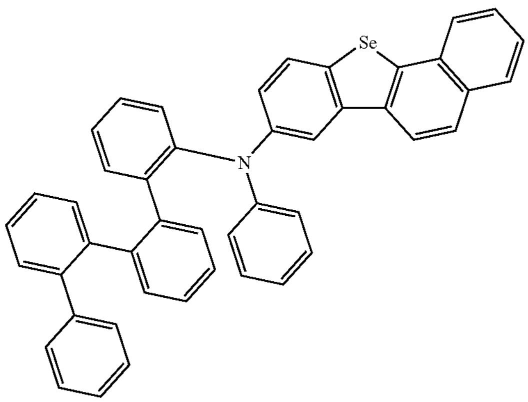
H2-233
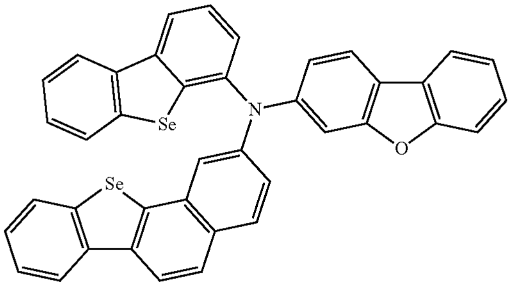
H2-234
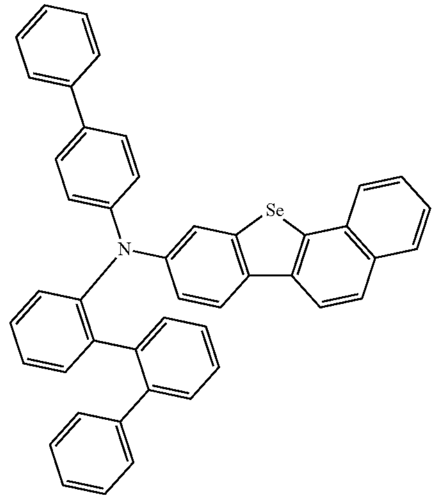
H2-235
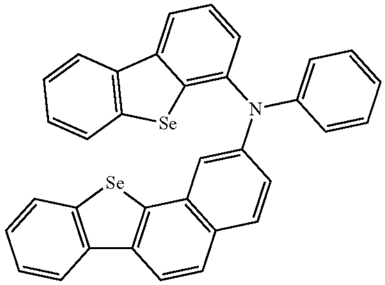

-continued
H2-236
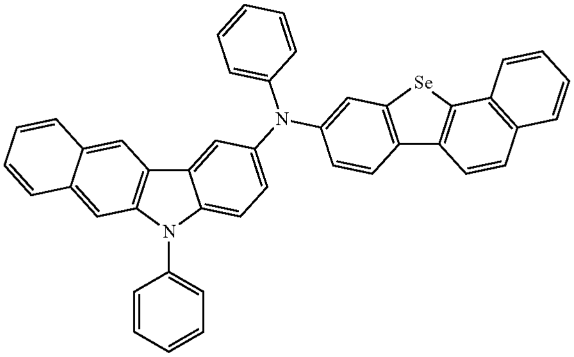
H2-237
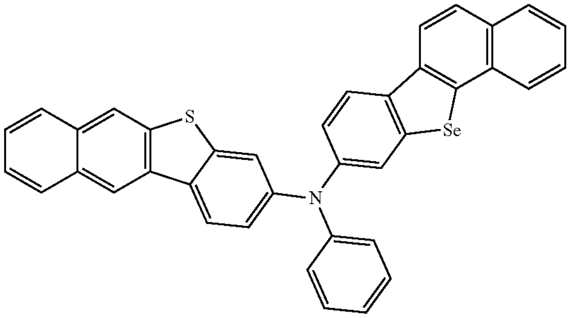
H2-238
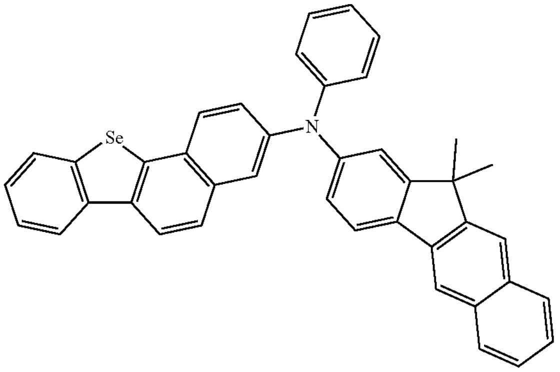
H2-239
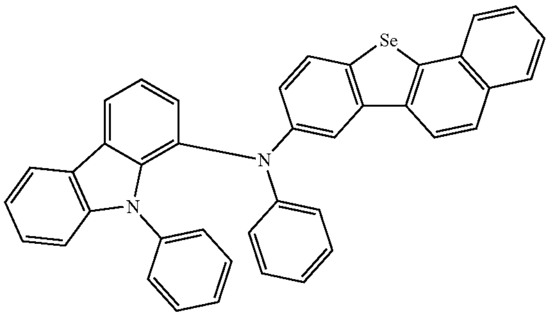
-continued
H2-240
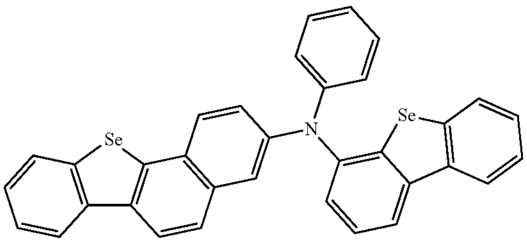
H2-241
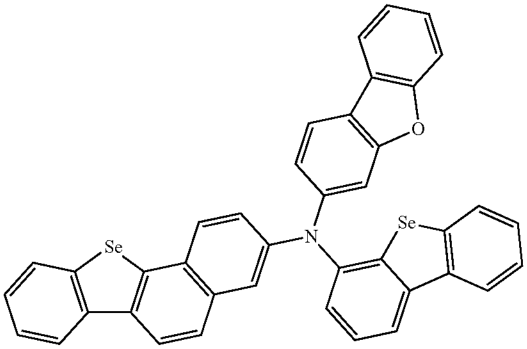
H2-242
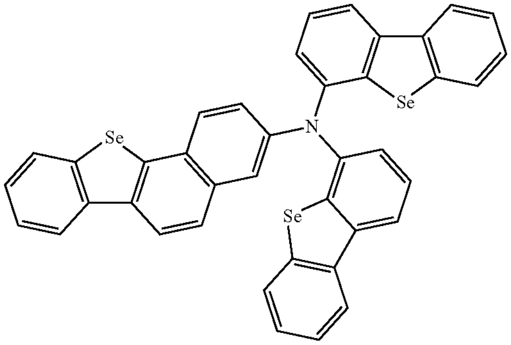
H2-243
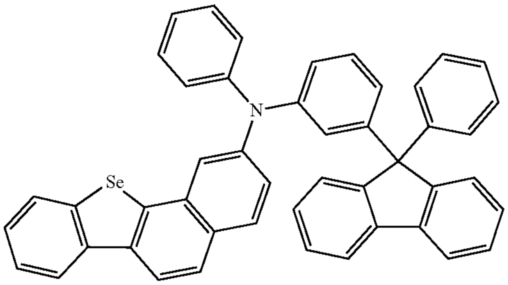

-continued
H2-244
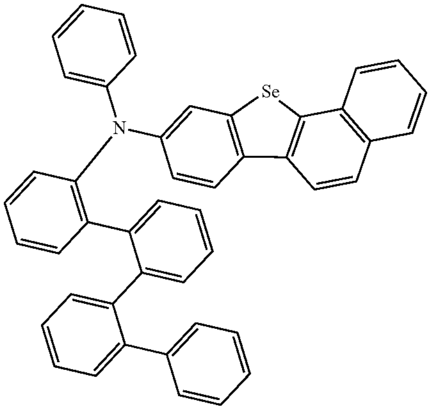
H2-245
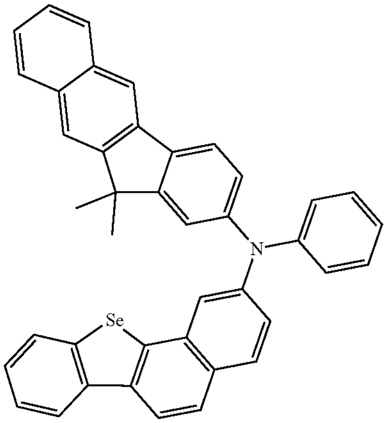
H2-246
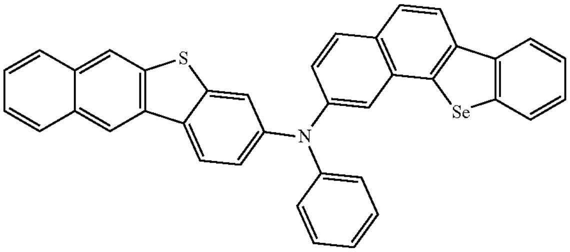
H2-247
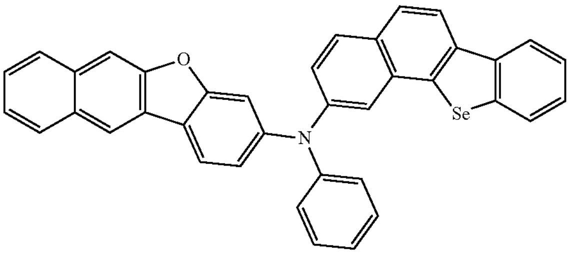
-continued
H2-248
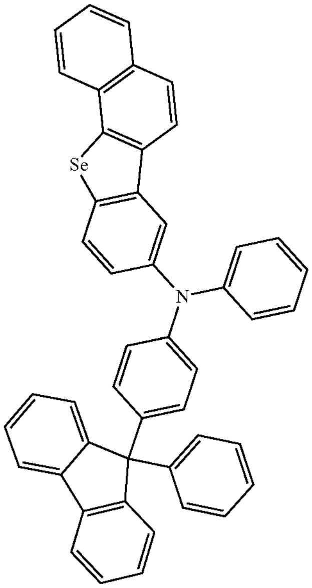
H2-249
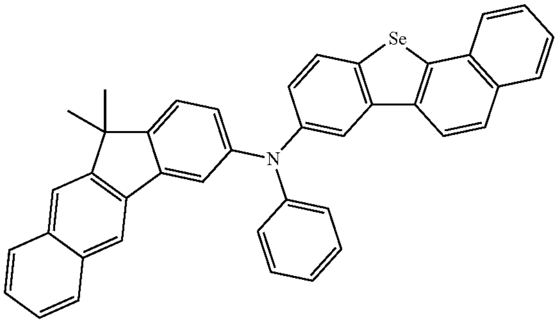
H2-250
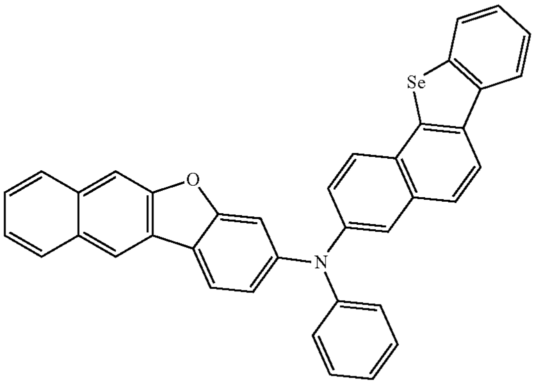

H2-251
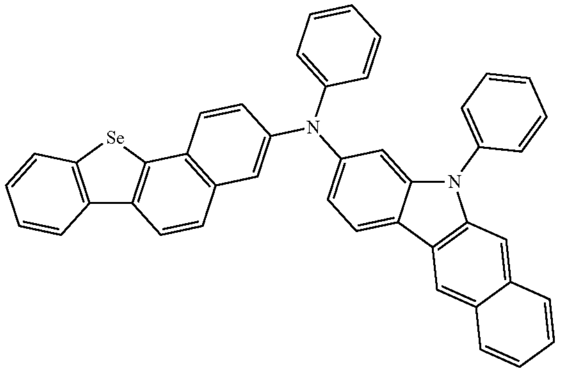
H2-252
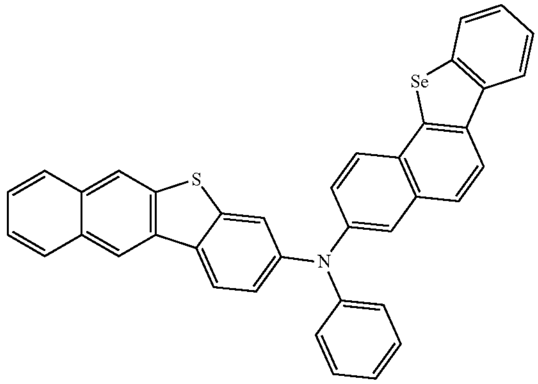
H2-253
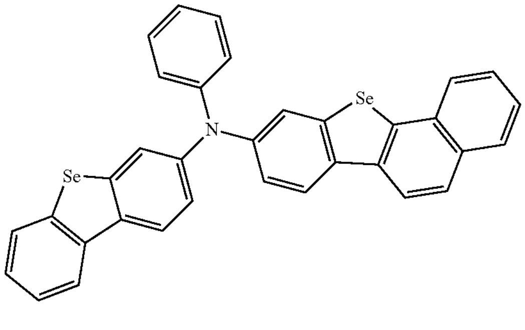
H2-254
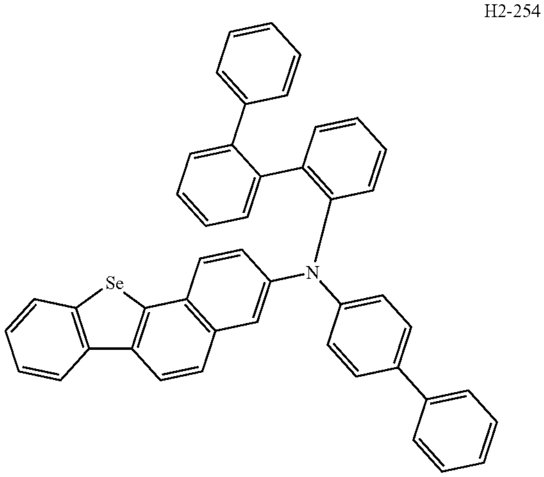
-continued
H2-255
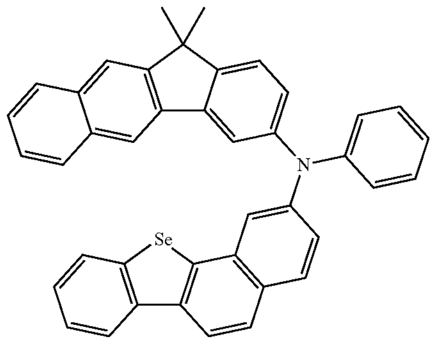
H2-256
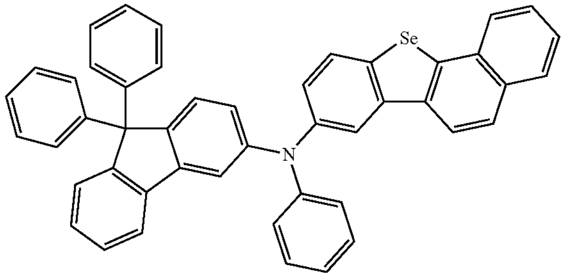
H2-257
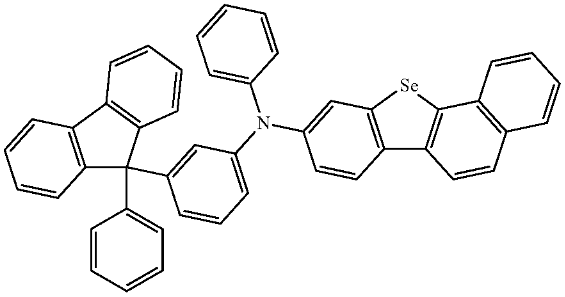
H2-258
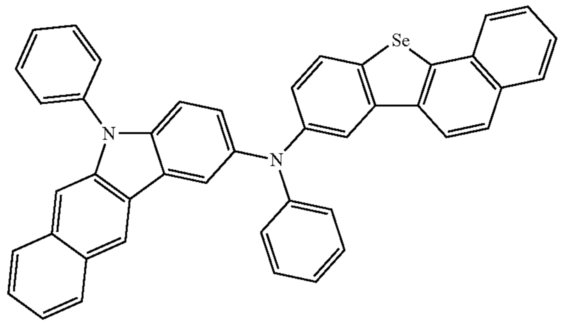

-continued
H2-259
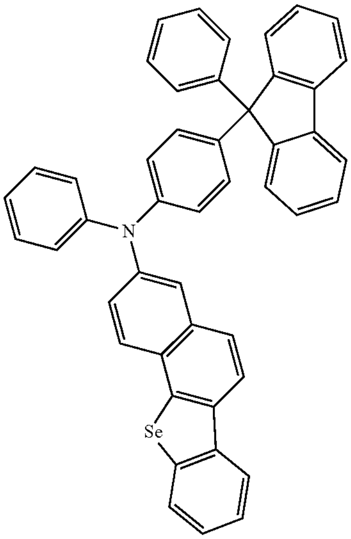
H2-260
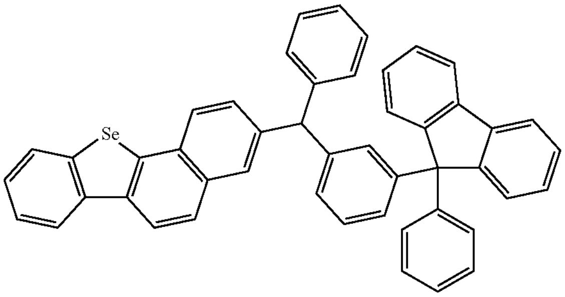
H2-261
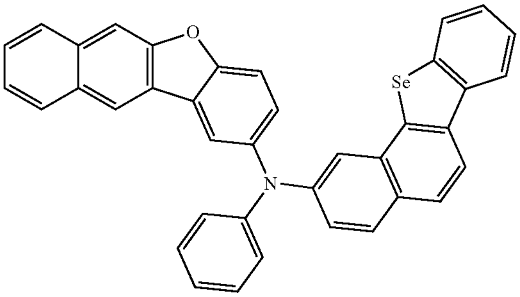
H2-262
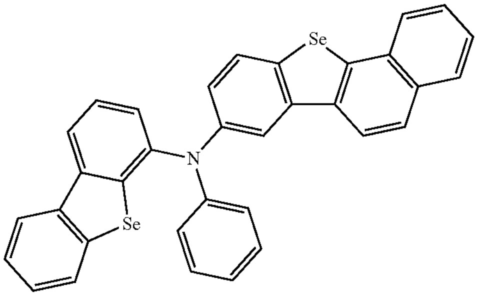
-continued
H2-263
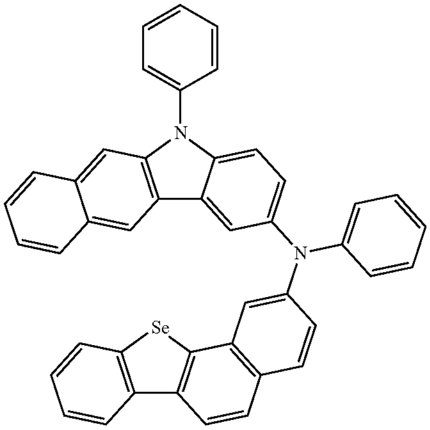
H2-264
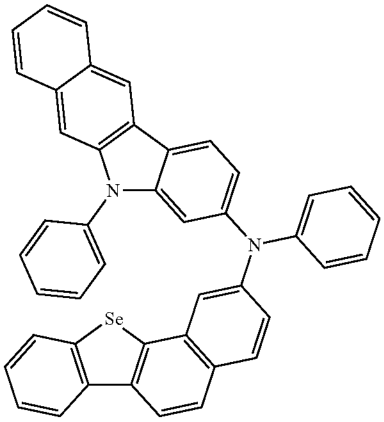
H2-265
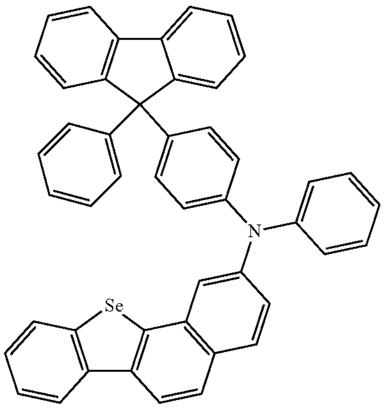

-continued
H2-266
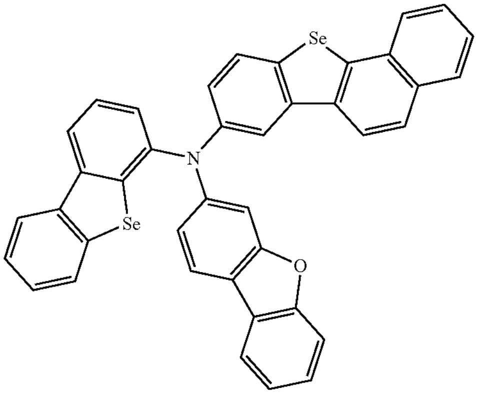
H2-267
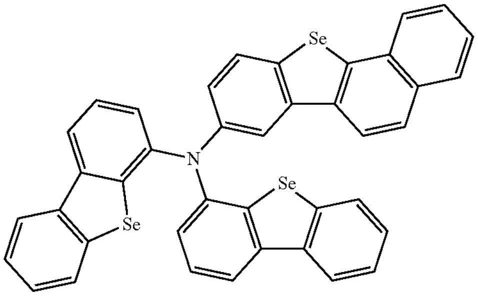
H2-268
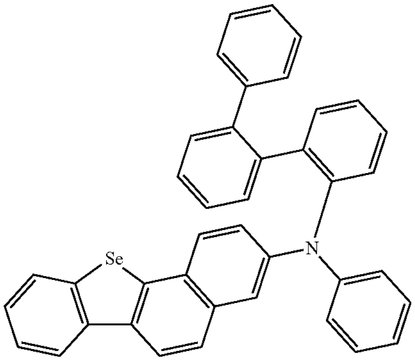
H2-269
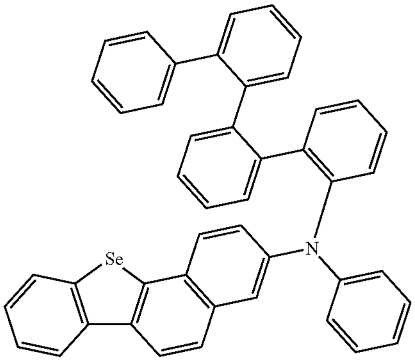
-continued
H2-270
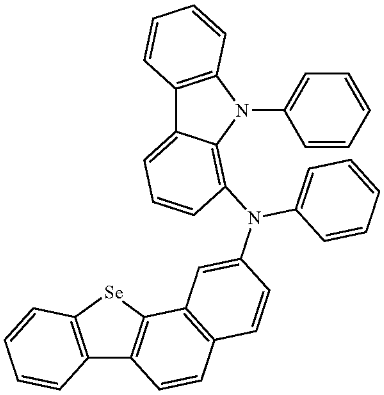
H2-271
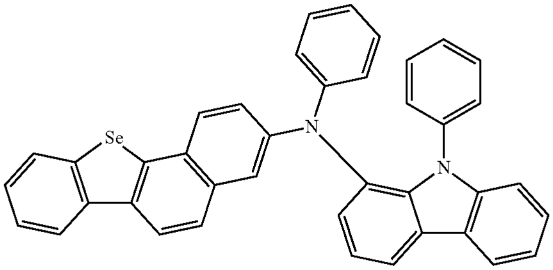
H2-272
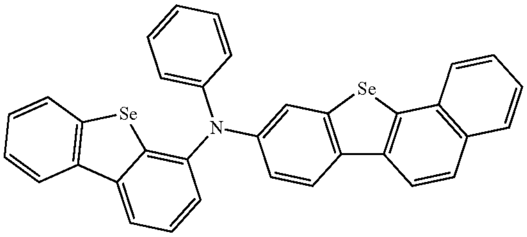
H2-273
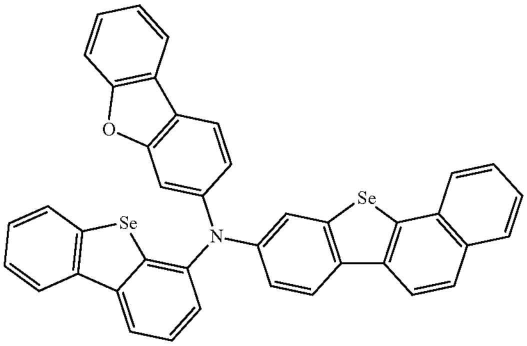

-continued
H2-274
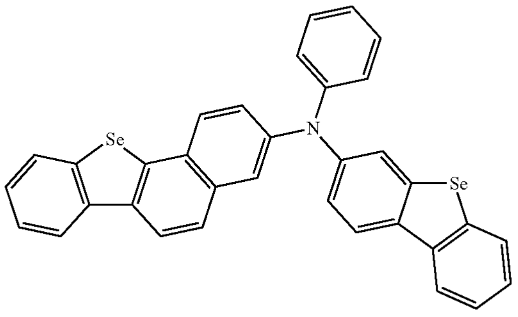
H2-275
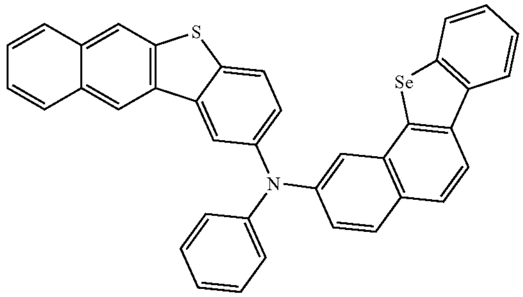
H2-276
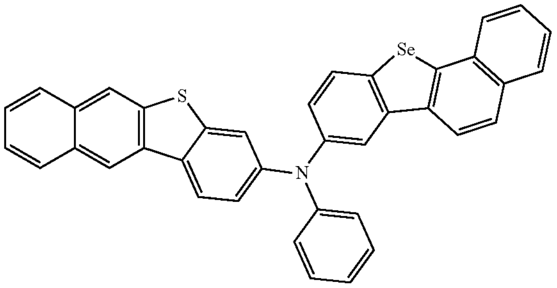
H2-277
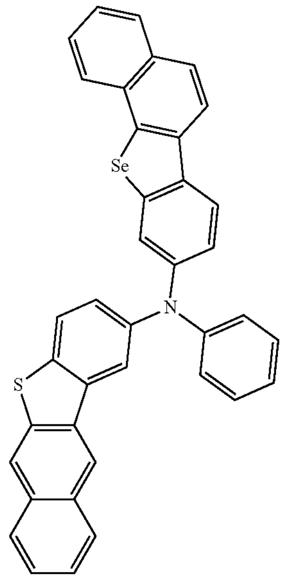
-continued
H2-278
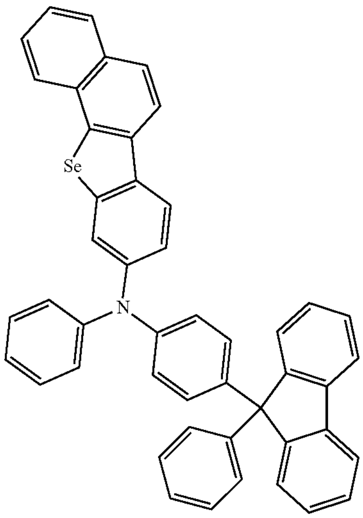
H2-279
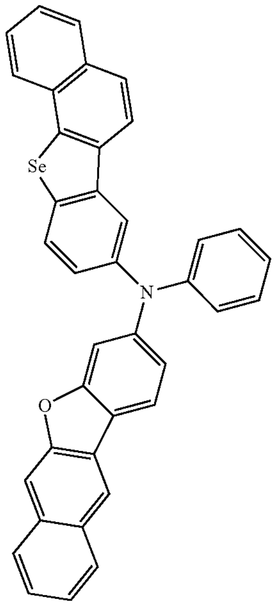
H2-280
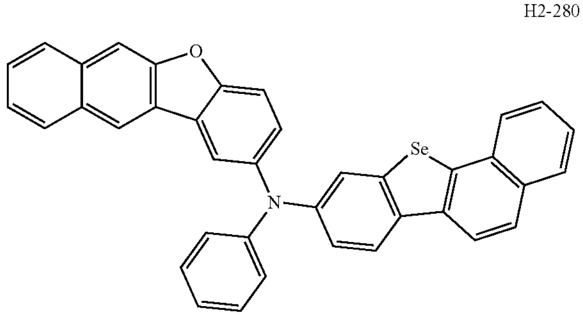

-continued
H2-281
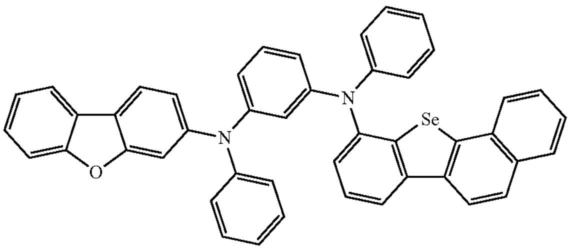
H2-282
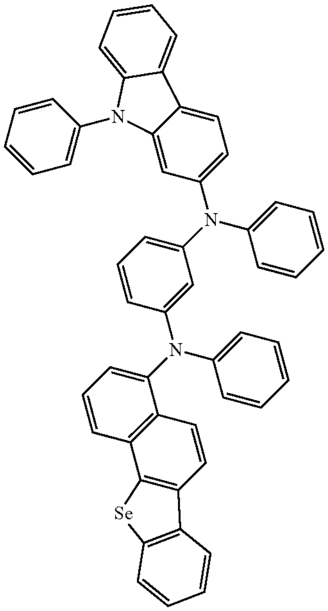
H2-283
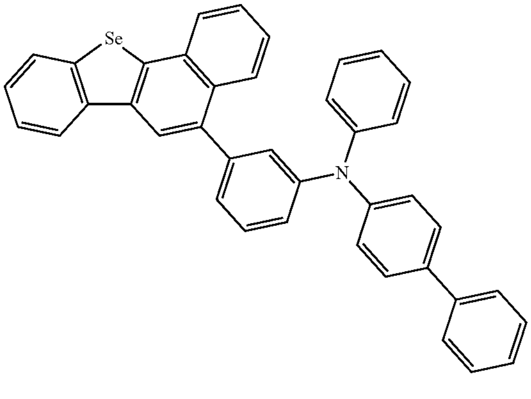
-continued
H2-284
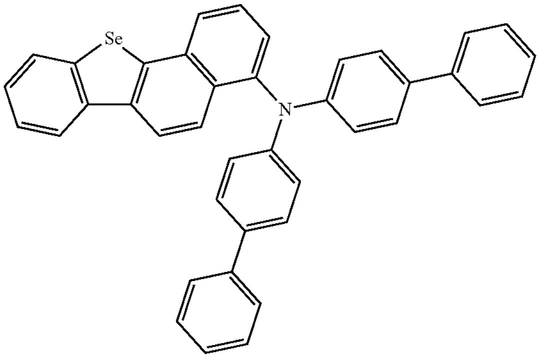
H2-285
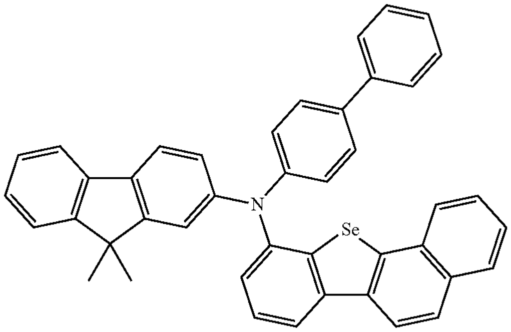
H2-286
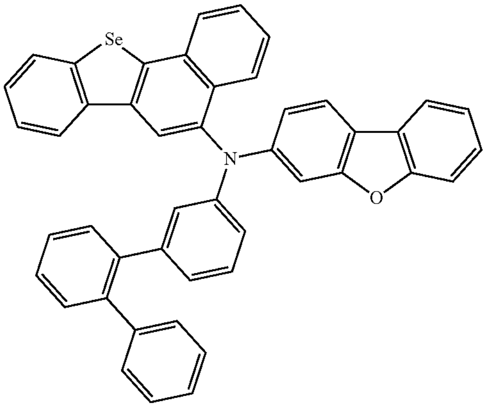
H2-287
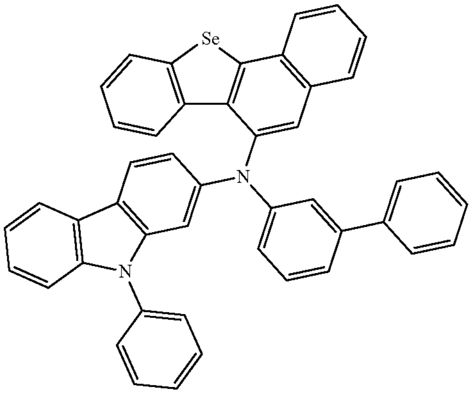

-continued
H2-288
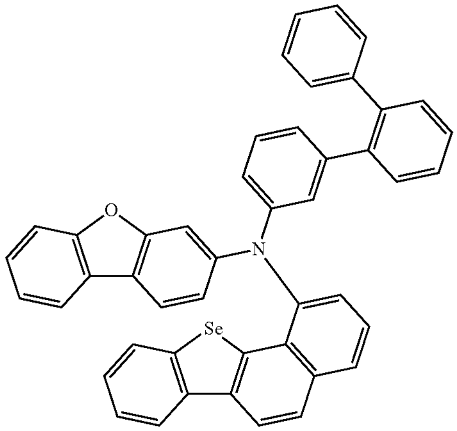
H2-289
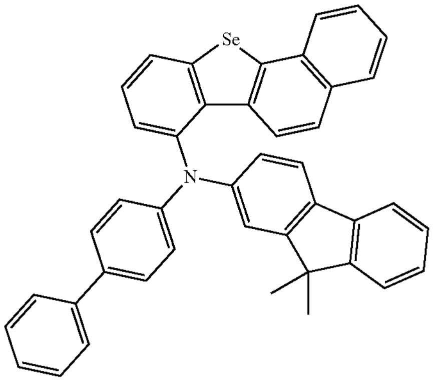
H2-290
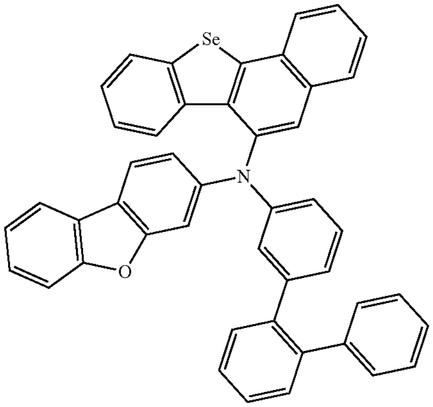
H2-291
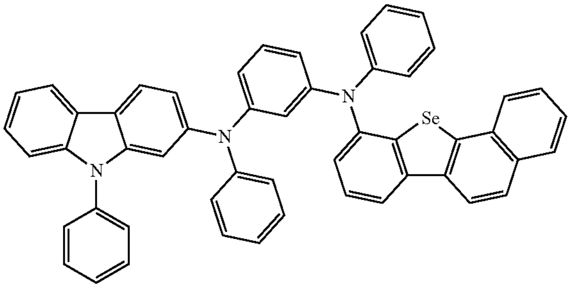
-continued
H2-292
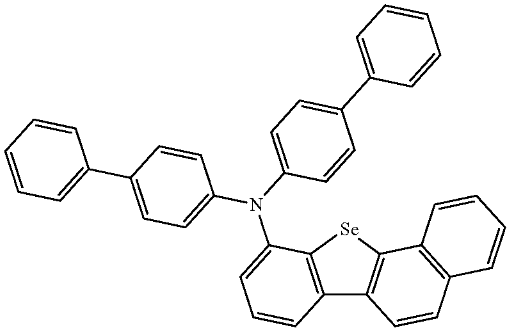
H2-293
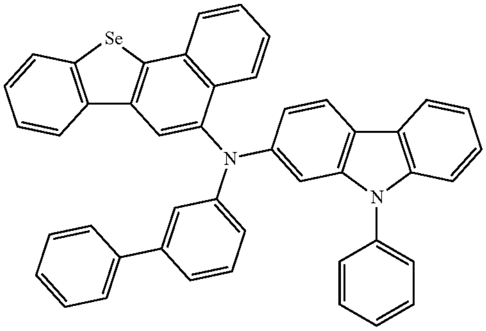
H2-294
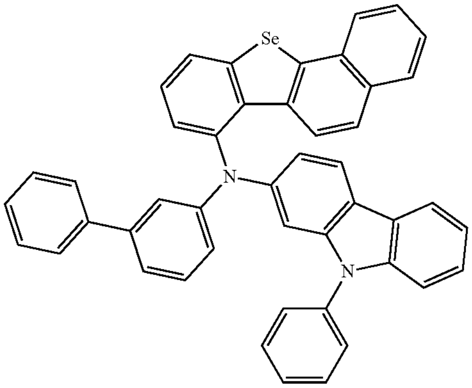
H2-295
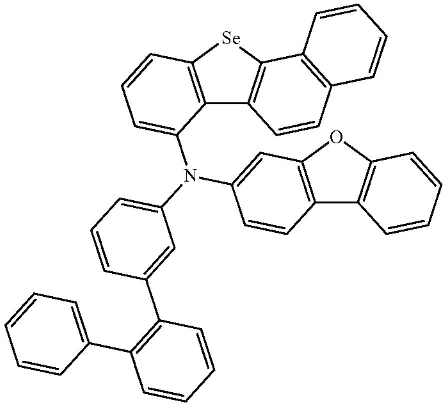

-continued
H2-296
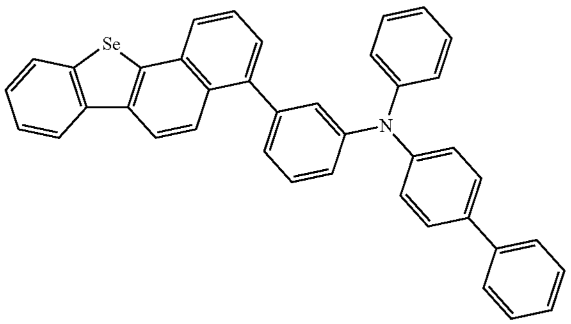
H2-297
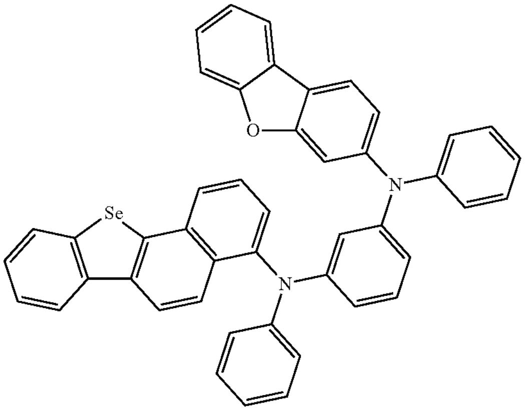
H2-298
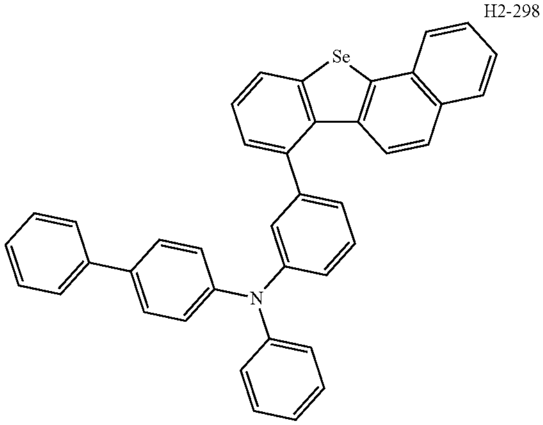
H2-299
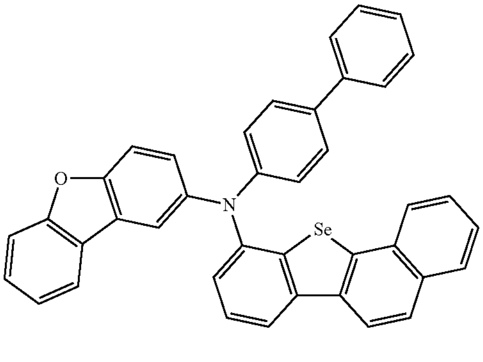
-continued
H2-300
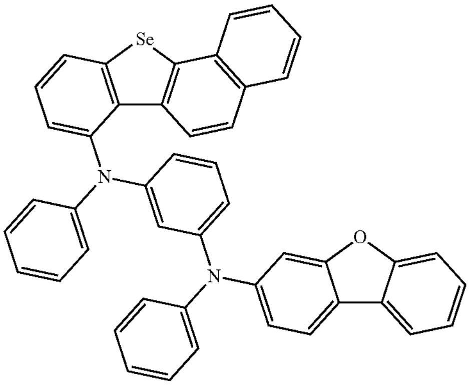
H2-301
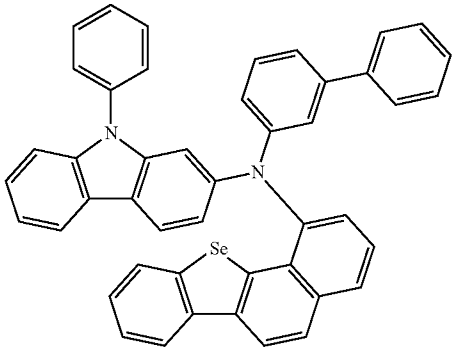
H2-302
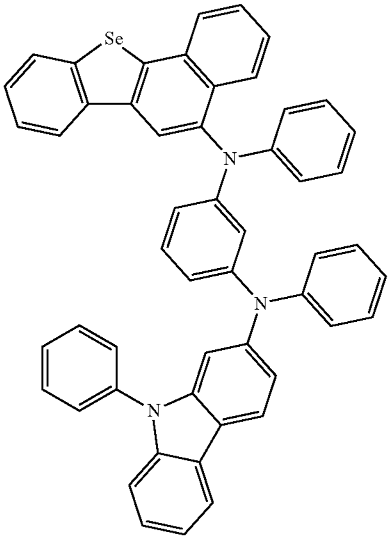

-continued
H2-303
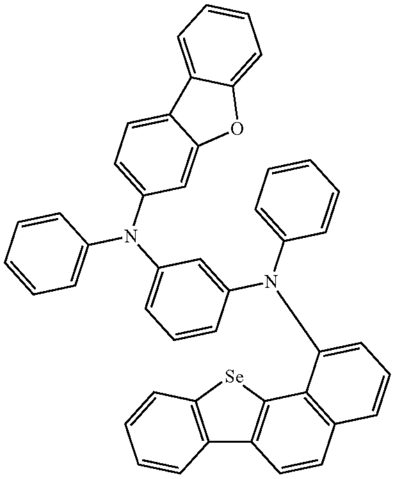
H2-304
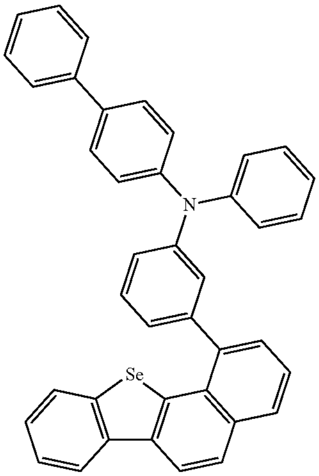
H2-305
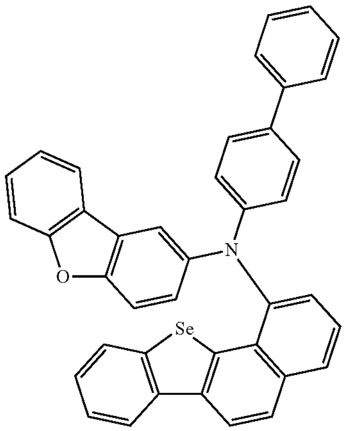
-continued
H2-306
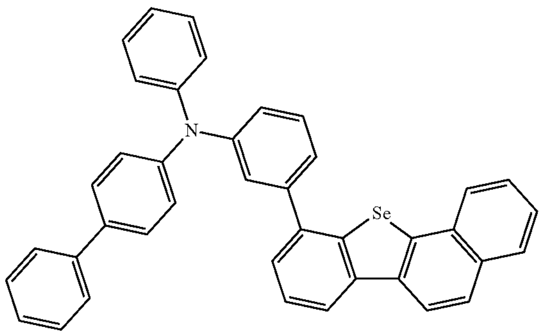
H2-307
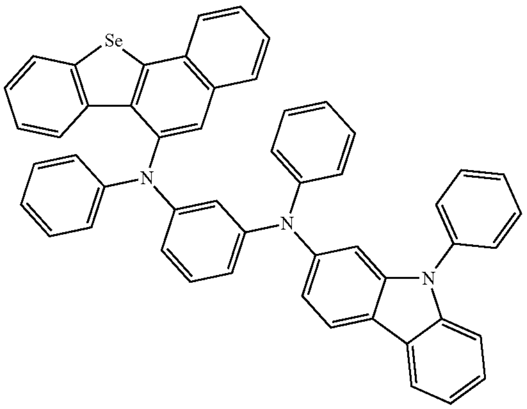
H2-308
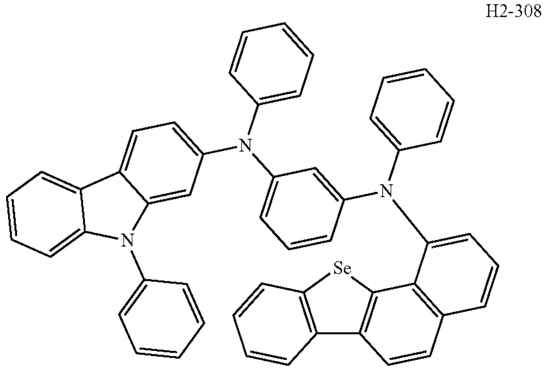
H2-309
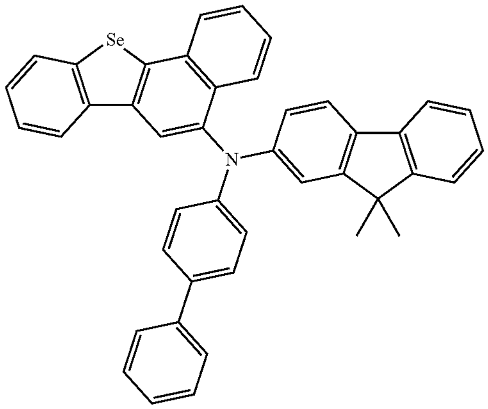

-continued
H2-310
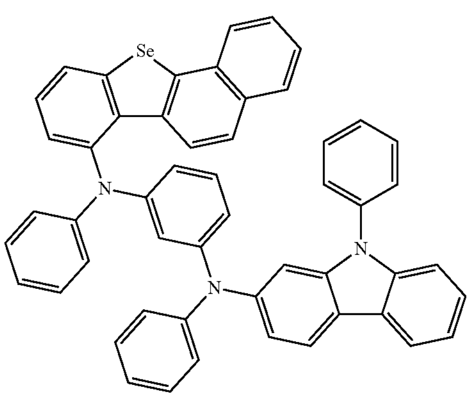
H2-311
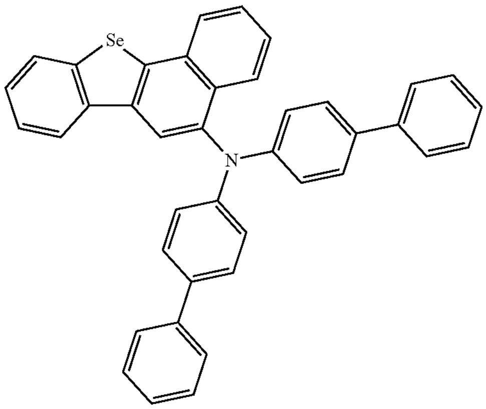
H2-312
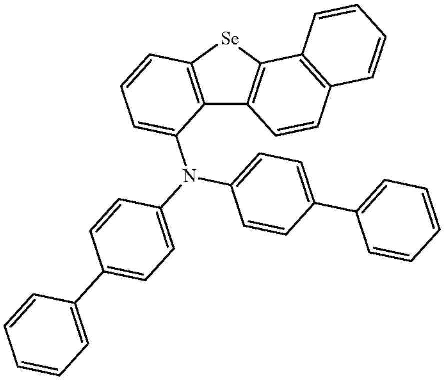
H2-313
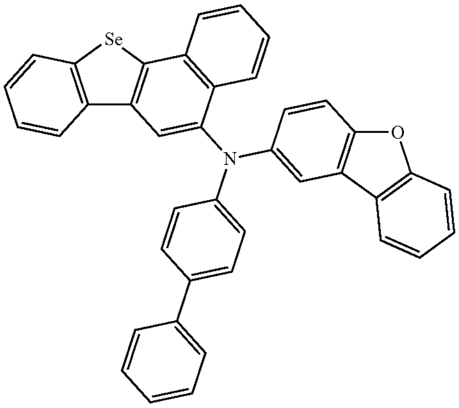
-continued
H2-314
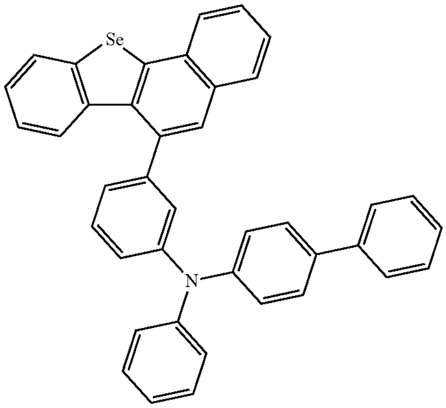
H2-315
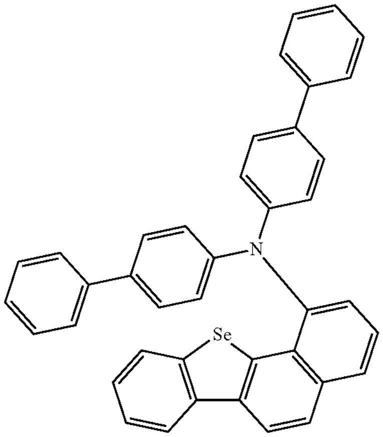
H2-316
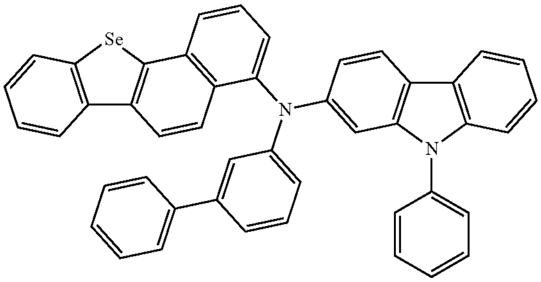
H2-317
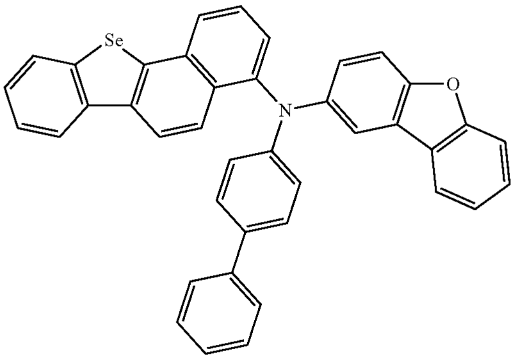

-continued
H2-318
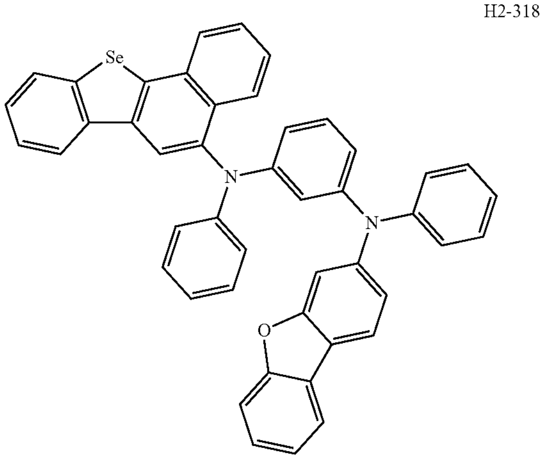
H2-319
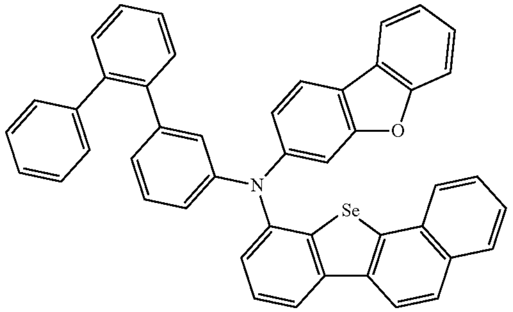
H2-320
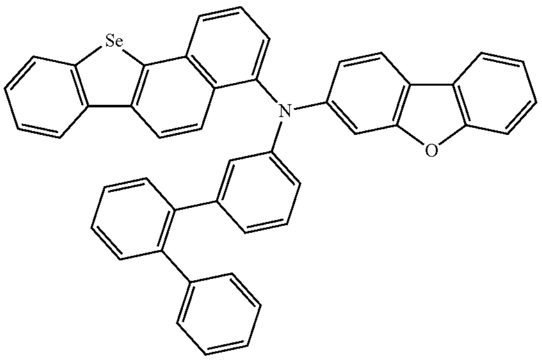
H2-321
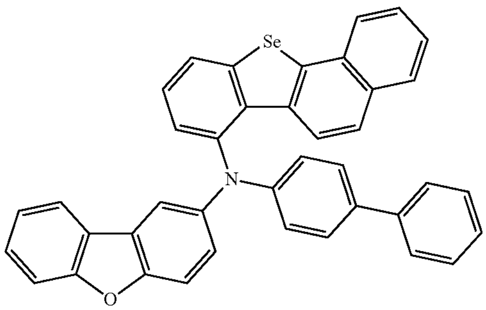
-continued
H2-322
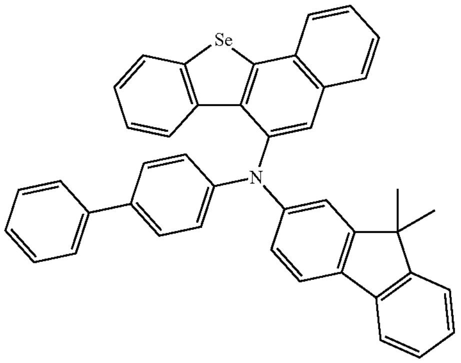
H2-323
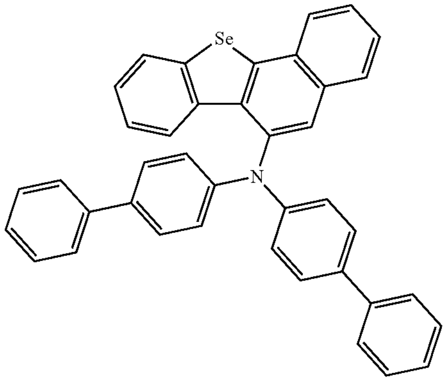
H2-324
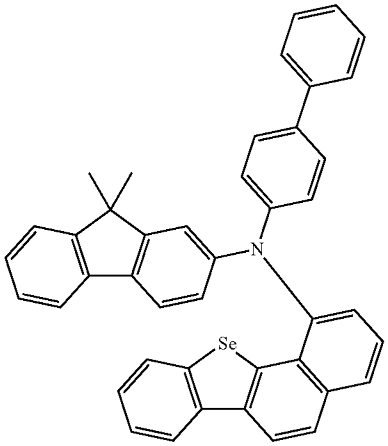
H2-325
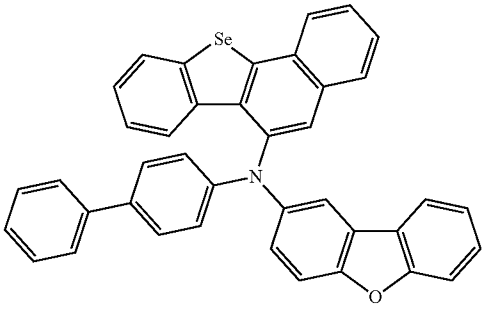

-continued
H2-326
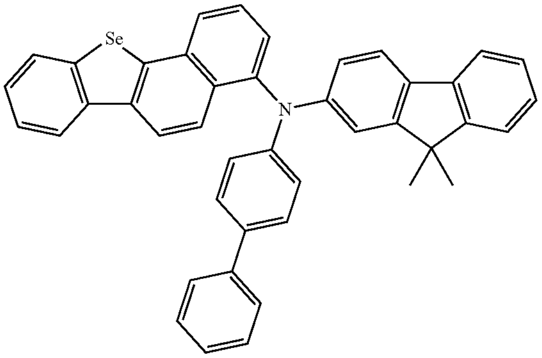
H2-327
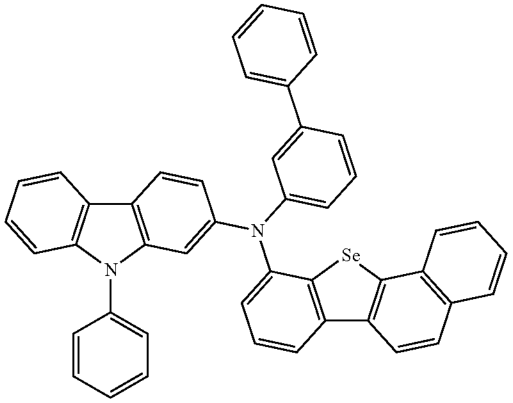
H2-328
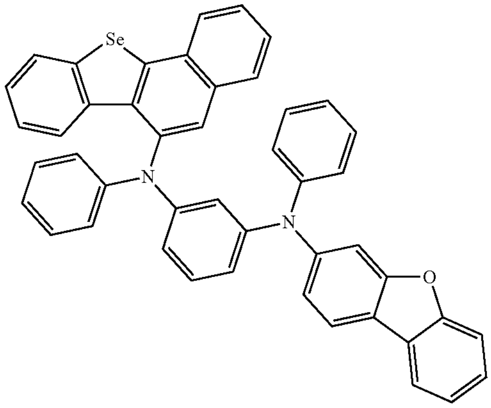
H2-329
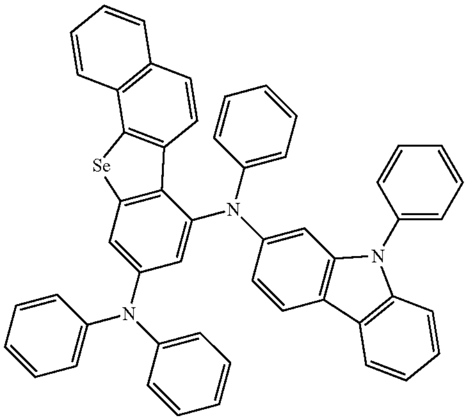
-continued
H2-330
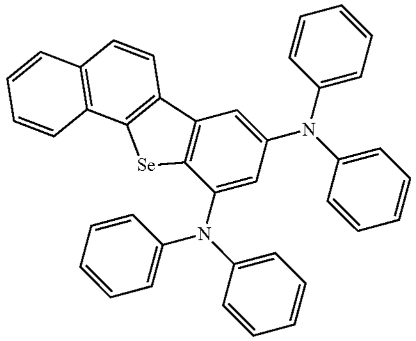
H2-331
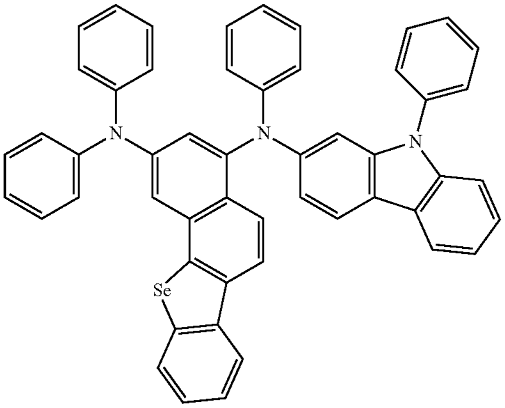
H2-332
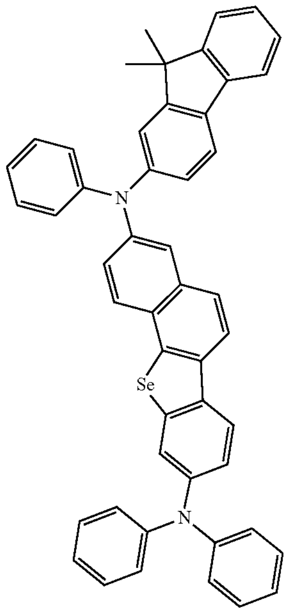
and -continued

H2-333

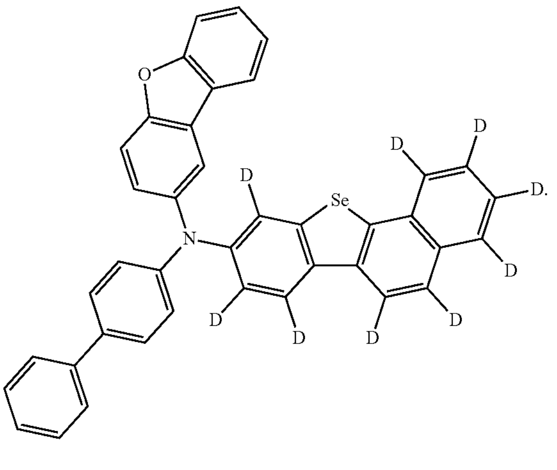

8. An organic electroluminescent device comprising a plurality of host materials according to claim 1.

9. An organic electroluminescent compound represented by the following Formula 3:

(3)

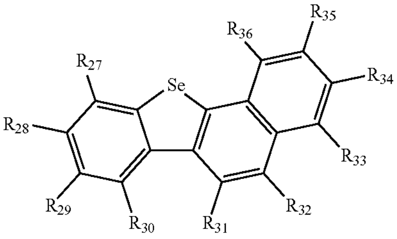

wherein, $R_{27}$ to $R_{36}$ each independently represent hydrogen, deuterium, a substituted or unsubstituted (C1-C30) alkyl, a substituted or unsubstituted (C6-C30) aryl, or the following Formula b; provided that at least one of $R_{27}$ to $R_{36}$ is (are) the following Formula b;

(b)

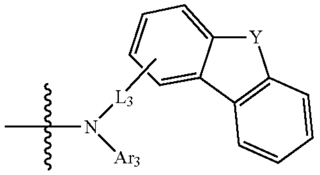

wherein,

Y represents O, S, $CR_{37}R_{38}$ or $NR_{39}$;

$R_{37}$ to $R_{39}$ each independently represent hydrogen, deuterium, or a substituted or unsubstituted (C6-C30) aryl;

$L_3$ represents a single bond, a substituted or unsubstituted (C6-C30) arylene, or a substituted or unsubstituted (3- to 30-membered) heteroarylene; and $Ar_3$ represents a substituted or unsubstituted (C6-C30) aryl, or a substituted or unsubstituted (3- to 30-membered) heteroaryl.

10. An organic electroluminescent device comprising the organic electroluminescent compound according to claim 9.

* * * * *